(12) United States Patent
Sano et al.

(10) Patent No.: US 6,379,994 B1
(45) Date of Patent: *Apr. 30, 2002

(54) METHOD FOR MANUFACTURING PHOTOVOLTAIC ELEMENT

(75) Inventors: Masafumi Sano, Kyoto-fu; Keishi Saito, Nara, both of (JP)

(73) Assignee: Canon Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/719,259

(22) Filed: Sep. 24, 1996

(30) Foreign Application Priority Data

| Sep. 25, 1995 | (JP) | 7-246503 |
| Sep. 25, 1995 | (JP) | 7-246504 |
| Sep. 25, 1995 | (JP) | 7-246517 |
| Sep. 25, 1995 | (JP) | 7-246520 |
| Sep. 25, 1995 | (JP) | 7-270615 |
| Sep. 25, 1995 | (JP) | 7-270616 |
| Sep. 29, 1995 | (JP) | 7-253210 |

(51) Int. Cl.[7] .............................. H01L 21/00
(52) U.S. Cl. ................................ 438/96; 438/509
(58) Field of Search ................ 438/96, 484, 509, 438/74, 98, 87; 257/458; 148/DIG. 3, DIG. 4

(56) References Cited

U.S. PATENT DOCUMENTS

| 4,113,514 A | | 9/1978 | Pankove et al. ............. 148/1.5 |
| 4,368,216 A | * | 1/1983 | Manassen et al. ............. 427/74 |
| 4,417,092 A | * | 11/1983 | Moustakas et al. ......... 136/258 |
| 4,464,415 A | * | 8/1984 | Yamazaki .................... 438/96 |
| 4,717,585 A | * | 1/1988 | Ishihara et al. ............. 427/568 |
| 5,077,223 A | * | 12/1991 | Yamazaki ..................... 438/87 |
| 5,256,576 A | * | 10/1993 | Guha et al. ................. 257/458 |
| 5,279,973 A | * | 1/1994 | Suizu ......................... 438/795 |
| 5,401,330 A | * | 3/1995 | Saito et al. ................. 257/436 |
| 5,563,075 A | * | 10/1996 | Saito et al. ................... 438/96 |

OTHER PUBLICATIONS

Y.S. Tsuo, et al., "Hydrogen–Plasma Reactive Flushing For a–Si:H P–I–N Solar Cell Fabrication," Mat'ls. Res. Soc. Symp. Proc. 149 (1989) pp. 471–476.

F. Demichelis, et al., "Effect of Plasma Treatment of the TCO On a–Si Solar Cell Performance," Mat'ls. Res. Soc. Symp. Proc. 258 (1992) pp. 905–910.

Scott et al. "Radiation Resistance Studies of Amorphous Silicon Films", IEEE, pp. 990–995, 1988.*

Nakamura et al. "The Roles of Atomic Hydrogen Played in "The Chemical Annealing" For Fabrication of a–Si:H", IEEE, pp. 480–483, Dec. 5, 1994.*

Nagayoshi et al. "The Effect of Hydrogen–Radical Annealing For SiO2 Passivation", IEEE, pp. 1513–1514, Dec. 5, 1994.*

* cited by examiner

*Primary Examiner*—Michael Trinh
(74) *Attorney, Agent, or Firm*—Fitzpatrick, Cella, Harper & Scinto

(57) ABSTRACT

Disclosed is a method for manufacturing a photovoltaic element wherein a pin-structure formed by laminating n-, i- and p-type semiconductor layers, each of which contains silicon atoms and has a non-monocrystalline crystal structure is formed at least one or more times on a substrate, the method comprising steps of forming each of the semiconductor layers and annealing the surface of at least one of the semiconductor layers or the substrate in an atmosphere of hydrogen gas, helium gas or argon gas that contains 1 to 1000 ppm of oxygen atom containing gas.

24 Claims, 10 Drawing Sheets

METHOD FOR MANUFACTURING PHOTOVOLTAIC ELEMENT

BACKGROUND OF THE INVENTION

1. Field of the Invention

The present invention relates to a manufacture method of a photovoltaic element. More particularly, the present invention relates to a manufacture method of a photovoltaic element which can reduce photo-degradation attributable to interfacial levels, prevent peel-off or delamination between semiconductor layers, and provide high resistance against a reverse bias.

2. Description of the Related Art

Defect levels present in semiconductor layers making up a photovoltaic element are closely related to generation and recombination of electric charges and are one of factors affecting characteristics of the photovoltaic element.

As one example of methods for compensating such defect levels, hydrogen plasma treatment for photovoltaic elements has been proposed as follows.

(1) U.S. Pat. No. 4,113,514 (J. 1. Pankove et. al., RCA, Sep. 12, 1978) discloses hydrogen plasma treatment for completed semiconductor elements.

(2) "EFFECT OF PLASMA TREATMENT OF THE TCO ON a-Si SOLAR CELL PERFORMANCE", F. Demichelis et. al., Mat. Res. Soc. Symp. Proc., Vol. 258, p 905, 1992 describes a method of carrying out hydrogen plasma treatment on a transparent electrode deposited over a substrate and then forming a solar cell of pin-structure over the treated electrode.

(3) "HYDROGEN-PLASMA REACTION FLUSHING FOR a-Si:H P-I-N SOLAR CELL FABRICATION", Y. S. Tsuo et. al., Mat. Res. Soc. Symp. Proc., Vol. 149, p 471, 1989 describes that, in fabricating solar cells of pin-structure, hydrogen plasma treatment is performed on the surface of a p-layer before an i-layer is deposited.

In those proposals, the hydrogen plasma treatment is carried out by introducing only hydrogen gas to a treatment chamber and activating the hydrogen gas with radio frequency (hereinafter abbreviated to "RF") to create a hydrogen plasma.

However, the hydrogen plasma not only acts on a substrate, an uncompleted element and a completed element which are to be treated, but also spreads over an entire inner wall of the chamber. Because the hydrogen plasma is very active, materials adsorbed on or contained in the inner wall surface of the chamber are sputtered therefrom by the hydrogen plasma. This raises a problem that if the sputtered materials are impurities (e.g., oxygen, nitrogen, carbon, iron, chromium, nickel and aluminum) which would give rise to defect levels when taken into semiconductor layers, generation and recombination of electric charges are disturbed and a photoelectric conversion characteristic is deteriorated.

Another problem is that because hydrogen gas is more difficult to discharge than other gases and a plasma created by hydrogen gas alone is more difficult to sustain than that created by using other gases, stable hydrogen plasma treatment cannot be ensured.

SUMMARY OF THE INVENTION

An object of the present invention is to provide a method for manufacturing a photovoltaic element with which, when carrying out, e.g., plasma treatment in manufacture of photovoltaic elements, impurities adsorbed on or contained in the inner wall surface of a treatment chamber will not be taken into the interior of and the interfaces between semiconductor layers, etc., and semiconductor layers having superior characteristics can be produced.

According to the present invention, in a method for manufacturing a photovoltaic element wherein a pin-structure formed by laminating n-, i- and p-type semiconductor layers, each of which contains silicon atoms and comprises a non-monocrystalline crystal structure, is formed at least one or more times on a substrate, the method comprises steps of forming each of the semiconductor layers and annealing the surface of at least one of the semiconductor layers or the substrate in an atmosphere of hydrogen gas, helium gas or argon gas that contains 1 to 1000 ppm of oxygen atom containing gas.

DETAILED DESCRIPTION OF THE PREFERRED EMBODIMENTS

Figure 1:
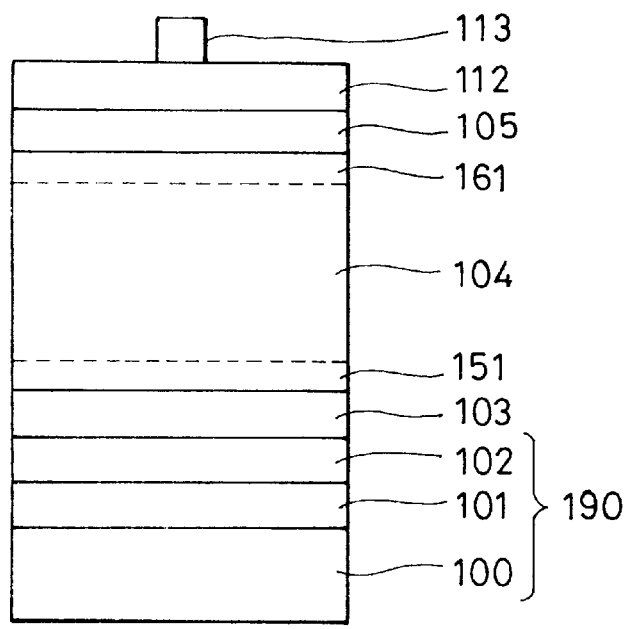
FIG. 1 is a sectional view schematically showing the construction of one embodiment of a photovoltaic element manufactured according to the present invention.

As to manufacture of a photovoltaic element having a pin-structure formed by laminating n-, i- and p-type semiconductor layers, each of which contains silicon atoms and has a crystal structure being not monocrystalline, the inventors consider that the following problems exist about the surface of the semiconductor layer immediately after it has been deposited with the plasma CVD process, for example.

(a) The surface of the semiconductor layer, immediately after it has been deposited with the plasma CVD process, contains many dangling bonds, has structural strains and is very active.

(b) If the semiconductor layer is left to stand in the condition of (a) and the next layer is then laminated on such a layer, a large number of interfacial levels remain between the previous layer and the next layer, resulting in a lowering of electrical and mechanical characteristics of the photovoltaic element.

(c) The dangling bonds and structural strains of the previous layer affect the deposition of the next layer and give rise to abnormal growth of the next layer.

As a method of solving the above problems, the inventors have found it effective that, when forming semiconductor layers in manufacture of the photovoltaic element, the surface of at least one of the semiconductor Layers or a substrate is annealed in an atmosphere of hydrogen gas, helium gas or argon gas that contains 1–1000 ppm of oxygen atom containing gas. As a result of the annealing, the oxidation rate can be controlled for the semiconductor layer or the substrate. If the amount of the oxygen atom containing gas added is too large, oxidation of a silicon layer would progress excessively. Conversely, if the amount of the oxygen atom containing gas added is too small, the advantages of the present invention would be difficult to achieve.

The inventors have also found that the above method including the annealing step exhibits advantageous actions below.

(1) Oxygen atoms are oriented in two ways and hence increase structural flexibility when bonded to silicon atoms. This reduces interfacial levels in the layer containing silicon atoms (i.e., the semiconductor layer).

(2) Because of oxygen atoms having large bonding energy with silicon atoms, if the annealing is carried out in an atmosphere containing a large number of oxygen atoms, the silicon surface would be oxidized excessively and brought into an insulation. However, only several or less atom layers of the silicon surface can be treated by carrying out the annealing in a controlled atmosphere that contains a small amount of oxygen atoms as with the present invention.

(3) As a result of the foregoing (1) and (2), surface defects and structural strains are reduced in the next layer laminated on the silicon surface which has been annealed with the oxygen atom containing gas according to the present invention. Therefore, the next layer can be formed as a deposition film including very few defect levels and also as a uniform film free of columnar structure.

(4) Oxygen atoms form silicon oxide by being bonded to silicon atoms, and a resulting silicon oxide layer has a wider band gap than a layer formed of silicon atoms alone. Therefore, the photo-voltage is increased when used as a photovoltaic element.

(5) In the silicon oxide layer based on the foregoing (1) to (4), the conduction band and the valence band are positioned so as to separate from each other wider than in a layer formed of silicon atoms alone; namely, there occur a gradient in electron affinity and ionization energy. Therefore, electric charges photo-excited near the silicon oxide layer can be separated efficiently without undergoing recombination. As a result, the photocurrent is increased when used as a photovoltaic element. In particular, when light is irradiated from the silicon oxide layer side, the utilization efficiency of light in a shorter wavelength range is improved. Further, photo-degradation attributable to interfacial levels is reduced.

(6) When bonded to silicon atoms, oxygen atoms are charged to be negative because of high electronegativity. As a result, adhesion to the next layer is improved. Especially, the semiconductor layers are less peeled off when the photovoltaic element is subjected to high temperature and humidity. Further, even if the photovoltaic element is folded, the semiconductor layers can be prevented from peeling off therebetween.

(7) Due to the formation of the silicon oxide layer, when the next layer (upper layer) is deposited as a p-or n-layer, impurities are prevented from diffusing into the previous layer from the next layer. This particularly results in less deterioration of characteristics when the photovoltaic element is employed at high temperatures.

(8) With a very thin silicon oxide layer formed near the interface between an i-layer and a p- or n-layer of the photovoltaic element, a wide band gap of the silicon oxide layer serves to suppress the breakdown of the photovoltaic element when a reverse bias is applied thereto.

Examples of the oxygen atom containing gas suitably used for the annealing carried out in the method of the present invention are $O_2$, CO, $CO_2$, NO, $NO_2$, $N_2O$, $CH_3CH_2OH$, $CH_3OH$ and so on.

As to the amount of the oxygen atom containing gas added, it is preferable that the annealing be performed with a smaller amount of the gas when active gas such as oxygen gas, for example, is employed. Conversely, it is preferable that the annealing be performed with a larger amount of the gas when relatively inert gas such as $CO_2$, for example, is employed.

Further, hydrogen gas, helium gas or argon gas added with the oxygen atom containing gas; is preferably introduced by being sprayed to the silicon semiconductor layer. It is believed that such a spray manner is effective to uniformly treat the silicon semiconductor surface.

In the method of the present invention, the annealing temperature is preferably set in the range of 50–400° C. By so setting, the silicon layer can be oxidized in an adequate thickness. If the annealing temperature is lower than 50° C., oxidation of the silicon layer would be insufficient in some cases. Conversely, if the annealing temperature is higher than 400° C., the silicon layer surface would be oxidized excessively and brought into an insulation. In the worst case, the photovoltaic element itself would be broken down. Accordingly, when the annealing temperature is set to fall in the range of 50–400° C., oxidation of the silicon layer surface can be controlled optimally.

When the above-mentioned annealing is carried out by adding the oxygen atom containing gas that is active depending on the composition thereof, it is preferable to perform the treatment at a relatively low temperature. Also, when the annealing is carried out by adding the oxygen atom containing gas that is relatively inert depending on the composition thereof, it is preferable to perform the treatment at a relatively high temperature. In the present invention, it is further preferable to carry out the annealing while changing temperature, taking into account the composition of the atmosphere gas, etc. A temperature distribution in the annealing step according to the present invention is desirably selected, for example, such that the annealing is carried out at a relatively high temperature immediately after the silicon semiconductor layer to be treated has been deposited, and the temperature is gradually lowered after that.

In the method of the present invention, the annealing pressure is preferably set in the range of 0.01–10 Torr. By so setting, the silicon layer can be oxidized in an adequate thickness. If the annealing pressure is lower than 0.01 Torr, oxidation of the silicon layer would be insufficient in some cases. Conversely, if the annealing pressure is higher than 10 Torr, the silicon layer surface would be oxidized excessively and brought into an insulation. Accordingly, when the annealing pressure is set to fall in the range of 0.01–10 Torr, oxidation of the silicon layer surface can be controlled optimally.

When practicing the method of the present invention, the photovoltaic element can be manufactured with the roll-to-roll technique in which a substrate is coiled into the form of a roll and various treatments, including formation of semiconductor layers (or films), are continuously performed on the substrate. In this case, particularly, it is preferable to set pressure such that the location nearer to the space in which each of the semiconductor layers is formed is subjected to a lower pressure.

In the method of the present invention, especially preferably, the semiconductor layers (or films) are formed by using the microwave plasma CVD process. In this case, the frequency of microwaves used is preferably set in the range of 0.1–10 GHz. By so setting, material gases different in decomposition energy from each other can be efficiently decomposed under a low pressure and hence a layer film can be formed at a higher rate. Further, by carrying out the annealing as a feature of the present invention on a deposition film formed with the plasma CVD process using microwaves of the above frequency range, the structure of the silicon layer surface becomes more relaxed and photodegradation attributable to interfacial levels can be suppressed.

In another form of the manufacture method of the photovoltaic element according to the present invention, the annealing of the semiconductor layer or the substrate is preferably carried out in an atmosphere of hydrogen gas, helium gas or argon gas that contains 1–1000 ppm of boron atom containing gas in addition to 1–1000 ppm of the oxygen atom containing gas as mentioned above.

It is thought that, by annealing at least one of the semiconductor layers or the substrate in an atmosphere of hydrogen gas, helium gas or argon gas that contains 1–1000 ppm of boron atom containing gas in addition to 1–1000 ppm of the oxygen atom containing gas, boron atoms show a steeper distribution in the semiconductor layer or the substrate and can be doped in the form of so-called delta doping. As a result, characteristic parameters, such as open-circuit voltage and curvilinear factor, of the finished photovoltaic element are improved. Furthermore, photodegradation attributable to the interfaces subjected to the annealing as a feature of the present invention is improved.

The amount of the boron atom containing gas added to the atmosphere of hydrogen gas, helium gas or argon gas in order to obtain the above-mentioned advantages of the annealing using the boron atom containing gas is in the range of 1–1000 ppm. If the content of the boron atom containing gas exceeds 1000 ppm, the residual gas would mix into a semiconductor layer (especially, an i-type layer) and affect electric characteristics of the semiconductor layer in some cases. Conversely, if the content of the boron atom containing gas is less than 1 ppm, the above-mentioned advantages resulted from using the boron atom containing gas would not be achieved in some cases. It is thought that, by carrying out the annealing in the presence of both the oxygen atom containing gas and the boron atom containing gas, boron atoms can be doped into the region of several or less atom layers with the aid of high reactivity of oxygen atoms and silicon atoms.

Examples of the boron atom containing gas suitably used for the annealing carried out in the method of the present invention are boron hydrides such as $B_2H_6$, $B_4H_{10}$, $B_5H_9$, $B_5H_{11}$, $B_6H_{10}$, $B_6H_{12}$ and $B_6H_{14}$, boron halides such as $BF_3$ and $BCl_3$, etc.

The boron atom containing gas is preferably added to hydrogen gas, helium gas or argon gas beforehand, when used.

In still another form of the manufacture method of the photovoltaic element according to the present invention, the annealing of the semiconductor layer or the substrate is preferably carried out in an atmosphere of hydrogen gas, helium gas or argon gas that contains 1–1000 ppm of phosphorus atom containing gas in addition to 1–1000 ppm of the oxygen atom containing gas as mentioned above.

It is thought that, by annealing at least one of the semiconductor layers or the substrate in an atmosphere of hydrogen gas, helium gas or argon gas that contains 1–1000 ppm of phosphorus atom containing gas in addition to 1–1000 ppm of the oxygen atom containing gas, phosphorus atoms show a steeper distribution in the semiconductor layer or the substrate and can be doped in the form of so-called delta doping. As a result, characteristic parameters, such as open-circuit voltage and curvilinear factor, of the finished photovoltaic element are improved. Furthermore, photodegradation attributable to the interfaces subjected to the annealing as a feature of the present invention is improved.

The amount of the phosphorus atom containing gas added to the atmosphere of hydrogen gas, helium gas or argon gas in order to obtain the above-mentioned advantages of the annealing using the boron atom containing gas is in the range of 1–1000 ppm. If the content of the phosphorus atom containing gas exceeds 1000 ppm, the residual gas would mix into a semiconductor layer (especially, an i-type layer) and affect electric characteristics of the semiconductor layer in some cases. Conversely, if the content of the phosphorus atom containing gas is less than 1 ppm, the above-mentioned advantages resulted from using the phosphorus atom containing gas would not be achieved in some cases. It is thought that, by carrying out the annealing in the presence of both the oxygen atom containing gas and the phosphorus atom containing gas, phosphorus atoms can be doped into the region of several or less atom layers with the aid of high reactivity of oxygen atoms and silicon atoms.

Examples of the phosphorus atom containing gas suitably used for the annealing carried out in the method of the present invention are phosphorus hydrides such as $PH_3$ and $P_2H_4$, phosphorus halides such as $PH_4I$, $PF_3$, $PF_5$, $PCL_3$ $PCl_5$, $PBr_3$ and $PI_3$, etc.

The phosphorus atom containing gas is preferably added to hydrogen gas, helium gas or argon gas beforehand, when used.

In still another form of the manufacture method of the photovoltaic element according to the present invention, the annealing of the semiconductor layer or the substrate is preferably carried out in an atmosphere of hydrogen gas, helium gas or argon gas that contains 1–1000 ppm of the boron atom containing gas as mentioned above and 1–1000 ppm of the phosphorus atom containing gas as mentioned above, in addition to 1–1000 ppm of the oxygen atom containing gas as mentioned above. It is thought that, by carrying out the annealing in the presence of both phosphorus atoms and boron atoms, particularly, the structure near the surface of the semiconductor layer or the substrate under the annealing becomes more relaxed.

In the annealing step using the boron atom containing gas (1–1000 ppm) and/or the phosphorus atom containing gas (1–1000 ppm), it is also preferable to set the annealing temperature in the range of 50 to 400° C., set the annealing pressure in the range of 0.01–10 Torr, and/or form the semiconductor layers (or films) by using the microwave plasma CVD process with the frequency of microwaves set in the range of 0.1–10 GHz, based on the viewpoints stated above.

In the manufacture method of the photovoltaic element according to the present invention, it is particularly preferable to apply a magnetic field to the specific atmosphere that contains 1–1000 ppm of the oxygen atom containing gas as mentioned above. It is thought that the applied magnetic field gives rise to perturbation in electronic energy levels of oxygen atoms contained in the atmosphere and hence affects the reaction between those oxygen atoms and silicon atoms. As a result, electric characteristics near the interfaces are improved. When so applying a magnetic field during the annealing step, the intensity of the magnetic field is preferably set in the range of 100–3000 G.

Such an annealing of the semiconductor layer or the substrate under the application of a magnetic field can also be performed in an atmosphere of hydrogen gas, helium gas or argon gas that contains 1–1000 ppm of the boron atom containing gas as mentioned above and/or 1–1000 ppm of the phosphorus atom containing gas as mentioned above in addition to 1–1000 ppm of the oxygen atom containing gas as mentioned above, based on the viewpoints stated above.

Preferred embodiments of the present invention will be described hereinafter in detail with reference to the drawings.

Figure 2:
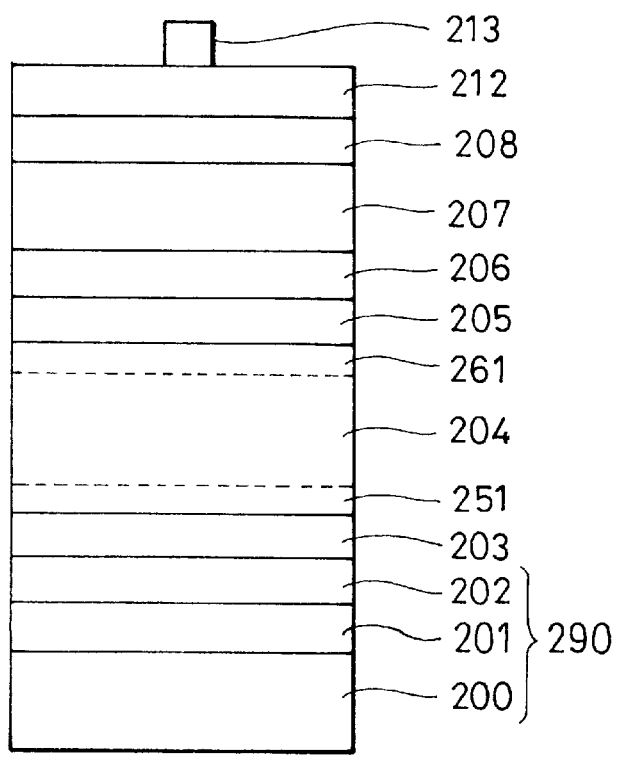
FIG. 2 is a sectional view schematically showing the construction of another embodiment of a photovoltaic element manufactured according to the present invention.
Figure 3:
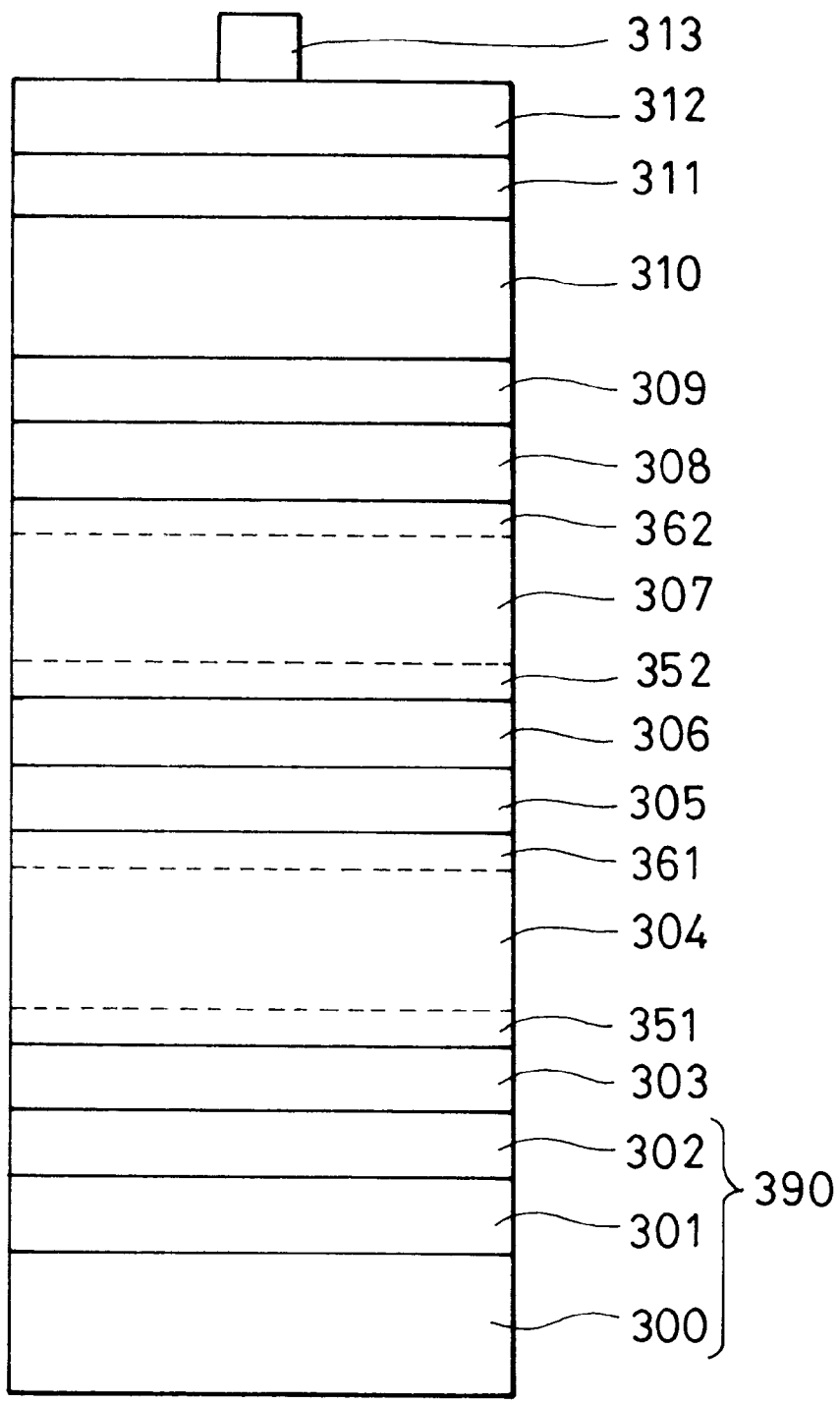
FIG. 3 is a sectional view schematically showing the construction of still another embodiment of a photovoltaic element manufactured according to the present invention.

Examples of the structure of a photovoltaic element manufactured by the method of the present invention will be described with reference to FIGS. 1 to 3. FIGS. 1, 2 and 3 show respectively the element having one pin-structure, the element having two pin-structures, and the element having three pin-structures.

FIG. 1 is a sectional view schematically showing an example of the so-called single type photovoltaic element having one pin-structure. This type photovoltaic element is divided into two structures; one wherein light is irradiated from the side opposite to a substrate and the other wherein light is irradiated from the substrate side.

When light is irradiated from the side opposite to a substrate, the photovoltaic element is made up by laminating a base member 190 comprised of a substrate 100, a reflecting layer 101 and a reflection enhancement layer (for example, transparent conductive layer) 102 (i.e. a substrate provided with a reflecting layer and a reflection enhancement layer), a first n-type layer (or p-type layer) 103, an n/i- (or p/i-) buffer layer 151, a first i-type layer 104, a p/i- (or n/i-) buffer layer 161, a first p-type layer (or n-type layer) 105, a transparent electrode 112, and a collector electrode 113 successively from below in the order named.

When light is irradiated from the substrate side, the photovoltaic element is made up with the same structure as shown in FIG. 1 except that a transparent member is used as the substrate 100, the reflecting layer 101 is replaced by a transparent conductive layer, the reflection enhancement layer 102 is replaced by a reflection preventing layer, and the transparent electrode 112 is replaced by a conductive layer serving also as a reflecting layer.

FIG. 2 is a sectional view schematically showing an example of the so-called tandem type photovoltaic element having two pin-structures. This type photovoltaic element is divided into two structures; one wherein light is irradiated from the side opposite to a substrate and the other wherein light is irradiated from the substrate side.

When light is irradiated from the side opposite to a substrate, the photovoltaic element is made up by laminating a base member 290 comprised of a substrate 200, a reflecting layer 201 and a reflection enhancement layer (for example, transparent conductive layer) 202 (i.e. a substrate provided with a reflecting layer and a reflection enhancement layer), a first n-type layer (or p-type layer) 203, an n/i- (or p/i-) buffer layer 251, a first i-type layer 204, a p/i- (or n/i-) buffer layer 261, a first p-type layer (or n-type layer) 205, a second n-type layer (or p-type layer) 206, a second i-type layer 207, a second p-type layer (or n-type layer) 208, a transparent electrode 212, and a collector electrode 213 successively from below in the order named.

When light is irradiated from the substrate side, the photovoltaic element is made up with the same structure as shown in FIG. 2 except that a transparent member is used as the substrate 200, the reflecting layer 201 is replaced by a transparent conductive layer, the reflection enhancement layer 202 is replaced by a reflection preventing layer, and the transparent electrode 212 is replaced by a conductive layer serving also as a reflecting layer.

FIG. 3 is a sectional view schematically showing an example of the so-called triple type photovoltaic element having three pin-structures. This type photovoltaic element is divided into two structures; one wherein light is irradiated from the side opposite to a substrate and the other wherein light is irradiated from the substrate side.

When light is irradiated from the side opposite to a substrate, the photovoltaic element is made up by laminating a base member 390 comprised of a substrate 300, a reflecting layer 301 and a reflection enhancement layer (for example, transparent conductive layer) 302 (i.e. a substrate provided with a reflecting layer and a reflection enhancement Layer), a first n-type layer (or p-type layer) 303, a first n/i- (or p/i-) buffer layer 351, a first i-type layer 304, a first p/i- (or n/i-) buffer layer 361, a first p-type layer (or n-type layer) 305, a second n-type layer (or p-type layer) 306, a second n/i- (or p/i-) buffer layer 352, a second i-type layer 307, a second p/i- (or n/i-) buffer layer 362, a second p-type layer (or n-type layer) 308, a third n-type layer (or p-type layer) 309, a third i-type layer 310, a third p--type layer (or n-type layer) 311, a transparent electrode 312, and a collector electrode 313 successively from below in the order named.

When light is irradiated from the substrate side, the photovoltaic element is made up with the same structure as shown in FIG. 3 except that a transparent member is used as the substrate 300, the reflecting layer 301 is replaced by a transparent conductive layer, the reflection enhancement layer 302 is replaced by a reflection preventing layer, and the transparent electrode 312 is replaced by a conductive layer serving also as a reflecting layer.

In the following description, the n-type layer, p-type layer and the i-type layer will be referred to as "n-layer", "p-layer" and "i-layer", respectively.

(Annealing)

It is effective that the annealing in the present invention be carried out on, for example, the interface between the p/i-buffer layer and the p-layer, the interface between the n/i-buffer layer and the n-layer, and the interface between the i-layer and the p-layer or/and the n-layer, i.e., that after forming one of the layers making up any of those interfaces, the annealing be carried out on the surface of the one layer. A suitable flow rate of hydrogen gas, helium gas or argon gas for use in the annealing to achieve the object of the present invention is preferably in the range of 100–10000 sccm, although it should be relevantly optimized depending on the size of a treatment chamber.

(Manufacture Apparatus and Method of Photovoltaic Element)

Figure 4:
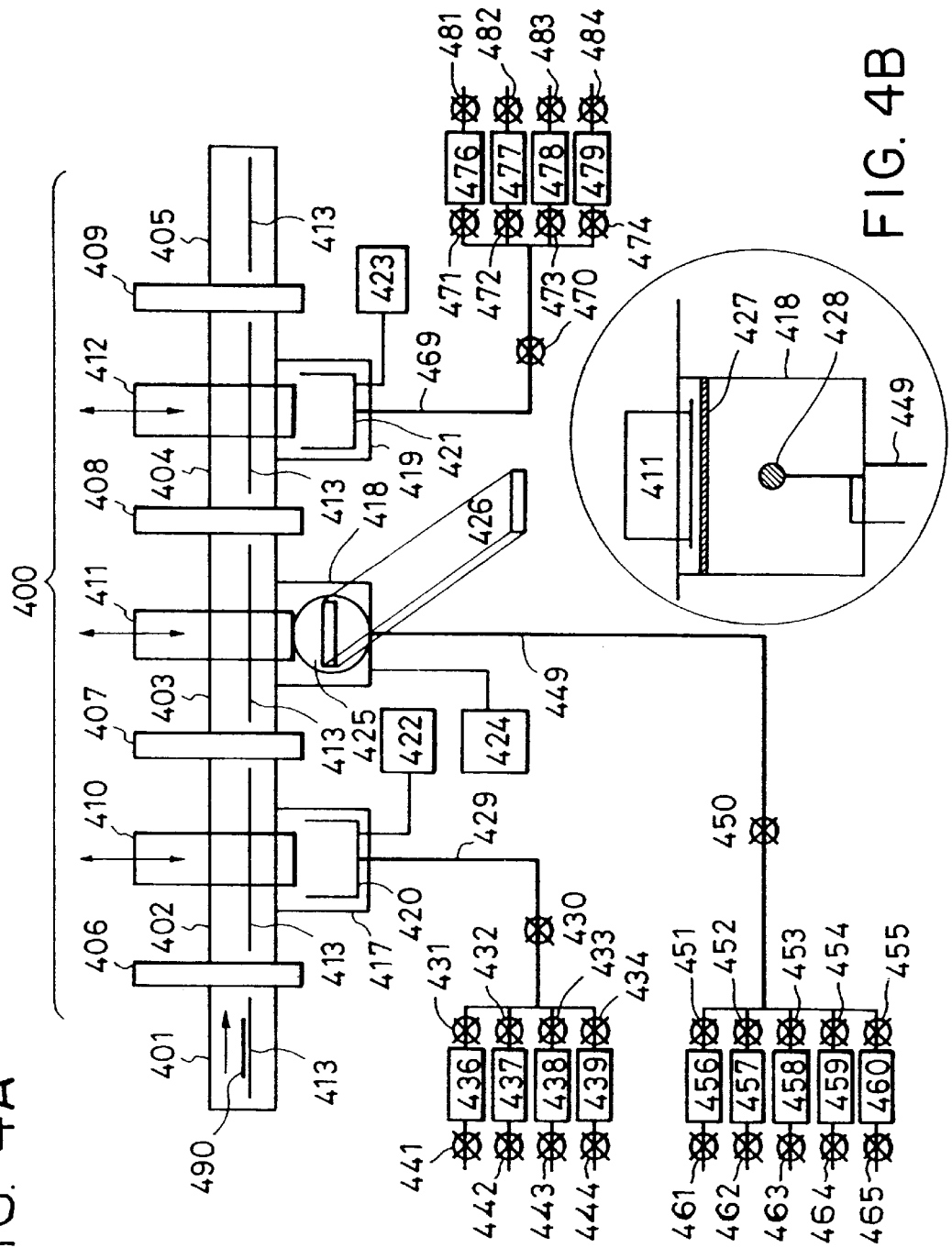
FIG. 4 is a view schematically showing one embodiment of a manufacture apparatus for the photovoltaic element, the apparatus employing the inline technique.
Figure 6:
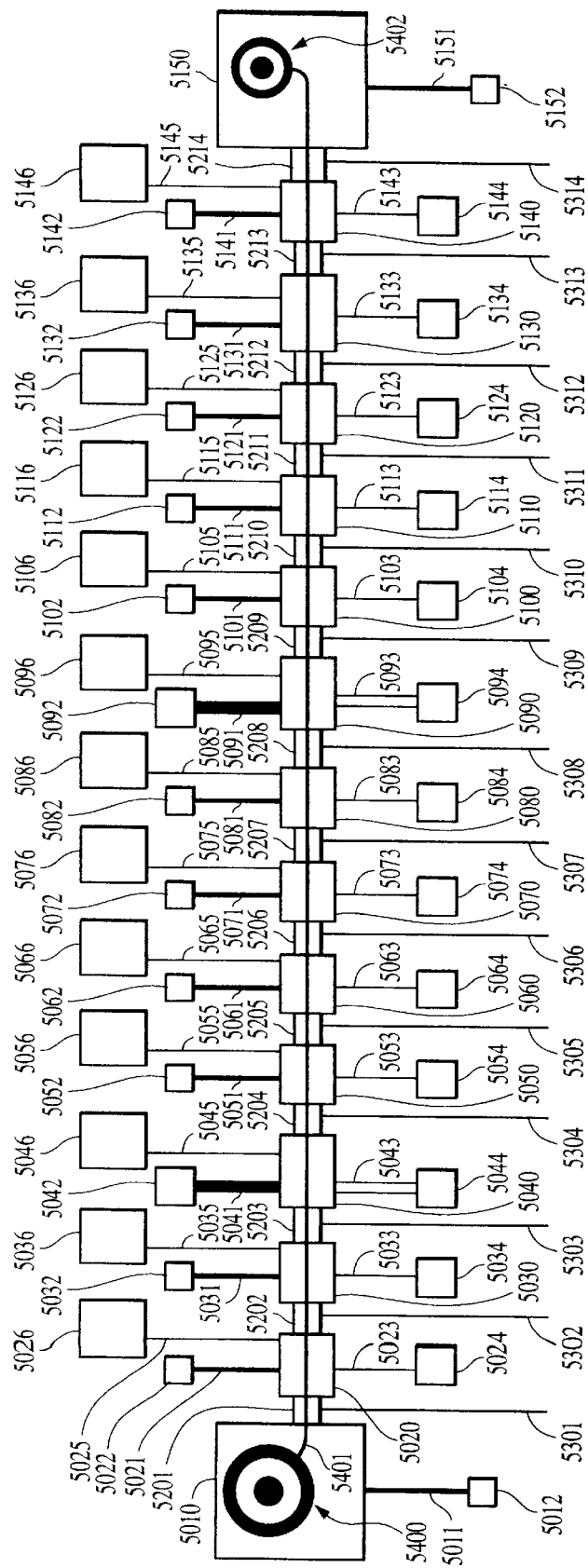
FIG. 6 is a view schematically showing one embodiment of a manufacture apparatus for the photovoltaic element, the apparatus employing the roll-to-roll technique.

A manufacture apparatus of the photovoltaic element used for embodying the method of the present invention is shown, by way of example, in FIGS. 4 and 6. FIG. 4 is a sectional view schematically showing one example of a manufacture apparatus called the inline type, and FIG. 6 is a sectional view schematically showing one example of a manufacture apparatus called the roll-to-roll type.

The inline type manufacture apparatus shown in FIG. 4 will be described below.

In the inline-type manufacture apparatus (method), a substrate (base member) having a predetermined configuration is continuously transferred through a plurality of chambers in which steps of forming different semiconductor layers, specifically formation of films and treatment of the films, are effected in sequence, thereby producing a photovoltaic element having any of the laminated structures shown in FIGS. 1 to 3, for example.

A manufacture apparatus 400 shown in FIG. 4 comprises a loading chamber 401, transfer chambers 402, 403, 404, an unloading chamber 405, gate valves 406, 407, 408, 409, substrate heating heaters 410, 411, 412, a substrate transferring rail 413, an n-layer (or p-layer) deposition chamber 417, an i-layer deposition chamber 418, a p-layer (or n-layer) i deposition chamber 419, plasma forming cups 420, 421, power sources 422, 423, 424, a microwave introducing window 425, a wave guide 426, gas introducing pipes 429, 449, 469, valves 430, 431, 432, 433, 434, 441, 442, 443, 444, 450, 451, 452, 453, 454, 455, 461, 462, 463, 464, 465, 470, 471, 472, 473, 474, 481, 482, 483, 484, mass flow controllers 436, 437, 438, 439, 456, 457, 458, 459, 460, 476, 477, 478,479, a shutter 427, a bias rod 428, a substrate holder 490, an evacuation apparatus (not shown), a microwave power source (not shown), vacuum gauges (not shown), a control device (not shown), etc.

The inline type manufacture apparatus shown in FIG. 4 will be described below following manufacture steps of the photovoltaic element in accordance with the inline process. The numbers put in parentheses represent the sequence of steps.

(I-1) All the chambers of the manufacture apparatus 400 are evacuated to a vacuum degree of $10^{-6}$ Torr or less, for example, by respective turbo molecular pumps (not shown) connected to the chambers.

(I-2) A base member (substrate) fabricated by vapor-depositing a reflecting layer of silver or the like on a stainless substrate and then vapor-depositing a reflection enhancement layer of zinc oxide or the like on the reflecting layer, is mounted onto the substrate holder 490.

(I-3) The holder 490 is put in the loading chamber 401. The door of the loading chamber 401 is closed and the loading chamber 401 is evacuated to a predetermined vacuum degree by a not-shown mechanical booster pump/rotary pump (MP/RP).

(I-4) When the loading chamber reaches the predetermined vacuum degree, the ME/RP is switched over to a turbo molecular pump to further continue evacuation until a vacuum degree of $10^{-6}$ Torr or less, for example.

(I-5) When the loading chamber reaches the vacuum degree of $10^{-6}$ Torr or less, for example, the gate valve 406 is opened, the holder 490 on the substrate transferring rail 413 is moved to the transfer chamber 402, and thereafter the gate valve 406 is closed again.

(I-6) The substrate heating heater 410 for the transfer chamber 402 is raised up to be out of interference with the substrate holder 490. The substrate holder is positioned such that the substrate locates just under the heater. The substrate heating heater 410 is then lowered down to bring the substrate (base member) into the n-layer deposition chamber 417.

(I-7) The substrate temperature is changed to a temperature suitable for deposition of an n-layer, and silicon atom containing gas for deposition of an n-layer, such as $SiH_4$ and $Si_2H_6$, and gas containing an element of Group V of the Periodic Table for deposition of an n-layer are introduced to the deposition chamber 417 through the valves 443, 444, the mass flow controllers 438, 439 and the valve 433, 434, 430. It is also preferable to appropriately adjust the flow rate of hydrogen gas depending on characteristics of the n-layer to be formed. Thus, material gases for deposition of an n-layer are introduced to the deposition chamber 417 and the opening degree of an evacuation valve (not shown) is varied so that the interior of the deposition chamber 417 becomes a desired vacuum degree in the range of 0.1–10 Torr, for example.

(I-8) RF power is introduced from the RF power source 422 to the plasma forming cup 420 to produce a plasma discharge, followed by maintaining the discharge for a desired period of time. In this manner, an n-type semiconductor layer is deposited in a desired thickness on the substrate (base member).

(I-9) After the end of deposition of the n-layer, the material gases are stopped from being introduced to the deposition chamber 417, and the residual gas in the chamber is purged out by hydrogen gas or helium gas. Subsequent to sufficient purging, the supply of hydrogen gas or helium gas is stopped and the pressure in the deposition chamber 417 is reduced down to $10^{-6}$ Torr or less, for example, by the turbo molecular pump.

(I-10) The gate valve 407 is opened, the holder 490 is moved to the transfer chamber 403, and thereafter the gate valve 407 is closed again.

(I-11) The position of the holder 490 is adjusted so that the substrate can be heated by the substrate heating heater 411. The substrate heating heater 411 is then brought into contact with the substrate to heat it to a predetermined temperature. At the same time, inert gas such as hydrogen gas or helium gas is introduced to the deposition chamber 418. This step is preferably performed under the same vacuum degree as suitable for subsequent deposition of an n/i-buffer layer.

(I-12) When the substrate reaches the predetermined temperature, the supply of the gas for heating the substrate is stopped and material gases for deposition of an n/i-buffer layer are supplied from a gas supply unit to the deposition chamber 418. For example, hydrogen gas, silane gas and germanium gas are supplied to the deposition chamber 418 through the gas introducing pipe 449 by opening the valves 462, 463, 464, setting respective desired flow rates with the mass flow controllers 457, 458, 459, and opening the valves 452, 453, 454, 450. At the same time, the supplied gases are evacuated by a diffusion pump (not shown) so that the vacuum degree in the deposition chamber 418 becomes a desired pressure.

(I-13) When the vacuum degree in the deposition chamber 418 is stabilized at the desired pressure, electric power of desired intensity is introduced from an RF power source (not shown) to the bias rod for applying a bias. An n/i-buffer layer is then deposited with the RF plasma CVD process. Preferably, the n/i-buffer layer is deposited at a lower deposition rate than an i-layer deposited thereafter.

(I-14) The substrate is heated to a predetermined temperature suitable for deposition of an i-layer. Heating the substrate is preferably performed while inert gas such as hydrogen gas or helium gas is introduced to flow through the deposition chamber 418 by opening the valve 461, setting a desired flow rate with the mass flow controller 456, and opening the valves 451, 450. Also, this step is preferably performed under the same vacuum degree as suitable for subsequent deposition of an i-layer.

(I-15) When the substrate reaches the predetermined temperature, the supply of the gas for heating the substrate is stopped and material gases for deposition of an i-layer are supplied from a gas supply unit to the deposition chamber 418. For example, hydrogen gas, silane gas and germanium gas are supplied to the deposition chamber 418 through the gas introducing pipe 449 by opening the valves 462, 463, 464, setting respective desired flow rates with the mass flow controllers 457, 458, 459, and opening the valves 452, 453, 454, 450. At the same time, the supplied gases are evacuated by a diffusion pump (not shown) so that the vacuum degree in the deposition chamber 418 becomes a desired pressure.

(I-16) When the vacuum degree in the deposition chamber 418 is stabilized at the desired pressure, electric power of desired intensity is introduced from a microwave power source (not shown) to the deposition chamber 418 through the wave guide 426 and the microwave introducing window 425. It is preferable that, concurrently with the introduction of microwave energy, bias power of desired intensity be also introduced from the external DC, RF or VHF power source 424 to the deposition chamber 418, i.e., the bias rod 428 for applying a bias, as shown in an enlarged view of the deposition chamber 418. In this manner, an i-layer is deposited in a desired thickness. After the i-layer has been deposited in a desired thickness, the application of microwave power and bias is stopped.

(I-17) The residual gas in the deposition chamber 418 is purged out, if necessary, by inert gas such as hydrogen gas or helium gas. After that, a p/i-buffer layer is deposited in a desired thickness on the i-layer in the same manner as for deposition of the above n/i-buffer layer. Subsequently, the residual gas in the deposition chamber 418 is purged out, if necessary, by inert gas such as hydrogen gas or helium gas.

(I-18) The annealing as a feature of the present invention can be carried out on the p/i-layer as follows. Gas cylinders, etc. are replaced by those ones required for the annealing described above, and gas lines are sufficiently purged of the residual gas. Then, base gas (hydrogen gas, helium gas or argon gas) and oxygen atom containing gas (1–1000 ppm), which are required to perform the annealing as a feature of the present invention, are introduced to the deposition chamber 418 at respective desired flow rates through the valves 461, 462, the mass flow controllers 456, 457, and the valves 451, 452, 450. Note that hydrogen gas, helium gas or argon gas may be added with boron atom containing gas and/or phosphorus atom containing gas in a predetermined flow rate (each 1–1000 ppm of the total gas amount). The opening degree of an evacuation valve (not shown) is varied so that the interior of the deposition chamber 418 becomes a desired vacuum degree. In this way, the annealing as a feature of the present invention is carried out for a predetermined period of time.

Depending on the condition of the surface of the substrate (base member) and the chamber inner wall, it is desired to properly change the flow rate of hydrogen gas, helium gas or argon gas (or the flow rate of total gas when any one of them is added with boron atom containing gas and/or phosphorus atom containing gas, when appropriate, as mentioned above), the flow rate of oxygen atom containing gas, the substrate temperature, etc. during the annealing step of these parameters, the flow rate of hydrogen gas, helium gas or argon gas is preferably changed such that it is relatively large at the beginning and reduces over time. The flow rate of oxygen atom containing gas is preferably changed such that it is relatively small at the beginning and increases over time.

(I-19) After completion of the annealing, the deposition chamber 418 is purged of the residual gas and the diffusion pump is switched over to a turbo molecular pump to further continue evacuation until the deposition chamber 418 reaches a vacuum degree of $10^{-6}$ Torr or less, for example. At the same time, the substrate heating heater 411 is raised up, allowing the holder 490 to move freely. The gate valve 408 is opened, the holder 490 is moved from the transfer chamber 403 to the transfer chamber 404, and thereafter the gate valve 408 is closed again.

(I-20) The holder 490 is positioned just under the substrate heating heater 412 and heated by the substrate heating heater 412. On this occasion, preferably, the substrate (base member) is heated while inert gas such as hydrogen gas or helium gas is kept under a pressure suitable for deposition of a p-layer during the heating by switching over a turbo molecular pump to an MP/RP for continued evacuation. When the substrate temperature is stabilized at a desired value, the supply of the inert gas such as hydrogen gas for heating the substrate is stopped and, $H_2$, $SiH_4$ and gas containing an element of Group III of the Periodic Table such as $BF_3$, i.e., material gases for deposition of a p-layer, are supplied to the deposition chamber 419 through the gas introducing pipe 469 by opening the valves 482, 483, 484, setting respective desired flow rates with the mass flow controllers 477, 478, 479, and opening the valves 472, 473, 474, 470.

(I-21) The opening degree of an evacuation valve is adjusted so that the interior of the deposition chamber 419 becomes a desired vacuum degree. After being stabilized at the desired vacuum degree, RF power is supplied from the RF power source 423 to the plasma forming cup 421. A p-layer is thus deposited for a desired period of time.

(I-22) After the end of deposition of the p-layer, the supply of both the RF power and the material gases are stopped and the residual gas in the deposition chamber 419 is sufficiently purged out by inert gas such as hydrogen gas or helium gas. Subsequent to purging, the MP/RP is switched over to the turbo molecular pump to further continue evacuation until a vacuum degree of $10^{-6}$ Torr or less. At the same time, the substrate heating heater 412 is raised up, the gate valve 409 is opened, and the holder 490 is moved to the unloading chamber 405, followed by closing the gate valve 409 again. When the temperature of the substrate holder 490 is lowered down to 100° C. or below, the door of the unloading chamber 490 is opened and the substrate holder is taken out to the exterior. Through the foregoing steps, the semiconductor layers of pin-structure subjected to the annealing as a feature of the present invention are formed on the substrate (base member).

(I-23) The substrate (base member) having the semiconductor layers of pin-structure formed thereon is set in a vacuum vaporizer for depositing a transparent electrode, where a transparent electrode is formed on the semiconductor layers. Further, the substrate (base member) formed with the transparent electrode is set in a vacuum vaporizer for depositing a collector electrode, where a collector electrode is vapor-deposited thereon.

A photovoltaic element (e.g., an element having the structure shown in FIG. 1) is manufactured through the foregoing steps (I-1) to (I-23).

While the annealing is carried out on the surface of the p/i-layer in the above-described embodiment, the present invention allows the annealing to be carried out on the surface of any other desired semiconductor layer. By carrying out the annealing as a feature of the present invention on the interface between the n/i-buffer layer and the i-layer as well, for example, characteristics of a photovoltaic element are further improved. The annealing as a feature of the present invention on the n/i-layer is performed as follows.

Gas cylinders, etc. are replaced by those ones required for the annealing as a feature of the present invention, and gas lines are sufficiently purged of the residual gas. Then, hydrogen gas, helium gas or argon gas (or any one of them added with boron atom containing gas and/or phosphorus atom containing gas in a predetermined flow rate, when appropriate) and oxygen atom containing gas, which are required to perform the annealing as a feature of the present invention, are introduced to the deposition chamber 418 at respective desired flow rates through the valves 461, 462, the mass flow controllers 456, 457, and the valves 451, 452, 450. The opening degree of the evacuation valve (not shown) is varied so that the interior of the deposition chamber 418 becomes a desired vacuum degree. In this way, the annealing as described above is carried out for a predetermined period of time.

Depending on the condition of the surface of the substrate (base member) and the chamber inner wall, it is desired to properly change the flow rate of hydrogen gas, helium gas or argon gas (or the flow rate of total gas when any one of them is added with boron atom containing gas and/or phosphorus atom containing gas in a predetermined flow rate, when appropriate), the flow rate of oxygen atom containing gas, the substrate temperature, etc. during the annealing step. Of these parameters, the flow rate of hydrogen gas, helium gas or argon gas is preferably changed such that it is relatively large at the beginning and reduces over time. The flow rate of oxygen atom containing gas is preferably changed such that it is relatively small at the beginning and increases over time. The substrate temperature is preferably changed such that it is relatively high at the beginning and lowers over time.

Further, the annealing can also be performed on the surface of the i-layer. More specifically, gas cylinders, etc. are replaced by those ones required for the annealing as a feature of the present invention, and gas lines are sufficiently purged of the residual gas. Then, hydrogen gas, helium gas or argon gas (or any one of them added with boron atom containing gas and/or phosphorus atom containing gas in a predetermined flow rate, when appropriate) and oxygen atom containing gas, which are required to perform the annealing as a feature of the present invention, are introduced to the deposition chamber 418 at respective desired flow rates through the valves 461, 462, the mass flow controllers 456, 457, and the valves 451, 452, 450. The opening degree of the evacuation valve (not shown) is varied so that the interior of the deposition chamber 418 becomes a desired vacuum degree. In this way, the annealing as described above is carried out for a predetermined period of time.

Depending on the condition of the surface of the substrate (base member) and the chamber inner wall, it is desired to properly change the flow rate of hydrogen gas, helium gas or argon gas (or the flow rate of total gas when any one of them is added with boron atom containing gas and/or phosphorus atom containing gas in a predetermined flow rate, when appropriate), the flow rate of oxygen atom containing gas, the substrate temperature, etc. during the annealing step. Of these parameters, the flow rate of hydrogen gas, helium gas or argon gas is preferably changed such that it is relatively large at the beginning and reduces over time. The flow rate of oxygen atom containing gas is preferably changed such that it is relatively small at the beginning and increases over time. The substrate temperature is preferably changed such that it is relatively high at the beginning and lowers over time.

In addition, preferably, the annealing according to the present invention is also carried out on the interface between the substrate (base member) and the n-layer. When annealing the interface between the substrate (base member) and the n-layer, the substrate is transferred to the chamber for deposition of an n-layer or the chamber for deposition of an i-layer in advance in the same manner as described above. While holding the substrate at a predetermined temperature, oxygen atom containing gas and hydrogen gas are introduced to the deposition chamber at respective desired flow rates in the same manner as described above. The pressure adjusting valve is regulated to establish an adequate vacuum degree in the deposition chamber. The annealing according to the present invention is thus carried out on the substrate for a predetermined period of time.

Figure 5:
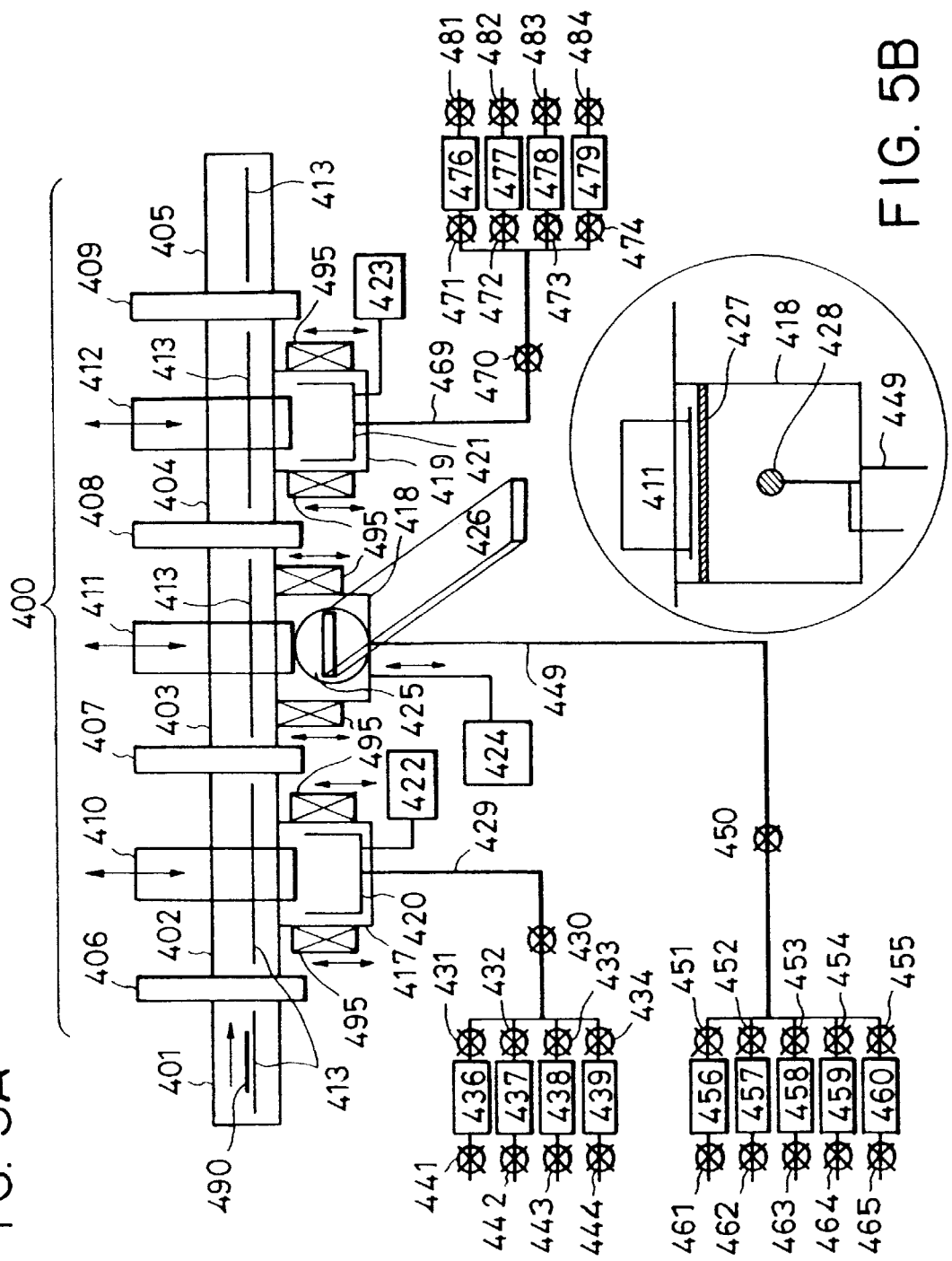
FIG. 5 is a view schematically showing another embodiment of a manufacture apparatus for the photovoltaic element, the apparatus employing the inline technique.

Moreover, in the manufacture process of a photovoltaic element employing the inline technique which has been described in connection with the apparatus shown in FIG. 4, it is also possible to apply a magnetic field in the range of 100–3000 G during the annealing of the semiconductor layer or the substrate, as mentioned before. In this case, for example, means for applying magnetic fields to chambers where semiconductor layers are to be formed are provided in the manufacture apparatus for a photovoltaic element. FIG. 5 shows an embodiment of the manufacture apparatus employing the inline technique which includes such magnetic field applying means. The function and operation of the structure and components of the apparatus shown in FIG. 5 are basically similar to those of the apparatus shown in FIG. 4 (the same reference numerals in FIGS. 4 and 5 designate the same components) except that a magnet (alnico) 495 is provided for each of the chambers 417, 418, 419 for forming semiconductor layers in such a manner that it is detachable in the direction of arrow.

When using such an apparatus in the above-described process of (I-1) to (I-23), the annealing can be performed on the p/i-layer in the step (I-18), for example, under a condition where a magnetic field of predetermined intensity is applied to the deposition chamber 418 by the magnet 495. In this case, the magnet may be detached or retracted from the chamber in the step (I-19). When the annealing with the application of a magnetic field is to be carried out on another semiconductor layer, the treatment can be achieved in the same manner as above in the step (I-18) by using the magnet associated with the chamber where that semiconductor layer is formed.

In that annealing with the application of a magnetic field, hydrogen gas, helium gas or argon gas may also be added with boron atom containing gas and/or phosphorus atom containing gas in a predetermined flow rate (each 1–1000 ppm of the total gas amount) in addition to the oxygen atom containing gas, as stated before.

A manufacture apparatus employing the roll-to-roll technique, shown in FIG. 6, will be described below.

In the roll-to-roll type manufacture apparatus (method), a strip-like substrate (base member) coiled into the form of a roll is moved through a plurality of interconnected chambers in which steps of forming different semiconductor layers and other layers (film formation) and treating these layers are effected successively on the substrate (base member), thereby producing a photovoltaic element having any of the laminated structures shown in FIGS. 1 to 3, for example.

A manufacture apparatus 5000 shown in FIG. 6 has, between a loading chamber 5010 for introducing a sheet-like substrate therethrough and an unloading chamber 5150, total thirteen chambers interconnected; i.e., a first n-layer forming (deposition) chamber 5020, a first RF-i- (n/i-) layer forming (deposition) chamber 5030, a first MW (microwave) -i-layer forming (deposition) chamber 5040, a first RF-i- (p/i-) layer forming (deposition) chamber 5050, a first p-layer forming (deposition) chamber 5060, a second n-layer forming (deposition) chamber 5070, a second RF-i-(n/i-) layer forming (deposition) chamber 5080, a second MW (microwave) -i-layer forming (deposition) chamber 5090, a second RF-i-(p/i-) layer forming (deposition) chamber 5100, a second p-layer forming (deposition) chamber 5110, a third n-layer forming (deposition) chamber 5120, a third RF-i-layer forming (deposition) chamber 5130, and a third p-layer forming (deposition) chamber 5140.

Adjacent twos of the above chambers are connected to each other through one of gas gates (5201, 5202, 5203, 5204, 5205, 5206, 5207, 5208, 5209, 5210, 5211, 5212, 5213, 5214). Also, connected to the gas gates are respectively gas supply pipes (5301, 5302, 5303, 5304, 5305, 5306, 5307, 5308, 5309, 5310, 5311, 5312, 5313, 5314).

The loading chamber 5010, the unloading chamber 5150, and the deposition chambers 5010–5140 are connected respectively to evacuation pumps (5012, 5022, 5032, 5042, 5052, 5062, 5072, 5082, 5092, 5102, 5112, 5122, 5132, 5142, 5152) through evacuation pipes (5011, 5021, 5031, 5041, 5051, 5061, 5071, 5081, 5091, 5101, 5111, 5121, 5141, 5151).

The deposition chambers 5010–5140 are connected respectively to mixers (5026, 5036, 5046, 5056, 5066, 5076, 5086, 5096, 5106, 5116, 5126, 5136, 5146) through material gas supply pipes (5025, 5035, 5045, 5055, 5065, 5075, 5085, 5095, 5105, 5115, 5125, 5135, 5145).

Further, the deposition chambers 5010–5140 are connected respectively to RF power sources (5024, 5034, 5044, 5054, 5064, 5074, 5084, 5094, 5104, 5114, 5124, 5134, 5144) through RF supply coaxial cables (5023, 5033, 5043, 5053, 5063, 5073, 5083, 5093, 5103, 5113, 5123, 5133, 5143).

In the loading chamber 5010 and the unloading chamber 5150, a sheet feed jig 5400 and a sheet coiling jig 5402 are disposed respectively. A sheet-like substrate (base member) 5401 is fed out from the sheet feeding jig 5400, passes the thirteen deposition chambers, and is coiled over the sheet coiling jig 5402.

Though not shown, connected to the MW (microwave) - i-layer deposition chambers are coaxial cables and power sources for applying biases, evacuated gas treating devices, etc.

The roll-to-roll type manufacture apparatus shown in FIG. 6 will be described below following manufacture steps of a photovoltaic element in accordance with the roll-to-roll process. The numbers put in parentheses represent the sequence of steps.

(R-1) A sheet-like substrate (i.e. base member) having a reflecting layer of Ag (or Al—Si, etc.) and a reflection enhancement layer of ZnO or the like both formed on a stainless substrate are coiled into the form of a roll and then set in the loading chamber 5010 for introducing a sheet-like substrate therethrough.

(R-2) The sheet-like substrate (base member) is extended through all the deposition chambers and all the gas gates for connection to the sheet coiling jig 5402 in the unloading chamber 5150. After evacuating the deposition chambers by associated evacuation apparatus (not shown) to $10^{-3}$ Torr or below, hydrogen gas is supplied to each of the deposition chambers from the mixers 5026, 5036, 5046, 5056, 5066, 5076, 5086, 5096, 5106, 5116, 5126, 5136, 5146 for forming respective deposition films.

(R-3) Hydrogen gas is supplied to each of the gas gates 5201, 5202, 5203, 5204, 5205, 5206, 5207, 5208, 5209, 5210, 5211, 5212, 5213, 5214 from associated gate gas supply units. The flow rates of hydrogen gas supplied to the gas gates are required to be set so that material gases in the adjacent deposition chambers will not mix with each other. Preferable flow rates depend on the spacing between the adjacent gas gates through which the sheet-like substrate passes. When the spacing is in the range of 0.5–5 mm, for example, hydrogen gas is preferably introduced at a flow rate in the range of 200–3000 sccm.

(R-4) The sheet-like substrate (base member) 5401 is heated to a predetermined temperature by respective substrate heating heaters disposed in the deposition chambers. When the substrate temperature is stabilized, the hydrogen gas supplied to each deposition chamber is switched over to desired material gases to be deposited in that deposition chamber. After the switchover to the material gases, the opening degree of an evacuation valve of each evacuation apparatus is adjusted so that a desired vacuum degree is created in each deposition chamber.

(R-5) The sheet-like substrate (base member) 5401 is started to move. After the vacuum degree has been stabilized, RF power or MW (microwave) power for generating a plasma is supplied to each deposition chamber. In this way, photovoltaic elements each having three pin-structures laminated on the sheet-like substrate are formed.

(R-6) After forming photovoltaic elements over a full length of one roll, the plasma discharge is stopped and a pinch valve (for holding the substrate between rubber plates to maintain a vacuum) attached to the gas gate 5201 is closed. While leaking nitrogen gas to the loading chamber 5010 for introducing a sheet-like substrate therethrough, another sheet-like substrate 5401 coiled into the form of a roll is set in the loading chamber 5010. An end of this succeeding sheet-like substrate 5401 is connected by welding to an end of the preceding sheet-like substrate sealingly held by the pinch valve.

(R-7) The loading chamber 5010 is closed and evacuated to a predetermined vacuum degree. The pinch valve is opened and the plasma discharge is resumed to start formation of photovoltaic elements again. Simultaneously, the sheetlike substrate is started to move.

By repeating the foregoing process, photovoltaic elements are formed on sheet-like substrates (base member) each coiled into the form of a roll in a successive manner.

As details of the manufacture apparatus, shown in FIG. 6, employing the roll-to-roll technique, one example of a deposition film forming chamber 601 using the RF plasma CVD process will be described below with reference to FIG. 7.

Figure 7:
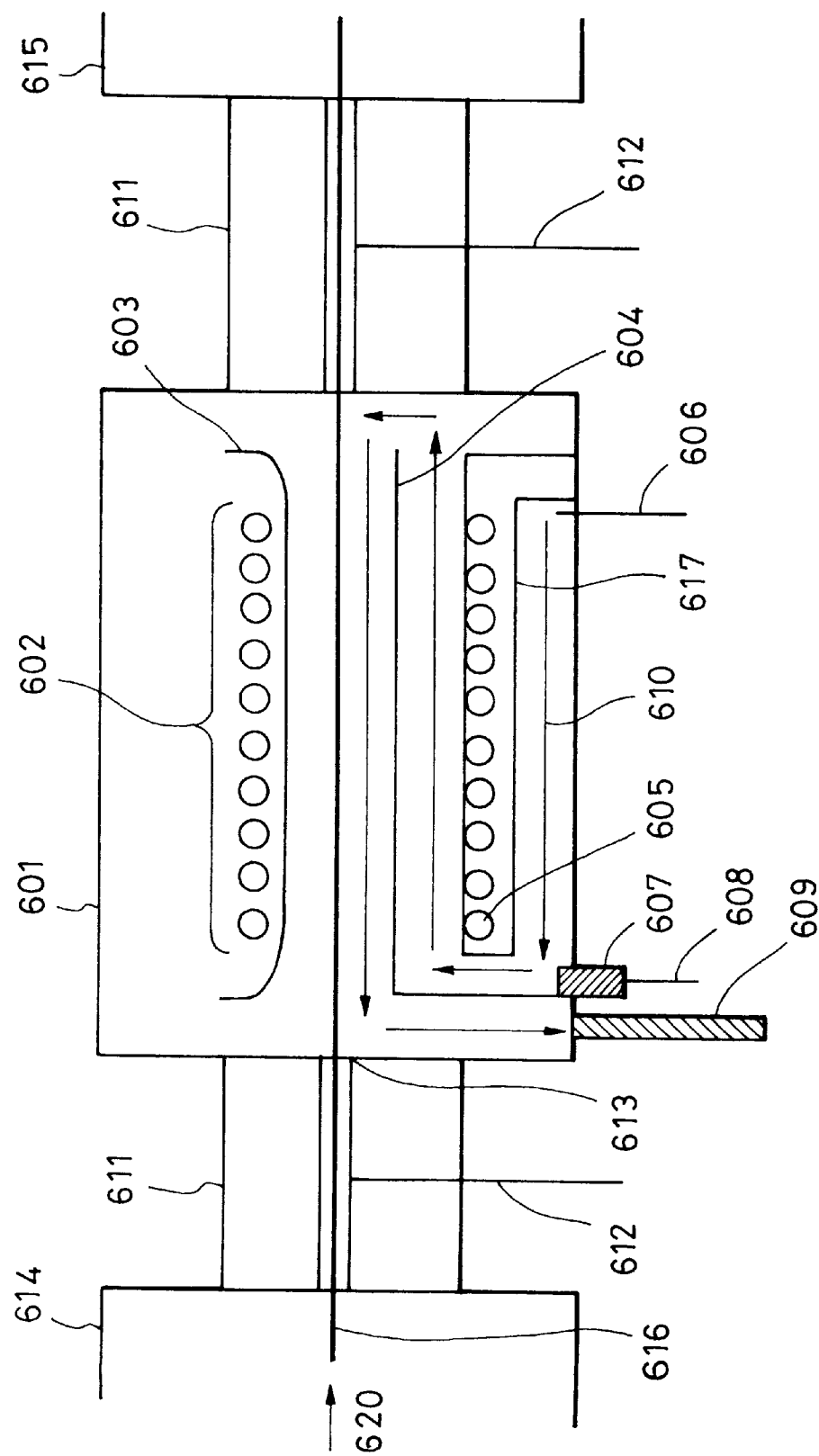
FIG. 7 is a view showing one example of a deposition film forming chamber with the RF plasma CVD process which is applicable to the apparatus shown in FIG. 6.

The deposition film forming chamber 601 shown in FIG. 7 comprises lamp heaters 602 disposed to face on one side a sheet-like substrate (base member) 616 for heating substrate, a control plate 603 disposed in surrounding relation to the lamp heaters 602 for establishing a desired distribution of the substrate temperature, an electrode 604 in the form of a flat plate or a grid for introducing RF power, heaters 605 for preheating material gases, these electrode 604 and the heaters 605 being disposed to face and substantially parallel to the other side of the sheet-like substrate 616, a material gas introducing pipe 606 projecting outward from the chamber, gas gates 611 for connection to adjacent deposition chambers 614 and 615, gas supply pipes 612 projecting outward from the gas gates, and gas gate spacing adjusting plates 613. The sheet-like substrate 616 is fed to pass the chamber 601 in the direction of arrow 620. Also, the material gases flow within the chamber 610 in the direction of arrows 610.

The material gases for the RF plasma CVD process are heated by the heaters 605 for preheating material gases, whereupon impurities contained in the material gases react with silane-base material gas and are deposited on the wall are surface. As a result, impurities contained in the material gases are reduced and a good deposition film can be formed.

Also, because the material gases are activated by preheating the material gases, a deposition film can be formed with relatively low RF power. Specifically, this means that when laminating multiple layers, the underlying layer is less damaged and hence interfacial levels between the layers can be reduced. In particular, when a layer is formed with the RF plasma CVD process to lie over an MW (microwave) -i-layer of a photovoltaic element manufactured according to the present invention, preheating the material gases for the RF plasma CVD process is very effective to prevent diffusion of chloride atoms contained in the MW-i-layer and improve characteristics of the photovoltaic element. A preferable temperature range is 150–450° C. measured in terms of gas temperature.

The lamp heaters 602 for heating the sheet-like substrate are usually arranged so that the substrate temperature becomes uniform in the chamber 601. For forming an RF-i-layer, however, the lamp heaters 602 are preferably arranged so that the substrate temperature lowers toward an n-layer or/and a player, with a view of increasing the photo-voltage of a resulting photovoltaic element.

Further, it is important that cooling pipes be arranged over an outer wall of the chamber in surrounding relation to the RF plasma discharge space for circulation of cooling water. By cooling the chamber outer wall, impurities due to degassing from the chamber outer wall can be prevented from mixing into a deposition film. Preferably, the temperature of the chamber outer wall is cooled to 50° C. or below.

As details of the manufacture apparatus, shown in FIG. 6, employing the roll-to-roll technique, one example of a deposition film forming chamber 701 using the microwave plasma CVD process will be described below with reference to FIG. 8.

Figure 8:
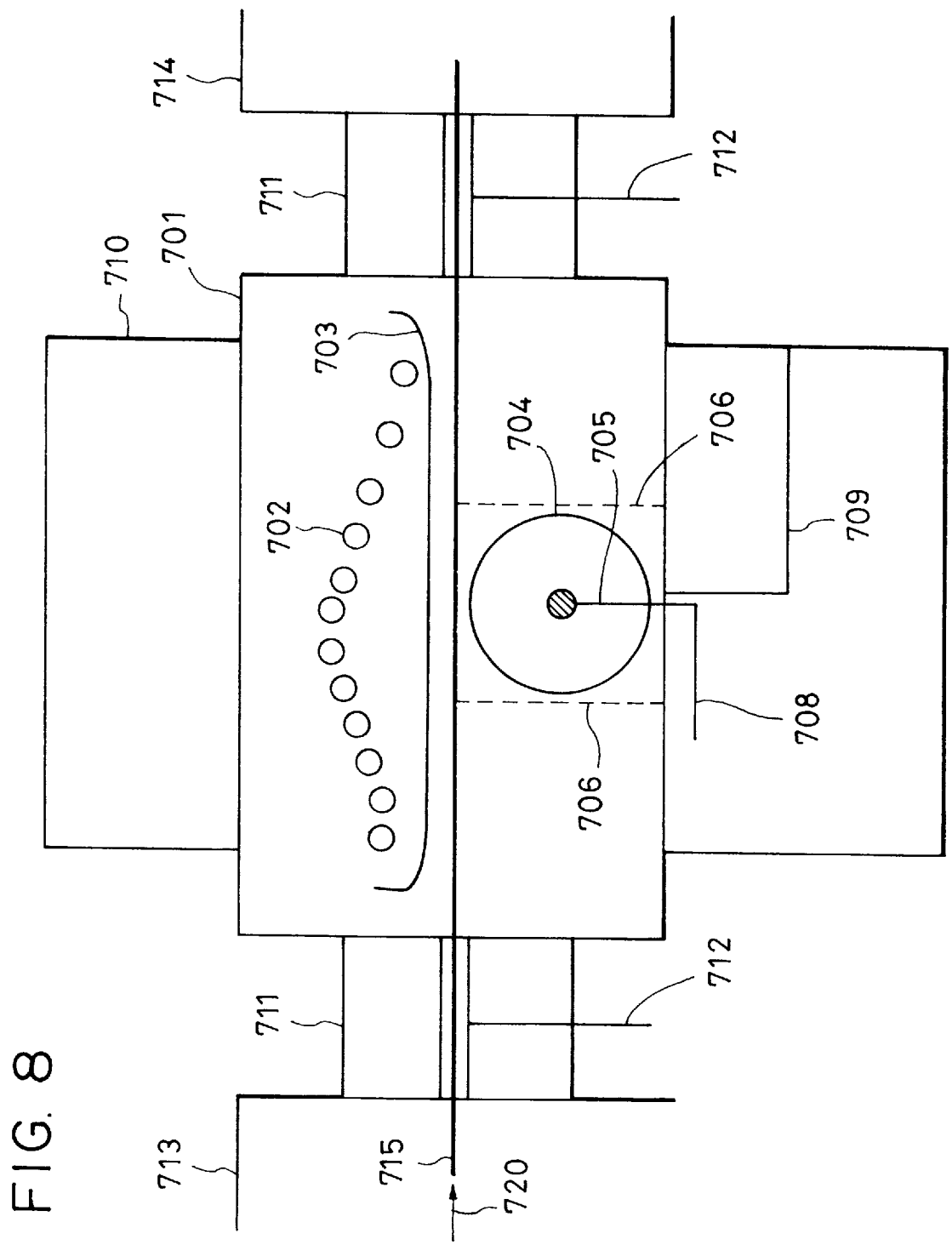
FIG. 8 is a view showing one example of a deposition film forming chamber with the microwave CVD process which is applicable to the apparatus shown in FIG. 6.

The deposition film forming chamber 701 shown in FIG. 8 comprises heaters 702, disposed to face on one side a sheet-like substrate (base member) 715 for heating the substrate, a control plate 703 disposed between the heaters 702 and the substrate 715 for adjusting the substrate temperature, an MW (microwave) introducing window 704, a bias electrode 705 for applying a bias, mesh plates 706 for controlling a spread of plasma discharge, a bias applying cable 08, a material gas introducing pipe 709, these components 704 to 709 being disposed on the other side of the substrate 715, a diffusion pump 710, gas gates 711 for connection to adjacent deposition chambers 713 and 714, and gas supply pipes 712 projecting outward from the gas gates. Further, connected to the chamber 701 are, though not shown, a bias applying power source, a mixing panel, a mechanical booster pump, a rotary pump and so on. The sheet-like substrate 715 is fed to pass the chamber 701 in the direction of arrow 720.

In the chamber 701 for deposition of an MW (microwave) -i-layer, preferably, the heaters 702 for heating the substrate are arranged so that the substrate temperature becomes uniform in the chamber. To this end, by way of example, the heaters 702 are preferably arranged to lie in the conical form as shown in FIG. 7. Further, it is preferable that cooling pipes be arranged over an outer wall of the chamber to cool the chamber outer wall. By cooling the chamber outer wall, degassing from the chamber outer wall can be prevented to a minimum and a good deposition film can be formed.

Preferably, the temperature of the chamber outer wall is cooled to 50° C. or below with a view of reducing the degassing.

In the above manufacture apparatus employing the roll-to-roll technique, the annealing as a feature of the present invention is carried out by introducing hydrogen gas, helium gas or argon gas, which contains 1–1000 ppm of the oxygen atom containing gas mentioned above, to flow in addition to gas supplied from the gas gates interconnecting the deposition film forming chambers in which layers to be treated are formed. Note that hydrogen gas, helium gas or argon gas may be added with boron atom containing gas and/or phosphorus atom containing gas in a predetermined flow rate (each 1–1000 ppm of the total gas amount), as stated before.

The gas cylinders used in the manufacture method of the photovoltaic element subjected to the annealing according to the present invention can be replaced, as needed, by different ones required for the treatment. On this occasion, it is preferable to sufficiently heat and purge, gas lines of the residual gas.

A photovoltaic element having pin- structures laminated in multiple can be formed by repeating the deposition of films any desired number of times in the n-layer deposition chamber, the i-layer deposition chamber, and the p-layer deposition chamber of the manufacture apparatus 400.

Moreover, in the manufacture process of a photovoltaic element employing the roll-to-roll technique which has been described in connection with the apparatus shown in FIG. 6, the deposition film forming chamber using the RF plasma CVD process shown in FIG. 7 and the deposition film zsd=forming chamber using the microwave plasma CVD process shown in FIG. 8, it is also possible to apply a magnetic field in the range of 100–3000 G during the annealing of the semiconductor layer or the substrate (base member), as mentioned before. In this case, magnetic field applying means are provided in the manufacture apparatus for a photovoltaic element, e.g., in the gas gates interconnecting the deposition film forming chambers where layers to be treated are formed.

Figure 9:
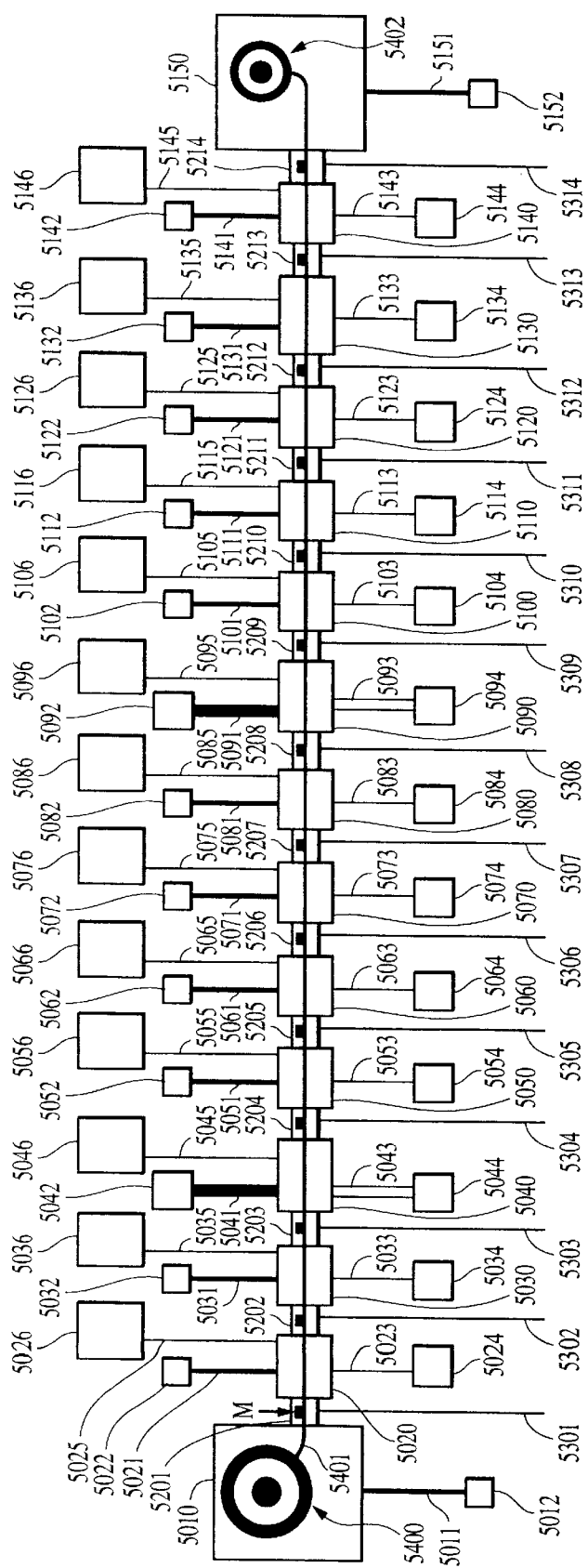
FIG. 9 is a view schematically showing another embodiment of a manufacture apparatus for the photovoltaic element, the apparatus employing the roll-to-roll technique.

FIG. 9 shows an embodiment of the manufacture apparatus employing the roll-to-roll technique which includes such magnetic field applying means. The function and operation of the structure and components of the apparatus shown in FIG. 9 are basically similar to those of the apparatus shown in FIG. 6 (the same reference numerals in FIGS. 6 and 9 designate the same components) except that a magnet roller (alnico) M is provided for each of the gas gates (5201 to 5214) in contact with its outer wall.

Figure 10:
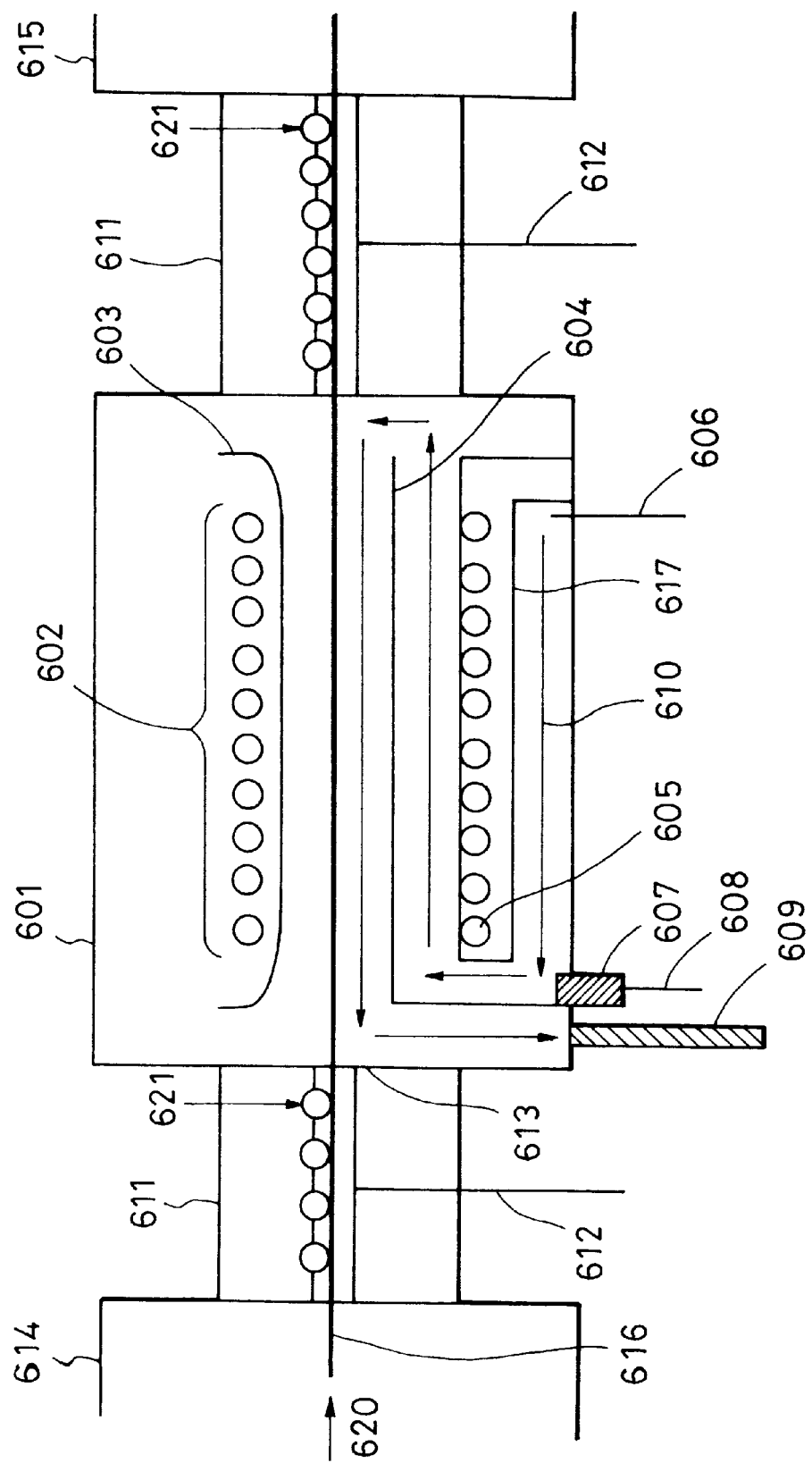
FIG. 10 is a view showing one example of a deposition film forming chamber with the RF plasma CVD process which is applicable to the apparatus shown in FIG. 9.
Figure 11:
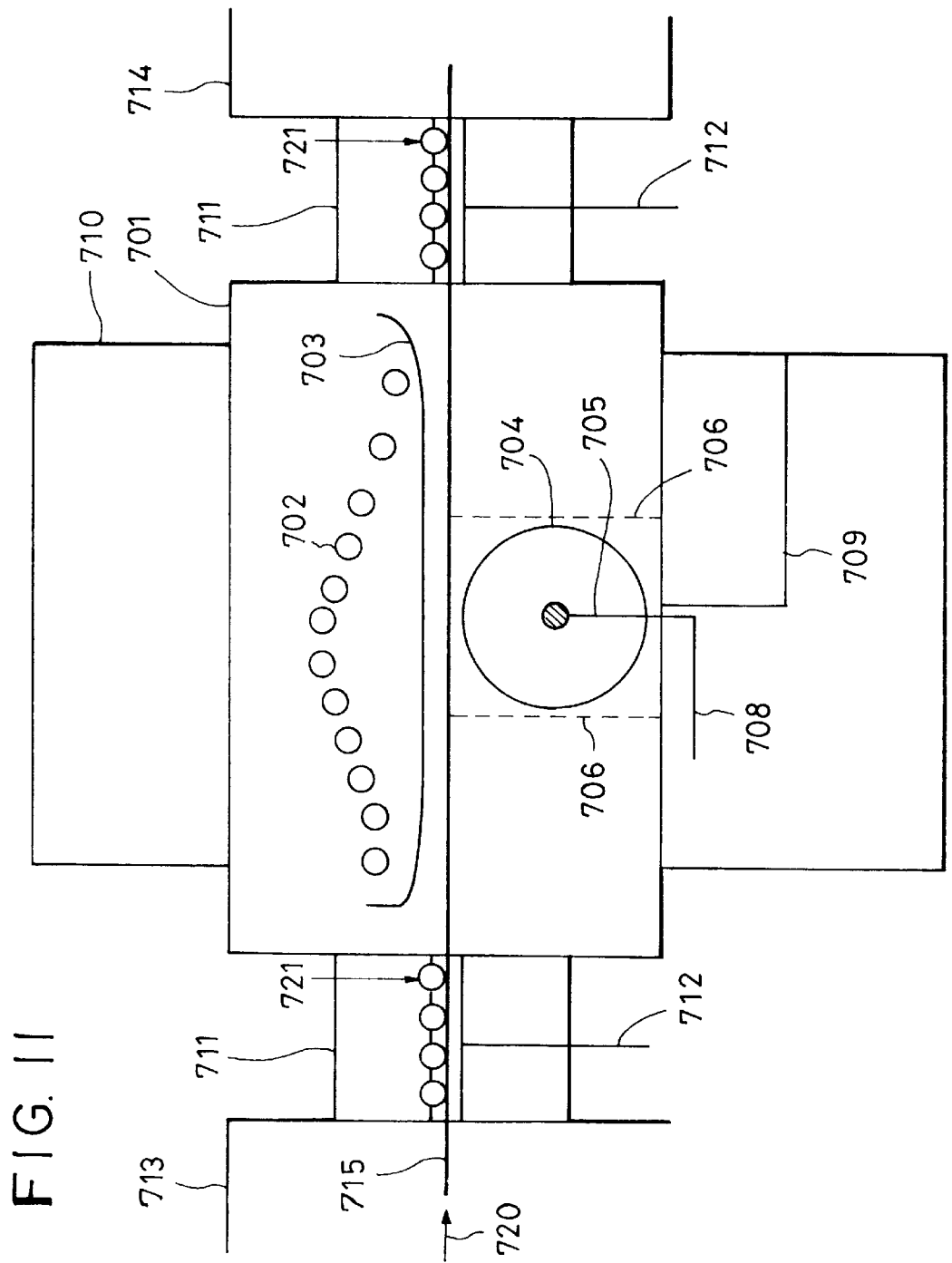
FIG. 11 is a view showing one example of a deposition film forming chamber with the microwave CVD process which is applicable to the apparatus shown in FIG. 9.

Further, FIG. 10 shows one example of deposition film forming chambers using the RF plasma CVD process which make up the apparatus shown in FIG. 9, and FIG. 11 shows one example of deposition film forming chambers using the microwave plasma CVD process which makes up the apparatus shown in FIG. 9. The function and operation of the structure and components of the deposition film forming chambers shown in FIGS. 10 and 11 are basically similar to those of the deposition film forming chambers shown in FIGS. 7 and 8, respectively, (the same reference numerals in these figures designate the same components) except that alnico-base magnet rollers 621, 721 are provided respectively for each of the gas gates (611 in FIG. 10 and 711 in FIG. 11) in contact with its outer wall.

When manufacturing photovoltaic elements with the roll-to-roll process by using such an apparatus, the annealing as described above is preferably carried out on the semiconductor layer or the substrate (base member) under a condition where a magnetic field is applied to the interior of the gas gate by the magnet rollers disposed outside the gate.

In that annealing with the application of a magnetic field, hydrogen gas, helium gas or argon gas may also be added with boron atom containing gas and/or phosphorus atom containing gas in a predetermined flow rate (each 1–1000 ppm of the total gas amount) in addition to the oxygen atom containing gas, as stated before.

Embodiments of components making up the photovoltaic element manufactured according to the present invention, in particular, components of the photovoltaic elements having the structures shown in FIGS. 1 to 3, will be described hereunder.

(Substrate/100 in FIG. 1, 200 in FIG. 2, 300 in FIG. 3)

Preferably, a material of the substrate used in the photovoltaic element according to the present invention is less subjected to deformation and torsion at the temperature required to form a deposition film, has a desired level of strength, and has electrical conductivity. It is also preferable that adhesion of the reflecting layer and the reflection enhancement layer to the substrate will not be reduced even after the hydrogen plasma treatment, i.e., the annealing, as a feature of the present invention is carried out after deposition of the reflecting layer and the reflection enhancement layer.

More specifically, the substrate can be formed of, e.g., any of metallic sheets of stainless steel, aluminum and alloys thereof, iron and alloys thereof, copper and alloys thereof, etc. and composites of several ones selected from these metallic sheets; sheets fabricated by coating, over -the surfaces of those metallic sheets and composites, metallic thin films of different materials and/or insulating thin films such as $SiO_2$, $Si_3N_4$, $Al_2O_3$ and AlN and by sputtering, vapor-deposition, plating, etc.; and heat-resistant resin sheets of polyimide, polyamide, polyethylene terephtalate, epoxy, etc. or composites of these resin sheets and glass fibers, carbon fibers, boron fibers, etc., on surfaces of which single metals or alloys thereof, transparent conductive oxides, etc. are coated by sputtering, vapor-deposition, plating, etc. to provide conductivity.

It is desired that the substrate thickness be as thin as possible in consideration of the cost, the storage space and other factors so long as the carrier possesses the strength enough to maintain a curved shape formed when it is moved. More specifically, the substrate thickness is preferably in the range of 0.01–5 mm, more preferably 0.02–2 mm, optimally 0.05–1 mm. In the case of forming the substrate of a metallic sheet or the like, a desired level of strength can be easily obtained even if the substrate has a relatively thin thickness.

The carrier width is not subjected to particular limitations and is determined depending on the size of vacuum vessels and so on.

The substrate has no particular limitations in its length and may be set to such a length that the substrate is just coiled into the form of a roll, or may have a very large length extended by joining long substrates to each other by welding or the like.

According to the method of the present invention, the substrate is heated/cooled in a short time, and it is not desired for a temperature distribution to spread in the lengthwise direction of the substrate. For this reason, preferably, the substrate has relatively small thermal conductivity in the direction of movement of the substrate and relatively large thermal conductivity in the direction of thickness of the substrate so that the surface temperature of the substrate follows heating/cooling.

Reducing the substrate thickness is expedient in order that the thermal conductivity of the substrate is decreased in the direction of movement thereof and increased in the direction of thickness thereof. When the substrate is uniform, the value of (thermal conductivity)×(thickness) is preferably not higher than $1 \times 10^{-1}$ W/K, more preferably not higher than $5 \times 10^{-2}$ W/K. (Reflecting Layer/layer 101 in FIG. 1, layer 201 in FIG. 2, layer 301 in FIG. 3)

Examples of a material of the reflecting layer used in the photovoltaic element according to the present invention include metals such as Ag, Au, Pt, Ni, Cr, Cu, Al, Ti, Zn, Mo and W, or alloys thereof. A thin film of any of these metals is formed by vacuum vapor-deposition, electron beam vapor-deposition, sputtering, etc. It must be taken into account that a formed metallic thin film will not give rise to a resistance component for an output of the photovoltaic element. Therefore, the sheet resistance value of the reflecting layer is preferably not higher than 50Ω, more preferably not higher than 10Ω.

When the substrate is light transparent and light is irradiated to the photovoltaic element from the transparent substrate side, a transparent conductive layer is formed in place of the reflecting layer. Materials suitable to such a transparent conductive layer are, e.g., tin oxide and indium oxide or alloys thereof. Preferably, the transparent conductive layer is formed in such a thickness as meeting the condition of preventing reflection. The sheet resistance value of the transparent conductive layer is preferably not higher than 50Ω, more preferably not higher than 10Ω.

(Reflection Enhancement Layer/layer 102 in FIG. 1, layer 202 in FIG. 2, layer 302 in FIG. 3)

Preferably, the reflection enhancement layer used in the photovoltaic element according to the present invention is preferably a transparent layer having light transmissivity not less than 85% so that light from the sun, white fluorescent lamps, etc. is efficiently absorbed in the semiconductor layers, and from the electrical point of view, has a sheet resistance value not higher than 100Ω so that the layer will not give rise to a resistance component for an output of the photovoltaic element. Materials having such properties are, e.g., metal oxides such as $SnO_2$, $In_2O_3$, ZnO, CdO, $Cd_2SnO_4$ and ITO ($In_2O_3$+$Sno_2$).

The reflection enhancement layer is laminated on the substrate (reflecting layer) in the photovoltaic element, and when a photovoltaic structure is formed on a transparent substrate and light is irradiated from the transparent substrate side, it is laminated on a p-layer or an n-layer. It is therefore necessary to select a material of the reflection enhancement layer which has good adhesion to those adjacent members.

Further, preferably, the reflection enhancement layer is deposited in such a thickness as meeting the condition of enhancing reflection. The reflection enhancement layer can be formed by any of such processes as resistance heating vapor-deposition, electron beam heating vapor-deposition, sputtering and spraying, that is properly selected depending on characteristics of the adjacent member.

(i-Type Semiconductor Layer/layer 104 in FIG. 1, layer 204 etc. in FIG. 2, layer 304 etc. in FIG. 3)

The i-type semiconductor layer (i-layer) in the photovoltaic element according to the present invention serves to generate and transport charge carriers when light is irradiated to a pin-junction. Particularly, the i-layer plays an important role in the photovoltaic element using an amorphous semiconductor material made of a metal of Group IV or an alloy based thereon.

Usable as the i-layer is also a layer being slightly p-or n-type. The i-layer being slightly p- or n-type is formed by, e.g., adding hydrogen atoms (H, D) or halogen atoms (X) in an amorphous semiconductor material. These inclusions play an important role as explained below.

Hydrogen atoms (H, D) or halogen atoms (X) contained in the i-layer serve to compensate dangling bonds in the i-layer and improve the product of mobility and lifetime of carriers in the i-layer. Further, those atoms serve to compensate interfacial levels of the interfaces of p-/i-layers and n-/i-layers, and are hence effective to improve the photovoltage, photocurrent and photo-response of the photovoltaic element. The content of hydrogen atoms or/and halogen atoms contained in the i-layer is optimally in the range of 1–40 at %. In particular, hydrogen atoms or/and halogen atoms are preferably distributed such that the content increases nearer to the interfaces of the p-layer/i-layer and the n-layer/i-layer. In this respect, the content of hydrogen atoms or/and halogen atoms near those interfaces is preferably 1.1–2 times the content in the bulk. Further, the content of hydrogen atoms or/and halogen atoms is preferably varied with respect to the content of silicon atoms.

When the photovoltaic element manufactured according to the present invention includes a plurality of pin-structures, i-layers are preferably laminated such that their band gaps reduces gradually from the light incident side. Amorphous silicon or amorphous silicon carbide is used to form an i-layer having a relatively wide band gap and amorphous silicon germanium is used to form an i-layer having a relatively narrow band gap.

Amorphous silicon and amorphous silicon germanium are expressed by a-Si:H, a-Si:F, a-Si:H:F, a-SiGe:H, a-SiGe:F, a-SiGe:H:F, etc. depending on elements which serve to compensate dangling bonds. When using amorphous silicon germanium as the i-layer, the content of germanium is preferably varied in the direction of thickness of the i-layer. In particular, germanium is preferably distributed such that the content reduces continuously in the direction toward the n-layer and/or the p-layer. The distribution of germanium atoms in the direction of thickness of the i-layer can be adjusted by changing a flow rate ratio of germanium containing gas contained in the material gases.

Other than changing a flow rate ratio of germanium containing gas, the content of germanium atoms in the i-layer can also be similarly varied by changing a flow rate of hydrogen gas used for diluting the material gases. The germanium content in the deposition film (i-layer) can be increased by increasing the amount of diluting hydrogen gas.

The hydrogen plasma treatment employed in the present invention is effective to particularly improve electrical connection between the so-called graded band gap layer, in which the content of germanium atoms is continuously varied as mentioned above, and a buffer layer adjacent thereto.

More specifically, the i-type semiconductor layer of the pin-junction suitable for the photovoltaic element according to the present invention is formed of, e.g., i-type hydrogenated amorphous silicon (a-Si:H). Preferable characteristics of the i-type hydrogenated amorphous silicon (a-Si:H) are below: optical band gap ($E_g$); 1.60–1.85 eV, content of hydrogen atoms ($C_H$); 1.0–25.0%, AM; 1.5, photoconductivity, ($\sigma_p$) under irradiation of artificial sunlight of 100 mW/cm$^2$; not less than $1.0 \times 10^{-5}$ S/cm, dark conductivity ($\sigma_d$); not more than $1.0 \times 10^{-9}$ S/cm, aback-tail slope based on constant photocurrent method (CPM); not more than 55 meV, and local level density; not more than $10^{17}$/cm$^3$. Also, amorphous silicon germanium as a semiconductor material used to form the i-layer having a relatively narrow band gap in the photovoltaic element according to the present invention preferably has characteristics below: optical band gap ($E_g$); 1.20–1.60 eV, content of hydrogen atoms ($C_H$); 1.0–25.0%, aback-tail slope based on constant photocurrent method (CPM); not more than 55 meV, and local level density; not more than $10^{17}$/cm$^3$.

The i-layer suitable for use in the photovoltaic element manufactured by the present invention is preferably deposited under conditions described below.

The amorphous semiconductor layer is preferably deposited with the RF, VHF or MW (microwave) plasma CVD process.

When depositing the i-layer with the RF plasma CVD process, an appropriate range of the substrate (base member) temperature is 100 to 350° C., an appropriate range of the vacuum degree in the deposition chamber is 0.05 to 10 Torr, and an appropriate range of the RF frequency is 1 to 50 MHz. In particular, the optimum RF frequency is 13.56 MHz. Also, an appropriate range of the RF power applied to the deposition chamber is 0.01 to 5 W/cm$^2$. Further, an appropriate range of the self-bias applied to the substrate by the RF power is 0 to 30 V.

When depositing the i-layer with the VHF plasma CVD process, an appropriate range of the substrate (base member) temperature is 100 to 450° C., an appropriate range of the vacuum degree in the deposition chamber is 0.0001 to 1 Torr, and an appropriate range of the VHF frequency is 60 to 99 MHz. Also, an appropriate range of the VHF power applied to the deposition chamber is 0.01 to 1 W/cm$^2$. Further, an appropriate range of the self-bias applied to the substrate by the VHF power is 10 to 1000 V. In addition, by providing a bias rod and introducing DC or RF to the deposition chamber in superposed relation or separately from VHF, characteristics of a deposited amorphous film can be improved. When a DC bias is introduced by using the bias rod, the bias rod is preferably charged to serve as a positive pole. When a DC bias is introduced to the substrate side, the substrate side is preferably charged to serve as a negative pole. When an RF bias is introduced, the area of an electrode receiving RF is preferably selected to be smaller than the substrate area.

When depositing the i-layer with the MW plasma CVD process, an appropriate range of the substrate (base member) temperature is 100 to 450° C., an appropriate range of the vacuum degree in the deposition chamber is 0.0001 to 0.05 Torr, and an appropriate range of the MW frequency is 100 MHz to 10 GHz. In particular, the optimum MW frequency is 2.45 GHz, Also, an appropriate range of the MW power applied to the deposition chamber is 0.01 to 1 W/cm$^2$. The MW power is optimally introduced to the deposition chamber through a wave guide. In addition, by providing a bias rod separately and introducing DC or RF to the deposition chamber as well as MW, characteristics of a deposited amorphous film can be improved. When a DC bias is introduced by using the bias rod, the bias rod is preferably charged to serve as a positive pole. When Et DC bias is introduced to the substrate side, the substrate side is preferably charged to serve as a negative pole. When an RF bias is introduced, the area of an electrode receiving RF is preferably selected to be smaller than the substrate area.

Silane-base material gas such as $SiH_4$, $Si_2H_6$, $SiF_4$ and $SiF_2H_2$ is appropriate to deposit the i-layer suitable for the method according to the present invention. For widening the band gap, such material gas is preferably added with gas containing carbon, nitrogen or oxygen. It is preferable that the gas containing carbon, nitrogen or oxygen be contained in a larger amount near the p-layer or/and the n-layer rather than being uniformly contained in the i-layer. By so distributing, the open-circuit voltage can be improved without interfering with mobility of charges in the-i-layer. Suitable examples of the carbon containing gas are $C_nH_{2n+2}$ (n; integer), $C_nH_{2n}$ (n; integer) and $C_2H_2$. Suitable examples of the nitrogen containing gas are $N_2$, NO, $N_2O$, $NO_2$ and $NH_3$. Suitable examples of the oxygen containing gas are $O_2$, $CO_2$ and $O_3$. Alternatively, those gases may also be introduced in any desired combination. An appropriate amount of the material gas(es) added for widening the band gap is 0.1 to 50%.

Moreover, characteristics of the i-layer are improved by adding an element of Group III or/and V of the Periodic Table thereto. Suitable examples of the element of Group III of the Periodic Table are B, Al and Ga. When adding B, in particular, B is preferably added by using gas such as $B_2H_6$ and $BF_3$. Suitable examples of the element of Group V of the Periodic Table are N, P and As. When adding P, in particular, the use of $PH_3$ is appropriate. An appropriate amount of the element of Group III or/and V of the Periodic Table added to the i-layer is 0.1 to 1000 ppm.

Characteristics of the photovoltaic element can be improved by forming an n/i-buffer layer or a p/i-buffer layer (the layers 151, 161, etc. in FIG. 1, the layers 251, 261, etc. in FIG. 2, and the layers 351, 361, 352, 262, etc. in FIG. 3) adjacent to the i-layer. Usable as such a buffer layer is a similar semiconductor layer as used for the i-layer. It is particularly preferable that the buffer layer be deposited at a lower deposition rate than the i-layer. An appropriate semiconductor used for the buffer layer has a wider band gap than used for the i-layer. In this respect, the band gap is preferably widened from the i-layer to the buffer layer in a smooth and continuous fashion.

The band gap of the buffer layer can be continuously changed as follows. The band gap is continuously narrowed by increasing the content of germanium atoms contained in a silicon-base non-single crystal semiconductor. On the other hand, the band gap is continuously widened by increasing the content of carbon atoms, oxygen atoms or/and nitrogen atoms contained in a silicon-base non-single crystal semiconductor. A ratio of the narrowest band gap to the widest band gap is preferably in the range of 1.01–1.5.

When adding an element of Group III or/and V of the Periodic Table to the buffer layer, it is preferable that the element of Group III of the Periodic Table be added to the n/i-buffer layer and the element of Group V of the Periodic Table be added to the p/i-buffer layer. By so adding, characteristics can be prevented from deteriorating due to diffusion of impurities from the n-layer or/and p-layer to the i-layer. (p-Type Semiconductor Layer, n-Type Semiconductor Layer/layers 103, 105, etc. in FIG. 1, layers 203, 205, etc. in FIG. 2, and layers 303, 305, etc. in FIG. 3)

The p-type semiconductor layer (p-layer) and n-type semiconductor layer (n-layer), which are used in the photovoltaic element according to the present invention and comprise non-single crystal, are important layers affecting characteristics of the photovoltaic element as with the i-layer described above.

Non-single crystal materials of the p- or n-layer used in the present invention include, e.g., amorphous materials and polycrystal materials.

Specific examples of amorphous materials (represented by a-) usable as the p-layer or the n-layer (of course, micro-crystal materials represented by μc- are also included in the category of amorphous materials) include a-Si:H, a-Si:HX, a-SiC:H, a-SiC:HX, a-SiGe:H, a-SiGeC:H, a-SiN:H, a-SiO:H, a-SiON:HX, a-SiOCN:HX, μc-Si:H, μc-SiC:H, μc-Si:HX, μc-SiC:HX, μc-SiGe:H, μc-SiO:H, μc-SiGeC:H, μc-SiN:H, μc-SiON:HX, μc-SiOCN:HX, etc. to which is added a p-type valence electron control agent (element of Group III of the Periodic Table such as B, Al, Ga, In and Tl) or an n-type valence electron control agent (element of Group V of the Periodic Table such P, As, Sb and Bi) in high concentration.

Specific examples of polycrystal materials (represented by poly-) usable as the p-layer or the n-layer include poly-Si:H, poly-Si:HX, poly-SiC:H, poly SIC:HX, poly-SiGe:H, poly-Si, poly-SiC, poly-SiGe, etc. to which is added a p-type valence electron control agent (element of Group III of the Periodic Table such as B, Al, Ga, In and Tl) or an n-type valence electron control agent (element of Group V of the Periodic Table such as P, As, Sb and Bi) in high concentration.

Particularly, a crystal semiconductor layer absorbing less light or an amorphous semiconductor layer having a wide band gap is suitable as the p-layer or n-layer on the light incident side.

The amount of the element of Group III of the Periodic Table added to the p-layer and the amount of the element of Group V of the Periodic Table added to the n-layer is optimally in the range of 0.1–50 at %.

Hydrogen atoms (H, D) or halogen atoms (X) contained in the p-layer or n-layer serve to compensate dangling bonds in the p-layer or n-layer and improve the doping efficiency into the p-layer or n-layer. The amount of hydrogen atoms or halogen atoms added to the p-layer or the n-layer is optimally in the range of 0.1–40 at %. Particularly, when the p-layer or the n-layer is crystal, the optimum amount of hydrogen atoms or halogen atoms is in the range of 0.1–8 at %.

Further, hydrogen atoms or/and halogen atoms are preferably distributed such that the content increases nearer to the interfaces of the p-layer/i-layer and the n-layer/i-layer. In this respect, the content of hydrogen atoms or/and halogen atoms near those interfaces is preferably 1.1–2 times the content in the bulk. By so increasing the content of hydrogen atoms or/and halogen atoms near the interfaces of the p-layer/i-layer and the n-layer/i-layer, it is possible to reduce defect levels and mechanical strains near the interfaces and, therefore, to increase the photo-voltage and photocurrent of the photovoltaic element according to the present invention.

As to electrical characteristics of the p-layer and the n-layer in the photovoltaic element, activation energy is preferably not higher than 0.2 eV, optimally not higher than 0.1 eV. The resistivity is preferably not higher than 100 Ωcm, optimally not higher than 1 Ωcm. Furthermore, the thickness of the p-layer and the n-layer is preferably in the range of 1–50 nm, optimally 3–10 nm. For forming an amorphous semiconductor layer based on any of elements of Group IV and alloys thereof which is suitable as the semiconductor layer used in the photovoltaic element according to the present invention, the optimum process is microwave plasma CVD and the next optimum process is RF plasma CVD.

In the microwave plasma CVD process, stuff gases such as material gas and diluting gas are introduced to deposition chamber while the deposition chamber is evacuated to establish a certain pressure therein. Then, microwaves oscillated from a microwave power source are introduced to the deposition chamber through a wave guide and a dielectric window (made of alumina ceramic or the like). This produces a plasma of the stuff gases and decomposes the material gas. As a result, a desired deposition film is formed on a substrate (base member) placed in the deposition chamber. The microwave plasma CVD process can form a deposition film, which is applicable to the photovoltaic element, under a wide variety of deposition conditions.

Examples of the material gas suitable to deposit an amorphous semiconductor layer based on any of elements Group IV and alloys thereof which is preferable for use in the manufacture method of the photovoltaic element according to the present invention, include a gasifiable compound containing silicon atoms, a gasifiable compound containing germanium atoms, a gasifiable compound containing carbon atoms, a gasifiable compound containing nitrogen atoms, a gasifiable compound containing oxygen atoms, and a gas mixture of two or more of these compounds.

Specifically, usable as the gasifiable compound containing silicon atoms is any of chain or ring silane compounds which are in a gaseous state or can be easily gasified, such as $SiH_4$, $Si_2H_6$, $SiF_4$, $SiFH_3$, $Si_2F_2$, $SiF_3H_2$, $Si_3H_8$, $SiD_4$, $SiHD_3$, $SiH_2D_2$, $SiH_3D$, $SiFD_3$, $SiF_2D_2$, $SiD_3H$, $Si_2D_3H_3$, $(SiF_2)_5$, $(SiF_2)_6$, $(SiF_2)_4$, $Si_2F_6$, $Si_3F_8$, $Si_2H_2F_4$, $Si_2H_3F_3$, $SiCl_4$, $(SiCl_2)_5$, $SiBr_4$, $(SiBr_2)_5$, $Si_2Cl_6$, $SiHCl_3$, $SiH_2Br_2$, $SiH_2Cl_2$ and $Si_2Cl_3F_3$.

Specific examples of the gasifiable compound containing germanium atoms include $GeH_4$, $GeD_4$, $GeF_4$, $GeF_4$, $GeF_2H_2$, $GeF_3H$, $GeHD_3$, $GeH_2D_2$, $GeH_3D$, $GeH_6$, $Ge_2D_6$, etc.

Specific examples of the gasifiable compound containing carbon atoms include $CH_4$, $CD_4$, $C_nH_{2n+2}$ (n; integer), $C_nH_{2n}$ (n; integer), $C_2H_2$, $C_6H_6$, $CO_2$, $CO$, etc.

Specific examples of the gasifiable compound containing nitrogen atoms include $N_2$, $NH_3$, $ND_3$, $NO$, $NO_2$, $N_2O$, etc.

Specific examples of the gasifiable compound containing oxygen atoms include $O_2$, $CO$, $CO_2$, $NO$, $NO_2$, $CH_3CH_2OH$, $CH_3OH$, etc.

Those gasifiable compounds may be introduced to the deposition chamber after being appropriately diluted with any of such gases as $H_2$, He, Ne, Ar, Xe and Kr.

Further, for control of valence electrons, elements of Group III and V of the Periodic Table are introduced to the p-layer and the n-layers respectively.

Specifically, effectively usable as starting materials for introducing the element of Group III are, e.g., boron hydrides such as $B_2H_6$, $B_4H_{10}$, $B_5H_{11}$, $B_6H_{10}$, $B_6H_{12}$ and $B_6H_{14}$, boron halides such as $BF_3$ and $BCl_3$, etc. when introducing boron atoms. In addition, $AlCl_3$, $GaCl_3$, $InCl_3$, $TlCl_3$, etc. can also be used. Particularly, $B_2H_6$ and $BF_3$ are suitable.

Effectively usable as starting materials for introducing the element of Group V are, e.g., phosphorus hydrides such as $PH_3$ and $P_2H_4$, phosphorus halides such as $PH_4I$, $PF_3$, $PF_3$, $PCl_3$, $PCl_5$, $PBr_3$, $PBr_5$, and $PI_3$, etc. when introducing phosphorus atoms. In addition, $AsH_3$, $ASF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, $BiBr_3$, etc. can also be used. Particularly, $PH_3$ and $PF_3$ are suitable.

Particularly, when depositing a layer of a micro-crystal semiconductor, a-Si:H or the like which absorbs less light or has a wide band gap, it is preferable to dilute the material gas with hydrogen gas as much as 2 to 100 times, and introduce relatively high microwave or RF power.

(Transparent Electrode/layer 112 in FIG. 1, layer 212 in FIG. 2, layer 312 in FIG. 3)

Preferably, the transparent electrode used in the photovoltaic element according to the present invention has light transmissivity not less than 85% so that light from the sun, white fluorescent lamps, etc. is efficiently absorbed in the semiconductor layers, and from the electrical point of view, has a sheet resistance value not higher than 100Ω so that the layer will not give rise to a resistance component for an output of the photovoltaic element. Materials having such properties are, e.g., metal oxides such as $SnO_2$, $In_2O_3$, ZnO, CdO, $Cd_2SnO_4$ and ITO ($In_2O_3$+$SnO_2$), metallic thin films fabricated as very thin and transparent films of metals such as Au, Al and Cu, etc.

Although the transparent electrode is laminated on the p-layer or the n-layer in the photovoltaic element, when a photovoltaic structure is formed on a transparent substrate and light is irradiated from the transparent substrate side, it is laminated on the carrier. It is therefore necessary to select a material of the transparent electrode which has good adhesion to those adjacent members. Furthermore, preferably, the transparent electrode is deposited in such a thickness as meeting the condition of preventing reflection. The transparent electrode can be formed by any of such processes as resistance heating vapor-deposition, electron beam heating vapor-deposition, sputtering and spraying, that is properly selected depending on characteristics of the adjacent member.

(Collector Electrode/layer 113 in FIG. 1, layer 213 in FIG. 2, layer 313 in FIG. 3)

The collector electrode of the photovoltaic element, which is manufactured by annealing a semiconductor layer according to the present invention, is preferably formed by, e.g., coating a silver paste with screen printing, or depositing Cr, Ag, Au, Cu, Ni, Mo, Al or the like with vacuum vapor-deposition using a mask. As an alternative, the collector electrode may be formed by attaching powder of carbon or Ag, along with resin, to metal wires of Cu, Au, Ag, Al or the like and then sticking the metal wires onto the surface of the photovoltaic element.

When a photovoltaic device having a desired output voltage and output current is manufactured by employing a number of photovoltaic elements according to the present invention, the photovoltaic elements according to the present invention are interconnected in series or parallel, a protective layer is formed on each of the front and rear sides, and an electrode for taking out an output, etc. are provided in place. When the photovoltaic elements according to the present invention are interconnected in series, diodes for preventing reverse currents may be incorporated.

The present invention will be described hereunder in more detail in conjunction with Examples of manufacture of a solar cell made of semiconductor materials based on non-single crystal silicon, but the invention is limited in no way to the Examples disclosed below.

EXAMPLE A-1

In this Example, a photovoltaic element of the type shown in FIG. 1 was manufactured by using an in-line type apparatus shown in FIG. 4, in accordance with the following procedure.

(1) A substrate (base member) was prepared as follows. A substrate 100 of a stainless steel of 50 mm long, 50 mm wide and 0.5 mm thick was subjected to an ultrasonic cleaning which was conducted by using acetone and propanol, followed by drying with heated air. A light reflecting layer 101 of Ag, having a thickness of 0.3 μm, was formed on the stainless steel substrate 100 by sputtering at room temperature. Then, a reflection enhancement layer 102 of ZnO, having a thickness of 1.0 μm, was formed on the reflecting layer 101 at 350° C., thus completing preparation of the substrate (base member).

(2) A deposition apparatus 400 is capable of performing both MWPCVD process and RFPCVD process. Semiconductor layers were formed on the reflection enhancement layer by using this apparatus.

Material gas cylinders, which were not shown, were connected to the deposition apparatus, through gas introduction lines. These cylinders contained material gases of ultra-high purity. More specifically, the following material gas cylinders were connected: an $SiH_4$ gas cylinder, $O_2/H_2$ (dilution: 1 ppm) gas cylinder, an $O_2$/He (dilution: 10 ppm) gas cylinder, $O_2$/Ar (dilution. 100 ppm) gas cylinder, an $O_2/H_2$ (dilution: 1000 ppm) gas cylinder, a $CH_4$ gas cylinder, a $GeH_4$ gas cylinder, an $Si_2H_6$ gas cylinder, a $PH_3/H_2$ gas (dilution: 0.1%) gas cylinder, a $B_2H_6/H_2$ (dilution: 0.2%) gas cylinder, an $H_2$ gas cylinder, an He gas cylinder, an $SiCl_2H_2$ gas cylinder and an $SiH_4/H_2$ (dilution: 1%) gas cylinder.

(3) The substrate having the reflecting layer 101 and the reflection enhancement layer 102 formed thereon (i.e. base member) was disposed on a substrate conveyor rails 413 laid in a load chamber 401, and the internal pressure of the load chamber 401 was lowered to $1\times10^{-5}$ Torr. by a vacuum pump (not shown). Then, a gate valve 406 was opened and the substrate was conveyed into a conveyance chamber 402 and then into a deposition chamber 417 which had been evacuated to certain levels of vacuum by vacuum pumps which are not shown. The substrate was held such that its reverse side is kept in close contact with a substrate heater 410 so as to be heated by the heater 410, while the interior of the deposition chamber 417 was evacuated by the vacuum pump to a level of $1\times10^{-5}$ Torr.

(4) Preparation for film forming operation was thus completed. Then, $H_2$ gas was introduced into the deposition chamber 417 through a gas-introduction line 429 and the flow rate of the $H_2$ gas was controlled to 500 sccm by means of valves 441, 431, 430, under the control of a mass-flow controller 436. At the same time, the internal pressure of the deposition chamber 417 was regulated to 1.0 Torr. by a conductance valve (not shown) Meanwhile, the substrate heater 410 was adjusted to maintain the substrate temperature at 350° C.

(5) An RF n-layer 103 of $\mu$c-Si was formed when the substrate temperature became steady.

To this end, valves 443, 433, 444 and 434 were operated to introduce the $SiH_4$ gas and $PH_3/H_2$ gas into the deposition chamber 417 through the gas introduction line 429. Flow rates of the $SiH_4$ gas, $H_2$ gas and the $PH_3/H_2$ gas were controlled to 2 sccm, 100 sccm and 200 sccm, respectively, by means of the mass-flow controllers 438, 436 and 439, while the pressure in the deposition chamber 417 was controlled to 1.0 Torr.

The power of an RF power supply 422 was set to 0.05 $W/cm^2$, and RF power was introduced from this power supply into a plasma-forming cup 420, so as to trigger a glow discharge, thereby starting formation of the RF n-layer on the substrate. The RF power was turned off when the thickness of the RF n-layer reached 20 nm, thus terminating the glow discharge to complete the formation of the RF n-layer 103. The supply of the $SiH_4$ gas, $PH_3/H_2$ gas and $H_2$ gas into the deposition chamber was stopped and the interior of the deposition chamber and the gas line were evacuated to $1\times10^{-5}$ Torr.

(6) Then, an annealing was executed in an atmosphere of a gas containing a trace amount of oxygen atoms.

For the purpose of executing the annealing in the gas atmosphere containing a trace amount of oxygen atoms as proposed by the invention, $O_2$/H, gas (dilution: 1 ppm) was introduced into the deposition chamber 417 through the gas introduction line 429. The valves 442 and 432 were opened and the flow rate of the $O_2/H_2$ gas was controlled to 500 sccm by means of a mass-flow controller 437. Meanwhile, the pressure in the deposition chamber 417 was controlled to 1.0 Torr by a conductance valve (not shown).

The annealing in accordance with the invention in a gas atmosphere containing trace amount of oxygen atoms was conducted for 10 minutes, while the substrate heater 410 was controlled to maintain the substrate temperature at 350° C. Then, the supply of the $O_2/H_2$ gas (dilution: 1 ppm) into the deposition chamber 417 was suspended and the interior of the deposition chamber 417 and the gas line was evacuated to $1\times10^{-5}$ Torr.

(7) Then, an RF i-layer 151 of a-Si, an MW i-layer 104 of a-SiGe, an RF i-layer 161 of a-Si and an RF p-layer of a-SiC were successively formed.

(7-1) As the first step, the gate valve 407 was opened and the substrate was conveyed into the conveyor chamber 403 and the i-layer deposition chamber 418 which have been evacuated by vacuum pumps (not shown). The substrate was held such that its reverse side is kept in close contact with a substrate heater 411 so as to be heated by the heater 411, while the interior of the i-layer deposition chamber 418 was evacuated by the vacuum pump to a level of $1\times10^{-5}$ Torr.

In order to form the RF i-layer, the substrate heater 411 was controlled to maintain the substrate temperature at 300° C. and, when the substrate had been sufficiently heated, valves 464, 454, 450, 463, 453 were gradually opened so as to introduce $Si_2H_6$ gas and $H_2$ gas into the i-layer deposition chamber 418 through a gas introduction line 449. The flow rates of the $Si_2H_6$ gas and $H_2$ gas were controlled to 4 sccm and 110 sccm, respectively, by mass-flow controllers 459, 458. Opening of a conductance valve (not shown) was controlled so as to maintain the internal pressure of the i-layer deposition chamber 418 at 0.7 Torr.

The power of an RF power supply 424 was set to 0.008 $W/cm^2$, and RF power was supplied from this power supply to a bias bar 428, so as to trigger a glow discharge, and a shutter 427 was opened thereby starting formation of the i-layer on the RF n-layer. The RF power was turned off when the thickness of the i-layer has reached 10 nm, and the RF power supply 424 was turned off, thus completing the formation of the RF i-layer 151. The supply of the $Si_2H_6$ gas and $H_2$ gas was stopped by closing valves 464, 454, 453, 450, and the interior of the i-layer deposition chamber 418 and the gas line were evacuated to $1\times10^{-5}$ Torr.

(7-2) In order to form the MW i-layer, the substrate heater 411 was controlled to maintain the substrate temperature at 380° C. and, when the substrate had been sufficiently heated, valves 461, 451, 450, 462, 452, 463, 453 were gradually opened so as to introduce $SiH_4$ gas, $GeH_4$ gas and $H_2$ gas into the i-layer deposition chamber 418 through the gas introduction line 449.

The flow rates of the $SiH_4$ gas, $GeH_4$ gas and $H_2$ gas were controlled to 50 sccm, 35 sccm and 150 sccm, respectively, by mass-flow controllers 456, 457 and 458. Opening of the conductance valve (not shown) was controlled so as to maintain the internal pressure of the i-layer deposition chamber 418 at 6 m Torr. Then the power of the RF power supply 424 was set to 0.30 $W/cm^2$, and RF power was supplied from this power supply to the bias bar 428. Then the power of a $\mu$W power supply (2.45 GHz) was set to 0.10 $W/cm^2$, and $\mu$W power was introduced through a waveguide tube 426 and a microwave guide window 425 into the i-layer deposition chamber 418 so as to trigger a glow discharge, and a shutter 427 was opened thereby starting formation of the MW i-layer on the RF i-layer. The $\mu$W glow discharge was ceased when the thickness of the i-layer has reached 0.17$\mu$, and the bias power supply 424 was turned off, thus completing the formation of the MW i-layer 104. The supply of the $SiH_4$ gas, $GeH_4$ gas and $H_2$ gas into the i-layer deposition chamber 418 was stopped by closing valves 451, 452, 453 and the interior of the i-layer deposition chamber 418 and the gas line were evacuated to $1\times10^{-5}$ Torr.

(7-3) In order to form the RF i-layer, the substrate heater 411 was controlled to maintain the substrate temperature at 250° C. and, when the substrate had been sufficiently heated, valves 464, 454, 450, 463, 453 were gradually opened so as to introduce $Si_2H_6$ gas and $H_2$ gas into the i-layer deposition chamber 418 through the gas introduction line 449. The flow rates of the $Si_2H_6$ gas and $H_2$ gas were controlled to 3 sccm and 80 sccm, respectively, by mass-flow controllers 459, 458. Opening of the conductance valve (rot shown) was controlled so as to maintain the internal pressure of the i-layer deposition chamber 418 at 0.7 Torr.

The power of the RF power supply 424 was set to 0.007 W/cm², and RF power was supplied from this power supply to a bias bar 428, so as to trigger a glow discharge, and the shutter 427 was opened thereby starting formation of the RF i-layer on the MW i-layer. The RF glow discharge was stopped when the thickness of the i-layer reached 20 nm, and the RF power supply 424 was turned off, thus completing the formation of the RF i-layer 161. The supply of the $Si_2H_6$ gas and $H_2$ gas into the i-layer deposition chamber 418 was stopped by closing valves 464, 454, 453, 450 and the interior of the i-layer deposition chamber 418 and the gas line were evacuated to $1\times10^{-5}$ Torr.

(8) In order to form an RF p-layer 105 of a-SiC, the gate valve 408 was opened and the substrate was conveyed into the conveyor chamber 404 and the p-layer deposition chamber 419 which had been evacuated by vacuum pumps (not shown). The substrate 490 was held such that its reverse side is kept in close contact with a substrate heater 412 so as to be heated by the heater 412, while the interior of the p-layer deposition chamber 419 was evacuated by the vacuum pump to a level of $1\times10^{-5}$ Torr.

The substrate heater 412 was controlled to maintain the substrate temperature at 230° C. When the substrate temperature had been stabilized, valves 481, 471, 470, 482, 472, 483, 473, 484, 474 were operated to introduce $H_2$ gas, $SiH_4/H_2$ gas $B_2H_6/H_2$ gas (dilution: 0.1%) and $CH_4$ gas into a deposition chamber 419 through the gas introduction line 469. Flow rates of the $H_2$ gas, $SiH_4/H_2$ gas $B_2H_6/H_2$ gas and the $CH_4$ gas were controlled to 60 sccm, 2 sccm, 10 sccm and 0.3 sccm, respectively, by means of the mass-flow controllers 476, 477, 478 and 479, while the pressure in the deposition chamber 419 was controlled to 2.0 Torr by adjusting the opening of a conductance valve (not shown).

The power of an RF power supply 423 was set to 0.07 W/cm², and RF power was introduced from this power supply into a plasma-forming cup 421, so as to trigger a glow discharge, thereby starting formation of the RF p-layer on the i-layer. The RF power was turned off when the thickness of the RF p-layer has reached 10 nm, thus terminating the glow discharge to complete the formation of the RF p-layer 205. The supply of the $SiH_4/H_2$ gas, $B_2H_6/H_2$ gas, $CH_4$ gas and $H_2$ gas into the p-layer deposition chamber 419 was terminated by closing the valves 472, 482, 473, 483, 474, 484, 471, 481, 470 and the interior of the p-layer deposition chamber 419 and the gas line were evacuated to $1\times10^{31\ 5}$ Torr.

Then, the gate valve 409 was opened and the substrate was conveyed into an unload chamber 405 which had been evacuated by a vacuum pump (not shown), and a leak valve (not shown) was opened to allow leakage.

(9) Then, an ITO film of 70 nm thick, serving as a transparent conductive layer 112, was formed on the RF p-layer by vacuum evaporation.

(10) A mask having comb-shaped aperture was placed on the transparent electrode 112 and a comb-shaped collector electrode 113 of Cr(40 nm)/Ag(1000 nm)/Cr(40 nm) was formed by vacuum evaporation.

Fabrication of the photovoltaic element of this example was thus completed. This element will be referred to as "SC/A-1". The conditions of the annealing in gas atmosphere containing trace amount of oxygen atoms in this example, as well as the conditions of film-forming processes for forming the RF n-layer, RF i-layer, MW i-layer and RF-p layer are collectively shown in Tables 1 and 2.

TABLE 1

| CONDITIONS OF ANNEALING IN GAS ATMOSPHERE CONTAINING TRACE AMOUNT OF OXYGEN ATOMS (SC/A-1) | |
|---|---|
| Type of gas containing oxygen atoms | $O_2/H_2$ |
| Gas concentration (dilution:ppm) | 1 |
| Annealing temp. (° C.) | 350 |
| Annealing press. (Torr) | 1.0 |

TABLE 2

| Sc Ex. 1 | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SiH_4/H_2$ flow rate sccm | Press. Torr | MW Power W/cm² | RF Power W/cm² | Substrate temp. ° C. | Film thickness nm |
|---|---|---|---|---|---|---|---|---|---|---|---|---|---|
| RF n-layer (103) | 2 | | | | 100 | 200 | | | 1.0 | | 0.05 | 350 | 20 |
| RF i-layer (151) | | 4 | | | 110 | | | | 0.7 | | 0.008 | 300 | 10 |
| MW i-layer (104) | 50 | | | 35 | 150 | | | | 0.006 | 0.10 | 0.30 | 380 | 170 |
| RF i-layer (161) | | 3 | | | 80 | | | | 0.7 | | 0.007 | 250 | 20 |
| RF p-layer (105) | | | 0.3 | | 60 | | 10 | 2 | 2.0 | | 0.07 | 230 | 10 |

Comparative Example A 1-1

A process was conducted as Comparative Example A1-1. This process was different from Example A1-1 in that it omitted the annealing in the gas atmosphere containing trace amount of oxygen atoms.

Other conditions were materially the same as those in Example A1. The photovoltaic element produced in Comparative Example A1-1 will be referred to as "SC/CA1-1".

Eight samples of the photovoltaic elements SC/A-1, as well as eight samples of the photovoltaic elements SC/CA1-

1, were produced and were subjected to measurement and evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The results are shown in Table 3.

The performance of the photovoltaic element is shown in Table 3 in terms of values measured on the samples of the photovoltaic element SC/A-1 as normalized by the values measured on the samples of the photovoltaic element SC/CA1-1.

TABLE 3

| Items of evaluation | Evaluation |
| --- | --- |
| Initial photoelectric conversion efficiency characteristic | 1.3 |
| Variation of Initial photoelectric conversion efficiency characteristic | 0.88 |
| Photo-degradation characteristic | 0.88 |
| Anti-environment characteristic | 0.86 |
| SEM observation of sectional face | 0.94 |
| Measurement of adhesion: Delamination | No delamination in SC/A-1 Slight delamination in SC/CA1-1 |

The initial photoelectric conversion efficiency was determined by placing the samples of the photovoltaic elements under a photo-irradiation of AM-1.5 (100 mW/cm$^2$) and measuring the V-I characteristics exhibited by these samples. The "variation" of the initial photoelectric conversion efficiency is the degree of difference of the efficiencies among the eight samples of each type of photovoltaic elements.

The photo-degradation was measured and evaluated in terms of the ratio of reduction in the photoelectric conversion efficiency exhibited by each sample of the photovoltaic element after a 1000-hour irradiation under 1 sun at 100 mW/cm$^2$ while setting the temperature of the sample element at 50° C.

The anti-environment characteristic was measured and evaluated in terms of the ratio of reduction in the photoelectric conversion efficiency exhibited by each sample of the photovoltaic element after an endurance test consisting of 100-hour shelving in a dark place of an atmosphere of 80° C. temperature, 80% humidity and a subsequent photo-irradiation under 1 sun at 100 mW/cm$^2$ conducted while setting the temperature of the photovoltaic element to 25° C.

The SEM observation of cut surface was conducted by observing a cut surface of the sample photovoltaic element with a scanning electron microscope (produced by Hitachi Limited., Model S-4500, magnification 50,000). Number of micro-cracks of sizes not smaller than 10 nm was counted per unit area and used as the item to be evaluated.

The adhesion was measured in terms of state of delamination as observed through an optical microscope (produced by Olympus Corp., bright field, magnification 1000) on the sample photovoltaic elements subjected to the above-mentioned SEM observation.

From the results shown in Table 3, it will be seen that all the sample photovoltaic elements SC/A-1 in accordance with Example A-1 exhibit superiority to the sample photovoltaic elements SC/CA1-1 of Comparison Example A1-1 in all items of evaluation.

EXAMPLE A-2

In this Example, a photovoltaic element of the tandem type shown in FIG. 2 was manufactured by using an in-line type apparatus shown in FIG. 4, in accordance with the following procedure.

(1) A substrate having a reflecting layer 201 and a reflection enhancement layer 202 formed thereon (i.e. base member), prepared in the same way as that in Example A1, was disposed on a substrate conveyor rails 413 laid in a load chamber 401, and the internal pressure of the load chamber 401 was lowered to $1\times10^{-5}$ Torr. by a vacuum pump (not shown).

(2) Then, a gate valve 406 was opened and the substrate was conveyed into a conveyance chamber 402 and then into a deposition chamber 417 which had been evacuated to certain levels of vacuum by vacuum pumps which are not shown. The substrate was held such that its reverse side is kept in close contact with a substrate heater 410 so as to be heated by the heater 410, while the interior of the deposition chamber 417 was evacuated by the vacuum pump to a level of $1\times10^{-5}$ Torr.

(3) Preparation for film forming operation was thus completed. Then, H$_2$ gas was introduced into the deposition chamber 417 through a gas-introduction line 429 and the flow rate of the H$_2$ gas was controlled to 500 sccm by means of valves 441, 431, 430, under the control of a mass-flow controller 436. At the same time, the internal pressure of the deposition chamber 417 was regulated to 1.0 Torr. by a conductance valve (not shown). Meanwhile, the substrate heater 410 was adjusted to maintain the substrate temperature at 350° C.

(4) An RF n-layer 203 of $\mu$c-Si was formed when the substrate temperature became steady.

To this end, valves 443, 433, 444 and 434 were operated to introduce the SiH$_4$ gas and PH$_3$/H$_2$ gas into the deposition chamber 417 through the gas introduction line 429. Flow rates of the SiH$_4$ gas, H$_2$ gas and the PH$_3$/H$_2$ gas were controlled to 2 sccm, 100 sccm and 200 sccm, respectively, by means of the mass-flow controllers 438, 436 and 439, while the pressure in the deposition chamber 417 was controlled to 1.0 Torr.

The power of an RF power supply 422 was set to 0.05 W/cm$^2$, and RF power was introduced from this power supply into a plasma-forming cup 420, so as to trigger a glow discharge, thereby starting formation of the RF n-layer—on the substrate. The RF power was turned off when the thickness of the RF n-layer reached 20 nm, thus terminating the glow discharge to complete the formation of the RF n-layer 203. The supply of the SiH$_4$ gas, PH$_3$/H$_2$ gas and H$_2$ gas into the deposition chamber 417 was stopped and the interior of the deposition chamber and the gas line were evacuated to $1\times10^{-5}$ Torr.

(5) Then, an annealing was executed in accordance with the present invention in an atmosphere of a gas containing a trace amount of oxygen atoms.

For the purpose of executing the annealing in the gas atmosphere containing a trace amount of oxygen atoms as proposed by the invention, O$_2$/He gas (dilution: 10 ppm) was introduced into the deposition chamber 417 through the gas introduction line 429. The valves 442 and 432 were opened and the flow rate of the O$_2$/He gas was controlled to 500 sccm by means of a mass-flow controller 437. Meanwhile, the pressure in the deposition chamber 417 was controlled to 1.0 Torr by a conductance valve (not shown).

The annealing in accordance with the invention in a gas atmosphere containing trace amount of oxygen atoms was conducted for 10 minutes, while the substrate heater 410 was controlled to maintain the substrate temperature at 350° C. Then, the supply of the $O_2$/He gas (dilution: 10 ppm) into the deposition chamber 417 was stopped and the interior of the deposition chamber 417 and the gas line was evacuated to $1\times10^{-5}$ Torr.

Then, an RF i-layer 251 of a-Si, an MW i-layer 204 of a-SiGe, an RF i-layer 261 of a-Si, an RF p-layer 205 of a-SiC, an RF n-layer 206 of $\mu$c-Si, an RF i-layer 207 of a-Si and an RF p-layer 208 of a-SiC were successively formed.

(5-1) As the first step, the gate valve 407 was opened and the substrate was conveyed into the conveyor chamber 403 and the i-layer deposition chamber 418 which have been evacuated by vacuum pumps (not shown). The substrate was held such that its reverse side is kept in close contact with a substrate heater 411 so as to be heated by the heater 411, while the interior of the i-layer deposition chamber 418 was evacuated by the vacuum pump to a level of $1\times10^{-5}$ Torr.

(5-2) In order to form the RF i-layer 251, the substrate heater 411 was controlled to maintain the substrate temperature at 300° C. and, when the substrate had been sufficiently heated, valves 464, 454, 450, 463, 453 were gradually opened so as to introduce $Si_2H_6$ gas and $H_2$ gas into the i-layer deposition chamber 418 through the gas introduction line 449. The flow rates of the $Si_2H_6$ gas and $H_2$ gas were controlled to 4 sccm and 110 sccm, respectively, by mass-flow controllers 459, 458. Opening of the conductance valve (not shown) was controlled so as to maintain the internal pressure of the i-layer deposition chamber 418 at 0.7 Torr.

The power of the RF power supply 424 was set to 0.008 W/cm², and RF power was supplied from this power supply to a bias bar 428, so as to trigger a glow discharge, and the shutter 427 was opened thereby starting formation of the i-layer on the RF n-layer. The RF glow discharge was stopped when the thickness of the i-layer reached 10 nm, and the RF power supply 424 was turned off, thus completing the formation of the RF i-layer 151. The supply of the $Si_2H_6$ gas and $H_2$ gas into the i-layer deposition chamber 418 was stopped by closing valves 464, 454, 453, 450 and the interior of the i-layer deposition chamber 418 and the gas line were evacuated to $1\times10^{-5}$ Torr.

(5-3) In order to form the MW i-layer 204, the substrate heater 411 was controlled to maintain the substrate temperature at 380° C. and, when the substrate had been sufficiently heated, valves 461, 451, 450, 462, 452, 463, 453 were gradually opened so as to introduce $SiH_4$ gas, $GeH_4$ gas and $H_2$ gas into the i-layer deposition chamber 418 through the gas introduction line 449. The flow rates of the $SiH_4$ gas, $GeH_4$ gas and $H_2$ gas were controlled to 50 sccm, 55 sccm and 150 sccm, respectively, by mass-flow controllers 456, 457 and 458. Opening of the conductance valve (not shown) was controlled so as to maintain the internal pressure of the i-layer deposition chamber 418 at 6 m Torr.

Then the power of the RF power supply 424 was set to 0.30 W/cm², and RF power was supplied from this power supply to the bias bar 428. Then the power of a $\mu$W power supply (2.45 GHz) was set to 0.10 W/cm², and $\mu$W power was introduced through a waveguide tube 426 and a microwave guide window 425 into the i-layer deposition chamber 418 so as to trigger a glow discharge, and a shutter 427 was opened thereby starting formation of the MW i-layer on the RF i-layer. The $\mu$W glow discharge was ceased when the thickness of the i-layer has reached $0.15\mu$, and the bias power supply 424 was turned off, thus completing the formation of the MW i-layer 204. The supply of the $SiH_4$ gas, $GeH_4$ gas and $H_2$ gas into the i-layer deposition chamber 418 was stopped by closing valves 451, 452, 453 and the interior of the i-layer deposition chamber 418 and the gas line were evacuated to $1\times10^{-5}$ Torr.

(5-4) In order to form the RF i-layer 261, the substrate heater 411 was controlled to maintain the substrate temperature at 250° C. substrate had been sufficiently heated, valves 464, 454, 450, 463, 453 were gradually opened so as to introduce $Si_2H_6$ gas and $H_2$ gas into the i-layer deposition chamber 418 through the gas introduction line 449. The flow rates of the $Si_2H_6$ gas and $H_2$ gas were controlled to 3 sccm and 80 sccm, respectively, by mass-flow controllers 459, 458. Opening of the conductance valve (not shown) was controlled so as to maintain the internal pressure of the i-layer deposition chamber 418 at 0.7 Torr.

The power of the RF power supply 424 was set to 0.007 W/cm², and RF power was supplied from this power supply to a bias bar 428, so as to trigger a glow discharge, and the shutter 427 was opened thereby starting formation of the RF i-layer on the MW i-layer. The RF glow discharge was stopped when the thickness of the i-layer has reached 20 nm, and the RF power supply 424 was turned off, thus completing the formation of the RF i-layer 261. The supply of the $Si_2H_6$ gas and $H_2$ gas into the i-layer deposition chamber 418 was stopped by closing valves 464, 454, 453, 450 and the interior of the i-layer deposition chamber 418 and the gas line were evacuated to $1\times10^{-5}$ Torr.

(5-5) In order to form an RF p-layer 205 of a-SiC, the gate valve 408 was opened and the substrate was conveyed into the conveyor chamber 404 and the p-layer deposition chamber 419 which had been evacuated by vacuum pumps (not shown). The substrate 490 was held such that its reverse side is kept in close contact with a substrate heater 412 so as to be heated by the heater 412, while the interior of the p-layer deposition chamber 419 was evacuated by the vacuum pump to a level of $1\times10^{-5}$ Torr.

The substrate heater 412 was controlled to maintain the substrate temperature at 230° C. When the substrate temperature had been stabilized, valves 481, 471, 470 482, 472, 483, 473, 484, 474 were operated to introduce $H_2$ gas, $SiH_4/H_2$ gas $B_2H_6/H_2$ gas and $CH_4$ gas into a deposition chamber 419 through the gas introduction line 469. Flow rates of the $H_2$ gas, $SiH_4$/H gas $B_2H_6/H_2$ gas and the $CH^4$ gas were controlled to 60 sccm, 2 sccm 10 sccm and 0.3 sccm, respectively, by means of the mass-flow controllers 476, 477, 478 and 479, while the pressure in the deposition chamber 419 was controlled to 2.0 Torr by adjusting the opening of a conductance valve (not shown).

The power of an RF power supply 423 was set to 0.07 W/cm², and RF power was introduced from this power supply into a plasma-forming cup 421, so as to trigger a glow discharge, thereby starting formation of the RF p-layer on the i-layer. The RF power was turned off when the thickness of the RF p-layer has reached 10 nm; thus terminating the glow discharge to complete the formation of the RF p-layer 205. The supply of the $SiH_4/H_2$ gas, $B_2H_6/H_2$ gas, $CH_4$ gas and the $H_2$ gas into the p-layer deposition chamber 419 was terminated by closing the valves 472, 482, 473, 483, 474, 484, 471, 481, 470 and the interior of the p-layer deposition chamber 419 and the gas line were evacuated to $1\times10^{-5}$ Torr.

(5-6) In order to form an RF n-layer 206 of $\mu$c-Si, the gate valves 408 and 407 were opened and the substrate was conveyed into the conveyor chamber 402 via conveyor chamber 403 and into the deposition chamber 417 which had been evacuated by vacuum pumps (not shown). The substrate was held such that its reverse side is kept in close contact with a substrate heater 410 so as to be heated by the heater 410, while the interior of the deposition chamber 417 was evacuated by the vacuum pump to a level of $1\times10^{-5}$ Torr.

For the purpose of forming the RF n-layer of μc-Si, $H_2$ gas was introduced into the deposition chamber 417 through the gas introduction line 429, and valves 441, 431, 430 were opened and the flow rate of the $H_2$ gas was regulated to 200 sccm by means of the mass-flow controller 436. The internal pressure of the deposition chamber 417 was adjusted to 1.0 Torr. by means of the conductance valve which is not shown.

The substrate heater 410 was controlled to maintain the substrate temperature at 225° C. When the substrate temperature had been stabilized, valves 443, 433, 444, 434 were operated to introduce $SiH_4$ gas and $PH_3/H_2$ gas into the deposition chamber 417 through the gas introduction line 429. Flow rates of the, $SiH_4$ gas, $H_2$ gas and the $PH_3/H_2$ gas were controlled to 2 sccm, 50 sccm and 250 scam, respectively, by means of the mass-flow controllers 438, 436 and 439, while the pressure in the deposition chamber 417 was controlled to 1.0 Torr.

The power of an RF power supply 422 was set to 0.04 $W/Cm^2$, and RF power was introduced from this power supply into a plasma-forming cup 420, so as to trigger a glow discharge, thereby starting formation of the RF n-layer on the RF p-layer. The RF power was turned off when the thickness of the RF n-layer has reached 10 nm, thus terminating the glow discharge to complete the formation of the RF n-layer 206. The supply of the $SiH_4$ gas, $PH_3/H_2$ gas and $H_2$ gas into the deposition chamber 417 was terminated and the interior of the deposition chamber and the gas line were evacuated to $1\times10^{-5}$ Torr.

(5-7) In order to form the RF i-layer of a-Si, the gate valve 407 was opened and the substrate was conveyed into the conveyor chamber 403 and the i-layer deposition chamber 418 which had been evacuated by vacuum pumps (not shown). The substrate was held such that its reverse side is kept in close contact with a substrate heater 411 so as to be heated by the heater 411, while the interior of the i-layer deposition chamber 418 was evacuated by the vacuum pump to a level of $1\times10^{-5}$ Torr.

For the purpose of forming the RF i-layer, the substrate heater 411 was controlled to maintain the substrate temperature at 200° C. and, when the substrate has been sufficiently heated, valves 464, 454, 450, 463, 453 were gradually opened so as to introduce $Si_2H_6$ gas and $H_2$ gas into the i-layer deposition chamber 418 through a gas introduction line 449. The flow rates of the $Si_2H_6$ gas and $H_2$ gas were controlled to 2 sccm and 80 sccm, respectively, by mass-flow controllers 459, 458. Opening of a conductance valve (not shown) was controlled so as to maintain the internal pressure of the i-layer deposition chamber 418 at 0.6 Torr.

The power of an RF power supply 424 was set to 0.007 $W/cm^2$, and RF power was supplied from this power supply to a bias bar 428, so as to trigger a glow discharge, and a shutter 427 was opened thereby starting formation of the RF i-layer on the RF n-layer 206. The RF power was turned off when the thickness of the i-layer has reached 120 nm, and the RF power supply 424 was turned off, thus completing the formation of the RF i-layer 207. The supply of the $Si_2H_6$ gas and $H_2$ gas into the i-layer deposition chamber 418 was stopped by closing valves 464, 454, 453 and the interior of the i-layer deposition chamber 418 and the gas line were evacuated to $1\times10^{-5}$ Torr.

(5-8) In order to form an RF p-layer 208 of a-SiC, the gate valve 408 was opened and the substrate was conveyed into the conveyor chamber 404 and the p-layer deposition chamber 419 which had been evacuated by vacuum pumps (not shown). The substrate was held such that its reverse side is kept in close contact with a substrate heater 412 so as to be heated by the heater 412, while the interior of the p-layer deposition chamber 419 was evacuated by the vacuum pump to a level of $1\times10^5$ Torr.

The substrate heater 412 was controlled to maintain the substrate temperature at 170° C. When the substrate temperature had been stabilized, valves 481, 471, 470, 482, 472, 483, 473, 484, 474 were operated to introduce $H_2$ gas, $SiH_4/H_2$ gas $B_2H_6/H_2$ gas and $CH_4$ gas into the deposition chamber 419 through the gas introduction line 469. Flow rates of the $H_2$ gas, $SiH_4/H_2$ gas $B_2H_6/H_2$ gas and the $CH_4$ gas were controlled to 60 sccm, 2 sccm, 10 sccm and 0.3 sccm, respectively, by means of the mass-flow controllers 476, 477, 478 and 479, while the pressure in the deposition chamber 419 was controlled to 2.0 Torr by adjusting the opening of a conductance valve (not shown).

The power of the RF power supply 423 was set to 0.07 $W/cm^2$, and RF power was introduced from this power supply into a plasma-forming cup 421, so as to trigger a glow discharge, thereby starting formation of the RF p-layer on the RF i-layer 207. The RF power was turned off when the thickness of the RF p-layer reached 10 nm, thus terminating the glow discharge to complete the formation of the RF p-layer 208. The supply of the $SiH_4/H_2$ gas, $B_2H_6H_2$ gas, $CH_4$ gas and $H_2$ gas into the p-layer deposition chamber 419 was terminated by closing the valves 472, 482, 473, 483, 474, 484, 471, 481, 470 and the interior of the p-layer deposition chamber 419 and the gas line were evacuated to $1\times10^{-5}$ Torr.

(6) Then, the gate valve 409 was opened and the substrate was conveyed into the unload chamber 405 which had been evacuated by the vacuum pump (not shown), and the leak valve (not shown) was opened to allow leakage.

(7) Then, an ITO film of 70 nm thick, serving as a transparent conductive layer 212, was formed on the RF p-layer 208 by vacuum evaporation.

(8) A mask having comb-shaped aperture was placed on the transparent electrode 212 and a comb-shaped collector electrode 213 of Cr(40 nm)/Ag (1000 nm)/Cr(40 nm) was formed by vacuum evaporation.

Fabrication of the photovoltaic element of this example was thus completed. This element will be referred to as "SC/A-2". The conditions of the annealing in gas atmosphere containing trace amount of oxygen atoms in this example, as well as the conditions of film-forming processes for forming the RF n-layer, RF i-layer, MW i-layer and RF-p layer are collectively shown in Tables 4 and 5.

TABLE 4

| CONDITIONS OF ANNEALING IN GAS ATMOSPHERE CONTAINING TRACE AMOUNT OF OXYGEN ATOMS (SC/A-2) | |
|---|---|
| Type of gas containing oxygen atoms | $O_2$/He |
| Gas concentration (dilution:ppm) | 10 |
| Annealing temp. (° C.) 350 | 350 |
| Annealing press. (Torr) | 1.0 |

TABLE 5

| | SiH₄ flow rate sccm | Si₂H₆ flow rate sccm | CH₄ flow rate sccm | GeH₄ flow rate sccm | H₂ flow rate sccm | PH₃/H₂ flow rate sccm | B₂H₆/H₂ flow rate sccm | SiH₄/H₂ flow rate sccm | Press. Torr | MW Power W/cm² | RF Power W/cm² | Substrate temp. °C. | Film thickness nm |
|---|---|---|---|---|---|---|---|---|---|---|---|---|---|
| RF n-layer (203) | 2 | | | | 100 | 200 | | | 1.0 | | 0.05 | 350 | 20 |
| RF i-layer (251) | | 4 | | | 110 | | | | 0.7 | | 0.008 | 300 | 10 |
| MW i-layer (204) | 50 | | | 55 | 150 | | | | 0.006 | 0.10 | 0.30 | 380 | 150 |
| RF i-layer (261) | | 3 | | | 80 | | | | 0.7 | | 0.007 | 250 | 20 |
| RF p-layer (205) | | | 0.3 | | 60 | | 10 | 2 | 2.0 | | 0.07 | 230 | 10 |
| RF n-layer (206) | 2 | | | | 50 | 250 | | | 1.0 | | 0.04 | 225 | 10 |
| RF i-layer (207) | | 2 | | | 80 | | | | 0.6 | | 0.007 | 200 | 120 |
| RF p-layer (208) | | | 0.3 | | 60 | | 10 | 2 | 2.0 | | 0.07 | 170 | 10 |

Comparative Example A 2-1

A process was conducted as Comparative Example A 2-1. This process was different from Example A-2 in that it omitted the annealing in the gas atmosphere containing trace amount of oxygen atoms.

Other conditions were materially the same as those in Example A-2. The photovoltaic element produced in Comparative Example A 2-1 will be referred to as "SC/CA2-1".

Ten samples of the photovoltaic elements SC/A-2, as well as ten samples of the photovoltaic elements SC/CA2-1, were produced and were subjected, basically in the same way as Example A-1 and Comparative Example A1-1, to measurement and evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The results are shown in Table 6. The variation of initial conversion efficiency was measured in terms of variation among the ten samples. The anti-environment characteristic was evaluated by setting the humidity to 90%.

The performance of the photovoltaic element is shown in Table 6 in terms of values measured on the samples of the photovoltaic element SC/A-2 as normalized by the values measured on the samples of the photovoltaic element SC/CA2-1.

TABLE 6

| Items of evaluation | Evaluation |
|---|---|
| Initial photoelectric conversion efficiency characteristic | 1.4 |
| Variation of Initial photoelectric conversion efficiency characteristic | 0.89 |
| Photo-degradation characteristic | 0.86 |
| Anti-environment characteristic | 0.85 |
| SEM observation of sectional face | 0.93 |
| Measurement of adhesion: Delamination | No delaminatino in SC/A-2 Slight delamination in SC/CA2-1 |

From the results shown in Table 6, it will be seen that all the sample photovoltaic elements SC/A-2 in accordance with Example A-2 exhibit superiority to the sample photovoltaic elements SC/CA2-1 of Comparison Example A2-1 in all items of evaluation.

EXAMPLE A-3

In this Example, a photovoltaic element of the triple type shown in FIG. 3 was manufactured by using an in-line type apparatus shown in FIG. 4, in accordance with the following procedure.

(1) A substrate having a reflecting layer 301 and a reflection enhancement layer 302 formed thereon (i.e. base member), prepared in the same way as that in Example A-1, was disposed on a substrate conveyor rails 413 laid in a load chamber 401, and the internal pressure of the load chamber 401 was lowered to 1×10⁻⁵ Torr. by a vacuum pump (not shown).

(2) Then, gate valves 406 and 407 were opened and the substrate was conveyed into conveyance chambers 402, 403 and then into a deposition chamber 418 which had been evacuated to certain levels of vacuum by vacuum pumps which are not shown. The substrate was held such that its reverse side is kept in close contact with a substrate heater 411 so as to be heated by the heater 411, while the interior of the deposition chamber 418 was evacuated by the vacuum pump to a level of 1×10⁻⁵ Torr.

(3) Preparation for film forming operation was thus completed. Then, H₂ gas was introduced into the deposition chamber 417 through a gas-introduction line 429 and the flow rate of the H₂ gas was controlled to 500 sccm by means of valves 441, 431, 430, under the control of a mass-flow controller 436. At the same time, the internal pressure of the deposition chamber 417 was regulated to 1.3 Torr. by a conductance valve (not shown). Meanwhile, the substrate heater 410 was adjusted to maintain the substrate temperature at 350° C. An RF n-layer 303 of μc-Si was formed when the substrate temperature has become steady.

(4) To this end, valves 443, 433, 444 and 434 were operated to introduce the SiH$_4$ gas and PH$_3$/H$_2$ gas into the deposition chamber 417 through the gas introduction line 429. Flow rates of the SiH$_4$ gas, H$_2$ gas and the PH$_3$/H$_2$ gas were controlled to 2 sccm, 100 sccm and 200 sccm, respectively, by means of the mass-flow controllers 438, 436 and 439, while the pressure in the deposition chamber 417 was controlled to 1.3 Torr.

The power of an RF power supply 422 was set to 0.05 W/cm$^2$, and RF power was introduced from this power supply into a plasma-forming cup 420, so as to trigger a glow discharge, thereby starting formation of the RF n-layer on the substrate. The RF power was turned off when the thickness of the RF n-layer has reached 20 nm, thus terminating the glow discharge to complete the formation of the RF n-layer 303. The supply of the SiH, gas, PH$_3$/H$_2$ gas and H$_2$ gas into the deposition chamber 417 was stopped and the interior of the deposition chamber and the gas line were evacuated to 1×10$^{-5}$ Torr.

(5) Then, an annealing was executed in an atmosphere of a gas containing a trace amount of oxygen atoms. For the purpose of executing the annealing in the gas atmosphere containing a trace amount of oxygen atoms, O$_2$/Ar gas (dilution: 100 ppm) was introduced as the oxygen atom-containing gas into the deposition chamber 417 through the gas introduction line 429. The valves 442 and 432 were opened and the flow rate of the O$_2$/Ar gas was controlled to 500 sccm by means of a mass-flow controller 437. Meanwhile, the pressure in the deposition chamber 417 was controlled to 1.3 Torr by a conductance valve (not shown).

The annealing in accordance with the invention in a gas atmosphere containing trace amount of oxygen atoms was conducted for 10 minutes, while the substrate heater 410 was controlled to maintain the substrate temperature at 350° C. Then, the supply of the O$_2$/Ar gas (dilution: 100 ppm) into the deposition chamber 417 was stopped and the interior of the deposition chamber 417 and the gas line was evacuated to 1×10$^{-5}$ Torr.

(6) Then, an RF i-layer 351 of a-Si, an MW i-layer 304 of a-SiGe, an RF i-layer 361 of a-Si, an RF p-layer 305 of a-SiC, an RF n-layer 306 of μc-Si, an RF i-layer 352 of a-Si, an MW i-layer 307 of a-SiGe, an RF i-layer 362 of a-Si, an RF p-layer 308 of a-SiC, an RF n-layer 309 of μc-Si, an RF i-layer 310 of a-Si, and an RF p-layer 311 of a-SiC were successively formed, in accordance with a procedure which is substantially the same as that used in Example A-2.

(7) Then, an ITO film of 70 nm thick, serving as a transparent conductive layer 312, was formed on the RF p-layer 311 by vacuum evaporation.

(8) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of this example was thus completed. This element will be referred to as "SC/A-3". The conditions of the annealing in gas atmosphere containing trace amount of oxygen atoms in this example, as well as the conditions of film-forming processes for forming the RF n-layer, RF i-layer, MW i-layer and RF-p layer are collectively shown in Tables 7 and 8.

TABLE 7

CONDITIONS OF ANNEALING IN GAS ATMOSPHERE
CONTAINING TRACE AMOUNT OF OXYGEN ATOMS (SC/A-3)
(SC/A-3)

| Type of gas containing oxygen atoms | O$_2$/He |
|---|---|
| Gas concentration (dilution:ppm) | 100 |
| Annealing temp. (° C.) | 350 |
| Annealing press. (Torr) | 1.0 |

TABLE 8

| | SiH$_4$ flow rate sccm | Si$_2$H$_6$ flow rate sccm | CH$_4$ flow rate sccm | GeH$_4$ flow rate sccm | H$_2$ flow rate sccm | PH$_3$/H$_2$ flow rate sccm | B$_2$H$_6$/H$_2$ flow rate sccm | SIH$_4$/H$_2$ flow rate sccm | Press. Torr | MW Power W/cm$^2$ | RF Power W/cm$^2$ | Substrate temp. ° C. | Film thickness nm |
|---|---|---|---|---|---|---|---|---|---|---|---|---|---|
| RF n-layer (303) | 2.0 | | | | 100 | 200 | | | 1.3 | | 0.05 | 350 | 20 |
| RF i-layer (351) | | 4.0 | | | 100 | | | | 0.8 | | 0.008 | 300 | 10 |
| MW i-layer (304) | 40 | | | 40 | 100 | | | | 0.010 | 0.12 | 0.31 | 370 | 110 |
| RF i-layer (361) | | 4.0 | 0.1 | | 100 | | | | 0.010 | 0.12 | 0.31 | 300 | 23 |
| RF p-layer (305) | | | | | 80 | | 9 | 2 | 1.8 | | 0.07 | 300 | 10 |
| RF n-layer (306) | 1.1 | | | | 40 | 290 | | | 1.1 | | 0.04 | 300 | 10 |
| RF i-layer (352) | | 4.0 | | | 90 | | | | 0.75 | | 0.008 | 300 | 10 |
| MW i-layer (307) | 35 | | | 25 | 120 | | | | 0.013 | 0.12 | 0.3 | 350 | 100 |
| RF i-layer (362) | | 3.5 | | | 90 | | | | 0.7 | | 0.008 | 280 | 23 |
| RF p-layer (308) | | | 0.2 | | 80 | | 9 | 2 | 1.7 | | 0.07 | 260 | 10 |
| RF n-layer (309) | 0.8 | | | | 50 | 250 | | | 1.05 | | 0.04 | 230 | 10 |

TABLE 8-continued

| | SiH$_4$ flow rate sccm | Si$_2$H$_6$ flow rate sccm | CH$_4$ flow rate sccm | GeH$_4$ flow rate sccm | H$_2$ flow rate sccm | PH$_3$/H$_2$ flow rate sccm | B$_2$H$_6$/H$_2$ flow rate sccm | SIH$_4$/H$_2$ flow rate sccm | Press. Torr | MW Power W/cm$^2$ | RF Power W/cm$^2$ | Substrate temp. °C. | Film thickness nm |
|---|---|---|---|---|---|---|---|---|---|---|---|---|---|
| RF i-layer (310) | 1.5 | | | | 80 | | | | 0.8 | | 0.007 | 190 | 90 |
| RF p-layer (311) | | | 0.4 | | 90 | 8 | 2 | | 1.6 | | 0.07 | 170 | 10 |

Comparative Example A 3-1

A process was conducted as Comparative Example A 3-1. This process was different from Example A-3 in that it omitted the annealing in the gas atmosphere containing trace amount of oxygen atoms.

Other conditions were materially the same as those in Example A-3. The photovoltaic element produced in Comparative Example A 3-1 will be referred to as "SC/CA3-1".

Seven samples of the photovoltaic elements SC/A-3, as well as seven samples of the photovoltaic elements SC/CA3-1, were produced and were subjected, basically in the same way as Example A-1 and Comparative Example A1-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The initial photoelectric conversion efficiency was evaluated in terms of variation of the conversion efficiency among the seven sample elements of each type. The anti-environment characteristic was evaluated by setting the humidity to 90% and the time of shelving in the dark place to 150 hours. The results are shown in Table 9.

The performance of the photovoltaic element is shown in Table 9 in terms of values measured on the samples of the photovoltaic element SC/A-3 as normalized by the values measured on the samples of the photovoltaic element SC/CA3-1.

TABLE 9

| Items of evaluation | Evaluation |
|---|---|
| Initial photoelectric conversion efficiency characteristic | 1.4 |
| Variation of Initial photoelectric conversion efficiency characteristic | 0.87 |
| Photo-degradation characteristic | 0.85 |
| Anti-environment characteristic | 0.84 |
| SEM observation of sectional face | 0.93 |
| Measurement of adhesion: Delamination | No delamination in SC/A-3 Slight delamination in SC/CA3-1 |

From the results shown in Table 9, it will be seen that all the sample photovoltaic elements SC/A-3 in accordance with Example A-3 exhibit superiority to the sample photovoltaic elements SC/CA3-1 of Comparison Example A3-1 in all items of evaluation.

EXAMPLE A-4

This Example is different from Example A-3 in that the annealing was effected on the RF i-layer 351 of a-Si, in place of the RF n-layer 303 of μc-Si. A photovoltaic element of the triple type shown in FIG. 3 was manufactured by using an in-line type apparatus shown in FIG. 4, in accordance with the following procedure.

(1) A substrate having a reflecting layer 301 and a reflection enhancement layer 302 formed thereon (i.e. base member), prepared in the same way as that in Example A-1, was disposed on a substrate conveyor rails 413 laid in a load chamber 401, and the internal pressure of the load chamber 401 was lowered to 1×10$^{-5}$ Torr. by a vacuum pump (not shown).

(2) Then, gate valves 406 and 407 were opened and the substrate was conveyed into conveyance chambers 402, 403 and then into a deposition chamber 418 which had been evacuated to certain levels of vacuum by vacuum pumps which are not shown The substrate was held such that its reverse side is kept in close contact with a substrate heater 411 so as to be heated by the heater 411, while the interior of the deposition chamber 418 was evacuated by the vacuum pump to a level of 1×10$^{-5}$ Torr.

(3) Preparation for film forming operation was thus completed. Then H$_2$ gas was introduced into the deposition chamber 417 through a gas-introduction line 429 and the flow rate of the H$_2$ gas was controlled to 500 sccm by means of valves 441, 431, 430, under the control of a mass-flow controller 436. At the same time, the internal pressure of the deposition chamber 417 was regulated to 1.3 Torr. by a conductance valve (not shown). Meanwhile, the substrate heater 410 was adjusted to maintain the substrate temperature at 350° C. An RF n-layer 303 of μc-Si and an RF i-later 351 of a-Si were formed when the substrate temperature has become steady.

(4) Then, an annealing was executed in an atmosphere of a gas containing a trace amount of oxygen atoms.

For the purpose of executing the annealing in the gas atmosphere containing a trace amount of oxygen atoms, O$_2$/H$_2$ gas (dilution: 1 ppm) was introduced as the oxygen atom-containing gas into the deposition chamber 418 through the gas introduction line 449. The valves 465 and 455 were opened and the flow rate of the O$_2$/H$_2$ gas was controlled to 500 sccm by means of a mass-flow controller 460. Meanwhile, the pressure in the deposition chamber 418 was controlled to 1.0 Torr by a conductance valve (not shown).

The annealing in accordance with the invention in a gas atmosphere containing trace amount of oxygen atoms was conducted for 10 minutes, while the substrate heater 411 was controlled to maintain the substrate temperature at 300° C. Then, the supply of the O$_2$/H$_2$ gas (dilution: 1 ppm) into the deposition chamber 418 was stopped and the interior of the deposition chamber 418 and the gas line was evacuated to 1×10$^{-5}$ Torr.

(5) Then, an MW i-layer 304 of a-SiGe, an RF i-layer 361 of a-Si, an RF p-layer 305 of a-SiC, an RF n-layer 306 of μc-Si, an RF i-layer 352 of a-Si, an MW i-layer 307 of a-SiGe, an RF i-layer 362 of a-Si, an RF p-layer 308 of a-SiC, an RF n-layer 309 of μc-Si, an RF i-layer 310 of a-Si, and an RF p-layer 311 of a-SiC were successively formed, in accordance with a procedure which is substantially the same as that used in Example A-2.

(6) Then, an ITO film of 70 nm thick, serving as a transparent conductive layer 312, was formed on the RF p-layer 311 by vacuum evaporation.

(7) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of this example was thus completed. This element will be referred to as "SC/A-4". The conditions of the annealing in gas atmosphere containing trace amount of oxygen atoms in this example, as well as the conditions of film-forming processes for forming the RF n-layer, RF i-layer, MW i-layer and RF-p layer are collectively shown in Tables 10 and 11.

TABLE 10

CONDITIONS OF ANNEALING IN GAS ATMOSPHERE CONTAINING TRACE AMOUNT OF OXYGEN ATOMS (SC/A-4)

| | |
|---|---|
| Type of gas containing oxygen atoms | $O_2/H_2$ |
| Gas concentration (dilution:ppm) | 1 |
| Annealing temp. (° C.) | 300 |
| Annealing press. (Torr) | 1.0 | acteristic against high-temperature and high-humidity environment, SEM observation of cut surface, and adhesion. The initial photoelectric conversion efficiency was evaluated in terms of variation of the conversion efficiency among the eight sample elements of each type. The anti-environment characteristic was evaluated by setting the temperature to 83° C., the humidity to 90% and the time of shelving in the dark place to 150 hours. The results are shown in Table 12.

The performance of the photovoltaic element is shown in Table 12 in terms of values measured on the samples of the photovoltaic element SC/A-4 as normalized by the values measured on the samples of the photovoltaic element SC/CA4-1.

TABLE 12

| Items of evaluation | Evaluation |
|---|---|
| Initial photoelectric conversion efficiency characteristic | 1.45 |
| Variation of Initial photoelectric conversion efficiency characteristic | 0.86 |
| Photo-degradation characteristic | 0.84 |
| Anti-environment characteristic | 0.84 |
| SEM observation of sectional face | 0.92 |

TABLE 11

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 200 | | | 1.3 | | 0.05 | 350 | 20 |
| RF i-layer | | 4.0 | | | 100 | | | | 0.8 | | 0.008 | 300 | 10 |
| MW i-layer | 40 | | | 50 | 100 | | | | 0.010 | 0.12 | 0.31 | 370 | 110 |
| RF i-layer | | 4.0 | | | 100 | | | | 0.75 | | 0.008 | 300 | 23 |
| RF p-layer | | | 1.0 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 35 | | | 27 | 120 | | | | 0.013 | 0.12 | 0.3 | 350 | 100 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 1.5 | | | 80 | | | | 0.8 | | 0.007 | 190 | 90 |
| RF p-layer | | | 0.4 | | 90 | | 8 | 2 | 1.6 | | 0.07 | 170 | 10 |

Comparative Example A 4-1

A process was conducted as Comparative Example A 4-1. This process was different from Example A-4 in that it omitted the annealing in the gas atmosphere containing trace amount of oxygen atoms.

Other conditions were materially the same as those in Example A-4. The photovoltaic element produced in Comparative Example A 4-1 will be referred to as "SC/CA4-1".

Eight samples of the photovoltaic elements SC/A-4, as well as eight samples of the photovoltaic elements SC/CA4-1, were produced and were subjected, basically in the same way as Example A-1 and Comparative Example A1-1, for evaluation of various items of performance such as initial photoelectric conversion efficiency (photo-voltage/incident photo-power), variation or lack of uniformity of the conversion efficiency, photo-degradation, anti-environment char- TABLE 12-continued

| Items of evaluation | Evaluation |
|---|---|
| Measurement of adhesion: Delamination | No delamination in SC/A-4 Slight delamination in SC/CA4-1 |

From the results shown in Table 12, it will be seen that all the sample photovoltaic elements SC/A-4 in accordance with Example A-4 exhibit superiority to the sample photovoltaic elements SC/CA4-1 of Comparison Example A4-1 in all items of evaluation.

EXAMPLE A-5

This Example is different from Example A-3 in that the annealing was effected on the MW i-layer 304 of a-Si, in place of the RF n-layer 303 of μc-Si. As in Example A-3, a photovoltaic element of the triple type shown in FIG. 3 was manufactured by using an in-line type apparatus shown in FIG. 4, in accordance with the following procedure.

(1) A substrate having a reflecting layer 301 and a reflection enhancement layer 302 formed thereon (i.e. base member), prepared in the same way as that in Example A-1, was disposed on a substrate conveyor rails 413 laid in a load chamber 401, and the internal pressure of the load chamber 401 was lowered to $1\times10^{-5}$ Torr. by a vacuum pump (not shown).

(2) Then, gate valves 406 and 407 were opened and the substrate was conveyed into conveyance chambers 402, 403 and then into a deposition chamber 418 which have been evacuated to certain levels of vacuum by vacuum pumps which are not shown. The substrate was held such that its reverse side is kept in close contact with a substrate heater 411 so as to be heated by the heater 411, while the interior of the deposition chamber 418 was evacuated by the vacuum pump to a level of $1\times10^{-5}$ Torr.

(3) Preparation for film forming operation was thus completed. Then, $H_2$ gas was introduced into the deposition chamber 417 through a gas-introduction line 429 and the flow rate of the $H_2$ gas was controlled to 500 sccm by means of valves 441, 431, 430, under the control of a mass-flow controller 436. At the same time, the internal pressure of the deposition chamber 417 was regulated to 1.3 Torr. by a conductance valve (not shown).

Meanwhile, the substrate heater 410 was adjusted to maintain the substrate temperature at 350° C. An RF n-layer 303 of μc-Si and an RF i-layer 351 of a-Si and an MW i-layer 304 of a-SiGe were formed when the substrate temperature became steady.

(4) Then, an annealing was executed in an atmosphere of a gas containing a trace amount of oxygen atoms.

For the purpose of executing the annealing in the gas atmosphere containing a trace amount of oxygen atoms, $O_2/H_2$ gas (dilution: 1 ppm) was introduced as the oxygen atom-containing gas into the deposition chamber 418 through the gas introduction line 449. The valves 465 and 455 were opened and the flow rate of the $O_2$/He gas was controlled to 500 scam by means of a mass-flow controller 460. Meanwhile, the pressure in the deposition chamber 418 was controlled to 1.0 Torr by a conductance valve (not shown).

The annealing in accordance with the invention in a gas atmosphere containing trace amount of oxygen atoms was conducted for 10 minutes, while the substrate heater 411 was controlled to maintain the substrate temperature at 300° C. Then, the supply of the $O_2$/He gas (dilution: 1 ppm) into the deposition chamber 418 was stopped and the interior of the deposition chamber 418 and the gas line was evacuated to $1\times10^{-5}$ Torr.

(5) Then, an RF i-layer 361 of a-Si, an RF p-layer 305 of a-SiC, an RF n-layer 306 of μc-Si, an RF i-layer 352 of a-Si, an MW i-layer 307 of a-SiGe, an RF i-layer 362 of a-Si, an RF p-layer 308 of a-SiC, an RF n-layer 309 of μc-Si, an RF i-layer 310 of a-Si, and an RF p-layer 311 of a-SiC were successively formed, in accordance with a procedure which is substantially the same as that used in Example A-2.

(6) Then, an ITO film of 70 nm thick, serving as a transparent conductive layer 312, was formed on the RF p-layer 311 by vacuum evaporation.

(7) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of this example was thus completed. This element will be referred to as "SC/A-5". The conditions of the annealing in gas atmosphere containing trace amount of oxygen atoms in this example, as well as the conditions of film-forming processes for forming the RF n-layer, RF i-layer, MW i-layer and RF-p layer are collectively shown in Tables 13 and 14.

TABLE 13

CONDITIONS OF ANNEALING IN GAS ATMOSPHERE CONTAINING TRACE AMOUNT OF OXYGEN ATOMS

| Type of gas containing oxygen atoms | $O_2$/He |
|---|---|
| Gas concentration (dilution:ppm) | 1 |
| Annealing temp. (° C.) | 300 |
| Annealing press. (Torr) | 1.0 |

TABLE 14

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 200 | | | 1.3 | | 0.05 | 350 | 20 |
| RF i-layer | | 4.0 | | | 100 | | | | 0.8 | | 0.008 | 300 | 10 |
| MW i-layer | 49 | | | 51 | 100 | | | | 0.010 | 0.12 | 0.31 | 370 | 100 |
| RF i-layer | | 4.0 | | | 100 | | | | 0.75 | | 0.008 | 300 | 23 |
| RF p-layer | | | 1.0 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 35 | | | 27 | 120 | | | | 0.013 | 0.12 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 80 | | | | 0.8 | | 0.007 | 190 | 90 |
| RF p-layer | | | 0.4 | | 90 | | 8 | 2 | 1.6 | | 0.07 | 170 | 10 |

Comparative Example A 5-1

A process was conducted as Comparative Example A 5-1. This process was different from Example A-5 in that it omitted the annealing in the gas atmosphere containing trace amount of oxygen atoms.

Other conditions were materially the same as those in Example A-5. The photovoltaic element produced in Comparative Example A 5-1 will be referred to as "SC/CA5-1".

Eight samples of the photovoltaic elements SC/A-5, as well as eight samples of the photovoltaic elements SC/CA5-1, were produced and were subjected, basically in the same way as Example A-1 and Comparative Example A1-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The initial photoelectric conversion efficiency was evaluated in terms of variation of the conversion efficiency among the eight sample elements of each type. The anti-environment characteristic was evaluated by setting the temperature to 83° C., the humidity to 90% and the time of shelving in the dark place to 150 hours. The results are shown in Table 15.

The performance of the photovoltaic element is shown in Table 15 in terms of values measured on the samples of the photovoltaic element SC/A-5 as normalized by the values measured on the samples of the photovoltaic element SC/CA5-1.

TABLE 15

| Items of evaluation | Evaluation |
|---|---|
| Initial photoelectric conversion efficiency characteristic | 1.48 |
| Variation of Initial photoelectric conversion efficiency characteristic | 0.86 |
| Photo-degradation characteristic | 0.84 |
| Anti-environment characteristic | 0.84 |
| SEM observation of sectional face | 0.92 |
| Measurement of adhesion: Delamination | No delamination in SC/A-5 Slight delamination in SC/CA5-1 |

From the results shown in Table 15, it will be seen that all the sample photovoltaic elements SC/A-5 in accordance with Example A-5 exhibit superiority to the sample photovoltaic elements SC/CA5-1 of Comparison Example A5-1 in all items of evaluation.

EXAMPLE A-6

This Example is different from Example A-3 in that the annealing was effected on the RF i-layer 361 of a-Si, in place of the RF n-layer 303 of $\mu$c-Si. As in Example A-3, a photovoltaic element of the triple type shown in FIG. 3 was manufactured by using an in-line type apparatus shown in FIG. 4, in accordance with the following procedure.

(1) A substrate having a reflecting layer 301 and a reflection enhancement layer 302 formed thereon (i.e. base member), prepared in the same way as that in Example A-1, was disposed on a substrate conveyor rails 413 laid in a load chamber 401, and the internal pressure of the load chamber 401 was lowered to $1 \times 10^{-5}$ Torr. by a vacuum pump (not shown).

(2) Then, gate valves 406 and 407 were opened and the substrate was conveyed into conveyance chambers 402, 403 and then into a deposition chamber 418 which had been evacuated to certain levels of vacuum by vacuum pumps which are not shown. The substrate was held such that its reverse side is kept in close contact with a substrate heater 411 so as to be heated by the heater 411, while the interior of the deposition chamber 418 was evacuated by the vacuum pump to a level of $1 \times 10^{-5}$ Torr.

(3) Preparation for film forming operation was thus completed. Then, $H_2$ gas was introduced into the deposition chamber 417 through a gas-introduction line 429 and the flow rate of the $H_2$ gas was controlled to 500 sccm by means of valves 441, 431, 430, under the control of a mass-flow controller 436. At the same time, the internal pressure of the deposition chamber 417 was regulated to 1.3 Torr. by a conductance valve (not shown). Meanwhile, the substrate heater 410 was adjusted to maintain the substrate temperature at 350° C. An RF n-layer 303 of $\mu$c-Si, an RF i-layer 351 of a-Si, an MW i-layer 304 of a-Si(;e and an RF i-layer 361 of a-Si were formed when the substrate temperature became steady.

(4) Then, an annealing was executed in an atmosphere of a gas containing a trace amount of oxygen atoms.

For the purpose of executing the annealing in the gas atmosphere containing a trace amount of oxygen atoms, $O_2$/Ar gas (dilution: 100 ppm) was introduced as the oxygen atom-containing gas into the deposition chamber 418 through the gas introduction line 449. The valves 465 and 455 were opened and the flow rate of the $O_2$/Ar gas was controlled to 500 sccm by means of a mass-flow controller 460. Meanwhile, the pressure in the deposition chamber 418 was controlled to 1.2 Torr by a conductance valve (not shown). The annealing in accordance with the invention in a gas atmosphere containing trace amount of oxygen atoms was conducted for 10 minutes, while the substrate heater 411 was controlled to maintain the substrate temperature at 300° C. Then, the supply of the $O_2$/Ar gas (dilution: 100 ppm) into the deposition chamber 418 was stopped and the interior of the deposition chamber 418 and the gas; line was evacuated to $1 \times 10^{-5}$ Torr.

(5) Then, an RF p-layer 305 of a-SiC, an RF n-layer 306 of $\mu$c-Si, an RF i-layer 352 of a-Si, an MW i-layer 307 of a-SiGe, an RF i-layer 362 of a-Si, an RF p-layer 308 of a-SiC, an RF n-layer 309 of $\mu$c-Si, an RF i-layer 310 of a-Si, and an RF p-layer 311 of a-SiC were successively formed, in accordance with a procedure which is substantially the same as that used in Example A-2.

(6) Then, an ITO film of 70 nm thick, serving as a transparent conductive layer 312, was formed on the RF p-layer 311 by vacuum evaporation (7) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of this example was thus completed. This element will be referred to as "SC/A-6". The conditions of the annealing in gas atmosphere containing trace amount of oxygen atoms in this example, as well as the conditions of film-forming processes for forming the RF n-layer, RF i-layer, MW i-layer and RF-p layer are collectively shown in Tables 16 and 17.

TABLE 16

CONDITIONS OF ANNEALING IN GAS ATMOSPHERE CONTAINING TRACE AMOUNT OF OXYGEN ATOMS

| Type of gas containing oxygen atoms | $O_2$/Ar |
|---|---|
| Gas concentration (dilution:ppm) | 1 |
| Annealing temp. (° C.) | 300 |
| Annealing press. (Torr) | 1.2 |

TABLE 17

| | SiH4 flow rate sccm | Si2H6 flow rate sccm | CH4 flow rate sccm | GeH4 flow rate sccm | H2 flow rate sccm | PH3/H2 flow rate sccm | B2H6/H2 flow rate sccm | SIH4/H2 flow rate sccm | Press. Torr | MW Power W/cm$^2$ | RF Power W/cm$^2$ | Substrate temp. °C | Film thickness nm |
|---|---|---|---|---|---|---|---|---|---|---|---|---|---|
| RF n-layer | 2.0 | | | | 100 | 200 | | | 1.3 | | 0.05 | 350 | 20 |
| RF i-layer | | 4.0 | | | 100 | | | | 0.8 | | 0.008 | 300 | 10 |
| MW i-layer | 49 | | | 51 | 100 | | | | 0.010 | 0.11 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 35 | | | 27 | 120 | | | | 0.013 | 0.11 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 80 | | | | 0.8 | | 0.007 | 190 | 90 |
| RF p-layer | | | 0.4 | | 90 | | 8 | 2 | 1.6 | | 0.07 | 170 | 10 |

Comparative Example A 6-1

A process was conducted as Comparative Example A 6-1. This process was different from Example A-6 in that it omitted the annealing in the gas atmosphere containing trace amount of oxygen atoms.

Other conditions were materially the same as those in Example A-6. The photovoltaic element produced in Comparative Example A 6-1 will be referred to as "SC/CA6-1".

Seven samples of the photovoltaic elements SC/A-6, as well as seven samples of the photovoltaic elements SC/CA6-1, were produced and were subjected, basically in the same way as Example A-1 and Comparative Example A1-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The initial photoelectric conversion efficiency was evaluated in terms of variation of the conversion efficiency among the seven sample elements of each type. The anti-environment characteristic was evaluated by setting the temperature to 83° C., the humidity to 90% and the time of shelving in the dark place to 150 hours. The results are shown in Table 18.

The performance of the photovoltaic element is shown in Table 18 in terms of values measured on the samples of the photovoltaic element SC/A-6 as normalized by the values measured on the samples of the photovoltaic element SC/CA6-1.

TABLE 18

| Items of evaluation | Evaluation |
|---|---|
| Initial photoelectric conversion efficiency characteristic | 1.49 |
| Variation of Initial photoelectric conversion efficiency characteristic | 0.85 |
| Photo-degradation characteristic | 0.83 |
| Anti-environment characteristic | 0.84 |
| SEM observation of sectional face | 0.92 |
| Measurement of adhesion: Delamination | No delamination in SC/A-6 Slight delamination in SC/CA6-1 |

From the results shown in Table 18, it will be seen that all the sample photovoltaic elements SC/A-6 in accordance with Example A-6 exhibit superiority to the sample photovoltaic elements SC/CA6-1 of Comparison Example A6-1 in all items of evaluation.

EXAMPLE A-7

This Example is different from Example A-2 in that the annealing was effected on the RF p-layer 205 of a-SiC, in place of the RF n-layer 203 of μc-Si. As in Example A-2, a photovoltaic element of tandem type shown in FIG. 2 was manufactured by using an in-line type apparatus shown in FIG. 4, in accordance with the following procedure.

(1) A substrate having a reflecting layer 201 and a reflection enhancement layer 202 formed thereon (i.e. base member), prepared in the same way as that in Example A-1, was disposed on a substrate conveyor rails 413 laid in a load chamber 401, and the internal pressure of the load chamber 401 was lowered to $1 \times 10^{-5}$ Torr. by a vacuum pump (not shown).

(2) Then, the gate valve 406 was opened and the substrate was conveyed into the conveyance chamber 402 and the deposition chamber 417 which had been evacuated to certain levels of vacuum by vacuum pumps which are not shown. The substrate was held such that its reverse side is kept in close contact with a substrate heater 410 so as to be heated by the heater 410, while the interior of the deposition chamber 417 was evacuated by the vacuum pump to a level of $1 \times 10^{-5}$ Torr.

(3) Preparation for film forming operation was thus completed. Then, H$_2$ gas was introduced into the deposition chamber 417 through a gas-introduction line 429 and the flow rate of the H$_2$ gas was controlled to 500 sccm by means of valves 441, 431, 430, under the control of a mass-flow controller 436. At the same time, the internal pressure of the deposition chamber 417 was regulated to 1.0 Torr. by a conductance valve (not shown). Meanwhile, the substrate heater 410 was adjusted to maintain the substrate temperature at 350° C. An RF n-layer 203 of μc-Si, an RF i-layer 251 of a-Si, an MW i-layer 204 of a-SiGe, an RF i-layer 261 of a-Si and an RF p-layer 205 of a-SiC were formed in the same method as that in Example A-2, when the substrate temperature has become steady.

(4) Then, an annealing was executed in an atmosphere of a gas containing a trace amount of oxygen atoms.

For the purpose of executing the annealing in the gas atmosphere containing a trace amount of oxygen atoms, $O_2/H_2$ gas (dilution: 1000 ppm) was introduced as the oxygen atom-containing gas into the deposition chamber 417 through the gas introduction line 429. The valves 442 and 432 were opened and the flow rate of the $O_2/H_2$ gas was controlled to 500 sccm by means of a mass-flow controller 436. Meanwhile, the pressure in the deposition chamber 417 was controlled to 1.0 Torr by a conductance valve (not shown). The annealing in accordance with the invention in a gas atmosphere containing trace amount of oxygen atoms was conducted for 10 minutes, while the substrate heater 410 was controlled to maintain the substrate temperature at 225° C. Then, the supply of the $O_2/H_2$ gas (dilution: 1000 ppm) into the deposition chamber 417 was stopped and the interior of the deposition chamber 417 and the gas line was evacuated to $1 \times 10^{-5}$ Torr.

(5) Then, an RF n-layer 206 of μc-Si, an RF i-layer 207 of a-Si and an RF p-layer 208 of a-SiC were successively formed, in accordance with a procedure which is substantially the same as that used in Example A-2.

(6) Then, an ITO film of 70 nm thick, serving as a transparent conductive layer 212, was formed on the RF p-layer 208 by vacuum evaporation.

(7) A mask having comb-shaped aperture was placed on the transparent electrode 212 and a comb-shaped collector electrode 213 of Cr(40 nm)/Ag(1000 nm)/Cr(40 nm) was formed by vacuum evaporation.

Fabrication of the photovoltaic element of this example was thus completed. This element will be referred to as "SC/A-7". The conditions of the annealing in gas atmosphere containing trace amount of oxygen atoms in this example, as well as the conditions of film-forming processes for forming the RF n-layer, RF i-layer, MW i-layer and RF-p layer are collectively shown in Tables 19 and 20.

TABLE 19

| CONDITIONS OF ANNEALING IN GAS ATMOSPHERE CONTAINING TRACE AMOUNT OF OXYGEN ATOMS | |
|---|---|
| Type of gas containing oxygen atoms | $O_2/H_2$ |
| Gas concentration (dilution:ppm) | 1000 |
| Annealing temp. (° C.) | 225 |
| Annealing press. (Torr) | 1.0 |

Comparative Example A 7-1

A process was conducted as Comparative Example A 7-1. This process was different from Example A-7 in that it omitted the annealing in the gas atmosphere containing trace amount of oxygen atoms.

Other conditions were materially the same as those in Example A-7. Consequently, samples materially the same as samples SC/CA2-1 were obtained. The photovoltaic element produced in Comparative Example A 7-1 will be referred to as "SC/CA7-1".

Seven samples of the photovoltaic elements SC/A-7, as well as seven samples of the photovoltaic elements SC/CA7-1, were produced and were subjected, basically in the same way as Example A-1 and Comparative Example A1-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The initial photoelectric conversion efficiency was evaluated in terms of variation of the conversion efficiency among the seven sample elements of each type. The anti-environment characteristic was evaluated by setting the temperature to 83° C., the humidity to 90% and the time of shelving in the dark place to 150 hours. The results are shown in Table 21.

The performance of the photovoltaic element is shown in Table 21 in terms of values measured on the samples of the photovoltaic element SC/A-7 as normalized by the values measured on the samples of the photovoltaic element SC/CA7-1.

TABLE 21

| Items of evaluation | Evaluation |
|---|---|
| Initial photoelectric conversion efficiency characteristic | 1.50 |
| Variation of Initial photoelectric conversion efficiency characteristic | 0.86 |
| Photo-degradation characteristic | 0.82 |
| Anti-environment characteristic | 0.84 |
| SEM observation of sectional face | 0.92 |
| Measurement of adhesion: Delamination | No delamination in SC/A-7 Slight delamination in SC/CA7-1 |

From the results shown in Table 21, it will be seen that all the sample photovoltaic elements SC/A-7 in accordance

TABLE 20

| | SiH$_4$ flow rate sccm | Si$_2$H$_6$ flow rate sccm | CH$_4$ flow rate sccm | GeH$_4$ flow rate sccm | H$_2$ flow rate sccm | PH$_3$/H$_2$ flow rate sccm | B$_2$H$_6$/H$_2$ flow rate sccm | SIH$_4$/H$_2$ flow rate sccm | Press. Torr | MW Power W/cm$^2$ | RF Power W/cm$^2$ | Substrate temp. ° C. | Film thickness nm |
|---|---|---|---|---|---|---|---|---|---|---|---|---|---|
| RF n-layer | 2 | | | | 100 | 200 | | | 1.0 | | 0.05 | 350 | 20 |
| RF i-layer | | 4 | | | 110 | | | | 0.7 | | 0.009 | 300 | 10 |
| MW i-layer | 49 | | | 52 | 150 | | | | 0.006 | 0.10 | 0.30 | 380 | 150 |
| RF i-layer | | 3 | | | 90 | | | | 0.7 | | 0.007 | 250 | 20 |
| RF p-layer | | | 0.3 | | 60 | | 10 | 2 | 2.0 | | 0.07 | 230 | 10 |
| RF n-1ayer | 2 | | | | 50 | 250 | | | 1.0 | | 0.04 | 225 | 10 |
| RF i-layer | | 1.8 | | | 80 | | | | 0.5 | | 0.007 | 200 | 120 |
| RF p-layer | | | 0.3 | | 60 | | 10 | 2 | 2.0 | | 0.07 | 170 | 10 | with Example A-7 exhibit superiority to the sample photovoltaic elements SC/CA7-1.

EXAMPLE A-8

This example is different from Example A-3 in that the concentration of the gas containing trace amount of oxygen atoms used as the annealing atmosphere was varied within the range of between 0.3 ppm and 2000 ppm, for the purpose of investigating the influence of the gas concentration on the performance such as the initial photoelectric conversion efficiency. $H_2$ gas was used as the diluting gas for varying the concentration of the gas containing trace amount of oxygen atoms.

In this example, as in Example A-3, a triple type photovoltaic element was produced by using the in-line type apparatus shown in FIG. 4. The process was materially the same as that in Example A-3, except that annealing conditions as shown in Table 22 and production conditions as shown in Table 23 were used. Ten sample elements were produced while varying the concentration of oxygen atoms-containing gas between 0.3 ppm and 2000 ppm.

TABLE 22

CONDITIONS OF ANNEALING IN GAS ATMOSPHERE CONTAINING TRACE AMOUNT OF OXYGEN ATOMS

| | |
|---|---|
| Type of gas containing oxygen atoms | $O_2/H_2$ |
| Gas concentration (dilution:ppm) | 0.3–2000 |
| Annealing temp. (° C.) | 330 |
| Annealing press. (Torr) | 1.0 |

These ten samples were subjected to evaluation of performance in terms of initial photoelectric conversion efficiency, variation of the conversion efficiency, photo-degradation, anti-environment characteristic and delamination of layers, in the same way as that in Example A-3. Results of evaluation on each of the ten samples are shown in Table 24. The evaluation was made by normalizing the measurement results of the samples with the values measured on the sample which was produced by using the annealing gas containing trace amount of oxygen atoms having the concentration of 0.3 ppm. A mark x indicates that the normalized value is not less than 1.0 but below 1.4, a mark Δ indicates that the normalized value is not less than 1.4 but below 1.8 and a mark ○ indicates that the normalized value is not less than 1.8.

From Table 24, it is understood that the concentration of the oxygen atom-containing gas, which is used as the atmosphere gas of the annealing in a gas containing trace amount of oxygen atoms, preferably ranges from 1 ppm to 1000 ppm with respect to the $H_2$ gas, in order to obtain good results in regard to the initial photoelectric conversion efficiency, variation of the efficiency, photo-degradation, anti-environment characteristic against high-temperature, high-humidity atmosphere and adhesion.

TABLE 23

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 200 | | | 1.3 | | 0.05 | 350 | 20 |
| RF i-layer | | 4.0 | | | 100 | | | | 0.8 | | 0.008 | 300 | 10 |
| MW i-layer | 49 | | | 51 | 125 | | | | 0.010 | 0.11 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 35 | | | 27 | 110 | | | | 0.013 | 0.11 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.5 | | | 80 | | | | 0.8 | | 0.007 | 190 | 90 |
| RF p-layer | | | 0.4 | | 90 | | 8 | 2 | 1.6 | | 0.07 | 170 | 10 |

TABLE 24

| Concentration of trace amount of oxygen atoms: ppm | 0.3 | 0.8 | 1 | 10 | 100 | 500 | 1000 | 1050 | 1300 | 2000 |
|---|---|---|---|---|---|---|---|---|---|---|
| Initial photoelectric conversion characteristic | x | Δ | ○ | ○ | ○ | ○ | ○ | x | x | x |
| Variation of characteristic | x | Δ | ○ | ○ | ○ | ○ | ○ | x | x | x |
| Photo-degradation characteristic | x | Δ | ○ | ○ | ○ | ○ | ○ | Δ | x | x |
| Anti-environment characteristic | x | Δ | ○ | ○ | ○ | ○ | ○ | x | x | x |
| Adhesion | x | Δ | ○ | ○ | ○ | ○ | ○ | Δ | x | x |

EXAMPLE A-9

This example is different from Example A-3 in that the concentration of the gas containing trace amount of oxygen atoms used as the annealing atmosphere was varied within the range of between 0.3 ppm and 2000 ppm, for the purpose of investigating the influence of the gas concentration on the performance such as the initial photoelectric conversion efficiency. He gas was used as the diluting gas for varying the concentration of the gas containing trace amount of oxygen atoms.

In this example, as in Example A-3, a triple type photovoltaic element of FIG. 3 was produced by using the in-line type apparatus shown in FIG. 4. The process was materially the same as that in Example A-3, except that annealing conditions as shown in Table 25 and production conditions as shown in Table 26 were used. Ten sample elements were produced while varying the concentration of oxygen atoms-containing gas between 0.3 ppm and 2000 ppm.

TABLE 25

CONDITIONS OF ANNEALING IN GAS ATMOSPHERE CONTAINING TRACE AMOUNT OF OXYGEN ATOMS

| | |
|---|---|
| Type of gas containing oxygen atoms | $O_2$/He |
| Gas concentration (dilution:ppm) | 0.3–2000 |
| Annealing temp. (° C.) 350 | 340 |
| Annealing press. (Torr) | 1.5 |

These ten samples were subjected to evaluation of performance in the same way as that in Example A-3. Results of evaluation on each of the ten samples are shown in Table 27. The evaluation was made by normalizing the values measured on the respective samples with the values measured on the sample which was produced by using the annealing gas containing trace amount of oxygen atoms having the concentration of 0.3 ppm. A mark x indicates that the normalized value is not less than 1.0 but below 1.4, a mark Δ indicates that the normalized value is not less than 1.4 but below 1.8 and a mark ○ indicates that the normalized value is not less than 1.8.

From Table 27, it is understood that the concentration of the oxygen atom-containing gas, which is used as the atmosphere gas of the annealing in a gas containing trace amount of oxygen atoms, most preferably ranges from 1 ppm to 1000 ppm with respect to the He gas, in order to obtain good results in regard to the initial photoelectric conversion efficiency, variation of the efficiency, photo-degradation, anti-environment characteristic against high-temperature, high-humidity atmosphere and adhesion.

TABLE 27

| Concentration of trace amount of oxygen atoms: ppm | 0.3 | 0.8 | 1 | 10 | 100 | 500 | 1000 | 1050 | 1300 | 2000 |
|---|---|---|---|---|---|---|---|---|---|---|
| Initial photoelectric conversion characteristic | x | Δ | ○ | ○ | ○ | ○ | ○ | x | x | x |
| Variation of characteristic | x | Δ | ○ | ○ | ○ | ○ | ○ | x | x | x |
| Photo-degradation characteristic | x | x | ○ | ○ | ○ | ○ | ○ | Δ | x | x |
| Anti-environment characteristic | x | Δ | ○ | ○ | ○ | ○ | ○ | x | x | x |
| Adhesion | x | Δ | ○ | ○ | ○ | ○ | ○ | Δ | x | x |

EXAMPLE A-10

This example is different from Example A-3 in that the concentration of the gas containing trace amount of oxygen atoms used as the annealing atmosphere was varied within the range of between 0.3 ppm and 2000 ppm, for the purpose of investigating the influence of the gas concentration on the performance such as the initial photoelectric conversion efficiency. Ar gas was used as the diluting gas for varying the concentration of the gas containing trace amount of oxygen atoms.

In this example, as in Example A-3, a triple type photovoltaic element of FIG. 3 was produced by using the in-line type apparatus shown in FIG. 4. The process was materially the same as that in Example A-3, except that annealing conditions as shown in Table 28 and production conditions as shown in Table 29 were used. Ten sample elements were produced while varying the concentration of oxygen atoms-containing gas between 0.3 ppm and 2000 ppm.

TABLE 26

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 200 | | | 1.3 | | 0.05 | 350 | 20 |
| RF i-layer | | 4.0 | | | 100 | | | | 0.8 | | 0.008 | 300 | 10 |
| MW i-layer | 48 | | | 51 | 120 | | | | 0.010 | 0.10 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 35 | | | 27 | 110 | | | | 0.013 | 0.10 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.5 | | | 80 | | | | 0.8 | | 0.007 | 190 | 90 |
| RF i-layer | | | 0.4 | | 90 | | 8 | 2 | 1.6 | | 0.07 | 170 | 10 |

TABLE 28

CONDITIONS OF ANNEALING IN GAS ATMOSPHERE
CONTAINING TRACE AMOUNT OF OXYGEN ATOMS

| | |
|---|---|
| Type of gas containing oxygen atoms | $O_2/Ar$ |
| Gas concentration (dilution:ppm) | 0.3–2000 |
| Annealing temp. (° C.) | 325 |
| Annealing press. (Torr) | 1.8 |

TABLE 29

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 200 | | | 1.3 | | 0.05 | 350 | 20 |
| RF i-layer | | 4.0 | | | 100 | | | | 0.8 | | 0.008 | 300 | 10 |
| MW i-layer | 48 | | | 51 | 150 | | | | 0.010 | 0.10 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 35 | | | 28 | 140 | | | | 0.013 | 0.10 | 0.3 | 350 | 98 |
| RF i-layer | | 3.5 | | | 90 | | | | 0.7 | | 0.008 | 280 | 23 |
| RF p-layer | | | 0.2 | | 80 | | | | | | | | |
| RF n-layer | 0.8 | | | | 50 | 250 | | | 1.05 | | 0.04 | 230 | 10 |
| RF i-layer | | 2.0 | | | 80 | | | | 0.8 | | 0.007 | 190 | 90 |
| RF p-layer | | | 0.4 | | 90 | | 8 | 2 | 1.6 | | 0.07 | 170 | 10 |

These ten samples were subjected to evaluation of performance in the same way as that in Example A-3. Results of evaluation on each of the ten samples are shown in Table 30. The evaluation was made by normalizing the values measured on the respective samples with the values measured on the sample which was produced by using the annealing gas containing trace amount of oxygen atoms having the concentration of 0.3 ppm. A mark x indicates that the normalized value is not less than 1.0 but below 1.4, a mark Δ indicates that the normalized value is not less than 1.4 but below 1.8 and a mark o indicates that the normalized value is not less than 1.8.

From Table 30, it is understood that the concentration of the oxygen atom-containing gas, which is used as the atmosphere gas of the annealing in a gas containing trace amount of oxygen atoms, most preferably ranges from 1 ppm to 1000 ppm with respect to the Ar gas, in order to obtain good results in regard to the initial photoelectric conversion efficiency, variation of the efficiency, photo-degradation, anti-environment characteristic against high-temperature, high-humidity atmosphere and adhesion.

EXAMPLE A-11

This example is different from Example A-3 in that the annealing temperature was varied within the range of between 25° C. and 500° C., for the purpose of investigating the influence of the annealing temperature on the performance such as the initial photoelectric conversion efficiency. $H_2$ gas was used as the diluting gas for varying the concentration of the gas containing trace amount of oxygen atoms.

In this example, as in Example A-3, a triple type photovoltaic element of FIG. 3 was produced by using the in-line type apparatus shown in FIG. 4. The process was materially the same as that in Example A-3, except that annealing conditions as shown in Table 31 and production conditions as shown in Table 32 were used. Ten sample elements were produced while varying the annealing temperature between 25° C. and 500° C.

TABLE 31

CONDITIONS OF ANNEALING IN GAS ATMOSPHERE
CONTAINING TRACE AMOUNT OF OXYGEN ATOMS

| | |
|---|---|
| Type of gas containing oxygen atoms | $O_2/H_2$ |
| Gas concentration (dilution:ppm) | 2 |
| Annealing temp. (° C.) | 25–500 |
| Annealing press. (Torr) | 1.0 |

TABLE 30

| Concentration of trace amount of oxygen atoms: (ppm) | 0.3 | 0.8 | 1 | 10 | 100 | 500 | 1000 | 1050 | 1300 | 2000 |
|---|---|---|---|---|---|---|---|---|---|---|
| Initial photoelectric conversion characteristic | x | Δ | o | o | o | o | o | x | x | x |
| Variation of characteristic | x | Δ | o | o | o | o | o | x | x | x |
| Photo-degradation characteristic | x | x | o | o | o | o | o | x | x | x |
| Anti-environment characteristic | x | Δ | o | o | o | o | o | x | x | x |
| Adhesion | x | x | o | o | o | o | o | x | x | x |

TABLE 32

| | SiH₄ flow rate sccm | Si₂H₆ flow rate sccm | CH₄ flow rate sccm | GeH₄ flow rate sccm | H₂ flow rate sccm | PH₃/H₂ flow rate sccm | B₂H₆/H₂ flow rate sccm | SIH₄/H₂ flow rate sccm | Press. Torr | MW Power W/cm² | RF Power W/cm² | Substrate temp. ° C. | Film thickness nm |
|---|---|---|---|---|---|---|---|---|---|---|---|---|---|
| RF n-layer | 2.0 | | | | 100 | 200 | | | 1.3 | | 0.05 | 350 | 20 |
| RF i-layer | | 4.0 | | | 100 | | | | 0.8 | | 0.008 | 300 | 10 |
| MW i-layer | 48 | | | 51 | 200 | | | | 0.010 | 0.10 | 0.25 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 35 | | | 28 | 160 | | | | 0.013 | 0.10 | 0.24 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 80 | | | | 0.8 | | 0.007 | 190 | 90 |
| RF p-layer | | | 0.4 | | 90 | | 8 | 2 | 1.6 | | 0.07 | 170 | 10 |

These ten samples were subjected to evaluation of performance in the same way as that in Example A-3. Results of evaluation on each of the ten samples are shown in Table 33. The evaluation was made by normalizing the values measured on the respective samples with the values measured on the sample which was produced by setting the annealing temperature to 25° C. A mark x indicates that the normalized value is not less than 1.0 but below 1.4, a mark Δ indicates that the normalized value is not less than 1.4 but below 1.8 and a mark ° indicates that the normalized value is not less than 1.8.

From Table 33, it is understood that the temperature of the annealing in the atmosphere gas containing trace amount of oxygen atoms most preferably ranges from 50° C. to 400° C., in order to obtain good results in regard to the initial photoelectric conversion efficiency, variation of the efficiency, photo-degradation, anti-environment characteristic against high-temperature, high-humidity atmosphere and adhesion.

TABLE 33

| Annealing temp. (° C.) | 25 | 40 | 50 | 100 | 200 | 300 | 400 | 430 | 470 | 500 |
|---|---|---|---|---|---|---|---|---|---|---|
| Initial photoelectric conversion characteristic | x | Δ | ° | ° | ° | ° | ° | x | x | x |
| Variation of characteristic | x | Δ | ° | ° | ° | ° | ° | x | x | x |
| Photo-degradation characteristic | x | Δ | ° | ° | ° | ° | ° | Δ | x | x |
| Anti-environment characteristic | x | Δ | ° | ° | ° | ° | ° | Δ | x | x |
| Adhesion | x | Δ | ° | ° | ° | ° | ° | Δ | x | x |

EXAMPLE A-12

This example is different from Example A-3 in that the pressure of the annealing atmosphere was varied within the range of between 0.002 Torr and 100 Torr, for the purpose of investigating the influence of the annealing atmosphere pressure on the performance such as the initial photoelectric conversion efficiency. $H_2$ gas was used as the diluting gas for determining the concentration of the gas containing trace amount of oxygen.

In this example, as in Example A-3, a triple type photovoltaic element of FIG. 3 was produced by using the in-line type apparatus shown in FIG. 4. The process was materially the same as that in Example A-3, except that annealing conditions as; shown in Table 34 and production conditions as shown in Table 35 were used. Ten sample elements were produced while varying the pressure of the annealing atmosphere within the range of between 0.002 Torr and 100 Torr.

TABLE 34

CONDITIONS OF ANNEALING IN GAS ATMOSPHERE
CONTAINING TRACE AMOUNT OF OXYGEN ATOMS

| Type of gas containing oxygen atoms | NO/H₂ |
|---|---|
| Gas concentration (dilution:ppm) | 1.5 |
| Annealing temp. (° C.) | 350 |
| Annealing press. (Torr) | 0.002–100 |

TABLE 35

| | SiH$_4$ flow rate sccm | Si$_2$H$_6$ flow rate sccm | CH$_4$ flow rate sccm | GeH$_4$ flow rate sccm | H$_2$ flow rate sccm | PH$_3$/H$_2$ flow rate sccm | B$_2$H$_6$/H$_2$ flow rate sccm | SIH$_4$/H$_2$ flow rate sccm | Press. Torr | MW Power W/cm$^2$ | RF Power W/cm$^2$ | Substrate temp. °C. | Film thickness nm |
|---|---|---|---|---|---|---|---|---|---|---|---|---|---|
| RF n-layer | 2.0 | | | | 100 | 200 | | | 1.3 | | 0.05 | 350 | 20 |
| RF i-layer | | 4.0 | | | 100 | | | | 0.8 | | 0.008 | 300 | 10 |
| MW i-layer | 47 | | | 51 | 200 | | | | 0.010 | 0.10 | 0.25 | 380 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 35 | | | 28 | 160 | | | | 0.013 | 0.10 | 0.24 | 360 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 80 | | | | 0.8 | | 0.007 | 190 | 90 |
| RF p-layer | | | 0.4 | | 90 | | 8 | 2 | 1.6 | | 0.07 | 170 | 10 |

These ten samples were subjected to evaluation of performance in the same way as that in Example A-3. Results of evaluation on each of the ten samples are shown in Table 36. The evaluation was made by normalizing the values measured on the respective samples with the values measured on the sample which was produced by setting the annealing atmosphere pressure to 0.002 Torr. A mark x indicates that the normalized value is not less than 1.0 but below 1.4, a mark Δ indicates that the normalized value is not less than 1.4 but below 1.8 and a mark ° indicates that the normalized value is not less than 1.8.

From Table 36, it is understood that the pressure of the annealing atmosphere most preferably ranges from 0.01 Torr to 10 Torr, in order to obtain good results in regard to the initial photoelectric conversion efficiency, variation of the efficiency, photo-degradation, anti-environment characteristic against high-temperature, high-humidity atmosphere and adhesion.

TABLE 36

| Annealing press. (Torr) | 0.002 | 0.005 | 0.01 | 0.1 | 1 | 5 | 10 | 20 | 50 | 100 |
|---|---|---|---|---|---|---|---|---|---|---|
| Initial photoelectric conversion characteristic | x | x | ○ | ○ | ○ | ○ | ○ | x | x | x |
| Variation of characteristic | x | x | ○ | ○ | ○ | ○ | ○ | x | x | x |
| Photo-degradation characteristic | x | Δ | ○ | ○ | ○ | ○ | ○ | Δ | x | x |
| Anti-environment characteristic | x | Δ | ○ | ○ | ○ | ○ | ○ | Δ | x | x |
| Adhesion | x | x | ○ | ○ | ○ | ○ | ○ | Δ | x | x |

EXAMPLE A-13

This example is different from Example A-3 in that the following conditions (i) to (iii) were employed, for the purpose of investigating the influence of these conditions on the performance such as the initial photoelectric conversion efficiency.

(i) The frequency of the microwave was varied within the range of between 0.02 GHz and 50 GHz in the formation of the MW i-layer 304 of a-SiGe and in the formation of the MW i-layer 307 of a-SiGe.

(ii) He gas was used in place of Ar gas, as the diluting gas which determines the concentration of the gas containing trace amount of oxygen atoms.

(iii) Different annealing conditions were adopted in annealing treatments effected on the MW i-layer 304 of a-SiGe and the MW i-layer 307 of a-SiGe.

In this Example, a photovoltaic element of the triple type shown in FIG. 3 was manufactured by using an in-line type apparatus shown in FIG. 4, except that the above-mentioned varying conditions were employed. The process was as follows.

(1) A substrate having a reflecting layer 301 and a reflection enhancement layer 302 formed thereon (i.e. base member), prepared in the same way as that in Example A-1, was disposed on a substrate conveyor rails 413 laid in a load chamber 401, and the internal pressure of the load chamber 401 was lowered to 1×10$^{-5}$ Torr. by a vacuum pump (not shown).

(2) Then, gate valves 406 and 407 were opened and the substrate was conveyed into conveyance chambers 402, 403 and then into a deposition chamber 418 which had been evacuated to certain levels of vacuum by vacuum pumps which are not shown. The substrate was held such that its reverse side is kept in close contact with a substrate heater 411 so as to be heated by the heater 411, while the interior of the deposition chamber 418 was evacuated by the vacuum pump to a level of 1×10$^{-5}$ Torr.

(3) Preparation for film forming operation was thus completed. Then, H$_2$ gas was introduced into the deposition chamber 417 through a gas-introduction line 429 and the flow rate of the H$_2$ gas was controlled to 500 sccm by means of valves 441, 431, 430, under the control of a mass-flow controller 436. At the same time, the internal pressure of the deposition chamber 417 was regulated to 1.3 Torr. by a conductance valve (not shown). Meanwhile, the substrate heater 410 was adjusted to maintain the substrate temperature at 350° C. When the substrate temperature had been stabilized, an RF i-layer 303 of μc-Si, an RF i-layer 351 of a-Si, and an MW i-layer 304 of a-SiGe were formed in the same way as that in Example A-2. In the formation of the MW i-layer, the MW introduction window 425 was removed and, instead, an antenna-type MW introduction electrode (not shown) was used according to the frequency of the microwave.

(4) Then, an annealing was executed in an atmosphere of a gas containing a trace amount of oxygen atoms.

For the purpose of executing the annealing in the gas atmosphere containing a trace amount of oxygen atoms, $O_2$/He gas (dilution: 1 ppm) was introduced as the oxygen atom-containing gas into the deposition chamber 418 through the gas introduction line 449. The valves 465 and 455 were opened and the flow rate of the $O_2$/He gas was controlled to 500 sccm by means of a mass-flow controller 460. Meanwhile, the pressure in the deposition chamber 418 was controlled to 1.0 Torr by a conductance valve (not shown). The annealing in accordance with the invention in a gas atmosphere containing trace amount of oxygen atoms was conducted for 10 minutes, while the substrate heater 411 was controlled to maintain the substrate temperature at 300° C. Then, the supply of the $O_2$/He gas (dilution: 1 ppm) into the deposition chamber 418 was stopped and the interior of the deposition chamber 418 and the gas line was evacuated to $1 \times 10^{-5}$ Torr.

(5) Then, an RF i-layer 361 of a-Si, an RF p-layer 305 of a-SiC, an RF i-layer 306 of μc-Si, an RF i-layer 352 of a-Si, and an MW i-layer 307 of a-SiGe were successively formed, in accordance with a procedure which is substantially the same as that used in Example A-2. In the formation of the MW i-layer, the MW introduction window 425 was removed and, instead, an antenna-type MW introduction electrode (not shown) was used according to the frequency of the microwave.

(6) Then, an annealing was executed in an atmosphere of a gas containing a trace amount of oxygen atoms.

For the purpose of executing the annealing in the gas atmosphere containing a trace amount of oxygen atoms, $O_2$/He gas (dilution: 1 ppm) was introduced as the oxygen atom-containing gas into the deposition chamber 418 through the gas introduction line 449. The valves 465 and 455 were opened and the flow rate of the $O_2$/He gas was controlled to 500 sccm by means of a mass-flow controller 460. Meanwhile, the pressure in the deposition chamber 418 was controlled to 1.5 Torr by a conductance valve (not shown). The annealing in accordance with the invention in a gas atmosphere containing trace amount of oxygen atoms was conducted for 10 minutes, while the substrate heater 411 was controlled to maintain the substrate temperature at 280° C. Then, the supply of the $O_2$/He gas (dilution: 1 ppm) into the deposition chamber 418 was stopped and the interior of the deposition chamber 418 and the gas line was evacuated to $1 \times 10^{-5}$ Torr.

(7) Then, an RF i-layer 362 of a-Si, an RF p-layer 308 of a-SiC, an RF i-layer 309 of μc-Si, an RF i-layer 310 of a-Si, and an RF p-layer 311 of a-SiC were successively formed, in accordance with a procedure which is substantially the same as that used in Example A-2.

(8) Then, an ITO film of 70 nm thick, serving as a transparent conductive layer 312, was formed on the RF p-layer 311 by vacuum evaporation.

(9) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Production of the photovoltaic element of this example was thus completed. Ten samples were produced while varying the frequency of the microwave used in the formation of the MW i-layer within the range of from 0.02 GHz to 50 GHz. The conditions of the annealing in the atmosphere of the gas containing trace amount of oxygen atoms and the conditions employed in the formation of the RF i-layer, RF i-layer, MW i-layer and RF p-layer are shown in Tables 37, 38 and 39.

TABLE 37

CONDITIONS OF ANNEALING IN GAS ATMOSPHERE
CONTAINING TRACE AMOUNT OF OXYGEN ATOMS
(MW i-layer 304)

| Type of gas containing oxygen atoms | $O_2$/He |
|---|---|
| Gas concentration (dilution:ppm) | 1 |
| Annealing temp. (° C.) | 300 |
| Annealing press. (Torr) | 1.0 |

TABLE 38

CONDITIONS OF ANNEALING IN GAS ATMOSPHERE
CONTAINING TRACE AMOUNT OF OXYGEN ATOMS
(MW i-layer 307)

| Type of gas containing oxygen atoms | $O_2$/He |
|---|---|
| Gas concentration (dilution:ppm) | 1 |
| Annealing temp. (° C.) | 280 |
| Annealing press. (Torr) | 1.5 |

TABLE 39

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 200 | | | 1.3 | | 0.05 | 350 | 20 |
| RF i-layer | | 4.0 | | | 100 | | | | 0.8 | | 0.008 | 300 | 10 |
| MW i-layer | 47 | | | 49 | 300 | | | | 0.005 | 0.25 | 0.28 | 380 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 33 | | | 28 | 225 | | | | 0.005 | 0.25 | 0.28 | 360 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 80 | | | | 0.8 | | 0.007 | 190 | 90 |
| RF p-layer | | | 0.4 | | 90 | | 8 | 2 | 1.6 | | 0.07 | 170 | 10 |

These ten samples were subjected to evaluation of performance in the same way as that in Example A-3. Results of evaluation on each of the ten samples are shown in Table 40. The evaluation was made by normalizing the values measured on the respective samples with the values measured on the sample which was produced by using the microwave frequency of 0.02 GHz. A mark x indicates that the normalized value is not less than 1.0 but below 1.4, a mark Δ indicates that the normalized value is not less than 1.4 but below 1.8 and a mark ° indicates that the normalized value is not less than 1.8. A mark ⊙ indicates that the normalized value is more than 2.0.

From Table 40, it is understood that the frequency of the microwave, which is employed in the formation of the MW i-layer 304 of a-SiGe and the MW i-layer 307 of a-SiGe which are to be annealed in a gas atmosphere containing trace amount of oxygen atoms, most preferably ranges from 0.1 GHz to 10 GHz, in order to obtain good results in regard to the initial photoelectric conversion efficiency, variation of the efficiency, photo-degradation, anti-environment characteristic against high-temperature, high-humidity atmosphere and adhesion.

TABLE 40

| Microwave frequency: GHz | 0.02 | 0.05 | 0.1 | 0.5 | 1 | 2.45 | 10 | 20 | 30 | 50 |
|---|---|---|---|---|---|---|---|---|---|---|
| Initial photo-electric conversion characteristic | x | x | ○ | ○ | ○ | ⊙ | ○ | x | x | x |
| Variation of characteristic | x | x | ○ | ⊙ | ○ | ⊙ | ○ | x | x | x |
| Photo-degradation characteristic | x | x | ⊙ | ⊙ | ⊙ | ⊙ | ○ | Δ | x | x |
| Anti-environment characteristic | x | x | ⊙ | ⊙ | ○ | ⊙ | ○ | x | x | x |
| Adhesion | x | x | ○ | ○ | ○ | ⊙ | ○ | x | x | x |

EXAMPLE A-14

In this example, a triple type photovoltaic element of the type shown in FIG. 3 was produced by using the roll-to-roll type apparatus shown in FIG. 6. The annealing was conducted by using four types of annealing gas containing trace amount of oxygen atoms under various annealing conditions as shown in Table 41. The production process was as follows.

(1) A sheet-like substrate (base member) of 30 cm wide, composed of a substrate of a stainless steel and carrying a reflecting layer such as of Ag (or Al—Si or the like) and a reflection enhancement layer such as of ZnO, was rolled up and set in a loading chamber 5010 for loading sheet-type substrate.

(2) The sheet-type substrate was threaded through all the deposition chambers and all the gas gates, and was connected to a sheet take-up jig disposed in an unload chamber 5150.

(3) The deposition chambers were evacuated to a level of $10^{-3}$ Torr or lower by evacuating systems which are not shown. Material gases were supplied to the deposition chambers, from mixing devices 5024, 5034, 5044, 5054, 5064, 5074, 5084, 5094, 5104, 5114, 5124, 5134 and 5144 associated with the respective deposition chambers.

(4) A gas containing trace amount of oxygen atoms was supplied from the respective gate gas supply devices to the gas gates 5201, 5202, 5203, 5204, 5205, 5206, 5207, 5208, 5209, 5210, 5211, 5212, 5213 and 5214.

In this example, the gap in the gas gate through which the sheet-type substrate passes was variable, and the gas containing trace amount of oxygen atoms was supplied to the gas gates at a total flow rate of 1000 sccm. The temperature of the annealing in the atmosphere of the gas containing trace amount of oxygen atoms was controlled to range between 350° C. and 50° C. by means of heaters incorporated in the gas gates. At the same time, the annealing pressure was controlled to range between 3 Torr and 1 Torr, by means of an evacuating system which is not shown.

(5) The substrate was heated by a substrate heater of each deposition device, and the level of the vacuum in each deposition device was controlled by operating an evacuating valve of each evacuation device. Advance of the sheet-type substrate was commenced when the substrate temperature and the vacuum level have been settled, and RF power for generating plasma and MW power (frequency 2.45 GHz) were supplied to each deposition device.

A triple-type solar cell having three pin structures stacked on one on another on the sheet-type substrate 300 was thus produced.

(6) Then, an ITO film of 70 nm thick, serving as a transparent conductive layer 312, was formed on the RF p-layer 311 by vacuum evaporation.

(7) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of this example was thus completed. This element will be referred to as "SC/A-14". The conditions of the annealing in gas atmosphere containing trace amount of oxygen atoms in this example, as well as the conditions of film-forming processes for forming the RF n-layer, RF i-layer, MW i-layer and RF-p layer are collectively shown in Tables 41 and 42.

TABLE 41

CONDITIONS OF ANNEALING IN GAS ATMOSPHERE CONTAINING TRACE AMOUNT OF OXYGEN ATOMS

| Gas gate | Type of gas | Gas concentration (dilution:ppm) | Anneal temp. (° C.) | Anneal press. (Torr) |
|---|---|---|---|---|
| 5201 | O$_2$/He | 800 | 350 | 3.0 |
| 5202 | O$_2$/H$_2$ | 3 | 350 | 2.0 |
| 5203 | O$_2$/H$_2$ | 1 | 350 | 1.5 |
| 5204 | O$_2$/He | 1 | 300 | 1.2 |
| 5205 | NO/He | 1 | 300 | 2.5 |
| 5206 | NO/He | 200 | 300 | 2.3 |
| 5207 | O$_2$/He | 10 | 300 | 1.8 |
| 5208 | O$_2$/H$_2$ | 1 | 350 | 1.2 |
| 5209 | O$_2$/H$_2$ | 1 | 280 | 1.0 |
| 5210 | O$_2$/H$_2$ | 2 | 260 | 2.3 |
| 5211 | NO/He | 100 | 230 | 2.2 |
| 5212 | O$_2$/H$_2$ | 1 | 190 | 1.3 |
| 5213 | O$_2$/He | 3 | 170 | 2.1 |
| 5214 | O$_2$/He | 800 | 50 | 2.1 |

TABLE 42

| | SiH$_4$ flow rate sccm | Si$_2$H$_6$ flow rate sccm | CH$_4$ flow rate sccm | GeH$_4$ flow rate sccm | H$_2$ flow rate sccm | PH$_3$/H$_2$ flow rate sccm | B$_2$H$_6$/H$_2$ flow rate sccm | SIH$_4$/H$_2$ flow rate sccm | Press. Torr | MW Power W/cm$^2$ | RF Power W/cm$^2$ | Substrate temp. °C | Film thickness nm |
|---|---|---|---|---|---|---|---|---|---|---|---|---|---|
| RF n-layer | 2.0 | | | | 100 | 200 | | | 1.3 | | 0.05 | 350 | 20 |
| RF i-layer | | 4.0 | | | 100 | | | | 0.8 | | 0.008 | 300 | 10 |
| MW i-layer | 47 | | | 49 | 100 | | | | 0.005 | 0.07 | 0.28 | 380 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 33 | | | 28 | 100 | | | | 0.005 | 0.05 | 0.28 | 360 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 80 | | | | 0.8 | | 0.007 | 190 | 90 |
| RF p-layer | | | 0.4 | | 90 | | 8 | 2 | 1.6 | | 0.07 | 170 | 10 |

Comparative Example A 14-1

A process was conducted as Comparative Example A 14-1. This process was different from Example A-14 in that it omitted the annealing in the gas atmosphere containing trace amount of oxygen atoms and that H$_2$ gas or He gas as desired was supplied to each gas gate.

Other conditions were materially the same as those in Example A-14. The photovoltaic element produced in Comparative Example A 14-1 will be referred to as "SC/CA14-1".

Seven samples of the photovoltaic elements SC/A-14, as well as seven samples of the photovoltaic elements SC/CA14-1, were produced and were subjected, basically in the same way as Example A-1 and Comparative Example A1-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The initial photoelectric conversion efficiency was evaluated in terms of variation of the conversion efficiency among the seven sample elements of each type. The anti-environment characteristic was evaluated by setting the temperature to 85° C., the humidity to 90% and the time of shelving in the dark place to 150 hours. The results are shown in Table 43.

The performance of the photovoltaic element is shown in Table 43 in terms of values measured on the samples of the photovoltaic element SC/A-14 as normalized by the values measured on the samples of the photovoltaic element SC/CA14-1.

TABLE 43

| Items of evaluation | Evaluation |
|---|---|
| Initial photoelectric conversion efficiency characteristic | 1.55 |
| Variation of Initial photoelectric conversion efficiency characteristic | 0.84 |
| Photo-degradation characteristic | 0.81 |
| Anti-environment characteristic | 0.83 |
| SEM observation of sectional face | 0.91 |
| Measurement of adhesion: | No delamination in SC/A-14 |
| Delamination | Slight delamination in SC/CA14-1 |

From Table 43, it is understood that the photovoltaic element in SC.A-14 of this example exhibits superiority to the comparative example SC/CA14-1 in all items of the evaluation.

EXAMPLE A-15

In this example, a triple type photovoltaic element of the type shown in FIG. 3 was produced by using the roll-to-roll type apparatus shown in FIG. 6. The annealing was conducted under various combinations of annealing conditions in a gas atmosphere containing trace amount of oxygen atoms. The production process was as follows.

(1) A sheet-like substrate (base member) of 30 cm wide, composed of a substrate of a stainless steel and carrying a reflecting layer such as of Ag (or Al—Si or the like) and a reflection enhancement layer such as of ZnO, was rolled up and set in a loading chamber 5010 for loading sheet-type substrate. The sheet-type substrate was threaded through all the deposition chambers and all the gas gates, and was connected to a sheet take-up jig disposed in an unload chamber 5150. The deposition chambers were evacuated to a level of 10$^{-5}$ Torr or lower by evacuating systems which are not shown.

(2) Material gases were supplied to the deposition chambers, from mixing devices 5024, 5034, 5044, 5054, 5064, 5074, 5084, 5094, 5104, 5114, 5124, 5134 and 5144 associated with the respective deposition chambers.

(3) A gas containing trace amount of oxygen atoms were supplied from the respective gate gas supply devices to the gas gates 5201, 5202, 5203, 5204, 5205, 5206, 5207, 5208, 5209, 5210, 5211, 5212, 5213 and 5214.

In this example, the gap in the gas gate through which the sheet-type substrate passes was variable, and the gas containing trace amount of oxygen atoms was supplied to the gas gates at a total flow rate of 1000 sccm. The temperature of the annealing was controlled to range between 350° C. and 250° C. by means of heaters incorporated in the gas gates. At the same time, the annealing pressure was controlled to range between 3 Torr and 1 Torr, by means of an evacuating system which is not shown.

(4) The substrate was heated by a substrate heater of each deposition device, and the level of the vacuum in each deposition device was controlled by operating an evacuating valve of each evacuation device. Advance of the sheet-type substrate was commenced when substrate temperature and the vacuum level had been settled, and RF power for generating plasma and M power (frequency 0.5 GHz) were supplied to each deposition chamber. An antenna-type MW introduction electrode was used in the MW power supply system.

A triple-type solar cell having three pin structures stacked on one on another on the sheet-type substrate 300 was thus produced.

(5) Then, an ITO film of 70 nm thick, serving as a transparent conductive layer 312, was formed on the RF p-layer 311 by vacuum evaporation.

(6) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of this example was thus completed. This element will be referred to as "SC/A-15". The conditions of the annealing in gas atmosphere containing trace amount of oxygen atoms in this example, as well as the conditions of film-forming processes for forming the RF n-layer, RF i-layer, MW i-layer and RF-p layer are collectively shown in Tables 44 and 45.

TABLE 44

CONDITIONS OF ANNEALING IN GAS ATMOSPHERE CONTAINING TRACE AMOUNT OF OXYGEN ATOMS

| Gas gate | Type of gas | Gas concentration (dilution:ppm) | Anneal temp. (° C.) | Anneal press. (Torr) |
|---|---|---|---|---|
| 5201 | $O_2$/Ar | 800 | 350 | 3.0 |
| 5202 | $CO_2/H_2$ | 1 | 350 | 2.1 |
| 5203 | $O_2/H_2$ | 1 | 350 | 1.5 |
| 5204 | $O_2/H_2$ | 1 | 300 | 1.2 |
| 5205 | CO/He | 3 | 300 | 2.4 |
| 5206 | NO/Ar | 120 | 300 | 2.3 |
| 5207 | $O_2$/He | 10 | 300 | 1.7 |
| 5208 | $O_2/H_2$ | 1 | 350 | 1.2 |
| 5209 | $O_2/H_2$ | 1 | 280 | 1.0 |
| 5210 | CO/He | 2 | 260 | 2.3 |
| 5211 | NO/Ar | 80 | 230 | 2.2 |
| 5212 | $O_2/H_2$ | 1 | 190 | 1.3 |
| 5213 | $O_2$/He | 3 | 170 | 2.1 |
| 5214 | $O_2$/He | 800 | 50 | 2.1 |

TABLE 45

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 200 | | | 1.3 | | 0.05 | 350 | 20 |
| RF i-layer | | 4.0 | | | 100 | | | | 0.8 | | 0.008 | 300 | 10 |
| MW i-layer | 45 | | | 47 | 100 | | | | 0.004 | 0.13 | 0.30 | 380 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 31 | | | 28 | 100 | | | | 0.004 | 0.13 | 0.30 | 360 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 80 | | | | 0.8 | | 0.007 | 190 | 90 |
| RF p-layer | | | 0.4 | | 90 | | 8 | 2 | 1.6 | | 0.07 | 170 | 10 |

Comparative Example A 15-1

A process was conducted as Comparative Example A 15-1. This process was different from Example A-15 in that it omitted the annealing in the gas atmosphere containing trace amount of oxygen atoms and that $H_2$ gas, He gas or Ar gas as desired was supplied to each gas gate.

Other conditions were materially the same as those in Example A-15. The photovoltaic element produced in Comparative Example A 15-1 will be referred to as "SC/CA15-1".

Seven samples of the photovoltaic elements SC/A-15, as well as seven samples of the photovoltaic elements SC/CA15-1, were produced and were subjected, basically in the same way as Example A-1 and Comparative Example A1-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The initial photoelectric conversion efficiency was evaluated in terms of variation of the conversion efficiency among the seven sample elements of each type. The photo-degradation characteristic was measured by setting the element temperature to 48° C. The anti-environment characteristic was evaluated by setting the temperature to 87° C., the humidity to 90% and the time of shelving in the dark place to 200 hours. The results are shown in Table 46.

The performance of the photovoltaic element is shown in Table 46 in terms of values measured on the samples of the photovoltaic element SC/A-15 as normalized by the values measured on the samples of the photovoltaic element SC/CA15-1.

TABLE 46

| Items of evaluation | Evaluation |
|---|---|
| Initial photoelectric conversion efficiency characteristic | 1.56 |
| Variation of Initial photoelectric conversion efficiency characteristic | 0.84 |
| Photo-degradation characteristic | 0.81 |
| Anti-environment characteristic | 0.84 |
| SEM observation of sectional face | 0.91 |
| Measurement of adhesion: Delamination | No delamination in SC/A-15 Slight delamination in SC/CA14-1 |

From Table 43, it is understood that the photovoltaic element in SC/A-15 of this example exhibits superiority to the comparative example SC/CA15-1 in all items of the evaluation.

EXAMPLE A-16

In this example, a triple type photovoltaic element of the type shown in FIG. 3 was produced by using the roll-to-roll type apparatus shown in FIG. 6. The annealing was conducted under various combinations of annealing conditions as shown in Table 41. The production process was as follows.

(1) A sheet-like substrate (base member) of 30 cm wide, composed of a substrate of a stainless steel and carrying a reflecting layer such as of Ag (or Al—Si or the like) and a reflection enhancement layer such as of ZnO, was rolled up and set in a loading chamber 5010 for loading sheet-type substrate. The sheet-type substrate was threaded through all the deposition chambers and all the gas gates, and was connected to a sheet take-up jig disposed in an unload chamber 5150. The deposition chambers were evacuated to a level of $10^{-3}$ Torr or lower by evacuating systems which are not shown.

(2) Material gases were supplied to the deposition chambers, from mixing devices 5024, 5034, 5044, 5054, 5064, 5074, 5084, 5094, 5104, 5114, 5124, 5134 and 5144 associated with the respective deposition chambers.

(3) A gas containing trace amount of oxygen atoms were supplied from the respective gate gas supply devices to the gas gates 5201, 5202, 5203, 5204, 5205, 5206, 5207, 5208, 5209, 5210, 5211, 5212, 5213 and 5214.

In this example, the gap in the gas gate through which the sheet-type substrate passes was variable, and the gas containing trace amount of oxygen atoms was supplied to the gas gates at a total flow rate of 1200 sccm. The temperature of the annealing was controlled to range between 350° C. and 50° C. by means of heaters incorporated in the gas gates. At the same time, the annealing pressure was controlled to range between 3 Torr and 1 Torr, by means of an evacuating system which is not shown.

(4) The substrate was heated by a substrate heater of each deposition device, and the level of the vacuum in each deposition device was controlled by operating an evacuating valve of each evacuation device. Advance of the sheet-type substrate was commenced when the substrate temperature and the vacuum level had been settled and RF power for generating plasma and MW power (frequency 0.1 GHz) were supplied to each deposition chamber. An antenna-type MW introduction electrode was used in the MW power supply system.

A triple-type solar cell having three pin structures stacked on one on another on the sheet-type substrate 300 was thus produced.

(5) Then, an ITO film of 70 nm thick, serving as a transparent conductive layer 312, was formed on the RF p-layer 311 by vacuum evaporation.

(6) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of this example was thus completed. This element will be referred to as "SC/A-16". The conditions of the annealing in gas atmosphere containing trace amount of oxygen atoms in this example, as well as the conditions of film-forming processes for forming the RF n-layer, RF i-layer, MW i-layer and RF-p layer are collectively shown in Tables 47 and 48.

TABLE 47

CONDITIONS OF ANNEALING IN GAS ATMOSPHERE CONTAINING TRACE AMOUNT OF OXYGEN ATOMS

| Gas gate | Type of gas | Gas concentration (dilution:ppm) | Anneal temp. (° C.) | Anneal press. (Torr) |
|---|---|---|---|---|
| 5201 | $O_2$/Ar | 700 | 350 | 3.0 |
| 5202 | $CO_2$/$H_2$ | 2 | 350 | 2.1 |
| 5203 | $O_2$/$H_2$ | 1 | 350 | 1.5 |
| 5204 | $O_2$/He | 1 | 300 | 1.2 |
| 5205 | CO/He | 3 | 300 | 2.4 |
| 5206 | NO/Ar | 120 | 300 | 2.3 |
| 5207 | $O_2$/He | 10 | 300 | 1.7 |
| 5208 | $O_2$/$H_2$ | 1 | 350 | 1.2 |
| 5209 | $O_2$/$H_2$ | 1 | 280 | 1.0 |
| 5210 | $CO_2$/He | 2 | 260 | 2.3 |
| 5211 | NO/Ar | 80 | 230 | 2.2 |
| 5212 | $O_2$/$H_2$ | 1 | 190 | 1.3 |
| 5213 | $O_2$/He | 5 | 170 | 2.1 |
| 5214 | $O_2$/$H_2$ | 700 | 50 | 2.1 |

TABLE 48

| | $SiH_4$ flow rate sccm | $Si_2H_6$ flow rate sccm | $CH_4$ flow rate sccm | $GeH_4$ flow rate sccm | $H_2$ flow rate sccm | $PH_3$/$H_2$ flow rate sccm | $B_2H_6$/$H_2$ flow rate sccm | $SiH_4$/$H_2$ flow rate sccm | Press. Torr | MW Power W/cm² | RF Power W/cm² | Substrate temp. ° C. | Film thickness nm |
|---|---|---|---|---|---|---|---|---|---|---|---|---|---|
| RF n-layer | 2.0 | | | | 100 | 200 | | | 1.3 | | 0.05 | 350 | 20 |
| RF i-layer | | 4.0 | | | 100 | | | | 0.8 | | 0.008 | 300 | 10 |
| MW i-layer | 46 | | | 48 | 100 | | | | 0.004 | 0.26 | 0.29 | 380 | 90 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 31 | | | 29 | 100 | | | | 0.004 | 0.26 | 0.29 | 375 | 85 |
| RF i-layer | | 4.0 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 80 | | | | 0.8 | | 0.007 | 190 | 88 |
| RF p-layer | | | 0.4 | | 90 | | 8 | 2 | 1.6 | | 0.07 | 170 | 10 |

Comparative Example A 16-1

A process was conducted as Comparative Example A 16-1. This process was different from Example A-16 in that it omitted the annealing in the gas atmosphere containing trace amount of oxygen atoms and that $H_2O$ gas, He gas or Ar gas as desired was supplied to each gas gate.

Other conditions were materially the same as those in Example A-16. The photovoltaic element produced in Comparative Example A 16-1 will be referred to as "SC/CA16-1".

Seven samples of the photovoltaic elements SC/A-16, as well as seven samples of the photovoltaic elements SC/CA16-1, were produced and were subjected, basically in the same way as Example A-1 and Comparative Example A1-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The results are shown in Table 49. The initial photoelectric conversion efficiency was evaluated in terms of variation of the conversion efficiency among the seven sample elements of each type. The photo-degradation characteristic was measured by setting the element temperature to 45° C. The anti-environment characteristic was evaluated by setting the temperature to 86° C., the humidity to 91% and the time of shelving in the dark place to 220 hours. The results are shown in Table 49.

The performance of the photovoltaic element is shown in Table 49 in terms of values measured on the samples of the photovoltaic element SC/A-16 as normalized by the values measured on the samples of the photovoltaic element SC/CA16-1.

TABLE 49

| Items of evaluation | Evaluation |
|---|---|
| Initial photoelectric conversion efficiency characteristic | 1.56 |
| Variation of Initial photoelectric conversion efficiency characteristic | 0.84 |
| Photo-degradation characteristic | 0.82 |
| Anti-environment characteristic | 0.84 |
| SEM observation of sectional face | 0.90 |
| Measurement of adhesion: | No delamination in SC/A-16 |
| Delamination | Slight delamination in SC/CA16-1 | four samples are a sample Aa in which the mono-film of a formed semiconductor layer is an RF n-layer, a sample Ab in which the mono-film of a formed semiconductor layer is an RF i-layer, a sample Ac in which the mono-film of a formed semiconductor layer is an MW i-layer, and a sample Ad in which the mono-film of a formed semiconductor layer is an RF p-layer.

The process for preparing these samples was as follows.

(1) A substrate (base member) for each sample was prepared by effecting, on a substrate 100 of quartz glass of 25 mm wide, 40 mm long and 0.8 mm thick, supersonic cleaning conducted by employing acetone and isopropanol, followed by drying with heated air.

(2) A Cr layer of 5 nm thick was formed on the surface of the substrate 100 of quartz glass by sputtering.

(3) Then, one of n-type semiconductor layer, i-type semiconductor layer and p-type semiconductor layer was formed to a thickness of 1 pm by the same method as that used in Example A-1, and the substrate having such semiconductor layer was subjected to annealing in atmosphere of a gas containing trace amount of oxygen atoms in the same way as that in Example A-1.

Samples of mono-films for the purpose of measurement of interface defect density were thus prepared. The conditions of the annealing in gas atmosphere containing trace amount of oxygen atoms in this example, as well as the conditions of film-forming processes for forming the RF n-layer, RF i-layer, MW i-layer and RF-p layer are collectively shown in Tables 50 and 51.

TABLE 50

CONDITIONS OF ANNEALING IN GAS ATMOSPHERE CONTAINING TRACE AMOUNT OF OXYGEN ATOMS

| Ex. A17 sample | Type of gas | Gas concentration (dilution:ppm) | Annealing Temp. (° C.) | Annealing press. (Torr) |
|---|---|---|---|---|
| Aa | $O_2/Ar$ | 100 | 350 | 3 |
| Ab | $O_2/H_2$ | 2 | 250 | 2 |
| Ac | $O_2/H_2$ | 3 | 300 | 1.5 |
| Ad | $CO_2/He$ | 200 | 230 | 3 |

TABLE 51

| Sample | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SiH_4/H_2$ flow rate sccm | Press. Torr | MW Power $W/cm^2$ | RF Power $W/cm^2$ | Substrate temp. ° C. |
|---|---|---|---|---|---|---|---|---|---|---|---|---|
| Aa RF n-layer | 2.5 | | | | 100 | 200 | | | 1.0 | | 350 | 350 |
| Ab RF i-layer | | 3.8 | | | 110 | | | | 0.7 | | 300 | 300 |
| Ac MW i-layer | 45 | | | 47 | 150 | | | | 0.006 | 0.10 | 380 | 380 |
| Ad RF p-layer | | | 0.3 | | 80 | | 10 | 2 | 2.0 | | 230 | 230 |

From Table 43, it is understood that the photovoltaic element in SC/A-16 of this example exhibits superiority to the comparative example SC/CA16-1 in all items of the evaluation.

EXAMPLE A-17

Using the in-line type apparatus shown in FIG. 4, four types of samples of mono-film were prepared for measurement of interface defect density. More specifically, these

Comparative Example A 17-1

A process was conducted as Comparative Example A 17-1. This process was different from Example A-17 in that it omitted the annealing in the gas atmosphere containing trace amount of oxygen atoms.

Other conditions were materially the same as those in Example A-17. The mono-film for measurement of interface defect density prepared in Comparative Example A 17-1 will be referred to as "SC/CA17-1".

Three samples of mono-film Aa to Ad, as well as three samples of mono-film SC/CA17-1, were produced and were subjected to PDS (Photothermal Deflection Spectroscopy) measurement. The results are shown in Table 52. The measurement results are shown in this Table in terms of values measured on the samples Aa to Ad normalized with the values measured on the samples of the comparative example, i.e., SC/CA17-1. Thus, the values shown in table 52 shows the ratio of reduction in the interface defect density.

TABLE 52

| Sample name | Type of semiconductor layer formed | Reduction of interfacial defect density |
|---|---|---|
| Aa | RF n-layer | 0.97 |
| Ab | RF i-layer | 0.90 |
| Ac | MW i-layer | 0.89 |
| Ad | RF p-layer | 0.95 |

The above-mentioned PDS measurement was conducted in accordance with the method disclosed in "W. B. Jackson, D. K. Biegelsen, J. C. Knights et al. Appl. Phys. Lett. 42, 105, (1983)" and "Z. E. Smith, V. Chu, T. L. Chu et al. Appl. Phy. Lett. 50, 1521, (1987)".

From Table 52, it is understood that the samples of the Example A-17, which have undergone the annealing in atmosphere gas containing trace amount of oxygen atoms in accordance with the invention, exhibit smaller density of interface defects and, hence, superior performance, as compared with the samples of Comparative Example (SC/CA17-1) which were prepared without such annealing.

EXAMPLE B-1

In this Example, a photovoltaic element of the type shown in FIG. 1 was manufactured by using an in-line type apparatus shown in FIG. 4, in accordance with the following procedure.

(1) A substrate (base member) was prepared as follows. A substrate 100 of a stainless steel of 50 mm long, 50 mm wide and 0.5 mm thick was subjected to an ultrasonic cleaning which was conducted by using acetone and propanol, followed by drying with heated air. A light reflecting layer 101 of Ag, having a thickness of 0.3 μm, was formed on the stainless steel substrate 100 by sputtering at room temperature. Then, a reflection enhancement layer 102 of ZnO, having a thickness of 1.0 pm, was formed on the reflecting layer 101 at 350° C., thus completing preparation of the substrate (base member).

(2) A deposition apparatus 400 is capable of performing both MWPCVD process and RFPCVD process. Semiconductor layers were formed on the reflection enhancement layer by using this apparatus.

Material gas cylinders, which were not shown, were connected to the deposition apparatus, through gas introduction lines. These cylinders contained material gases of ultra-high purity. More specifically, the following material gas cylinders were connected: an $SiH_4$ gas cylinder, $O_2/H_2$ (dilution: 2 ppm) gas cylinder, an $O_2$/He (dilution: 10 ppm) gas cylinder, $O_2$/Ar (dilution 100 ppm) gas cylinder, an $O_2H_2$ (dilution: 2000 ppm) gas cylinder, a $CH_4$ gas cylinder, a $GeH_4$ gas cylinder, an $Si_2H_6$ gas cylinder, a $PH_3/H_2$ gas (dilution: 0.1%) gas cylinder, $B_2H_6/H_2$ (dilutions: 2 ppm, 10 ppm, 100 ppm, 2000 ppm) gas cylinders, $BF_3/H_2$ gas (dilutions 2 ppm, 10 ppm, 100 ppm, 2000 ppm) cylinders, an $H_2$ gas cylinder, an He gas cylinder, an $SiCl_2H_2$ gas cylinder and an $SiH_4/H_2$ (dilution: 1%) gas cylinder.

(3) The substrate having the reflecting layer 101 and the reflection enhancement layer 102 formed thereon (i.e. base member) was disposed on a substrate conveyor rails 413 laid in a load chamber 401, and the internal pressure of the load chamber 401 was lowered to $1\times10^{-5}$ Torr. by a vacuum pump (not shown). Then, a gate valve 406 was opened and the substrate was conveyed into a conveyance chamber 402 and then into a deposition chamber 417 which have been evacuated to certain levels of vacuum by vacuum pumps which are not shown. The substrate was held such that its reverse side is kept in close contact with a substrate heater 410 so as to be heated by the heater 410, while the interior of the deposition chamber 417 was evacuated by the vacuum pump to a level of $1\times10^{-5}$ Torr.

(4) Preparation for film forming operation was thus completed. Then, $H_2$ gas was introduced into the deposition chamber 417 through a gas-introduction line 429 and the flow rate of the $H_2$ gas was controlled to 500 sccm by means of valves 441, 431, 430, under the control of a mass-flow controller 436. At the same time, the internal pressure of the deposition chamber 417 was regulated to 1.0 Torr. by a conductance valve (not shown). Meanwhile, the substrate heater 410 was adjusted to maintain the substrate temperature at 350° C.

(5) An RF n-layer 103 of pc-Si was formed when the substrate temperature has become steady.

To this end, valves 443, 433, 444 and 434 were operated to introduce the $SiH_4$ gas and $PH_3/H_2$ gas into the deposition chamber 417 through the gas introduction line 429. Flow rates of the $SiH_4$ gas, $H_2$ gas and the $PH_3/H_2$ gas were controlled to 2 sccm, 100 sccm and 200 sccm, respectively, by means of the mass-flow controllers 438, 436 and 439, while the pressure in the deposition chamber 417 was controlled to 1.0 Torr.

The power of an RF power supply 422 was set to 0.05 W/cm², and RF power was introduced from this power supply into a plasma-forming cup 420, so as to trigger a glow discharge, thereby starting formation of the RF n-layer on the substrate. The RF power was turned off when the thickness of the RF n-layer has reached 20 nm, thus terminating the glow discharge to complete the formation of the RF n-layer 103. The supply of the $SiH_4$ gas, $PH_3/H_2$ gas and $H_2$ gas into the deposition chamber was stopped and the interior of the deposition chamber and the gas line were evacuated to $1\times10^{-5}$ Torr.

(6) Then, an annealing was executed in an atmosphere of a gas containing a trace amount of oxygen atoms and Group III element atoms.

For the purpose of executing the annealing in the gas atmosphere containing a trace amount of oxygen atoms and Group III element atoms, $O_2/H_2$ gas (dilution: 2 ppm) was introduced as the oxygen atom-containing gas, as well as the $B_2H_6/H_2$ gas (dilution 2 ppm) as the gas containing Group III element atoms, into the deposition chamber 417 through the gas introduction line 429. The valves 442 and 432 were opened and the flow rate of the $O_2/H_2$ gas (dilution 2 ppm) was controlled to 500 sccm by means of a mass-flow controller 437. Valves and a mass-flow controller, not shown, were operated to maintain the flow rate of the $B_2H_6/H_2$ gas (dilution 2 ppm) at 500 sccm.

Meanwhile, the pressure in the deposition chamber 417 was controlled to 1.0 Torr by a conductance valve (not shown).

The annealing in accordance with the invention in a gas atmosphere containing trace amounts of oxygen atoms and Group III element atoms was conducted for 10 minutes, while the substrate heater 410 was controlled to maintain the substrate temperature at 350° C. Then, the supply of the $O_2/H_2$ gas (dilution: 1 ppm) and the $B_2H_6/H_2$ gas (dilution 2 ppm) into the deposition chamber 417 was stopped and the interior of the deposition chamber 417 and the gas line was evacuated to $1\times10^{-5}$ Torr.

(7) Then, an RF i-layer 151 of a-Si, an MW i-layer 104 of a-SiGe, and an RF i-layer 161 of a-Si were successively formed in accordance with the steps (7-1) to (7-3) of Example A-1.

(8) Then, an RF p-layer 105 of a-SiC was formed in accordance with the step (8) of Example A-1 under conditions which will be described later.

(9) Then, a transparent conductive layer 112 was formed on the RF p-layer 105, and a comb-shaped collector electrode 113 of Cr(40 nm)/Ag(1000 nm)/Cr(40 nm) was formed thereon by vacuum evaporation, in accordance with the steps (9) and (10) of Example A-1.

Fabrication of the photovoltaic element of this example was thus completed. This element will be referred to as "SC/B-1". The conditions of the annealing in gas atmosphere containing trace amount of oxygen atoms and trace amount of Group III element atoms in this example, as well as the conditions of film-forming processes for forming the RF n-layer, RF i-layer, MW i-layer and RF-p layer are collectively shown in Tables 53 and 54.

TABLE 53

CONDITIONS OF ANNEALING IN ATMOSPHERE FORMED OF GAS CONTAINING TRACE AMOUNT OF OXYGEN ATOMS AND GAS CONTAINING TRACE AMOUNT OF GROUP III

| | |
|---|---|
| Type of gas containing trace amount of oxygen atoms | $O_2/H_2$ |
| Oxygen atom concentration in whole annealing gas | 1 |
| Type of gas containing trace amount of Group III element atoms | $B_2H_6/H_2$ |
| Group III element atom concentration in whole annealing gas (ppm) | 1 |
| Annealing temp. (° C.) | 350 |
| Annealing press. (Torr) | 1.0 |

Seven samples of the photovoltaic elements SC/B-1, as well as seven samples of the photovoltaic elements SC/CB1-1, were produced and were subjected, basically in the same way as that in Example A-1 and Comparative Example A1-1, to measurement and evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The results are shown in Table 55. The photo-degradation was measured by setting the element temperature to 45° C., while the anti-environment test was conducted by setting the atmosphere temperature to 82° C.

The performance of the photovoltaic element is shown in Table 55 in terms of values measured on the samples of the photovoltaic element SC/B-1 as normalized by the values measured on the samples of the photovoltaic element SC/CB1-1.

TABLE 55

| Items of evaluation | Evaluation |
|---|---|
| Initial photoelectric conversion efficiency characteristic | 1.25 |
| Variation of Initial photoelectric conversion efficiency characteristic | 0.90 |
| Photo-degradation characteristic | 0.88 |
| Anti-environment characteristic | 0.86 |
| SEM observation of sectional face | 0.94 |
| Measurement of adhesion: Delamination | No delamination in SC/B-1 Slight delamination in SC/CB1-1 |

From the results shown in Table 55, it will be seen that all the sample photovoltaic elements SC/B-1 in accordance with Example A-1 exhibit superiority to the sample photovoltaic elements SC/CB1-1 of Comparison Example B-1 in all items of evaluation.

EXAMPLE B-2

In this Example, a photovoltaic element of the tandem type shown in FIG. 2 was manufactured by using an in-line

TABLE 54

| SC Ex. 1 | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer (103) | 2 | | | | 100 | 200 | | | 1.0 | | 0.05 | 350 | 20 |
| RF i-layer (151) | | 4 | | | 110 | | | | 0.7 | | 0.008 | 300 | 10 |
| MW i-layer (104) | 49 | | | 47 | 150 | | | | 0.005 | 0.10 | 0.30 | 380 | 170 |
| RF i-layer (161) | | 3 | | | 80 | | | | 0.7 | | 0.007 | 250 | 20 |
| RF p-layer (105) | | | 0.3 | | 60 | | 10 | 2 | 2.0 | | 0.07 | 230 | 10 |

Comparative Example B 1-1

A process was conducted as Comparative Example B1-1. This process was different from Example B-1 in that it omitted the annealing in the gas atmosphere containing trace amount of oxygen atoms and trace amount of Group III element atoms.

Other conditions were materially the same as those in Example B1. The photovoltaic element produced in Comparative Example B1-1 will be referred to as "SC/CB1–1".

type apparatus shown in FIG. 4, in accordance with the following procedure.

(1) A substrate having a reflecting layer 201 and a reflection enhancement layer 202 formed thereon (i.e. base member), prepared in the same way as that in Example B-1, was disposed on a substrate conveyor rails 413 laid in a load chamber 401, and the internal pressure of the load chamber 401 was lowered to $1\times10^{-5}$ Torr. by a vacuum pump (not shown).

(2) Then, a gate valve 406 was opened and the substrate was conveyed into a conveyance chamber 402 and then into a deposition chamber 417 which had been evacuated to certain levels of vacuum by vacuum pumps which are not shown. The substrate was held such that its reverse side is kept in close contact with a substrate heater 410 so as to be heated by the heater 410, while the interior of the deposition chamber 417 was evacuated by the vacuum pump to a level of $1\times10^{-5}$ Torr.

(3) Preparation for film forming operation was thus completed. Then, $H_2$ gas was introduced into the deposition chamber 417 through a gas-introduction line 429 and the flow rate of the $H_2$ gas was controlled to 500 sccm by means of valves 441, 431, 430, under the control of a mass-flow controller 436. At the same time, the internal pressure of the deposition chamber 417 was regulated to 1.0 Torr. by a conductance valve (not shown). Meanwhile, the substrate heater 410 was adjusted to maintain the substrate temperature at 350° C.

(4) An RF n-layer 203 of pc-Si was formed when the substrate temperature became steady.

To this end, valves 443, 433, 444 and 434 were operated to introduce the $SiH_4$ gas and $PH_3/H_2$ gas into the deposition chamber 417 through the gas introduction line 429. Flow rates of the $SiH_4$ gas, $H_2$ and the $PH_3/H_2$ gas were controlled to 2 sccm, 100 sccm and 200 sccm, respectively, by means of the mass-flow controllers 438, 436 and 439, while the pressure in the deposition chamber 417 was controlled to 1.0 Torr. The power of an RF power supply 422 was set to 0.05 W/cm$^2$, and RF power was introduced from this power supply into a plasma-forming cup 420, so as to trigger a glow discharge, thereby starting formation of the RF n-layer on the substrate. The RF power was turned off when the thickness of the RF n-layer reached 20 nm, thus terminating the glow discharge to complete the formation of the RF n-layer. The supply of the $SiH_4$ gas, $PH_3/H_2$ gas and $H_2$ gas into the deposition chamber 417 was stopped and the interior of the deposition chamber and the gas line were evacuated to $1\times10^{-5}$ Torr.

(5) Then, an annealing was executed in accordance with the present invention in an atmosphere of a gas containing a trace amount of oxygen atoms and trace amount of Group III element atoms.

For the purpose of executing the annealing in the gas atmosphere containing a trace amount of oxygen atoms and trace amount of Group III element atoms, $O_2/He$ gas (dilution: 10 ppm) as the oxygen atom-containing gas and $BF_3/H_2$ gas (dilution 10 ppm) as the gas containing trace amount of Group III element atoms were introduced into the deposition chamber 417 through the gas introduction line 429. The valves 442 and 432 were opened and the flow rate of the $O_2/He$ gas was controlled to 500 sccm by means of a mass-flow controller 437. Valves and a mass-flow controller (not shown) were operated so as to maintain the flow rate of the $BF_3/H_2$, gas (dilution 10 ppm) at 500 sccm.

Meanwhile, the pressure in the deposition chamber 417 was controlled to 1.5 Torr by a conductance valve (not shown).

The annealing in accordance with the invention in a gas atmosphere containing trace amount of oxygen atoms and trace amount of Group III element atoms was conducted for 10 minutes, while the substrate heater 410 was controlled to maintain the substrate temperature at 350° C. Then, the supply of the $O_2/He$ gas (dilution: 10 ppm) and the $BF_3/H_2$ gas (dilution 10 ppm) into the deposition chamber 417 was stopped and the interior of the deposition chamber 417 and the gas line was evacuated to $1\times10^{-5}$ Torr.

Then, an RF i-layer 251 of a-Si, an MW i-layer 204 of a-SiGe, an RF i-layer 261 of a-Si, an RF p-layer 205 of a-SiC, an RF n-layer 206 of $\mu$c-Si, an RF i-layer 207 of a-Si and an RF p-layer 208 of a-SiC were successively formed, in accordance with the steps (6-1 ) to (6-8) of Example A-2, under the conditions which will be described later. A transparent conductive layer 212 was formed on the RF p-layer, followed by formation of a collector electrode 213 thereon, in accordance with the steps (7) to (9) of Example A-2.

Fabrication of the photovoltaic element of this example was thus completed. This element will be referred to as "SC/B-2". The conditions of the annealing in gas atmosphere containing trace amount of oxygen atoms and Group III element atoms in this example, as well as the conditions of film-forming processes for forming the RF n-layer, RF i-layer, MW i-layer and RF-p layer are collectively shown in Tables 56 and 57.

TABLE 56

CONDITIONS OF ANNEALING IN ATMOSPHERE FORMED OF GAS CONTAINING TRACE AMOUNT OF OXYGEN ATOMS AND GAS CONTAINING TRACE AMOUNT OF GROUP III

| | |
|---|---|
| Type of gas containing trace amount of oxygen atoms | $O_2$/He |
| Oxygen atom concentration in whole annealing gas (ppm) | 5 |
| Type of gas containing trace amount of Group III element atoms | $BF_3/H_2$ |
| Group III element atom concentration in whole annealing gas (ppm) | 5 |
| Annealing temp. (° C.) | 350 |
| Annealing press. (Torr) | 1.5 |

TABLE 57

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power W/cm$^2$ | RF Power W/cm$^2$ | Substrate temp. ° C. | Film thickness nm |
|---|---|---|---|---|---|---|---|---|---|---|---|---|---|
| RF n-layer (203) | 2 | | | | 100 | 200 | | | 1.0 | | 0.05 | 350 | 20 |
| RF i-layer (251) | | 4 | | | 110 | | | | 0.7 | | 0.008 | 300 | 10 |
| MW i-layer (204) | 50 | | | 55 | 150 | | | | 0.006 | 0.10 | 0.30 | 380 | 150 |
| RF i-layer (261) | | 3 | | | 80 | | | | 0.7 | | 0.007 | 250 | 20 |
| RF p-layer (205) | | | 0.3 | | 60 | | 10 | 2 | 2.0 | | 0.07 | 230 | 10 |

TABLE 57-continued

| | SiH₄ flow rate sccm | Si₂H₆ flow rate sccm | CH₄ flow rate sccm | GeH₄ flow rate sccm | H₂ flow rate sccm | PH₃/H₂ flow rate sccm | B₂H₆/H₂ flow rate sccm | SiH₄/H₂ flow rate sccm | Press. Torr | MW Power W/cm² | RF Power W/cm² | Substrate temp. °C | Film thickness nm |
|---|---|---|---|---|---|---|---|---|---|---|---|---|---|
| RF n-layer (206) | 2 | | | | 50 | 250 | | | 1.0 | | 0.04 | 225 | 10 |
| RF i-layer (207) | | 2 | | | 80 | | | | 0.6 | | 0.007 | 200 | 120 |
| RF p-layer (208) | | | 0.3 | | 60 | | 10 | 2 | 2.0 | | 0.07 | 170 | 10 |

Comparative Example B 2-1

A process was conducted as Comparative Example B 2-1. This process was different from Example B-2 in that it omitted the annealing in the gas atmosphere containing trace amount of oxygen atoms and trace amount of Group III element atoms.

Other conditions were materially the same as those in Example B-2. The photovoltaic element produced in Comparative Example B 2-1 will be referred to as "SC/CB2-1".

Seven samples of the photovoltaic elements SC/B-2, as well as seven samples of the photovoltaic elements SC/CB2-1, were produced and were subjected, basically in the same way as Example A-1 and Comparative Example A1-1, to measurement and evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The photo-degradation was measured by setting the element temperature to 38° C., while the anti-environment test was conducted by setting the atmosphere temperature to 90° C. The results are shown in Table 58.

The performance of the photovoltaic element is shown in Table 58 in terms of values measured on the samples of the photovoltaic element SC/B-2 as normalized by the values measured on the samples of the photovoltaic element SC/CB2-1.

TABLE 58

| Items of evaluation | Evaluation |
|---|---|
| Initial photoelectric conversion efficiency characteristic | 1.3 |
| Variation of Initial photoelectric conversion efficiency characteristic | 0.89 |
| Photo-degradation characteristic | 0.86 |
| Anti-environment characteristic | 0.85 |
| SEM observation of sectional face | 0.92 |
| Measurement of adhesion: Delamination | No delamination in SC/B-2 Slight delamination in SC/CB2-1 |

From the results shown in Table 58, it will be seen that all the sample photovoltaic elements SC/B-2 in accordance with Example B-2 exhibit superiority to the sample photovoltaic elements SC/CB2-1 of Comparison Example B2-1 in all items of evaluation.

EXAMPLE B-3

In this Example, a photovoltaic element of the triple type shown in FIG. 3 was manufactured by using an in-line type apparatus shown in FIG. 4, in accordance with the following procedure.

(1) A substrate having a reflecting layer 301 and a reflection enhancement layer 302 formed thereon (i.e. base member), prepared in the same way as that in Example B-1, was disposed on a substrate conveyor rails 413 laid in a load chamber 401, and the internal pressure of the load chamber 401 was lowered to $1 \times 10^{-5}$ Torr. by a vacuum pump (not shown).

(2) Then, gate valves 406 and 407 were opened and the substrate was conveyed into conveyance chambers 402, 403 and then into a deposition chamber 418 which had been evacuated to certain levels of vacuum by vacuum pumps which are not shown. The substrate was held such that its reverse side was kept in close contact with a substrate heater 411 so as to be heated by the heater 411, while the interior of the deposition chamber 418 was evacuated by the vacuum pump to a level of $1 \times 10^{-5}$ Torr.

(3) Preparation for film forming operation was thus completed. Then, H₂ gas was introduced into the deposition chamber 417 through a gas-introduction line 429 and the flow rate of the H₂ gas was controlled to 500 sccm by means of valves 441, 431, 430, under the control of a mass-flow controller 436. At the same time, the internal pressure of the deposition chamber 417 was regulated to 1.3 Torr. by a conductance valve (not shown). Meanwhile, the substrate heater 410 was adjusted to maintain the substrate temperature at 350° C. An RF n-layer 303 of μc-Si was ; formed when the substrate temperature became steady.

(4) To this end, valves 443, 433, 444 and 434 were operated to introduce the SiH₄ gas and PH₃/H₂ gas into the deposition chamber 417 through the gas introduction line 429. Flow rates of the SiH₄ gas, H₂ gas and the PH₃/H₂ gas were controlled to 2 sccm, 100 sccm and 200 sccm, respectively, by means of the mass-flow controllers 438, 436 and 439, while the pressure in the deposition chamber 417 was controlled to 1.3 Torr.

The power of an RF power supply 422 was set to 0.05 W/cm², and RF power was introduced from this power supply into a plasma-forming cup 420, so as to trigger a glow discharge, thereby starting formation of the RF n-layer on the substrate. The RF power was turned off when the thickness of the RF n-layer reached 20 nm, thus terminating the glow discharge to complete the formation of the RF n-layer 303. The supply of the SiH₄ gas, PH₃/H₂ gas and H₂ gas into the deposition chamber 417 was stopped and the interior of the deposition chamber and the gas line were evacuated to $1 \times 10^{-5}$ Torr.

(5) Then, an annealing was executed in an atmosphere of a gas containing a trace amount of oxygen atoms and a trace amount of Group III element atoms.

For the purpose of executing the annealing in the gas atmosphere containing a trace amount of oxygen atoms and a trace amount of Group III element atoms, O₂/Ar gas (dilution: 100 ppm) as the gas containing oxygen atoms and $BF_3/H_2$ gas (dilution 100 ppm) was the gas containing trace amount of Group III element atoms were introduced into the deposition chamber 417 through the gas introduction line 429. The valves 442 and 432 were opened and the flow rate of the $O_2/Ar$ gas (dilution 100 ppm) was controlled to 500 sccm by means of a mass-flow controller 437. Valves and a mass-flow controller (not shown) were operated so as to control the flow rate of $BF_3/H_2$ gas (dilution 100 ppm) to 500 sccm.

Meanwhile, the pressure in the deposition chamber 417 was controlled to 1.2 Torr by a conductance valve (not shown). The annealing in accordance with the invention in a gas atmosphere containing trace amount of oxygen atoms and trace amount of Group III element atoms was conducted for 10 minutes, while the substrate heater 410 was controlled to maintain the substrate temperature at 350° C. Then, the supply of the $O_2/Ar$ gas (dilution: 100 ppm) and the $BF_3/H_2$ gas (dilution 100 ppm) into the deposition chamber 417 was stopped and the interior of the deposition chamber 417 and the gas line was evacuated to $1\times10^{-5}$ Torr.

(6) Then, an RF i-layer 351 of a-Si, an MW i-layer 304 of a-SiGe, an RF i-layer 361 of a-Si, an RF p-layer 305 of a-SiC, an RF n-layer 306 of μc-Si, an RF i-layer 352 of a-Si, an MW i-layer 307 of a-SiGe, an RF i-layer 362 of a-Si, an RF p-layer 308 of a-SiC, an RF n-layer 309 of μc-Si, an RF i-layer 310 of a-Si, and an RF p-layer 311 of a-SiC were successively formed, in accordance with a procedure which is substantially the same as that used in Example B-2, i.e., in the same way as that in Example A-1.

(7) Then, an ITO film of 70 nm thick, serving as a transparent conductive layer 312, was formed on the RF p-layer 311 by vacuum evaporation.

(8) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of the present invention was thus completed. This element will be referred to as "SC/B-3". The conditions of the annealing in gas atmosphere containing trace amount of oxygen atoms and trace amount of Group III element atoms in this example, as well as the conditions of film-forming processes for forming the RF n-layer, RF i-layer, MW i-layer and RF-p layer are collectively shown in Tables 59 and 60.

TABLE 59

CONDITIONS OF ANNEALING IN ATMOSPHERE FORMED OF GAS CONTAINING TRACE AMOUNT OF OXYGEN ATOMS AND GAS CONTAINING TRACE AMOUNT OF GROUP III

| | |
|---|---|
| Type of gas containing trace amount of oxygen atoms | $O_2/Ar$ |
| Oxygen atom concentration in whole annealing gas (ppm) | 50 |
| Type of gas containing trace amount of Group III element atoms | $BF_3/H_2$ |
| Group III element atom concentration in whole annealing gas (ppm) | 50 |
| Annealing temp. (° C.) | 350 |
| Annealing press. (Torr) | 1.2 |

TABLE 60

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer (303) | 2.0 | | | | 100 | 200 | | | 1.3 | | 0.05 | 350 | 20 |
| RF i-layer (351) | | 4.0 | | | 100 | | | | 0.8 | | 0.008 | 300 | 10 |
| MW i-layer (304) | 40 | | | 41 | 100 | | | | 0.010 | 0.10 | 0.31 | 370 | 110 |
| RF i-layer (361) | | 4.0 | | | 100 | | | | 0.75 | | 0.008 | 300 | 23 |
| RF p-layer (305) | | | 0.1 | | 80 | | 9 | 2 | 1.8 | | 0.07 | 300 | 10 |
| RF n-layer (306) | 1.1 | | | | 40 | 290 | | | 1.1 | | 0.04 | 300 | 10 |
| RF i-layer (352) | | 4.0 | | | 90 | | | | 0.75 | | 0.008 | 300 | 10 |
| MW i-layer (307) | 35 | | | 26 | 120 | | | | 0.013 | 0.10 | 0.3 | 350 | 100 |
| RF i-layer (362) | | 3.5 | | | 90 | | | | 0.7 | | 0.008 | 280 | 23 |
| RF p-layer (308) | | | 0.2 | | 80 | | 9 | 2 | 1.7 | | 0.07 | 260 | 10 |
| RF n-layer (309) | 0.8 | | | | 50 | 250 | | | 1.05 | | 0.04 | 230 | 10 |
| RF i-layer (310) | | 1.5 | | | 80 | | | | 0.8 | | 0.007 | 190 | 90 |
| RF p-layer (311) | | | 0.4 | | 90 | | 8 | 2 | 1.6 | | 0.07 | 170 | 10 |

Comparative Example B 3-1

A process was conducted as Comparative Example B 3-1. This process was different from Example B-3 in that it omitted the annealing in the gas atmosphere containing trace amount of oxygen atoms and trace amount of Group III element atoms.

Other conditions were materially the same as those in Example B-3. The photovoltaic element produced in Comparative Example B 3-1 will be referred to as "SC/CB3-1".

Eight samples of the photovoltaic elements SC/B-3, as well as eight samples of the photovoltaic elements SC/CB3-1, were produced and were subjected, basically in the same way as Example A-1 and Comparative Example A1-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The photo-degradation characteristic was measured by setting the element temperature to 47° C. The anti-environment characteristic was evaluated by setting the temperature and humidity of the atmosphere to 85° C. and 90% and the time of shelving in the dark place to 150 hours. The results are shown in Table 61.

The performance of the photovoltaic element is shown in Table 61 in terms of values measured on the samples of the photovoltaic element SC/B-3 as normalized by the values measured on the samples of the photovoltaic element SC/CB3-1.

TABLE 61

| Items of evaluation | Evaluation |
| --- | --- |
| Initial photoelectric conversion efficiency characteristic | 1.4 |
| Variation of Initial photoelectric conversion efficiency characteristic | 0.86 |
| Photo-degradation characteristic | 0.85 |
| Anti-environment characteristic | 0.84 |
| SEM observation of sectional face | 0.94 |
| Measurement of adhesion: Delamination | No delamination in SC/B-3 Slight delamination in SC/CB3-1 |

From the results shown in Table 61, it will be seen that all the sample photovoltaic elements SC/B-3 in accordance with Example B-3 exhibit superiority to the sample photovoltaic elements SC/CB3-1 of Comparison Example B3-1 in all items of evaluation.

EXAMPLE B-4

This Example is different from Example B-3 in that the annealing was effected on the RF i-layer 351 of a-Si, in place of the RF n-layer 303 of $\mu$c-Si. A photovoltaic element of the triple type shown in FIG. 3 was manufactured by using an in-line type apparatus shown in FIG. 4, in accordance with the following procedure.

(1) A substrate having a reflecting layer 301 and a reflection enhancement layer 302 formed thereon (i.e. base member), prepared in the same way as that in Example B-1, was disposed on a substrate conveyor rails 413 laid in a load chamber 401, and the internal pressure of the load chamber 401 was lowered to $1 \times 10^{-5}$ Torr. by a vacuum pump (not shown).

(2) Then, gate valves 406 and 407 were opened and the substrate was conveyed into conveyance chambers 402, 403 and then into a deposition chamber 418 which had been evacuated to certain levels of vacuum by vacuum pumps which are not shown. The substrate was held such that its reverse side was kept in close contact with a substrate heater 411 so as to be heated by the heater 411, while the interior of the deposition chamber 418 was evacuated by the vacuum pump to a level of $1 \times 10^{-5}$ Torr.

(3) Preparation for film forming operation was thus completed. Then, H$_2$ gas was introduced into the deposition chamber 417 through a gas-introduction line 429 and the flow rate of the H$_2$ gas was controlled to 500 sccm by means of valves 441, 431, 430, under the control of a mass-flow controller 436. At the same time, the internal pressure of the deposition chamber 417 was regulated to 1.3 Torr. by a conductance valve (not shown). Meanwhile, the substrate heater 410 was adjusted to maintain the substrate temperature at 350° C. An RF n-layer 303 of $\mu$c-Si and an RF i-layer 351 of a-Si were formed when the substrate temperature became steady.

(4) Then, an annealing was executed in an atmosphere of a gas containing a trace amount of oxygen atoms and a trace amount of Group III element atoms.

For the purpose of executing the annealing in the gas atmosphere containing a trace amount of oxygen atoms and a trace amount of Group III element atoms, O$_2$/H$_2$ gas (dilution: 2 ppm) as the gas containing oxygen atoms and B$_2$H$_6$/H$_2$ gas (dilution: 2 ppm) as the gas containing Group III element atoms were introduced into the deposition chamber 418 through the gas introduction line 449. The valves 465 and 455 were opened and the flow rate of the O$_2$/H$_2$ gas (dilution: 2 ppm) was controlled to 500 sccm by means of a mass-flow controller 460. Valves and a mass-flow controller (not shown) were operated so as to control the flow rate of the B$_2$H$_6$/H$_2$ gas (dilution: 2 ppm) to 500 sccm. Meanwhile, the pressure in the deposition chamber 418 was controlled to 1.3 Torr by a conductance valve (not shown).

The annealing in accordance with the invention in a gas atmosphere containing trace amount of oxygen atoms and trace amount of Group III element atoms was conducted for 10 minutes, while the substrate heater 411 was controlled to maintain the substrate temperature at 300° C. Then, the supply of the O$_2$/H$_2$ gas (dilution: 2 ppm) and B$_2$H$_6$/H$_2$ gas (dilution: 2 ppm) into the deposition chamber 418 was stopped and the interior of the deposition chamber 418 and the gas line was evacuated to $1 \times 10^{-5}$ Torr.

(5) Then, an MW i-layer 304 of a-SiGe, an RF i-layer 361 of a-Si, an RF p-layer 305 of a-SiC, an RF n-layer 306 of $\mu$c-Si, an RF i-layer 352 of a-Si, an MW i-layer 307 of a-SiGe, an RF i-layer 362 of a-Si, an RF p-layer 308 of a-SiC, an RF n-layer 309 of $\mu$c-Si, an RF i-layer 310 of a-Si, and an RF p-layer 311 of a-SiC were successively formed, in accordance with a procedure which is substantially the same as that used in Example B-2, i.e., in the same way as Example A-2.

(6) Then, an ITO film of 70 nm thick, serving as a transparent conductive layer 312, was formed on the RF p-layer 311 by vacuum evaporation.

(7) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of the present invention was thus completed. This element will be referred to as "SC/B-4". The conditions of the annealing in gas atmosphere containing trace amount of oxygen atoms and trace amount of Group III element atoms in this example, as well as the conditions of film-forming processes for forming the RF n-layer, RF i-layer, MW i-layer and RF-p layer are collectively shown in Tables 62 and 63.

TABLE 62

CONDITIONS OF ANNEALING IN ATMOSPHERE FORMED OF GAS CONTAINING TRACE AMOUNT OF OXYGEN ATOMS AND GAS CONTAINING TRACE AMOUNT OF GROUP III

| | |
| --- | --- |
| Type of gas containing trace amount of oxygen atoms | O$_2$/H$_2$ |
| Oxygen atom concentration in whole annealing gas (ppm) | 1 |
| Type of gas containing trace amount of Group III element atoms | B$_2$H$_6$/H$_2$ |

TABLE 62-continued

CONDITIONS OF ANNEALING IN ATMOSPHERE FORMED OF GAS CONTAINING TRACE AMOUNT OF OXYGEN ATOMS AND GAS CONTAINING TRACE AMOUNT OF GROUP III

| | |
|---|---|
| Group III element atom concentration in whole annealing gas (ppm) | 1 |
| Annealing temp. (° C.) | 300 |
| Annealing press. (Torr) | 1.3 |

TABLE 63

| | SiH$_4$ flow rate sccm | Si$_2$H$_6$ flow rate sccm | CH$_4$ flow rate sccm | GeH$_4$ flow rate sccm | H$_2$ flow rate sccm | PH$_3$/H$_2$ flow rate sccm | B$_2$H$_6$/H$_2$ flow rate sccm | SIH$_4$/H$_2$ flow rate sccm | Press. Torr | MW Power W/cm$^2$ | RF Power W/cm$^2$ | Substrate temp. ° C. | Film thickness nm |
|---|---|---|---|---|---|---|---|---|---|---|---|---|---|
| RF n-layer | 2.0 | | | | 100 | 200 | | | 1.3 | | 0.05 | 350 | 20 |
| RF i-layer | | 4.0 | | | 100 | | | | 0.8 | | 0.008 | 300 | 10 |
| MW i-layer | 50 | | | 51 | 100 | | | | 0.010 | 0.10 | 0.31 | 370 | 110 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 34 | | | 28 | 120 | | | | 0.013 | 0.11 | 0.3 | 350 | 100 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 1.5 | | | 80 | | | | 0.8 | | 0.007 | 190 | 90 |
| RF p-layer | | | 0.4 | | 90 | | 8 | 2 | 1.6 | | 0.07 | 170 | 10 |

Comparative Example B 4-1

A process was conducted as Comparative Example B 4-1. This process was different from Example B-4 in that it omitted the annealing in the gas atmosphere containing trace amount of oxygen atoms and trace amount of Group III element atoms.

Other conditions were materially the same as those in Example B-4. The photovoltaic element produced in Comparative Example B 4-1 will be referred to as "SC/CB4-1".

Six samples of the photovoltaic elements SC/B-4, as well as six samples of the photovoltaic elements SC/CB4-1, were produced and were subjected, basically in the same way as Example A-1 and Comparative Example A1-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The initial photoelectric conversion efficiency was evaluated in terms of variation of the conversion efficiency among the six sample elements of each type. The photo-degradation characteristic was measured by setting the element temperature to 45° C. The anti-environment characteristic was evaluated by setting the temperature to 85° C., the humidity to 90% and the time of shelving in the dark place to 150 hours. The results are shown in Table 64.

The performance of the photovoltaic element is shown in Table 64 in terms of values measured on the samples of the photovoltaic element SC/B-4 as normalized by the values measured on the samples of the photovoltaic element SC/CB4-1.

TABLE 64

| Items of evaluation | Evaluation |
|---|---|
| Initial photoelectric conversion efficiency characteristic | 1.45 |
| Variation of Initial photoelectric conversion efficiency characteristic | 0.87 |
| Photo-degradation characteristic | 0.84 |
| Anti-environment characteristic | 0.84 |
| SEM observation of sectional face | 0.93 |
| Measurement of adhesion: Delamination | No Delamination in SC/B-4 Slight delamination in SC/CB4-1 |

From the results shown in Table 64, it will be seen that all the sample photovoltaic elements SC/B-4 in accordance with Example B-4 exhibit superiority to the sample photovoltaic elements SC/CB4-1 of Comparison Example B4-1 in all items of evaluation.

EXAMPLE B-5

This Example is different from Example B-3 in that the annealing was effected on the MW i-layer 304 of a-SiGe, in place of the RF n-layer 303 of $\mu$c-Si. As in Example B-3, a photovoltaic element of the triple type shown in FIG. 3 was manufactured by using an in-line type apparatus shown in FIG. 4, in accordance with the following procedure.

(1) A substrate having a reflecting layer 301 and a reflection enhancement layer 302 formed thereon (i.e. base member), prepared in the same way as that in Example B-1, was disposed on a substrate conveyor rails 413 laid in a load chamber 401, and the internal pressure of the load chamber 401 was lowered to 1×10$^{-5}$ Torr. by a vacuum pump (not shown).

(2) Then, gate valves 406 and 407 were opened and the substrate was conveyed into conveyance chambers 402, 403 and then into a deposition chamber 418 which had been evacuated to certain levels of vacuum by vacuum pumps which are not shown. The substrate was held such that its reverse side was kept in close contact with a substrate heater 411 so as to be heated by the heater 411, while the interior of the deposition chamber 418 was evacuated by the vacuum pump to a level of 1×10$^{-5}$ Torr.

(3) Preparation for film forming operation was thus completed. Then, $H_2$ gas was introduced into the deposition chamber 417 through a gas-introduction line 429 and the flow rate of the $H_2$ gas was controlled to 500 sccm by means of valves 441, 431, 430, under the control of a mass-flow controller 436. At the same time, the internal pressure of the deposition chamber 417 was regulated to 1.3 Torr. by a conductance valve (not shown). Meanwhile, the substrate heater 410 was adjusted to maintain the substrate temperature at 350° C. An RF n-layer 303 of μc-Si and an RF i-layer 351 of a-Si and an MW i-layer 304 of a-SiGe were formed when the substrate temperature has become steady.

(4) Then, an annealing was executed in an atmosphere of a gas containing a trace amount of oxygen atoms and a trace amount of Group III element atoms.

For the purpose of executing the annealing in the gas atmosphere containing a trace amount of oxygen atoms and a trace amount of Group III element atoms, $O_2$/He gas (dilution: 2 ppm) as the gas containing oxygen atoms and $BF_3/H_2$ gas (dilution: 2 ppm) as the gas containing trace amount of Group III element atoms were introduced into the deposition chamber 418 through the gas introduction line 449. The valves 465 and 455 were opened and the flow rate of the $O_2$/He gas (dilution: 2 ppm) was controlled to 500 sccm by means of a mass-flow controller 460. The flow rate of the $BF_3/H_2$ gas (dilution: 2 ppm) also was controlled to 500 sccm by means of valves and a mass-flow controller which are not shown.

Meanwhile, the pressure in the deposition chamber 418 was controlled to 1.1 Torr by a conductance valve (not shown).

The annealing in accordance with the invention in a gas atmosphere containing trace amount of oxygen atoms and trace amount of Group III element atoms was conducted for 10 minutes, while the substrate heater 411 was controlled to maintain the substrate temperature at 300° C. Then, the supply of the $O_2$/He gas (dilution: 2 ppm) and the $BF_3/H_2$ gas (dilution: 2 ppm) into the deposition chamber 418 was stopped and the interior of the deposition chamber 418 and the gas line was evacuated to $1\times10^{-5}$ Torr.

Then, an RF i-layer 361 of a-Si, an RF p-layer 305 of a-SiC, an RF n-layer 306 of μc-Si, an RF i-layer 352 of a-Si, an MW i-layer 307 of a-SiGe, an RF i-layer 362 of a-Si, an RF p-layer 308 of a-SiC, an RF n-layer 309 of μc-Si, an RF i-layer 310 of a-Si, and an RF p-layer 311 of a-SiC were successively formed, in accordance with a procedure which is substantially the same as that used in Example B-2, i.e., in the same way as that in Example A-2.

(6) Then, an ITO film of 70 nm thick, serving as a transparent conductive layer 312, was formed on the RF p-layer 311 by vacuum evaporation.

(7) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of the present invention was thus completed. This element will be referred to as "SC/B-5". The conditions of the annealing in gas atmosphere containing trace amount of oxygen atoms and trace amount of Group III element atoms in this example, as well as the conditions of film-forming processes for forming the RF n-layer, RF i-layer, MW i-layer and RF-p layer are collectively shown in Tables 65 and 66.

TABLE 65

CONDITIONS OF ANNEALING IN ATMOSPHERE FORMED OF GAS CONTAINING TRACE AMOUNT OF OXYGEN ATOMS AND GAS CONTAINING TRACE AMOUNT OF GROUP III

| | |
|---|---|
| Type of gas containing trace amount of oxygen atoms | $O_2$/He |
| Oxygen atom concentration in whole annealing gas (ppm) | 1 |
| Type of gas containing trace amount of Group III element atoms | $BF_3/H_2$ |
| Group III element atom concentration in whole annealing gas (ppm) | 1 |
| Annealing temp. (° C.) | 300 |
| Annealing press. (Torr) | 1.1 |

TABLE 66

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power W/cm² | RF Power W/cm² | Substrate temp. ° C. | Film thickness nm |
|---|---|---|---|---|---|---|---|---|---|---|---|---|---|
| RF n-layer | 2.0 | | | | 100 | 200 | | | 1.3 | | 0.05 | 350 | 20 |
| RF i-layer | | 4.0 | | | 100 | | | | 0.8 | | 0.008 | 300 | 10 |
| MW i-layer | 40 | | | 41 | 100 | | | | 0.010 | 0.10 | 0.31 | 370 | 110 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 35 | | | 28 | 120 | | | | 0.013 | 0.10 | 0.3 | 350 | 100 |
| RF i-layer | | 3.5 | | | 90 | | | | 0.7 | | 0.008 | 280 | 23 |
| RF p-layer | | | 0.2 | | 80 | | 9 | 2 | 1.7 | | | 260 | 10 |
| RF n-layer | 0.8 | | | | 50 | 250 | | | 1.05 | | 0.04 | 230 | 10 |
| RF i-layer | | 1.5 | | | 80 | | | | 0.8 | | 0.007 | 190 | 90 |
| RF p-layer | | | 0.4 | | 90 | | 8 | 2 | 1.6 | | 0.07 | 170 | 10 |

Comparative Example B 5-1

A process was conducted as Comparative Example B 5-1. This process was different from Example B-5 in that it omitted the annealing in the gas atmosphere containing trace amount of oxygen atoms and trace amount of Group III element atoms.

Other conditions were materially the same as those in Example B-5. The photovoltaic element produced in Comparative Example B 5-1 will be referred to as "SC/CB5-1".

Seven samples of the photovoltaic elements SC/B-5, as well as seven samples of the photovoltaic elements SC/CB5-1, were produced and were subjected, basically in the same way as Example A-1 and Comparative Example A1-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The variation of the initial photoelectric conversion efficiency was evaluated in terms of variation of the conversion efficiency among the seven sample elements of each type. The anti-environment characteristic was evaluated by setting the temperature to 85° C., the humidity to 90% and the time of shelving in the dark place to 150 hours. The photo-degradation was evaluated by setting the element temperature to 43° C. The results are shown in Table 67.

The performance of the photovoltaic element is shown in Table 67 in terms of values measured on the samples of the photovoltaic element SC/B-5 as normalized by the values measured on the samples of the photovoltaic element SC/CB5-1.

TABLE 67

| Items of evaluation | Evaluation |
| --- | --- |
| Initial photoelectric conversion efficiency characteristic | 1.48 |
| Variation of Initial photoelectric conversion efficiency characteristic | 0.85 |
| Photo-degradation characteristic | 0.84 |
| Anti-environment characteristic | 0.84 |
| SEM observation of sectional face | 0.93 |
| Measurement of adhesion: Delamination | NO delamination in SC/B-5 slight delamination in SC/CB5-1 |

From the results shown in Table 67, it will be seen that all the sample photovoltaic elements SC/B-5 in accordance with Example B-5 exhibit superiority to the sample photovoltaic elements SC/CB5-1 of Comparison Example B5-1 in all items of evaluation.

EXAMPLE B-6

This Example is different from Example B-3 in that the annealing was effected on the RF i-layer 361 of a-Si, in place of the RF n-layer 303 of μc-Si. A photovoltaic element of the triple type shown in FIG. 3 was manufactured by using an in-line type apparatus shown in FIG. 4, in accordance with the following procedure.

(1) A substrate having a reflecting layer 301 and a reflection enhancement layer 302 formed thereon (i.e. base member), prepared in the same way as that in Example B-1, was disposed on a substrate conveyor rails 413 laid in a load chamber 401, and the internal pressure of the load chamber 401 was lowered to $1 \times 10^{-5}$ Torr. by a vacuum pump (not shown).

(2) Then, gate valves 406 and 407 were opened and the substrate was conveyed into conveyance chambers 402, 403 and then into a deposition chamber 418 which have been evacuated to certain levels of vacuum by vacuum pumps which are not shown. The substrate was held such that its reverse side is kept in close contact with a substrate heater 411 so as to be heated by the heater 411, while the interior of the deposition chamber 418 was evacuated by the vacuum pump to a level of $1 \times 10^{-5}$ Torr.

(3) Preparation for film forming operation was thus completed. Then, $H_2$ gas was introduced into the deposition chamber 417 through a gas-introduction line 429 and the flow rate of the $H_2$ gas was controlled to 500 scam by means of valves 441, 431, 430, under the control of a mass-flow controller 436. At the same time, the internal pressure of the deposition chamber 417 was regulated to 1.3 Torr. by a conductance valve (not shown). Meanwhile, the substrate heater 410 was adjusted to maintain the substrate temperature at 350° C. An RF n-layer 303 of μc-Si, an RF i-layer 351 of a-Si, an MW i-layer 304 of a-SiGe and an RF i-layer 361 of a-Si were formed when the substrate temperature has become steady.

(4) Then, an annealing was executed in an atmosphere of a gas containing a trace amount of oxygen atoms and a trace amount of Group III element atoms.

For the purpose of executing the annealing in the gas atmosphere containing a trace amount of oxygen atoms and a trace amount of Group III element atoms, $O_2$/Ar gas (dilution: 100 ppm) as the gas containing oxygen atoms and $BF_3/H_2$ gas (dilution 100 ppm) as the gas containing trace amount of Group III element atoms were introduced into the deposition chamber 418 through the gas introduction line 449. The valves 465 and 455 were opened and the flow rate of the $O_2$/Ar gas (dilution 100 ppm) was controlled to 500 sccm by means of a mass-flow controller 460. The flow rate of the $BF_3/H_2$ gas (dilution 100 ppm) also was regulated to 500 sccm by values and mass-flow controller which are not shown. Meanwhile, the pressure in the deposition chamber 418 was controlled to 1.3 Torr by a conductance valve (not shown).

The annealing in accordance with the invention in a gas atmosphere containing trace amount of oxygen atoms and trace amount of Group III element atoms was conducted for 10 minutes, while the substrate heater 411 was controlled to maintain the substrate temperature at 300° C. Then, the supply of the $O_2$/Ar gas (dilution: 100 ppm) and the $BF_3/H_2$ gas (dilution 100 ppm) into the deposition chamber 418 was stopped and the interior of the deposition chamber 418 and the gas line was evacuated to $1 \times 10^{-5}$ Torr.

Then, an RF p-layer 305 of a-SiC, e an RF n-layer 306 of μc-Si, an RF i-layer 352 of a-Si, an MW i-layer 307 of a-SiGe, an RF i-layer 362 of a-Si, an RF p-layer 308 of a-SiC, an RF n-layer 309 of μc-Si, an RF i-layer 310 of a-Si, and an RF p-layer 311 of a-SiC were successively formed, in accordance with a procedure which is substantially the same as that used in Example B-2, i.e., in the same way as that in Example A-2.

(6) Then, an ITO film of 70 nm thick, serving as a transparent conductive layer 312, was formed on the RF p-layer 311 by vacuum evaporation.

(7) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of this example as thus completed. This element will be referred to as "SC/B-6". The conditions of the annealing in gas atmosphere containing trace amount of oxygen atoms and trace amount of Group III element atoms in this example, as well as the conditions of film-forming processes for forming the RF n-layer, RF i-layer, MW i-layer and RF-p layer are collectively shown in Tables 68 and 69.

TABLE 68

CONDITIONS OF ANNEALING IN ATMOSPHERE FORMED OF GAS CONTAINING TRACE AMOUNT OF OXYGEN ATOMS AND GAS CONTAINING TRACE AMOUNT OF GROUP III

| | |
|---|---|
| Type of gas containing trace amount of oxygen atoms | $O_2/Ar$ |
| Oxygen atom concentration in whole annealing gas (ppm) | 50 |
| Type of gas containing trace amount of Group III element atoms | $BF_3/H_2$ |
| Group III element atom concentration in whole annealing gas (ppm) | 50 |
| Annealing temp. (° C.) | 300 |
| Annealing press. (Torr) | 1.3 |

TABLE 70

| Items of evaluation | Evaluation |
|---|---|
| Initial photoelectric conversion efficiency characteristic | 1.49 |
| Variation of Initial photoelectric conversion efficiency characteristic | 0.83 |
| Photo-degradation characteristic | 0.83 |
| Anti-environment characteristic | 0.84 |
| SEM observation of sectional face | 0.93 |
| Measurement of adhesion: | No delamination in SC/B-6 |
| Delamination | Slight delamination in SC/CB6-1 |

TABLE 69

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 48 | | | 51 | 100 | | | | 0.010 | 0.11 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 32 | | | 27 | 120 | | | | 0.010 | 0.11 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 80 | | | | 0.8 | | 0.007 | 190 | 90 |
| RF p-layer | | | 0.4 | | 90 | | 8 | 2 | 1.6 | | 0.07 | 170 | 10 |

Comparative Example B 6-1

A process was conducted as Comparative Example B6-1. This process was different from Example B-6 in that it omitted the annealing in the gas atmosphere containing trace amount of oxygen atoms and trace amount of Group III element atoms.

Other conditions were materially the same as those in Example B-6. The photovoltaic element produced in Comparative Example B 6-1 will be referred to as "SC/CB6-1".

Eight samples of the photovoltaic elements SC/B-6, as well as eight samples of the photovoltaic elements SC/CB6-1, were produced and were subjected, basically in the same way as Example A-1 and Comparative Example A1-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The photo-degradation was evaluated by setting the element temperature to 48° C. The anti-environment characteristic was evaluated by setting the temperature to 85° C., the humidity to 90% and the time of shelving in the dark place to 150 hours. The results are shown in Table 70.

The performance of the photovoltaic element is shown in Table 70 in terms of values measured on the samples of the photovoltaic element SC/B-6 as normalized by the values measured on the samples of the photovoltaic element SC/CB6-1.

From the results shown in Table 70, it will be seen that all the sample photovoltaic elements SC/B-6 in accordance with Example B-6 exhibit superiority to the sample photovoltaic elements SC/CB6-1 of Comparison Example B6-1 in all items of evaluation.

EXAMPLE B-7

This Example is different from Example B-2 in that the annealing was effected on the RF p-layer 205 of a-SiC, in place of the RF n-layer 203 of $\mu$c-Si. As in Example B-2, a photovoltaic element of tandem type shown in FIG. 2 was manufactured by using an in-line type apparatus shown in FIG. 4, in accordance with the following procedure.

(1) A substrate having a reflecting layer 201 and a reflection enhancement layer 202 formed thereon (i.e. base member), prepared in the same way as that in Example B-1, was disposed on a substrate conveyor rails 413 laid in a load chamber 401, and the internal pressure of the load chamber 401 was lowered to $1\times10^{-5}$ Torr. by a vacuum pump (not shown).

(2) Then, the gate valve 406 was opened and the substrate was conveyed into the conveyance chamber 402 and the deposition chamber 417 which had been evacuated to certain levels of vacuum by vacuum pumps which are not shown. The substrate was held such that its reverse side was kept in close contact with a substrate heater 410 so as to be heated by the heater 410, while the interior of the deposition chamber 417 was evacuated by the vacuum pump to a level of $1\times10^{-5}$ Torr.

(3) Preparation for film forming operation was thus completed. Then, $H_2$ gas was introduced into the deposition chamber 417 through a gas-introduction line 429 and the flow rate of the $H_2$ gas was controlled to 500 sccm by means of valves 441, 431, 430, under the control of a mass-flow controller 436. At the same time, the internal pressure of the deposition chamber 417 was regulated to 1.0 Torr. by a conductance valve (not shown). Meanwhile, the substrate heater 410 was adjusted to maintain the substrate temperature at 350° C. An RF n-layer 203 of μc-Si, an RF i-layer 251 of a-Si, an MW i-layer 204 of a-SiGe, an RF i-layer 261 of a-Si and an RF P-layer 205 of a-SiC were formed in the same method as that in Example B-2, when the substrate temperature became steady.

(4) Then, an annealing was executed in an atmosphere of a gas containing a trace amount of oxygen atoms and a trace amount of Group III element atoms.

For the purpose of executing the annealing in the gas atmosphere containing a trace amount of oxygen atoms and Group III element atoms, $O_2/H_2$ gas (dilution: 2000 ppm) as the gas containing oxygen atoms and $B_2H_6/H_2$ gas (dilution: 2000 ppm) as the gas containing trace amount of Group III element atoms were introduced into the deposition chamber 418 through the gas introduction line 429. The valves 442 and 432 were opened and the flow rate of the $O_2/H_2$ gas (dilution: 2000 ppm) was controlled to 500 sccm by means of a mass-flow controller 436. The flow rate of the $B_2H_6/H_2$ gas (dilution: 2000 ppm) also was regulated to 500 sccm by means of valves and a mass-flow controller which are not shown.

Meanwhile, the pressure in the deposition chamber 417 was controlled to 1.3 Torr by a conductance valve (not shown).

(7) A mask having comb-shaped aperture was placed on the transparent electrode 212 and a comb-shaped collector electrode 213 of Cr(40 nm)/Ag(1000 nm)/Cr(40 nm) was formed by vacuum evaporation.

Fabrication of the photovoltaic element of this example was thus completed. This element will be referred to as "SC/B-7". The conditions of the annealing in gas atmosphere containing trace amount of oxygen atoms and trace amount of Group III element atoms in this example, as well as the conditions of film-forming processes for forming the RF n-layer, RF i-layer, MW i-layer and RF-p layer are collectively shown in Tables 71 and 72.

TABLE 71

CONDITIONS OF ANNEALING IN ATMOSPHERE FORMED OF GAS CONTAINING TRACE AMOUNT OF OXYGEN ATOMS AND GAS CONTAINING TRACE AMOUNT OF GROUP III

| | |
|---|---|
| Type of gas containing trace amount of oxygen atoms | $O_2/H_2$ |
| Oxygen atom concentration in whole annealing gas (ppm) | 1000 |
| Type of gas containing trace amount of Group III element atoms | $B_2H_6/H_2$ |
| Group III element atom concentration in whole annealing gas (ppm) | 1000 |
| Annealing temp. (° C.) | 225 |
| Annealing press. (Torr) | 1.3 |

TABLE 72

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SiH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 200 | | | 1.0 | | 0.05 | 350 | 20 |
| RF i-layer | | 4 | | | 110 | | | | 0.7 | | 0.008 | 300 | 10 |
| MW i-layer | 48 | | | 52 | 150 | | | | 0.006 | 0.08 | 0.30 | 380 | 150 |
| RF i-layer | | 3 | | | 80 | | | | 0.7 | | 0.007 | 250 | 20 |
| RF p-layer | | | 0.3 | | 60 | | 10 | 2 | 2.0 | | 0.07 | 230 | 10 |
| RF n-layer | 2 | | | | 50 | 250 | | | 1.0 | | 0.04 | 225 | 10 |
| RF i-layer | | 1.8 | | | 80 | | | | 0.5 | | 0.007 | 200 | 120 |
| RF p-layer | | | 0.3 | | 60 | | 10 | 2 | 2.0 | | 0.07 | 170 | 10 |

The annealing in accordance with the invention in a gas atmosphere containing trace amount of oxygen atoms and trace amount of Group III element atoms was conducted for 10 minutes, while the substrate heater 410 was controlled to maintain the substrate temperature at 225° C. Then, the supply of the $O_2/H_2$ gas (dilution: 2000 ppm) and the $B_2H_6/H_2$ gas (dilution: 2000 ppm) into the deposition chamber 417 was stopped and the interior of the deposition chamber 417 and the gas line was evacuated to $1 \times 10^{-5}$ Torr.

(5) Then, an RF n-layer 206 of μc-Si, an RF i-layer 207 of a-Si and an RF p-layer 208 of a-SiC were successively formed, in accordance with a procedure which is substantially the same as that used in Example B-2, i.e., in the same was as that in Example A-2.

(6) Then, an ITO film of 70 nm thick, serving as a transparent conductive layer 212, was formed on the RF p-layer 208 by vacuum evaporation.

Comparative Example B 7-1

A process was conducted as Comparative Example B 7-1. This process was different from Example B-7 in that it omitted the annealing in the gas atmosphere containing trace amount of oxygen atoms and trace amount of Group III element atoms.

Other conditions were materially the same as those in Example B-7. The photovoltaic element produced in Comparative Example B 7-1 will be referred to as "SC/CB7-1".

Six samples of the photovoltaic elements SC/B-7, as well as six samples of the photovoltaic elements SC/CB7-1, were produced and were subjected, basically in the same way as Example A-1 and Comparative Example A1-1, for evaluation of various items of performance such as initial photoelectric conversion efficiency (photo-voltage/incident photopower), variation or lack of uniformity of the conversion efficiency, photo-degradation, anti-environment characteristic against high-temperature and high-humidity environment, SEM observation of cut surface, and adhesion.

The photo-degradation was evaluated by setting the element temperature to 49° C., while the anti-environment characteristic was evaluated by setting the temperature to 86° C., the humidity to 90% and the time of shelving in the dark place to 150 hours. The results are shown in Table 73.

The performance of the photovoltaic element is shown in Table 73 in terms of values measured on the samples of the photovoltaic element SC/B-7 as normalized by the values measured on the samples of the photovoltaic element SC/CB7-1.

TABLE 73

| Items of evaluation | Evaluation |
| --- | --- |
| Initial photoelectric conversion efficiency characteristic | 1.50 |
| Variation of Initial photoelectric conversion efficiency characteristic | 0.85 |
| Photo-degradation characteristic | 0.82 |
| Anti-environment characteristic | 0.84 |
| SEM observation of sectional face | 0.93 |
| Measurement of adhesion: Delamination | No delamination in SC/B-7 Slight delamination SC/CB7-1 | same as that in Example B-3, except that annealing conditions as shown in Table 74 and production conditions as shown in Table 75 were used. Ten sample elements were produced while varying the concentration of oxygen atoms-containing gas between 0.3 ppm and 2000 ppm.

TABLE 74

CONDITIONS OF ANNEALING IN ATMOSPHERE FORMED OF GAS CONTAINING TRACE AMOUNT OF OXYGEN ATOMS AND GAS CONTAINING TRACE AMOUNT OF GROUP III

| | |
| --- | --- |
| Type of gas containing trace amount of oxygen atoms | $O_2/H_2$ |
| Oxygen atom concentration in whole annealing gas (ppm) | 0.3–2000 |
| Type of gas containing trace amount of Group III element atoms | $B_2H_6/H_2$ |
| Group III element atom concentration in whole annealing gas (ppm) | 2 |
| Annealing temp. (° C.) | 330 |
| Annealing press. (Torr) | 1.0 |

TABLE 75

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
| --- | --- | --- | --- | --- | --- | --- | --- | --- | --- | --- | --- | --- | --- |
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 48 | | | 51 | 125 | | | | 0.010 | 0.11 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 32 | | | 27 | 110 | | | | 0.011 | 0.11 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.5 | | | 80 | | | | 0.8 | | 0.007 | 190 | 90 |
| RF p-layer | | | 0.4 | | 90 | | 8 | 2 | 1.6 | | 0.07 | 170 | 10 |

From the results shown in Table 73, it will be seen that all the sample photovoltaic elements SC/B-7 in accordance with Example B-7 exhibit superiority to the sample photovoltaic elements SC/CB7-1.

EXAMPLE B-8

This example is different from Example B-3 in that the concentration of the gas containing trace amount of oxygen atoms in the annealing gas containing trace amount of oxygen atoms and trace amount of Group III element atoms was varied within the range of between 0.3 ppm and 2000 ppm, for the purpose of investigating the influence of the gas concentration on the performance such as the initial photoelectric conversion efficiency. $H_2$ gas was used as the diluting gas for varying the concentration of the gas containing trace amount of oxygen atoms and the concentration of the gas containing trace amount of Group III element atoms.

In this example, a triple type photovoltaic element as shown in FIG. 3 was produced by using the in-line type apparatus shown in FIG. 4. The process was materially the These ten samples were subjected to evaluation of performance of various items in the same way as that in Example B-3. Results of evaluation on each of the ten samples are shown in Table 76. The evaluation was made by normalizing the measurement results of the samples with the values measured on the sample which was produced by using the annealing gas containing trace amount of oxygen atoms having the concentration of 0.3 ppm. A mark x indicates that the normalized value is not less than 1.0 but below 1.4, a mark Δ indicates that the normalized value is not less than 1.4 but below 1.8 and a mark ○ indicates that the normalized value is not less than 1.8.

From Table 76, it is understood that the concentration of the oxygen atom-containing gas, which is used in the atmosphere gas of the annealing containing trace amount of oxygen atoms and trace amount of Group III element atoms, most preferably ranges from 1 ppm to 1000 ppm with respect to the whole annealing gas (total amount of diluting $H_2$ gas in this example), in order to obtain good results in regard to the initial photoelectric conversion efficiency, variation of the efficiency, photo-degradation, anti-environment characteristic against high-temperature, high-humidity atmosphere, and adhesion.

TABLE 76

| | Concentration of trace amount of oxygen atoms: ppm | | | | | | | | | |
|---|---|---|---|---|---|---|---|---|---|---|
| | 0.3 | 0.8 | 1 | 10 | 100 | 500 | 1000 | 1050 | 1300 | 2000 |
| Initial photoelectric conversion characteristic | x | Δ | o | o | o | o | o | x | x | x |
| Variation of characteristic | x | Δ | o | o | o | o | o | x | x | x |
| Photo-degradation characteristic | x | x | o | o | o | o | o | Δ | x | x |
| Anti-environment characteristic | x | Δ | o | o | o | o | o | x | x | x |
| Adhesion | x | Δ | o | o | o | o | o | Δ | x | x |

EXAMPLE B-9

This example is different from Example A-3 in that the concentration of the gas containing trace amount of oxygen atoms used in the annealing was varied within the range of between 0.3 ppm and 2000 ppm, for the purpose of investigating the influence of the gas concentration on the performance such as the initial photoelectric conversion efficiency. He gas was used as the diluting gas for varying the concentration of the gas containing trace amount of oxygen atoms and the concentration of the gas containing trace amount of Group III element atoms.

In this example, a triple type photovoltaic element of the type shown in FIG. 3 was produced by using the in-line type apparatus shown in FIG. 4. The process was materially the same as that in Example B-3, except that annealing conditions as shown in Table 77 and production conditions as shown in Table 78 were used. Ten sample elements were produced while varying the concentration of oxygen atoms-containing gas between 0.3 ppm and 2000 ppm.

TABLE 77

CONDITIONS OF ANNEALING IN ATMOSPHERE FORMED OF GAS CONTAINING TRACE AMOUNT OF OXYGEN ATOMS AND GAS CONTAINING TRACE AMOUNT OF GROUP III

| | |
|---|---|
| Type of gas containing trace amount of oxygen atoms | $O_2$/He |
| Oxygen atom concentration in whole annealing gas (ppm) | 0.3–2000 |
| Type of gas containing trace amount of Group III element atoms | $B_2H_6$/He |
| Group III element atom concentration in whole annealing gas (ppm) | 3 |
| Annealing temp. (° C.) | 340 |
| Annealing press. (Torr) | 1.4 |

These ten samples were subjected to evaluation of performance in the same way as that in Example B-3. Results of evaluation on each of the ten samples are shown in Table 79. The evaluation was made by normalizing the values measured on the respective samples with the values measured on the sample which was produced by using the annealing gas containing trace amount of oxygen atoms having the concentration of 0.3 ppm. A mark x indicates that the normalized value is not less than 1.0 but below 1.4, a mark Δ indicates that the normalized value is not less than 1.4 but below 1.8 and a mark o indicates that the normalized value is not less than 1.8.

From Table 79, it is understood that the concentration of the oxygen atom-containing gas, which is used in the atmosphere gas of the annealing containing trace amount of oxygen atoms and trace amount of Group III element atoms, most preferably ranges from 1 ppm to 1000 ppm with respect to the whole annealing gas (total diluting He gas in this case), in order to obtain good results in regard to the initial photoelectric conversion efficiency, variation of the efficiency, photo-degradation, anti-environment characteristic against high-temperature, high-humidity atmosphere, and adhesion.

TABLE 78

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 47 | | | 51 | 120 | | | | 0.010 | 0.10 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 31 | | | 27 | 110 | | | | 0.008 | 0.10 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.5 | | | 80 | | | | 0.8 | | 0.007 | 190 | 90 |
| RF p-layer | | | 0.4 | | 90 | | 8 | 2 | 1.6 | | 0.07 | 170 | 10 |

TABLE 79

| Concentration of trace amount of oxygen atoms: ppm | 0.3 | 0.8 | 1 | 10 | 100 | 500 | 1000 | 1050 | 1300 | 2000 |
|---|---|---|---|---|---|---|---|---|---|---|
| Initial photoelectric conversion characteristic | x | Δ | ○ | ○ | ○ | ○ | ○ | x | x | x |
| Variation of characteristic | x | Δ | ○ | ○ | ○ | ○ | ○ | Δ | x | x |
| Photo-degradation characteristic | Δ | Δ | ○ | ○ | ○ | ○ | ○ | Δ | x | x |
| Anti-environment characteristic | x | Δ | ○ | ○ | ○ | ○ | ○ | Δ | x | x |
| Adhesion | x | Δ | ○ | ○ | ○ | ○ | ○ | Δ | x | x |

EXAMPLE B-10

This example is different from Example B-3 in that the concentration of the gas containing trace amount of oxygen atoms used in the annealing atmosphere was varied within the range of between 0.3 ppm and 2000 ppm, for the purpose of investigating the influence of the gas concentration on the performance such as the initial photoelectric conversion efficiency. Ar gas was used as the diluting gas for varying the concentration of the gas containing trace amount of oxygen atoms and the concentration of the concentration of the gas containing trace amount of Group III element atoms.

In this example, a triple type photovoltaic element of FIG. 3 was produced by using the in-line type apparatus shown in FIG. 4. The process were materially the same as that in Example B-3, except that : annealing conditions as shown in Table 80 and production conditions as shown in Table 81 were used. Ten sample elements were produced while varying the concentration of oxygen atoms-containing gas between 0.3 ppm and 2000 ppm.

TABLE 80

CONDITIONS OF ANNEALING IN ATMOSPHERE FORMED OF GAS CONTAINING TRACE AMOUNT OF OXYGEN ATOMS AND GAS CONTAINING TRACE AMOUNT OF GROUP III

| | |
|---|---|
| Type of gas containing trace amount of oxygen atoms | $O_2$/Ar |
| Oxygen atom concentration in whole annealing gas (ppm) | 0.3–2000 |
| Type of gas containing trace amount of Group III element atoms | $B_2H_6$/Ar |
| Group III element atom concentration in whole annealing gas (ppm) | 2 |
| Annealing temp. (° C.) | 320 |
| Annealing press. (Torr) | 1.7 |

These ten samples were subjected to evaluation of performance in the same way as that in Example B-3. Results of evaluation on each of the ten samples are shown in Table 82. The evaluation was made by normalizing the values measured on the respective samples with the values measured on the sample which was produced by using the annealing gas containing trace amount of oxygen atoms having the concentration of 0.3 ppm. A mark x indicates that the normalized value is not less than 1.0 but below 1.4, a mark Δ indicates that the normalized value is not less than 1.4 but below 1.8 and a mark ○ indicates that the normalized value is not less than 1.8.

From Table 82, it is understood that the concentration of the oxygen atom-containing gas, which was used in the atmosphere gas of the annealing containing trace amount of oxygen atoms and trace amount of Group III element atoms, most preferably ranges from 1 ppm to 1000 ppm with respect to the whole annealing gas (Total diluting Ar gas in this case), in order to obtain good results in regard to the initial photoelectric conversion efficiency, variation of the efficiency, photo-degradation, anti-environment characteristic against high-temperature, high-humidity atmosphere, and adhesion.

TABLE 81

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 47 | | | 51 | 150 | | | | 0.010 | 0.10 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 29 | | | 28 | 140 | | | | 0.008 | 0.10 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 80 | | | | 0.8 | | 0.007 | 190 | 90 |
| RF p-layer | | | 0.4 | | 90 | | 8 | 2 | 1.6 | | 0.07 | 170 | 10 |

TABLE 82

| | Concentration of trace amount of oxygen atoms: ppm | | | | | | | | | |
|---|---|---|---|---|---|---|---|---|---|---|
| | 0.3 | 0.8 | 1 | 10 | 100 | 500 | 1000 | 1050 | 1300 | 2000 |
| Initial photoelectric conversion characteristic | x | Δ | o | o | o | o | o | x | x | x |
| Variation of characteristic | x | Δ | o | o | o | o | o | x | x | x |
| Photo-degradation characteristic | x | Δ | o | o | o | o | o | Δ | x | x |
| Anti-environment characteristic | x | Δ | o | o | o | o | o | x | x | x |
| Adhesion | x | x | o | o | o | o | o | x | x | x |

EXAMPLE B-11

This example is different from Example B-3 in that the concentration of the gas-containing trace amount of Group III element atoms used in the annealing atmosphere was varied within the range of between 0.3 ppm and 2000 ppm, for the purpose of investigating the influence of the gas concentration on the performance such as the initial photoelectric conversion efficiency. $H_2$ gas was used as the diluting gas for varying the concentration of the gas containing trace amount of oxygen atoms and the concentration of the gas containing trace amount of Group III element atoms.

In this example, a triple type photovoltaic element of FIG. 3 was produced by using the in-line type apparatus shown in FIG. 4. The process was materially the same as that in Example B-3, except that annealing conditions as shown in Table 83 and production conditions as shown in Table 84 were used. Ten sample elements were produced while varying the concentration of the gas containing trace amount of Group III element atoms between 0.3 ppm and 2000 PPM.

TABLE 83

CONDITIONS OF ANNEALING IN ATMOSPHERE FORMED OF GAS CONTAINING TRACE AMOUNT OF OXYGEN ATOMS AND GAS CONTAINING TRACE AMOUNT OF GROUP III

| | |
|---|---|
| Type of gas containing trace amount of oxygen atoms | $O_2/H_2$ |
| Oxygen atom concentration in whole annealing gas (ppm) | 2 |
| Type of gas containing trace amount of Group III element atoms | $B_2H_6/H_2$ |
| Group III element atom concentration in whole annealing gas (ppm) | 0.3–2000 |
| Annealing temp. (° C.) | 300 |
| Annealing press. (Torr) | 1.2 |

TABLE 84

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SiH_4/H_2$ flow rate sccm | Press. Torr | MW Power $W/cm^2$ | RF Power $W/cm^2$ | Substance temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 47 | | | 51 | 180 | | | | 0.010 | 0.10 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 29 | | | 28 | 160 | | | | 0.008 | 0.10 | 0.3 | 350 | 98 |
| RF i-layer | | 3.5 | | | 90 | | | | 0.7 | | 0.008 | 280 | 23 |
| RF p-layer | | | 0.2 | | 80 | | | | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 65 | | | | 0.8 | | 0.007 | 190 | 90 |
| RF p-layer | | | 0.4 | | 90 | | 8 | 2 | 1.6 | | 0.07 | 170 | 10 |

These ten samples were subjected to evaluation of performance in the same way as that in Example B-3. Results of evaluation on each of the ten samples are shown in Table 85. The evaluation was made by normalizing the values measured on the respective samples with the values measured on the sample which was produced by using the gas containing trace amount of Group III element atoms having the concentration of 0.3 ppm. A mark x indicates that the normalized value is not less than 1.0 but below 1.4, a mark Δ indicates that the normalized value is not less than 1.4 but below 1.8 and a mark ○ indicates that the normalized value is not less than 1.8.

From Table 85, it is understood that the concentration of the gas containing trace amount of Group III element atoms, which is used in the atmosphere gas of the annealing containing trace amount of oxygen atoms and trace amount of Group III element atoms, most preferably ranges from 1 ppm to 1000 ppm with respect to the whole annealing gas (Total diluting $H_2$ gas in this case), in order to obtain good results in regard to the initial photoelectric conversion efficiency, variation of the efficiency, photo-degradation, anti-environment characteristic against high-temperature, high-humidity atmosphere, and adhesion.

EXAMPLE B-12

This example is different from Example B-3 in that the concentration of the gas containing trace amount of Group III element atoms used in the annealing atmosphere was varied within the range of between 0.3 ppm and 2000 ppm, for the purpose of investigating the influence of the gas concentration on the performance such as the initial photoelectric conversion efficiency. He gas was used as the diluting gas for varying the concentration of the gas containing trace amount of oxygen atoms and the concentration of the concentration of the gas containing trace amount of Group III element atoms.

In this example, a triple type photovoltaic element of FIG. 3 was produced by using the in-line type apparatus shown in FIG. 4. The process was materially the same as that in Example B-3, except that annealing conditions as shown in Table 86 and production conditions as shown in Table 87 were used. Ten sample elements were produced while varying the concentration of the gas containing trace amount of Group III element atoms between 0.3 ppm and 2000 ppm.

TABLE 86

CONDITIONS OF ANNEALING IN ATMOSPHERE FORMED OF GAS CONTAINING TRACE AMOUNT OF OXYGEN ATOMS AND GAS CONTAINING TRACE AMOUNT OF GROUP III

| | |
|---|---|
| Type of gas containing trace amount of oxygen atoms | $O_2$/He |
| Oxygen atom concentration in whole annealing gas (ppm) | 2 |
| Type of gas containing trace amount of Group III element atoms | $B_2H_6$/He |
| Group III element atom concentration in whole annealing gas (ppm) | 0.3–2000 |

TABLE 85

| | Concentration of trace amount of oxygen atoms: ppm | | | | | | | | | |
|---|---|---|---|---|---|---|---|---|---|---|
| | 0.3 | 0.8 | 1 | 10 | 100 | 500 | 1000 | 1050 | 1300 | 2000 |
| Initial photoelectric conversion characteristic | x | Δ | ○ | ○ | ○ | ○ | ○ | Δ | x | x |
| Variation of characteristic | x | x | ○ | ○ | ○ | ○ | ○ | x | x | x |
| Photo-degradation characteristic | x | Δ | ○ | ○ | ○ | ○ | ○ | Δ | x | x |
| Anti-environment characteristic | x | Δ | ○ | ○ | ○ | ○ | ○ | Δ | x | x |
| Adhesion | x | x | ○ | ○ | ○ | ○ | ○ | x | x | x |

TABLE 86-continued

CONDITIONS OF ANNEALING IN ATMOSPHERE FORMED OF GAS CONTAINING TRACE AMOUNT OF OXYGEN ATOMS AND GAS CONTAINING TRACE AMOUNT OF GROUP III

| | |
|---|---|
| Annealing temp. (° C.) | 280 |
| Annealing press. (Torr) | 1.2 |

TABLE 87

| | $SiH_4$ flow rate sccm | $Si_2H_6$ flow rate sccm | $CH_4$ flow rate sccm | $GeH_4$ flow rate sccm | $H_2$ flow rate sccm | $PH_3$/$H_2$ flow rate sccm | $B_2H_6$/$H_2$ flow rate sccm | $SiH_4$/$H_2$ flow rate sccm | Press. Torr | MW Power W/cm² | RF Power W/cm² | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 46 | | | 50 | 190 | | | | 0.010 | 0.10 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 29 | | | 27 | 180 | | | | 0.008 | 0.10 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |

TABLE 87-continued

| | SiH$_4$ flow rate sccm | Si$_2$H$_6$ flow rate sccm | CH$_4$ flow rate sccm | GeH$_4$ flow rate sccm | H$_2$ flow rate sccm | PH$_3$/H$_2$ flow rate sccm | B$_2$H$_6$/H$_2$ flow rate sccm | SIH$_4$/H$_2$ flow rate sccm | Press. Torr | MW Power W/cm$^2$ | RF Power W/cm$^2$ | Substrate temp. °C. | Film thickness nm |
|---|---|---|---|---|---|---|---|---|---|---|---|---|---|
| RF n-layer | 0.8 | | | | 50 | 250 | | | 1.05 | | 0.04 | 230 | 10 |
| RF i-layer | | 2.0 | | | 65 | | | | 0.8 | | 0.007 | 190 | 90 |
| RF p-layer | | | 0.4 | | 90 | | 8 | 2 | 1.6 | | 0.07 | 170 | 10 |

These ten samples were subjected to evaluation of performance in the same way as that in Example B-3. Results of evaluation on each of the ten samples are shown in Table 88. The evaluation was made by normalizing the values measured on the respective samples with the values measured on the sample which was produced by using the gas containing trace amount of Group III element atoms having the concentration of 0.3 ppm. A mark x indicates that the normalized value is not less than 1.0 but below 1.4, a mark Δ indicates that the normalized value is not less than 1.4 but below 1.8 and a mark ○ indicates that the normalized value is not less than 1.8.

From Table 88, it is understood that the concentration of the gas containing trace amount of Group III element atoms, which is used in the atmosphere gas of the annealing containing trace amount of oxygen atoms and trace amount of Group III element atoms, most preferably ranges from 1 ppm to 1000 ppm with respect to the whole annealing gas (Total diluting He gas in this case), in order to obtain good results in regard to the initial photoelectric conversion efficiency, variation of the efficiency, photo-degradation, anti-environment characteristic against high-temperature, high-humidity atmosphere and adhesion.

In this example, a triple type photovoltaic element of FIG. 3 was produced by using the in-line type apparatus shown in FIG. 4. The process was materially the same as that in Example B-3, except that annealing conditions as shown in Table 89 and production conditions as shown in Table 90 were used. Ten sample elements were produced while varying the concentration of the gas containing trace amount of Group III element atoms between 0.3 ppm and 2000 ppm.

TABLE 88

| | Concentration of trace amount of Group III atoms: ppm | | | | | | | | | |
|---|---|---|---|---|---|---|---|---|---|---|
| | 0.3 | 0.8 | 1 | 10 | 100 | 500 | 1000 | 1050 | 1300 | 2000 |
| Initial photoelectric conversion characteristic | x | Δ | ○ | ○ | ○ | ○ | ○ | Δ | x | x |
| Variation of characteristic | x | x | ○ | ○ | ○ | ○ | ○ | x | x | x |
| Photo-degradation characteristic | x | Δ | ○ | ○ | ○ | ○ | ○ | x | x | x |
| Anti-environment characteristic | x | x | ○ | ○ | ○ | ○ | ○ | Δ | x | x |
| Adhesion | x | x | ○ | ○ | ○ | ○ | ○ | x | x | x |

EXAMPLE B-13

This example is different from Example B-3 in that the concentration of the gas containing trace amount of Group III element atoms used in the annealing atmosphere was varied within the range of between 0.3 ppm and 2000 ppm, for the purpose of investigating the influence of the gas concentration on the performance such as the initial photoelectric conversion efficiency. Ar gas was used as the diluting gas for varying the concentration of the gas containing trace amount of oxygen atoms and the concentration of the concentration of the gas containing trace amount of Group III element atoms.

TABLE 89

CONDITIONS OF ANNEALING IN ATMOSPHERE FORMED OF GAS CONTAINING TRACE AMOUNT OF OXYGEN ATOMS AND GAS CONTAINING TRACE AMOUNT OF GROUP III

| | |
|---|---|
| Type of gas containing trace amount of oxygen atoms | O$_2$/Ar |
| Oxygen atom concentration in whole annealing gas (ppm) | 2 |
| Type of gas containing trace amount of Group III element atoms | B$_2$H$_6$/Ar |
| Group III element atom concentration in whole annealing gas (ppm) | 0.3–2000 |
| Annealing temp. (° C.) | 310 |
| Annealing press. (Torr) | 1.3 |

TABLE 90

| | SiH$_4$ flow rate sccm | Si$_2$H$_6$ flow rate sccm | CH$_4$ flow rate sccm | GeH$_4$ flow rate sccm | H$_2$ flow rate sccm | PH$_3$/H$_2$ flow rate sccm | B$_2$H$_6$/H$_2$ flow rate sccm | SiH$_4$/H$_2$ flow rate sccm | Press. Torr | MW Power W/cm$^2$ | RF Power W/cm$^2$ | Substrate temp. °C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 46 | | | 49 | 250 | | | | 0.010 | 0.10 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 29 | | | 26 | 180 | | | | 0.008 | 0.10 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 85 | | | | 0.8 | | 0.007 | 190 | 90 |
| RF p-layer | | | 0.4 | | 90 | | 8 | 2 | 1.6 | | 0.07 | 170 | 10 |

These ten samples were subjected to evaluation of performance in the same way as that in Example B-3. Results of evaluation on each of the ten samples are shown in Table 91. The evaluation was made by normalizing the values measured on the respective samples with the values measured on the sample which was produced by using the gas containing trace amount of Group III element atoms having the concentration of 0.3 ppm. A mark x indicates that the normalized value is not less than 1.0 but below 1.4, a mark Δ indicates that the normalized value is not less than 1.4 but below 1.8 and a mark o indicates that the normalized value is not less than 1.8.

From Table 91, it is understood that the concentration of the gas containing trace amount of Group III element atoms, which is used in the atmosphere gas of the annealing containing trace amount of oxygen atoms and trace amount of Group III element atoms, most preferably ranges from 1 ppm to 1000 ppm with respect to the whole annealing gas (Total diluting Ar gas in this case), in order to obtain good results in regard to the initial photoelectric conversion efficiency, variation of the efficiency, photo-degradation, anti-environment characteristic against high-temperature, high-humidity atmosphere and adhesion.

In this example, a triple type photovoltaic element as shown in FIG. 3 was produced by using the in-line type apparatus shown in FIG. 4. The process were materially the same as that in Example B-3, except that annealing conditions as shown in Table 92 and production conditions as shown in Table 93 were used. Ten sample elements were produced while varying the annealing temperature between 25° C. and 500° C.

TABLE 92

CONDITIONS OF ANNEALING IN ATMOSPHERE FORMED OF GAS CONTAINING TRACE AMOUNT OF OXYGEN ATOMS AND GAS CONTAINING TRACE AMOUNT OF GROUP III

| | |
|---|---|
| Type of gas containing trace amount of oxygen atoms | O$_2$/H$_2$ |
| Oxygen atom concentration in whole annealing gas (ppm) | 2 |
| Type of gas containing trace amount of Group III element atoms | BF$_3$/Ar |
| Group III element atom concentration in whole annealing gas (ppm) | 2 |

TABLE 91

| | Concentration of trace amount of Group III atoms: ppm | | | | | | | | | |
|---|---|---|---|---|---|---|---|---|---|---|
| | 0.3 | 0.8 | 1 | 10 | 100 | 500 | 1000 | 1050 | 1300 | 2000 |
| Initial photoelectric conversion characteristic | x | x | o | o | o | o | o | x | x | x |
| Variation of characteristic | x | x | o | o | o | o | o | x | x | x |
| Photo-degradation characteristic | x | Δ | o | o | o | o | o | x | x | x |
| Anti-environment characteristic | x | x | o | o | o | o | o | x | x | x |
| Adhesion | x | x | o | o | o | o | o | x | x | x |

EXAMPLE B-14

This example is different from Example B-3 in that the annealing temperature was varied within the range of between 25° C. and 500° C., for the purpose of investigating the influence of the annealing temperature on the performance such as the initial photoelectric conversion efficiency. H$_2$ gas was used as the diluting gas for varying the concentration of the gas containing trace amount of oxygen atoms and the concentration of the gas containing trace amount of Group III element atoms.

TABLE 92-continued

CONDITIONS OF ANNEALING IN ATMOSPHERE FORMED OF GAS CONTAINING TRACE AMOUNT OF OXYGEN ATOMS AND GAS CONTAINING TRACE AMOUNT OF GROUP III

| | |
|---|---|
| Annealing temp. (° C.) | 25–500 |
| Annealing press. (Torr) | 1.1 |

TABLE 93

| | SiH$_4$ flow rate sccm | Si$_2$H$_6$ flow rate sccm | CH$_4$ flow rate sccm | GeH$_4$ flow rate sccm | H$_2$ flow rate sccm | PH$_3$/H$_2$ flow rate sccm | B$_2$H$_6$/H$_2$ flow rate sccm | SiH$_4$/H$_2$ flow rate sccm | Press. Torr | MW Power W/cm$^2$ | RF Power W/cm$^2$ | Substrate temp. °C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 48 | | | 51 | 150 | | | | 0.010 | 0.10 | 0.25 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 35 | | | 29 | 180 | | | | 0.013 | 0.10 | 0.24 | 350 | 98 |
| RF i-layer | | 4.0 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 85 | | | | 0.8 | | 0.007 | 190 | 90 |
| RF p-layer | | | 0.4 | | 90 | | 8 | 2 | 1.6 | | 0.07 | 170 | 10 |

These ten samples were subjected to evaluation of performance in the same way as that in Example B-3. Results of evaluation on each of the ten samples are shown in Table 94. The evaluation was made by normalizing the values measured on the respective samples with the values measured on the sample which was produced by setting the annealing temperature to 25° C. A mark x indicates that the normalized value is not less than 1.0 but below 1.4, a mark Δ indicates that the normalized value is not less than 1.4 but below 1.8 and a mark ○ indicates that the normalized value is not less than 1.8.

From Table 94, it is understood that the temperature of annealing conducted in the atmosphere containing trace amount of oxygen atoms and trace amount of Group III element atoms most preferably ranges from 50° C. to 400° C., in order to obtain good results in regard to the initial photoelectric conversion efficiency, variation of the efficiency, photo-degradation, anti-environment characteristic against high-temperature, high-humidity atmosphere, and adhesion.

EXAMPLE B-15

This example is different from Example B-3 in that the pressure of the annealing atmosphere was varied within the range of between 0.002 Torr and 100 Torr, for the purpose of investigating the influence of the annealing atmosphere pressure on the performance such as the initial photoelectric conversion efficiency. H$_2$ gas was used as the diluting gas for determining the concentration of the gas containing trace amount of oxygen and the concentration of the gas containing trace amount of Group III element atoms.

In this example, triple type photovoltaic element of the type shown in FIG. 3 was produced by using the in-line type apparatus shown in FIG. 4. The process was materially the same as that in Example B-3, except that annealing conditions as shown in Table 95 and production conditions as shown in Table 96 were used.

Ten sample elements were produced while varying the pressure of the annealing atmosphere within the range of between 0.002 Torr and 100 Torr.

TABLE 95

CONDITIONS OF ANNEALING IN ATMOSPHERE FORMED OF GAS CONTAINING TRACE AMOUNT OF OXYGEN ATOMS AND GAS CONTAINING TRACE AMOUNT OF GROUP III

| | |
|---|---|
| Type of gas containing trace amount of oxygen atoms | O$_2$/H$_2$ |
| Oxygen atom concentration in whole annealing gas (ppm) | 2 |
| Type of gas containing trace amount of Group III element atoms | B$_2$H$_6$/H$_2$ |
| Group III element atom concentration in whole annealing gas (ppm) | 2 |

TABLE 94

| | Annealing temp. (° C.) | | | | | | | | | |
|---|---|---|---|---|---|---|---|---|---|---|
| | 25 | 40 | 50 | 100 | 200 | 300 | 400 | 430 | 470 | 500 |
| Initial photoelectric conversion characteristic | x | Δ | ○ | ○ | ○ | ○ | ○ | x | x | x |
| Variation of characteristic | x | x | ○ | ○ | ○ | ○ | ○ | x | x | x |
| Photo-degradation characteristic | x | x | ○ | ○ | ○ | ○ | ○ | Δ | x | x |
| Anti-environment characteristic | x | Δ | ○ | ○ | ○ | ○ | ○ | x | x | x |
| Adhesion | x | x | ○ | ○ | ○ | ○ | ○ | Δ | x | x |

TABLE 95-continued

CONDITIONS OF ANNEALING IN ATMOSPHERE FORMED OF GAS CONTAINING TRACE AMOUNT OF OXYGEN ATOMS AND GAS CONTAINING TRACE AMOUNT OF GROUP III

| | |
|---|---|
| Annealing temp. (° C.) | 340 |
| Annealing press. (Torr) | 0.002–100 |

TABLE 96

| | SiH$_4$ flow rate sccm | Si$_2$H$_6$ flow rate sccm | CH$_4$ flow rate sccm | GeH$_4$ flow rate sccm | H$_2$ flow rate sccm | PH$_3$/H$_2$ flow rate sccm | B$_2$H$_6$/H$_2$ flow rate sccm | SIH$_4$/H$_2$ flow rate sccm | Press. Torr | MW Power W/cm$^2$ | RF Power W/cm$^2$ | Substrate temp. °C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 47 | | | 51 | 200 | | | | 0.010 | 0.08 | 0.25 | 380 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 33 | | | 28 | 160 | | | | 0.013 | 0.07 | 0.24 | 360 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 85 | | | | 0.8 | | 0.007 | 190 | 90 |
| RF p-layer | | | 0.4 | | 90 | | 8 | 2 | 1.6 | | 0.07 | 170 | 10 |

These ten samples were subjected to evaluation of performance in the same way as that in Example B-3. Results of evaluation on each of the ten samples are shown in Table 97. The evaluation was made by normalizing the values measured on the respective samples with the values measured on the sample which was produced by setting the annealing atmosphere pressure to 0.002 Torr. A mark x indicates that the normalized value is not less than 1.0 but below 1.4, a mark Δ indicates that the normalized value is not less than 1.4 but below 1.8 and a mark o indicates that the normalized value is not less than 1.8.

From Table 97, it is understood that the pressure of the annealing conducted in the atmosphere containing trace amount of oxygen atoms and trace amount of Group III element atoms most preferably ranges from 0.01 Torr to 10 Torr, in order to obtain good results in regard to the initial photoelectric conversion efficiency, variation of the efficiency, photo-degradation, anti-environment characteristic against high-temperature, high-humidity atmosphere, and adhesion.

TABLE 97

| | Annealing press. (Torr) | | | | | | | | | |
|---|---|---|---|---|---|---|---|---|---|---|
| | 0.002 | 0.00 | 0.01 | 0.1 | 1 | 5 | 10 | 20 | 50 | 100 |
| Initial photoelectric conversion characteristic | x | Δ | o | o | o | o | o | x | x | x |
| Variation of characteristic | x | x | o | o | o | o | o | x | x | x |
| Photo-degradation characteristic | x | Δ | o | o | o | o | o | Δ | x | x |
| Anti-environment characteristic | x | Δ | o | o | o | o | o | Δ | x | x |
| Adhesion | x | x | o | o | o | o | o | x | x | x |

EXAMPLE B-16

This example is different from Example B-3 in that the following conditions (i) to (iv) were employed, for the purpose of investigating the influence of these conditions on the performance such as the initial photoelectric conversion efficiency.

(i) The frequency of the microwave was varied within the range of between 0.02 GHz and 50 GHz in the formation of the MW i-layer 304 of a-SiGe and in the formation of the MW i-layer 307 of a-SiGe.

(ii) He gas was used in place of Ar gas, as the diluting gas which determines the concentration of the gas containing trace amount of oxygen atoms.

(iii) Different annealing conditions were adopted in annealing treatments effected on the MW i-layer 304 of a-SiGe and the MW i-layer 307 of a-SiGe.

(iv) H$_2$ gas was used in place of Ar gas as the diluting gas which determines the concentration of the gas containing trace amount of Group III element atoms.

In this Example, a photovoltaic element of the triple type shown in FIG. 3 was manufactured by using an in-line type apparatus shown in FIG. 4. The process was as follows.

(1) A substrate having a reflecting layer 301 and a reflection enhancement layer 302 formed thereon (i.e. base member), prepared in the same way as that in Example B-1, was disposed on a substrate conveyor rails 413 laid in a load chamber 401, and the internal pressure of the load chamber 401 was lowered to 1×10$^{-5}$ Torr. by a vacuum pump (not shown).

(2) Then, gate valves 406 and 407 were opened and the substrate was conveyed into conveyance chambers 402, 403 and then into a deposition chamber 418 which have been evacuated to certain levels of vacuum by vacuum pumps which are not shown. The substrate was held such that its reverse side is kept in close contact with a substrate heater 411 so as to be heated by the heater 411, while the interior of the deposition chamber 418 was evacuated by the vacuum pump to a level of 1×10$^{-5}$ Torr.

(3) Preparation for film forming operation was thus completed. Then, H$_2$ gas was introduced into the deposition chamber 417 through a gas-introduction line 429 and the flow rate of the H$_2$ gas was controlled to 500 sccm by means of valves 441, 431, 430, under the control of a mass-flow controller 436. At the same time, the internal pressure of the deposition chamber 417 was regulated to 1.3 Torr. by a conductance valve (not shown). Meanwhile, the substrate heater 410 was adjusted to maintain the substrate temperature at 350° C. When the substrate temperature has been stabilized, an RF n-layer 303 of μc-Si, an RF i-layer 351 of a-Si, and an MW i-layer 304 of a-SiGe were formed in the same way as that in Example B-2. In the formation of the MW i-layer, the MW introduction window 425 was removed and, instead, an antenna-type MW introduction electrode (not shown) was used according to the frequency of the microwave.

(4) Then, an annealing was executed in an atmosphere of a gas containing a trace amount of oxygen atoms and trace amount of Group III element atoms.

For the purpose of executing the annealing in the gas atmosphere containing a trace amount of oxygen atoms and trace amount of Group III element atoms, $O_2$/He gas (dilution: 2 ppm) as the gas containing oxygen atoms and $BF_3/H_2$ gas (dilution: 2 ppm) as the gas containing trace amount of Group III element atoms were introduced into the deposition chamber 418 through the gas introduction line 449. The valves 465 and 455 were opened and the flow rate of the $O_2$/He gas (dilution: 2 ppm) was controlled to 500 sccm by means of a mass-flow controller 460. The flow rate of the $BF_3/H_2$ gas (dilution: 2 ppm) also was regulated to 500 sccm by means of valves and a mass-flow controller which are not shown.

Meanwhile, the pressure in the deposition chamber 418 was controlled to 1.0 Torr by a conductance valve (not shown). The annealing in a gas atmosphere containing trace amount of oxygen atoms and trace amount of Group III element atoms was conducted for 10 minutes, while the substrate heater 411 was controlled to maintain the substrate temperature at 300° C. Then, the supply of the $O_2$/He gas (dilution: 2 ppm) and the $BF_3/H_7$ gas (dilution: 2 ppm) into the deposition chamber 418 was stopped, and the interior of the deposition chamber 418 and the gas line was evacuated to $1 \times 10^{-5}$ Torr.

(5) Then, an RF i-layer 361 of a-Si, an RF p-layer 305 of a-SiC, an RF n-layer 306 of pc-Si, an RF i-layer 352 of a-Si, and MW i-layer 307 of a-SiGe were successively formed, in accordance with a procedure which is substantially the same as that used in Example A-2. In the formation of the MW i-layer, the MW introduction window 425 was removed and, instead, an antenna-type MW introduction electrode (not shown) was used according to the frequency of the microwave.

(6) Then, an annealing was executed in an atmosphere of a gas containing a trace amount of oxygen atoms and a trace amount of Group III element atoms.

For the purpose of executing the annealing in the gas atmosphere containing a trace amount of oxygen atoms and a trace amount of Group III element atoms, $O_2$/He gas (dilution: 2 ppm) as the gas containing oxygen atoms and $BF_3/H_2$ gas (dilution: 2 ppm) as the gas containing Group III element atoms were introduced into the deposition chamber 418 through the gas introduction line 449. The valves 465 and 455 were opened and the flow rate of the $O_2$/He gas (dilution: 2 ppm) was controlled to 500 sccm by means of a mass-flow controller 460. The flow rate of the $BF_3/H_2$ gas (dilution: 2 ppm) also was regulated to 500 sccm by means of valves and a mass-flow controller which are not shown.

Meanwhile, the pressure in the deposition chamber 418 was controlled to 1.4 Torr by a conductance valve (not shown). The annealing in a gas atmosphere containing trace amount of oxygen atoms and trace amount of Group III element atoms was conducted for 10 minutes, while the substrate heater 411 was controlled to maintain the substrate temperature at 280° C. Then, the supply of the $O_2$/He gas (dilution: 2 ppm) and the $BF_3/H_2$ gas (dilution: 2 ppm) into the deposition chamber 418 was stopped and the interior of the deposition chamber 418 and the gas line was evacuated to $1 \times 10^{-5}$ Torr.

(7) Then, an RF i-layer 362 of a-Si, an RF p-layer 308 of a-SiC, an RF n-layer 309 of μc-Si, an RF i-layer 310 of a-Si, and an RF p-layer 311 of a-SiC were successively formed, in accordance with a procedure which is substantially the same as that used in Example B-2, i.e., in the same way as Example A-2.

(8) Then, an ITO film of 70 nm thick, serving as a transparent conductive layer 312, was formed on the RF p-layer 311 by vacuum evaporation.

(9) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Production of the photovoltaic element of this example was thus completed. Ten samples were produced while varying the microwave frequency within the range of from 0.02 GHz to 50 GHz during formation of the MW i-layer. The conditions of the annealing in the atmosphere of the gas containing trace amount of oxygen atoms and trace amount of Group III element atoms, and the conditions employed in the formation of the RF n-layer, RF i-layer, MW i-layer and RF p-layer are shown in Tables 98, 99 and 100.

TABLE 98

CONDITIONS OF ANNEALING IN ATMOSPHERE FORMED OF GAS CONTAINING TRACE AMOUNT OF OXYGEN ATOMS AND GAS CONTAINING TRACE AMOUNT OF GROUP III

| | |
|---|---|
| Type of gas containing trace amount of oxygen atoms | $O_2$/He |
| Oxygen atom concentration in whole annealing gas (ppm) | 1 |
| Type of gas containing trace amount of Group III element atoms | $BF_3/H_2$ |
| Group III element atom concentration in whole annealing gas (ppm) | 1 |
| Annealing temp. (° C.) | 300 |
| Annealing press. (Torr) | 1.0 |

TABLE 99

CONDITIONS OF ANNEALING IN ATMOSPHERE FORMED OF GAS CONTAINING TRACE AMOUNT OF OXYGEN ATOMS AND GAS CONTAINING TRACE AMOUNT OF GROUP III

| | |
|---|---|
| Type of gas containing trace amount of oxygen atoms | $O_2$/He |
| Oxygen atom concentration in whole annealing gas (ppm) | 1 |
| Type of gas containing trace amount of Group III element atoms | $BF_3/H_2$ |
| Group III element atom concentration in whole annealing gas (ppm) | 1 |
| Annealing temp. (° C.) | 280 |
| Annealing press. (Torr) | 1.4 |

TABLE 100

| | SiH$_4$ flow rate sccm | Si$_2$H$_6$ flow rate sccm | CH$_4$ flow rate sccm | GeH$_4$ flow rate sccm | H$_2$ flow rate sccm | PH$_3$/H$_2$ flow rate sccm | B$_2$H$_6$/H$_2$ flow rate sccm | SIH$_4$/H$_2$ flow rate sccm | Press. Torr | MW Power W/cm$^2$ | RF Power W/cm$^2$ | Substrate temp. °C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 67 | | | 69 | 250 | | | | 0.010 | 0.25 | 0.28 | 380 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 43 | | | 38 | 225 | | | | 0.011 | 0.25 | 0.28 | 360 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 85 | | | | 0.8 | | 0.007 | 190 | 90 |
| RF p-layer | | | 0.4 | | 90 | | 8 | 2 | 1.6 | | 0.07 | 170 | 10 |

These ten samples were subjected to evaluation of performance in the same way as that in Example B-3. Results of evaluation on each of the ten samples are shown in Table 101. The evaluation was made by normalizing the values measured on the respective samples with the values measured on the sample which was produced by using the microwave frequency of 0.02 GHz. A mark x indicates that the normalized value is not less than 1.0 but below 1.4, a mark Δ indicates that the normalized value is not less than 1.4 but below 1.8 and a mark ○ indicates that the normalized value is not less than 1.8. A mark ○ indicates that the normalized value is more than 2.0.

From Table 101, it is understood that the frequency of the microwave, which is employed in the formation of the MW i-layer 304 of a-SiGe and the MW i-layer 307 of a-SiGe which are to be annealed in the gas atmosphere containing trace amount of oxygen atoms and trace amount of Group III element atoms, most preferably ranges from 0.1 GHz to 10 GHz, in order to obtain good results in regard to the initial photoelectric conversion efficiency, variation of the efficiency, photo-degradation, anti-environment characteristic against high-temperature, high-humidity atmosphere, and adhesion.

TABLE 101

| | Microwave frequency: GHz | | | | | | | | | |
|---|---|---|---|---|---|---|---|---|---|---|
| | 0.02 | 0.05 | 0.1 | 0.5 | 1 | 2.45 | 10 | 20 | 30 | 50 |
| Initial photoelectric conversion characteristic | x | x | ○ | ○ | ○ | ⊚ | ○ | x | x | x |
| Variation of characteristic | x | x | ○ | ⊚ | ○ | ⊚ | ○ | x | x | x |
| Photo-degradation characteristic | x | x | ⊚ | ⊚ | ⊚ | ⊚ | ○ | Δ | x | x |
| Anti-environment characteristic | x | Δ | ⊚ | ⊚ | ○ | ⊚ | ○ | x | x | x |
| Adhesion | x | x | ○ | ○ | ○ | ⊚ | ○ | Δ | x | x |

EXAMPLE B-17

In this example, a triple type photovoltaic element of the type shown in FIG. 3 was produced by using the roll-to-roll type apparatus shown in FIG. 6. The annealing was conducted by using various combinations of annealing conditions in the atmosphere containing trace amount of oxygen atoms and trace amount of Group III. The production process was as follows.

(1) A sheet-like substrate (base member) of 30 cm wide, composed of a substrate of a stainless steel and carrying a reflecting layer such as of Ag (or Al—Si or the like) and a reflection enhancement layer such as of ZnO, was rolled up and set in a loading chamber 5010 for loading sheet-type substrate.

(2) The sheet-type substrate was threaded through all the deposition chambers and all the gas gates, and was connected to a sheet take-up jig disposed in an unload chamber 5150.

(3) The deposition chambers were evacuated to a level of $10^{-3}$ Torr or lower by evacuating systems which are not shown. Material gases were supplied to the deposition chambers, from mixing devices 5024, 5034, 5044, 5054, 5064, 5074, 5084, 5094, 5104, 5114, 5124, 5134 and 5144 associated with the respective deposition chambers.

(4) A gas containing trace amount of oxygen atoms and a gas containing trace amount of Group III element atoms were supplied from the respective gate gas supply devices to the gas gates 5201, 5202, 5203, 5204, 5205, 5206, 5207, 5208, 5209, 5210, 5211, 5212, 5213 and 5214.

In this example, the gap in the gas gate through which the sheet-type substrate passes was variable, and the gases containing trace amount of oxygen atoms and trace amount of Group III element atoms were supplied to the gas gates at a total flow rate of 1000 sccm. The temperature of the annealing in the atmosphere containing trace amount of oxygen atoms and trace amount of Group III element atoms was controlled to range between 350° C. and 50° C. by means of heaters incorporated in the gas gates. At the same time, the annealing pressure was controlled to range between 3 Torr and 1 Torr, by means of an evacuating system which is not shown.

(5) The substrate was heated by a substrate heater of each deposition device, and the level of the vacuum in each deposition device was controlled by operating an evacuating valve of each evacuation device. Advance of the sheet-type substrate was commenced when the substrate temperature and the vacuum level had been settled, and RF power for generating plasma and MW power (frequency 2.45 GHz) were supplied to each deposition device.

A triple-type solar cell having three pin structures stacked on one on another on the sheet-type substrate 300 was thus produced.

(6) Then, an ITO film of 70 nm thick, serving as a transparent conductive layer 312, was formed on the RF p-layer 311 by vacuum evaporation.

(7) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of this example was thus completed. This element will be referred to as "SC/B-17". The conditions of the annealing in gas atmosphere containing trace amount of oxygen atoms and trace amount of Group III element atoms in this example, as well as the conditions of film-forming processes for forming the RF n-layer, RF i-layer, MW i-layer and RF-p layer are collectively shown in Tables 102 and 103.

Comparative Example B 17-1

A process was conducted as Comparative Example B 17 1-1. This process was different from Example B-17 in that it omitted the annealing in the gas atmosphere containing trace amount of oxygen atoms and trade amount of Group III element atoms and that $H_2$ gas and a gas containing trace amount of Group III element atoms or He gas as desired was supplied to each gas gate.

Other conditions were materially the same as those in Example B-17. The photovoltaic element produced in Comparative Example B 17-1 will be referred to as "SC/CB17-1".

Six samples of the photovoltaic elements SC/B-17, as well as seven samples of the photovoltaic elements SC/CB17-1, were produced and were subjected, basically in the same way as Example A-1 and Comparative Example A1-1, for evaluation of various items of performance such as initial photoelectric conversion efficiency (photo-voltage/incident photo-power), variation or lack of uniformity of the environment, SEM observation of cut surface, and adhesion. conversion efficiency, photo-degradation, anti-environment

TABLE 102

CONDITIONS OF ANNEALING IN ATMOSPHERE FORMED OF GAS CONTAINING TRACE AMOUNT OF OXYGEN ATOMS AND GAS CONTAINING TRACE AMOUNT OF ATOMS OF GROUP III ELEMENT

| Gas gate | Type of gas containing oxygen atoms | Concentration of trace amount of oxygen atoms in whole annealing gas (ppm) | Type of gas containing Group III element atoms | Concentration of trace amount of Group III element atoms in whole annealing gas (ppm) | Annealing temp. (° C.) | Annealing press. (Torr) |
|---|---|---|---|---|---|---|
| 5201 | $O_2$/He | 500 | $B_2H_6$/He | 1 | 350 | 3.0 |
| 5202 | $O_2$/$H_2$ | 3 | $B_2H_6$/$H_2$ | 1 | 350 | 2.0 |
| 5203 | $O_2$/$H_2$ | 1 | $BF_3$/$H_2$ | 5 | 350 | 1.6 |
| 5204 | $O_2$/He | 1 | $BF_3$/He | 5 | 300 | 1.2 |
| 5205 | NO/He | 1 | $BF_3$/He | 500 | 300 | 2.5 |
| 5206 | NO/He | 200 | $B_2H_6$/He | 10 | 300 | 2.3 |
| 5207 | $O_2$/He | 10 | $B_2H_6$/He | 1 | 300 | 1.9 |
| 5208 | $O_2$/$H_2$ | 1 | $BF_3$/$H_2$ | 5 | 350 | 1.3 |
| 5209 | $O_2$/$H_2$ | 1 | $BF_3$/$H_2$ | 5 | 280 | 1.0 |
| 5210 | $O_2$/He | 2 | $B_2H_6$/He | 500 | 260 | 2.3 |
| 5211 | NO/He | 100 | $B_2H_6$/He | 10 | 230 | 2.2 |
| 5212 | $O_2$/$H_2$ | 1 | $B_2H_6$/He | 1 | 190 | 1.3 |
| 5213 | $O_2$/He | 3 | $B_2H_6$/He | 500 | 170 | 2.0 |
| 5214 | $O_2$/He | 500 | $B_2H_6$/He | 100 | 50 | 2.0 |

TABLE 103

| | $SiH_4$ flow rate sccm | $Si_2H_6$ flow rate sccm | $CH_4$ flow rate sccm | $GeH_4$ flow rate sccm | $H_2$ flow rate sccm | $PH_3$/$H_2$ flow rate sccm | $B_2H_6$/$H_2$ flow rate sccm | $SIH_4$/$H_2$ flow rate sccm | Press. Torr | MW Power W/cm² | RF Power W/cm² | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 47 | | | 50 | 130 | | | | 0.005 | 0.25 | 0.28 | 380 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 33 | | | 30 | 125 | | | | 0.005 | 0.25 | 0.28 | 360 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 65 | | | | 0.8 | | 0.007 | 190 | 90 |
| RF p-layer | | | 0.4 | | 90 | | 8 | 2 | 1.6 | | 0.07 | 170 | 10 | characteristic against high-temperature and high-humidity The initial photoelectric conversion efficiency was evaluated in terms of variation of the conversion efficiency among the six sample elements of each type. The photo-degradation was evaluated by setting the element temperature to 48° C. The anti-environment characteristic was evaluated by setting the temperature to 88° C., the humidity to 90% and the time of shelving in the dark place to 150 hours. The results are shown in Table 104.

The performance of the photovoltaic element is shown in Table 104 in terms of values measured on the samples of the photovoltaic element SC/B-17 as normalized by the values measured on the samples of the photovoltaic element SC/CB17-1.

TABLE 104

| Items of evaluation | Evaluation |
| --- | --- |
| Initial photoelectric conversion efficiency characteristic | 1.56 |
| Variation of Initial photoelectric conversion efficiency characteristic | 0.84 |
| Photo-degradation characteristic | 0.81 |
| Anti-environment characteristic | 0.83 |
| SEM observation of sectional face | 0.92 |
| Measurement of adhesion: Delamination | No delamination in SC/B-17 Slight delamination in SC/CB17-1 |

From Table 104, it is understood that the photovoltaic element SC/B-17 of this example exhibits superiority to the comparative example SC/CB17-1 in all items of the evaluation.

EXAMPLE B-18

In this example, a triple type photovoltaic element was produced by using the roll-to-roll type apparatus shown in FIG. 6. The annealing was conducted under various combinations of annealing conditions conducted in an atmosphere containing trace amount of oxygen atoms and trace amount of Group III element atoms. The production process was as follows.

(1) A sheet-like substrate (base member) of 30 cm wide, composed of a substrate of a stainless steel and carrying a reflecting layer such as of Ag (or Al—Si or the like) and a reflection enhancement layer such as of ZnO, was rolled up and set in a loading chamber 5010 for loading sheet-type substrate. The sheet-type substrate was threaded through all the deposition chambers and all the gas gates, and was connected to a sheet take-up jig disposed in an unload chamber 5150. The deposition chambers were evacuated to a level of $10^{-3}$ Torr or lower by evacuating systems which are not shown.

(2) Material gases were supplied to the deposition chambers, from mixing devices 5024, 5034, 5044, 5054, 5064, 5074, 5084, 5094, 5104, 5114, 5124, 5134 and 5144 associated with the respective deposition chambers.

(3) A gas containing trace amount of oxygen atom was supplied from the respective gate gas supply devices to the gas gates 5201, 5202, 5203, 5204, 5205, 5206, 5207, 5208, 5209, 5210, 5211, 5212, 5213 and 5214.

In this example, the gap in the gas gate through which the sheet-type substrate passes was variable, and the gases containing trace amount of oxygen atoms and trace amount of Group III element atoms were supplied to the gas gates at a total flow rate of 1000 sccm. The temperature of the annealing in the atmosphere containing trace amount of oxygen atoms and trace amount of Group III element atoms was controlled to range between 350° C. and 250° C. by means of heaters incorporated in the gas gates. At the same time, the annealing pressure was controlled to range between 3 Torr and 1 Torr, by means of an evacuating system which is not shown.

(4) The substrate was heated by a substrate heater of each deposition device, and the level of the vacuum in each deposition device was controlled by operating an evacuating valve of each evacuation device. Advance of the sheet-type substrate was commenced when the substrate temperature and the vacuum level have been settled, and RF power for generating plasma and MW power (frequency 0.5 GHz) were supplied to each deposition chamber. An antenna-type MW introduction electrode was used in the MW power supply system.

A triple-type solar cell having three pin structures stacked on one on another on the sheet-type substrate 300 was thus produced.

(5) Then, an ITO film of 70 nm thick, serving as a transparent conductive layer 312, was formed on the RF p-layer 311 by vacuum evaporation.

(6) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of this example was thus completed. This element will be referred to as "SC/B-18". The conditions of the annealing in gas atmosphere containing trace amount of oxygen atoms and trace amount of Group III element atoms in this example, as well as the conditions of film-forming processes for forming the RF n-layer, RF i-layer, MW i-layer and RF-p layer are collectively shown in Tables 105 and 106.

TABLE 105

CONDITIONS OF ANNEALING IN ATMOSPHERE FORMED OF GAS CONTAINING TRACE AMOUNT OF OXYGEN ATOMS AND GAS CONTAINING TRACE AMOUNT OF ATOMS OF GROUP III ELEMENT

| Gas gate | Type of gas containing oxygen atoms | Concentration of trace amount of oxygen atoms in whole annealing gas (ppm) | Type of gas containing Group III element atoms | Concentration of trace amount of Group III element atoms in whole annealing gas (ppm) | Annealing temp. (° C.) | Annealing press. (Torr) |
| --- | --- | --- | --- | --- | --- | --- |
| 5201 | $O_2$/Ar | 500 | $B_2H_6$/Ar | 1 | 350 | 3.0 |
| 5202 | $CO_2$/$H_2$ | 3 | $B_2H_6$/$H_2$ | 1 | 350 | 2.0 |
| 5203 | $O_2$/$H_2$ | 1 | $BF_3$/$H_2$ | 5 | 350 | 1.6 |

TABLE 105-continued

CONDITIONS OF ANNEALING IN ATMOSPHERE FORMED OF GAS CONTAINING TRACE AMOUNT OF OXYGEN
ATOMS AND GAS CONTAINING TRACE AMOUNT OF ATOMS OF GROUP III ELEMENT

| Gas gate | Type of gas containing oxygen atoms | Concentration of trace amount of oxygen atoms in whole annealing gas (ppm) | Type of gas containing Group III element atoms | Concentration of trace amount of Group III element atoms in whole annealing gas (ppm) | Annealing temp. (° C.) | Annealing press. (Torr) |
|---|---|---|---|---|---|---|
| 5204 | O$_2$/He | 1 | BF$_3$/He | 5 | 300 | 1.2 |
| 5205 | CO/He | 5 | BF$_3$/He | 400 | 300 | 2.5 |
| 5206 | NO/Ar | 100 | B$_2$H$_6$/Ar | 10 | 300 | 2.3 |
| 5207 | O$_2$/He | 10 | B$_2$H$_6$/He | 1 | 300 | 1.9 |
| 5208 | O$_2$/H$_2$ | 1 | BF$_3$/H$_2$ | 5 | 350 | 1.3 |
| 5209 | O$_2$/H$_2$ | 1 | BF$_3$/H$_2$ | 5 | 280 | 1.0 |
| 5210 | CO/He | 2 | B$_2$H$_6$/He | 400 | 260 | 2.3 |
| 5211 | NO/Ar | 80 | B$_2$H$_6$/Ar | 10 | 230 | 2.2 |
| 5212 | O$_2$/H$_2$ | 1 | B$_2$H$_6$/He | 1 | 190 | 1.3 |
| 5213 | O$_2$/He | 5 | B$_2$H$_6$/He | 400 | 170 | 2.0 |
| 5214 | O$_2$/He | 500 | B$_2$H$_6$/He | 100 | 50 | 2.0 |

TABLE 106

| | SiH$_4$ flow rate sccm | Si$_2$H$_6$ flow rate sccm | CH$_4$ flow rate sccm | GeH$_4$ flow rate sccm | H$_2$ flow rate sccm | PH$_3$/H$_2$ flow rate sccm | B$_2$H$_6$/H$_2$ flow rate sccm | SIH$_4$/H$_2$ flow rate sccm | Press. Torr | MW Power W/cm$^2$ | RF Power W/cm$^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 45 | | | 47 | 200 | | | | 0.004 | 0.11 | 0.30 | 380 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 31 | | | 28 | 150 | | | | 0.004 | 0.11 | 0.30 | 360 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 80 | | | | 0.8 | | 0.007 | 190 | 90 |
| RF p-layer | | | 0.4 | | 90 | | 8 | 2 | 1.6 | | 0.07 | 170 | 10 |

Comparative Example B 18-1

A process was conducted as Comparative Example B 18-1. This process was different from Example B-18 in that it omitted the annealing in the gas atmosphere containing trace amount of oxygen atoms and that H$_2$ gas, He gas or Ar gas as desired was supplied to each gas gate.

Other conditions were materially the same as those in Example B-18. The photovoltaic element produced in Comparative Example B 18-1 will be referred to as "SC/CB18-1".

Eight samples of the photovoltaic elements SC/B-18, as well as seven samples of the photovoltaic elements SC/CB18-1, were produced and were subjected, basically in the same way as Example A-1 and Comparative Example A1-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The initial photoelectric conversion efficiency was evaluated in terms of variation of the conversion efficiency among the seven sample elements of each type. The photo-degradation characteristic was measured by setting the element temperature to 45° C. The anti-environment characteristic was evaluated by setting the temperature to 88° C., the humidity to 90% and the time of shelving in the dark place to 300 hours. The results are shown in Table 107.

The performance of the photovoltaic element is shown in Table 107 in terms of values measured on the samples of the photovoltaic element SC/B-18 as normalized by the values measured on the samples of the photovoltaic element SC/CB18-1.

TABLE 107

| Items of evaluation | Evaluation |
|---|---|
| Initial photoelectric conversion efficiency characteristic | 1.52 |
| Variation of Initial photoelectric conversion efficiency characteristic | 0.84 |
| Photo-degradation characteristic | 0.81 |
| Anti-environment characteristic | 0.84 |
| SEM observation of sectional face | 0.92 |

TABLE 107-continued

| Items of evaluation | Evaluation |
| --- | --- |
| Measurement of adhesion: Delamination | No delamination in SC/B-18 Slight delamination in SC/CB18-1 |

From Table 107, it is understood that the photovoltaic element SC/B-18 of this example exhibits superiority to the comparative example SC/CB18-1 in all items of the evaluation.

EXAMPLE B-19

In this example, a triple type photovoltaic element was produced by using the roll-to-roll type apparatus shown in FIG. 6. The annealing was conducted under various combinations of conditions of annealing in the atmosphere containing trace amount of oxygen atoms and trace amount of Group III element atoms. The production process was as follows.

(1) A sheet-like substrate (base member) of 30 cm wide, composed of a substrate of a stainless steel and carrying a reflecting layer such as of Ag (or Al—Si or the like) and a reflection enhancement layer such as of ZnO, was rolled up and set in a loading chamber 5010 for loading sheet-type substrate. The sheet-type substrate was threaded through all the deposition chambers and all the gas gates, and was connected to a sheet take-up jig disposed in an unload chamber 5150. The deposition chambers were evacuated to a level of $10^{-3}$ Torr or lower by evacuating systems which are not shown.

(2) Material gases were supplied to the deposition chambers, from mixing devices 5024, 5034, 5044, 5054, 5064, 5074, 5084, 5094, 5104, 5114, 5124, 5134 and 5144 associated with the respective deposition chambers.

(3) A gas containing trace amount of oxygen atoms was supplied from the respective gate gas supply devices to the gas gates 5201, 5202, 5203, 5204, 5205, 5206, 5207, 5208, 5209, 5210, 5211, 5212, 5213 and 5214.

In this example, the gap in the gas gate through which the sheet-type substrate passes was variable, and the gases containing trace amount of oxygen atoms and trace amount of Group III element atoms were supplied to the gas gates at a total flow rate of 1400 sccm. The temperature of the annealing in the atmosphere containing trace amount of oxygen atoms and trace amount of Group III element atoms was controlled to range between 350° C. and 50° C. by means of heaters incorporated in the gas gates. At the same time, the annealing pressure was controlled to range between 3 Torr and 1 Torr, by means of an evacuating system which is not shown.

(4) The substrate was heated by a substrate heater of each deposition device, and the level of the vacuum in each deposition device was controlled by operating an evacuating valve of each evacuation device. Advance of the sheet-type substrate was commenced when the substrate temperature and the vacuum level have been settled, and RF power for generating plasma and MW power (frequency 0.1 GHz) was supplied to each deposition chamber. An antenna-type MW introduction electrode was used in the MW power supply system.

A triple-type solar cell having three pin structures stacked on one on another on the sheet-type substrate 300 was thus produced.

(5) Then, an ITO film of 70 nm thick, serving as a transparent conductive layer 312, was formed on the RF p-layer 311 by vacuum evaporation.

(6) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of this example was thus completed. This element will be referred to as "SC/B-19". The conditions of the annealing in gas atmosphere containing trace amount of oxygen atoms and trace amount of Group III element atoms in this example, as well as the conditions of film-forming processes for forming the RF n-layer, RF i-layer, MW i-layer and RF-p layer are collectively shown in Tables 108 and 109.

TABLE 108

CONDITIONS OF ANNEALING IN ATMOSPHERE FORMED OF GAS CONTAINING TRACE AMOUNT OF OXYGEN ATOMS AND GAS CONTAINING TRACE AMOUNT OF ATOMS OF GROUP III ELEMENT

| Gas gate | Type of gas containing oxygen atoms | Concentration of trace amount of oxygen atoms in whole annealing gas (ppm) | Type of gas containing Group III element atoms | Concentration of trace amount of Group III element atoms in whole annealing gas (ppm) | Annealing temp. (° C.) | Annealing press. (Torr) |
| --- | --- | --- | --- | --- | --- | --- |
| 5201 | $O_2$/AR | 500 | $B_2H_6$/Ar | 1 | 350 | 3.0 |
| 5202 | $CO_2$/$H_2$ | 3 | $B_2H_6$/$H_2$ | 1 | 350 | 2.0 |
| 5203 | $O_2$/$H_2$ | 1 | $BF_3$/$H_2$ | 4 | 350 | 1.6 |
| 5204 | $O_2$/He | 1 | $BF_3$/He | 4 | 300 | 1.2 |
| 5205 | CO/He | 5 | $BF_3$/He | 500 | 300 | 2.5 |
| 5206 | NO/Ar | 100 | $B_2H_6$/Ar | 10 | 300 | 2.3 |
| 5207 | $O_2$/He | 10 | $B_2H_6$/He | 1 | 300 | 1.9 |
| 5208 | $O_2$/$H_2$ | 1 | $BF_3$/$H_2$ | 5 | 350 | 1.3 |
| 5209 | $O_2$/$H_2$ | 1 | $BF_3$/$H_2$ | 5 | 280 | 1.0 |
| 5210 | CO/He | 2 | $B_2H_6$/He | 500 | 260 | 2.3 |
| 5211 | NO/Ar | 80 | $B_2H_6$/Ar | 10 | 230 | 2.2 |
| 5212 | $O_2$/$H_2$ | 1 | $B_2H_6$/He | 1 | 190 | 1.3 |
| 5213 | $O_2$/He | 5 | $B_2H_6$/He | 400 | 170 | 2.0 |
| 5214 | $O_2$/He | 500 | $B_2H_6$/He | 100 | 50 | 2.0 |

TABLE 109

| | SiH₄ flow rate sccm | Si₂H₆ flow rate sccm | CH₄ flow rate sccm | GeH₄ flow rate sccm | H₂ flow rate sccm | PH₃/H₂ flow rate sccm | B₂H₆/H₂ flow rate sccm | SIH₄/H₂ flow rate sccm | Press. Torr | MW Power W/cm² | RF Power W/cm² | Substrate temp. °C | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 46 | | | 48 | 150 | | | | 0.004 | 0.26 | 0.29 | 380 | 90 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 31 | | | 29 | 130 | | | | 0.004 | 0.26 | 0.29 | 375 | 85 |
| RF i-layer | | 4.0 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 80 | | | | 0.7 | | 0.007 | 190 | 88 |
| RF p-layer | | | 0.4 | | 90 | | 8 | 2 | 1.6 | | 0.07 | 170 | 10 |

Comparative Example B 19-1

A process was conducted as Comparative Example B 19-1. This process was different from Example B-19 in that it omitted the annealing in the gas atmosphere containing trace amount of oxygen atoms and that H₂ gas, He gas or Ar gas as desired was supplied to each gas gate.

Other conditions were materially the same as those in Example B-19. The photovoltaic element produced in Comparative Example B-19-1 will be referred to as "SC/CB19-1".

Eight samples of the photovoltaic elements SC/B-19, as well as eight samples of the photovoltaic elements SC/CB19-1, were produced and were subjected, basically in the same way as Example A-1 and Comparative Example A1-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The photo-degradation characteristic was measured by setting the element temperature to 43° C. The anti-environment characteristic was evaluated by setting the temperature to 89° C., the humidity to 93% and the time of shelving in the dark place to 220 hours. The results are shown in Table 110.

The performance of the photovoltaic element is shown in Table 110 in terms of values measured on the samples of the photovoltaic element SC/B-19 as normalized by the values measured on the samples of the photovoltaic element SC/CB19-1.

TABLE 110

| Items of evaluation | Evaluation |
|---|---|
| Initial photoelectric conversion efficiency characteristic | 1.51 |
| Variation of Initial photoelectric conversion efficiency characteristic | 0.86 |
| Photo-degradation characteristic | 0.82 |
| Anti-environment characteristic | 0.84 |
| SEM observation of sectional face | 0.91 |
| Measurement of adhesion: | No delamination in SC/B-19 |

TABLE 110-continued

| Items of evaluation | Evaluation |
|---|---|
| Delamination | Slight delamination in SC/CB19-1 |

From Table 110, it is understood that the photovoltaic element in SC/B-19 of this example exhibits superiority to the comparative example SC/CB19-1 in all items of the evaluation.

EXAMPLE B-20

Using the in-line type apparatus shown in FIG. 4, four types of samples of mono-film were prepared for measurement of interface defect density. More specifically, these four samples are a sample Ba in which the mono-film of a formed semiconductor layer is an RF n-layer, a sample Bb in which the mono-film of a formed semiconductor layer is an RF i-layer, a sample Bc in which the mono-film of a formed semiconductor layer is an MW i-layer, and a sample Bd in which the mono-film of a formed semiconductor layer is an RF p-layer.

The process for preparing these samples was as follows.

(1) A substrate (base member) for each sample was prepared by effecting, on a substrate 100 of quartz glass of 25 mm wide, 50 mm long and 0.8 mm thick, supersonic cleaning conducted by employing acetone and isopropanol, followed by drying with heated air.

(2) A Cr layer of 5 nm thick was formed on the surface of the substrate 100 of quartz glass by sputtering.

(3) Then, one of n-type semiconductor layer, i-type semiconductor layer and p-type semiconductor layer was formed to a thickness of 1 μm by the same method as that used in Example B-1, and the substrate having such semiconductor layer was subjected to annealing in atmosphere of a gas containing trace amount of oxygen atoms and trace amount of Group III element atoms, in the same way as that in Example B-1.

Samples of mono-films for the purpose of measurement of interface defect density were thus prepared. The conditions of the annealing in gas atmosphere containing trace amount of oxygen atoms and trace amount of Group III element atoms in this example, as well as the conditions of film-forming processes for forming the RF n-layer, RF i-layer, MW i-layer and RF-p layer are collectively shown in Tables 111 and 112.

TABLE 111

CONDITIONS OF ANNEALING IN ATMOSPHERE FORMED OF GAS CONTAINING TRACE AMOUNT OF OXYGEN ATOMS AND GAS CONTAINING TRACE AMOUNT OF ATOMS OF GROUP III ELEMENT

| Sample | Type of gas containing oxygen atoms | Concentration of trace amount of oxygen atoms in whole annealing gas (ppm) | Type of gas containing Group III element atoms | Concentration of trace amount of Group III element atoms in whole annealing gas (ppm) | Annealing temp. (° C.) | Annealing press. (Torr) |
|---|---|---|---|---|---|---|
| Ba | $O_2/Ar$ | 100 | $B_2H_6/Ar$ | 100 | 350 | 3 |
| Bb | $O_2/H_2$ | 2 | $BF_3/H_2$ | 10 | 250 | 2 |
| Bc | $O_2/H_2$ | 3 | $BF_3/H_2$ | 15 | 300 | 1.5 |
| Bd | $CO_2/He$ | 200 | $B_2H_3/He$ | 500 | 230 | 3 |

TABLE 112

| Sample | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. |
|---|---|---|---|---|---|---|---|---|---|---|---|---|
| Ba RF n-layer | 2.5 | | | | 100 | 180 | | | 1.0 | | 0.05 | 350 |
| Bb RF i-layer | | 4.5 | | | 110 | | | | 0.7 | | 0.008 | 300 |
| Bc MW i-layer | 45 | | | 47 | 150 | | | | 0.006 | 0.08 | 0.30 | 380 |
| Bd RF i-layer | | | 0.3 | | 80 | | 15 | 2 | 2.0 | | 0.07 | 230 |

Comparative Example B 20-1

A process was conducted as Comparative Example B 20-1. This process was different from Example B-20 in that the semiconductor layers were formed without the step of annealing in the gas atmosphere containing trace amount of oxygen atoms and trace amount of Group III element atoms.

Other conditions were materially the same as those in Example B-20. The mono-film for measurement of interface defect density prepared in Comparative Example B 20-1 will be referred to as "SC/CB20-1".

Three samples of mono-film Ba to Bd, as well as three samples of mono-film SC/CB20-1, were produced and were subjected to PDS (Photothermal Deflection Spectroscopy) measurement. The results are shown in Table 113. The measurement results are shown in this Table in terms of values measured on the samples Ba to Bd normalized with the values measured on the samples of the Comparative example, i.e., SC/CB20-1. Thus, the values shown in table 113 shows the ratio of reduction in the interface defect density.

TABLE 113

| Sample name | Type of semiconductor layer formed | Reduction of interfacial defect density |
|---|---|---|
| Ba | RF n-layer | 0.98 |
| Bb | RF i-layer | 0.89 |
| Bc | MW i-layer | 0.87 |
| Bd | RF p-layer | 0.95 |

From Table 113, it is understood that the samples of the Example B-20, which have undergone the annealing in atmosphere gas containing trace amount of oxygen atoms and trace amount of Group III element atoms in accordance with the invention, exhibit smaller density of interface defects and, hence, superior performance, as compared with the samples of Comparative Example (SC/CB20-1) which were prepared without such annealing.

EXAMPLE C-1

In this Example, a photovoltaic element of the type shown in FIG. 1 was manufactured by using an in-line type apparatus shown in FIG. 4, in accordance with the following procedure.

(1) A substrate (base member) was prepared as follows. A substrate 100 of a stainless steel of 50 mm long, 50 mm wide and 0.5 mm thick was subjected to an ultrasonic cleaning which was conducted by using acetone and propanol, followed by drying with heated air. A light reflecting layer 101 of Ag, having a thickness of 0.3 μm, was formed on the stainless steel substrate 100 by sputtering at room temperature. Then, a reflection enhancement layer 102 of ZnO, having a thickness of 1.0 μm, was formed on the reflecting layer 101 at 350° C., thus completing preparation of the substrate (base member).

(2) A deposition apparatus 400 is capable of performing both MWPCVD process and RFPCVD process. Semiconductor layers were formed on the reflection enhancement layer by using this apparatus.

Material gas cylinders, which were not shown, were connected to the deposition apparatus, through gas introduction lines. These cylinders contained material gases of ultra-high purity. More specifically, the following material gas cylinders were connected: an $SiH_4$ gas cylinder, $O_2/H_2$ (dilution: 2 ppm) gas cylinder, an $O_2/He$ (dilution: 10 ppm) gas cylinder, $O_2/Ar$ (dilution 100 ppm) gas cylinder, an $O_2/H_2$ (dilution: 2000 ppm) gas cylinder, a $CH_4$ gas cylinder, a $GeH_4$ gas cylinder, an $Si_2H_6$ gas cylinder, a $B_2H_6/H_2$ (dilutions: 2 ppm, 10 ppm, 100 ppm, 0.2%, 0.5%) gas cylinders, $PH_3/H_2$ (dilution 2 ppm, 10 ppm, 100 ppm, 2000 pm) gas cylinders, PF$_5$/H$_2$ (dilutions 2 ppm, 10 ppm, 100 ppm, 2000 ppm) gas cylinders, an H$_2$ gas cylinder, an He gas cylinder, an SiCl$_2$H$_2$ gas cylinder and an SiH$_4$/H$_2$ (dilution: 1%) gas cylinder.

(3) The substrate having the reflecting layer 101 and the reflection enhancement layer 102 formed thereon (i.e. base member) was disposed on a substrate conveyor rails 413 laid in a load chamber 401, and the internal pressure of the load chamber 401 was lowered to 1×10$^{-5}$ Torr. by a vacuum pump (not shown). Then, a gate valve 406 was opened and the substrate was conveyed into a conveyance chamber 402 and then into a deposition chamber 417 which have been evacuated to certain levels of vacuum by vacuum pumps which are not shown. The substrate was held such that its reverse side is kept in close contact with a substrate heater 410 so as to be heated by the heater 410, while the interior of the deposition chamber 417 was evacuated by the vacuum pump to a level of 1×10$^{-5}$ Torr.

(4) Preparation for film forming operation was thus completed. Then, H$_2$ gas was introduced into the deposition chamber 417 through a gas-introduction line 429 and the flow rate of the H$_2$ gas was controlled to 500 sccm by means of valves 441, 431, 430, under the control of a mass-flow controller 436. At the same time, the internal pressure of the deposition chamber 417 was regulated to 1.0 Torr. by a conductance valve (not shown). Meanwhile, the substrate heater 410 was adjusted to maintain the substrate temperature at 350° C.

(5) An RF n-layer 103 of μc-Si was formed when the substrate temperature became steady.

To this end, valves 443, 433, 444 and 434 were operated to introduce the SiH$_4$ gas and PH$_3$/H$_2$ gas into the deposition chamber 417 through the gas introduction line 429. Flow rates of the SiH$_4$ gas, H$_2$ gas and the PH$_3$/H$_2$ gas were controlled to 2 sccm, 100 sccm and 200 sccm, respectively, by means of the mass-flow controllers 438, 436 and 439, while the pressure in the deposition chamber 417 was controlled to 1.0 Torr.

The power of an RF power supply 422 was set to 0.05 W/cm$^2$, and RF power was introduced from this power supply into a plasma-forming cup 420, so as to trigger a glow discharge, thereby starting formation of the RF n-layer on the substrate. The RF power was turned off when the thickness of the RF n-layer has reached 20 nm, thus terminating the glow discharge to complete the formation of the RF n-layer 103. The supply of the SiH$_4$ gas, PH$_3$/H$_2$ gas and H$_2$ gas into the deposition chamber 417 was stopped and the interior of the deposition chamber and the gas line were evacuated to 1×10$^{-5}$ Torr.

(6) Then, an annealing was executed in an atmosphere of a gas containing trace amounts of oxygen atoms and atoms of a Group V element atoms.

For the purpose of executing the annealing in the gas atmosphere containing a trace amount of oxygen atoms and Group V element atoms, O$_2$/H$_2$ gas (dilution: 2 ppm) was introduced as the oxygen atom-containing gas, as well as the PH$_3$/H$_2$ gas (dilution 2000 ppm) as the gas containing Group V element atoms, into the deposition chamber 417 through the gas introduction line 429. The valves 442 and 432 were opened and the flow rate of the O$_2$/H$_2$ gas (dilution 2 ppm) was controlled to 500 sccm by means of a mass-flow controller 437. Valves 444, 434 were opened and a mass-flow controller 439 was operated to maintain the flow rate of the PH$_3$/H$_2$ gas (dilution 2000 ppm) at 500 sccm. Meanwhile, the pressure in the deposition chamber 417 was controlled to 1.0 Torr by a conductance valve (not shown).

The annealing in accordance with the invention in a gas atmosphere containing trace amounts of oxygen atoms and Group V element atoms was conducted for 10 minutes, while the substrate heater 410 was controlled to maintain the substrate temperature at 350° C. Then, the supply of the O$_2$/H$_2$ gas (dilution: 2 ppm) and the PH$_3$/H$_2$ gas (dilution: 2000 ppm) into the deposition chamber 417 was stopped and the interior of the deposition chamber 417 and the gas line was evacuated to 1×10$^{-5}$ Torr.

(7) Then, an RF i-layer 151 of a-Si, an MW i-layer 104 of a-SiGe, and an RF i-layer 161 of a-Si were successively formed in accordance with the steps (7-1) to (7-3) of Example A-1 under the conditions which will be described later.

(8) Then, an RF p-layer 105 of a-SiC was formed in accordance with the step (8) of Example A-1.

(9) Then, a transparent conductive layer 112 was formed on the RF p-layer 105, and a comb-shaped collector electrode 113 of Cr(40 nm)/Ag(1000 nm)/Cr(40 nm) was formed thereon by vacuum evaporation, in accordance with the steps (9) and (10) of Example A-1.

Fabrication of the photovoltaic element of this example (element of the type shown in FIG. 1) was thus completed. This element will be referred to as "SC/C-1". The conditions of the annealing in gas atmosphere containing trace amount of oxygen atoms and trace amount of Group V element atoms in this example, as well as the conditions of film-forming processes for forming the RF n-layer, RF i-layer, MW i-layer and RF-p layer are collectively shown in Tables 114 and 115.

TABLE 114

CONDITIONS OF ANNEALING IN GAS ATMOSPHERE CONTAINING TRACE AMOUNT OF OXYGEN ATOMS AND GAS CONTAINING TRACE AMOUNT OF GROUP V ELEMENT ATOMS

| | |
|---|---|
| Type of gas containing trace amount of oxygen atoms | O$_2$/H$_2$ |
| Concentration of trace amount of oxygen atoms in whole annealing gas (ppm) | 1 |
| Type of gas containing trace amount of Group V element atoms | PH$_3$/H$_2$ |
| Concentration of trace amount of Group V element atoms in whole annealing gas (ppm) | 1000 |
| Annealing temp. (° C.) | 350 |
| Annealing press. (Torr) | 1.0 |

TABLE 115

| SC Ex. 1 | SiH₄ flow rate sccm | Si₂H₆ flow rate sccm | CH₄ flow rate sccm | GeH₄ flow rate sccm | H₂ flow rate sccm | PH₃/H₂ flow rate sccm | B₂H₆/H₂ flow rate sccm | SIH₄/H₂ flow rate sccm | Press. Torr | MW Power W/cm² | RF Power W/cm² | Substrate temp. ° C. | Film thickness nm |
|---|---|---|---|---|---|---|---|---|---|---|---|---|---|
| RF n-layer | 2 | | | | 100 | 10 | | | 1.0 | | 0.05 | 350 | 20 |
| RF i-layer | | 4 | | | 110 | | | | 0.7 | | 0.008 | 300 | 10 |
| MW i-layer | 50 | | | 47 | 200 | | | | 0.005 | 0.10 | 0.30 | 380 | 170 |
| RF i-layer | | 3 | | | 80 | | | | 0.7 | | 0.007 | 250 | 20 |
| RF p-layer | | | 0.3 | | 60 | | 10 | 2 | 2.0 | | 0.07 | 230 | 10 |

Comparative Example C 1-1

A process was conducted as Comparative Example C1-1. This process was different from Example C-1 in that it omitted the annealing in the gas atmosphere containing trace amount of oxygen atoms and trace amount of Group V element atoms.

Other conditions were materially the same as those in Example C1. The photovoltaic element produced in Comparative Example C1-1 will be referred to as "SC/CC1-1".

Seven samples of the photovoltaic elements SC/C-1, as well as seven samples of the photovoltaic elements SC/CC1-1, were produced and were subjected, basically in the same way as that in Example A-1 and Comparative Example A1-1, to measurement and evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The results are shown in Table 116. The variation of photoelectric conversion efficiency was evaluated in terms of variation of efficiency among 7 samples of each type of element. The photo-degradation was measured by setting the element temperature to 45° C. and the time of photo-irradiation to 1200 hours, while the anti-environment test was conducted by setting the atmosphere temperature to 82° C. and humidity to 85%.

The performance of the photovoltaic element is shown in Table 116 in terms of values measured on the samples of the photovoltaic element SC/C-1 as normalized by the values measured on the samples of the photovoltaic element SC/CC1-1.

TABLE 116

| Items of evaluation | Evaluation |
|---|---|
| Initial photoelectric conversion efficiency characteristic | 1.28 |
| Variation of Initial photoelectric conversion efficiency characteristic | 0.89 |
| Photo-degradation characteristic | 0.88 |
| Anti-environment characteristic | 0.86 |
| SEM observation of sectional face | 0.94 |
| Measurement of adhesion: Delamination | No delamination in SC/C-1 Slight delamination in SC/CC1-1 |

From the results shown in Table 115, it will be seen that all the sample photovoltaic elements SC/C-1 in accordance with Example C-1 exhibit superiority to the sample photovoltaic elements SC/CC1-1 of Comparison Example C1-1 in all items of evaluation.

EXAMPLE C-2

In this Example, a photovoltaic element of the tandem type shown in FIG. 2 was manufactured by using an in-line type apparatus shown in FIG. 4, in accordance with the following procedure.

(1) A substrate having a reflecting layer 201 and a reflection enhancement layer 202 formed thereon (i.e. base member), prepared in the same way as that in Example C-1, was disposed on a substrate conveyor rails 413 laid in a load chamber 401, and the internal pressure of the load chamber 401 we as lowered to $1 \times 10^{-5}$ Torr. by a vacuum pump (not shown).

(2) Then, a gate valve 406 was opened and the substrate was conveyed into a conveyance chamber 402 and then into a deposition chamber 417 which had been evacuated to certain levels of vacuum by vacuum pumps which are not shown. The substrate was held such that its reverse side is kept in close contact with a substrate heater 410 so as to be heated by the heater 410, while the interior of the deposition chamber 417 was evacuated by the vacuum pump to a level of $1 \times 10^{-5}$ Torr.

(3) Preparation for film forming operation was thus completed. Then, H₂ gas was introduced into the deposition chamber 417 through a gas-introduction line 429 and the flow rate of the H₂ gas was controlled to 500 sccm by means of valves 441, 431, 430, under the control of a mass-flow controller 436. At the same time, the internal pressure of the deposition chamber 417 was regulated to 1.0 Torr. by a conductance valve (not shown). Meanwhile, the substrate heater 410 was adjusted to maintain the substrate temperature at 350° C.

(4) An RF n-layer 203 of μc-Si was formed when the substrate temperature has become steady.

To this end, valves 443, 433, 444 and 434 were operated to introduce the SiH₄ gas and PH₃/H₂ gas into the deposition chamber 417 through the gas introduction line 429. Flow rates of the SiH₄ gas, H₂ gas and the PH₃/H₂ gas were controlled to 2 sccm, 100 sccm and 10 sccm, respectively, by means of the mass-flow controllers 438, 436 and 439, while the pressure in the deposition chamber 417 was controlled to 1.0 Torr.

The power of an RF power supply 422 was set to 0.05 W/cm², and RF power was introduced from this power supply into a plasma-forming cup 420, so as to trigger a glow discharge, thereby starting formation of the RF n-layer on the substrate. The RF power was turned off when the thickness of the RF n-layer has reached 20 nm, thus terminating the glow discharge to complete the formation of the RF n-layer. The supply of the SiH₄ gas, PH₃/H₂ gas and H₂ gas into the deposition chamber 417 was stopped and the interior of the deposition chamber and the gas line were evacuated to 1×10$^{-5}$ Torr.

(5) Then, an annealing was executed in accordance with the present invention in an atmosphere of a gas containing a trace amount of oxygen atoms and trace amount of Group V element atoms.

For the purpose of executing the annealing in the gas atmosphere containing a trace amount of oxygen atoms and trace amount of Group V element: atoms, O$_2$/He gas (dilution: 10 ppm) as the oxygen atom-containing gas and PH$_3$/H$_2$ gas (dilution: 2000 ppm ) as the gas containing trace amount of Group V element atoms were introduced into the deposition chamber 417 through the gas introduction line 429. The valves 442 and 432 were opened and the flow rate of the O$_2$/He gas (dilution: 10 ppm) was controlled to 500 sccm by means of a mass-flow controller 437. Valves 444, 432 were opened and a mass-flow controller 439 was operated so as to maintain the flow rate of the PH$_3$/H$_2$ gas (dilution: 2000 ppm) at 500 sccm. Meanwhile, the pressure in the deposition chamber 417 was controlled to 1.5 Torr by a conductance valve (not shown).

TABLE 117

CONDITIONS OF ANNEALING IN GAS ATMOSPHERE CONTAINING TRACE AMOUNT OF OXYGEN ATOMS AND GAS CONTAINING TRACE AMOUNT OF GROUP V ELEMENT ATOMS

| | |
|---|---|
| Type of gas containing trace amount of oxygen atoms | O$_2$/He |
| Concentration of trace amount of oxygen atoms in whole annealing gas (ppm) | 5 |
| Type of gas containing trace amount of Group V element atoms | PH$_3$/H$_2$ |
| Concentration of trace amount of Group V element atoms in whole annealing gas (ppm) | 1000 |
| Annealing temp. (° C.) | 350 |
| Annealing press. (Torr) | 1.3 |

TABLE 118

| | SiH$_4$ flow rate sccm | Si$_2$H$_6$ flow rate sccm | CH$_4$ flow rate sccm | GeH$_4$ flow rate sccm | H$_2$ flow rate sccm | PH$_3$/H$_2$ flow rate sccm | B$_2$H$_6$/H$_2$ flow rate sccm | SiH$_4$/H$_2$ flow rate sccm | Press. Torr | MW Power W/cm$^2$ | RF Power W/cm$^2$ | Substrate temp. ° C. | Film thickness nm |
|---|---|---|---|---|---|---|---|---|---|---|---|---|---|
| RF n-layer | 2 | | | | 100 | 10 | | | 1.0 | | 0.05 | 350 | 20 |
| RF i-layer | | 4 | | | 110 | | | | 0.7 | | 0.008 | 300 | 10 |
| MW i-layer | 50 | | | 53 | 250 | | | | 0.006 | 0.10 | 0.25 | 380 | 150 |
| RF i-layer | | 3 | | | 80 | | | | 0.7 | | 0.007 | 250 | 20 |
| RF p-layer | | | 0.3 | | 60 | | 10 | 2 | 2.0 | | 0.07 | 230 | 10 |
| RF n-layer | 2.5 | | | | 50 | 15 | | | 1.0 | | 0.04 | 225 | 10 |
| RF i-layer | | 2.5 | | | 80 | | | | 0.6 | | 0.007 | 200 | 120 |
| RF p-layer | | | 0.3 | | 60 | | 10 | 2 | 2.0 | | 0.07 | 170 | 10 |

The annealing in accordance with the invention in a gas atmosphere containing trace amount of oxygen atoms and trace amount of Group V element atoms was conducted for 10 minutes, while the substrate heater 410 was controlled to maintain the substrate temperature at 350° C. Then, the supply of the O$_2$/He gas (dilution: 10 ppm) and the PH$_3$/H$_2$ gas (dilution: 2000 ppm) into the deposition chamber 417 was stopped and the interior of the deposition chamber 417 and the gas line was evacuated to 1×10$^{-5}$ Torr.

Then, an RF i-layer 251 of a-Si, an MW i-layer 204 of a-SiGe, an RF i-layer 261 of a-Si, an RF p-layer 205 of a-SiC, an RF n-layer 206 of pc-Si, an RF i-layer 207 of a-Si and an RF p-layer 208 of a-SiC were successively formed, in accordance with the steps (6-1) to (6-8) of Example A-2, under the conditions which will be described later. A transparent conductive layer 212 was formed on the RF p-layer, followed by formation of a collector electrode 213 thereon, in accordance with the steps (7) to (9) of Example A-2.

Fabrication of the photovoltaic element of this example was thus completed. This element will be referred to as "SC/C-2". The conditions of the annealing in gas atmosphere containing trace amount of oxygen atoms and Group V element atoms in this example, as well as the conditions of film-forming processes for forming the RF n-layer, RF i-layer, MW i-layer and. RF-p layer are collectively shown in Tables 117 and 118.

Comparative Example C 2-1

A process was conducted as Comparative Example C 2-1. This process was different from Example C-2 in that it omitted the annealing in the gas atmosphere containing trace amount of oxygen atoms and trace amount of Group V element atoms.

Other conditions were materially the same as those in Example C-2. The photovoltaic element produced in Comparative Example C 2-1 will be referred to as "SC/CC2-1".

Seven samples of the photovoltaic elements SC/C-2, as well as seven samples of the photovoltaic elements SC/CC2-1, were produced and were subjected, basically in the same way as Example A-1 and Comparative Example A1-1, to measurement and evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The photo-degradation was measured by setting the element temperature to 35° C., while the anti-environment test was conducted by setting the atmosphere temperature to 85° C. and humidity to 90%. The results are shown in Table 119.

The performance of the photovoltaic element is shown in Table 119 in terms of values measured on the samples of the photovoltaic element SC/C-2 as normalized by the values measured on the samples of the photovoltaic element SC/CC2-1.

TABLE 119

| Items of evaluation | Evaluation |
| --- | --- |
| Initial photoelectric conversion efficiency characteristic | 1.28 |
| Variation of Initial photoelectric conversion efficiency characteristic | 0.89 |
| Photo-degradation characteristic | 0.86 |
| Anti-environment characteristic | 0.85 |
| SEM observation of sectional face | 0.93 |
| Measurement of adhesion: Delamination | No delamination in SC/C-2 Slight delamination in SC/CC2-1 |

From the results shown in Table 119, it will be seen that all the sample photovoltaic elements SC/C-2 in accordance with Example C-2 exhibit superiority to the sample photovoltaic elements SC/CC2-1 of Comparison Example C2-1 in all items of evaluation.

EXAMPLE C-3

In this Example, a photovoltaic element of the triple type shown in FIG. 3 was manufactured by using an in-line type apparatus shown in FIG. 4, in accordance with the following procedure.

(1) A substrate having a reflecting layer 301 and a reflection enhancement layer 302 formed thereon (i.e. base member), prepared in the same way as that in Example C-1, was disposed on a substrate conveyor rails 413 laid in a load chamber 401, and the internal pressure of the load chamber 401 was lowered to $1\times10^{-5}$ Torr. by a vacuum pump (not shown).

(2) Then, gate valves 406 and 407 were opened and the substrate was conveyed into conveyance chambers 402, 403 and then into a deposition chamber 418 which have been evacuated to certain levels of vacuum by vacuum pumps which are not shown. The substrate was held such that its reverse side is kept in close contact with a substrate heater 411 so as to be heated by the heater 411, while the interior of the deposition chamber 418 was evacuated by the vacuum pump to a level of $1\times10^{-5}$ Torr.

(3) Preparation for film forming operation was thus completed. Then, $H_2$ gas was introduced into the deposition chamber 417 through a gas-introduction line 429 and the flow rate of the $H_2$ gas was controlled to 500 sccm by means of valves 441, 431, 430, under the control of a mass-flow controller 436. At the same time, the internal pressure of the deposition chamber 417 was regulated to 1.3 Torr. by a conductance valve (not shown). Meanwhile, the substrate heater 410 was adjusted to maintain the substrate temperature at 350° C. An RF n-layer 303 of $\mu c$-Si was formed when the substrate temperature became steady.

(4) To this end, valves 443, 433, 444 and 434 were operated to introduce the $SiH_4$ gas and $PH_3/H_2$ gas into the deposition chamber 417 through the gas introduction line 429. Flow rates of the $SiH_4$ gas, $H_2$ gas and the $PH_3/H_2$ gas were controlled to 2 sccm, 100 sccm and 200 sccm, respectively, by means of the mass-flow controllers 438, 436 and 439, while the pressure in the deposition chamber 417 was controlled to 1.3 Torr.

The power of an RF power supply 422 was set to 0.05 W/cm², and RF power was introduced from this power supply into a plasma-forming cup 420, so as to trigger a glow discharge, thereby starting formation of the RF n-layer on the substrate. The RF power was turned off when the thickness of the RF n-layer reached 20 nm, thus terminating the glow discharge to complete the formation of the RF n-layer 303. The supply of the $SiH_4$ gas, $PH_3/H_2$ gas and $H_2$ gas into the deposition chamber 417 was stopped and the interior of the deposition chamber and the gas line were evacuated to $1\times10^{-5}$ Torr.

(5) Then, an annealing was executed in an atmosphere of a gas containing a trace amount of oxygen atoms and a trace amount of Group V element atoms.

For the purpose of executing the annealing in the gas atmosphere containing a trace amount of oxygen atoms and a trace amount of Group V element atoms, $O_2$/Ar gas (dilution: 100 ppm) as the gas containing oxygen atoms and $PH_3/H_2$ gas (dilution: 1000 ppm) was the gas containing trace amount of Group V element atoms were introduced into the deposition chamber 417 through the gas introduction line 429. The valves 442 and 432 were opened and the flow rate of the $O_2$/Ar gas (dilution: 100 ppm) was controlled to 500 sccm by means of a mass-flow controller 437. Valves 443, 444 were opened and a mass-flow controller 437 was operated so as to control the flow rate of $PH_3/H_2$ gas (dilution: 1000 ppm), to 500 sccm. Meanwhile, the pressure in the deposition chamber 417 was controlled to 1.5 Torr by a conductance valve (not shown).

The annealing in accordance with the invention in a gas atmosphere containing trace amount of oxygen atoms and trace amount of Group V element atoms was conducted for 10 minutes, while the substrate heater 410 was controlled to maintain the substrate temperature at 350° C. Then, the supply of the $O_2$/Ar gas (dilution: 100 ppm) and the $PH_3/H_2$ gas (dilution: 1000 ppm) into the deposition chamber 417 was stopped and the interior of the deposition chamber 417 and the gas line was evacuated to $1\times10^{-5}$ Torr.

(6) Then, an RF i-layer 351 of a-Si, an MW i-layer 304 of a-SiGe, an RF i-layer 361 of a-Si, an RF p-layer 305 of a-SiC, an RF n-layer 306 of $\mu c$-Si, an RF i-layer 352 of a-Si, an MW i-layer 307 of a-SiGe, an RF i-layer 362 of a-Si, an RF p-layer 308 of a-SiC, an RF n-layer 309 of $\mu c$-Si, an RF i-layer 310 of a-Si, and an RF p-layer 311 of a-SiC were successively formed, in accordance with a procedure which is substantially the same as that used in, Example C-2, i.e., in the same way as that in Example A-1.

(7) Then, an ITO film of 70 nm thick, serving as a transparent conductive layer 312, was formed on the RF p-layer 311 by vacuum evaporation. (8) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of the present invention was thus completed. This element will be referred to as "SC/C-3". The conditions of the annealing in gas atmosphere containing trace amount of oxygen atoms and trace amount of Group V element atoms in this example, as well as the conditions of film-forming processes for forming the RF n-layer, RF i-layer, MW i-layer and RF-p layer are collectively shown in Tables 120 and 121.

TABLE 120

CONDITIONS OF ANNEALING IN GAS ATMOSPHERE CONTAINING TRACE AMOUNT OF OXYGEN ATOMS AND GAS CONTAINING TRACE AMOUNTS OF GROUP V ELEMENT ATOMS

| | |
|---|---|
| Type of gas containing trace amount of oxygen atoms | $O_2/Ar$ |
| Concentration of trace amount of oxygen atoms in whole annealing gas (ppm) | 50 |
| Type of gas containing trace amount of Group V element atoms | $PH_3/H_2$ |
| Concentration of trace amount of Group V element atoms in whole annealing gas (ppm) | 500 |
| Annealing temp. (° C.) | 350 |
| Annealing press. (Torr) | 1.5 |

TABLE 121

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer (303) | 2.0 | | | | 100 | 20 | | | 1.3 | | 0.05 | 350 | 20 |
| RF i-layer (351) | | 4.0 | | | 100 | | | | 0.8 | | 0.008 | 300 | 10 |
| MW i-layer (304) | 40 | | | 41 | 100 | | | | 0.010 | 0.10 | 0.31 | 370 | 100 |
| RF i-layer (361) | | 4.0 | | | 100 | | | | 0.75 | | 0.008 | 300 | 23 |
| RF p-layer (305) | | | 0.1 | | 80 | | 9 | 2 | 1.8 | | 0.07 | 300 | 10 |
| RF n-layer (306) | 1.1 | | | | 40 | 29 | | | 1.1 | | 0.04 | 300 | 10 |
| RF i-layer (352) | | 4.0 | | | 90 | | | | 0.75 | | 0.008 | 300 | 10 |
| MW i-layer (307) | 35 | | | 26 | 130 | | | | 0.013 | 0.08 | 0.3 | 350 | 100 |
| RF i-layer (362) | | 3.5 | | | 90 | | | | 0.7 | | 0.008 | 280 | 23 |
| RF p-layer (308) | | | 0.2 | | 80 | | 9 | 2 | 1.7 | | 0.07 | 260 | 10 |
| RF n-layer (309) | 0.8 | | | | 50 | 25 | | | 1.05 | | 0.04 | 230 | 10 |
| RF i-layer (310) | | 1.5 | | | 80 | | | | 0.8 | | 0.007 | 190 | 88 |
| RF p-layer (311) | | | 0.4 | | 90 | | 8 | 2 | 1.6 | | 0.07 | 170 | 10 |

Comparative Example C 3-1

A process was conducted as Comparative Example C3-1. This process was different from Example C-3 in that it omitted the annealing in the gas atmosphere containing trace amount of oxygen atoms and trace amount of Group V element atoms.

Other conditions were materially the same as those in Example C-3. The photovoltaic element produced in Comparative Example C3-1 will be referred to as "SC/CC3-1".

Eight samples of the photovoltaic elements SC/C-3, as well as eight samples of the photovoltaic elements SC/CC3-1, were produced and were subjected, basically in the same way as Example A-1 and Comparative Example A1-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion.

The photo-degradation characteristic was measured by setting the element temperature to 45° C. The anti-environment characteristic was evaluated by setting the temperature and humidity of the atmosphere to 85° C. and 90% and the time of shelving in the dark place to 250 hours. The results are shown in Table 122.

The performance of the photovoltaic element is shown in Table 122 in terms of values measured on the samples of the photovoltaic element SC/C-3 as normalized by the values measured on the samples of the photovoltaic element SC/CC3-1.

TABLE 122

| Items of evaluation | Evaluation |
|---|---|
| Initial photoelectric conversion efficiency characteristic | 1.38 |
| Variation of Initial photoelectric conversion efficiency characteristic | 0.86 |
| Photo-degradation characteristic | 0.85 |
| Anti-environment characteristic | 0.84 |
| SEM observation of sectional face | 0.94 |
| Measurement of adhesion: Delamination | No delamination in SC/C-3 Slight delamination in SC/CC3-1 |

From the results shown in Table 112,, it will be seen that all the sample photovoltaic elements SC/C-3 in accordance with Example C-3 exhibit superiority to the sample photovoltaic elements SC/CC3-1 of Comparison Example C3-1 in all items of evaluation.

EXAMPLE C-4

This Example is different from Example C-3 in that the annealing was effected on the RF i-layer 351 of a-Si, in place of the RF n-layer 303 of $\mu$c-Si. A photovoltaic element of the triple type shown in FIG. 3 was manufactured by using an in-line type apparatus shown in FIG. 4, in accordance with the following procedure.

(1) A substrate having a reflecting layer 301 and a reflection enhancement layer 302 formed thereon (i.e. base member), prepared in the same way as that in Example C-1, was disposed on a substrate conveyor rails 413 laid in a load chamber 401, and the internal pressure of the load chamber 401 was lowered to $1\times10^{-5}$ Torr. by a vacuum pump (not shown).

(2) Then, gate valves 406 and 407 were opened and the substrate was conveyed into conveyance chambers 402 403 and then into a deposition chamber 418 which had been evacuated to certain levels of vacuum by vacuum pumps which are not shown. The substrate was held such that its reverse side is kept in close contact with a substrate heater 411 so as to be heated by the heater 411, while the interior of the deposition chamber 418 was evacuated by the vacuum pump to a level of $1\times10^{-5}$ Torr.

(3) Preparation for film forming operation was thus completed. Then, $H_2$ gas was introduced into the deposition chamber 417 through a gas-introduction line 429 and the flow rate of the $H_2$ gas was controlled to 500 sccm by means of valves 441, 431, 430, under the control of a mass-flow controller 436. At the same time, the internal pressure of the deposition chamber 417 was regulated to 1.3 Torr. by a conductance valve (not shown). Meanwhile, the substrate heater 410 was adjusted to maintain the substrate temperature at 350° C. An RF n-layer 303 of $\mu$c-Si, an RF i-layer 351 of a-Si, an MW i-layer 304 of a-SiGe and RF i-layer became steady.

(4) Then, an annealing was executed in an atmosphere of a gas containing a trace amount of oxygen atoms and a trace amount of Group V element atoms.

For the purpose of executing the annealing in the gas atmosphere containing a trace amount of oxygen atoms and a trace amount of Group V element atoms, $O_2$/Ar gas (dilution: 100 ppm) as the gas containing oxygen atoms and $PF_5/H_2$ gas (dilution: 100 ppm) were introduced into the deposition chamber 418 through the gas introduction line 449. The valves 465 and 455 were opened and the flow rate of the $O_2$/Ar gas (dilution: 100 ppm) was controlled to 500 sccm by means of a mass-flow controller 460. Valves and a mass-flow controller (not shown) were operated so as to control the flow rate of the $PF_5/H_2$ gas (dilution: 100 ppm) to 500 sccm. Meanwhile, the pressure in the deposition chamber 418 was controlled to 1.5 Torr by a conductance valve (not shown).

The annealing in accordance with the invention in a gas atmosphere containing trace amount of oxygen atoms and trace amount of Group V element atoms was conducted for 10 minutes, while the substrate heater 411 was controlled to maintain the substrate temperature at 300° C. Then, the supply of the $O_2$/Ar gas (dilution: 100 ppm) and $PF_5/H_2$ gas (dilution: 100 ppm) into the deposition chamber 418 was stopped and the interior of the deposition chamber 418 and the gas line was evacuated to $1\times10^{-5}$ Torr.

(5) Then, an RF p-layer 305 of a-SiC, an RF n-layer of $\mu$c-Si, an RF i-layer 352 of a-Si, an MW i-layer 307 of a-SiGe, an RF i-layer 362 of a-Si, an RF p-layer 308 of a-SiC, an RP n-layer 309 of $\mu$c-Si, an RF i-layer 310 of a-Si, and an RF p-layer 311 of a-SiC were successively formed, in accordance with a procedure which is substantially the same as that used in Example C-2, i.e., in the same way as that in Example A-2.

(6) Then, an ITO film of 70 nm thick, serving as a transparent conductive layer 312, was formed on the RF p-layer 311 by vacuum evaporation.

(7) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of the present invention was thus completed. This element will be referred to as "SC/C-4". The conditions of the annealing in gas atmosphere containing trace amount of oxygen atoms and trace amount of Group V element atoms in this example, as well as the conditions of film-forming processes for forming the RF n-layer, RF i-layer, MW i-layer and RF-p layer are collectively shown in Tables 123 and 124.

TABLE 123

CONDITIONS OF ANNEALING IN GAS ATMOSPHERE CONTAINING TRACE AMOUNT OF OXYGEN ATOMS AND GAS CONTAINING TRACE AMOUNT OF GROUP V ELEMENT ATOMS

| | |
|---|---|
| Type of gas containing trace amount of oxygen atoms | $O_2$/Ar |
| Concentration of trace amount of oxygen atoms in whole annealing gas (ppm) | 50 |
| Type of gas containing trace amount of Group V element atoms | $PH_5/H_2$ |
| Concentration of trace amount of Group V element atoms in whole annealing gas (ppm) | 50 |
| Annealing temp. (° C.) | 300 |
| Annealing press. (Torr) | 1.5 |

TABLE 124

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 200 | | | 1.3 | | 0.05 | 350 | 20 |
| RF i-layer | | 4.0 | | | 100 | | | | 0.8 | | 0.008 | 300 | 10 |
| MW i-layer | 50 | | | 51 | 150 | | | | 0.010 | 0.10 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |

TABLE 124-continued

|  | SiH$_4$ flow rate sccm | Si$_2$H$_6$ flow rate sccm | CH$_4$ flow rate sccm | GeH$_4$ flow rate sccm | H$_2$ flow rate sccm | PH$_3$/H$_2$ flow rate sccm | B$_2$H$_6$/H$_2$ flow rate sccm | SIH$_4$/H$_2$ flow rate sccm | Press. Torr | MW Power W/cm$^2$ | RF Power W/cm$^2$ | Substrate temp. °C. | Film thickness nm |
|---|---|---|---|---|---|---|---|---|---|---|---|---|---|
| RF n-layer | 1.1 |  |  |  | 40 | 290 |  |  | 1.1 |  | 0.04 | 300 | 10 |
| RF i-layer |  | 4.0 |  |  | 90 |  |  |  | 0.75 |  | 0.008 | 300 | 10 |
| MW i-layer | 33 |  |  | 28 | 150 |  |  |  | 0.013 | 0.10 | 0.3 | 350 | 10 |
| RF i-layer |  | 3.5 |  |  | 90 |  |  |  | 0.7 |  | 0.008 | 280 | 23 |
| RF p-layer |  |  | 0.2 |  | 80 |  | 9 | 2 | 1.7 |  | 0.07 | 260 | 10 |
| RF n-layer | 0.8 |  |  |  | 50 | 250 |  |  | 1.05 |  | 0.04 | 230 | 10 |
| RF i-layer |  | 1.5 |  |  | 80 |  |  |  | 0.8 |  | 0.007 | 190 | 88 |
| RF p-layer |  |  | 0.4 |  | 90 |  | 8 | 2 | 1.6 |  | 0.07 | 170 | 10 |

Comparative Example C 4-1

A process was conducted as Comparative Example C 4-1. This process was different from Example C-4 in that it omitted the annealing in the gas atmosphere containing trace amount of oxygen atoms and trace amount of Group V element atoms.

Other conditions were materially the same as those in Example C-4. The photovoltaic element produced in Comparative Example B 4-1 will be referred to as "SC/CC4-1".

Eight samples of the photovoltaic elements SC/C-4, as well as eight samples of the photovoltaic elements SC/CC4-1, were produced and were subjected, basically in the same way as Example A-1 and Comparative Example A1-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The photo-degradation characteristic was measured by setting the element temperature to 38° C. and irradiation time to 1100 hours. The anti-environment characteristic was evaluated by setting the temperature to 85° C., the humidity to 92% and the time of shelving in the dark place to 250 hours. The results are shown in Table 125.

The performance of the photovoltaic element is shown in Table 125 in terms of values measured on the samples of the photovoltaic element SC/C-4 as normalized by the values measured on the samples of the photovoltaic element SC/CC4-1.

TABLE 125

| Items of evaluation | Evaluation |
|---|---|
| Initial photoelectric conversion efficiency characteristic | 1.45 |
| Variation of Initial photoelectric conversion efficiency characteristic | 0.83 |
| Photo-degradation characteristic | 0.83 |
| Anti-environment characteristic | 0.84 |
| SEM observation of sectional face | 0.93 |
| Measurement of adhesion: Delamination | No delamination in SC/C-4 Slight delamination in SC/CC4-1 |

From the results shown in Table 125, it will be seen that all the sample photovoltaic elements SC/C-4 in accordance with Example C-4 exhibit superiority to the sample photovoltaic elements SC/CC4-1 of Comparison Example C4-1 in all items of evaluation.

EXAMPLE C-5

This Example is different from Example C-3 in that the annealing was effected on the MW i-layer 304 of a-SiGe, in place of the RF n-layer 303 of μc-Si. As in Example C-3, a photovoltaic element of the triple type shown in FIG. 3 was manufactured by using an in-line type apparatus shown in FIG. 4, in accordance with the following procedure.

(1) A substrate having a reflecting layer 301 and a reflection enhancement layer 302 formed thereon (i.e. base member), prepared in the same way as that in Example C-1, was disposed on a substrate conveyor rails 413 laid in a load chamber 401, and the internal pressure of the load chamber 401 was lowered to 1×10$^{-5}$ Torr. by a vacuum pump (not shown).

(2) Then, gate valves 406 and 407 were opened and the substrate was conveyed into conveyance chambers 402, 403 and then into a deposition chamber 418 which have been evacuated to certain levels of vacuum by vacuum pumps which are not shown. The substrate was held such that its reverse side is kept in close contact with a substrate heater 411 so as to be heated by the heater 411, while the interior of the deposition chamber 418 was evacuated by the vacuum pump to a level of 1×10$^{-5}$ Torr.

(3) Preparation for film forming operation was thus completed. Then, H$_2$ gas was introduced into the deposition chamber 417 through a gas-introduction line 429 and the flow rate of the H$_2$ gas was controlled to 500 sccm by means of valves 441, 431, 430, under the control of a mass-flow controller 436. At the same time, the internal pressure of the deposition chamber 417 was regulated to 1.3 Torr. by a conductance valve (not shown). Meanwhile, the substrate heater 410 was adjusted to maintain the substrate temperature at 350° C. An RF n-layer 303 of μc-Si and an RF i-layer 351 of a-Si were formed when the substrate temperature became steady.

(4) Then, an annealing was executed in an atmosphere of a gas containing a trace amount of oxygen atoms and a trace amount of Group V element atoms.

For the purpose of executing the annealing in the gas atmosphere containing a trace amount of oxygen atoms and a trace amount of Group V element atoms, O$_2$/H$_2$ gas (dilution: 2 ppm) as the gas containing oxygen atoms, PH$_3$H$_2$ gas (dilution: 8 ppm) as the gas containing trace amount of Group V element atoms, and B$_2$H$_6$/H$_2$ gas (dilution: 4 ppm) as the gas containing trace amount of Group III element were introduced into the deposition chamber 418 through the gas introduction line 449. The valves 465 and 455 were opened and the flow rate of the O$_2$/H$_2$ gas (dilution: 2 ppm) was controlled to 500 sccm by means of a mass-flow controller 460. The flow rate of the PH$_3$/H$_2$ gas (dilution: 8 ppm) gas was controlled to 250 scam by means of valves and a mass-flow controller which are not shown. The flow rate of the B$_2$H$_6$/H$_2$ gas (dilution: 4 ppm) was also controlled to 250 sccm by means of valves and a mass-flow controller which also are not shown. Meanwhile, the pressure in the deposition chamber 418 was controlled to 1.5 Torr by a conductance valve (not shown).

The annealing in accordance with the invention in a gas atmosphere containing trace amount of oxygen atoms and trace amount of Group V element atoms was conducted for 10 minutes, while the substrate heater 411 was controlled to maintain the substrate temperature at 300° C. Then, the supply of the O$_2$/H$_2$ gas (dilution: 2 ppm), PH$_3$/H$_2$ gas (dilution: 8 ppm) gas and the B$_2$H$_6$/H$_2$ gas (dilution: 4 ppm) into the deposition chamber 418 was stopped and the interior of the deposition chamber 418 and the gas line was evacuated to 1×10$^{-5}$ Torr.

Then, an MW i-layer 304 of a-SiGe, an RF i-layer 361 of a-Si, an RF p-layer 305 of a-SiC, an RF n-layer 306 of μc-Si, an RF i-layer 352 of a-Si, an MW i-layer 307 of a-SiGe, an RF i-layer 362 of a-Si, an RF p-layer 308 of a-SiC, an RF n-layer 309 of μc-Si, an RF i-layer 310 of a-Si, and an RF p-layer 311 of a-SiC were successively formed, in accordance with a procedure which is substantially the same as that used in Example C-2, i.e., in the same way as that in Example A-2.

(6) Then, an ITO film of 70 nm thick, serving as a transparent conductive layer 312, was formed on the RF player 311 by vacuum evaporation.

(7) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of the present invention was thus completed. This element will be referred to as "SC/C-5". The conditions of the annealing in gas atmosphere containing trace amount of oxygen atoms and trace amount of Group V element atoms in this example, as well as the conditions of film-forming processes for forming the RF n-layer, RF i-layer, MW i-layer and RF-p layer are collectively shown in Tables 126 and 127.

TABLE 126

CONDITIONS OF ANNEALING IN ATMOSPHERE FORMED OF GAS CONTAINING TRACE AMOUNT OF OXYGEN ATOMS AND GAS CONTAINING TRACE AMOUNT OF GROUP V ELEMENT ATOMS

| | |
|---|---|
| Type of gas containing trace amount of oxygen atoms | O$_2$/H$_2$ |
| Concentration of trace amount of oxygen atoms in whole annealing gas (ppm) | 1 |
| Type of gas containing trace amount of Group V element atoms | PH$_3$/H$_2$ |
| Concentration of trace amount of Group V element atoms in whole annealing gas (ppm) | 2 |
| Type of gas containing trace amount of Group III element atoms (ppm) | B$_2$H$_6$/H$_2$ |
| Concentration of trace amount of Group III element atoms in whole annealing gas (ppm) | 1 |
| Annealing temp. (° C.) | 300 |
| Annealing press. (Torr) | 1.5 |

TABLE 127

| | SiH$_4$ flow rate sccm | Si$_2$H$_6$ flow rate sccm | CH$_4$ flow rate sccm | GeH$_4$ flow rate sccm | H$_2$ flow rate sccm | PH$_3$/H$_2$ flow rate sccm | B$_2$H$_6$/H$_2$ flow rate sccm | SlH$_4$/H$_2$ flow rate sccm | Press. Torr | MW Power W/cm$^2$ | RF Power W/cm$^2$ | Substrate temp. ° C. | Film thickness nm |
|---|---|---|---|---|---|---|---|---|---|---|---|---|---|
| RF n-layer | 2.0 | | | | 100 | 200 | | | 1.3 | | 0.05 | 350 | 20 |
| RF i-layer | | 4.0 | | | 100 | | | | 0.8 | | 0.008 | 300 | 10 |
| MW i-layer | 50 | | | 51 | 130 | | | | 0.010 | 0.10 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 32 | | | 29 | 120 | | | | 0.013 | 0.11 | 0.3 | 350 | 100 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 1.5 | | | 80 | | | | 0.8 | | 0.007 | 190 | 90 |
| RF p-layer | | | 0.4 | | 90 | | 8 | 2 | 1.6 | | 0.07 | 170 | 10 |

Comparative Example C 5-1

A process was conducted as Comparative Example C5-1. This process was different from Example C-5 in that it omitted the annealing in the gas atmosphere containing trace amount of oxygen atoms and trace amount of Group V element atoms.

Other conditions were materially the same as those in Example C-5. The photovoltaic element produced in Comparative Example C 5-1 will be referred to as "SC/CC5-1".

Six samples of the photovoltaic elements SC/C-5, as well as six samples of the photovoltaic elements SC/CC5-1, were produced and were subjected, basically in the same way as Example A-1 and Comparative Example A1-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The photo-degradation was evaluated by setting the element temperature to 43° C. and the photo-irradiation time to 1100 hours. The anti-environment characteristic was evaluated by setting the temperature to 86° C., the humidity to 90% and the time of shelving in the dark place to 250 hours. The results are shown in Table 128.

The performance of the photovoltaic element is shown in Table 128 in terms of values measured on the samples of the photovoltaic element SC/C-5 as normalized by the values measured on the samples of the photovoltaic element SC/CC5-1.

TABLE 128

| Items of evaluation | Evaluation |
| --- | --- |
| Initial photoelectric conversion efficiency characteristic | 1.38 |
| Variation of Initial photoelectric conversion efficiency characteristic | 0.86 |
| Photo-degradation characteristic | 0.84 |
| Anti-environment characteristic | 0.84 |
| SEM observation of sectional face | 0.93 |
| Measurement of adhesion: Delamination | No delamination in SC/B-6 Slight delamination in SC/CB6-1 |

From the results shown in Table 128, it will be seen that all the sample photovoltaic elements SC/C-5 in accordance with Example C-5 exhibit superiority to the sample photovoltaic elements SC/CC5-1 of Comparison Example C5-1 in all items of evaluation.

EXAMPLE C-6

This Example is different from Example C-3 in that the annealing was effected on the RF i-layer 361 of a-Si, in place of the RF n-layer 303 of $\mu$c-Si. A photovoltaic element of the triple type shown in FIG. 3 was manufactured by using an in-line type apparatus shown in FIG. 4, in accordance with the following procedure.

(1) A substrate having a reflecting layer 301 and a reflection enhancement layer 302 formed thereon (i.e. base member), prepared in the same way as that in Example C-1, was disposed on a substrate conveyor rails 413 laid in a load chamber 401, and the internal pressure of the load chamber 401 was lowered to $1 \times 10^{-5}$ Torr. by a vacuum pump (not shown).

(2) Then, gate valves 406 and 407 were opened and the substrate was conveyed into conveyance chambers 402, 403 and then into a deposition chamber 418 which have been evacuated to certain levels of vacuum by vacuum pumps which are not shown. The substrate was held such that its reverse side is kept in close contact with a substrate heater 411 so as to be heated by the heater 411, while the interior of the deposition chamber 418 was evacuated by the vacuum pump to a level of $1 \times 10^{-5}$ Torr.

(3) Preparation for film forming operation was thus completed. Then, $H_2$ gas was introduced into the deposition chamber 417 through a gas-introduction line 429 and the flow rate of the $H_2$ gas was controlled to 500 sccm by means of valves 441, 431, 430, under the control of a mass-flow controller 436. At the same time, the internal pressure of the deposition chamber 417 was regulated to 1.3 Torr. by a conductance valve (not shown). Meanwhile, the substrate heater 410 was adjusted to maintain the substrate temperature at 350° C. An RF n-layer 303 of $\mu$c-Si, an RF i-layer 351 of a-Si, an MW i-layer 304 of a-SiGe and an RF i-layer 361 of a-Si were formed when the substrate temperature has become steady.

(4) Then, an annealing was executed in an atmosphere of a gas containing a trace amount of oxygen atoms and a trace amount of Group V element atoms.

For the purpose of executing the annealing in the gas atmosphere containing a trace amount of oxygen atoms and a trace amount of Group V element atoms, $O_2$/He gas (dilution: 2 ppm) as the gas containing oxygen atoms, $PF_5/H_2$ gas (dilution: 8 ppm) as the gas containing Group V element atoms and $BF_3/H_2$ gas (dilution: 4 ppm) as the gas containing trace amount of Group III element atoms were introduced into the deposition chamber 418 through the gas introduction line 449. The valves 465 and 455 were opened and the flow rate of the $O_2$/He gas (dilution: 2 ppm) was controlled to 500 sccm by means of a mass-flow controller 460. The flow rate of the $PF_5/H_2$ gas (dilution: 8 ppm) gas also was regulated to 250 sccm by valves and a mass-flow controller (not shown). The flow rate of the $BF3/H_2$ gas (dilution: 4 ppm) also was regulated to 250 sccm by valves and a mass-flow controller (not shown). Meanwhile, the pressure in the deposition chamber 418 was controlled to 1.3 Torr by a conductance valve (not shown).

The annealing in accordance with the invention in a gas atmosphere containing trace amount of oxygen atoms and trace amount of Group V element atoms was conducted for 10 minutes, while the substrate heater 411 was controlled to maintain the substrate temperature at 300° C. Then, the supply of the $O_2$/He gas (dilution: 2 ppm), $PF_5/H_2$ gas (dilution: 8 ppm) gas and the $BF_3/H_2$ gas (dilution: 4 ppm) into the deposition chamber 418 was stopped and the interior of the deposition chamber 418 and the gas line was evacuated to $1 \times 10^{-5}$ Torr.

Then, an RF i-layer 361 of a-Si, an RF p-layer 305 of a-SiC, an RF n-layer 306 of $\mu$c-Si, an RF i-layer 352 of a-Si, an MW i-layer 307 of a-SiGe, an RF i-layer 362 of a-Si, an RF p-layer 308 of a-SiC, an RF n-layer 309 of $\mu$c-Si, an RF i-layer 310 of a-Si, and an RF p-layer 311 of a-SiC were successively formed, in accordance with a procedure which is substantially the same as that used in Example C-2, i.e., in the same way as that in Example A-2.

(6) Then, an ITO film of 70 nm thick, serving as a transparent conductive layer 312, was formed on the RF p-layer 311 by vacuum evaporation.

(7) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of this example was thus completed. This element will be referred to as "SC/C-6". The conditions of the annealing in gas atmosphere containing trace amount of oxygen atoms and trace amount of Group V element atoms in this example, as well as the conditions of film-forming processes for forming the RF n-layer, RF i-layer, MW i-layer and RF-p layer are collectively shown in Tables 129 and 130.

TABLE 129

CONDITIONS OF ANNEALING IN ATMOSPHERE FORMED OF GAS CONTAINING TRACE AMOUNT OF OXYGEN ATOMS AND GAS CONTAINING TRACE AMOUNT OF GROUP V ELEMENT ATOMS

| | |
|---|---|
| Type of gas containing trace amount of oxygen atoms | $O_2/He$ |
| Concentration of trace amount of oxygen atoms in whole annealing gas (ppm) | 1 |
| Type of gas containing trace amount of Group V element atoms | $PF_5/H_2$ |
| Concentration of trace amount of Group V element atoms in whole annealing gas (ppm) | 2 |
| Type of gas containing trace amount of Group III element atoms (ppm) | $BF_3/H_2$ |
| Concentration of trace amount of Group III element atoms in whole annealing gas (ppm) | 1 |
| Annealing temp. (° C.) | 310 |
| Annealing press. (Torr) | 1.3 |

TABLE 130

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 200 | | | 1.3 | | 0.05 | 350 | 20 |
| RF i-layer | | 4.0 | | | 100 | | | | 0.8 | | 0.008 | 300 | 10 |
| MW i-layer | 47 | | | 51 | 110 | | | | 0.010 | 0.09 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 31 | | | 27 | 120 | | | | 0.013 | 0.08 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 80 | | | | 0.8 | | 0.007 | 190 | 90 |
| RF p-layer | | | 0.4 | | 90 | | 8 | 2 | 1.6 | | 0.07 | 170 | 10 |

Comparative Example C 6-1

A process was conducted as Comparative Example C6-1. This process was different from Example C-6 in that it omitted the annealing in the gas atmosphere containing trace amount of oxygen atoms and trace amount of Group V element atoms.

Other conditions were materially the same as those in Example C-6. The photovoltaic element produced in Comparative Example C 6-1 will be referred to as "SC/CC6-1".

Six samples of the photovoltaic elements SC/C-6, as well as six samples of the photovoltaic elements SC/CC6-1, were produced and were subjected, basically in the same way as Example A-1 and Comparative Example A1-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The photo-degradation was evaluated by setting the element temperature to 43° C. The anti-environment characteristic was evaluated by setting the temperature to 86° C., the humidity of 90% and the time of shelving in the dark place to 250 hours. The results are shown in Table 131.

The performance of the photovoltaic element is shown in Table 131 in terms of values measured on the samples of the photovoltaic element SC/C-6 as normalized by the values measured on the samples of the photovoltaic element SC/CC6-1.

TABLE 131

| Items of evaluation | Evaluation |
|---|---|
| Initial photoelectric conversion efficiency characteristic | 1.48 |
| Variation of Initial photoelectric conversion efficiency characteristic | 0.84 |
| Photo-degradation characteristic | 0.84 |
| Anti-environment characteristic | 0.84 |
| SEM observation of sectional face | 0.93 |

TABLE 131-continued

| Items of evaluation | Evaluation |
|---|---|
| Measurement of adhesion: Delamination | No delamination in SC/C-6 Slight delamination in SC/CC6-1 |

From the results shown in Table 131, it will be seen that all the sample photovoltaic elements SC/C-6 in accordance with Example C-6 exhibit superiority to the sample photovoltaic elements SC/CC6-1 of Comparison Example C6-1 in all items of evaluation.

EXAMPLE C-7

This Example is different from Example C-2 in that the annealing was effected on the RF p-layer 205 of a-SiC, in place of the RF n-layer 203 of μc-Si. As in Example C-2, a photovoltaic element of tandem type shown in FIG. 2 was manufactured by using an in-line type apparatus shown in FIG. 4, in accordance with the following procedure.

(1) A substrate having a reflecting layer 201 and a reflection enhancement layer 202 formed thereon (i.e. base member), prepared in the same way as that in Example C-1, was disposed on a substrate conveyor rails 413 laid in a load chamber 401, and the internal pressure of the load chamber 401 was lowered to $1\times10^{-5}$ Torr. by a vacuum pump (not shown).

(2) Then, the gate valve 406 was opened and the substrate was conveyed into the conveyance chamber 402 and the deposition chamber 417 which had been evacuated to certain levels of vacuum by vacuum pumps which are not shown. The substrate was held such that its reverse side is kept in close contact with a substrate heater 410 so as to be heated by the heater 410, while the interior of the deposition chamber 417 was evacuated by the vacuum pump to a level of $1 \times 10^{-5}$ Torr.

(3) Preparation for film forming operation was thus completed. Then, $H_2$ gas was introduced into the deposition chamber 417 through a gas-introduction line 429 and the flow rate of the $H_2$ gas was controlled to 500 sccm by means of valves 441, 431, 430, under the control of a mass-flow controller 436. At the same time, the internal pressure of the deposition chamber 417 was regulated to 1.0 Torr. by a conductance valve (not shown). Meanwhile, the substrate heater 410 was adjusted to maintain the substrate temperature at 350° C. An RF n-layer 203 of $\mu$c-Si, an RF i-layer 251 of a-Si, an MW i-layer 204 of a-SiGe, an RF i-layer 261 of a-Si and an RF p-layer 205 of a-SiC were formed in the same method as that in Example C-2, when the substrate temperature has become steady.

(4) Then, an annealing was executed in an atmosphere of a gas containing a trace amount of oxygen atoms and a trace amount of Group V element atoms.

For the purpose of executing the annealing in the gas atmosphere containing a trace amount of oxygen atoms and Group V element atoms, $O_2/H_2$ gas (dilution: 2000 ppm) as the gas containing oxygen atoms, $PH_3/H_2$ gas (dilution: 2000 ppm) as the gas containing trace amount of Group V element atoms and $B_2H_6/H_2$ gas (dilution: 2000 ppm) as the gas containing trace amount of Group III element atoms were introduced into the deposition chamber 418 through the gas introduction line 429. The valves 442 and 432 were opened and the flow rate of the $O_2/H_2$ gas (dilution: 2000 ppm) was controlled to 500 sccm by means of a mass flow controller 436. The flow rate of the $PH_3/H_2$ gas (dilution: 2000 ppm) was regulated to 250 sccm by means of valves and a mass-flow controller which are not shown. The flow rate of the $B_2H_6/H_2$ gas (dilution: 2000 ppm) also was regulated to 250 sccm by means of valves and a mass flow controller which are not shown. Meanwhile, the pressure in the deposition chamber 417 was controlled to 1.5 Torr by a conductance valve (not shown).

The annealing in accordance with the invention in a gas atmosphere containing trace amount of oxygen atoms and trace amount of Group V element atoms was conducted for 10 minutes, while the substrate heater 410 was controlled to maintain the substrate temperature at 225° C. Then, the supply of the $O_2/H_2$ gas (dilution: 2000 ppm), $PH_3/H_2$ gas (dilution: 2000 ppm) and the $B_2H_6/H_2$ gas (dilution: 2000 ppm) into the deposition chamber 417 was stopped and the interior of the deposition chamber 417 and the gas line was evacuated to $1 \times 10^{-5}$ Torr.

(5) Then, an RF n-layer 206 of $\mu$c-S:i, an RF i-layer 207 of a-Si and an RF p-layer 208 of a-SiC were successively formed, in accordance with a procedure which is substantially the same as that used in Example C-2, i.e., in the same way as that in Example A-2.

(6) Then, an ITO film of 70 nm thick, serving as a transparent conductive layer 212, was formed on the RF player 208 by vacuum evaporation.

(7) A mask having comb-shaped aperture was placed on the transparent electrode 212 and a comb-shaped collector electrode 213 of Cr(40 nm)/Ag(1000 nm)/Cr(40 nm) was formed by vacuum evaporation.

Fabrication of the photovoltaic element of this example was thus completed. This element will be referred to as "SC/C-7". The conditions of the annealing in gas atmosphere containing trace amount of oxygen atoms and trace amount of Group V element atoms in this example, as well as the conditions of film-forming processes for forming the RF n-layer, RF i-layer, MW i-layer and RF-p layer are collectively shown in Tables 132 and 133.

TABLE 132

CONDITIONS OF ANNEALING IN GAS ATMOSPHERE CONTAINING TRACE AMOUNT OF OXYGEN ATOMS AND GAS CONTAINING TRACE AMOUNT OF GROUP V ELEMENT ATOMS

| | |
|---|---|
| Type of gas containing trace amount of oxygen atoms | $O_2/H_2$ |
| Concentration of trace amount of oxygen atoms in whole annealing gas (ppm) | 1000 |
| Type of gas containing trace amount of Group V element atoms | $PH_3/H_2$ |
| Concentration of trace amount of Group V element atoms in whole annealing gas (ppm) | 500 |
| Type of gas containing trace amount of Group III element atoms (ppm) | $B_2H_6/H_2$ |
| Concentration of trace amount of Group III element atoms in whole annealing gas (ppm) | 500 |
| Annealing temp. (° C.) | 225 |
| Annealing press. (Torr) | 1.5 |

TABLE 133

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SiH_4/H_2$ flow rate sccm | Press. Torr | MW Power W/cm² | RF Power W/cm² | Substrate temp. ° C. | Film thickness nm |
|---|---|---|---|---|---|---|---|---|---|---|---|---|---|
| RF n-layer | 2 | | | | 100 | 200 | | | 1.0 | | 0.05 | 350 | 20 |
| RF i-layer | | 4 | | | 110 | | | | 0.7 | | 0.008 | 300 | 10 |
| MW i-layer | 48 | | | 52 | 220 | | | | 0.006 | 0.08 | 0.30 | 380 | 150 |
| RF i-layer | | 3 | | | 80 | | | | 0.7 | | 0.007 | 250 | 20 |
| RF p-layer | | | 0.3 | | 60 | | 10 | 2 | 2.0 | | 0.07 | 230 | 10 |
| RF n-layer | 2 | | | | 50 | 250 | | | 1.0 | | 0.04 | 225 | 10 |
| RF i-layer | | 2.2 | | | 80 | | | | 0.5 | | 0.007 | 200 | 120 |
| RF p-layer | | | 0.3 | | 60 | | 10 | 2 | 2.0 | | 0.07 | 170 | 10 |

Comparative Example C 7-1

A process was conducted as Comparative Example C 7-1. This process was different from Example C-7 in that it omitted the annealing in the gas atmosphere containing trace amount of oxygen atoms and trace amount of Group V element atoms.

Other conditions were materially the same as those in Example C-7. The photovoltaic element produced in Comparative Example C 7-1 will be referred to as "SC/CC7-1".

Six samples of the photovoltaic elements SC/C-7, as well as six samples of the photovoltaic elements SC/CC7-1, were produced and were subjected, basically in the same way as Example A-1 and Comparative Example A1-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The photo-degradation was evaluated by setting the element temperature to 45° C. and the photo-irradiation time to 1050 hours, while the anti-environment characteristic was evaluated by setting the temperature to 87° C., the humidity to 90% and the time of shelving in the dark place to 250 hours. The results are shown in Table 134.

The performance of the photovoltaic element is shown in Table 134 in terms of values measured on the samples of the photovoltaic element SC/C-7 as normalized by the values measured on the samples of the photovoltaic element SC/CC7-1.

From the results shown in Table 134, it will be seen that all the sample photovoltaic elements SC/C-7 in accordance with Example C-7 exhibit superiority to the sample photovoltaic element SC/CC7-1.

EXAMPLE C-8

This example is different from Example C-3 in that the concentration of the gas containing trace amount of oxygen atoms in the annealing gas containing trace amount of oxygen atoms and trace amount of Group V element atoms was varied within the range of between 0.3 ppm and 2000 ppm, for the purpose of investigating the influence of the gas concentration on the performance such as the initial photoelectric conversion efficiency. $H_2$ gas was used as the diluting gas for determining the concentration of the gas containing trace amount of oxygen atoms and the concentration of the gas containing trace amount of Group V element atoms.

In this example, a triple type photovoltaic element as shown in FIG. 3 was produced by using the in-line type apparatus shown in FIG. 4. The process was materially the same as that in Example C-3, except that annealing conditions as shown in Table 135 and production conditions as shown in Table 136 were used. Ten sample elements were produced while varying the concentration of oxygen atoms-containing gas between 0.3 ppm and 2000 ppm.

TABLE 134

| Items of evaluation | Evaluation |
| --- | --- |
| Initial photoelectric conversion efficiency characteristic | 1.51 |
| Variation of Initial photoelectric conversion efficiency characteristic | 0.85 |
| Photo-degradation characteristic | 0.82 |
| Anti-environment characteristic | 0.84 |
| SEM observation of sectional face | 0.93 |
| Measurement of adhesion: Delamination | No delamination in SC/C-7 Slight delamination in SC-CC7-1 |

TABLE 135

CONDITIONS OF ANNEALING IN GAS ATMOSPHERE CONTAINING TRACE AMOUNT OF OXYGEN ATOMS AND GAS CONTAINING TRACE AMOUNT OF GROUP V ELEMENT ATOMS

| | |
| --- | --- |
| Type of gas containing trace amount of oxygen atoms | $O_2/H_2$ |
| Concentration of trace amount of oxygen atoms in whole annealing gas (ppm) | 0.3–2000 |
| Type of gas containing trace amount of Group V element atoms | $PH_3/H_2$ |
| Concentration of trace amount of Group V element atoms in whole annealing gas (ppm) | 4 |
| Annealing temp. (° C.) | 330 |
| Annealing press. (Torr) | 1.2 |

TABLE 136

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power W/cm$^2$ | RF Power W/cm$^2$ | Substrate temp. ° C. | Film thickness nm |
| --- | --- | --- | --- | --- | --- | --- | --- | --- | --- | --- | --- | --- | --- |
| RF n-layer | 2.0 | | | | 100 | 200 | | | 1.3 | | 0.05 | 350 | 20 |
| RF i-layer | | 4.0 | | | 100 | | | | 0.8 | | 0.008 | 300 | 10 |
| MW i-layer | 50 | | | 51 | 130 | | | | 0.010 | 0.10 | 0.31 | 370 | 100 |
| RF i-layer | | 4.0 | | | 100 | | | | 0.75 | | 0.008 | 300 | 23 |

TABLE 136-continued

| | SiH$_4$ flow rate sccm | Si$_2$H$_6$ flow rate sccm | CH$_4$ flow rate sccm | GeH$_4$ flow rate sccm | H$_2$ flow rate sccm | PH$_3$/H$_2$ flow rate sccm | B$_2$H$_6$/H$_2$ flow rate sccm | SiH$_4$/H$_2$ flow rate sccm | Press. Torr | MW Power W/cm$^2$ | RF Power W/cm$^2$ | Substrate temp. °C. | Film thickness nm |
|---|---|---|---|---|---|---|---|---|---|---|---|---|---|
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 32 | | | 29 | 120 | | | | 0.013 | 0.11 | 0.3 | 350 | 100 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 1.5 | | | 80 | | | | 0.8 | | 0.007 | 190 | 90 |
| RF p-layer | | | 0.4 | | 90 | | 8 | 2 | 1.6 | | 0.7 | 170 | 10 |

These ten samples were subjected to evaluation of performance of various items in the same way as that in Example C-3. Results of evaluation on each of the ten samples are shown in Table 137. The evaluation was made by normalizing the measurement results of the samples with the values measured on the sample which was produced by using the annealing gas containing trace amount of oxygen atoms having the concentration of 0.3 ppm. A mark x indicates that the normalized value is not less than 1.0 but below 1.4, a mark Δ indicates that the normalized value is not less than 1.4 but below 1.8 and a mark ○ indicates that the normalized value is not less than 1.8.

From Table 137, it is understood that the concentration of the oxygen atom-containing gas, which is used in the atmosphere gas of the annealing containing trace amount of oxygen atoms and trace amount of Group V element atoms, most preferably ranges from 1 ppm to 1000 ppm with respect to the whole annealing gas (total amount of diluting H$_2$ gas in this example), in order to obtain good results in regard to the initial photoelectric conversion efficiency, variation of the efficiency, photo-degradation, anti-environment characteristic against high-temperature, high-humidity atmosphere, and adhesion.

oxygen atoms and the concentration of the gas containing trace amount of Group V element atoms in accordance with the invention.

In this example, a triple type photovoltaic element of the type shown in FIG. 3 was produced by using the in-line type apparatus shown in FIG. 4. The process was materially the same as that in Example C-3, except that annealing conditions as shown in Table 138 and production conditions as shown in Table 139 were used.

Ten sample elements were produced while varying the concentration of oxygen atoms-containing gas between 0.3 ppm and 2000 ppm.

TABLE 138

CONDITIONS OF ANNEALING IN GAS ATMOSPHERE CONTAINING TRACE AMOUNT OF OXYGEN ATOMS AND GAS CONTAINING TRACE AMOUNT OF GROUP V ELEMENT ATOMS

| Type of gas containing trace amount of oxygen atoms | O$_2$/He |
|---|---|
| concentration of trace amount of oxygen atoms in whole annealing gas | 0.3–2000 |

TABLE 137

| Concentration of trace amount of oxygen atoms: ppm | 0.3 | 0.8 | 1 | 10 | 100 | 500 | 1000 | 1050 | 1300 | 2600 |
|---|---|---|---|---|---|---|---|---|---|---|
| Initial photoelectric conversion characteristic | x | x | ○ | ○ | ○ | ○ | ○ | x | x | x |
| Variation of characteristic | x | Δ | ○ | ○ | ○ | ○ | ○ | x | x | x |
| Photo-degradation characteristic | x | x | ○ | ○ | ○ | ○ | ○ | Δ | x | x |
| Anti-environment characteristic | x | Δ | ○ | ○ | ○ | ○ | ○ | x | x | x |
| Adhesion | x | x | ○ | ○ | ○ | ○ | ○ | Δ | x | x |

EXAMPLE C-9

This example is different from Example C-3 in that the concentration of the gas containing trace amount of oxygen atoms used in the annealing was varied within the range of between 0.3 ppm and 2000 ppm, for the purpose of investigating the influence of the gas concentration on the performance such as the initial photoelectric conversion efficiency. He gas was used as the diluting gas for determining the concentration of the gas containing trace amount of TABLE 138-continued CONDITIONS OF ANNEALING IN GAS ATMOSPHERE CONTAINING TRACE AMOUNT OF OXYGEN ATOMS AND GAS CONTAINING TRACE AMOUNT OF GROUP V ELEMENT ATOMS

| (ppm) Type of gas containing trace amount of Group V element atoms | PH$_3$/He |
|---|---|
| Concentration of trace amount of Group | 3 |

TABLE 138-continued

CONDITIONS OF ANNEALING IN GAS ATMOSPHERE CONTAINING TRACE AMOUNT OF OXYGEN ATOMS AND GAS CONTAINING TRACE AMOUNT OF GROUP V ELEMENT ATOMS

| V element atoms in whole annealing gas (ppm) | |
|---|---|
| Annealing temp. (° C.) | 330 |
| Annealing press. (Torr) | 1.3 | oxygen atoms and trace amount of Group V element atoms, most preferably ranges from 1 ppm to 1000 ppm with respect to the whole annealing gas (total diluting He gas in this case), in order to obtain good results in regard to the initial photoelectric conversion efficiency, variation of the efficiency, photo-degradation, anti-environment characteristic against high-temperature, high-humidity atmosphere, and adhesion.

TABLE 139

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SiH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 200 | | | 1.3 | | 0.05 | 350 | 20 |
| RF i-layer | | 4.0 | | | 100 | | | | 0.8 | | 0.008 | 300 | 10 |
| MW i-layer | 47 | | | 51 | 110 | | | | 0.010 | 0.09 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.i | | 0.04 | 300 | 10 |
| RF i-layer | | 4.0 | | | 90 | | | | 0.75 | | 0.008 | 300 | 10 |
| MW i-layer | 31 | | | 27 | 120 | | | | 0.013 | 0.08 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 80 | | | | 0.8 | | 0.007 | 190 | 90 |
| RF p-layer | | | 0.4 | | 90 | | 8 | 2 | 1.6 | | 0.07 | 170 | 10 |

These ten samples were subjected to evaluation of performance in the same way as that in Example C-3. Results of evaluation on each of the ten samples are shown in Table 140. The evaluation was made by normalizing the values measured on the respective samples with the values measured on the sample which was produced by using the annealing gas containing trace amount of oxygen atoms having the concentration of 0.3 ppm. A mark x indicates that the normalized value is not less than 1.0 but below 1.4, a mark Δ indicates that the normalized value is not less than 1.4 but below 1.8 and a mark ○ indicates that the normalized value is not less than 1.8.

From Table 140, it is understood that the concentration of the oxygen atom-containing gas, which is used in the atmosphere gas of the annealing containing trace amount of

TABLE 140

| Concentration of trace amount of oxygen atoms: ppm | 0.3 | 0.8 | 1 | 10 | 100 | 500 | 1000 | 1050 | 1300 | 2000 |
|---|---|---|---|---|---|---|---|---|---|---|
| Initial photoelectric conversion | x | Δ | ○ | ○ | ○ | ○ | ○ | x | x | x |
| Variation of characteristic | x | x | ○ | ○ | ○ | ○ | ○ | Δ | x | x |
| Photo-degradation characteristic | x | Δ | ○ | ○ | ○ | ○ | ○ | x | x | x |
| Anti-environment characteristic | x | x | ○ | ○ | ○ | ○ | ○ | Δ | x | x |
| Adhesion | x | Δ | ○ | ○ | ○ | ○ | ○ | Δ | x | x |

EXAMPLE C-10

This example is different from Example C-3 in that the concentration of the gas containing trace amount of oxygen atoms used in the annealing atmosphere was varied within the range of between 0.3 ppm and 2000 ppm, for the purpose of investigating the influence of the gas concentration on the performance such as the initial photoelectric conversion efficiency. Ar gas was used as the diluting gas for determining the concentration of the gas containing trace amount of oxygen atoms and the concentration of the gas containing trace amount of Group V element atoms.

In this example, a triple type photovoltaic element of FIG. 3 was produced by using the in-line type apparatus shown in FIG. 4. The process was materially the same as that in Example C-3, except that annealing conditions as shown in Table 141 and production conditions as shown in Table 142 were used. Ten sample elements were produced while varying the concentration of oxygen atoms containing gas between 0.3 ppm and 2000 ppm.

TABLE 141

CONDITIONS OF ANNEALING IN GAS ATMOSPHERE CONTAINING TRACE AMOUNT OF OXYGEN ATOMS AND GAS CONTAINING TRACE AMOUNT OF GROUP V ELEMENT ATOMS

| | |
|---|---|
| Type of gas containing trace amount of oxygen atoms | $O_2$/Ar |
| Oxygen atom concentration in whole annealing gas (ppm) | 0.3–2000 |
| Type of gas containing trace amount of Group V element atoms | $PH_3$/Ar |
| Concentration of trace amount of Group V element atoms in whole annealing gas (ppm) | 2 |
| Annealing temp. (° C.) | 310 |
| Annealing press. (Torr) | 1.5 |

These ten samples were subjected to evaluation of performance in the same way as that in Example C-3. Results of evaluation on each of the ten samples are shown in Table 143. The evaluation was made by normalizing the values measured on the respective samples with the values measured on the sample which was produced by using the annealing gas containing trace amount of oxygen atoms having the concentration of 0.3 ppm. A mark x indicates that the normalized value is not less than 1.0 but below 1.4, a mark Δ indicates that the normalized value is not less than 1.4 but below 1.8 and a mark ○ indicates that the normalized value is not less than 1.8.

From Table 143, it is understood that the concentration of the oxygen atom-containing gas, which is used in the atmosphere gas of the annealing containing trace amount of oxygen atoms and trace amount of Group V element atoms, most preferably ranges from 1 ppm to 1000 ppm with respect to the whole annealing gas (Total diluting Ar gas in this case), in order to obtain good results in regard to the initial photoelectric conversion efficiency, variation of the efficiency, photo-degradation, anti-environment characteristic against high-temperature, high-humidity atmosphere, and adhesion.

TABLE 142

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 47 | | | 51 | 225 | | | | 0.010 | 0.10 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 29 | | | 28 | 200 | | | | 0.008 | .08 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 80 | | | | 0.8 | | 0.007 | 190 | 90 |
| RF p-layer | | | 0.4 | | 90 | | 8 | 2 | 1.6 | | 0.07 | 170 | 10 |

TABLE 143

| Concentration of trace amount of oxygen atoms: ppm | 0.3 | 0.8 | 1 | 10 | 100 | 500 | 1000 | 1050 | 1300 | 2000 |
|---|---|---|---|---|---|---|---|---|---|---|
| Initial photoelectric conversion characteristic | X | Δ | ○ | ○ | ○ | ○ | ○ | X | X | X |
| Variation of characteristic | X | X | ○ | ○ | ○ | ○ | ○ | Δ | X | X |
| Photo-degradation characteristic | X | Δ | ○ | ○ | ○ | ○ | ○ | Δ | X | X |
| Anti-environment characteristic | X | Δ | ○ | ○ | ○ | ○ | ○ | Δ | X | X |
| Adhesion | X | X | ○ | ○ | ○ | ○ | ○ | Δ | X | X |

EXAMPLE C-11

This example is different from Example C-3 in that the concentration of the gas containing trace amount of Group V element atoms used in the annealing atmosphere was varied within the range of between 0.3 ppm and 2000 ppm, for the purpose of investigating the influence of the gas concentration on the performance such as the initial photoelectric conversion efficiency. $H_2$ gas was used as the-diluting-gas for varying the concentration of the gas containing trace amount of oxygen atoms and the concentration of the gas containing trace amount of Group V element atoms.

In this example, a triple type photovoltaic element of FIG. 3 was produced by using the in-line type apparatus shown in FIG. 4. The process was materially the same as that in Example C-3, except that annealing conditions as shown in Table 144 and production conditions as shown in Table 145 were used. Ten sample elements were produced while varying the concentration of the gas containing trace amount of Group V element atoms between 0.3 ppm and 2000 ppm.

TABLE 144

CONDITIONS OF ANNEALING IN GAS ATMOSPHERE CONTAINING TRACE AMOUNT OF OXYGEN ATOMS AND GAS CONTAINING TRACE AMOUNT OF GROUP V ELEMENT ATOMS

| | |
|---|---|
| Type of gas containing trace amount of oxygen atoms | $O_2/H_2$ |
| Concentration of trace amount of oxygen atoms in whole annealing gas (ppm) | 2 |
| Type of gas containing trace amount of Group V element atoms | $PH_3/H_2$ |
| Concentration of trace amount of Group V element atoms in whole annealing gas (ppm) | 0.3–2000 |
| Annealing temp. (° C.) | 310 |
| Annealing press. (Torr) | 1.0 |

These ten samples were subjected to evaluation of performance in the same way as that in Example C-3. Results of evaluation on each of the ten samples are shown in Table 146. The evaluation was made by normalizing the values measured on the respective samples with the values measured on the sample which was produced by using the gas containing trace amount of Group V element atoms having the concentration of 0.3 ppm. A mark x indicates that the normalized value is not less than 1.0 but below 1.4, a mark Δ indicates that the normalized value is not less than 1.4 but below 1.8 and a mark ○ indicates that the normalized value is not less than 1.8.

From Table 146, it is understood that the concentration of the gas containing trace amount of Group V element atoms, which is used in the atmosphere gas of the annealing containing trace amount of oxygen atoms and trace amount of Group V element atoms, most preferably ranges from 1 ppm to 1000 ppm with respect to the whole annealing gas (Total diluting $H_2$ gas in this case), in order to obtain good results in regard to the initial photoelectric conversion efficiency, variation of the efficiency, photo-degradation, anti-environment characteristic against high-temperature, high-humidity atmosphere, and adhesion.

TABLE 145

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 47 | | | 51 | 200 | | | | 0.010 | 0.10 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 29 | | | 29 | 130 | | | | 0.008 | 0.10 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 65 | | | | 0.8 | | 0.007 | 190 | 90 |
| RF p-layer | | | 0.4 | | 90 | | 8 | 2 | 1.6 | | 0.07 | 170 | 10 |

TABLE 146

| Concentration of trace amount of oxygen atoms: ppm | 0.3 | 0.8 | 1 | 10 | 100 | 500 | 1000 | 1050 | 1300 | 2000 |
|---|---|---|---|---|---|---|---|---|---|---|
| Initial photo electric conversion characteristic | X | Δ | ○ | ○ | ○ | ○ | ○ | Δ | X | X |
| Variation of characteristic | X | X | ○ | ○ | ○ | ○ | ○ | Δ | X | X |
| Photo-degradation characteristic | X | Δ | ○ | ○ | ○ | ○ | ○ | Δ | X | X |
| Anti-environment characteristic | X | Δ | ○ | ○ | ○ | ○ | ○ | Δ | X | X |
| Adhesion | X | Δ | ○ | ○ | ○ | ○ | ○ | X | X | X |

EXAMPLE C-12

This example is different from Example C-3 in that the concentration of the gas containing trace amount of Group V element atoms used in the annealing atmosphere was varied within the range of between 0.3 ppm and 2000 ppm, for the purpose of investigating the influence of the gas concentration on the performance such as the initial photoelectric conversion efficiency. He gas was used as the diluting gas for determining the concentration of the gas containing trace amount of oxygen atoms and the gas containing trace amount of Group V element atoms.

In this example, a triple type photovoltaic element of FIG. 3 was produced by using the in-line type apparatus shown in FIG. 4. The process was materially the same as that in Example C-3, except that annealing conditions as shown in Table 147 and production conditions as shown in Table 148 were used. Ten sample elements were produced while varying the concentration of the gas containing trace amount of Group V element atoms between 0.3 ppm and 2000 ppm.

TABLE 147

CONDITIONS OF ANNEALING IN GAS ATMOSPHERE CONTAINING TRACE AMOUNT OF OXYGEN ATOMS AND GAS CONTAINING TRACE AMOUNT OF GROUP V ELEMENT ATOMS

| | |
|---|---|
| Type of gas containing trace amount of oxygen atoms | O$_2$/He |
| Oxygen atom concentration in whole annealing gas (ppm) | 2 |
| Type of gas containing trace amount of Group V element atoms | PH$_3$/He |
| Concentration of trace amount of Group V element atoms in whole annealing gas (ppm) | 0.3–2000 |
| Annealing temp. (° C.) | 290 |
| Annealing press. (Torr) | 1.0 |

TABLE 148

| | SiH$_4$ flow rate sccm | Si$_2$H$_6$ flow rate sccm | CH$_4$ flow rate sccm | GeH$_4$ flow rate sccm | H$_2$ flow rate sccm | PH$_3$/H$_2$ flow rate sccm | B$_2$H$_6$/H$_2$ flow rate sccm | SiH$_4$/H$_2$ flow rate sccm | Press. Torr | MW Power W/cm$^2$ | RF Power W/cm$^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 46 | | | 50 | 225 | | | | 0.010 | 0.10 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 29 | | | 27 | 130 | | | | 0.008 | 0.08 | 0.3 | 330 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 65 | | | | 0.8 | | 0.007 | 190 | 90 |
| RF p-layer | | | 0.4 | | 90 | | 8 | 2 | 1.6 | | 0.07 | 170 | 10 |

These ten samples were subjected to evaluation of performance in the same way as that in Example C-3. Results of evaluation on each of the ten samples are shown in Table 149. The evaluation was made by normalizing the values measured on the respective samples with the values measured on the sample which was produced by using the gas containing trace amount of Group V element atoms having the concentration of 0.3 ppm. A mark x indicates that the normalized value is not less than 1.0 but below 1.4, a mark Δ indicates that the normalized value is not less than 1.4 but below 1.8 and a mark ○ indicates that the normalized value is not less than 1.8.

From Table 149, it is understood that the concentration of the gas containing trace amount of Group V element atoms, which is used in the atmosphere gas of the annealing containing trace amount of oxygen atoms and trace amount of Group V element atoms, most preferably ranges from 1 ppm to 1000 ppm with respect to the whole annealing gas (Total diluting He gas in this case), in order to obtain good results in regard to the initial photoelectric conversion efficiency, variation of the efficiency, photo-degradation, anti-environment characteristic against high-temperature, high-humidity atmosphere, and adhesion.

TABLE 149

| Concentration of trace amount of oxygen atoms: ppm | .03 | 0.8 | 1 | 10 | 100 | 500 | 1000 | 1050 | 1300 | 2000 |
|---|---|---|---|---|---|---|---|---|---|---|
| Initial photoelectric conversion characteristic | x | Δ | o | o | o | o | o | Δ | x | x |
| Variation of characteristic | x | x | o | o | o | o | o | Δ | x | x |
| Photo-degradation characteristic | x | Δ | o | o | o | o | o | x | x | x |
| Anti-environment characteristic | x | Δ | o | o | o | o | o | Δ | x | x |
| Adhesion | x | Δ | o | o | o | o | o | x | x | x |

EXAMPLE C-13

This example is different from Example C-3 in that the concentration of the gas containing trace amount of Group V element atoms used in the annealing was varied within the range of between 0.3 ppm and 2000 ppm, for the purpose of investigating the influence of the gas concentration on the performance such as the initial photoelectric conversion efficiency. Ar gas was used as the diluting gas for determining the concentration of the gas containing trace amount of oxygen atoms and the concentration of the gas containing trace amount of Group V element atoms.

In this example, a triple type photovoltaic element of FIG. 3 was produced by using the in-line type apparatus shown in FIG. 4. The process was materially the same as that in Example C-3, except that annealing conditions as shown in Table 150 and production conditions as shown in Table 151 were used. Ten sample elements were produced while varying the concentration of the gas containing trace amount of Group V element atoms between 0.3 ppm and 2000 ppm.

TABLE 150

CONDITIONS OF ANNEALING IN ATMOSPHERE FORMED OF GAS CONTAINING TRACE AMOUNT OF OXYGEN ATOMS AND GAS CONTAINING TRACE AMOUNT OF GROUP V ELEMENT ATOMS

| | |
|---|---|
| Type of gas containing trace amount of oxygen atoms | $O_2$/Ar |
| Concentration of trace amount of oxygen atoms in whole annealing gas (ppm) | 2 |
| Type of gas containing trace amount of Group V element atoms | $B_2H_6$/Ar |

TABLE 150-continued

CONDITIONS OF ANNEALING IN ATMOSPHERE FORMED OF GAS CONTAINING TRACE AMOUNT OF OXYGEN ATOMS AND GAS CONTAINING TRACE AMOUNT OF GROUP V ELEMENT ATOMS

| | |
|---|---|
| Concentration of trace amount of Group V element atoms in whole annealing gas (ppm) | 0.3–2000 |
| Annealing temp. (° C.) | 300 |
| Annealing press. (Torr) | 1.1 |

TABLE 151

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SiH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 46 | | | 49 | 150 | | | | 0.010 | 0.10 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 29 | | | 26 | 130 | | | | 0.008 | 0.09 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 85 | | | | 0.8 | | 0.007 | 190 | 90 |
| RF p-layer | | | 0.4 | | 90 | | 8 | 2 | 1.6 | | 0.07 | 170 | 10 |

These ten samples were subjected to evaluation of performance in the same way as that in Example C-3. Results of evaluation on each of the ten samples are shown in Table 152. The evaluation was made by normalizing the values measured on the respective samples with the values measured on the sample which was produced by using the gas containing trace amount of Group V element atoms having the concentration of 0.3 ppm. A mark x indicates that the normalized value is not less than 1.0 but below 1.4, a mark Δ indicates that the normalized value is not less than 1.4 but below 1.8 and a mark o indicates that the normalized value is not less than 1.8.

From Table 152, it is understood that the concentration of the gas containing trace amount of Group V element atoms, which is used in the atmosphere gas of the annealing containing trace amount of oxygen atoms and the gas containing trace amount of Group V element atoms, most preferably ranges from 1 ppm to 1000 ppm with respect to the whole annealing gas (Total diluting Ar gas in this case), in order to obtain good results in regard to the initial photoelectric conversion efficiency, variation of the efficiency, photo-degradation, anti-environment characteristic against high-temperature, high-humidity atmosphere, and adhesion.

TABLE 152

| Concentration of trace amount of oxygen atoms: ppm | 0.3 | 0.8 | 1 | 10 | 100 | 500 | 1000 | 1050 | 1300 | 2000 |
|---|---|---|---|---|---|---|---|---|---|---|
| Initial photoelectric conversion characteristic | x | x | ○ | ○ | ○ | ○ | ○ | x | x | x |
| Variation of characteristic | x | x | ○ | ○ | ○ | ○ | ○ | Δ | x | x |
| Photo-degradation characteristic | x | Δ | ○ | ○ | ○ | ○ | ○ | x | x | x |
| Anti-environment characteristic | x | x | ○ | ○ | ○ | ○ | ○ | Δ | x | x |
| Adhesion | x | Δ | ○ | ○ | ○ | ○ | ○ | x | x | x |

EXAMPLE C-14

In this example, annealing was conducted by using both a gas containing trace amount of Group III element atoms and a gas containing trace amount of Group V element atoms, and the concentration of the former gas was varied within the range of between 0.3 ppm and 2000 ppm, for the purpose of investigating the influence of the gas concentration on the performance such as the initial photoelectric conversion efficiency. $H_2$ gas was used as the diluting gas for determiLning the concentration of the gas containing trace amount of oxygen atoms, concentration of the gas containing trace amount of Group V element atoms, and the concentration of the gas containing trace amount of Group III element atoms.

TABLE 153

CONDITIONS OF ANNEALING IN GAS ATMOSPHERE CONTAINING TRACE AMOUNT OF OXYGEN ATOMS AND GAS CONTAINING TRACE AMOUNT OF GROUP V ELEMENT ATOMS

| | |
|---|---|
| Type of gas containing trace amount of oxygen atoms | $O_2/H_2$ |
| Concentration of trace amount of oxygen atoms in whole annealing gas (ppm) | 2 |
| Type of gas containing trace amount of Group V element atoms | $PH_3/H_2$ |
| Concentration of trace amount of Group V element atoms in whole annealing gas (ppm) | 2 |
| Type of gas containing trace amount of Group III element atoms (ppm) | $B_2H_6/H_2$ |
| Concentration of trace amount of Group III element atoms in whole annealing gas (ppm) | 0.3–2000 |
| Annealing temp. (° C.) | 290 |
| Annealing press. (Torr) | 1.1 |

TABLE 154

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SiH_4/H_2$ flow rate sccm | Press. Torr | MW Power W/cm² | RF Power W/cm² | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 47 | | | 51 | 190 | | | | 0.010 | 0.10 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 29 | | | 28 | 170 | | | | 0.008 | 0.09 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 65 | | | | 0.8 | | 0.007 | 190 | 90 |
| RF p-layer | | | 0.4 | | 90 | | 8 | 2 | 1.6 | | 0.07 | 170 | 10 |

In this example, a triple type photovoltaic element of FIG. 3 was produced by using the in-line type apparatus shown in FIG. 4. The process were materially the same as that in Example C-6, except that annealing conditions as shown in Table 153 and production conditions as shown in Table 154 were used. Ten sample elements were produced while varying the concentration of the gas containing trace amount of Group III element atoms between 0.3 ppm and 2000 ppm.

These ten samples were subjected to evaluation of performance in the same way as that in Example C-6. Results of evaluation on each of the ten samples are shown in Table 155. The evaluation was made by normalizing the values measured on -the respective samples with the values measured on the sample which was produced by using the gas containing trace amount of Group III element atoms having the concentration of 0.3 ppm. A mark x indicates that the normalized value is not less than 1.0 but below 1.4, a mark Δ indicates that the normalized value is not less than 1.4 but below 1.8 and a mark ○ indicates that the normalized value is not less than 1.8.

From Table 155, it is understood that the concentration of the gas containing trace amount of Group III element atoms, which is used in the atmosphere gas of the annealing formed of the gas containing trace amount of oxygen atoms, the gas containing trace amount of Group V element atoms and also the gas containing trace amount of Group III element atoms, most preferably ranges from 1 ppm to 1000 ppm with respect to the whole annealing gas (Total diluting $H_2$ gas in this case), in order to obtain good results in regard to the initial photoelectric conversion efficiency, variation of the efficiency, photo-degradation, anti-environment characteristic against high-temperature, high-humidity atmosphere, and adhesion.

EXAMPLE C-15

In this example, annealing was conducted by using both a gas containing trace amount of Group III element atoms and a gas containing trace amount of Group V element atoms, and the concentration of the former gas was varied within the range of between 0.3 ppm and 2000 ppm, for the purpose of investigating the influence of the gas concentration on the performance such as the initial photoelectric conversion efficiency. He gas was used as the diluting gas for determining the concentration of the gas containing trace amount of oxygen atoms, concentration of the gas containing trace amount of Group V element atoms, and the concentration of the gas containing trace amount of Group III element atoms.

In this example, a triple type photovoltaic element of FIG. 3 was produced by using the in-line type apparatus shown in FIG. 4. The process were materially the same as that in Example C-6, except that annealing conditions as shown in Table 156 and production conditions as shown in Table 157 were used. Ten sample elements were produced while varying the concentration of the gas containing trace amount of Group III element atoms between 0.3 ppm and 2000 ppm.

TABLE 156

CONDITIONS OF ANNEALING IN GAS ATMOSPHERE CONTAINING TRACE AMOUNT OF OXYGEN ATOMS AND GAS CONTAINING TRACE AMOUNT OF GROUP V ELEMENT ATOMS

| | |
|---|---|
| Type of gas containing trace amount of oxygen atoms | $O_2$/He |
| Concentration of trace amount of oxygen atoms in whole annealing gas (ppm) | 2 |

TABLE 156-continued

CONDITIONS OF ANNEALING IN GAS ATMOSPHERE CONTAINING TRACE AMOUNT OF OXYGEN ATOMS AND GAS CONTAINING TRACE AMOUNT OF GROUP V ELEMENT ATOMS

| | |
|---|---|
| Type of gas containing trace amount of Group V element atoms | $PF_3$/He |
| Concentration of trace amount of Group V element atoms in whole annealing gas (ppm) | 2 |
| Type of gas containing trace amount of Group III element atoms (ppm) | $B_2H_6$/He |
| Concentration of trace amount of Group III element atoms in whole annealing gas (ppm) | 0.3–2000 |
| Annealing temp. (° C.) | 290 |
| Annealing press. (Torr) | 1.2 |

TABLE 155

| | Concentration of trace amount of oxygen atoms: ppm | | | | | | | | | |
|---|---|---|---|---|---|---|---|---|---|---|
| | 0.3 | 0.8 | 1 | 10 | 100 | 500 | 1000 | 1050 | 1300 | 2000 |
| Initial photoelectric conversion characteristic | x | x | ○ | ○ | ○ | ○ | ○ | Δ | x | x |
| Variation of characteristic | x | x | ○ | ○ | ○ | ○ | ○ | x | x | x |
| Photo-degradation characteristic | x | Δ | ○ | ○ | ○ | ○ | ○ | Δ | x | x |
| Anti-environment characteristic | x | Δ | ○ | ○ | ○ | ○ | ○ | x | x | x |
| Adhesion | x | x | ○ | ○ | ○ | ○ | ○ | x | x | x |

TABLE 157

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substance temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 46 | | | 50 | 210 | | | | 0.010 | 0.10 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.12 | | 0.04 | 300 | 10 |
| RF i-layer | | 4.0 | | | 90 | | | | 0.75 | | 0.008 | 300 | 10 |
| MW i-layer | 29 | | | 27 | 200 | | | | 0.008 | 0.09 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 65 | | | | 0.8 | | 0.007 | 190 | 90 |
| RF p-layer | | | 0.4 | | 90 | | 8 | 2 | 1.6 | | 0.07 | 170 | 10 |

These ten samples were subjected to evaluation of performance in the same way as that in Example C-6. Results of evaluation on each of the ten samples are shown in Table 158. The evaluation was made by normalizing the values measured on the respective samples with the values measured on the sample which was produced by using the gas containing trace amount of Group III element atoms having the concentration of 0.3 ppm. A mark x indicates that the normalized value is not less than 1.0 but below 1.4, a mark Δ indicates that the normalized value is not less than 1.4, but below 1.8 and a mark ○ indicates that the normalized value is not less than 1.8.

From Table 158, it is understood that the concentration of the gas containing trace amount of Group III element atoms, which is used in the atmosphere gas of the annealing formed of the gas containing trace amount of oxygen atoms, the gas containing trace amount of Group V element atoms and also the gas containing trace amount of Group III element atoms, most preferably ranges from 1 ppm to 1000 ppm with respect to the whole annealing gas (Total diluting He gas in this case), in order to obtain good results in regard to the initial photoelectric conversion efficiency, variation of the efficiency, photo-degradation, anti-environment characteristic against high-temperature, high-humidity atmosphere, and adhesion.

EXAMPLE C-16

In this example, annealing was conducted by using both a gas containing trace amount of Group III element atoms and a gas containing trace amount of Group V element atoms, and the concentration of the former gas was varied within the range of between 0.3 ppm and 2000. ppm, for the purpose of investigating the influence of the gas concentration on the performance such as the initial photoelectric conversion efficiency. Ar gas was used as the diluting gas for determining the concentration of the gas containing trace amount of oxygen atoms, concentration of the gas containing trace amount of Group V element atoms, and the concentration of the gas containing trace amount of Group III element atoms.

In this example, a triple type photovoltaic element of FIG. 3 was produced by using the in-line type apparatus shown in FIG. 4. The process was materially the same as that in Example C-6, except that annealing conditions as shown in Table 159 and production conditions as shown in Table 160 were used. Ten sample elements were produced while varying the concentration of the gas containing trace amount of Group III element atoms between 0.3 ppm and 2000 ppm.

TABLE 159

CONDITIONS OF ANNEALING IN GAS ATMOSPHERE CONTAINING TRACE AMOUNT OF OXYGEN ATOMS AND GAS CONTAINING TRACE AMOUNT OF GROUP V ELEMENT ATOMS

| | |
|---|---|
| Type of gas containing trace amount of oxygen atoms | $O_2$/Ar |
| Concentration of trace amount of oxygen atoms in whole annealing gas (ppm) | 2 |
| Type of gas containing trace amount of Group V element atoms | $PH_3$/Ar |
| Concentration of trace amount of Group V element atoms in whole annealing gas (ppm) | 2 |
| Type of gas containing trace amount of Group III element atoms (ppm) | $BF_3$/Ar |

TABLE 158

| | Concentration of trace amount of Group III atoms: ppm | | | | | | | | | |
|---|---|---|---|---|---|---|---|---|---|---|
| | 0.3 | 0.8 | 1 | 10 | 100 | 500 | 1000 | 1050 | 1300 | 2000 |
| Initial photoelectric conversion characteristic | x | Δ | ○ | ○ | ○ | ○ | ○ | Δ | x | x |
| Variation of characteristic | x | x | ○ | ○ | ○ | ○ | ○ | Δ | x | x |
| Photo-degradation characteristic | x | Δ | ○ | ○ | ○ | ○ | ○ | x | x | x |
| Anti-environment characteristic | x | Δ | ○ | ○ | ○ | ○ | ○ | Δ | x | x |
| Adhesion | x | x | ○ | ○ | ○ | ○ | ○ | Δ | x | x |

TABLE 159-continued

CONDITIONS OF ANNEALING IN GAS ATMOSPHERE CONTAINING TRACE AMOUNT OF OXYGEN ATOMS AND GAS CONTAINING TRACE AMOUNT OF GROUP V ELEMENT ATOMS

| | |
|---|---|
| Concentration of trace amount of Group III element atoms in whole annealing gas (ppm) | 0.3–2000 |
| Annealing temp. (° C.) | 290 |
| Annealing press. (Torr) | 1.4 |

TABLE 160

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 46 | | | 49 | 180 | | | | 0.010 | 0.10 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 29 | | | 29 | 150 | | | | 0.008 | 0.10 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |

TABLE 160-continued

| | SiH$_4$ flow rate sccm | Si$_2$H$_6$ flow rate sccm | CH$_4$ flow rate sccm | GeH$_4$ flow rate sccm | H$_2$ flow rate sccm | PH$_3$/H$_2$ flow rate sccm | B$_2$H$_6$/H$_2$ flow rate sccm | SIH$_4$/H$_2$ flow rate sccm | Press. Torr | MW Power W/cm$^2$ | RF Power W/cm$^2$ | Substrate temp. °C. | Film thickness nm |
|---|---|---|---|---|---|---|---|---|---|---|---|---|---|
| RF n-layer | 0.8 | | | | 50 | 250 | | | 1.05 | | 0.04 | 230 | 10 |
| RF i-layer | | 2.0 | | | 85 | | | | 0.8 | | 0.007 | 190 | 90 |
| RF p-layer | | | 0.4 | | 90 | | 8 | 2 | 1.6 | | 0.07 | 170 | 10 |

These ten samples were subjected to evaluation of performance in the same way as the Example C-6. Results of evaluation on each of the ten samples are shown in Table 161. The evaluation was made by normalizing the values measured on the sample which was produced by using the gas containing trace amount of Group III element atoms having the concentration of 0.3 ppm. A mark x indicates that the normalized value is not less than 1.0 but below 1.4, a mark Δ indicates that the normalized value is not less 1.4 but below 1.8 and a mark ○ indicates that the normalized value is not less than 1.8.

From Table 161, it is understood that the concentration of the gas containing trace amount of Group III element atoms, which is used in the atmosphere gas of the annealing formed of the gas containing trace amount of oxygen atoms, the gas containing trace amount of Group V element atoms and also the gas containing trace amount of Group III element atoms, most preferably ranges from 1 ppm to 1000 ppm with respect to the whole annealing gas (Total diluting He gas in this case), in order to obtain good results in regard to the initial photoelectric conversion efficiency, variation of the efficiency, photo-degradation, anti-environment characteristic against high-temperature, high-humidity atmosphere, and adhesion.

EXAMPLE C-17

This example is different from Example C-3 in that the annealing temperature was varied within the range of between 25° C. and 500° C., for the purpose of investigating the influence of the annealing temperature on the performance such as the initial photoelectric conversion efficiency. H$_2$ gas was used as the diluting gas for determining the concentration of the gas containing trace amount of oxygen atoms and the concentration of the gas containing trace amount of Group V element atoms.

In this example, a triple type photovoltaic element as shown in FIG. 3 was produced by using the in-line type apparatus shown in FIG. 4. The process was materially the same as that in Example C-3, except that annealing conditions as shown in Table 162 and production conditions as shown in Table 163 were used. Ten sample elements were produced while varying the annealing temperature between 25° C. and 500° C.

TABLE 162

CONDITIONS OF ANNEALING IN GAS ATMOSPHERE CONTAINING TRACE AMOUNT OF OXYGEN ATOMS AND GAS CONTAINING TRACE AMOUNT OF GROUP V ELEMENT ATOMS

| | |
|---|---|
| Type of gas containing trace amount of oxygen atoms | O$_2$/H$_2$ |
| Concentration of trace amount of oxygen atoms in whole annealing gas (ppm) | 2 |
| Type of gas containing trace amount of Group V element atoms | PF$_3$/H$_2$ |
| Concentration of trace amount of Group V element atoms in whole annealing gas (ppm) | 2 |
| Annealing temp. (° C.) | 25–500 |
| Annealing press. (Torr) | 1.4 |

TABLE 161

| Concentration of trace amount of oxygen atoms: ppm | 0.3 | 0.8 | 1 | 10 | 100 | 500 | 1000 | 1050 | 1300 | 2000 |
|---|---|---|---|---|---|---|---|---|---|---|
| Initial photoelectric conversion characteristic | X | Δ | ○ | ○ | ○ | ○ | ○ | X | X | X |
| Variation of characteristic | X | Δ | X | ○ | ○ | ○ | ○ | Δ | X | X |
| Photo-degradation characteristic | X | Δ | ○ | ○ | ○ | ○ | ○ | X | X | X |
| Anti-environment characteristic | X | X | ○ | ○ | ○ | ○ | ○ | X | Δ | X |
| Adhesion | X | Δ | ○ | ○ | ○ | ○ | ○ | X | X | X |

TABLE 163

| | SiH₄ flow rate sccm | Si₂H₆ flow rate sccm | CH₄ flow rate sccm | GeH₄ flow rate sccm | H₂ flow rate sccm | PH₃/H₂ flow rate sccm | B₂H₆/H₂ flow rate sccm | SiH₄/H₂ flow rate sccm | Press. Torr | MW Power W/cm² | RF Power W/cm² | Substrate temp. °C | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 48 | | | 51 | 200 | | | | 0.010 | 0.10 | 0.25 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 35 | | | 29 | 150 | | | | 0.013 | 0.09 | 0.24 | 350 | 98 |
| RF i-layer | | 4.0 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 80 | | | | 0.8 | | 0.007 | 190 | 90 |
| RF p-layer | | | 0.4 | | 90 | | 8 | 2 | 1.6 | | 0.07 | 170 | 10 |

These ten samples were subjected to evaluation of performance in the Fame way as that in Example C-3. Results of evaluation on each of the ten samples are shown in Table 164. The evaluation was made by normalizing the values measured on the respective samples with the values measured on the sample which was produced by setting the annealing temperature to 25° C. A mark x indicates that the normalized value is not less than 1.0 but below 1.4, a mark Δ indicates that the normalized value is not less than 1.4 but below 1.8 and a mark ○ indicates that the normalized value is not less than 1.8.

From Table 164, it is understood that the temperature of annealing conducted in the atmosphere containing trace amount of oxygen atoms and trace amount of Group V element atoms most preferably ranges from 50° C. to 400° C., in order to obtain good results in regard to the initial photoelectric conversion efficiency, variation of the efficiency, photo-degradation, anti-environment characteristic against high-temperature, high-humidity atmosphere, and adhesion.

TABLE 164

| Annealing temp. °C. | 25 | 40 | 50 | 100 | 200 | 300 | 400 | 430 | 470 | 500 |
|---|---|---|---|---|---|---|---|---|---|---|
| Initial photoelectric conversion characteristic | × | Δ | ○ | ○ | ○ | ○ | ○ | × | × | × |
| Variation of characteristic | × | Δ | ○ | ○ | ○ | ○ | ○ | × | × | × |
| Photo-degradation characteristic | × | × | ○ | ○ | ○ | ○ | ○ | Δ | × | × |
| Anti-environment characteristic | × | Δ | ○ | ○ | ○ | ○ | ○ | × | × | × |
| Adhesion | × | × | ○ | ○ | ○ | ○ | ○ | Δ | × | × |

EXAMPLE C-18

This example is different from Example C-3 in that the pressure of the annealing atmosphere was varied within the range of between 0.002 Torr and 100 Torr, for the purpose of investigating the influence of the annealing atmosphere pressure on the performance such as the initial photoelectric conversion efficiency. H₂ gas was used as the diluting gas for determining the concentration of the gas containing trace amount of oxygen and the concentration of the gas containing trace amount of Group V element atoms.

In this example, triple type photovoltaic element of the type shown in FIG. 3 was produced by using the in-line type apparatus shown in FIG. 4. The process was materially the same as that in Example C-3, except that annealing conditions as shown in Table 165 and production conditions as shown in Table 166 were used.

Ten sample elements were produced while varying the pressure of the annealing atmosphere within the range of between 0.002 Torr and 100 Torr.

TABLE 165

CONDITIONS OF ANNEALING IN GAS ATMOSPHERE CONTAINING TRACE AMOUNT OF OXYGEN ATOMS AND GAS CONTAINING TRACE AMOUNT OF GROUP V ELEMENT ATOMS

| | |
|---|---|
| Type of gas containing trace amount of oxygen atoms | O₂/H₂ |
| Concentration of trace amount of oxygen atoms in whole annealing gas (ppm) | 2 |
| Type of gas containing trace amount of | PH₃/H₂ |

TABLE 165-continued

CONDITIONS OF ANNEALING IN GAS ATMOSPHERE CONTAINING TRACE AMOUNT OF OXYGEN ATOMS AND GAS CONTAINING TRACE AMOUNT OF GROUP V ELEMENT ATOMS

| | |
|---|---|
| Group V element atoms | |
| Concentration of trace amount of Group V element atoms in whole annealing gas (ppm) | 3 |

TABLE 165-continued

CONDITIONS OF ANNEALING IN GAS ATMOSPHERE CONTAINING TRACE AMOUNT OF OXYGEN ATOMS AND GAS CONTAINING TRACE AMOUNT OF GROUP V ELEMENT ATOMS

| Annealing temp. (° C.) | 330 |
|---|---|
| Annealing press. (Torr) | 0.002–100 |

TABLE 166

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 200 | | | 1.3 | | 0.05 | 350 | 20 |
| RF i-layer | | 4.0 | | | 100 | | | | 0.8 | | 0.008 | 300 | 10 |
| MW i-layer | 47 | | | 51 | 180 | | | | 0.010 | 0.08 | 0.25 | 380 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 31 | | | 28 | 150 | | | | 0.013 | 0.07 | 0.24 | 360 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 80 | | | | 0.8 | | 0.007 | 190 | 90 |
| RF p-layer | | | 0.4 | | 90 | | 8 | 2 | 1.6 | | 0.07 | 170 | 10 |

Ten samples were subjected to evaluation of performance in the same way as that in Example C-3. Results of evaluation on each of the ten samples are shown in Table 167. The evaluation was made by normalizing the values measured on the respective samples with the values measured on the sample which was produced by setting the annealing atmosphere pressure to 0.002 Torr. A mark x indicates that the normalized value is not less than 1.0 but below 1.4, a mark Δ indicates that the normalized value is not less than 1.4 but below 1.8 and a mark ○ indicates that the normalized value is not less than 1.8.

From Table 167, it is understood that the pressure of the annealing conducted the atmosphere containing trace amount of oxygen atoms and trace amount of Group V element atoms most preferably ranges from 0.01 Torr to 10 Torr, in order to obtain good results in regard to the initial photoelectric conversion efficiency, variation of the efficiency, photo-degradation, anti-environment characteristic against high-temperature, high-humidity atmosphere, and adhesion.

TABLE 167

| Annealing press (Torr) | 0.002 | 0.005 | 0.01 | 0.1 | 1 | 5 | 10 | 20 | 50 | 100 |
|---|---|---|---|---|---|---|---|---|---|---|
| Initial photoelectric conversion characteristic | X | Δ | ○ | ○ | ○ | ○ | ○ | Δ | X | X |
| Variation of characteristic | X | X | ○ | ○ | ○ | ○ | ○ | X | X | X |
| Photo-degradation characteristic | X | Δ | ○ | ○ | ○ | ○ | ○ | Δ | X | X |
| Anti-environment characteristic | X | X | ○ | ○ | ○ | ○ | ○ | Δ | X | X |
| Adhesion | X | Δ | ○ | ○ | ○ | ○ | ○ | X | X | X |

EXAMPLE C-19

This example is different from Example C-3 in that the following conditions (i) to (iv) were employed, for the purpose of investigating the influence of these conditions on the performance such as the initial photoelectric conversion efficiency.

(i) The frequency of the microwave was varied within the range of between 0.02 GHz and 50 GHz in the formation of the MW i-layer 304 of a-SiGe and in the formation of the MW i-layer 307 of a-SiGe.

(ii) He gas was used in place of Ar gas, as the diluting gas which determines the concentration of the gas containing trace amount of oxygen atoms.

(iii) Different annealing conditions were adopted in annealing treatments effected on the MW i-layer 304 of a-SiGe and the MW i-layer 307 of a-SiGe.

(iv) $H_2$ gas was used in place of Ar gas as the diluting gas which determines the concentration of the gas containing trace amount of Group V element atoms and the concentration of the gas containing trace amount of Group III element atoms.

In this Example, a photovoltaic element of the triple type shown in FIG. 3 was manufactured by using an in-line type apparatus shown in FIG. 4. The process was as substantially the same as Example C-3, except for the conditions mentioned above.

(1) A substrate having a reflecting layer 301 and a reflection enhancement layer 302 formed thereon (i.e. base member), prepared in the same way as that in Example C-1, was disposed on a substrate conveyor rails 413 laid in a load chamber 401, and the internal pressure of the load chamber 401 was lowered to $1\times10^{-5}$ Torr. by a vacuum pump (not shown).

(2) Then, gate valves 406 and 407 were opened and the substrate was conveyed into conveyance chambers 402, 403 and then into a deposition chamber 418 which had been evacuated to certain levels of vacuum by vacuum pumps which are not shown. The substrate was held such that its reverse side is kept in close contact with a substrate heater 411 so as to be heated by the heater 411, while the interior of the deposition chamber 418 was evacuated by the vacuum pump to a level of $1\times10^{-5}$ Torr.

(3) Preparation for film forming operation was thus completed. Then, $H_2$ gas was introduced into the deposition chamber 417 through a gas-introduction line 429 and the flow low rate of the H$_2$ gas was controlled to 500 sccm by means of valves 441, 431, 430, under the control of a mass-flow controller 436. At the same time, the internal pressure of the deposition chamber 417 was regulated to 1.3 Torr. by a conductance valve (not shown). Meanwhile, the substrate heater 410 was adjusted to maintain the substrate temperature at 350° C. When the substrate temperatures had been stabilized, an RF n-layer 303 of μc-Si, an RF i-layer 351 of a-Si, and an MW i-layer 304 of a-SiGe were formed in the same way as that in Example C-2. In the formation of the MW i-layer, the MW introduction window 425 was removed and, instead, an antenna-type MW introduction electrode (not shown) was used according to the frequency of -the microwave.

(4) Then, an annealing was executed in an atmosphere of a gas containing a trace amount of oxygen atoms and trace amount of Group V element atoms.

For the purpose of executing the annealing in the gas atmosphere containing a trace amount of oxygen atoms and trace amount of Group V element atoms, O$_2$/He gas (dilution: 2 ppm) as the gas containing oxygen atoms, and PF$_3$/H$_2$ gas (dilution: 4 ppm) as the gas containing trace amount of Group V element atoms and BF$_3$/H$_2$ gas (dilution: 4 ppm) were introduced into the deposition chamber 418 through the gas introduction line 449. The valves 465 and 455 were opened and the flow rate of the O$_2$/He gas (dilution: 2 ppm) was controlled to 500 sccm by means of a mass-flow controller 460. The flow rate of the PF$_3$/H$_2$ gas (dilution: 4 ppm) also was regulated to 250 sccm by means of valves and a mass-flow-controller which are not shown. The flow rate of the PF$_3$/H$_2$ gas (dilution: 4 ppm) also was regulated to 250 sccm by means of valves and a mass-flow controller which are not shown. Meanwhile, the pressure in the deposition chamber 418 was controlled to 1.2 Torr by a conductance valve (not shown).

The annealing in a gas atmosphere containing trace amount of oxygen atoms and trace amount of Group V element atoms was conducted for 10 minutes, while the substrate heater 411 was controlled to maintain the substrate temperature at 300° C. Then, the supply of the O$_2$/He gas (dilution: 2 ppm), PF$_3$/H$_2$ gas (dilution: 4 ppm) and BF$_3$/H$_2$ gas (dilution: 4 ppm) into the deposition chamber 418 was stopped, and the interior of the deposition chamber 418 and the gas line was evacuated to 1×10$^{-5}$ Torr.

(5) Then, an RF i-layer 361 of a-Si, an RF p-layer 305 of a-SiC, an RF n-layer 306 of μc-Si, an RF-i-layer 352 of a-Si, and MW i-layer 307 of a-SiGe were successively formed, in accordance with a procedure which is substantially the same as that used in Example C-2.

In the formation of the MW i-layer, the MW introduction window 425 was removed and, instead, an antenna-type MW introduction electrode (not shown) was used depending on the frequency of the microwave.

(6) Then, an annealing was executed in an atmosphere of a gas containing a trace amount of oxygen atoms and a trace amount of Group V element atoms.

For the purpose of executing the annealing in the gas atmosphere containing a trace amount of oxygen atoms and a trace amount of Group V element atoms, O$_2$/He gas (dilution: 2 ppm) as the gas containing oxygen atoms, PF$_3$/H$_2$ gas (dilution: 4 ppm) as the gas containing trace amount of Group V element atoms and. BF$_3$/H$_2$ gas (dilution: 4 ppm) as the gas containing Group III element atoms were introduced into the deposition chamber 418 through the gas introduction line 449. The valves 465 and 455 were opened and the flow rate of the O$_2$/He gas (dilution: 2 ppm) was controlled to 500 sccm by means of a mass-flow controller 460. The flow rate of the PF$_3$/H$_2$ gas (dilution: 4 ppm) also was regulated to 250 sccm by means of valves and a mass-flow controller which are not shown. The flow rate of the BF$_3$/H$_2$ gas (dilution: 4 ppm) also was regulated to 250 sccm by means of valves and a mass-flow controller which are not shown. Meanwhile, the pressure in the deposition chamber 418 was controlled to 1.3 Torr by a conductance valve (not shown).

The annealing in a gas atmosphere containing trace amount of oxygen atoms and trace amount of Group V element atoms was conducted for 10 minutes, while the substrate heater 411 was controlled to maintain the substrate temperature at 270° C. Then, the supply of the O$_2$/He gas (dilution: 2 ppm), PF$_3$/H$_2$ gas (dilution: 4 ppm) and the BF$_3$/H$_2$ gas (dilution: 4 ppm) into the deposition chamber 418 was stopped and the interior of the deposition chamber 418 and the gas line was evacuated to 1×10$^{-5}$ Torr.

(7) Then, an RF i-layer 362 of a-Si, an RF p-layer 308 of a-SiC, an RF n-layer 309 of μc-Si, an RF i-layer 310 of a-Si, and an RF p-layer 311 of a-SiC were successively formed, in accordance with a procedure which is substantially the same as that used in Example C-2, i.e., in the same way as Example A-2.

(8) Then, an ITO film of 70 nm thick, serving as a transparent conductive layer 312, was formed on the RF p-layer 311 by vacuum evaporation.

(9) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Production of the photovoltaic element of this example was thus completed. Ten samples were produced while varying the microwave frequency within the range of from 0.02 GHz to 50 GHz during formation of the MW i-layer. The conditions of the annealing in the atmosphere of the gas containing trace amount of oxygen atoms and trace amount of Group V element atoms, and the conditions employed in the formation of the RF n-layer, RF i-layer, MW i-layer and RF p-layer are shown in Tables 168, 169 and 170.

TABLE 168

CONDITIONS OF ANNEALING IN GAS ATMOSPHERE CONTAINING TRACE AMOUNT OF OXYGEN ATOMS AND GAS CONTAINING TRACE AMOUNT OF GROUP V ELEMENT ATOMS (MW i-layer 304)

| | |
|---|---|
| Type of gas containing trace amount of oxygen atoms | O$_2$/He |
| Concentration of trace amount of oxygen atoms in whole annealing gas (ppm) | 1 |
| Type of gas containing trace amount of Group V element atoms | PF$_3$/H$_2$ |
| Concentration of trace amount of Group V element atoms in whole annealing gas (ppm) | 1 |
| Type of gas containing trace amount of Group III element atoms annealing gas (ppm) | BF$_3$/H$_2$ |
| Concentration of trace amount of Group III element atoms in whole annealing gas (ppm) | 1 |
| Annealing temp. (° C.) | 300 |
| Annealing press. (Torr) | 1.2 |

TABLE 169

CONDITIONS OF ANNEALING IN GAS ATMOSPHERE CONTAINING TRACE AMOUNT OF OXYGEN ATOMS AND GAS CONTAINING TRACE AMOUNT OF GROUP V ELEMENT ATOMS (MW i-layer 307)

| | |
|---|---|
| Type of gas containing trace amount of oxygen atoms | $O_2$/He |
| Concentration of trace amount of oxygen atoms in whole annealing gas (ppm) | 1 |
| Type of gas containing trace amount of Group V element atoms | $PF_3/H_2$ |
| Concentration of trace amount of Group V element atoms in whole annealing gas (ppm) | 1 |
| Type of gas containing trace amount of Group III element atoms annealing gas (ppm) | $BF_3/H_2$ |
| Concentration of trace amount of Group III element atoms in whole annealing gas (ppm) | 1 |
| Annealing temp. (° C.) | 270 |
| Annealing press. (Torr) | 1.3 |

TABLE 170

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 67 | | | 69 | 200 | | | | 0.010 | 0.25 | 0.28 | 380 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 43 | | | 39 | 180 | | | | 0.011 | 0.25 | 0.28 | 360 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 80 | | | | 0.8 | | 0.007 | 190 | 90 |
| RF p-layer | | | 0.4 | | 990 | | 8 | 2 | 1.6 | | 0.07 | 170 | 10 |

These ten samples were subjected to evaluation of performance in the same way as that in Example C-3. Results of evaluation on each of the ten samples are shown in Table 171. The evaluation was made by normalizing the values measured on the respective samples with the values measured on the sample which was produced by using the microwave frequency of 0.02 GHz. A mark x indicates that the normalized value is not less than 1.0 but below 1.4, a mark Δ indicates that the normalized value is not less than 1.4 but below 1.8 and a mark ○ indicates that the normalized value is not less than 1.8.

From Table 171, it is understood that the frequency of the microwave, which is employed in the formation of the MW i-layer 304 of a-SiGe and the MW i-layer 307 of aSiGe which are to be annealed in the gas atmosphere containing trace amount of oxygen atoms and trace amount of Group V element atoms, most preferably ranges from 0.1 GHz to 10 GHz, in order to obtain good results in regard to the initial photoelectric conversion efficiency, variation of the efficiency, photo-degradation, antienvironment characteristic against high-temperature, high-humidity atmosphere, and adhesion.

TABLE 171

| Microwave frequency: GHz | 0.02 | 0.05 | 0.1 | 0.5 | 1 | 2.45 | 10 | 20 | 30 | 50 |
|---|---|---|---|---|---|---|---|---|---|---|
| Initial photoelectric conversion characteristic | x | x | ○ | ○ | ○ | ⊙ | ○ | x | x | x |
| Variation of characteristic | x | x | ⊙ | ⊙ | ○ | ⊙ | ○ | x | x | x |
| Photo-degradation characteristic | x | Δ | ○ | ⊙ | ⊙ | ⊙ | ○ | Δ | x | x |
| Anti-environment characteristic | x | Δ | ⊙ | ○ | ○ | ⊙ | ○ | Δ | x | x |
| Adhesion | x | x | ○ | ⊙ | ○ | ⊙ | ○ | x | x | x |

EXAMPLE C-20

In this example, a triple type photovoltaic element of the type shown in FIG. 3 was produced by using the roll-to-roll type apparatus shown in FIG. 6. The annealing was conducted by using various combinations of annealing conditions in the atmosphere containing trace amount of oxygen atoms and trace amount of Group V element atoms. The production process was as follows.

(1) A sheet-like substrate (base member) of 30 cm wide, composed of a substrate of a stainless steel and carrying a reflecting layer such as of Ag (or Al—Si or the like) and a reflection enhancement layer such as of Zno, was rolled up and set in a loading chamber 5010 for loading sheet-type substrate.

(2) The sheet-type substrate was threaded through all the deposition chambers and all the gas gates, and was connected to a sheet take-up jig disposed in an unload chamber 5150.

(3) The deposition chambers were evacuated to a level of $10^{-3}$ Torr or lower by evacuating systems which are not shown. Material gases were supplied to the deposition chambers, from mixing devices 5024, 5034, 5044, 5054, 5064, 5074, 5084, 5094, 5104, 5114, 5124, 5134 and 5144 associated with the respective deposition chambers.

(4) Gases containing trace amounts of oxygen atoms and gases containing trace amounts of Group V element atoms were supplied from the respective gate gas supply devices to the gas gates 5201, 5202, 5203, 5204, 5205, 5206, 5207, 5208, 5209, 5210, 5211, 5212, 5213 and 5214.

In this example, the gap in the gas gate through which the sheet-type substrate passes was variable, and the gases containing trace amount of oxygen atoms and trace amount of Group V element atoms were supplied to the gas gates at a total flow rate of 1000 sccm. The temperature of the annealing in the atmosphere containing trace amount of oxygen atoms and trace amount of Group V element atoms was controlled to range between 350° C. and 50° C. by means of heaters incorporated in the gas gates. At the same time, the annealing pressure was controlled to range between 3 Torr and 1 Torr, by means of an evacuating system which is not shown.

(5) The substrate was heated by a substrate heater of each deposition device, and the level of the vacuum in each deposition device was controlled by operating an evacuating valve of each evacuation device. Advance of the sheet-type substrate was commenced when the substrate temperature and the vacuum level had been settled, and RF power for generating plasma and MW power (frequency 2.45 GHz) were supplied to each deposition device.

A triple-type solar cell having three pin structures stacked on one on another on the sheet-type substrate 300 was thus produced.

(6) Then, an ITO film of 70 nm thick, serving as a transparent conductive layer 312, was formed on the RF p-layer 311 by vacuum evaporation.

(7) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of this example was thus completed. This element will be referred to as "SC/C-20". The conditions of the annealing in gas atmosphere containing trace amount of oxygen atoms and trace amount of Group V element atoms in this example, as well as the conditions of film-forming processes for forming the RF n-layer, RF i-layer, MW i-layer and RF-p layer are collectively shown in Tables 172 and 173.

TABLE 172

CONDITIONS OF ANNEALING IN ATMOSPHERE FORMED OF GAS CONTAINING TRACE AMOUNT OF OXYGEN ATOMS AND GAS CONTAINING TRACE AMOUNT OF ATOMS OF GROUP V ELEMENT

| Gas gate | Type of Gas containing oxygen atoms | Concentration of trace amount of oxygen atoms in whole annealing gas (ppm) | Type of gas Containing Group V element atoms | Concentration of trace amount of Group V element atoms in whole annealing gas (ppm) | Type of gas containing Group III element atoms | Concentration of trace amount of Group III element atoms in whole annealing gas (ppm) | Annealing temp. (° C.) | Annealing press. (Torr) |
|---|---|---|---|---|---|---|---|---|
| 5201 | $O_2/He$ | 500 | $PH_3/H_2$ | 500 | | | 350 | 3.0 |
| 5202 | $O_2/H_2$ | 3 | $PF_3/H_2$ | 2 | | | 350 | 2.0 |
| 5203 | $O_2/H_2$ | 1 | $PF_5/He$ | 2 | $BF_3/H_2$ | 3 | 350 | 1.6 |
| 5204 | $O_2/He$ | 1 | $PH_3/H_2$ | 2 | $BF_3/He$ | 3 | 300 | 1.2 |
| 5205 | NO/He | 1 | $PH_5/H_2$ | 1 | | | 300 | 2.5 |
| 5206 | NO/He | 200 | $PH_5/H_2$ | 200 | $B_2H_6/He$ | 200 | 300 | 2.3 |
| 5207 | $O_2/H_2$ | 10 | $PH_3/He$ | 2 | $BF_3/H_2$ | | 300 | 1.9 |
| 5208 | $O_2/H_2$ | 1 | $PF_5/He$ | 1 | $BF_3H_2$ | 3 | 350 | 1.3 |
| 5209 | $O_2/H_2$ | 1 | $PF_3/He$ | 1 | | 3 | 280 | 1.0 |
| 5210 | $O_2/He$ | 2 | $PH_3/H_2$ | 1 | | | 260 | 2.3 |
| 5211 | NO/He | 100 | $PF_3/H_2$ | 200 | $B_2H_2/He$ | 200 | 230 | 2.2 |
| 5212 | $O_2/H_2$ | 1 | $PH_3/He$ | 2 | | | 190 | 1.3 |
| 5213 | $O_2/He$ | 3 | $PF_5/He$ | 1 | | | 170 | 2.0 |
| 5214 | $O_2/H_3$ | 500 | $PH_3/H_2$ | 1 | | | 50 | 2.0 |

TABLE 173

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power W/cm$^2$ | RF Power W/cm$^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 47 | | | 50 | 180 | | | | 0.005 | 0.07 | 0.28 | 380 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 33 | | | 30 | 160 | | | | 0.005 | 0.07 | 0.28 | 360 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 65 | | | | 0.8 | | 0.007 | 190 | 90 |
| RF p-layer | | | 0.4 | | 90 | | 8 | 2 | 1.6 | | 0.07 | 170 | 10 |

Comparative Example C20-1

A process was conducted as Comparative Example C20-1 This process was different from Example C-20 in that it omitted the annealing in the gas atmosphere containing trace amount of oxygen atoms and trace amount of Group V element atoms and that $H_2$ or He gas as desired was supplied to each gas gate.

Other conditions were materially the same as those in Example C-20. The photovoltaic element produced in Comparative Example C 20-1 will be referred to as "SC/CC20-1".

Seven samples of the photovoltaic elements SC/C-20, as well as seven samples of the photovoltaic elements SC/CC20-1, were produced and were subjected, basically in the same way as Example A-1 and Comparative Example A1-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The photo-degradation was evaluated by setting the element temperature to 45° C. and the photo-irradiation time to 1200 hours. The anti-environment characteristic was valuated by setting the temperature to 89° C., the humidity to 92% and the time of shelving in the dark place to 230 hours. The results are shown in Table 174.

The performance of the photovoltaic element is shown in Table 174 in terms of values measured on the samples of the photovoltaic element SC/C-20 as normalized by the values measured on the samples of the photovoltaic element SC/CC20-1.

TABLE 174

| Items of evaluation | Evaluation |
| --- | --- |
| Initial photoelectric conversion efficiency characteristic | 1.56 |
| Variation of Initial photoelectric conversion efficiency characteristic | 0.83 |
| Photo-degradation characteristic | 0.81 |
| Anti-environment characteristic | 0.83 |
| SEM observation of sectional face | 0.92 |
| Measurement of adhesion: Delamination | No delamination in SC/C-20 Slight delamination in SC-CC20-1 |

From Table 174, it is understood that the photovoltaic element SC/C-20 of this example exhibits superiority to the comparative example SC/CC20-1 in all items of the evaluation.

EXAMPLE C-21

In this example, a triple type photovoltaic element was produced by using the roll-to-roll type apparatus shown in FIG. 6. The annealing was conducted under various combinations of annealing conditions conducted in an atmosphere containing trace amount of oxygen atoms and trace amount of Group V element atoms. The production process was as follows.

(1) A sheet-like substrate (base member) of 30 cm wide, composed of a substrate of a stainless steel and carrying a reflecting layer such as of Ag (or Al—Si or the like) and a reflection enhancement layer such as of ZnO, was rolled up and set in a loading chamber 5010 for loading sheet-type substrate. The sheet-type substrate was threaded through all the deposition chambers and all the gas gates, and was connected to a sheet take-up jig disposed in an unload chamber 5150. The deposition chambers were evacuated to a level of $10^{-3}$ Torr or lower by evacuating systems which are not shown.

(2) Material gases were supplied to the deposition chambers, from mixing devices 5024, 5034, 5044, 5054, 5064, 5074, 5084, 5094, 5104, 5114, 5124, 5134 and 5144 associated with the respective deposition chambers.

(3) Gases containing trace amounts of oxygen atoms and gases containing trace amounts of Group V element atoms were supplied from the respective gate gas supply devices to the gas gates 5201, 5202, 5203, 5204, 5205, 5206, 5207, 5208, 5209, 5210, 5211, 5212, 5213 and 5214.

In this example, the gap in the gas gate through which the sheet-type substrate passes was variable, and the gases containing trace amount of oxygen atoms and trace amount of Group V element atoms were supplied to the gas gates at a total flow rate of 1000 sccm. The temperature of the annealing in the atmosphere containing trace amount of oxygen atoms and trace amount of Group V element atoms was controlled to range between 350° C. and 250° C. by means of heaters incorporated in the gas gates. At the same time, the annealing pressure was controlled to range between 3 Torr and 1 Torr, by means of an evacuating system which is not shown.

(4) The substrate was heated by a substrate heater of each deposition device, and the level of the vacuum in each deposition device was controlled by operating an evacuating valve of each evacuation device. Advance of the sheet-type substrate was commenced when the substrate temperature and the vacuum level had been settled, and RF power for generating plasma and MW power (frequency 0.5 GHz) were supplied to each deposition chamber. An antenna-type MW introduction electrode was used in the MW power supply system.

A triple-type solar cell having three pin structures stacked on one on another on the sheet-type substrate 300 was thus produced.

(5) Then, an ITO film of 70 nm thick, serving as a transparent conductive layer 312, was formed on the RF p-layer 311 by vacuum evaporation.

(6) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of this example was thus completed. This element will be referred to as "SC/C-21". The conditions of the annealing in gas atmosphere containing trace amount of oxygen atoms and trace amount of Group V element atoms in this example, as well as the conditions of film-forming processes for forming the RF n-layer, RF i-layer, MW i-layer and RF-p layer are collectively shown in Tables 175 and 176.

TABLE 175

CONDITIONS OF ANNEALING IN ATMOSPHERE FORMED OF GAS CONTAINING TRACE AMOUNT OF OXYGEN ATOMS AND GAS CONTAINING TRACE AMOUNT OF ATOMS OF GROUP V ELEMENT

| Gas gate | Type of Gas containing oxygen atoms | Concentration of trace amount of oxygen atoms in whole annealing gas (ppm) | Type of gas Containing Group V element atoms | Concentration of trace amount of Group V element atoms in whole annealing gas (ppm) | Type of gas containing Group III element atoms | Concentration of trace amount of Group III element atoms in whole annealing gas (ppm) | Annealing temp. (° C.) | Annealing press. (Torr) |
|---|---|---|---|---|---|---|---|---|
| 5201 | $O_2/Ar$ | 500 | $PH_5/He$ | 500 | | | 350 | 3.0 |
| 5202 | $CO_2/H_2$ | 3 | $PF_3/H_2$ | 2 | | | 350 | 2.0 |
| 5203 | $O_2/H_2$ | 1 | $PF_3/He$ | 2 | $BF_3/H_2$ | 4 | 350 | 1.6 |
| 5204 | $O_2/He$ | 1 | $PH_3/H_2$ | 2 | $BF_3/He$ | 3 | 300 | 1.2 |
| 5205 | $CO/He$ | 6 | $PH_3/H_2$ | 1 | | | 300 | 2.5 |
| 5206 | $NO/Ar$ | 200 | $PH_5/Ar$ | 200 | $B_2H_6/He$ | 200 | 300 | 2.3 |
| 5207 | $O_2/He$ | 10 | $PH_3/He$ | 2 | | | 300 | 1.9 |
| 5208 | $O_2/H_2$ | 1 | $PF_3/He$ | 1 | $BF_3/H_2$ | 4 | 350 | 1.3 |
| 5209 | $O_2/H_2$ | 1 | $PF_3/He$ | 1 | $BF_3/H_2$ | 3 | 280 | 1.0 |
| 5210 | $CO/He$ | 2 | $PH_3/He$ | 1 | | | 260 | 2.3 |
| 5211 | $NO/Ar$ | 90 | $PF_3/Ar$ | 200 | $B_2H_6/He$ | 200 | 230 | 2.2 |
| 5212 | $O_2/H_2$ | 1 | $PH_3/He$ | 2 | | | 190 | 1.3 |
| 5213 | $O_2/He$ | 3 | $PF_3/He$ | 1 | | | 170 | 2.0 |
| 5214 | $O_2/He$ | 500 | $PH_3/H_2$ | 1 | | | 50 | 2.0 |

TABLE 176

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 45 | | | 47 | 180 | | | | 0.004 | 0.11 | 0.30 | 380 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 31 | | | 29 | 160 | | | | 0.004 | 0.10 | 0.30 | 360 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 80 | | | | 0.7 | | 0.007 | 190 | 90 |
| RF p-layer | | | 0.4 | | 90 | | 8 | 2 | 1.6 | | 0.07 | 170 | 10 |

Comparative Example C 21-1

A process was conducted as Comparative Example C 21-1. This process was different from Example C-21 in that it omitted the annealing in the gas atmosphere containing trace amount of oxygen atoms and trace amount of Group V element atoms, and that $H_2$ gas, He gas or Ar gas as desired was supplied to each gas gate.

Other conditions were materially the same as those in Example C-21. The photovoltaic element produced in Comparative Example C 21-1 will be referred to as "SC/CC21-1".

Six samples of the photovoltaic elements SC/C-21, as well as six samples of the photovoltaic elements SC/CC211, were produced and were subjected, basically in the same way as Example A-1 and Comparative Example A1-1, for evaluation of various items of performance such as initial photoelectric conversion efficiency (photovoltage/incident photo-power), variation or lack of uniformity of the conversion efficiency, photo-degradation, anti-environment characteristic against high-temperature and high-humidity environment, SEM observation of cut surface, and adhesion.

The photo-degradation characteristic was measured by setting the element temperature to 42° C. and the photo-irradiation time to 1200 hours. The anti-environment characteristic was evaluated by setting the temperature to 88° C., the humidity to 93% and the time of shelving in the dark place to 330 hours. The results are shown in Table 177.

The performance of the photovoltaic element is shown in Table 177 in terms of values measured on the samples of the photovoltaic element SC/C-21 as normalized by the values measured on the samples of the photovoltaic element SC/CC21-1.

TABLE 177

| Items of evaluation | Evaluation |
|---|---|
| Initial photoelectric conversion efficiency characteristic | 1.52 |
| Variation of Initial photoelectric conversion efficiency characteristic | 0.83 |

TABLE 177-continued

| Items of evaluation | Evaluation |
|---|---|
| Photo-degradation characteristic | 0.81 |
| Anti-environment characteristic | 0.84 |
| SEM observation of sectional face | 0.92 |
| Measurement of adhesion: Delamination | No delamination in SC/B-6 Slight delamination in SC-CC21-1 |

From Table 177, it is understood that the photovoltaic element SC/C-21 of this example exhibits superiority to the comparative example SC/CC21-1 in all items of the evaluation.

EXAMPLE C-22

In this example, a triple type photovoltaic element was produced by using the roll-to-roll type apparatus shown in FIG. 6. The annealing was conducted under various combinations of conditions of annealing in the atmosphere containing trace amount of oxygen atoms and trace amount of Group V element atoms. The production process was as follows.

(1) A sheet-like substrate (base member) of 30 cm wide, composed of a substrate of a stainless steel and carrying a reflecting layer such as of Ag (or Al—Si or the like) and a reflection enhancement layer such as of ZnO, was rolled up and set in a loading chamber 5010 for loading sheet-type substrate. The sheet-type substrate was threaded through all the deposition chambers and all the gas gates, and was connected to a sheet take-up jig disposed in an unload chamber 5150. The deposition chambers were evacuated to a level of $10^{-3}$ Torr or lower by evacuating systems which are not shown.

(2) Material gases were supplied to the deposition chambers, from mixing devices 5024, 5034, 5044, 5054, 5064, 5074, 5084, 5094, 5104, 5114, 5124, 5134 and 5144 associated with the respective deposition chambers.

(3) Gases containing trace amounts of oxygen atoms and gases containing trace amounts of Group V element atoms were supplied from the respective gate gas supply devices to the gas gates 5201, 5202, 5203, 5204, 5205, 5206, 5207, 5208, 5209, 5210, 5211, 5212, 5213 and 5214.

In this example, the gap in the gas gate through which the sheet-type substrate passes was variable, and the gases containing trace amount of oxygen atoms and trace amount of Group V element atoms were supplied to the gas gates at a total flow rate of 1400 sccm. The temperature of the annealing in the atmosphere containing trace amount of oxygen atoms and trace amount of Group V element atoms were controlled to range between 350° C. and 50° C. by means of heaters incorporated in the gas gates. At the same time, the annealing pressure was controlled to range between 3 Torr and 1 Torr, by means of an evacuating system which is not shown.

(4) The substrate was heated by a substrate heater of each deposition device, and the level of the vacuum in each deposition device was controlled by operating an evacuating valve of each evacuation device. Advance of the sheet-type substrate was commenced when the substrate temperature and the vacuum level had been settled, and RF power for generating-plasma and MW power (frequency 0.1 GHz) were supplied to each deposition chamber. An antenna-type MW introduction electrode was used in the MW power supply system.

A triple-type solar cell having three pin structures stacked on one on another on the sheet-type substrate 300 was thus produced.

(5) Then, an ITO film of 70 nm thick, serving as a transparent conductive layer 312, was formed on the RF p-layer 311 by vacuum evaporation.

(6) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of this example was thus completed. This element will be referred to as "SC/C-22". The conditions of the annealing in gas atmosphere containing trace amount of oxygen atoms in this example, as well as the conditions of film-forming processes for forming the RF n-layer, RF i-layer, MW i-layer and RF-p layer are collectively shown in Tables 178 and 179.

TABLE 178

CONDITIONS OF ANNEALING IN ATMOSPHERE FORMED OF GAS CONTAINING TRACE AMOUNT OF OXYGEN ATOMS AND GAS CONTAINING TRACE AMOUNT OF ATOMS OF GROUP V ELEMENT

| Gas gate | Type of gas containing oxygen atoms | Concentration of trace amount of oxygen atoms in Whole annealing gas (ppm) | Type of gas Containing Group V element atoms | Concentration of trace amount of Group V element atoms in whole annealing gas (ppm) | Type of gas containing Group III element atoms | Concentration of trace amount of Group III element atoms in whole annealing gas (ppm) | Annealing temp. (° C.) | Annealing press. (Torr) |
|---|---|---|---|---|---|---|---|---|
| 5201 | $O_2$/Ar | 500 | $PH_3$/He | 500 | | | 350 | 3.0 |
| 5202 | $CO_2$/$H_2$ | 3 | $PF_3$/$F_2$ | 2 | | | 350 | 2.0 |
| 5203 | $O_2$/$H_2$ | 1 | $PF_5$/He | 2 | $BF_3$/$H_2$ | 4 | 350 | 1.6 |
| 5204 | $O_2$/He | 1 | $PH_3$/$H_2$ | 2 | $BF_3$/$H_2$ | 3 | 300 | 1.2 |
| 5205 | CO/He | 6 | $PH_3$/$H_2$ | 1 | | | 300 | 2.5 |
| 5206 | NO/Ar | 150 | $PF_3$/Ar | 150 | $B_2H_6$/He | 150 | 300 | 2.3 |
| 5207 | $O_2$/He | 10 | $PH_3$/He | 2 | | | 300 | 1.9 |
| 5208 | $O_2$/$H_2$ | 1 | $PF_3$/He | 1 | $BF_3$/$H_2$ | 4 | 350 | 1.3 |
| 5209 | $O_2$/$H_2$ | 1 | $PF_5$/He | 1 | $BF_3$/$H_2$ | 3 | 280 | 1.0 |
| 5210 | CO/He | 2 | $PH_3$/He | 1 | | | 260 | 2.3 |
| 5211 | NO/Ar | 90 | $PF_5$Ar | 200 | $B_2H_6$/He | 200 | 230 | 2.2 |
| 5212 | $O_2$/$H_2$ | 1 | $PH_3$/He | 2 | | | 190 | 1.3 |

TABLE 178-continued

CONDITIONS OF ANNEALING IN ATMOSPHERE FORMED OF GAS CONTAINING TRACE AMOUNT OF
OXYGEN ATOMS AND GAS CONTAINING TRACE AMOUNT OF ATOMS OF GROUP V ELEMENT

| Gas gate | Type of gas containing oxygen atoms | Concentration of trace amount of oxygen atoms in Whole annealing gas (ppm) | Type of gas Containing Group V element atoms | Concentration of trace amount of Group V element atoms in whole annealing gas (ppm) | Type of gas containing Group III element atoms | Concentration of trace amount of Group III element atoms in whole annealing gas (ppm) | Annealing temp. (° C.) | Annealing press. (Torr) |
|---|---|---|---|---|---|---|---|---|
| 5213 | $O_2$/He | 3 | $PF_3$/He | 1 | | | 170 | 2.0 |
| 5214 | $O_2$/He | 500 | $PH_3$/$H_2$ | 1 | | | 50 | 2.0 |

TABLE 179

| | $SiH_4$ flow rate sccm | $Si_2H_6$ flow rate sccm | $CH_4$ flow rate sccm | $GeH_4$ flow rate sccm | $H_2$ flow rate sccm | $PH_3$/$H_2$ flow rate sccm | $B_2H_6$/$H_2$ flow rate sccm | $SIH_4$/$H_2$ flow rate sccm | Press. Torr | MW Power W/cm$^2$ | RF Power W/cm$^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 46 | | | 48 | 225 | | | | 0.004 | 0.26 | 0.29 | 380 | 90 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 31 | | | 29 | 150 | | | | 0.004 | 0.26 | 0.29 | 375 | 85 |
| RF i-layer | | 4.0 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 80 | | | | 0.7 | | 0.007 | 190 | 88 |
| RF p-layer | | | 0.4 | | 90 | | 8 | 2 | 1.6 | | 0.07 | 170 | 10 |

Comparative Example C22-1

A process was conducted as Comparative Example C22-1. This process was different from Example C-22 in that it omitted the annealing in the gas atmosphere containing trace amount of oxygen atoms and trace amount of Group V element atoms and that $H_2$ gas, He gas or Ar gas as desired was supplied to each gas gate.

Other conditions were materially the same as those in Example C-22. The photovoltaic element produced in Comparative Example C 22-1 will be referred to as "SC/CC22-1".

Eight samples of the photovoltaic elements SC/C-22, as well as eight samples of the photovoltaic elements SC/CC22-1, were produced and were subjected, basically in the same way as Example A-1 and Comparative Example A1-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The photo-degradation characteristic was measured by setting the element temperature to 41° C. and the photo-irradiation time to 1200 hours. The anti-environment characteristic was evaluated by setting the temperature to 90° C., the humidity to 93% and the time of shelving in the dark place to 320 hours. The results are shown in Table 180.

The performance of the photovoltaic element is shown in Table 180 in terms of values measured on the samples of the photovoltaic element SC/C-22 as normalized by the values measured on the samples of the photovoltaic element SC/CC22-1.

TABLE 180

| Items of evaluation | Evaluation |
|---|---|
| Initial photoelectric conversion efficiency characteristic | 1.52 |
| Variation of Initial photoelectric conversion efficiency characteristic | 0.82 |
| Photo-degradation characteristic | 0.82 |
| Anti-environment characteristic | 0.84 |
| SEM observation of sectional face | 0.91 |
| Measurement of adhesion: Delamination | No delamination in SC/C-22 Slight delamination in SC-CC22-1 |

From Table 180, it is understood that the photovoltaic element in SC/C-22 of this example exhibits superiority to the comparative example SC/CC22-1 in all items of the evaluation.

EXAMPLE C-23

Using the in-line type apparatus shown in FIG. 4, four types of samples of mono-film were prepared for measurement of interface defect density. More specifically, these four samples are a sample Ca in which the mono-film of a formed semiconductor layer is an RF n-layer, a sample Cb in which the mono-film of a formed semiconductor layer is an RF i-layer, a sample Cc in which the mono-film of a formed semiconductor layer is an MW i-layer, and a sample Cd in which the mono-film of a formed semiconductor layer is an RF p-layer.

The process for preparing these samples was as follows.

(1) A substrate (base member) for each sample was prepared by effecting, on a substrate 100 of quartz glass of 25 mm wide, 50 mm long and 0.8 mm thick, supersonic cleaning conducted by employing acetone and isopropanol, followed by drying with heated air.

(2) A Cr layer of 5 nm thick was formed on the surface of the substrate 100 of quartz glass by sputtering.

(3) Then, one of n-type semiconductor layer, i-type semiconductor layer and p-type semiconductor layer was formed to a thickness of 1 μm by the same method as that used in Example C-1, and the substrate having such semiconductor layer was subjected to annealing in atmosphere of a gas containing trace amount of oxygen atoms and trace amount of Group V element atoms, in the same way as that in Example C-1.

Samples of mono-films for the purpose of measurement of interface defect density were thus prepared. The conditions of the annealing in gas atmosphere containing trace amount of oxygen atoms and trace amount of Group V element atoms in this example, as well as the conditions of film-forming processes for forming the RF n-layer, RF i-layer, MW i-layer and RF-p layer are collectively shown in Tables 181 and 182.

Comparative Example C 23-1

A process was conducted as Comparative Example C 23-1. This process was different from Example C-23 in that the semiconductor layers were formed without the step of annealing in the gas atmosphere containing trace amount of oxygen atoms and trace amount of Group V element atoms.

Other conditions were materially the same as those in Example C-23. The mono-film for measurement of interface defect density prepared in Comparative Example C23-1 will be referred to as "SC/CC23-1".

Three samples of mono-film Ca to Cd, as well as three samples of mono-film SC/C23-1, were produced and were subjected to PDS (Photothermal Deflection Spectroscopy) measurement in the same way as that in Example A-17. The results are shown in Table 183. The measurement results are shown in this Table in terms of values measured on the samples Ca to Cd normalized with the values measured on the samples of the comparative example, i.e., SC/CC23-1. Thus, the values shown in table 183 shows the ratio of reduction in the interface defect density.

TABLE 183

| Sample name | Type of semiconductor layer formed | Reduction of interfacial defect density |
|---|---|---|
| Ca | RF n-layer | 0.92 |
| Cb | RF i-layer | 0.88 |

TABLE 181

CONDITIONS OF ANNEALING IN ATMOSPHERE FORMED OF GAS CONTAINING TRACE AMOUNT OF OXYGEN ATOMS AND GAS CONTAINING TRACE AMOUNT OF ATOMS OF GROUP V ELEMENT

| Sample | Type of gas containing oxygen atoms | Concentration of trace amount of Oxygen atoms in Whole annealing gas (ppm) | Type of gas containing Group V element atoms | Concentration of trace amount of Group V element atoms in whole annealing gas (ppm) | Annealing temp. (° C.) | Annealing press. (Torr) |
|---|---|---|---|---|---|---|
| Ca | $O_2$/Ar | 110 | $PH_3$/Ar | 500 | 350 | 3 |
| Cb | $O_2$/He | 3 | $PF_3/H_2$ | 1 | 250 | 2 |
| Cc | $O_2/H_2$ | 4 | $PF_3/H_2$ | 1 | 300 | 1.5 |
| Cd | $CO_2$/He | 220 | $PH_3$/He | 30 | 230 | 3 |

TABLE 182

| Sample | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SiH_4/H_2$ flow rate sccm | Press. Torr | MW Power $W/cm^2$ | RF Power $W/cm^2$ | Substrate temp. ° C. |
|---|---|---|---|---|---|---|---|---|---|---|---|---|
| Ca RF n-layer | 2.5 | | | | 80 | 180 | | | 1.0 | | 0.05 | 350 |
| Cb RF i-layer | | 4.5 | | | 130 | | | | 0.7 | | 0.008 | 300 |
| Cc MW i-layer | 45 | | | 47 | 180 | | | | 0.006 | 0.08 | 0.30 | 380 |
| Cd RF i-layer | | | 0.3 | | 80 | | 15 | 2 | 2.0 | | 0.07 | 230 |

TABLE 183-continued

| Sample name | Type of semiconductor layer formed | Reduction of interfacial defect density |
|---|---|---|
| Cc | MW i-layer | 0.86 |
| Cd | RF p-layer | 0.94 |

From Table 183, it is understood that the samples of the Example C-23, which have undergone the annealing in atmosphere gas containing trace amount of oxygen atoms and trace amount of Group V element atoms in accordance with the invention, exhibit smaller density of interface defects and, hence, superior performance, as compared with the samples of Comparative Example (SC/CC23-1) which were prepared without such annealing.

EXAMPLE D-1

In this Example, a photovoltaic element of the type shown in FIG. 1 was manufactured by using an in-line type apparatus shown in FIG. 5, in accordance with the following procedure.

(1) A substrate (base member) was prepared as follows. A substrate 100 of a stainless steel of 50 mm long, 50 mm wide and 0.5 mm thick was subjected to an ultrasonic cleaning which was conducted by using acetone and propanol, followed by drying with heated air. A light reflecting layer 101 of Ag, having a thickness of 0.3 pm, was formed on the stainless steel substrate 100 by sputtering at room temperature. Then, a reflection enhancement layer 102 of ZnO, having a thickness of 1.0 pm, was formed on the reflecting layer 101 at 350° C., thus completing preparation of the substrate (base member).

(2) A deposition apparatus 400 is capable of performing both MWPCVD process and RFPCVD process. Semiconductor layers were formed on the reflection enhancement layer by using this apparatus.

Material gas cylinders, which were not shown, were connected to the deposition apparatus, through gas introduction lines. These cylinders contained material gases of ultra-high purity. More specifically, the following material gas cylinders were connected: an $SiH_4$ gas cylinder, $O_2/H_2$ (dilution: 1 ppm) gas cylinder, an $O_2/He$ (dilution: 10 ppm) gas cylinder, an $O_2/Ar$ (dilution 100 ppm) gas cylinder, an $O_2/H_2$ (dilution: 1000 ppm) gas cylinder, a $CH_4$ gas cylinder, a $GeH_4$ gas cylinder, an $S_2H_6$ gas cylinder, a $PH_3/H_2$ gas (dilution: 0.1%) gas cylinder, a $B_2H_6/H_2$ (dilution: 0.2%) gas cylinder, an $H_2$ gas cylinder, an He gas cylinder, an $SiCl_2H_2$ gas cylinder and an $SiH_4/H_2$ (dilution: 1%) gas cylinder.

(3) The substrate having the reflecting layer 101 and the reflection enhancement layer 102 formed thereon (i.e. base member) was disposed on a substrate conveyor rails 413 laid in a load chamber 401, and the internal pressure of the load chamber 401 was lowered to $1 \times 10^{-5}$ Torr. by a vacuum pump (not shown). Then, a gate valve 406 was opened and the substrate was conveyed into a conveyance chamber 402 and then into a deposition chamber 417 which have been evacuated to certain levels of vacuum by vacuum pumps which are not shown. The substrate was held such that its reverse side is kept in close contact with a substrate heater 410 so as to be heated by the heater 410, while the interior of the deposition chamber 417 was evacuated by the vacuum pump to a level of $1 \times 10^{-5}$ Torr.

(4) Preparation for film forming operation was thus completed. Then, $H_2$ gas was introduced into the deposition chamber 417 through a gels-introduction line 429 and the flow rate of the $H_2$ gas was controlled to 500 sccm by means of valves 441, 431, 430, under the control of a mass-flow controller 436. At the same time, the internal pressure of the deposition chamber 417 was regulated to 1.0 Torr. by a conductance valve (not shown). Meanwhile, the substrate heater 410 was adjusted to maintain the substrate temperature at 350° C.

(5) An RF n-layer 103 of $\mu c$-Si was formed when the substrate temperature has become steady.

To this end, valves 443, 433, 444 and 434 were operated to introduce the $SiH_4$ gas and $PH_3/H_2$ gas into the deposition chamber 417 through the gas introduction line 429. Flow rates of the $SiH_4$ gas, $H_2$ gas and the $PH_3/H_2$ gas were controlled to 2 sccm, 100 sccm and 200 sccm, respectively, by means of the mass-flow controllers 438, 436 and 439, while the pressure in the deposition chamber 417 was controlled to 1.0 Torr. The power of an RF power supply 422 was set to 0.05 W/cm$^2$, and RF power was introduced from this power supply into a plasma-forming cup 420, so as to trigger a glow discharge, thereby starting formation of the RF n-layer on the substrate. The RF power was turned off when the thickness of the RF n-layer has reached 20 nm, thus terminating the glow discharge to complete the formation of the RF n-layer 103. The supply of the $SiH_4$, gas, $PH_3/H_2$ gas and $H_2$ gas into the deposition chamber 417 was stopped and the interior of the deposition chamber and the gas line were evacuated to $1 \times 10^{-5}$ Torr.

(6) Then, an annealing was executed in an atmosphere of a gas containing a trace amount of oxygen atoms under the influence of a static magnetic field.

For the purpose of executing the annealing in the gas atmosphere containing a trace amount of oxygen atoms and under the influence of a static magnetic field, $O_2/H_2$ gas (dilution: 1 ppm) was introduced into the deposition chamber 417 through the gas introduction line 429. The valves 442 and 432 were opened and the flow rate of the $O_2/H_2$ gas (dilution 1 ppm) was controlled to 500 sccm by means of a mass-flow controller 437. An alnico magnet 495 of 2500 gauss, having a height adjusting mechanism, was arranged as means for applying static magnetic field. Meanwhile, the pressure in the deposition chamber 417 was controlled to 1.5 Torr by a conductance valve (not shown).

The annealing in accordance with the invention in a gas atmosphere containing trace amount of oxygen atoms under influence of a static magnetic field was conducted for 10 minutes, while the substrate heater 410 was controlled to maintain the substrate temperature at 350° C. Then, the alnico magnet 495 of 2500 gauss having height adjusting mechanism, serving as the means for applying static magnetic field, was demounted and the supply of the $O_2/H_2$ gas (dilution: 1 ppm) into the deposition chamber 417 was stopped. Then, the interior of the deposition chamber 417 and the gas line was evacuated to $1 \times 10^{-5}$ Torr.

(7) Then, an RF i-layer 151 of a-Si, an MW i-layer 104 of a-SiGe, an RF i-layer 161 of a-Si and an RF p-layer 105 of a-SiC were successively formed, in accordance with steps (7-1) to (8) of Example A-1.

An ITO film of 70 nm thick, serving as a transparent conductive layer 112, was formed on the RF p-layer 105 by vacuum evaporation and a comb-shaped collector electrode 113 of Cr(40 nm)/Ag(1000 nm)/Cr(40 nm) was formed thereon by vacuum evaporation, in accordance with the steps (9) and (10) in Example A-1.

Fabrication of the photovoltaic element of this example of the type shown in FIG. 1 was thus completed. This element will be referred to as "SC/D-1". The conditions of the annealing in gas atmosphere containing trace amount of oxygen atoms under static magnetic field in this example, as well as the conditions of film-forming processes for forming the RF n-layer, RF i-layer, MW i-layer and RF-p layer are collectively shown in Tables 184 and 185.

TABLE 184

CONDITIONS OF ANNEALING UNDER STATIC MAGNETIC FIELD IN GAS ATMOSPHERE CONTAINING TRACE AMOUNT OF OXYGEN ATOMS

| | |
|---|---|
| Type of gas containing oxygen atoms | $O_2/H_2$ |
| Gas concentration (dilution: ppm) | 1 |
| Type of magnet | ALNICO |
| Magnetic field intensity (G) | 2500 |
| Annealing temp. (° C.) | 350 |
| Annealing press. (Torr) | 1.5 |

TABLE 185

| SC Ex. 1 | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SiH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer (103) | 2 | | | | 100 | 200 | | | 1.0 | | 0.05 | 350 | 20 |
| RF i-layer (151) | | 4 | | | 110 | | | | 0.7 | | 0.008 | 300 | 10 |
| MW i-layer (104) | 50 | | | 40 | 150 | | | | 0.006 | 0.08 | 0.30 | 380 | 170 |
| RF i-layer (161) | | 3 | | | 80 | | | | 0.7 | | 0.007 | 250 | 20 |
| RF p-layer (105) | | | 0.3 | | 60 | | 10 | 2 | 2.0 | | 0.07 | 230 | 10 |

TABLE 186

| Items of evaluation | Evaluation |
|---|---|
| Initial photoelectric conversion efficiency characteristic | 1.31 |
| Variation of Initial photoelectric conversion efficiency characteristic | 0.88 |
| Photo-degradation characteristic | 0.88 |
| Anti-environment characteristic | 0.86 |
| SEM observation of sectional face | 0.94 |
| Measurement of adhesion: Delamination | No delamination in SC/D-1 Slight delamination in SC/CD1-1 |

From the results shown in Table 186, it will be seen that all the sample photovoltaic elements SC/D-1 in accordance Comparative Example D 1-1

A process was conducted as Comparative Example D1-1. This process was different from Example D-1 in that it omitted the annealing in the gas atmosphere containing trace amount of oxygen atoms.

Other conditions were materially the same as those in Example D-1. The photovoltaic element produced in Comparative Example D1-1 will be referred to as "SC/CD1-1".

Seven samples of the photovoltaic elements SC/D-1, as well as seven samples of the photovoltaic elements SC/CD1-1, were produced and were subjected to measurement and evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The photo-degradation was evaluated by setting the element temperature to 49° C., while the anti-environment characteristic was evaluated by setting the atmosphere temperature to 82° C. The results are shown in Table 186.

The performance of the photovoltaic element is shown in Table 186 in terms of values measured on the samples of the photovoltaic element SC/D-1 as normalized by the values measured on the samples of the photovoltaic element SC/CD1-1.

with Example D-1 exhibit : superiority to the sample photovoltaic elements SC/CD1-1 of Comparison Example D1-1 in all items of evaluation.

EXAMPLE D-2

In this Example, a photovoltaic element of the tandem type shown in FIG. 2 was manufactured by using an in-line type apparatus shown in FIG. 5, in accordance with the following procedure.

(1) A substrate having a reflecting layer 201 and a reflection enhancement layer 202 formed thereon (i.e. base member), prepared in the same way as that in Example D-1, was disposed on a substrate conveyor rails 413 laid in a load chamber 401, and the internal pressure of the load chamber 401 was lowered to $1 \times 10^{-5}$ Torr. by a vacuum pump (not shown).

(2) Then, a gate valve 406 was opened and the substrate was conveyed into a conveyance chamber 402 and then into a deposition chamber 417 which had been evacuated to certain levels of vacuum by vacuum pumps which are not shown. The substrate was held such that its reverse side is kept in close contact with a substrate heater 410 so as to be heated by the heater 410, while the interior of the deposition chamber 417 was evacuated by the vacuum pump to a level of $1 \times 10^{-5}$ Torr.

(3) Preparation for film forming operation was thus completed. Then, $H_2$ gas was introduced into the deposition chamber 417 through a gas-introduction line 429 and the flow rate of the $H_2$ gas was controlled to 500 sccm by means of valves 441, 431, 430, under the control of a mass-flow controller 436. At the same time, the internal pressure of the deposition chamber 417 was regulated to 1.0 Torr. by a conductance valve (not shown). Meanwhile, the substrate heater 410 was adjusted to maintain the substrate temperature at 350° C.

(4) An RF n-layer 203 of μc-Si was formed when the substrate temperature became steady.

To this end, valves 443, 433, 444 and 434 were operated to introduce the $SiH_4$ gas and $PH_3/H_2$ gas into the deposition chamber 417 through the gas introduction line 429. Flow rates of the $SiH_4$ gas, $H_2$ gas and the $PH_3/H_2$ gas were controlled to 2 sccm, 100 sccm and 200 sccm, respectively, by means of the mass-flow controllers 438, 436 and 439, while the pressure in the deposition chamber 417 was controlled to 1.0 Torr.

The power of an RF power supply 422 was set to 0.05 W/cm$^2$, and RF power was introduced from this power supply into a plasma-forming cup 420, so as to trigger a glow discharge, thereby starting formation of the RF n-layer on the substrate. The RF power was turned off when the thickness of the RF n-layer has reached 20 nm, thus terminating the glow discharge to complete the formation of the RF n-layer 203. The supply of the $SiH_4$ gas, $PH_3/H_2$ gas and $H_2$ gas into the deposition chamber 417 was stopped and the interior of the deposition chamber and the gas line were evacuated to $1 \times 10^{-5}$ Torr.

(5) Then, an annealing was executed in accordance with the present invention in an atmosphere of a gas containing a trace amount of oxygen atoms under a static magnetic field.

For the purpose of executing the annealing in the gas atmosphere containing a trace amount of oxygen atoms under static magnetic field as proposed by the invention, $O_2$/He gas (dilution: 10 ppm) was introduced into the deposition chamber 417 through the gas introduction line 429. The valves 442 and 432 were opened and the flow rate of the $O_2$/He gas (dilution 10 ppm) was controlled to 500 sccm by means of a mass-flow controller 437. Then, an alnico magnet 495 of 2300 gauss having a height adjusting mechanism, serving as means for applying the static magnetic field, was arranged. Meanwhile, the pressure in the deposition chamber 417 was controlled to 1.3 Torr by a conductance valve (not shown).

The annealing in accordance with the invention in a gas atmosphere containing trace amount of oxygen atoms under the static magnetic field was conducted for 10 minutes, while the substrate heater 410 was controlled to maintain the substrate temperature at 350° C. Then, the alnico magnet 495 of 2300 gauss having the height adjusting mechanism, served as the means for applying static magnetic field, was removed and the supply of the $O_2$/He gas (dilution: 10 ppm) into the deposition chamber 417 was stopped. The interior of the deposition chamber 417 and the gas line was then evacuated to $1 \times 10^{-5}$ Torr.

Then, an RF i-layer 251 of a-Si, an MW i-layer 204 of a-SiGe, an RF i-layer 261 of a-Si, an RF p-layer 205 of a-SiC, an RF n-layer 206 of μc-Si, an RF i-layer 207 of a-Si and an RF p-layer 208 of a-SiC were successively formed, in accordance with the steps (6-1) to (6-8) of Example A-2. Subsequently, a transparent conductive layer 212 was formed on the RF p-layer and a collecting electrode 213 was formed thereon, in accordance with the steps (7) to (9) of Example A-2.

Fabrication of the photovoltaic element of this example was thus completed. This element will be referred to as "SC/D-2". The conditions of the annealing in gas atmosphere containing trace amount of oxygen atoms under static magnetic field in this example, as well as the conditions of film-forming processes for forming the RF n-layer, RF i-layer, MW i-layer and RF-p layer are collectively shown in Tables 187 and 188.

TABLE 187

CONDITIONS OF ANNEALING UNDER STATIC MAGNETIC FIELD IN GAS ATMOSPHERE CONTAINING TRACE AMOUNT OF OXYGEN ATOMS

| Type of gas containing oxygen atoms | $O_2$/He |
| --- | --- |
| Gas concentration (dilution: ppm) | 10 |
| Type of magnet | ALNICO |
| Magnetic field intensity (G) | 2300 |
| Annealing temp. (° C.) | 350 |
| Annealing press. (Torr) | 1.3 |

TABLE 188

| Sample | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SiH_4/H_2$ flow rate sccm | Press. Torr | MW Power W/cm$^2$ | RF Power W/cm$^2$ | Substrate temp. ° C. | Film thickness nm |
| --- | --- | --- | --- | --- | --- | --- | --- | --- | --- | --- | --- | --- | --- |
| RF n-layer (203) | 2 | | | | 100 | 200 | | | 1.0 | | 0.05 | 350 | 20 |
| RF i-layer (251) | | 4 | | | 110 | | | | 0.7 | | 0.008 | 300 | 10 |
| MW i-layer (204) | 50 | | | 55 | 100 | | | | 0.006 | 0.10 | 0.30 | 380 | 150 |
| RF i-layer (261) | | 3 | | | 80 | | | | 0.7 | | 0.007 | 250 | 20 |
| RF p-layer (205) | | | 0.3 | | 60 | | 10 | 2 | 2.0 | | 0.07 | 230 | 10 |
| RF n-layer (206) | 2 | | | | 50 | 250 | | | 1.0 | | 0.04 | 225 | 10 |
| RF i-layer (207) | | 3 | | | 60 | | | | 0.6 | | 0.007 | 200 | 120 |
| RF p-layer (208) | | | 0.3 | | 60 | | 10 | 2 | 2.0 | | 0.07 | 170 | 10 |

Comparative Example D 2-1

A process was conducted as Comparative Example D 2-1. This process was different from Example D-2 in that it omitted the treatment with hydrogen plasma containing trace amount of silane gas under the static magnetic field.

Other conditions were materially the same as those in Example D-2. The photovoltaic element produced in Comparative Example D 2-1 will be referred to as "SC/CD2-1".

Seven samples of the photovoltaic elements SC/D-2, as well as seven samples of the photovoltaic elements SC/CD2-1, were produced and were subjected, basically in the same way as Example A-1 and Comparative Example A1-1, to measurement and evaluation of various items of performance such as initial photoelectric conversion efficiency (photo-voltage/incident photo-power), variation or lack of uniformity of the conversion efficiency, photo-degradation, anti-environment characteristic against high-temperature, and high-humidity environment, SEM observation of cut surface, and adhesion. The photo-degradation was evaluated by setting the element temperature to 47° C., while the anti-environment characteristic was evaluated by setting the atmosphere temperature to 83° C. and the humidity to 90%. The results are shown in Table 189.

The performance of the photovoltaic element is shown in Table 189 in terms of values measured on the samples of the photovoltaic element SC/D-2 as normalized by the values measured on the samples of the photovoltaic element SC/CD2-1.

TABLE 189

| Items of evaluation | Evaluation |
| --- | --- |
| Initial photoelectric conversion efficiency characteristic | 1.41 |
| Variation of Initial photoelectric conversion efficiency characteristic | 0.88 |
| Photo-degradation characteristic | 0.86 |
| Anti-environment characteristic | 0.85 |
| SEM observation of sectional face | 0.93 |
| Measurement of adhesion: Delamination | No delamination in SC/D-2 Slight delamination in SC/CD2-1 |

From the results shown in Table 189, it will be seen that all the sample photovoltaic elements SC/D-2 in accordance with-Example D-2 exhibit superiority to the sample photovoltaic elements SC/CD2-1 of Comparison Example D2-1 in all items of evaluation.

EXAMPLE D-3

In this Example, a photovoltaic element of the triple type shown in FIG. 3 was manufactured by using an in-line type apparatus shown in FIG. 5, in accordance with the following procedure.

(1) A substrate having a reflecting layer 301 and a reflection enhancement layer 302 formed thereon (i.e. base member), prepared in the same way as that in Example D-1, was disposed on a substrate conveyor rails 413 laid in a load chamber 401, and the internal pressure of the load chamber 401 was lowered to $1 \times 10^{-5}$ Torr. by a vacuum pump (not shown).

(2) Then, gate valves 406 and 407 were opened and the substrate was conveyed into conveyance chambers 402, 403 and then into a deposition chamber 418 which have been evacuated to certain levels of vacuum by vacuum pumps which are not shown. The substrate was held such that its reverse side was kept in close contact with a substrate heater 411 so as to be heated by the heater 411 while the interior of the deposition chamber 418 was evacuated by the vacuum pump to a level of $1 \times 10^{-5}$ Torr.

(3) Preparation for film forming operation was thus completed. Then, $H_2$ gas was introduced into the deposition chamber 417 through a gas-introduction line 429 and the f low rate of the $H_2$ gas was controlled to 500 sccm by means of valves 441, 431, 430, under the control of a mass-flow controller 436. At the same time, the internal pressure of the deposition chamber 417 was regulated to 1.3 Torr. by a conductance valve (not shown). Meanwhile, the substrate heater 410 was adjusted to maintain the substrate temperature at 350° C. An RF n-layer 303 of $\mu$c-Si was formed when the substrate temperature became steady.

(4) To this end, valves 443, 433, 444 and 434 were operated to introduce the $SiH_4$ gas and $PH_3/H_2$ gas into the deposition chamber 417 through the gas introduction line 429. Flow rates of the $SiH_4$ gas, $H_2$ gas and the $PH_3/H_2$ gas were controlled to 2 sccm, 100 sccm and 200 sccm, respectively, by means of the mass-flow controllers 438, 436 and 439, while the pressure in the deposition chamber 417 was controlled to 1.3 Torr.

The power of an RF power supply 422 was set to 0.05 W/cm$^2$, and RF power was introduced from this power supply into a plasma-forming cup 420, so as to trigger a glow discharge, thereby starting formation of the RF n-layer on the substrate. The RF power was turned off when the thickness of the RF n-layer has reached 20 nm, thus terminating the glow discharge to complete the formation of the RF n-layer 303. The supply of the $SiH_4$ gas, $PH_3/H_2$ gas and $H_2$ gas into the deposition chamber 417 was stopped and the interior of the deposition chamber and the gas line were evacuated to $1 \times 10^{-5}$ Torr.

(5) Then, an annealing was executed in an atmosphere of a gas containing a trace amount of oxygen atoms under a static magnetic field.

For the purpose of executing the annealing in the gas atmosphere containing a trace amount of oxygen atoms under the static magnetic field, $O_2$/Ar gas (dilution: 100 ppm) was introduced as the oxygen atom-containing gas into the deposition chamber 417 through the gas introduction line 429. The valves 442 and 432 were opened and the flow rate of the $O_2$/Ar gas (dilution 100 ppm) was controlled to 500 sccm by means of a mass-flow controller 437. Then, an alnico magnet 495 of 2000 gauss having a height adjusting mechanism, serving as the means for applying the static magnetic field, was installed. Meanwhile, the pressure in the deposition chamber 417 was controlled to 1.3 Torr by a conductance valve (not shown).

The annealing in accordance with the invention in a gas atmosphere containing trace amount of oxygen atoms under the static magnetic field was conducted for 10 minutes, while the substrate heater 410 was controlled to maintain the substrate temperature at 350° C. Then, the alnico magnet 495 of 2000 gauss having the height adjusting mechanism, serving as the means for applying the static magnetic field, was removed, and the supply of the $O_2$/Ar gas (dilution: 100 ppm ) into the deposition chamber 417 was stopped. The interior of the deposition chamber 417 and the gas line was then evacuated to $1 \times 10^{-5}$ Torr.

(6) Then, an RF i-layer 351 of a-Si, an MW i-layer 304 of a-SiGe, an RF i-layer 361 of a-Si, an RF p-layer 305 of a-SiC, an RF n-layer 306 of $\mu$c-Si, an RF i-layer 352 of a-Si, an MW i-layer 307 of a-SiGe, an RF i-layer 362 of a-Si, an RF p-layer 308 of a-SiC, an RF n-layer 309 of $\mu$c-Si, an RF i-layer 310 of a-Si, and an RF p-layer 311 of a-SiC were successively formed, in accordance with a procedure which is substantially the same as that used in Example D-2, i.e., in Example A-2.

(7) Then, an ITO film of 70 nm thick, serving as a transparent conductive layer 312, was formed on the RF p-layer 311 by vacuum evaporation.

(8) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of this example was thus completed. This element will be referred to as "SC/D-3". The conditions of the annealing in gas atmosphere containing trace amount of oxygen atoms under the static magnetic field in this example, as well as the conditions of film-forming processes for forming the RF n-layer, RF i-layer, MW i-layer and RF-p layer are collectively shown in Tables 190 and 191.

TABLE 190

CONDITIONS OF ANNEALING UNDER STATIC MAGNETIC FIELD IN GAS ATMOSPHERE CONTAINING TRACE AMOUNT OF OXYGEN ATOMS

| Type of gas containing oxygen atoms | $O_2$/Ar |
|---|---|
| Gas concentration (dilution: ppm) | 100 |
| Type of magnet | ALNICO |
| Magnetic field intensity (G) | 2000 |
| Annealing temp. (° C.) | 350 |
| Annealing press. (Torr) | 1.5 | sion efficiency, photo-degradation, anti-environment characteristic against high-temperature and high-humidity environment, SEM observation of cut surface, and adhesion. The photo-degradation was evaluated by setting the element temperature to 47° C. The anti-environment characteristic was evaluated by setting the temperature and the humidity to 90% and the time of shelving in the dark place to 150 hours. The results are shown in Table 192.

The performance of the photovoltaic element is shown in Table 192 in terms of values measured on the samples of the photovoltaic element SC/D-3 as normalized by the values measured on the samples of the photovoltaic element SC/CD3-1.

TABLE 192

| Items of evaluation | Evaluation |
|---|---|
| Initial photoelectric conversion efficiency characteristic | 1.4 |
| Variation of Initial photoelectric conversion efficiency characteristic | 0.86 |
| Photo-degradation characteristic | 0.85 |
| Anti-environment characteristic | 0.84 |
| SEM observation of sectional face | 0.93 |
| Measurement of adhesion: Delamination | No delamination in SC/D-3 Slight delamination in SC/CD3-1 |

From the results shown in Table 192, it will be seen that all the sample photovoltaic elements SC/D-3 in accordance

TABLE 191

| Sample | SiH$_4$ flow rate sccm | Si$_2$H$_6$ flow rate sccm | CH$_4$ flow rate sccm | GeH$_4$ flow rate sccm | H$_2$ flow rate sccm | PH$_3$/H$_2$ flow rate sccm | B$_2$H$_6$/H$_2$ flow rate sccm | SiH$_4$/H$_2$ flow rate sccm | Press. Torr | MW Power W/cm$^2$ | RF Power W/cm$^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 50 | | | 50 | 150 | | | | 0.010 | 0.12 | 0.31 | 370 | 110 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 35 | | | 27 | 150 | | | | 0.013 | 0.09 | 0.3 | 350 | 100 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 1.5 | | | 80 | | | | 0.8 | | 0.007 | 190 | 90 |
| RF p-layer | | | 0.4 | | 90 | | 8 | 2 | 1.6 | | 0.07 | 170 | 10 |

Comparative Example D 3-1

A process was conducted as Comparative Example D 3-1. This process was different from Example D-3 in that it omitted the annealing in the gas atmosphere containing trace amount of oxygen atoms under the static magnetic field.

Other conditions were materially the same as those in Example D-3. The photovoltaic element produced in Comparative Example D 3-1 will be referred to as "SC/CD3-1".

Seven samples of the photovoltaic elements SC/D-3, as well as seven samples of the photovoltaic elements SC/CD3-1, were produced and were subjected, basically in the same way as Example A-1 and Comparative Example A1-1, for evaluation of various items of performance such as initial photoelectric conversion efficiency (photo-voltage/incident photo-power), variation or lack of uniformity of the converwith Example D-3 exhibit superiority to the sample photovoltaic elements SC/CD3-1 of Comparison Example D3-1 in all items of evaluation.

EXAMPLE D-4

This Example is different from Example D-3 in that the annealing was effected on the RF i-layer 351 of a-SiGe, in place of the RF n-layer 303 of $\mu$c-Si. As in Example D-3, a photovoltaic element of the triple type shown in FIG. 3 was manufactured by using an in-line type apparatus shown in FIG. 5, in accordance with the following procedure.

(1) A substrate having a reflecting layer 301 and a reflection enhancement layer 302 formed thereon (i.e. base member), prepared in the same way as that in Example A-1, was disposed on a substrate conveyor rails 413 laid in a load chamber 401, and the internal pressure of the load chamber 401 was lowered to 1×10$^{-5}$ Torr. by a vacuum pump (not shown).

(2) Then, gate valves 406 and 407 were opened and the substrate was conveyed into conveyance chambers 402, 403 and then into a deposition chamber 418 which had been evacuated to certain levels of vacuum by vacuum pumps which are not shown. The substrate was held such that its reverse side is kept in close contact with a substrate heater 411 so as to be heated by the heater 411, while the interior of the deposition chamber 418 was evacuated by the vacuum pump to a level of 1×10$^{-5}$ Torr.

(3) Preparation for film forming operation was thus completed. Then, H$_2$ gas was introduced into the deposition chamber 417 through a gas-introduction line 429 and the flow rate of the H$_2$ gas was controlled to 500 sccm by means of valves 441, 431, 430, under the control of a mass-flow controller 436. At the same time, the internal pressure of the deposition chamber 417 was regulated to 1.3 Torr. by a conductance valve (not shown). Meanwhile, the substrate heater 410 was adjusted to maintain the substrate temperature at 350° C. An RF n-layer 303 of μc-Si, an RF i-later 351 of a-Si, an MW i-layer 304 of a-SiGe and an RF i-layer 361 of a-Si were formed when the substrate temperature has become steady.

(4) Then, an annealing was executed in an atmosphere of a gas containing a trace amount of oxygen atoms under a static magnetic field.

For the purpose of executing the annealing in the gas atmosphere containing a trace amount of oxygen atoms under static magnetic field, O$_2$/H$_2$ gas (dilution: 1 ppm) was introduced as the oxygen atom-containing gas into the deposition chamber 418 through the gas introduction line 449. The valves 465 and 455 were opened and the flow rate of the O$_2$/H$_2$ gas (dilution 1 ppm) was controlled to 500 sccm by means of a mass-flow controller 460. Then, an alnico magnet 495 of 2100 gauss having a height adjusting mechanism, serving as the means for applying static magnetic field, was disposed. Meanwhile, the pressure in the deposition chamber 418 was controlled to 1.3 Torr by a conductance valve (not shown).

The annealing in accordance with the invention in a gas atmosphere containing trace amount of oxygen atoms under the static magnetic field was conducted for 10 minutes, while the substrate heater 411 was controlled to maintain the substrate temperature at 300° C. Then, the alnico magnet 495 of 2100 gauss having height adjusting mechanism, serving as the means for applying the static magnetic field, was removed and the supply of the O$_2$/H$_2$ gas (dilution: 1 ppm) into the deposition chamber 418 was stopped. The interior of the deposition chamber 418 and the gas line was then evacuated to 1×10$^{-5}$ Torr.

(5) Then, an MW i-layer 304 of a-SiGe, an RF i-layer 361 of a-Si, an RF p-layer 305 of a-SiC, an RF n-layer 306 of μc-Si, an RF i-layer 352 of a-Si, an MW i-layer 307 of a-SiGe, an RF i-layer 362 of a-Si, an RF p-layer 308 of a-SiC, an RF n-layer 309 of μc-Si, an RF i-layer 310 of a-Si, and an RF p-layer 311 of a-SiC were successively formed, in accordance with a procedure which is substantially the same as that used in Example D-2, i.e., in the same way as that in Example A-2.

(6) Then, an ITO film of 70 nm thick, serving as a transparent conductive layer 312, was formed on the RF p-layer 311 by vacuum evaporation.

(7) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of this example was thus completed. This element will be referred to as "SC/D-4". The conditions of the annealing in gas atmosphere containing trace amount of oxygen atoms under the static magnetic field in this example, as well as the conditions of film-forming processes for forming the RF n-layer, RF i-layer, MW i-layer and RF-p layer are collectively shown in Tables 193 and 194.

TABLE 193

CONDITIONS OF ANNEALING UNDER STATIC MAGNETIC FIELD IN GAS ATMOSPHERE CONTAINING TRACE AMOUNT OF OXYGEN ATOMS

| | |
|---|---|
| Type of gas containing oxygen atoms | O$_2$/He |
| Gas concentration (dilution: ppm) | 1 |
| Type of magnet | ALNICO |
| Magnetic field intensity (G) | 2100 |
| Annealing temp. (° C.) | 300 |
| Annealing press. (Torr) | 1.3 |

TABLE 194

| Sample | SiH$_4$ flow rate sccm | Si$_2$H$_6$ flow rate sccm | CH$_4$ flow rate sccm | GeH$_4$ flow rate sccm | H$_2$ flow rate sccm | PH$_3$/H$_2$ flow rate sccm | B$_2$H$_6$/H$_2$ flow rate sccm | SiH$_4$/H$_2$ flow rate sccm | Press. Torr | MW Power W/cm$^2$ | RF Power W/cm$^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 50 | | | 50 | 150 | | | | 0.010 | 0.12 | 0.31 | 370 | 110 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 35 | | | 27 | 150 | | | | 0.013 | 0.08 | 0.3 | 350 | 100 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 1.5 | | | 80 | | | | 0.8 | | 0.007 | 190 | 90 |
| RF p-layer | | | 0.4 | | 90 | | 8 | 2 | 1.6 | | 0.07 | 170 | 10 |

Comparative Example D 4-1

A process was conducted as Comparative Example D 4-1. This process was different from Example D-4 in that it omitted the annealing in the gas atmosphere containing trace amount of oxygen atoms under the static magnetic field.

Other conditions were materially the same as those in Example D-4. The photovoltaic element produced in Comparative Example D 4-1 will be referred to as "SC/CD4-1".

Seven samples of the photovoltaic elements SC/D-4, as well as seven samples of the photovoltaic elements SC/CD4-1, were produced and were subjected, basically in the same way as Example A-1 and Comparative Example A1-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The photo-degradation was evaluated by setting the element temperature to 47° C. The anti-environment characteristic was evaluated by setting the temperature to 83° C., the humidity to 92% and the time of shelving in the dark place to 150 hours. The results are shown in Table 195.

In Table 195, the performance is shown in terms of values measured on the elements SC/D-4 as normalized with the values measured on the elements SC/CD-4.

TABLE 195

| Items of evaluation | Evaluation |
|---|---|
| Initial photoelectric conversion efficiency characteristic | 1.45 |
| Variation of Initial photoelectric conversion efficiency characteristic | 0.87 |
| Photo-degradation characteristic | 0.84 |
| Anti-environment characteristic | 0.84 |
| SEM observation of sectional face | 0.92 |
| Measurement of adhesion: Delamination | No delamination in SC/D-4 Slight delamination in SC/CD4-1 |

From the results shown in Table 195, it will be seen that all the sample photovoltaic elements SC/D-4 in accordance with Example D-4 exhibit superiority to the sample photovoltaic elements SC/CD4-1 of Comparison Example D4-1 in all items of evaluation.

EXAMPLE D-5

This Example is different from Example D-3 in that the annealing was effected on the MW i-layer 304 of a-SiGe, in place of the RF n-layer 303 of μc-Si. As in Example D-3, a photovoltaic element of the triple type shown in FIG. 3 was manufactured by using an in-line type apparatus shown in FIG. 5, in accordance with the following procedure.

(1) A substrate having a reflecting layer 301 and a reflection enhancement layer 302 formed thereon (i.e. base member), prepared in the same way as that in Example D-1, was disposed on a substrate conveyor rails 413 laid in a load chamber 401, and the internal pressure of the load chamber 401 was lowered to $1 \times 10^{-5}$ Torr. by a vacuum pump (not shown).

(2) Then, gate valves 406 and 407 were opened and the substrate was conveyed into conveyance chambers 402, 403 and then into a deposition chamber 418 which have been evacuated to certain levels of vacuum by vacuum pumps which are not shown. The substrate was held such that its reverse side is kept in close contact with a substrate heater 411 so as to be heated by the heater 411, while the interior of the deposition chamber 418 was evacuated by the vacuum pump to a level of $1 \times 10^{-5}$ Torr.

(3) Preparation for film forming operation was thus completed. Then, $H_2$ gas was introduced into the deposition chamber 417 through a gas-introduction line 429 and the f low rate of the $H_2$ gas was controlled to 500 sccm by means of valves 441, 431, 430, under the control of a mass-flow controller 436. At the same time, the internal pressure of the deposition chamber 417 was regulated to 1.3 Torr. by a conductance valve (not shown). Meanwhile, the substrate heater 410 was adjusted to maintain the substrate temperature at 350° C. An RF n-layer 303 of μc-Si, an RF i-layer 351 of a-Si and an MW i-layer 304 of a-SiGe were formed when the substrate temperature has become steady.

(4) Then, an annealing was executed in an atmosphere of a gas containing a trace amount of oxygen atoms under a static magnetic field.

For the purpose of executing the annealing in the gas atmosphere containing a trace amount of oxygen atoms under the static magnetic field, $O_2$/He gas (dilution: 1 ppm) was introduced as the oxygen atom-containing gas into the deposition chamber 418 through the gas introduction line 449. The valves 465 and 455 were opened and the flow rate of the $O_2$/ lie gas was controlled to 500 sccm by means of a mass-flow controller 460. Then, an alnico magnet of 1900 gauss having a height adjusting mechanism, serving as the means for applying the static magnetic field, was installed. Meanwhile, the pressure in the deposition chamber 418 was controlled to 1.3 Torr by a conductance valve (not shown).

The annealing in accordance with the invention in a gas atmosphere containing trace amount of oxygen atoms under a static magnetic field was conducted for 10 minutes, while the substrate heater 411 was controlled to maintain the substrate temperature at 300° C. Then, the alnico magnet 495 of 1900 gauss having height adjusting mechanism, serving as the means for applying the static magnetic field, was removed and the supply of the $O_2$/He gas (dilution: 1 ppm) into the deposition chamber 418 was stopped. The interior of the deposition chamber 418 and the gas line was evacuated to $1 \times 10^{-5}$ Torr.

Then, an RF i-layer 361 of a-Si, an RF p-layer 305 of a-SiC, an RF n-layer 306 of μc-Si, an RF i-layer 352 of a-Si, an MW i-layer 307 of a-SiGe s, an RF i-layer 362 of a-Si- an RF p-layer 308 of a-SiC, an RF n-layer 309 of μc-Si, an RF i-layer 310 of a-Si, and an RF p-layer 311 of a-SiC were successively formed, in accordance with a procedure which is substantially the same as that used in Example D-2, i.e., in the same way as Example A-2.

(6) Then, an ITO film of 70 nm thick, serving as a transparent conductive layer 312, was formed on the RF p-layer 311 by vacuum evaporation.

(7) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of this example was thus completed. This element will be referred to as "SC/D-5". The conditions of the annealing in gas atmosphere containing trace amount of oxygen atoms under static magnetic field in this example, as well as the conditions of film-forming processes for forming the RF n-layer, RF i-layer, MW i-layer and RF-p layer are collectively shown in Tables 196 and 197.

TABLE 196

CONDITIONS OF ANNEALING UNDER STATIC MAGNETIC FIELD IN GAS ATMOSPHERE CONTAINING TRACE AMOUNT OF OXYGEN ATOMS

| | |
|---|---|
| Type of gas containing oxygen atoms | $O_2$/He |
| Gas concentration (dilution: ppm) | 1 |
| Type of magnet | ALNICO |
| Magnetic field intensity (G) | 1900 |
| Annealing temp. (° C.) | 300 |
| Annealing press. (Torr) | 1.3 |

TABLE 197

| Sample | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SiH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 49 | | | 51 | 100 | | | | 0.010 | 0.12 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 35 | | | 28 | 110 | | | | 0.013 | 0.12 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 3.0 | | | 80 | | | | 0.8 | | 0.007 | 190 | 90 |
| RF p-layer | | | 0.4 | | 90 | | 8 | 2 | 1.6 | | 0.07 | 170 | 10 |

Comparative Example D 5-1

A process was conducted as Comparative Example D 5-1. This process was different from Example D-5 in that it omitted the annealing in the gas atmosphere containing trace amount of oxygen atoms under the static magnetic field.

Other conditions were materially the same as those in Example D-5. The photovoltaic element produced in Comparative Example D 5-1 will be referred to as "SC/CD5-1".

Five samples of the photovoltaic elements SC/D-5, as well as five samples of the photovoltaic elements SC/CD5-1, were produced and were subjected, basically in the same way as Example A-1 and Comparative Example A1-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The photo-degradation was evaluated by setting the element temperature to 45° C. The anti-environment characteristic was evaluated by setting the temperature to 83° C., the humidity to 92% and the time of shelving in the dark place to 150 hours. The results are shown in Table 198.

The performance of the photovoltaic element is shown in Table 198 in terms of values measured on the samples of the photovoltaic element SC/D-5 as normalized by the values measured on the samples of the photovoltaic element SC/CD5-1.

TABLE 198

| Items of evaluation | Evaluation |
|---|---|
| Initial photoelectric conversion efficiency characteristic | 1.48 |
| Variation of Initial photoelectric conversion efficiency characteristic | 0.85 |
| Photo-degradation characteristic | 0.84 |

TABLE 198-continued

| Items of evaluation | Evaluation |
|---|---|
| Anti-environment characteristic | 0.84 |
| SEM observation of sectional face | 0.92 |
| Measurement of adhesion: Delamination | No delamination in SC/D-5 Slight delamination in SC/CD5-1 |

From the results shown in Table 198, it will be seen that all the sample photovoltaic elements SC/D-5 in accordance with Example D-5 exhibit superiority to the sample photovoltaic elements SC/CD5-1 of Comparison Example D5-1 in all items of evaluation.

EXAMPLE D-6

This Example is different from Example D-3 in that the annealing was effected on the RF i-Layer 361 of a-Si, in place of the RF n-layer 303 of µc-Si. As in Example D-3, a photovoltaic element of the triple type shown in FIG. 3 was manufactured by using an in-line type apparatus shown in FIG. 5, in accordance with the following procedure.

(1) A substrate having a reflecting layer 301 and a reflection enhancement layer 302 formed thereon (i.e. base member), prepared in the same way as that in Example D-1, was disposed on a substrate conveyor rails 413 laid in a load chamber 401, and the internal pressure of the load chamber 401 was lowered to $1 \times 10^{-5}$ Torr. by a vacuum pump (not shown).

(2) Then, gate valves 406 and 407 were opened and the substrate was conveyed into conveyance chambers 402, 403 and then into a deposition chamber 418 which had been evacuated to certain levels of vacuum by vacuum pumps which are not shown. The substrate was held such that its reverse side is kept in close contact with a substrate heater 411 so as to be heated by the heater 411, while the interior of the deposition chamber 418 was evacuated by the vacuum pump to a level of $1 \times 10^{-5}$ Torr.

(3) Preparation for film forming operation was thus completed. Then $H_2$ gas was introduced into the deposition chamber 417 through a gas-introduction line 429 and the flow rate of the $H_2$ gas was controlled to 500 sccm by means of valves 411, 431, 430, under the control of mass-flow controller 436. At the same time, the internal pressure of the deposition chamber 417 was regulated to 1.3 Torr. by a conductance valve (not show shown). Meanwhile, the substrate heater 410 was adjusted to maintain the substrate temperature at 350° C. An RF n-layer 303 of μc-Si, an RF i-layer 351 of a-Si and MW i-layer 304 or a a-SiGe were formed when the substrate temperature has become steady.

(4) Then, an annealing was executed in an atmosphere of a gas containing a trace amount of oxygen atoms under a static magnetic field.

For the purpose of executing the annealing in the gas atmosphere containing a trace amount of oxygen atoms under a static magnetic field, $O_2$/Ar gas (dilution: 100 ppm) was introduced as the oxygen atom-containing gas into the deposition chamber 418 through the gas introduction line 449. The valves 465 and 455 were opened and the flow rate of the $O_2$/Ar gas was controlled to 500 sccm by means of a mass-flow controller 460. Then, an alnico magnet 495 of 1800 gauss having a height adjusting mechanism, serving as means for applying the static magnetic field, was installed. Meanwhile, the pressure in the deposition chamber 418 was controlled to 1.4 Torr by a conductance valve (not shown).

The annealing in accordance with the invention in a gas atmosphere containing trace amount of oxygen atoms under the static magnetic field was conducted for 10 minutes, while the substrate heater 411 was controlled to maintain the substrate temperature at 300° C. Then, the alnico magnet 495 of 1800 gauss having a height adjusting mechanism, serving as means for applying the static magnetic field, was removed and the supply of the $O_2$/Ar gas (dilution: 100 ppm) into the deposition chamber 418 was stopped. The interior of the deposition chamber 418 and the gas line was then evacuated to $1 \times 10^{-5}$ Torr.

(5) Then, an RF p-layer 305 of a-SiC, an RF n-layer 306 of μc-Si, an RF i-layer 352 of a-Si, an MW i-layer 307 of SiGe, an RF i-layer 309 of μc-Si, an RF i-layer 310 of a-Si, and an RF p-layer 311 of a-SiC were successively formed, in accordance with a procedure which is substantially the same as that used in Example D-2, i.e., in the same way as Example A-2.

(6) Then, an ITO film of 70 nm thick, serving as a transparent conductive layer 312, was formed on the RF p-layer 311 by vacuum evaporation.

(7) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of this example was thus completed. This element will be referred to as "SC/D-6". The conditions of the annealing in gas atmosphere containing trace amount of oxygen atoms under the static magnetic field in this example, as well as the conditions of film-forming processes for forming the RF n-layer, RF i-layer, MW i-layer and RF p-layer are collectively shown in Tables 199 and 200.

TABLE 199

CONDITIONS OF ANNEALING UNDER STATIC MAGNETIC FIELD IN GAS ATMOSPHERE CONTAINING TRACE AMOUNT OF OXYGEN ATOMS

| Type of gas containing oxygen atoms | $O_2$/He |
| Gas concentration (dilution: ppm) | 100 |
| Type of magnet | ALNICO |
| Magnetic field intensity (G) | 1800 |
| Annealing temp. (° C.) | 300 |
| Annealing press. (Torr) | 1.4 |

TABLE 200

| Sample | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SiH_4/H_2$ flow rate sccm | Press. Torr | MW Power W/cm² | RF Power W/cm² | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 49 | | | 51 | 150 | | | | 0.010 | 0.11 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 35 | | | 27 | 110 | | | | 0.013 | 0.09 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 80 | | | | 0.8 | | 0.007 | 190 | 90 |
| RF p-layer | | | 0.4 | | 90 | | 8 | 2 | 1.6 | | 0.07 | 170 | 10 |

Comparative Example D 6-1

A process was conducted as Comparative Example D 61. This process was different from Example D-6 in that it omitted the annealing in the gas atmosphere containing trace amount of oxygen atoms under the static magnetic field.

Other conditions were materially the same as those in Example D-6. The photovoltaic element produced in Comparative Example D 6-1 will be referred to as "SC/CD6-1".

Seven samples of the photovoltaic elements SC/D-6, as well as seven samples of the photovoltaic elements SC/CD6-1, were produced and were subjected, basically in the same way as Example A-1 and Comparative Example A1-1, for evaluation of various items of performance such as initial photoelectric conversion efficiency (photovoltage/incident photo-power), variation or lack of uniformity of the conversion efficiency, photo-degradation, anti-environment characteristic against high-temperature and high-humidity environment, SEM observation of cut surface, and adhesion. The photo-degradation was evaluated by setting the element temperature to 44° C. The anti-environment characteristic was evaluated by setting the temperature to 84° C., the humidity to 91% and the time of shelving in the dark place to 150 hours. The results are shown in Table 201.

The performance of the photovoltaic element is shown in Table 201 in terms of values measured on the samples of the photovoltaic element SC/D-6 as normalized by the values measured on the samples of the photovoltaic element SC/CD6-1.

TABLE 201

| Items of evaluation | Evaluation |
| --- | --- |
| Initial photoelectric conversion efficiency characteristic | 1.49 |
| Variation of Initial photoelectric conversion efficiency characteristic | 0.84 |
| Photo-degradation characteristic | 0.83 |
| Anti-environment characteristic | 0.84 |
| SEM observation of sectional face | 0.92 |
| Measurement of adhesion: Delamination | No delamination in SC/D-6 Slight delamination in SC/CD6-1 |

From the results shown in Table 201, it will be seen that all the sample photovoltaic elements SC/D-6 in accordance with Example D-6 exhibit superiority to the sample photovoltaic elements SC/CD6-1 of Comparison Example D6-1 in all items of evaluation.

EXAMPLE D-7

This Example is different from Example D-2 in that the annealing was effected on the RF p-layer 205 of a-SiC, in place of the RF n-layer 203 of $\mu$c-Si. As in Example D-2, a photovoltaic element of tandem type shown 5 in FIG. 2 was manufactured by using an in-line type apparatus shown in FIG. 5, in accordance with the following procedure.

(1) A substrate having a reflecting layer 201 and a reflection enhancement layer 202 formed thereon (i.e. base member), prepared in the same way as that in Example D-1, was disposed on a substrate conveyor rails 413 laid in a load chamber 401, and the internal pressure of the load chamber 401 was lowered to $1\times10^{-5}$ Torr. by a vacuum pump (not shown).

(2) Then, the gate valve 406 was opened and the substrate was conveyed into the conveyance chamber 402 and the deposition chamber 417 which have been evacuated to certain levels of vacuum by vacuum pumps which are not shown. The substrate was held such that its reverse side is kept in close contact with a substrate heater 410 so as to be heated by the heater 410, while the interior of the deposition chamber 417 was evacuated by the vacuum pump to a level of $1\times10^{-5}$ Torr.

(3) Preparation for film forming operation was thus completed. Then, $H_2$ gas was introduced into the deposition chamber 417 through a gas-introduction line 429 and the flow rate of the $H_2$ gas was controlled to 500 sccm by means of valves 441, 431, 430, under the control of a mass-flow controller 436. At the same time, the 5 internal pressure of the deposition chamber 417 was regulated to 1.0 Torr. by a conductance valve (not shown). Meanwhile, the substrate heater 410 was adjusted to maintain the substrate temperature at 350° C. An RF n-layer 203 of $\mu$c-Si, an RF i-layer 251 of a-Si, an MW i-layer 204 of a-SiGe, an RF i-layer 261 of a-Si and an RF p-layer 205 of a-SiC were formed in the same method as that in Example A-2, when the substrate temperature has become steady.

(4) Then, an annealing was executed in an atmosphere of a gas containing a trace amount of oxygen atoms under a static magnetic field.

For the purpose of executing the annealing in the gas atmosphere containing a trace amount of oxygen atoms, $O_2/H_2$ gas (dilution: 1000 ppm) was introduced as the oxygen atom-containing gas into the deposition chamber 417 through the gas introduction line 429. The valves 442 and 432 were opened and the flow rate of the $O_2/H_2$ gas (dilution 1000 ppm) was controlled to 500 sccm by means of a mass-flow controller 436. Then, an alnico magnet 495 of 1700 gauss having a height adjusting mechanism, serving as means for applying static magnetic field, was installed. Meanwhile, the pressure in the deposition chamber 417 was controlled to 1.3 Torr by a conductance valve (not shown).

The annealing in accordance with the invention in a gas atmosphere containing trace amount of oxygen atoms under static magnetic field was conducted for 10 minutes, while the substrate heater 410 was controlled to maintain the substrate temperature at 225° C. Then, the alnico magnet 495 of 1700 gauss having a height adjusting mechanism, serving means for applying the static magnetic field, was removed and the supply of the $O_2/H_2$ gas (dilution: 1000 ppm) into the deposition chamber 417 was stopped. Then, the interior of the deposition chamber 417 and the gas line was evacuated to $1\times10^{-5}$ Torr.

(5) Then, an RF n-layer 206 of $\mu$c-Si, an RF i-layer 207 of a-Si and an RF p-layer 208 of a-SiC were successively formed, in accordance with a procedure which is substantially the same as that used in Example D-2.

(6) Then, an ITO film of 70 nm thick, serving as a transparent conductive layer 212, was formed on the RF player 208 by vacuum evaporation.

(7) A mask having comb-shaped aperture was placed on the transparent electrode 212 and a comb-shaped collector electrode 213 of Cr(40 nm)/Ag(1000 nm)/Cr(40 nm) was formed by vacuum evaporation.

Fabrication of the photovoltaic element of this example was thus completed. This element will be referred to as "SC/D-7". The conditions of the annealing in gas atmosphere containing trace amount of oxygen atoms under the static magnetic field in this example, as well as the conditions of film-forming processes for forming the RF n-layer, RF i-layer, MW i-layer and RF p-layer are collectively shown in Tables 202 and 203.

TABLE 202

CONDITIONS OF ANNEALING UNDER STATIC MAGNETIC FIELD IN GAS ATMOSPHERE CONTAINING TRACE AMOUNT OF OXYGEN ATOMS

| | |
| --- | --- |
| Type of gas containing oxygen atoms | $O_2/H_2$ |
| Gas concentration (dilution: ppm) | 1000 |
| Type of magnet | ALNICO |
| Magnetic field intensity (G) | 1700 |
| Annealing temp. (° C.) | 225 |
| Annealing press. (Torr) | 1.3 |

TABLE 203

| | SiH₄ flow rate sccm | Si₂H₆ flow rate sccm | CH₄ flow rate sccm | GeH₄ flow rate sccm | H₂ flow rate sccm | PH₃/H₂ flow rate sccm | B₂H₆/H₂ flow rate sccm | SIH₄/H₂ flow rate sccm | Press. Torr | MW Power W/cm² | RF Power W/cm² | Substrate temp. ° C. | Film thickness nm |
|---|---|---|---|---|---|---|---|---|---|---|---|---|---|
| RF n-layer | 2 | | | | 100 | 200 | | | 1.0 | | 0.05 | 350 | 20 |
| RF i-layer | | 4 | | | 110 | | | | 0.7 | | 0.008 | 300 | 10 |
| MW i-layer | 49 | | | 52 | 220 | | | | 0.006 | 0.10 | 0.30 | 380 | 150 |
| RF i-layer | | 3 | | | 80 | | | | 0.7 | | 0.007 | 250 | 20 |
| RF p-layer | | | 0.3 | | 60 | | 10 | 2 | 2.0 | | 0.07 | 230 | 10 |
| RF n-layer | 2 | | | | 50 | 250 | | | 1.0 | | 0.04 | 225 | 10 |
| RF i-layer | | 1.8 | | | 70 | | | | 0.5 | | 0.007 | 200 | 120 |
| RF i-layer | | | 0.3 | | 60 | | 10 | 3 | 2.0 | | 0.07 | 170 | 10 |

Comparative Example D 7-1

A process was conducted as Comparative Example D 7-1. This process was different from Example D-7 in that it omitted the annealing in the gas atmosphere containing trace amount of oxygen atoms under the static magnetic field.

Other conditions were materially the same as those in Example D-7. The photovoltaic element produced in Comparative Example D 7-1 will be referred to as "SC/CD7-1".

Seven samples of the photovoltaic elements SC/D-7, as well as seven samples of the photovoltaic elements SC/CD7-1, were produced and were subjected, basically in the same way as Example A-1 and Comparative Example A1-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The photo-degradation was evaluated by setting the element temperature to 46° C. The anti-environment characteristic was evaluated by setting the temperature to 84° C., the humidity to 92% and the time of shelving in the dark place to 150 hours. The results are shown in Table 204.

The performance of the photovoltaic element is shown in Table 204 in terms of values measured on the samples of the photovoltaic element SC/D-7 as normalized by the values measured on the samples of the photovoltaic element SC/CD7-1.

TABLE 204

| Items of evaluation | Evaluation |
|---|---|
| Initial photoelectric conversion efficiency characteristic | 1.50 |
| Variation of Initial photoelectric conversion efficiency characteristic | 0.85 |
| Photo-degradation characteristic | 0.82 |
| Anti-environment characteristic | 0.84 |
| SEM observation of sectional face | 0.92 |
| Measurement of adhesion: Delamination | No delamination in SC/D-7 Slight delamination in SC/CD7-1 |

From the results shown in table 204, it will be seen that all the sample photovoltaic elements SC/D-7 in accordance with Example D-7 exhibit superiority to the sample photovoltaic elements SC/CD7-7, in all items of the evaluation.

EXAMPLE D-8

This example is different from Example D-3 in that the concentration of the gas containing trace amount of oxygen atoms, used in the annealing conducted under the static magnetic field, was varied within the range of between 0.3 ppm and 2000 ppm, for the purpose of investigating the influence of the gas concentration on the performance such as the initial photoelectric conversion efficiency. H₂ gas was used as the diluting gas for varying the concentration of the gas containing trace amount of oxygen atoms used in the annealing conducted under the static magnetic field.

In this example, as in Example A-3, a triple type photovoltaic element was produced by using the in-line type apparatus shown in FIG. 5. The process were materially the same as that in Example D-3, except that annealing conditions as shown in Table 205 and production conditions as shown in Table 206 were used. Ten sample elements were produced while varying the concentration of oxygen atoms-containing gas between 0.3 ppm and 2000 ppm.

TABLE 205

CONDITIONS OF ANNEALING UNDER STATIC MAGNETIC FIELD IN GAS ATMOSPHERE CONTAINING TRACE AMOUNT OF OXYGEN ATOMS

| Type of gas containing oxygen atoms | O₂/H₂ |
|---|---|
| Gas concentration (dilution: ppm) | 0.3–2000 |
| Type of magnet | ALNICO |
| Magnetic field intensity (G) | 1500 |
| Annealing temp. (° C.) | 330 |
| Annealing press. (Torr) | 1.2 |

TABLE 206

| | SiH$_4$ flow rate sccm | Si$_2$H$_6$ flow rate sccm | CH$_4$ flow rate sccm | GeH$_4$ flow rate sccm | H$_2$ flow rate sccm | PH$_3$/H$_2$ flow rate sccm | B$_2$H$_6$/H$_2$ flow rate sccm | SIH$_4$/H$_2$ flow rate sccm | Press. Torr | MW Power W/cm$^2$ | RF Power W/cm$^2$ | Substrate temp. °C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 49 | | | 51 | 160 | | | | 0.11 | 0.10 | 0.11 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 35 | | | 27 | 110 | | | | 0.013 | 0.10 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.5 | | | 80 | | | | 0.8 | | 0.007 | 190 | 90 |
| RF p-layer | | | 0.4 | | 90 | | 8 | 2 | 1.6 | | 0.07 | 170 | 10 |

These ten samples were subjected to evaluation of performance in the same way as that: in Example D-3. Results of evaluation on each of the ten samples are shown in Table 207. The evaluation was made by normalizing the measurement results of the samples with the values measured on the sample which was produced by using the annealing gas containing trace amount of oxygen atoms having the concentration of 0.3 ppm. A mark x indicates that the normalized value is not less than 1.0 but below 1.4, a mark Δ indicates that the normalized value is not less than 1.4 but below 1.8 and a mark ○ indicates that the normalized value is not less than 1.8.

From Table 207, it is understood that the concentration of the oxygen atom-containing gas, which is used as the atmosphere gas of the annealing in a gas containing trace amount of oxygen atoms under static magnetic field, preferably ranges from 1 ppm to 1000 ppm with respect to the H$_2$ gas, in order to obtain good results in regard to the initial photoelectric conversion efficiency, variation of the efficiency, photo-degradation, anti-environment characteristic against high-temperature, high-humidity atmosphere and adhesion.

EXAMPLE D-9

This example is different from Example D-3 in that of the concentration of the gas containing trace amount of oxygen atoms used in the annealing under static magnetic field was varied within the range of between 0.3 ppm and 2000 ppm, for the purpose of investigating the influence of the gas concentration on the performance such as the initial photoelectric conversion efficiency. He gas was used as the diluting gas for varying the concentration of the gas containing trace amount of oxygen atoms used in the annealing under the static magnetic field.

In this example, as in Example D-3, a triple type photovoltaic element of FIG. 3 was produced by using the in-line type apparatus shown in FIG. 5. The process was materially the same as that in Example D-3, except that annealing conditions as shown in Table 208 and production conditions as shown in Table 209 were used. Ten sample elements were produced while varying the concentration of oxygen atoms-containing gas between 0.3 ppm and 2000 ppm.

TABLE 207

| Concentration of trace amount of oxygen atoms: ppm | .03 | 0.8 | 1 | 10 | 100 | 500 | 1000 | 1050 | 1300 | 2000 |
|---|---|---|---|---|---|---|---|---|---|---|
| Initial photoelectric conversion characteristic | × | Δ | ○ | ○ | ○ | ○ | ○ | Δ | × | × |
| Variation of characteristic | × | Δ | ○ | ○ | ○ | ○ | ○ | × | × | × |
| Photo-degradation characteristic | × | Δ | ○ | ○ | ○ | ○ | ○ | Δ | × | × |
| Anti-environment characteristic | × | Δ | ○ | ○ | ○ | ○ | ○ | Δ | × | × |
| Adhesion | × | × | ○ | ○ | ○ | ○ | ○ | Δ | × | × |

TABLE 208

CONDITIONS OF ANNEALING UNDER STATIC MAGNETIC FIELD IN GAS ATMOSPHERE CONTAINING TRACE AMOUNT OF OXYGEN ATOMS

| | |
|---|---|
| Type of gas containing oxygen atoms | $O_2$/He |
| Gas concentration (dilution: ppm) | 0.3–2000 |
| Type of magnet | ALNICO |
| Magnetic field intensity (G) | 1200 |
| Annealing temp. (° C.) | 330 |
| Annealing press. (Torr) | 1.3 |

TABLE 209

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SiH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 48 | | | 51 | 130 | | | | 0.010 | 0.10 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 35 | | | 27 | 130 | | | | 0.011 | 0.10 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.5 | | | 80 | | | | 0.8 | | 0.007 | 190 | 90 |
| RF p-layer | | | 0.4 | | 90 | | 8 | 2 | 1.6 | | 0.07 | 170 | 10 |

TABLE 210

| Concentration of trace amount of oxygen atoms: ppm | .03 | 0.8 | 1 | 10 | 100 | 500 | 1000 | 1050 | 1300 | 2000 |
|---|---|---|---|---|---|---|---|---|---|---|
| Initial photoelectric conversion characteristic | × | Δ | ○ | ○ | ○ | ○ | ○ | Δ | × | × |
| Variation of characteristic | × | Δ | ○ | ○ | ○ | ○ | ○ | Δ | × | × |
| Photo-degradation characteristic | × | × | ○ | ○ | ○ | ○ | ○ | Δ | × | × |
| Anti-environment characteristic | × | Δ | ○ | ○ | ○ | ○ | ○ | × | × | × |
| Adhesion | × | × | ○ | ○ | ○ | ○ | ○ | Δ | × | × |

These ten samples were subjected to evaluation of performance in the same way as that in Example D-3. Results of evaluation on each of the ten samples are shown in Table 210. The evaluation was made by normalizing the values measured on the respective samples with the values measured on the sample which was produced by using the annealing gas containing trace amount of oxygen atoms having the concentration of 0.3 ppm. A mark x indicates that the normalized value is not less than 1.0 but below 1.4, a mark Δ indicates that the normalized value is not less than 1.4 but below 1.8 and a mark ○ indicates that the normalized value is not less than 1.8.

From Table 210, it is understood that the concentration of the oxygen atom-containing gas, which is used as the atmosphere gas of the annealing conducted in a gas containing trace amount of oxygen atoms under a static magnetic field, most preferably ranges from 1 ppm to 1000 ppm with respect to the He gas, in order to obtain good results in regard to the initial photoelectric conversion efficiency, variation of the efficiency, photo-degradation, anti-environment characteristic against high-temperature, high-humidity atmosphere and adhesion.

EXAMPLE D-10

This example is different from Example D-3 in that the concentration of the gas containing trace amount of oxygen atoms used in the annealing under a static magnetic field was varied within the range of between 0.3 ppm and 2000 ppm, for the purpose of investigating the influence of the gas concentration on the performance such as the initial photoelectric conversion efficiency. Ar gas was used as the diluting gas for varying the concentration of the gas containing trace amount of oxygen atoms used in the annealing under the static magnetic field.

In this example, as in Example A-3, a triple type photovoltaic element of FIG. 3 was produced by using the in-line type apparatus shown in FIG. 5. The process was materially the same as that in Example D-3, except that annealing conditions as shown in Table 211 and production conditions as shown in Table 212 were used.

Ten sample elements were produced while varying the concentration of oxygen atoms-containing gas between 0.3 ppm and 2000 ppm.

TABLE 211

CONDITIONS OF ANNEALING UNDER STATIC MAGNETIC FIELD IN GAS ATMOSPHERE CONTAINING TRACE AMOUNT OF OXYGEN ATOMS

| | |
|---|---|
| Type of gas containing oxygen atoms | $O_2/Ar$ |
| Gas concentration (dilution: ppm) | 0.3–2000 |
| Type of magnet | ALNICO |
| Magnetic field intensity (G) | 1000 |
| Annealing temp. (° C.) | 320 |
| Annealing press. (Torr) | 1.6 | the normalized value is not less than 1.0 but below 1.4, a mark Δ indicates that the normalized value is not less than 1.4 but below 1.8 and a mark ○ indicates that the normalized value is not less than 1.8.

From Table 213, it is understood that the concentration of the oxygen atom-containing gas, which is used in the annealing conducted in a gas containing trace amount of oxygen atoms under static magnetic field, most preferably ranges from 1 ppm to 1000 ppm with respect to the Ar gas, in order to obtain good results in regard to the initial photoelectric conversion efficiency, variation of the efficiency, photo-degradation, anti-environment characteristic against high-temperature, high-humidity atmosphere and adhesion.

TABLE 212

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 48 | | | 51 | 200 | | | | 0.010 | 0.10 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 35 | | | 28 | 135 | | | | 0.013 | 0.10 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 60 | | | | 0.8 | | 0.007 | 190 | 90 |
| RF p-layer | | | 0.4 | | 90 | | 8 | 2 | 1.6 | | 0.07 | 170 | 10 |

These ten samples were subjected to evaluation of performance in the same way as that in Example D-3. Results of evaluation on each of the ten samples are shown in Table 213. The evaluation was made by normalizing the values measured on the respective samples with the values measured on the sample which was produced by using the annealing gas containing trace amount of oxygen atoms having the concentration of 0.3 ppm. A mark x indicates that

TABLE 213

| Concentration of trace amount of oxygen atoms: ppm | .03 | 0.8 | 1 | 10 | 100 | 500 | 1000 | 1050 | 1300 | 2000 |
|---|---|---|---|---|---|---|---|---|---|---|
| Initial photoelectric conversion characteristic | × | Δ | ○ | ○ | ○ | ○ | ○ | Δ | × | × |
| Variation of characteristic | × | Δ | ○ | ○ | ○ | ○ | ○ | × | × | × |
| Photo-degradation characteristic | × | × | ○ | ○ | ○ | ○ | ○ | Δ | × | × |
| Anti-environment characteristic | × | Δ | ○ | ○ | ○ | ○ | ○ | × | × | × |
| Adhesion | × | × | ○ | ○ | ○ | ○ | ○ | Δ | × | × |

EXAMPLE D-11

This example is different from Example D-3 in that the intensity of the static magnetic field employed in the annealing was varied within the range of from 30 G to 4000 G, for the purpose of investigating the influence of the magnetic field intensity on the performance such as the initial photoelectric conversion efficiency. $H_2$ gas was used as the diluting gas for varying the concentration of the gas containing trace amount of oxygen atoms used in the annealing conducted under the static magnetic field.

In this example, a triple type photovoltaic element of FIG. 3 was produced by using the in-line type apparatus shown in FIG. 5. The process was materially the same as that in Example D-3, except that : annealing conditions as shown in Table 214 and production conditions as shown in Table 215 were used. Ten sample elements were produced while varying the static magnetic field intensity between 30 G and 4000 G.

TABLE 214

CONDITIONS OF ANNEALING UNDER STATIC MAGNETIC FIELD IN GAS ATMOSPHERE CONTAINING TRACE AMOUNT OF OXYGEN ATOMS

| | |
|---|---|
| Type of gas containing oxygen atoms | $O_2/H_2$ |
| Gas concentration (dilution: ppm) | 1 |
| Type of magnet | ALNICO |
| Magnetic field intensity (G) | 30–4000 |
| Annealing temp. (° C.) | 300 |
| Annealing press. (Torr) | 1.4 |

216. The evaluation was made by normalizing the values measured on the respective samples with the values measured on the sample which was produced when the intensity of the static magnetic field used in the annealing was 30 G. A mark x indicates that the normalized value is not less than 1.0 but below 1.4, a mark Δ indicates that the normalized value is not less than 1.4 but below 1.8 and a mark ○ indicates that the normalized value is not less than 1.8.

From Table 216, it is understood t hat the intensity of the static magnetic field employed in the annealing most preferably ranges from 100 G to 3000 G, in order to obtain good results in regard to the initial photoelectric conversion efficiency, variation of the efficiency, photo-degradation, anti-environment characteristic against high-temperature, high-humidity atmosphere, and adhesion.

TABLE 215

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 48 | | | 51 | 170 | | | | 0.010 | 0.10 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 35 | | | 29 | 145 | | | | 0.010 | 0.10 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 80 | | | | 0.8 | | 0.007 | 190 | 90 |
| RF p-layer | | | 0.4 | | 90 | | 8 | 2 | 1.6 | | 0.07 | 170 | 10 |

These ten samples were subjected to evaluation of performance in the same way as that in Example D-3. Results of evaluation on each of the ten samples are shown in Table

TABLE 216

| Magnetic field intensity | 30 30 | 70 70 | 100 100 | 500 500 | 1000 1000 | 2000 2000 | 3000 3000 | 3050 3050 | 3500 3500 | 4000 4000 |
|---|---|---|---|---|---|---|---|---|---|---|
| Initial photoelectric conversion characteristic | x | Δ | ○ | ○ | ○ | ○ | ○ | Δ | x | x |
| Variation of characteristic | x | Δ | ○ | ○ | ○ | ○ | ○ | x | x | x |
| Photo-degradation characteristic | x | x | ○ | ○ | ○ | ○ | ○ | Δ | x | x |

TABLE 216-continued

| Magnetic field intensity | 30 30 | 70 70 | 100 100 | 500 500 | 1000 1000 | 2000 2000 | 3000 3000 | 3050 3050 | 3500 3500 | 4000 4000 |
|---|---|---|---|---|---|---|---|---|---|---|
| Anti-environment characteristic | × | Δ | ○ | ○ | ○ | ○ | ○ | Δ | × | × |
| Adhesion | × | Δ | ○ | ○ | ○ | ○ | ○ | Δ | × | × |

EXAMPLE D-12

This example is different from Example D-3 in that the annealing temperature was varied within the range of between 25° C. and 500° C., for the purpose of investigating the influence of the annealing temperature on the performance such as the initial photoelectric conversion efficiency. $H_2$ gas was used as the diluting gas for varying the concentration of the gas containing trace amount of oxygen atoms used in the annealing conducted under a static magnetic field.

In this example, as in Example D-3, a triple type photovoltaic element of FIG. 3 was produced by using the in-line type apparatus shown in FIG. 5. The process was materially the same as that in Example D-3, except that annealing conditions as shown in Table 217 and production conditions as shown in Table 218 were used. Ten sample elements were produced while varying the annealing temperature between 25° C. and 500° C. Other conditions were the same as those employed in Example D-3.

TABLE 217

CONDITIONS OF ANNEALING UNDER STATIC MAGNETIC FIELD IN GAS ATMOSPHERE CONTAINING TRACE AMOUNT OF OXYGEN ATOMS

| | |
|---|---|
| Type of gas containing oxygen atoms | $O_2/H_2$ |
| Gas concentration (dilution: ppm) | 2 |
| Type of magnet | ALNICO |
| Magnetic field intensity (G) | 850 |
| Annealing temp. (° C.) | 25–500 |
| Annealing press. (Torr) | 1.3 |

These ten samples were subjected to evaluation of performance in the same way as that in Example D-3. Results of evaluation on each of the ten samples are shown in Table 219. The evaluation was made by normalizing the values measured on the respective samples with the values measured on the sample which was produced by setting the annealing temperature to 25° C. A mark x indicates that the normalized value is not less than 1.0 but below 1.4, a mark Δ indicates that the normalized value is not less than 1.4 but below 1.8 and a mark ○ indicates that the normalized value is not less than 1.8.

From Table 219, it is understood that the temperature of the annealing in the atmosphere gas containing trace amount of oxygen atoms most preferably ranges from 50° C. to 400° C., in order to obtain good results in regard to the initial photoelectric conversion efficiency, variation of the efficiency, photo-degradation, anti-environment characteristic against high-temperature, high-humidity atmosphere, and adhesion.

TABLE 218

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SiH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 48 | | | 51 | 225 | | | | 0.010 | 0.10 | 0.25 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 35 | | | 29 | 140 | | | | 0.013 | 0.10 | 0.24 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 80 | | | | 0.8 | | 0.007 | 190 | 90 |
| RF p-layer | | | 0.4 | | 90 | | 8 | 2 | 1.6 | | 0.07 | 170 | 10 |

TABLE 219

| Annealing temp. (° C.) | 25 | 40 | 50 | 100 | 200 | 300 | 400 | 430 | 470 | 500 |
|---|---|---|---|---|---|---|---|---|---|---|
| Initial photoelectric conversion characteristic | × | Δ | ○ | ○ | ○ | ○ | ○ | × | × | × |
| Variation of characteristic | × | × | ○ | ○ | ○ | ○ | ○ | Δ | × | × |
| Photo-degradation characteristic | × | Δ | ○ | ○ | ○ | ○ | ○ | Δ | × | × |
| Anti-environment characteristic | × | Δ | ○ | ○ | ○ | ○ | ○ | × | × | × |
| Adhesion | × | × | ○ | ○ | ○ | ○ | ○ | Δ | × | × |

EXAMPLE D-13

This example is different from Example D-3 in that the pressure of the annealing atmosphere was varied within the range of between 0.002 Torr and 100 Torr, for the purpose of investigating the influence of the annealing atmosphere pressure on the performance such as the initial photoelectric conversion efficiency. $H_2$ gas was used as the diluting gas for determining the concentration of the gas containing trace amount of oxygen used in the annealing conducted under static magnetic field.

In this example, a triple type photovoltaic element of FIG. 3 was produced by using the in-line type apparatus shown in FIG. 5. The process were materially the same as that in Example D-3, except that annealing conditions as shown in Table 220 and production conditions as shown in Table 221 were used. Ten sample elements were produced while varying the pressure of the annealing atmosphere within the range of between 0.002 Torr and 100 Torr.

TABLE 220

CONDITIONS OF ANNEALING UNDER STATIC MAGNETIC FIELD IN GAS ATMOSPHERE CONTAINING TRACE AMOUNT OF OXYGEN ATOMS

| | |
|---|---|
| Type of gas containing oxygen atoms | $NO/H_2$ |
| Gas concentration (dilution: ppm) | 2 |
| Type of magnet | ALNICO |
| Magnetic field intensity (G) | 1850 |
| Annealing temp. (° C.) | 350 |
| Annealing press. (Torr) | 0.002–100 |

TABLE 221

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power W/cm² | RF Power W/cm² | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 47 | | | 51 | 150 | | | | 0.010 | 0.10 | 0.25 | 380 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 33 | | | 28 | 140 | | | | 0.013 | 0.10 | 0.24 | 360 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 60 | | | | 0.8 | | 0.007 | 190 | 90 |
| RF p-layer | | | 0.4 | | 90 | | 8 | 2 | 1.6 | | 0.07 | 170 | 10 |

These ten samples were subjected to evaluation of performance in the same way as that in Example D-3. Results of evaluation on each of the ten samples are shown in Table 222. The evaluation was made by normalizing the values measured on the respective samples with the values measured on the sample which was produced by setting the annealing atmosphere pressure to 0.002 Torr. A mark x indicates that the normalized value is not less than 1.0 but below 1.4, a mark Δ indicates that the normalized value is not less than 1.4 but below 1.8 and a mark ○ indicates that the normalized value is not less than 1.8.

From Table 222, it is understood that the pressure of the annealing atmosphere most preferably ranges from 0.01 Torr to 10 Torr, in order to obtain good results in regard to the initial photoelectric conversion efficiency, variation of the efficiency, photo-degradation, anti-environment characteristic against high-temperature, high-humidity atmosphere, and adhesion.

TABLE 222

| Annealing press. (Torr) | 0.002 0.002 | 0.005 0.005 | 0.01 0.01 | 0.1 0.1 | 1 1 | 5 5 | 10 10 | 20 20 | 50 50 | 100 100 |
|---|---|---|---|---|---|---|---|---|---|---|
| Initial photoelectric conversion characteristic | × | Δ | ○ | ○ | ○ | ○ | ○ | × | × | × |
| Variation of characteristic | × | × | ○ | ○ | ○ | ○ | ○ | Δ | × | × |
| Photo-degradation characteristic | × | Δ | ○ | ○ | ○ | ○ | ○ | Δ | × | × |
| Anti-environment characteristic | × | Δ | ○ | ○ | ○ | ○ | ○ | Δ | × | × |
| Adhesion | × | × | ○ | ○ | ○ | ○ | ○ | Δ | × | × |

EXAMPLE D-14

This example is different from Example D-3 in that the following conditions (i) to (iii) were employed, for the purpose of investigating the influence of these conditions on the performance such as the initial photoelectric conversion efficiency.

(i) The frequency of the microwave was varied within the range of between 0.02 GHz and 50 GHz in the formation of the MW i-layer 304 of a-SiGe and in the formation of the MW i-layer 307 of a-SiGe.

(ii) He gas was used in place of Ar gas, as the diluting gas which determines the concentration of the gas containing trace amount of oxygen atoms used in the annealing conducted under static magnetic field.

(iii) Different annealing conditions were adopted in annealing treatments effected on the MW i-layer 304 of aSiGe and the MW i-layer 307 of a-SiGe.

In this Example, a photovoltaic element of the triple type shown in FIG. 3 was manufactured by using an in-line type apparatus shown in FIG. 5, except that the above-mentioned varying conditions were employed. The process was as follows.

(1) A substrate having a reflecting layer 301 and a reflection enhancement layer 302 formed thereon (i.e. base member), prepared in the same way as that in Example D-1, was disposed on a substrate conveyor rails 413 laid in a load chamber 401, and the internal pressure of the load chamber 401 was lowered to $1\times10^{-5}$ Torr. by a vacuum pump (not shown).

(2) Then, gate valves 406 and 407 were opened and the substrate was conveyed into conveyance chambers 402, 403 and then into a deposition chamber 418 which have been evacuated to certain levels of vacuum by vacuum pumps which are not shown. The substrate was held such that its reverse side is kept in close contact with a substrate heater 411 so as to be heated by the heater 411, while the interior of the deposition chamber 418 was evacuated by the vacuum pump to a level of $1\times10^{-5}$ Torr.

(3) Preparation for film forming operation was thus completed. Then, the $H_2$ gas was introduced into the deposition chamber 417 through a gas-introduction line 429 and the flow rate of the $H_2$ gas was controlled to 500 sccm by means of valves 441, 431, 430, under the control of a mass-flow controller 436. At the same time, the internal pressure of the deposition chamber 417 was regulated to 1.3 Torr. by a conductance valve (not shown).

Meanwhile, the substrate heater 410 was adjusted to maintain the substrate temperature at 350° C. When the substrate temperature has been stabilized, an RF n-layer 303 of μc-Si, an RF i-layer 351 of a-Si, and an MW i-layer 304 of a-SiGe were formed in the same way as that in Example D-2. In the formation of the MW i-layer, the MW introduction window 425 was removed and, instead, an antenna-type MW introduction electrode (not shown) was used according to the frequency of the microwave.

(4) Then, an annealing was executed in an atmosphere of a gas containing a trace amount of oxygen atoms under a static magnetic field.

For the purpose of executing the annealing in the gas atmosphere containing a trace amount of oxygen atoms under the static magnetic field, $O_2$/He gas (dilution: 1 ppm) was introduced as the oxygen atom-containing gas into the deposition chamber 418 through the gas introduction line 449. The valves 465 and 455 were opened and the flow rate of the $O_2$/He gas (dilution 1 ppm) was controlled to 500 sccm by means of a mass-flow controller 460. Then, an alnico magnet of 2800 gauss having a height adjusting mechanism, serving as means for applying static magnetic field, was installed. Meanwhile, the pressure in the deposition chamber 418 was controlled to 1.5 Torr by a conductance valve (not shown).

The annealing in accordance with the invention in a gas atmosphere containing trace amount of oxygen atoms under the static magnetic field was conducted for 10 minutes, while the substrate heater 411 was controlled to maintain the substrate temperature at 300° C. Then, the alnico magnet 495 of 2800 gauss having height adjusting mechanism, serving as the means for applying static magnetic field, was removed and the supply of the $O_2$/He gas (dilution: 1 ppm) into the deposition chamber 418 was stopped. The interior of the deposition chamber 418 and the gas line was then evacuated to $1\times10^{-5}$ Torr.

(5) Then, an RF i-layer 361 of a-Si, an RF p-layer 305 of a-SiC, an RF n-layer 306 of μc-Si, an RF i-layer 352 of a-Si, and an MW i-layer 307 of a-SiGe were successively formed, in accordance with a procedure which is substantially the same as that used in Example D-2. In the formation of the MW i-layer, the MW introduction window 425 was removed and, instead, an antenna-type MW introduction electrode (not shown) was used according to the frequency of the microwave.

(6) Then, an annealing was executed in an atmosphere of a gas containing a trace amount of oxygen atoms under a static magnetic field.

For the purpose of executing the annealing in the gas atmosphere containing a trace amount of oxygen atoms, $O_2$/He gas (dilution: 1 ppm) was introduced as the oxygen atom-containing gas into the deposition chamber 418 through the gas introduction line 449. The valves 465 and 455 were opened and the flow rate of the $O_2$/He gas (dilution 1 ppm) was controlled to 500 sccm by means of a mass-flow controller 460. An alnico magnet 495 of 2700 gauss having a height adjusting mechanism, serving as means for applying the static magnetic field, was installed. Meanwhile, the pressure in the deposition chamber 418 was controlled to 1.4 Torr by a conductance valve (not shown).

The annealing in accordance with the invention in a gas atmosphere containing trace amount of oxygen atoms was conducted for 10 minutes, while the substrate heater 411 was controlled to maintain the substrate temperature at 280° C. Then, the alnico magnet 495 of 2700 gauss having the height adjusting mechanism, serving as the means for applying static magnetic field, was removed and the supply of the $O_2$/He gas (dilution: 1 ppm) into the deposition chamber 418 was stopped. Then, the interior of the deposition chamber 418 and the gas line was evacuated to $1\times10^{-5}$ Torr.

(7) Then, an RF-i-layer 362 of a-Si, an RF p-layer 308 of a-SiC, an RF n-layer 309 of μc-Si, an RF i-layer 310 of a-Si, and an RF p-layer 311 of a-SiC were successively formed, in accordance with a procedure which is substantially the same as that used in Example D-2.

(8) Then, an ITO film of 70 nm thick, serving as a transparent conductive layer 312, was formed on the RF p-layer 311 by vacuum evaporation.

(9) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Production of the photovoltaic element of this example was thus completed. Ten samples were produced while varying the frequency of the microwave used in the formation of the MW i-layer within the range of from 0.02 GHz to 50 GHz. The conditions of the annealing in the atmosphere of the gas containing trace amount of oxygen atoms and the conditions employed in the formation of the RF n-layer, RF i-layer, MW i-layer and RF p-layer are shown in Tables 223, 224 and 225.

TABLE 223

CONDITIONS OF ANNEALING UNDER STATIC MAGNETIC FIELD IN GAS ATMOSPHERE CONTAINING TRACE AMOUNT OF OXYGEN ATOMS
(MW i-layer 304)

| | |
|---|---|
| Type of gas containing oxygen atoms | $O_2$/HE |
| Gas concentration (dilution: ppm) | 1 |
| Type of magnet | ALNICO |
| Magnetic field intensity (G) | 2800 |
| Annealing temp. (° C.) | 300 |
| Annealing press. (Torr) | 1.5 |

TABLE 224

CONDITIONS OF ANNEALING UNDER STATIC MAGNETIC FIELD IN GAS ATMOSPHERE CONTAINING TRACE AMOUNT OF OXYGEN ATOMS
(MW i-layer 307)

| | |
|---|---|
| Type of gas containing oxygen atoms | $O_2$/He |
| Gas concentration (dilution: ppm) | 1 |
| Type of magnet | ALNICO |
| Magnetic field intensity (G) | 2700 |
| Annealing temp. (° C.) | 280 |
| Annealing press. (Torr) | 1.4 |

These ten samples were subjected to evaluation of performance in the same way as that in Example D-3. Results of evaluation on each of the ten samples are shown in Table 226. The evaluation was made by normalizing the values measured on the respective samples with the values measured on the sample which was produced by using the microwave frequency of 0.02 GHz. A mark x indicates that the normalized value is not less than 1.0 but below 1.4, a mark Δ indicates that the normalized value is not less than 1.4 but below 1.8 and a mark ○ indicates that the normalized value is not less than 1.8. A mark ⊙ indicates that the nonmasked value is more than 2.0.

From Table 226, it is understood that the frequency of the microwave, which is employed in the formation of the MW i-layer 304 of a-SiGe and the MW i-layer 307 of a-SiGe which are to be annealed in the gas atmosphere containing trace amount of oxygen atoms under a static magnetic field, most preferably ranges from 0.1 GHz to 10 GHz, in order to obtain good results in regard to the initial photoelectric conversion efficiency, variation of the efficiency, photo-degradation, anti-environment characteristic against high-temperature, high-humidity atmosphere, and adhesion.

TABLE 226

| Microwave frequency: GHz | 0.02 | 0.05 | 0.1 | 0.5 | 1 | 2.45 | 10 | 20 | 30 | 50 |
|---|---|---|---|---|---|---|---|---|---|---|
| Initial photoelectric conversion characteristic | x | x | ⊙ | ○ | ○ | ⊙ | ○ | x | x | x |
| Variation of characteristic | x | x | ○ | ⊙ | ○ | ⊙ | ○ | x | x | x |
| Photo-degradation characteristic | x | x | ○ | ⊙ | ⊙ | ⊙ | ○ | Δ | x | x |
| Anti-environment characteristic | x | Δ | ⊙ | ⊙ | ○ | ⊙ | ○ | x | x | x |
| Adhesion | x | x | ○ | ○ | ○ | ⊙ | ○ | x | x | x |

EXAMPLE D-15

In this example, a triple type photovoltaic element of the type shown in FIG. 3 was produced by using the roll-to-roll type apparatus shown in FIG. 9. The annealing was conducted under various conditions of annealing conducted in an atmosphere containing trace amount of oxygen atoms under a static magnetic field. The production process was as follows.

TABLE 225

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 220 | | | 1.0 | | 0.05 | 350 | 20 |
| RF i-layer | | 4.0 | | | 100 | | | | 0.8 | | 0.008 | 300 | 10 |
| MW i-layer | 47 | | | 49 | 280 | | | | 0.005 | 0.25 | 0.28 | 380 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 33 | | | 28 | 200 | | | | 0.005 | 0.25 | 0.28 | 360 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 70 | | | | 0.8 | | 0.007 | 190 | 90 |
| RF p-layer | | | 0.4 | | 90 | | 8 | 2 | 1.6 | | 0.07 | 170 | 10 |

(1) A sheet-like substrate (base member) of 30 cm wide, composed of a substrate of a stainless steel and carrying a reflecting layer such as of Ag (or Al—Si or the like) and a reflection enhancement layer such as of ZnO, was rolled up and set in a loading chamber 5010 for loading sheet-type substrate.

(2) The sheet-type substrate was threaded through all the deposition chambers and all the gas gates, and was connected to a sheet take-up jig disposed in an unload chamber 5150.

(3) The deposition chambers were evacuated to a level of 10-3 Torr or lower by evacuating systems which are not shown. Material gases were supplied to the deposition chambers, from mixing devices 5024, 5034, 5044, 5054, 5064, 5074, 5084, 5094, 5104, 5114, 5124, 5134 and 5144 associated with the respective deposition chambers.

(4) An alnico magnet roller M of 1200 gauss was incorporated in each of the gas gates 5201, 5202, 5203, 5204, 5205, 5206, 5207, 5208, 5209, 5210, 5211, 5212, 5213 and 5214 and gases containing trace amounts of oxygen atoms to be used under static magnetic fields were supplied from the respective gate gas supply devices to these gas gates.

In this example, the gap in the gas gate through which the sheet-type substrate passes was variable, and the gas containing trace amount of oxygen atoms to be used under the static magnetic field was supplied to the gas gates at a total flow rate of 1000 sccm. The temperature of the annealing in the atmosphere of the gas containing trace amount of oxygen atoms under the static magnetic field was controlled to range between 350° C. and 50° C. by means of heaters incorporated in the gas gates.

At the same time, the annealing pressure was controlled to range between 3 Torr and 1 Torr, by means of an evacuating system which is not shown.

(5) The substrate was heated by a substrate heater of each deposition device, and the level of the vacuum in each deposition device was controlled by operating an evacuating valve of each evacuation device. Advance of the sheet-type substrate was commenced when the substrate temperature and the vacuum level have been settled, and RF power for generating plasma and MW power (frequency 2.45 GHz) were supplied to each deposition device. A triple-type solar cell having three pin structures stacked one on another on the sheet-type substrate 300 was thus produced.

(6) Then, an ITO film of 70 nm thick, serving as a transparent conductive layer 312, was formed on the RF p-layer 311 by vacuum evaporation.

(7) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of this example was thus completed. This element will be referred to as "SC/D-15". The conditions of the annealing in gas atmosphere containing trace amount of oxygen atoms under the static magnetic field in this example, as well as the conditions of film-forming processes for forming the RF n-layer, RF i-layer, MW i-layer and RF-p layer are collectively shown in Tables 227 and 228.

TABLE 227

CONDITIONS OF ANNEALING UNDER STATIC MAGNETIC FIELD IN GAS ATMOSPHERE CONTAINING TRACE AMOUNT OF OXYGEN ATOMS

| Gas gate | Type of gas | Gas concentration (dilution: ppm) | Annealing temp. (° C.) | Annealing press. (Torr) |
|---|---|---|---|---|
| 5201 | $O_2$/He | 900 | 350 | 3.0 |
| 5202 | $O_2$/$H_2$ | 3 | 350 | 2.0 |
| 5203 | $O_2$/H | 1 | 350 | 1.5 |
| 5204 | $O_2$/He | 1 | 300 | 1.2 |
| 5205 | NO/He | 5 | 300 | 2.5 |
| 5206 | NO/He | 200 | 300 | 2.3 |
| 5207 | $O_2$/He | 10 | 300 | 1.8 |
| 5208 | $O_2$/$H_2$ | 1 | 350 | 1.2 |
| 5209 | $O_2$/$H_2$ | 1 | 280 | 1.0 |
| 5210 | $O_2$/He | 5 | 260 | 2.3 |
| 5211 | NO/He | 100 | 230 | 2.2 |
| 5212 | $O_2$/$H_2$ | 1 | 190 | 1.3 |
| 5213 | $O_2$/He | 5 | 170 | 2.1 |
| 5214 | $O_2$/He | 900 | 50 | 2.1 |

TABLE 228

| | $SiH_4$ flow rate sccm | $Si_2H_6$ flow rate sccm | $CH_4$ flow rate sccm | $GeH_4$ flow rate sccm | $H_2$ flow rate sccm | $PH_3$/$H_2$ flow rate sccm | $B_2H_6$/$H_2$ flow rate sccm | $SIH_4$/$H_2$ flow rate sccm | Press. Torr | MW Power W/cm$^2$ | RF Power W/cm$^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 47 | | | 49 | 130 | | | | 0.005 | 0.07 | 0.28 | 380 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 33 | | | 29 | 120 | | | | 0.005 | 0.05 | 0.28 | 360 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 70 | | | | 0.8 | | 0.007 | 190 | 90 |
| RF p-layer | | | 0.4 | | 90 | | 8 | 2 | 1.6 | | 0.07 | 170 | 10 |

Comparative Example D 15-1

A process was conducted as Comparative Example D 15-1. This process was different from Example D-15 in that it omitted the annealing in the gas atmosphere containing trace amount of oxygen atoms under the static magnetic field and that $H_2$ gas or He gas as desired was supplied to each gas gate.

Other conditions were materially the same as those in Example D-15. The photovoltaic element produced in Comparative Example D15-1 will be referred to as "SC/CD15-1".

Seven samples of the photovoltaic elements SC/D-15, as well as seven samples of the photovoltaic elements SC/CD15-1, were produced and were subjected, basically in the same way as Example A-1 and Comparative Example A1-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The photo-degradation was evaluated by setting the element temperature to 52° C. The anti-environment characteristic was evaluated by setting the temperature to 86° C., the humidity to 91% and the time of shelving in the dark place to 150 hours. The results are shown in Table 229.

The performance of the photovoltaic element is shown in Table 229 in terms of values measured on the samples of the photovoltaic element SC/D-15 as normalized by the values measured on the samples of the photovoltaic element SC/CD15-1.

TABLE 229

| Items of evaluation | Evaluation |
|---|---|
| Initial photoelectric conversion efficiency characteristic | 1.56 |
| Variation of Initial photoelectric conversion efficiency characteristic | 0.84 |
| Photo-degradation characteristic | 0.81 |
| Anti-environment characteristic | 0.83 |
| SEM observation of sectional face | 0.91 |
| Measurement of adhesion: Delamination | No delamination in SC/D-15 Slight delamination in SC/CD15-1 |

From Table 229, it is understood that the photovoltaic element in SC/D-15 of this example exhibits superiority to the comparative example SC/CD15-1 in all items of the evaluation.

EXAMPLE D-16

In this example, a triple type photovoltaic element of the type shown in FIG. 3 was produced by using the roll-to-roll type apparatus shown in FIG. 9. The annealing was conducted under various combinations of annealing conditions in a gas atmosphere containing trace amount of oxygen atoms. The production process was as follows.

(1) A sheet-like substrate (base member) of 30 cm wide, composed of a substrate of a stainless steel and carrying a reflecting layer such as of Ag (or Al—Si or the like) and a reflection enhancement layer such as of ZnO, was rolled up and set in a loading chamber 5010 for loading sheet-type substrate. The sheet-type substrate was threaded through all the deposition chambers and all the gas gates, and was connected to a sheet take-up jig disposed in an unload chamber 5150. The deposition chambers were evacuated to a level of $10^{-3}$ Torr or lower by evacuating systems which are not shown.

(2) Material gases were supplied to the deposition chambers, from mixing devices 5024, 5034, 5044, 5054, 5064, 5074, 5084, 5094, 5104, 5114, 5124, 5134 and 5144 associated with the respective deposition chambers.

(3) An alnico magnet roller M of 1000 gauss was incorporated in each of the gas gates 5201, 5202, 5203, 5204, 5205, 5206, 5207, 5208, 5209, 5210, 5211, 5212, 5213 and 5214 and gases containing trace amounts of oxygen atoms to be used under static magnetic fields were supplied to these gates from the respective gas supply devices.

In this example, the gap in the gas gate through which the sheet-type substrate passes was variable, and the gas containing trace amount of oxygen atoms under the static magnetic field was supplied to the gas gates at a total flow rate of 1000 sccm. The temperature of the annealing in the gas atmosphere containing trace amount of oxygen atoms under static magnetic field was controlled to range between 350° C. and 50° C. by means of heaters incorporated in the gas gates. At the same time, the annealing pressure was controlled to range between 3 Torr and 1 Torr, by means of an evacuating system which is not shown.

(4) The substrate was heated by a substrate heater of each deposition device, and the level of the vacuum in each deposition device was controlled by operating an evacuating valve of each evacuation device. Advance of the sheet-type substrate was commenced when the substrate temperature and the vacuum level had been settled, and RF power for generating plasma and MW power (frequency 0.5 GHz) were supplied to each deposition chamber. An antenna-type MW introduction electrode was used in the MW power supply system.

A triple-type solar cell having three pin structures stacked on one on another on the sheet-type substrate 300 was thus produced.

(5) Then, an ITO film of 70 nm thick, serving as a transparent conductive layer 312, was formed on the RF p-layer 311 by vacuum evaporation.

(6) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of this example was thus completed. This element will be referred to as "SC/D-16". The conditions of the annealing in gas atmosphere containing trace amount of oxygen atoms under the static magnetic field in this example, as well as the conditions of film-forming processes for forming the RF n-layer, RF i-layer, MW i-layer and RF-p layer are collectively shown in Tables 230 and 231.

TABLE 230

CONDITIONS OF ANNEALING UNDER STATIC MAGNETIC FIELD IN GAS ATMOSPHERE CONTAINING TRACE AMOUNT OF OXYGEN ATOMS

| Gas gate | Type of gas | Gas concentration (dilution: ppm) | Annealing temp. (° C.) | Annealing press. (Torr) |
|---|---|---|---|---|
| 5201 | $O_2/Ar$ | 900 | 350 | 3.0 |
| 5202 | $CO_2/H_2$ | 1 | 350 | 2.1 |
| 5203 | $O_2/H_2$ | 1 | 350 | 1.5 |
| 5204 | $O_2/H_2$ | 1 | 300 | 1.2 |
| 5205 | CO/He | 10 | 300 | 2.4 |
| 5206 | NO/Ar | 120 | 300 | 2.3 |
| 5207 | $O_2$/He | 10 | 300 | 1.7 |
| 5208 | $O_2/H_2$ | 1 | 350 | 1.2 |
| 5209 | $O_2/H_2$ | 1 | 280 | 1.0 |
| 5210 | CO/He | 5 | 260 | 2.3 |

TABLE 230-continued

CONDITIONS OF ANNEALING UNDER STATIC MAGNETIC FIELD IN GAS ATMOSPHERE CONTAINING TRACE AMOUNT OF OXYGEN ATOMS

| Gas gate | Type of gas | Gas concentration (dilution: ppm) | Annealing temp. (° C.) | Annealing press. (Torr) |
|---|---|---|---|---|
| 5211 | NO/Ar | 80 | 230 | 2.2 |
| 5212 | $O_2/H_2$ | 1 | 190 | 1.3 |
| 5213 | $O_2$/He | 10 | 170 | 2.1 |
| 5214 | $O_2$/He | 800 | 50 | 2.1 |

TABLE 231

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 220 | | | 1.0 | | 0.05 | 350 | 20 |
| RF i-layer | | 4.0 | | | 100 | | | | 0.8 | | 0.008 | 300 | 10 |
| MW i-layer | 45 | | | 47 | 130 | | | | 0.004 | 0.13 | 0.30 | 380 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 31 | | | 28 | 120 | | | | 0.004 | 0.10 | 0.30 | 360 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 60 | | | | 0.7 | | 0.007 | 190 | 90 |
| RF p-layer | | | 0.4 | | 90 | | 8 | 2 | 1.6 | | 0.07 | 170 | 10 |

Comparative Example D 16-1

A process was conducted as Comparative Example D 16-1. This process was different from Example D-16 in that it omitted the annealing in the gas atmosphere containing trace amount of oxygen atoms under the static magnetic field and that $H_2$ gas, He gas or Ar gas as desired was supplied to each gas gate.

Other conditions were materially the same as those in Example D-16. The photovoltaic element produced in Comparative Example D 16-1 will be referred to as "SC/CD16-1".

Seven samples of the photovoltaic elements SC/D-16, as well as seven samples of the photovoltaic elements SC/CD16-1, were produced and were subjected, basically in the same way as Example A-1 and Comparative Example A1-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The photo-degradation characteristic was measured by setting the element temperature to 45° C. The e anti-environment characteristic was evaluated by setting the temperature to 87° C., the humidity to 92% and the time of shelving in the dark place to 200 hours. The results are shown in Table 232.

The performance of the photovoltaic element is shown in Table 232 in terms of values measured on the samples of the photovoltaic element SC/D-16 as normalized by the values measured on the samples of the photovoltaic element SC/CD16-1.

TABLE 232

| Items of evaluation | Evaluation |
|---|---|
| Initial photoelectric conversion efficiency characteristic | 1.56 |
| Variation of Initial photoelectric conversion efficiency characteristic | 0.83 |
| Photo-degradation characteristic | 0.81 |
| Anti-environment characteristic | 0.84 |

TABLE 232-continued

| Items of evaluation | Evaluation |
|---|---|
| SEM observation of sectional face | 0.91 |
| Measurement of adhesion: Delamination | No delamination in SC/D-16 Slight delamination in SC/CD16-1 |

From Table 232, it is understood that the photovoltaic element in SC/D-16 of this example exhibits superiority to the comparative example SC/CD16-1 in all items of the evaluation.

EXAMPLE D-17

In this example, a triple type photovoltaic element of the type shown in FIG. 3 was produced by using the roll-to-roll type apparatus shown in FIG. 9. The annealing was conducted under various combinations of conditions of annealing conducted in an atmosphere containing trace amount of oxygen atoms under a static magnetic field. The production process was as follows.

(1) A sheet-like substrate (base member) of 30 cm wide, composed of a substrate of a stainless steel and carrying a reflecting layer such as of Ag (or Al—Si or the like) and a reflection enhancement layer such as of ZnO, was rolled up and set in a loading chamber 5010 for loading sheet-type substrate. The sheet-type substrate was threaded through all the deposition chambers and all the gas gates, and was connected to a sheet take-up jig disposed in an unload chamber 5150. The deposition chambers were evacuated to a level of $10^{-3}$ Torr or lower by evacuating systems which are not shown.

(2) Material gases were supplied to the deposition chambers, from mixing devices 5024, 5034, 5044, 5054, 5064, 5074, 5084, 5094, 5104, 5114, 5124, 5134 and 5144 associated with the respective deposition chambers.

(3) An alnico magnet roller M having a static magnetic field intensity of 900 gauss was incorporated in each of the gas gates 5201, 5202, 5203, 5204, 5205, 5206, 5207, 5208, 8209, 5210, 5211, 5212, 5213 and 5214 and gases containing trace amounts of oxygen atoms were introduced into these gates so as to be used under the static magnetic fields.

In this example, the gap in the gas gate through which the sheet-type substrate passes was variable, and the gas containing trace amount of oxygen atoms under the static magnetic field was supplied to the gas gates at a total flow rate of 1200 sccm. The temperature of the annealing conducted in the atmosphere containing trace amount of oxygen atoms under the static magnetic field was controlled to range between 350° C. and 50° C. by means of heaters incorporated in the gas gates. At the same time, the annealing pressure was controlled to range between 3 Torr and 1 Torr, by means of an evacuating system which is not shown.

(4) The substrate was heated by a substrate heater of each deposition device, and the level of the vacuum in each deposition device was controlled by operating an evacuating valve of each evacuation device. Advance of the sheet-type substrate was commenced when the substrate temperature and the vacuum level had been settled, and RF power for generating plasma and MW power (frequency 0.1 GHz) were supplied to each deposition chamber. An antenna-type MW introduction electrode was used in the MW power supply system.

A triple-type solar cell having three pin structures stacked one on another on the sheet-type substrate 300 was thus produced.

(5) Then, an ITO film of 70 nm thick, serving as a transparent conductive layer 312, was formed on the RF p-layer 311 by vacuum evaporation.

(6) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of this example was thus completed. This element will be referred to as "SC/D-17". The conditions of the annealing in gas atmosphere containing trace amount of oxygen atoms in this example, as well as the conditions of film-forming processes for forming the RF n-layer, RF i-layer, MW i-layer and RF-p layer are collectively shown in Tables 233 and 234.

TABLE 233

CONDITIONS OF ANNEALING UNDER STATIC MAGNETIC FIELD IN GAS ATMOSPHERE CONTAINING TRACE AMOUNT OF OXYGEN ATOMS

| Gas gate | Type of gas | Gas concentration (dilution: ppm) | Annealing temp. (° C.) | Annealing press. (Torr) |
|---|---|---|---|---|
| 5201 | $O_2/Ar$ | 800 | 350 | 3.0 |
| 5202 | $CO_2/H_2$ | 2 | 350 | 2.1 |
| 5203 | $O_2/H_2$ | 1 | 350 | 1.5 |
| 5204 | $O_2/H_2$ | 1 | 300 | 1.2 |
| 5205 | CO/He | 5 | 300 | 2.4 |
| 5206 | NO/Ar | 120 | 300 | 2.3 |
| 5207 | $O_2/He$ | 10 | 300 | 1.7 |
| 5208 | $O_2/H_2$ | 1 | 350 | 1.2 |
| 5209 | $O_2/H_2$ | 1 | 280 | 1.0 |
| 5210 | CO/He | 10 | 260 | 2.3 |
| 5211 | NO/Ar | 80 | 230 | 2.2 |
| 5212 | $O_2/H_2$ | 1 | 190 | 1.3 |
| 5213 | $CO_2/He$ | 10 | 170 | 2.1 |
| 5214 | $O_2/H_2$ | 700 | 50 | 2.1 |

TABLE 234

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 220 | | | 1.0 | | 0.05 | 350 | 20 |
| RF i-layer | | 4.0 | | | 100 | | | | 0.8 | | 0.008 | 300 | 10 |
| MW i-layer | 46 | | | 48 | 130 | | | | 0.004 | 0.26 | 0.29 | 380 | 90 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 31 | | | 29 | 120 | | | | 0.004 | 0.26 | 0.29 | 375 | 85 |
| RF i-layer | | 4.0 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 60 | | | | 0.7 | | 0.007 | 190 | 88 |
| RF p-layer | | | 0.4 | | 90 | | 8 | 2 | 1.6 | | 0.07 | 170 | 10 |

Comparative Example D 17-1

A process was conducted as Comparative Example D 17-1. This process was different from Example D-17 in that it omitted the annealing in the gas atmosphere containing trace amount of oxygen atoms under the static magnetic field and that H2 gas, He gas or Ar gas as desired was supplied to each gas gate.

Other conditions were materially the same as those in Example D-17. The photovoltaic element produced in Comparative Example D17-1 will be referred to as "SC/CD17-1".

Seven samples of the photovoltaic elements SC/D-17, as well as seven samples of the photovoltaic elements SC/CD17-1, were produced and were subjected, basically in the same way as Example A-1 and Comparative Example A1-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The initial photoelectric conversion efficiency was evaluated in terms of variation of the conversion efficiency among the seven sample elements of each type. The photo-degradation characteristic was measured by setting the element temperature to 43° C. The anti-environment characteristic was evaluated by setting the temperature to 86° C., the humidity to 93% and the time of shelving in the dark place to 220 hours. The results are shown in Table 235.

The performance of the photovoltaic element is shown in Table 235 in terms of values measured on the samples of the photovoltaic element SC/D-17 as normalized by the values measured on the samples of the photovoltaic element SC/CD17-1.

TABLE 235

| Items of evaluation | Evaluation |
|---|---|
| Initial photoelectric conversion efficiency characteristic | 1.57 |
| Variation of Initial photoelectric conversion efficiency characteristic | 0.84 |
| Photo-degradation characteristic | 0.82 |
| Anti-environment characteristic | 0.84 |
| SEM observation of sectional face | 0.91 |
| Measurement of adhesion: Delamination | No delamination in SC/D-17 Slight delamination in SC/CD17-1 |

From Table 235, it is understood that the photovoltaic element in SC/D-17 of this example exhibits superiority to the comparative example SC/CD17-1 in all items of the evaluation.

EXAMPLE D-18

Using the in-line type apparatus shown in FIG. 5, four types of samples of mono-film were prepared for measurement of interface defect density. More specifically, these four samples are a sample Da in which the mono-film of a formed semiconductor layer is an RF n-layer, a sample Db in which the mono-film of a formed semiconductor layer is an RF i-layer, a sample Dc in which the mono-film of a formed semiconductor layer is an MW i-layer, and a sample Dd in which the mono-film of a formed semiconductor layer is an RF p-layer.

The Process for preparing these samples was as follows.

(1) A substrate (base member) for each sample was prepared by effecting, on a substrate 100 of quartz glass of 25 mm wide, 50 mm long and 0.8 mm thick, supersonic cleaning conducted by employing acetone and isopropanol, followed by drying with heated air.

(2) A Cr layer of 5 nm thick was formed on the surface of the substrate 100 of quartz glass by sputtering.

(3) Then, one of n-type semiconductor layer, i-type semiconductor layer and p-type semiconductor layer were formed to a thickness of 1 $\mu$m by the same method as that used in Example D-1, and the substrate having such semiconductor layer was subjected to annealing in atmosphere of a gas containing trace amount of oxygen atoms under a static magnetic field in the same way as that in Example D-1.

Samples of mono-films for the purpose of measurement of interface defect density were thus prepared. The conditions of the annealing in gas atmosphere containing trace amount of oxygen atoms under static magnetic field in this example, as well as the conditions of film-forming processes for forming the RF n-layer, RF i-layer, MW i-layer and RF-p layer are collectively shown in Tables 236 and 237.

TABLE 236

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF ATOMS OF GROUP III ELEMENT

| Sample | Type of gas containing oxygen atoms | Concentration of trace amount of Oxygen atoms (ppm) | Type of magnet | Magnetic field intensity (G) | Annealing temp. (° C.) | Annealing press. (Torr) |
|---|---|---|---|---|---|---|
| Da | $O_2/Ar$ | 120 | SAMARIUM COBALT | 1800 | 350 | 2.5 |
| Db | $O_2/H_2$ | 3 | ALNICO | 2000 | 250 | 1.8 |
| Dc | $O_2/H_2$ | 2 | ALNICO | 2500 | 300 | 2 |
| Dd | $CO_2/He$ | 150 | SAMARIUM COBALT | 1500 | 230 | 3.5 |

TABLE 237

| Sample | SiH$_4$ flow rate sccm | Si$_2$H$_6$ flow rate sccm | CH$_4$ flow rate sccm | GeH$_4$ flow rate sccm | H$_2$ flow rate sccm | PH$_3$/H$_2$ flow rate sccm | B$_2$H$_6$/H$_2$ flow rate sccm | SiH$_4$/H$_2$ flow rate sccm | Press. Torr | MW Power W/cm$^2$ | RF Power W/cm$^2$ | Substrate temp. °C |
|---|---|---|---|---|---|---|---|---|---|---|---|---|
| 8a RF n-layer | 2.5 | | | | 100 | 200 | | | 1.0 | | 0.05 | 350 |
| 8b RF i-layer | | 3.8 | | | 90 | | | | 0.6 | | 0.008 | 300 |
| 8c MW i-layer | 45 | | | 47 | 200 | | | | 0.006 | 0.08 | 0.30 | 380 |
| 8d RF i-layer | | | 0.3 | | 80 | 10 | | 2 | 2.2 | | 0.07 | 230 |

Comparative Example D 18-1

A process was conducted as Comparative Example D 18-1. This process was different from Example D-18 in that each semiconductor layer was formed without the annealing in the gas atmosphere containing trace amount of oxygen atoms in the static magnetic field.

Other conditions were materially the same as those in Example D-18. The mono-film for measurement of interface defect density prepared in Comparative Example D 18-1 will be referred to as "SC/CD18-1".

Three samples of mono-film Da to Dd, as well as three samples of mono-film SC/CD18-1, were produced and were subjected to PDS (Photothermal Deflection Spectroscopy) measurement. The results are shown in Table 238. The measurement results are shown in this Table in terms of values measured on the samples Da to Dd normalized with the values measured on the samples of the comparative example, i.e., SC/CD18-1. Thus, the values shown in table 238 shows the ratio of reduction in the interface defect density.

TABLE 238

| Sample name | Type of semiconductor layer formed | Reduction of interfacial defect density |
|---|---|---|
| Da | RF n-layer | 0.96 |
| Db | RF i-layer | 0.90 |
| Dc | MW i-layer | 0.88 |
| Dd | RF p-layer | 0.94 |

From Table 238, it is understood that the samples Da to Dd of the Example D-18, which have undergone the annealing in atmosphere gas containing trace amount of oxygen atoms in accordance with the invention, exhibit smaller density of interface defects and, hence, superior performance, as compared with the samples of Comparative Example (SC/CD18-1) which were prepared without such annealing.

EXAMPLE E-1

In this Example, a photovoltaic element of the type shown in FIG. 1 was manufactured by using an in-line type apparatus shown in FIG. 5, in accordance with the following procedure.

(1) A substrate (base member) was prepared as follows. A substrate 100 of a stainless steel of 50 mm long, 50 mm wide and 0.5 mm thick was subjected to an ultrasonic cleaning which was conducted by using acetone and propanol, followed by drying with heated air. A light reflecting layer 101 of Ag, having a thickness of 0.3 μm, was formed on the stainless steel substrate 100 by sputtering at room temperature. Then, a reflection enhancement layer 102 of ZnO, having a thickness of 1.0 μm, was formed on the reflecting layer 101 at 350° C., thus completing preparation of the substrate (base member).

(2) A deposition apparatus 400 is capable of performing both MWPCVD process and RFPCVD process. Semiconductor layers were formed on the reflection enhancement layer by using this apparatus.

Material gas cylinders, which were not shown, were connected to the deposition apparatus, through gas introduction lines. These cylinders contained material gases of ultra-high purity. More specifically, the following material gas cylinders were connected: an SiH$_4$ gas cylinder, O$_2$/H$_2$ (dilution: 2 ppm) gas cylinder, an O$_2$/He (dilution: 10 ppm) gas cylinder, O$_2$/Ar (dilution 100 ppm) gas cylinder, an O$_2$/H$_2$. (dilution: 2000 ppm) gas cylinder, a CH$_4$ gas cylinder, a GeH$_4$ gas cylinder, an Si$_2$H$_6$ gas cylinder, a PH$_3$/H$_2$ gas (dilution: 0.1%) gas cylinder, B$_2$H$_6$/H$_2$ (dilutions: 2 ppm, 10 ppm, 100 ppm, 2000 ppm) gas cylinders, BF$_3$/H$_2$ gas (dilutions 2 ppm, 10 ppm, 100 ppm, 2000 ppm) cylinders, an H$_2$ gas cylinder, an He gas cylinder, an SiCl$_2$H$_2$ gas cylinder and an SiH$_4$/H$_2$ (dilution: 1%) gas cylinder.

(3) The substrate having the reflecting layer 101 and the reflection enhancement layer 102 formed thereon (i.e. base member) was disposed on a substrate conveyor rails 413 laid in a load chamber 401, and the internal pressure of the load chamber 401 was lowered to 1×10$^{-5}$ Torr. by a vacuum pump (not shown). Then, a gate valve 406 was opened and the substrate was conveyed into a conveyance chamber 402 and then into a deposition chamber 417 which had been evacuated to certain levels of vacuum by vacuum pumps which are not shown. The substrate was held such that its reverse side was kept in close contact with a substrate heater 410 so as to be heated by the heater 410, while the interior of the deposition chamber 417 was evacuated by the vacuum pump to a level of 1×10$^{-5}$ Torr.

(4) Preparation for film forming operation was thus completed. Then, H$_2$ gas was introduced into the deposition chamber 417 through a gas-introduction line 429 and the flow rate of the H$_2$ gas was controlled to 500 sccm by means of valves 441, 431, 430, under the control of a mass-flow controller 436. At the same time, the internal pressure of the deposition chamber 417 was regulated to 1.0 Torr. by a conductance valve (not shown). Meanwhile, the substrate heater 410 was adjusted to maintain the substrate temperature at 350° C.

(5) An RF n-layer 103 of μc-Si was formed when the substrate became steady.

To this end, valves 443, 433, 444 and 434 were operated to introduce the SiH$_4$ gas and PH$_3$/H$_2$ gas into the deposition chamber 417 through the gas introduction line 429. Flow rates of the SiH$_4$ gas, H$_2$ gas and the PH$_3$/H$_2$ gas were controlled to 2 sccm, 100 sccm and 200 sccm, respectively, by means of the mass-flow controllers 438, 436 and 439, while the pressure in the deposition chamber 417 was controlled to 1.0 Torr. The power of an RF power supply 422 was set to 0.05 W/cm$^2$, and RF power was introduced from this power supply into a plasma-forming cup 420, so as to trigger a glow discharge, thereby starting formation of the RF n-layer on the substrate. The RF power was turned off when the thickness of the RF n-layer had reached 20 nm, thus terminating the glow discharge to complete the formation of the RF n-layer 103. The supply of the SiH$_4$ gas, PH$_3$/H$_2$ gas and H$_2$ gas into the deposition chamber was stopped and the interior of the deposition chamber and the gas line were evacuated to 1×10$^{-5}$ Torr.

(6) Then, an annealing was executed in an atmosphere of a gas containing trace amounts of oxygen atoms and group III element atoms under a static magnetic field.

For the purpose of executing the annealing in the gas atmosphere containing trace amounts of oxygen atoms and Group III element atoms, O$_2$/H$_2$ gas (dilution: 2 ppm) was introduced as the oxygen atom-containing gas, as well as the B$_2$H$_6$/H$_2$ gas (dilution 2 ppm) as the gas containing Group III element atoms, into the deposition chamber 417 through the gas introduction line 429. The valves 442 and 432 were opened and the flow rate of the O$_2$/H$_2$ gas (dilution 2 ppm) was controlled to 500 sccm by means of a mass-flow controller 437. Valves and a mass-flow controller, not shown, were operated to maintain the flow rate of the B$_2$H$_6$/H$_2$ gas (dilution 2 ppm) at 500 sccm. Then, an alnico magnet 495 of 2800 gauss having a height adjusting mechanism, serving as means for applying a static magnetic field, was installed. Meanwhile, the pressure in the deposition chamber 417 was controlled to 1.3 Torr by a conductance valve (not shown). The annealing in accordance with the invention in a gas atmosphere containing trace amounts of oxygen-atoms and Group III element atoms under the static-magnetic field was conducted for 10 minutes, while the substrate heater 410 was controlled to maintain the substrate temperature at 350° C. Then, the alnico magnet 495 of 2800 gauss having the height adjusting mechanism, serving as means for applying the static magnetic field, was removed and the supply of the O$_2$/H$_2$ gas (dilution: 2 ppm) and the B$_2$H$_6$/H$_2$ gas (dilution 2 ppm) into the deposition chamber 417 was stopped. The interior of the deposition chamber 417 and the gas line was then evacuated to 1×10$^{-5}$ Torr.

(7) Then, an RF i-layer 151 of-a-Si, an MW i-layer 104 of a-SiGe, and an RF i-layer 161 of a-Si were successively formed in accordance with the steps (7-1) to (7-3) of Example A-1.

(8) Then an RF p-layer 105 of a-SiC was formed in accordance with the step (8) of Example A-1 under the conditions which will be described later.

(9) Then, a transparent conductive layer 112 was formed on the RF p-layer 105, and a comb-shaped collector electrode 113 of Cr(40 nm)/Ag(1000 nm)/Cr(40 nm) was formed thereon by vacuum evaporation, in accordance with the steps (9) and (10) of Example A-1.

Fabrication of the photovoltaic element of this example was thus completed. This element will be referred to as "SC/E-1". The conditions of the annealing in gas atmosphere containing trace amount of oxygen atoms and trace amount of Group III element atoms under the static magnetic field in this example, as well as the conditions of film-forming processes for forming the RF n-layer, RF i-layer, MW i-layer and RF-p layer are collectively shown in Tables 239 and 240.

TABLE 239

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP III ELEMENT ATOMS

| | |
|---|---|
| Type of gas containing oxygen atoms | O$_2$/H$_2$ |
| Concentration of trace amount of oxygen atoms in whole annealing gas (ppm) | 1 |
| Type of gas containing Group III element atoms | B$_2$/H$_6$/H$_2$ |
| Concentration of trace amount of Group III element atoms in whole annealing gas (ppm) | 1 |
| Type of magnet | ALNICO |
| Magnetic field of intensity (G) | 2800 |
| Annealing temp. (° C.) | 350 |
| Annealing press. (Torr) | 1.3 |

TABLE 240

| Sample | SiH$_4$ flow rate sccm | Si$_2$H$_6$ flow rate sccm | CH$_4$ flow rate sccm | GeH$_4$ flow rate sccm | H$_2$ flow rate sccm | PH$_3$/H$_2$ flow rate sccm | B$_2$H$_6$/H$_2$ flow rate sccm | SIH$_4$/H$_2$ flow rate sccm | Press. Torr | MW Power W/cm$^2$ | RF Power W/cm$^2$ | Substrate temp. ° C. | Film thickness nm |
|---|---|---|---|---|---|---|---|---|---|---|---|---|---|
| RF n-layer (103) | 2 | | | | 100 | 200 | | | 1.0 | | 0.05 | 350 | 20 |
| RF i-layer (151) | | 4 | | | 110 | | | | 0.7 | | 0.008 | 300 | 10 |
| MW i-layer (104) | 50 | | | 47 | 200 | | | | 0.005 | 0.08 | 0.30 | 380 | 170 |
| RF i-layer (161) | | 3 | | | 80 | | | | 0.7 | | 0.007 | 250 | 20 |
| RF p-layer (105) | | | 0.3 | | 60 | | 10 | 2 | 2.0 | | 0.07 | 230 | 10 |

Comparative Example E 1-1

A process was conducted as Comparative Example E1-1. This process was different from Example E-1 in that it omitted the annealing in the gas atmosphere containing trace amount of oxygen atoms and trace amount of Group III element atoms under the static magnetic field.

Other conditions were materially the same as those in Example E-1. The photovoltaic element produced in Comparative Example E1-1 will be referred to as "SC/CE1-1".

Seven samples of the photovoltaic elements SC/E-1, as well as seven samples of the photovoltaic elements SC/CE1-

1, were produced and were subjected, basically in the same way as that in Example A-1 and Comparative Example A1-1, to measurement and evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The results are shown in Table 241. The photo-degradation was measured by setting the element temperature to 43° C., while the anti-environment test was conducted by setting the temperature and humidity to 82° C. and 90%, respectively.

The performance of the photovoltaic element is shown in Table 241 in terms of values measured on the samples of the photovoltaic element SC/E-1 as normalized by the values measured on the samples of the photovoltaic element SC/CE1-1.

TABLE 241

| Items of evaluation | Evaluation |
| --- | --- |
| Initial photoelectric conversion efficiency characteristic | 1.27 |
| Variation of Initial photoelectric conversion efficiency characteristic | 0.89 |
| Photo-degradation characteristic | 0.88 |
| Anti-environment characteristic | 0.86 |
| SEM observation of sectional face | 0.94 |
| Measurement of adhesion: Delamination | No delamination in SC/E-1 Slight delamination in SC/CE1-1 |

From the results shown in Table 241, it will be seen that all the sample photovoltaic elements SC/E-1 in accordance with Example E-1 exhibit superiority to the sample photovoltaic elements SC/CE1-1 of Comparison Example E-1 in all items of evaluation.

EXAMPLE E-2

In this Example, a photovoltaic element of the tandem type shown in FIG. 2 was manufactured by using an in-line type apparatus shown in FIG. 5, in accordance with the following procedure.

(1) A substrate having a reflecting layer 201 and a reflection enhancement layer 202 formed thereon (i.e. base member), prepared in the same way as that in Example E-1, was disposed on a substrate conveyor rails 413 laid in a load chamber 401, and the internal pressure of the load chamber 401 was lowered to $1\times10^{-5}$ Torr. by a vacuum pump (not shown).

(2) Then, a gate valve 406 was opened and the substrate was conveyed into a conveyance chamber 402 and then into a deposition chamber 417 which had been evacuated to certain levels of vacuum by vacuum pumps which are not shown. The substrate was held such that its reverse side was kept in close contact with a substrate heater 410 so as to be heated by the heater 410, while the interior of the deposition chamber 417 was evacuated by the vacuum pump to a level of $1\times10^{-5}$ Torr.

(3) Preparation for film forming operation was thus completed. Then, $H_2$ gas was introduced into the deposition chamber 417 through a gas-introduction line 429 and the flow rate of the $H_2$ gas was controlled to 500 sccm by means of valves 441, 431, 430, under the control of a mass-flow controller 436. At the same time, the internal pressure of the deposition chamber 417 was regulated to 1.0 Torr. by a conductance valve (not shown). Meanwhile, the substrate heater 410 was adjusted to maintain the substrate temperature at 350° C.

(4) An RF n-layer 203 of $\mu$c-Si was formed when the substrate temperature became steady.

To this end, valves 443, 433, 444 and 434 were operated to introduce the $SiH_4$ gas and $PH_3/H_2$ gas into the deposition chamber 417 through the gas introduction line 429. Flow rates of the $SiH_4$ gas, $H_2$ gas and the $PH_3/H_2$ gas were controlled to 2 sccm, 100 sccm and 200 sccm, respectively, by means of the mass-flow controllers 438, 436 and 439, while the pressure in the deposition chamber 417 was controlled to 1.0 Torr. The power of an RF power supply 422 was set to 0.05 $W/cm^2$, and RF power was introduced from this power supply into a plasma-forming cup 420, so as to trigger a glow discharge, thereby starting formation of the RF n-layer on the substrate. The RF power was turned off when the thickness of the RF n-layer had reached 20 nm, thus terminating the glow discharge to complete the formation of the RF n-layer 203. The supply of the $SiH_4$ gas, $PH_3/H_2$ gas and $H_2$ gas into the deposition chamber 417 was stopped and the interior of the deposition chamber and the gas line were evacuated to $1\times10^{-5}$ Torr.

(5) Then, an annealing was executed in accordance with the present invention in an atmosphere of a gas containing a trace amount of oxygen atoms and trace amount of Group III element atoms under a static magnetic field.

For the purpose of executing the annealing in the gas atmosphere containing a trace amount of oxygen atoms and trace amount of Group III element atoms under the static magnetic field, $O_2$/He gas (dilution: 10 ppm) as the oxygen atom-containing gas and $BF_3/H_2$ gas (dilution 10 ppm) as the gas containing trace amount of Group III element atoms were introduced into the deposition chamber 417 through the gas introduction line 429. The valves 442 and 432 were opened and the flow rate of the $O_2$/He (dilution 10 ppm) gas was controlled to 500 sccm by means of a mass-flow controller 437. Valves and a mass-flow controller (not shown) were operated so as to maintain the flow rate of the $BF_3/H_2$ gas (dilution 10 ppm) at 500 sccm. Then, an alnico magnet 495 of 2500 gauss having a height adjusting mechanism, serving as means for applying static magnetic field, was installed. Meanwhile, the pressure in the deposition chamber 417 was controlled to 1.3 Torr by a conductance valve (not shown). The annealing in accordance with the invention in a gas atmosphere containing trace amount of oxygen atoms and trace amount of Group III element atoms under the static magnetic field was conducted for 10 minutes, while the substrate heater 410 was controlled to maintain the substrate temperature at 350° C. Then, the supply of the $O_2$/He gas (dilution: 10 ppm) and the $BF_3/H_2$ gas (dilution 10 ppm) into the deposition chamber 417 was stopped and the interior of the deposition chamber 417 and the gas line was evacuated to $1\times10^{-5}$ Torr.

Then, an RF i-layer 251 of a-Si, an MW i-layer 204 of a-SiGe, an RF i-layer 261 of a-Si, an RF p-layer 205 of a-SiC, an RF n-layer 206 of $\mu$c-Si, an RF i-layer 207 of a-Si and an RF p-layer 208 of a-SiC were successively formed, in accordance with the steps (6-1) and (6-8) of Example A-2, under the conditions which will be described later. A transparent conductive layer 212 was formed on the RF p-layer, followed by formation of a collector electrode 213 thereon, in accordance with the steps (7) to (9) of Example A-2.

Fabrication of the photovoltaic element of this example was thus completed. This element will be referred to as "SC/E-2". The conditions of the annealing in gas atmosphere containing trace amount of oxygen atoms and Group III element atoms under the static magnetic field in this example, as well as the conditions of film-forming processes for forming the RF n-layer, RF i-layer, MW i-layer and RF-p layer are collectively shown in Tables 242 and 243.

TABLE 242

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP III ELEMENT ATOMS

| | |
|---|---|
| Type of gas containing oxygen atoms | $O_2$/He |
| Concentration of trace amount of oxygen atoms in whole annealing gas (ppm) | 5 |
| Type of gas containing Group III element atoms | $BF_3/H_2$ |
| Concentration of trace amount of Group III element atoms in whole annealing gas (ppm) | 5 |
| Type of magnet | ALNICO |
| Magnetic field of intensity (G) | 2500 |
| Annealing temp. (° C.) | 350 |
| Annealing press. (Torr) | 1.3 | photovoltaic element SC/E-2 as normalized by the values measured on the samples of the photovoltaic element SC/CE2-1.

TABLE 244

| Items of evaluation | Evaluation |
|---|---|
| Initial photoelectric conversion efficiency characteristic | 1.31 |
| Variation of Initial photoelectric conversion efficiency characteristic | 0.89 |
| Photo-degradation characteristic | 0.86 |
| Anti-environment characteristic | 0.85 |
| SEM observation of sectional face | 0.92 |
| Measurement of adhesion: Delamination | No delamination in SC/E-2 Slight delamination in SC/CE2-1 |

From the results shown in Table 244, it will be seen that all the sample photovoltaic elements SC/E-2 in accordance with Example E-2 exhibit superiority to the sample photovoltaic elements SC/CE2-1 of Comparison Example E2-1 in all items of evaluation.

TABLE 243

| Sample | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SiH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer (203) | 2 | | | | 100 | 200 | | | 1.0 | | 0.05 | 350 | 20 |
| RF i-layer (251) | | 4 | | | 110 | | | | 0.7 | | 0.008 | 300 | 10 |
| MW i-layer (204) | 50 | | | 53 | 120 | | | 0.006 | 0.10 | 0.25 | 380 | 150 |
| RF i-layer (261) | | 3 | | | 80 | | | | 0.7 | | 0.007 | 250 | 20 |
| RF p-layer (205) | | | 0.3 | | 60 | | 10 | 2 | 2.0 | | 0.07 | 230 | 10 |
| RF n-layer (206) | 2.5 | | | | 50 | 250 | | | 1.0 | | 0.04 | 225 | 10 |
| RF i-layer (207) | | 2 | | | 60 | | | | 0.6 | | 0.007 | 200 | 120 |
| RF p-layer (208) | | | 0.3 | | 60 | | 10 | 2 | 2.0 | | 0.07 | 170 | 10 |

Comparative Example E 2-1

A process was conducted as Comparative Example E 2-1. This process was different from Example E-2 in that it omitted the annealing in the gas atmosphere containing trace amount of oxygen atoms and trace amount of Group III element atoms under the static magnetic field.

Other conditions were materially the same as those in Example E-2. The photovoltaic element produced in Comparative Example E 2-1 will be referred to as "SC/CE2-1".

Seven samples of the photovoltaic elements SC/E-2, as well as seven samples of the photovoltaic elements SC/CE2-1, were produced and were subjected, basically in the same way as Example A-1, to measurement and evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The photo-degradation was measured by setting the element temperature to 36° C., while the anti-environment test was conducted by setting the temperature and humidity to 83° C. and 92%. The results are shown in Table 244.

The performance of the photovoltaic element is shown in Table 244 in terms of values measured on the samples of the

EXAMPLE E-3

In this Example, a photovoltaic element of the triple type shown in FIG. 3 was manufactured by using an in-line type apparatus shown in FIG. 5, in accordance with the following procedure.

(1) A substrate having a reflecting layer 301 and a reflection enhancement layer 302 formed thereon (i.e. base member), prepared in the same way as that in Example E-1, was disposed on a substrate conveyor rails 413 laid in a load chamber 401, and the internal pressure of the load chamber 401 was lowered to $1 \times 10^{-5}$ Torr. by a vacuum pump (not shown).

(2) Then, gate valves 406 and 407 were opened and the substrate was conveyed into conveyance chambers 402, 403 and then into a deposition chamber 418 which had been evacuated to certain levels of vacuum by vacuum pumps which are not shown. The substrate was held such that its reverse side was kept in close contact with a substrate heater 411 so as to be heated by the heater 411, while the interior of the deposition chamber 418 was evacuated by the vacuum pump to a level of $1 \times 10^{-5}$ Torr.

(3) Preparation for film forming operation was thus completed. Then, $H_2$ gas was introduced into the deposition chamber 417 through a gas-introduction line 429 and the flow rate of the $H_2$ gas was controlled to 500 sccm by means of valves 441, 431, 430, under the control of a mass-flow controller 436. At the same time, the internal pressure of the deposition chamber 417 was regulated to 1.3 Torr. by a conductance valve (not shown). Meanwhile, the substrate heater 410 was adjusted to maintain the substrate temperature at 350° C. An RF n-layer 303 of μc-Si was formed when the substrate temperature became steady.

(4) To this end, valves 443, 433, 444 and 434 were operated to introduce the $SiH_4$ gas and $PH_3/H_2$ gas into the deposition chamber 417 through the gas introduction line 429. Flow rates of the $SiH_4$ gas, $H_2$ gas and the $PH_3/H_2$ gas were controlled to 2 sccm, 100 sccm and 200 sccm, respectively, by means of the mass-flow controllers 438, 436 and 439, while the pressure in the deposition chamber 417 was controlled to 1.3 Torr.

The power of an RF power supply 422 was set to 0.05 W/cm², and RF power was introduced from this power supply into a plasma-forming cup 420, so as to trigger a glow discharge, thereby starting formation of the RF n-layer on the substrate. The RF power was turned off when the thickness of the RF n-layer has reached 20 nm, thus terminating the glow discharge to complete the formation of the RF n-layer 303. The supply of the $SiH_4$ gas, $PH_3/H_2$ gas and $H_2$ gas into the deposition chamber 417 was stopped and the interior of the deposition chamber and the gas line were evacuated to $1\times10^{-5}$ Torr.

(5) Then, an annealing was executed in an atmosphere of a gas containing a trace amount of oxygen atoms and a trace amount of Group III element atoms under static magnetic field was conducted.

For the purpose of executing the annealing in the gas atmosphere containing a trace amount of oxygen atoms and a trace amount of Group III element atoms under the static magnetic field, $O_2/Ar$ gas (dilution: 100 ppm) as the gas containing oxygen atoms and $BF_3/H_2$ gas (dilution 100 ppm) was the gas containing trace amount of Group III element atoms were introduced into the deposition chamber 417 through the gas introduction line 429. The valves 442 and 432 were opened and the flow rate of the $O_2/Ar$ gas (dilution 100 ppm) was controlled to 500 sccm by means of a mass-flow controller 437. Valves and a mass-flow controller (not shown) were operated so as to control the flow rate of $BF_3/H_2$ gas (dilution 100 ppm) to 500 sccm. Then, an alnico magnet 495 of 2600 gauss having a height adjusting mechanism, serving as means for applying static magnetic field, was installed. Meanwhile, the pressure in the deposition chamber 417 was controlled to 1.3 Torr by a conductance valve (not shown). The annealing in accordance with the invention in a gas atmosphere containing trace amount of oxygen atoms and trace amount of Group III element atoms under the static magnetic field was conducted for 10 minutes, while the substrate heater 410 was controlled to maintain the substrate temperature at 350° C. Then, the alnico magnet 495 of 2600 gauss having height adjusting mechanism, serving as means for applying the static magnetic field, was removed and the supply of the $O_2/Ar$ gas (dilution: 100 ppm) and the $BF_3/H_2$ gas (dilution 100 ppm) into the deposition chamber 417 was stopped and the interior of the deposition chamber 417 and the gas line was evacuated to $1\times10^{-5}$ Torr.

(6) Then, an RF i-layer 351 of a-Si, an MW i-layer 304 of a-SiGe, an RF i-layer 361 of a-Si, an RF p-layer 305 of a-SiC, an RF n-layer 306 of μc-Si, an RF i-layer 352 of a-Si, an MW i-layer 307 of a-SiGe, an RF i-layer 362 of a-Si, an RF p-layer 308 of a-SiC, an RF n-layer 309 of μc-Si, an RF i-layer 310 of a-Si, and an RF p-layer 311 of a-SiC were successively formed, in accordance with a procedure which is substantially the same as that used in Example E-2, i.e., in the same way as that in Example A-1.

(7) Then, an ITO film of 70 nm thick, serving as a transparent conductive layer 312, was formed on the RF p-layer 311 by vacuum evaporation.

(8) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of the present invention was thus completed. This element will be referred to as "SC/E-3". The conditions of the annealing in gas atmosphere-containing trace amount of oxygen atoms and trace amount of Group III element atoms in this example, as well as the conditions of film-forming processes for forming the RF n-layer, RF i-layer, MW i-layer and RF-p layer are collectively shown in Tables 245 and 246.

TABLE 245

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP III ELEMENT ATOMS

| | |
|---|---|
| Type of gas containing oxygen atoms | $O_2/Ar$ |
| Concentration of trace amount of oxygen atoms in whole annealing gas (ppm) | 50 |
| Type of gas containing Group III element atoms | $BF_3/H_2$ |
| Concentration of trace amount of Group III element atoms in whole annealing gas (ppm) | 50 |
| Type of magnet | ALNICO |
| Magnetic field of intensity (G) | 2600 |
| Annealing temp. (° C.) | 350 |
| Annealing press. (Torr) | 1.3 |

TABLE 246

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power W/cm² | RF Power W/cm² | Substrate temp. ° C. | Film thickness nm |
|---|---|---|---|---|---|---|---|---|---|---|---|---|---|
| RF n-layer (303) | 2.0 | | | | 100 | 200 | | | 1.0 | | 0.05 | 350 | 20 |
| RF i-layer (351) | | 4.0 | | | 100 | | | | 0.8 | | 0.008 | 300 | 10 |
| MW i-layer (304) | 40 | | | 41 | 130 | | | | 0.010 | 0.10 | 0.31 | 370 | 110 |
| RF i-layer (361) | | 4.0 | | | 100 | | | | 0.75 | | 0.008 | 300 | 23 |
| RF p-layer (305) | | | 0.1 | | 80 | | 9 | 2 | 1.8 | | 0.07 | 300 | 10 |
| RF n-layer (306) | 1.1 | | | | 40 | 290 | | | 1.1 | | 0.04 | 300 | 10 |
| RF i-layer (352) | | 4.0 | | | 0 | | | | 0.75 | | 0.008 | 300 | 10 |
| MW i-layer (307) | 35 | | | 26 | 130 | | | | 0.013 | 0.10 | 0.3 | 350 | 100 |
| RF i-layer (362) | | 3.5 | | | 90 | | | | 0.7 | | 0.008 | 280 | 23 |
| RF p-layer (308) | | | 0.2 | | 80 | | 9 | 2 | 1.7 | | 0.07 | 260 | 10 |

TABLE 246-continued

| | SiH₄ flow rate sccm | Si₂H₆ flow rate sccm | CH₄ flow rate sccm | GeH₄ flow rate sccm | H₂ flow rate sccm | PH₃/H₂ flow rate sccm | B₂H₆/H₂ flow rate sccm | SiH₄/H₂ flow rate sccm | Press. Torr | MW Power W/cm² | RF Power W/cm² | Substrate temp. °C. | Film thickness nm |
|---|---|---|---|---|---|---|---|---|---|---|---|---|---|
| RF n-layer (309) | 0.8 | | | | 50 | 250 | | | 1.05 | | 0.04 | 230 | 10 |
| RF i-layer (310) | | 1.5 | | | 70 | | | | 0.8 | | 0.007 | 190 | 90 |
| RF p-layer (311) | | | 0.4 | | 90 | | 8 | 2 | 1.6 | | 0.07 | 170 | 10 |

Comparative Example E 3-1

A process was conducted as Comparative Example E 3-1. This process was different from Example E-3 in that it omitted the annealing in the gas atmosphere containing trace amount of oxygen atoms and trace amount of Group III element atoms under the static magnetic field.

Other conditions were materially the same as those in Example E-3. The photovoltaic element produced in Comparative Example E 3-1 will be referred to as "SC/CE3-1".

Eight samples of the photovoltaic elements SC/E-3, as well as eight samples of the photovoltaic elements SC/CE3-1, were produced and were subjected, basically in the same way as Example A-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The photo-degradation characteristic was measured by setting the element temperature to 25° C. The anti-environment characteristic was evaluated by setting the temperature and humidity of the atmosphere to 85° C. and 95% and the time of shelving in the dark place to 150 hours. The results are shown in Table 247.

The performance of the photovoltaic element is shown in Table 247 in terms of values measured on the samples of the photovoltaic element SC/E-3 as normalized by the values measured on the samples of the photovoltaic element SC/CE3-1.

TABLE 247

| Items of evaluation | Evaluation |
|---|---|
| Initial photoelectric conversion efficiency characteristic | 1.41 |
| Variation of Initial photoelectric conversion efficiency characteristic | 0.86 |
| Photo-degradation characteristic | 0.85 |
| Anti-environment characteristic | 0.84 |
| SEM observation of sectional face | 0.94 |
| Measurement of adhesion: Delamination | No delamination in SC/E-3 Slight delamination in SC/CE3-1 |

From the results shown in Table 247, it will be seen that all the sample photovoltaic elements SC/E-3 in accordance with Example E-3 exhibit superiority to the sample photovoltaic elements SC/CE3-1 of Comparison Example E3-1 in all items of evaluation.

EXAMPLE E-4

This Example is different from Example E-3 in that the annealing was effected on the RF i-Layer 351 of a-Si, in place of the RF n-layer 303 of μc-Si. A photovoltaic element of the triple type shown in FIG. 3 was manufactured by using an in-line type apparatus shown in FIG. 5, in accordance with the following procedure.

(1) A substrate having a reflecting layer 301 and a reflection enhancement layer 302 formed thereon (i.e. base member), prepared in the same way as that in Example E-1, was disposed on a substrate conveyor rail 413 laid in a load chamber 401, and the internal pressure of the load chamber 401 was lowered to 1×10⁻⁵ Torr. by a vacuum pump (not shown).

(2) Then, gate valves 406 and 407 were opened and the substrate was conveyed into conveyance chambers 402, 403 and then into a deposition chamber 418 which had been evacuated to certain levels of vacuum by vacuum pumps which are not shown. The substrate was held such that its reverse side was kept in close contact with a substrate heater 411 so as to be heated by the heater 411, while the interior of the deposition chamber 418 was evacuated by the vacuum pump to a level of 1×10⁻⁵ Torr.

(3) Preparation for film forming operation was thus completed. Then, H₂ gas was introduced into the deposition chamber 417 through a gas-introduction line 429 and the flow rate of the H₂ gas was controlled to 500 sccm by means of valves 441, 431, 430, under the control of a mass-flow controller 436. At the same time, the internal pressure of the deposition chamber 417 was regulated to 1.3 Torr. by a conductance valve (not shown). Meanwhile, the substrate heater 410 was adjusted to maintain the substrate temperature at 350° C. An RF n-layer 303 of μc-Si, an RF i-layer 351 of a-Si, an MW i-layer 304 of a-SiGe and an RF i-layer 361 of a-Si were 12 formed when the substrate temperature became steady.

(4) Then, an annealing was executed in an atmosphere of a gas containing a trace amount of oxygen atoms and a trace amount of Group III element atoms under a static magnetic field.

For the purpose of executing the annealing in the gas atmosphere containing a trace amount of oxygen atoms and a trace amount of Group III element atoms under the static magnetic field, O₂/H₂ gas (dilution: 2 ppm) as the gas containing oxygen atoms and B₂H₆/H₂ gas (dilution 2 ppm) as the gas containing trace amount of Group III element atoms were introduced into the deposition chamber 418 through the gas introduction line 449. The valves 465 and 455 were opened and the flow rate of the O₂/H₂ gas (dilution 2 ppm) was controlled to 500 sccm by means of a mass-flow controller 460. Valves and a mass-flow controller (not shown) were operated so as to control the flow rate of the B₂H₆/H₂ gas (dilution 2 ppm) to 500 sccm. Then, an alnico magnet 495 of 2300 gauss having height adjusting mechanism, serving as means for applying static magnetic field, was installed. Meanwhile, the pressure in the deposition chamber 418 was controlled to 1.2 Torr by a conductance valve (not shown). The annealing in accordance with the invention in a gas atmosphere containing trace amount of oxygen atoms and trace amount of Group III element atoms under the static magnetic field was conducted for 10 minutes, while the substrate heater 411 was controlled to maintain the substrate temperature at 300° C. Then, the supply of the $O_2/H_2$ gas (dilution: 2 ppm) and $B_2H_6/H_2$ gas (dilution 2 ppm) into the deposition chamber 418 was stopped and the interior of the deposition chamber 418 and the gas line was evacuated to $1\times10^{-5}$ Torr.

(5) Then, an MW i-layer 304 of a-SiGe, an RF i-layer 361 of a-Si, an RF p-layer 305 of a-SiC, an RF n-layer 306 of $\mu$c-Si, an RF i-layer 352 of a-Si, an MW i-layer 307 of a-SiGe, an RF i-layer 362 of a-Si, an RF p-layer 308 of a-SiC, an RF n-layer 309 of $\mu$c-Si, an RF i-layer 310 of a-Si, and an RF p-layer 311 of a-SiC were successively formed, in accordance with a procedure which is substantially the same as that used in Example E-2, i.e., in the same way as Example A-2.

(6) Then, an ITO film of 70 nm thick, serving as a transparent conductive layer 312, was formed on the RF player 311 by vacuum evaporation.

(7) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of the present invention was thus completed. This element will be referred to as "SC/E-4". The conditions of the annealing in gas atmosphere containing trace amount of oxygen atoms and trace amount of Group III element atoms under static magnetic field in this example, as well as the conditions of film-forming processes for forming the RF n-layer, RF i-layer, MW i-layer and RF-p layer are collectively shown in Tables 248 and 249.

TABLE 248

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP III ELEMENT ATOMS

| | |
|---|---|
| Type of gas containing oxygen atoms | $O_2/H_2$ |
| Concentration of trace amount of oxygen atoms in whole annealing gas (ppm) | 1 |
| Type of gas containing Group III element atoms | $B_2H_6/H_2$ |
| Concentration of trace amount of Group III element atoms in whole annealing gas (ppm) | 1 |
| Type of magnet | ALNICO |

TABLE 248-continued

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP III ELEMENT ATOMS

| | |
|---|---|
| Magnetic field intensity (G) | 2300 |
| Annealing temp. (° C.) | 330 |
| Annealing press. (Torr) | 1.2 |

TABLE 249

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SiH_4/H_2$ flow rate sccm | Press. Torr | MW Power W/cm² | RF Power W/cm² | Substrate temp. ° C. | Film thickness nm |
|---|---|---|---|---|---|---|---|---|---|---|---|---|---|
| RF n-layer | 2.0 | | | | 100 | 200 | | | 1.0 | | 0.05 | 350 | 20 |
| RF i-layer | | 4.0 | | | 100 | | | | 0.8 | | 0.008 | 300 | 10 |
| MW i-layer | 50 | | | 51 | 160 | | | | 0.010 | 0.10 | 0.31 | 370 | 110 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 34 | | | 28 | 150 | | | | 0.013 | 0.11 | 0.3 | 350 | 100 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 1.5 | | | 70 | | | | 0.8 | | 0.007 | 190 | 90 |
| RF p-layer | | | 0.4 | | 90 | | 8 | 2 | 1.6 | | 0.07 | 170 | 10 |

Comparative Example E 4-1

A process was conducted as Comparative Example E 4-1. This process was different from Example E-4 in that it omitted the annealing in the gas atmosphere containing trace amount of oxygen atoms and trace amount of Group III element atoms under the static magnetic field.

Other conditions were materially the same as those in Example E-4. The photovoltaic element produced in Comparative Example E 4-1 will be referred to as "SC/CE4-1".

Six samples of the photovoltaic elements SC/E-4, as well as six samples of the photovoltaic elements SC/CE4-1, were produced and were subjected, basically in the same way as Example A-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The photo-degradation characteristic was measured by setting the element temperature to 38° C. The anti-environment characteristic was evaluated by setting the temperature to 85° C., the humidity to 92% and the time of shelving in the dark place to 150 hours. The results are shown in Table 250.

The performance of the photovoltaic element is shown in Table 250 in terms of values measured on the samples of the photovoltaic element SC/E-4 as normalized by the values measured on the samples of the photovoltaic element SC/CE4-1.

TABLE 250

| Items of evaluation | Evaluation |
| --- | --- |
| Initial photoelectric conversion efficiency characteristic | 1.45 |
| Variation of Initial photoelectric conversion efficiency characteristic | 0.86 |
| Photo-degradation characteristic | 0.84 |
| Anti-environment characteristic | 0.84 |
| SEM observation of sectional face | 0.93 |
| Measurement of adhesion: Delamination | No delamination in SC/E-4 Slight delamination in SC/CE4-1 |

From the results shown in Table 250, it will be seen that all the sample photovoltaic elements SC/E-4 in accordance with Example E-4 exhibit superiority to the sample photovoltaic elements SC/CE4-1 of Comparison Example E4-1 in all items of evaluation.

EXAMPLE E-5

This Example is different from Example B-3 in that the annealing was effected on the MW i-layer 304 of a SiGe, in place of the RF n-layer 303 of $\mu$c-Si. As in Example E-3, a photovoltaic element of the triple type shown in FIG. 3 was manufactured by using an in-line type apparatus shown in FIG. 5, in accordance with the following procedure.

(1) A substrate having a reflecting layer 301 and a reflection enhancement layer 302 formed thereon (i.e. base member), prepared in the same way as that in Example E-1, was disposed on a substrate conveyor rails 413 laid in a load chamber 401, and the internal pressure of the load chamber 401 was lowered to $1 \times 10^{-5}$ Torr. by a vacuum pump (not shown).

(2) Then, gate valves 406 and 407 were opened and the substrate was conveyed into conveyance chambers 402, 403 and then into a deposition chamber 418 which had been evacuated to certain levels of vacuum by vacuum pumps which are not shown. The substrate was held such that its reverse side was kept in close contact with a substrate heater 411 so as to be heated by the heater 411, while the interior of the deposition chamber 418 was evacuated by the vacuum pump to a level of $1 \times 10^{-5}$ Torr.

(3) Preparation for film forming operation was thus completed. Then, $H_2$ gas was introduced into the deposition chamber 417 through a gas-introduction line 429 and the flow rate of the $H_2$ gas was controlled to 500 sccm by means of valves 441, 431, 430, under the control of a mass-flow controller 436. At the same time, the internal pressure of the deposition chamber 417 was regulated to 1.3 Torr. by a conductance valve (not shown). Meanwhile, the substrate heater 410 was adjusted to maintain the substrate temperature at 350° C. An RF n-layer 303 of $\mu$c-Si, an RF i-layer 351 of a-Si and an MW i-layer 304 of a-SiGe were formed when the substrate temperature became steady.

(4) Then, an annealing was executed in an atmosphere of a gas containing a trace amount of oxygen atoms and a trace amount of Group III element atoms under a static magnetic field.

For the purpose of executing the annealing in the gas atmosphere containing a trace amount of oxygen atoms and a trace amount of Group III element atoms under the static magnetic field, $O_2$/He gas (dilution: 2 ppm) as the gas containing oxygen atoms and $BF_3/H_2$ gas (dilution 2 ppm) as the gas containing trace amount of Group III element atoms were introduced into the deposition chamber 418 through the gas introduction line 449. The valves 465 and 455 were opened and the flow rate of the $O_2$/He gas (dilution 2 ppm) was controlled to 500 sccm by means of a mass flow controller 460. The flow rate of the $BF_3/H_2$ gas (dilution 2 ppm) also was controlled to 500 sccm by means of valves and a mass-flow controller which are not shown. Then, an alnico magnet 495 of 2000 gauss having a height adjusting mechanism, serving as the means for applying static magnetic field, was installed. Meanwhile, the pressure in the deposition chamber 418 was controlled to 1.3 Torr by a conductance valve (not shown). The annealing in accordance with the invention in a gas atmosphere containing trace amount of oxygen atoms and trace amount of Group III element atoms under the static magnetic field was then conducted for 10 minutes, while the substrate heater 411 was controlled to maintain the substrate temperature at 300° C. Then, the alnico magnet 495 of 2000 gauss having a height adjusting mechanism, serving as means for applying static magnetic field, was removed and the supply of the $O_2$/He gas (dilution: 2 ppm) and the $BF_3/H_2$ gas (dilution 2 ppm) into the deposition chamber 418 was stopped. Then, the interior of the deposition chamber 418 and the gas line was evacuated to $1 \times 10^{-5}$ Torr.

Then, an RF i-layer 361 of a-Si, an RF p-layer 305 of a-SiC, an RF n-layer 306 of $\mu$c-Si, an RF i-layer 352 of a-Si, an MW i-layer 307 of a-SiGe, an RF i-layer 362 of a-Si, an RF p-layer 308 of a-SiC, an RF n-layer 309 of $\mu$c-Si, an RF i-layer 310 of a-Si, and an RF p-layer 311 of a-SiC were successively formed, in accordance with a procedure which is substantially the same as that used in Example E-2, i.e., in the same way as that in Example A-2.

(6) Then, an ITO film of 70 nm thick, serving as a transparent conductive layer 312, was formed on the RF p-layer 311 by vacuum evaporation.

(7) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of the present invention was thus completed. This element will be referred to as "SC/E-5". The conditions of the annealing in gas atmosphere containing trace amount of oxygen atoms and trace amount of Group III element atoms under the static magnetic field in this example, as well as the conditions of film-forming processes for forming the RF n-layer, RF i-layer, MW i-layer and RF-p layer are collectively shown in Tables 251 and 252.

TABLE 251

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP III ELEMENT ATOMS

| | |
| --- | --- |
| Type of gas containing oxygen atoms | $O_2$/He |
| Concentration of trace amount of oxygen atoms in whole annealing gas (ppm) | 1 |
| Type of gas containing Group III element atoms | $BF_3/H_2$ |
| Concentration of trace amount of Group III element atoms in whole annealing gas (ppm) | 1 |
| Type of magnet | ALNICO |
| Magnetic field of intensity (G) | 2000 |

TABLE 251-continued

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP III ELEMENT ATOMS

| | |
|---|---|
| Annealing temp. (° C.) | 300 |
| Annealing press. (Torr) | 1.3 |

TABLE 252

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 220 | | | 1.0 | | 0.05 | 350 | 20 |
| RF i-layer | | 4.0 | | | 100 | | | | 0.8 | | 0.008 | 300 | 10 |
| MW i-layer | 48 | | | 51 | 135 | | | | 0.010 | 0.09 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 32 | | | 27 | 110 | | | | 0.013 | 0.08 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 70 | | | | 0.8 | | 0.007 | 190 | 90 |
| RF p-layer | | | 0.4 | | 90 | | 8 | 2 | 1.6 | | 0.07 | 170 | 10 |

Comparative Example E 5-1

A process was conducted as Comparative Example E 5-1. This process was different from Example E-5 in that it omitted the annealing in the gas atmosphere containing trace amount of oxygen atoms and trace amount of Group III element atoms under the static magnetic field.

Other conditions were materially the same as those in Example E-5. The photovoltaic element produced in Comparative Example E 5-1 will be referred to as "SC/CE5-1".

Seven samples of the photovoltaic elements SC/E-5, as well as seven samples of the photovoltaic elements SC/CE5-1, were produced and were subjected, basically in the same way as Example A-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The photo-degradation was evaluated by setting the element temperature to 41° C. The anti-environment characteristic was evaluated by setting the temperature to 85° C., the humidity to 90% and the time of shelving in the dark place to 150 hours. The results are shown in Table 253.

The performance of the photovoltaic element is shown in Table 253 in terms of values measured on the samples of the photovoltaic element SC/E-5 as normalized by the values measured on the samples of the photovoltaic element SC/CE5-1.

TABLE 253

| Items of evaluation | Evaluation |
|---|---|
| Initial photoelectric conversion efficiency characteristic | 1.48 |
| Variation of Initial photoelectric conversion efficiency characteristic | 0.84 |

TABLE 253-continued

| Items of evaluation | Evaluation |
|---|---|
| Photo-degradation characteristic | 0.84 |
| Anti-environment characteristic | 0.84 |
| SEM observation of sectional face | 0.93 |
| Measurement of adhesion: Delamination | No delamination in SC/E-5 Slight delamination in SC/CE5-1 |

From the results shown in Table 253, it will be seen that all the sample photovoltaic elements SC/E-5 in accordance with Example E-5 exhibit superiority to the sample photovoltaic elements SC/CE5-1 of Comparison Example E5-1 in all items of evaluation.

EXAMPLE E-6

This Example is different from Example E-3 in that the annealing was effected on the RF i-layer 361 of a-Si, in place of the RF n-layer 303 of $\mu$c-Si. A photovoltaic element of the triple type shown in FIG. 3 was manufactured by using an in-line type apparatus shown in FIG. 5, in accordance with the following procedure.

(1) A substrate having a reflecting layer 301 and a reflection enhancement layer 302 formed thereon (i.e. base member), prepared in the same way as that in Example E-1, was disposed on a substrate conveyor rails 413 laid in a load chamber 401, and the internal pressure of the load chamber 401 was lowered to $1\times10^{-5}$ Torr. by a vacuum pump (not shown).

(2) Then, gate valves 406 and 407 were opened and the substrate was conveyed into conveyance chambers 402, 403 and then into a deposition chamber 418 which had been evacuated to certain levels of vacuum by vacuum pumps which are not shown. The substrate was held such that its reverse side was kept in close contact with a substrate heater 411 so as to be heated by the heater 411, while the interior of the deposition chamber 418 was evacuated by the vacuum pump to a level of $1\times10^{-5}$ Torr.

(3) Preparation for film forming operation was thus completed. Then, $H_2$ gas was introduced into the deposition chamber 417 through a gas-introduction line 429 and the flow rate of the $H_2$ gas was controlled to 500 sccm by means of valves 441, 431, 430, under the control of a mass-flow controller 436. At the same time, the internal pressure of the deposition chamber 417 was regulated to 1.3 Torr. by a conductance valve (not shown). Meanwhile, the substrate heater 410 was adjusted to maintain the substrate temperature at 350° C. An RF n-layer 303 of $\mu$c-Si, an RF i-layer 351 of a-Si, an MW i-layer 304 of a-SiGe and an RF i-layer 361 of a-Si were formed when the substrate temperature became steady.

(4) Then, an annealing was executed in an atmosphere of a gas containing a trace amount of oxygen atoms and a trace amount of Group III element atoms under a static magnetic field.

For the purpose of executing the annealing in the gas atmosphere containing a trace amount of oxygen atoms and a trace amount of Group III element atoms under the static magnetic field, $O_2$/Ar gas (dilution: 100 ppm) as the gas containing oxygen atoms and $BF_3/H_2$ gas (dilution 100 ppm) as the gas containing trace amount of Group III element atoms were introduced into the deposition chamber 418 through the gas introduction line 449. The valves 465 and 455 were opened and the flow rate of the $O_2$/Ar gas (dilution 100 ppm) was controlled to 500 sccm by means of a mass-flow controller 460. The flow rate of the $BF_3/H_2$ gas (dilution 100 ppm ) i also was regulated to 500 sccm by valves and mass-flow controller which are not shown. Then, an alnico magnet 495 of 1700 gauss having height adjusting mechanism, serving as means for applying static magnetic field, was installed. Meanwhile, the pressure in the deposition chamber 418 was controlled to 1.5 Torr by a conductance valve (not shown). Then, the annealing in accordance with the invention in a gas atmosphere containing trace amount of oxygen atoms and trace amount of Group III element atoms under the static magnetic field was conducted for 10 minutes, while the substrate heater 411 was controlled to maintain the substrate temperature at 300° C. Then, the alnico magnet 495 of 1700 gauss having height adjusting mechanism, serving as means for applying static magnetic field, was removed and the supply of the $O_2$/Ar gas (dilution: 100 ppm) and the $BF_3/H_2$ gas (dilution 100 ppm) into the deposition chamber 418 was stopped. The interior of the deposition chamber 418 and the gas line was then evacuated to $1\times10^{-5}$ Torr.

Then, an RF p-layer 305 of a-SiC, an RF n-layer 306 of $\mu$c-Si, an RF i-layer of 352 of a-Si, an MW i-layer 307 of a-SiGe, an RF i-layer 362 of a-Si, an RF p-layer 308 of a-SiC, an RF n-layer 309 of $\mu$c-Si, an RF i-layer 310 of a-Si, and an RF p-layer 311 of a-SiC were successively formed, in accordance with a procedure which is substantially the same as that used in Example E-2, i.e., in the same way as that in Example A-2.

(6) Then, an ITO film of 70 nm thick, serving as a transparent conductive layer 312, was formed on the RF player 311 by vacuum evaporation.

(7) A mask having comb-shaped aperture was placed on the transparent electrode 312 and a-comb-shaped collector electrode 313 of Cr(40 nm)/Ag(1000 nm)/Cr(40 nm) was formed by vacuum evaporation.

Fabrication of the photovoltaic element of this example was thus completed. This element will be referred to as "SC/E-6". The conditions of the annealing in gas atmosphere containing trace amount of oxygen atoms and trace amount of Group III element atoms in this example, as well as the conditions of film-forming processes for forming the RF n-layer, RF i-layer, MW i-layer and RF-p layer are collectively shown in Tables 254 and 259.

TABLE 254

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP III ELEMENT ATOMS

| | |
|---|---|
| Type of gas containing oxygen atoms | $O_2$/Ar |
| Concentration of trace amount of oxygen atoms in whole annealing gas (ppm) | 50 |
| Type of gas containing Group III element atoms | $BF_3/H_2$ |
| Concentration of trace amount of Group III element atoms in whole annealing gas (ppm) | 50 |
| Type of magnet | ALNICO |
| Magnetic field of intensity (G) | 1700 |
| Annealing temp. (° C.) | 300 |
| Annealing press. (Torr) | 1.5 |

TABLE 255

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 220 | | | 1.0 | | 0.05 | 350 | 20 |
| RF i-layer | | 4.0 | | | 100 | | | | 0.8 | | 0.008 | 300 | 10 |
| MW i-layer | 48 | | | 51 | 150 | | | | 0.010 | 0.11 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 32 | | | 27 | 150 | | | | 0.010 | 0.11 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |

TABLE 255-continued

| | SiH₄ flow rate sccm | Si₂H₆ flow rate sccm | CH₄ flow rate sccm | GeH₄ flow rate sccm | H₂ flow rate sccm | PH₃/H₂ flow rate sccm | B₂H₆/H₂ flow rate sccm | SiH₄/H₂ flow rate sccm | Press. Torr | MW Power W/cm² | RF Power W/cm² | Substrate temp. °C | Film thickness nm |
|---|---|---|---|---|---|---|---|---|---|---|---|---|---|
| RF i-layer | 2.0 | | | | 70 | | | | 0.8 | | 0.007 | 190 | 90 |
| RF p-layer | | 0.4 | | | 90 | | 8 | 2 | 1.6 | | 0.07 | 170 | 10 |

Comparative Example E 6-1

A process was conducted as Comparative Example E6-1. This process was different from Example E-6 in that it omitted the annealing in the gas atmosphere containing trace amount of oxygen atoms and trace amount of Group III element atoms under the static magnetic field.

Other conditions were materially the same as those in Example E-6. The photovoltaic element produced in Comparative Example E 6-1 will be referred to as "SC/CE6-1".

Eight samples of the photovoltaic elements SC/E-6, as well as eight samples of the photovoltaic elements SC/CE6-1, were produced and were subjected, basically in the same way as Example A-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The photo-degradation was evaluated by setting the element temperature to 46° C. The anti-environment characteristic was evaluated by setting the temperature to 87° C., the humidity to 90% and the time of shelving in the dark place to 150 hours. The results are shown in Table 256.

The performance of the photovoltaic element is shown in Table 256 in terms of values measured on the samples of the photovoltaic element SC/E-6 as normalized by the values measured on the samples of the photovoltaic element SC/CE6-1.

TABLE 256

| Items of evaluation | Evaluation |
|---|---|
| Initial photoelectric conversion efficiency characteristic | 1.49 |
| Variation of Initial photoelectric conversion efficiency characteristic | 0.82 |
| Photo-degradation characteristic | 0.83 |
| Anti-environment characteristic | 0.84 |
| SEM observation of sectional face | 0.93 |
| Measurement of adhesion: Delamination | No delamination in SC/E-6 Slight delamination in SC/CE6-1 |

From the results shown in Table 256, it will be seen that all the sample photovoltaic elements SC/E-6 in accordance with Example E-6 exhibit superiority to the sample photovoltaic elements SC/CE6-1 of Comparison Example E6-1 in all items of evaluation.

EXAMPLE E-7

This Example is different from Example E-2 in that the annealing was effected on the RF p-layer 205 of a-SiC, in place of the RF n-layer 203 of μc-Si. As in Example E-2, a photovoltaic element of tandem type shown in FIG. 2 was manufactured by using an in-line type apparatus shown in FIG. 5, in accordance with the following procedure.

(1) A substrate having a reflecting layer 201 and a reflection enhancement layer 202 formed thereon (i.e. base member), prepared in the same way as that in Example E-1, was disposed on a substrate conveyor rail 413 laid in a load chamber 401, and the internal pressure of the load chamber 401 was lowered to 1×10⁻⁵ Torr. by a vacuum pump (not shown).

(2) Then, the gate valve 406 was opened and the substrate was conveyed into the conveyance chamber 402 and the deposition chamber 417 which have been evacuated to certain levels of vacuum by vacuum pumps which are not shown. The substrate was held such that its reverse side was kept in close contact with a substrate heater 410 so as to be heated by the heater 410, while the interior of the deposition chamber 417 was evacuated by the vacuum pump to a level of 1×10⁻⁵ Torr.

(3) Preparation for film forming operation was thus completed. Then, H₂ gas was introduced into the deposition chamber 417 through a gas-introduction line 429 and the flow rate of the H₂ gas was controlled to 500 sccm by means of valves 441, 431, 430, under the control of a mass-flow controller 436. At the same time, the internal pressure of the deposition chamber 417 was regulated to 1.0 Torr. by a conductance valve (not shown). Meanwhile, the substrate heater 410 was adjusted to maintain the substrate temperature at 350° C. An RF n-layer 203 of μc-Si, an RF i-layer 251 of a-Si, an MW i-layer 204 of a-SiGe, an RF i-layer 261 of a-Si and an RF p-layer 205 of a-SiC were formed in the same method as that Example E-2, when the substrate temperature became steady.

(4) Then, an annealing was executed in an atmosphere of a gas containing a trace amount of oxygen atoms and a trace amount of Group III element atoms under a static magnetic field.

For the purpose of executing the annealing in the gas atmosphere containing a trace amount of oxygen atoms and Group III element atoms under the static magnetic field, O₂/H₂ gas (dilution: 2000 ppm) as the gas containing oxygen atoms and B₂H₆/H₂ gas (dilution 2000 ppm) as the gas containing trace amount of Group III element atoms were introduced into the deposition chamber 418 through the gas introduction line 429. The valves 442 and 432 were opened and the flow rate of the O₂/H₂ gas (dilution 2000 ppm) was controlled to 500 sccm by means of a mass-flow controller 436. The flow rate of the B₂H₆/H₂ gas (dilution 2000 ppm) also was regulated to 500 sccm by means of valves and a mass-flow controller which are not shown. Then, an alnico magnet 495 of 2700 gauss having a height adjusting mechanism, serving as the means for applying static magnetic field, was installed. Meanwhile, the pressure in the deposition chamber 417 was controlled to 1.4 Torr by a conductance valve (not shown). The annealing in accordance with the invention in a gas atmosphere containing trace amount of oxygen atoms and trace amount of Group III element atoms under the static magnetic field was conducted for 10 minutes, while the substrate heater 410 was controlled to maintain the substrate temperature at 225° C. Then, the alnico magnet 495 of 2700 gauss having height adjusting mechanism, serving as means for applying static magnetic field, was removed and the supply of the $O_2/H_2$ gas (dilution: 2000 ppm) and the $B_2H_6/H_2$ gas (dilution 2000 ppm) into the deposition chamber 417 was stopped. The interior of the deposition chamber 417 and the gas line was evacuated to $1\times10^{-5}$ Torr.

(5) Then, an RF n-layer 206 of $\mu$c-Si, an RF i-layer 207 of a-Si and an RF p-layer 208 of a-SiC were successively formed, in accordance with a procedure which is substantially the same as that used in Example E-2, i.e., in the same way as that in Example A-2.

(6) Then, an ITO film of 70 nm thick, serving as a transparent conductive layer 212, was formed on the RF player 208 by vacuum evaporation.

(7) A mask having comb-shaped aperture was placed on the transparent electrode 212 and a comb-shaped collector electrode 213 of Cr(40 nm)/Ag(1000 nm)/Cr(40 nm) was formed by vacuum evaporation.

Fabrication of the photovoltaic element of this example was thus completed. This element will be referred to as "SC/E-7". The conditions of the annealing in gas atmosphere containing trace amount of oxygen atoms and trace amount of Group III element atoms under the static magnetic field in this example, as well as the conditions of film-forming processes for forming the RF n-layer, RF i-layer, MW i-layer and RF-p layer are collectively shown in Tables 257 and 258.

Comparative Example E 7-1

A process was conducted as Comparative Example E 7-1. This process was different from Example E-7 in that it omitted the annealing in the gas atmosphere containing trace amount of oxygen atoms and trace amount of Group III element atoms under the static magnetic field.

Other conditions were materially the same as those in Example E-7. The photovoltaic element produced in Comparative Example E 7-1 will be referred to as "SC/CE7-1".

Six samples of the photovoltaic elements SC/E-7, as well as six samples of the photovoltaic elements SC/CE7-1, were produced and were subjected, basically in the same way as Example A-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The photo-degradation was evaluated by setting the element temperature to 45° C., while the anti-environment characteristic was evaluated by setting the temperature to 87° C., the humidity to 91% and the time of shelving in the dark place to 150 hours. The results are shown in Table 259.

The performance of the photovoltaic element is shown in Table 259 in terms of values measured on the samples of the photovoltaic element SC/E-7 as normalized by the values measured on the samples of the photovoltaic element SC/CE7-1.

TABLE 257

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP III ELEMENT ATOMS

| | |
|---|---|
| Type of gas containing oxygen atoms | $O_2/H_2$ |
| Concentration of trace amount of oxygen atoms in whole annealing gas (ppm) | 1000 |
| Type of gas containing Group III element atoms | $B_2H_6/H_2$ |
| Concentration of trace amount of Group III element atoms in whole annealing gas (ppm) | 1000 |
| Type of magnet | ALNICO |
| Magnetic field of intensity (G) | 2700 |
| Annealing temp. (° C.) | 220 |
| Annealing press. (Torr) | 1.4 |

TABLE 259

| Items of evaluation | Evaluation |
|---|---|
| Initial photoelectric conversion efficiency characteristic | 1.50 |
| Variation of Initial photoelectric conversion efficiency characteristic | 0.84 |
| Photo-degradation characteristic | 0.82 |
| Anti-environment characteristic | 0.84 |
| SEM observation of sectional face | 0.93 |
| Measurement of adhesion: Delamination | No delamination in SC/E-7 Slight delamination in SC/CE7-1 |

TABLE 258

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power W/cm$^2$ | RF Power W/cm$^2$ | Substrate temp. ° C. | Film thickness nm |
|---|---|---|---|---|---|---|---|---|---|---|---|---|---|
| RF n-layer | 2 | | | | 100 | 200 | | | 1.0 | | 0.05 | 350 | 20 |
| RF i-layer | | 4.0 | | | 110 | | | | 0.7 | | 0.008 | 300 | 10 |
| MW i-layer | 48 | | | 52 | 230 | | | | 0.006 | 0.08 | 0.30 | 380 | 150 |
| RF i-layer | | 3 | | | 80 | | | | 0.7 | | 0.007 | 250 | 20 |
| RF p-layer | | | 0.3 | | 60 | | 10 | 2 | 2.0 | | 0.07 | 230 | 10 |
| RF n-layer | 2 | | | | 50 | 250 | | | 1.0 | | 0.04 | 225 | 10 |
| RF i-layer | | 1.8 | | | 70 | | | | 0.5 | | 0.007 | 200 | 120 |
| RF i-layer | | | 0.3 | | 60 | | 10 | 2 | 2.0 | | 0.07 | 170 | 10 |

From the results shown in Table 73, it will be seen that all the sample photovoltaic elements SC/E-7 in accordance with Example E-7 exhibit superiority to the sample photovoltaic elements SC/CE7-1.

EXAMPLE E-8

This example is different from Example E-3 in that the concentration of the gas containing trace amount of oxygen atoms used in the annealing under the static magnetic field was varied within the range of between 0.3 ppm and 2000 ppm, for the purpose of investigating the influence of the gas concentration on the performance such as the initial photoelectric conversion efficiency. $H_2$ gas was used as the diluting gas for determining the concentration of the gas containing trace amount of oxygen atoms and the concentration of the gas containing trace amount of Group III element atoms.

In this example, a triple type photovoltaic element as shown in FIG. 3 was produced by using the in-line type apparatus shown in FIG. 5. The process were materially the same as that in Example E-3, except that annealing conditions as shown in Table 260 and production conditions as shown in Table 261 were used. Ten sample elements were produced while varying the concentration of oxygen atoms-containing gas between 0.3 ppm and 2000 ppm.

These ten samples were subjected to evaluation of performance of various items in the same way as that in Example E-3. Results of evaluation on each of the ten samples are shown in Table 262. The evaluation was made by normalizing the measurement results of the samples with the values measured on the sample which was produced by using the annealing gas containing trace amount of oxygen atoms having the concentration of 0.3 ppm. A mark x indicates that the normalized value is not less than 1.0 but below 1.4, a mark Δ indicates that the normalized value is not less than 1.4 but below 1.8 and a mark ○ indicates that the normalized value is not less than 1.8.

From Table 262, it is understood that the concentration of the oxygen atom-containing gas, which is used in the atmosphere gas of the annealing containing trace amount of oxygen atoms and trace amount of Group III element atoms under the static magnetic field, most preferably ranges from 1 ppm to 1000 ppm with respect to the whole annealing gas (total amount of diluting $H_2$ gas in this example), in order to obtain good results in regard to the initial photoelectric conversion efficiency, variation of the efficiency, photo-degradation, anti-environment characteristic against high-temperature, high-humidity atmosphere, and adhesion.

TABLE 260

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP III ELEMENT ATOMS

| | |
|---|---|
| Type of gas containing oxygen atoms | $O_2/H_2$ |
| Concentration of trace amount of oxygen atoms in whole annealing gas (ppm) | 0.3–2000 |
| Type of gas containing Group III element atoms | $B_2H_6/H_2$ |
| Concentration of trace amount of Group III element atoms in whole annealing gas (ppm) | 2 |
| Type of magnet | ALNICO |
| Magnetic field of intensity (G) | 2500 |
| Annealing temp. (° C.) | 330 |
| Annealing press. (Torr) | 1.2 |

TABLE 261

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SiH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 48 | | | 51 | 225 | | | | 0.010 | 0.11 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 32 | | | 27 | 130 | | | | 0.011 | 0.11 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.5 | | | 70 | | | | 0.8 | | 0.007 | 190 | 90 |
| RF p-layer | | | 0.4 | | 90 | | 8 | 2 | 1.6 | | 0.07 | 170 | 10 |

TABLE 262

| Concentration of trace amount of oxygen atoms: ppm | 0.3 | 0.8 | 1 | 10 | 100 | 500 | 1000 | 1050 | 1300 | 2000 |
|---|---|---|---|---|---|---|---|---|---|---|
| Initial photoelectric conversion characteristic | x | Δ | o | o | o | o | o | x | x | x |
| Variation of characteristic | x | Δ | o | o | o | o | o | Δ | x | x |
| Photo-degradation characteristic | x | Δ | o | o | o | o | o | Δ | x | x |
| Anti-environment characteristic | x | x | o | o | o | o | o | x | x | x |
| Adhesion | x | Δ | o | o | o | o | o | Δ | x | x |

EXAMPLE E-9

This example is different from Example E-3 in that the concentration of the gas containing trace amount of oxygen atoms used in the annealing under the static magnetic field was varied within the range of between 0.3 ppm and 2000 ppm, for the purpose of investigating the influence of the gas concentration on the performance such as the initial photoelectric conversion efficiency. He gas was used as the diluting gas for determining the concentration of the gas containing trace amount of oxygen atoms and the concentration of the gas containing trace amount of Group III element atoms.

In this example, a triple type photovoltaic element of the type shown in FIG. 3 was produced by using the in-line type apparatus shown in FIG. 5, under the same conditions as those in Example E-3, except that annealing conditions as shown in Table 263 and production conditions as shown in Table 264 were used. Ten sample elements were produced while varying the concentration of oxygen atoms-containing gas between 0.3 ppm and 2000 ppm.

TABLE 263

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP III ELEMENT ATOMS

| | |
|---|---|
| Type of gas containing oxygen atoms | $O_2$/He |
| Concentration of trace amount of oxygen atoms in whole annealing gas (ppm) | 0.3–2000 |
| Type of gas containing Group III element atoms | $B_2H_6$/He |
| Concentration of trace amount of Group III element atoms in whole annealing gas (ppm) | 3 |

TABLE 263-continued

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP III ELEMENT ATOMS

| | |
|---|---|
| Type of magnet | ALNICO |
| Magnetic field of intensity (G) | 2400 |
| Annealing temp. (° C.) | 340 |
| Annealing press. (Torr) | 1.2 |

TABLE 264

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SiH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 47 | | | 51 | 160 | | | | 0.010 | 0.10 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 31 | | | 27 | 140 | | | | 0.008 | 0.10 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.5 | | | 60 | | | | 0.8 | | 0.007 | 190 | 90 |
| RF p-layer | | | 0.4 | | 90 | | 8 | 2 | 1.6 | | 0.07 | 170 | 10 |

These ten samples were subjected to evaluation of performance in the same way as that in Example E-3. Results of evaluation on each of the ten samples are shown in Table 265. The evaluation was made by normalizing the values measured on the respective samples with the values measured on the sample which was produced by using the annealing gas containing trace amount of oxygen atoms having the concentration of 0.3 ppm. A mark x indicates that the normalized value is not less than 1.0 but below 1.4, a mark Δ indicates that the normalized value is not less than 1.4 but below 1.8 and a mark o indicates that the normalized value is not less than 1.8.

From Table 253, it is understood that the concentration of the oxygen atom-containing gas, which is used in the atmosphere gas of the annealing containing trace amount of oxygen atoms and trace amount of Group III element atoms under the static magnetic field, most preferably ranges from 1 ppm to 1000 ppm with respect to the whole annealing gas (total diluting He gas in this case), in order to obtain good results in regard to the initial photoelectric conversion efficiency, variation of the efficiency, photo-degradation, anti-environment characteristic against high-temperature, high-humidity atmosphere, and adhesion.

TABLE 265

| Concentration of trace amount of oxygen atoms: ppm | 0.3 | 0.8 | 1 | 10 | 100 | 500 | 1000 | 1050 | 1300 | 2000 |
|---|---|---|---|---|---|---|---|---|---|---|
| Initial photoelectric conversion characteristic | x | Δ | ◯ | ◯ | ◯ | ◯ | ◯ | x | x | x |
| Variation of characteristic | x | x | ◯ | ◯ | ◯ | ◯ | ◯ | x | x | x |
| Photo-degradation characteristic | x | Δ | ◯ | ◯ | ◯ | ◯ | ◯ | Δ | x | x |
| Anti-environment characteristic | x | Δ | ◯ | ◯ | ◯ | ◯ | ◯ | x | x | x |
| Adhesion | x | x | ◯ | ◯ | ◯ | ◯ | ◯ | Δ | x | x |

EXAMPLE E-10

This example is different from Example E-3 in that the concentration of the gas containing trace amount of oxygen atoms used in the annealing under the static magnetic field was varied within the range of between 0.3 ppm and 2000 ppm, for the purpose of investigating the influence of the gas concentration on the performance such as the initial photoelectric conversion efficiency. Ar gas was used as the diluting gas for determining the concentration of the gas containing trace amount of oxygen atoms and the concentration of the gas containing trace amount of Group III element atoms.

TABLE 266

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP III ELEMENT ATOMS

| | |
|---|---|
| Type of gas containing oxygen atoms | $O_2/Ar$ |
| Concentration of trace amount of oxygen atoms in whole annealing gas (ppm) | 0.3–2000 |
| Type of gas containing Group III element atoms | $B_2H_6/Ar$ |
| Concentration of trace amount of Group III element atoms in whole annealing gas (ppm) | 2 |
| Type of magnet | ALNICO |
| Magnetic field of intensity (G) | 1500 |
| Annealing temp. (° C.) | 320 |
| Annealing press. (Torr) | 1.6 |

TABLE 267

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SiH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 47 | | | 51 | 135 | | | | 0.010 | 0.10 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 29 | | | 28 | 125 | | | | 0.008 | 0.10 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 55 | | | | 0.8 | | 0.007 | 190 | 90 |
| RF p-layer | | | 0.4 | | 90 | | 8 | 2 | 1.6 | | 0.07 | 170 | 10 |

In this example, a triple type photovoltaic element of FIG. 3 was produced by using the in-line type apparatus shown in FIG. 5. The process was materially the same as that in Example E-3, except that annealing conditions as shown in Table 266 and production conditions as shown in Table 267 were used. Ten sample elements were produced while varying the concentration of oxygen atoms-containing gas between 0.3 ppm and 2000 ppm.

These ten samples were subjected to evaluation of performance in the same way as that in Example E-3. Results of evaluation on each of the ten samples are shown in Table 268. The evaluation was made by normalizing the values measured on the respective samples with the values measured on the sample which was produced by using the annealing gas containing trace amount of oxygen atoms having the concentration of 0.3 ppm. A mark x indicates that the normalized value is not less than 1.0 but below 1.4, a mark Δ indicates that the normalized value is not less than 1.4 but below 1.8 and a mark ○ indicates that the normalized value is not less than 1.8.

From Table 268, it is understood that the concentration of the oxygen atom-containing gas, which is used in the annealing containing conducted in the atmosphere containing trace amount of oxygen atoms and trace amount of Group III element atoms under the static magnetic field, most preferably ranges from 1 ppm to 1000 ppm with respect to the whole annealing gas (Total diluting Ar gas in this case), in order to obtain good results in regard to the initial photoelectric conversion efficiency, variation of the efficiency, photo-degradation, anti-environment characteristic against high-temperature, high-humidity atmosphere, and adhesion.

Example E-3, except at annealing conditions as shown in Table 269 and production conditions as shown in Table 270 were used. Ten sample elements were produced while varying the concentration of the gas containing trace amount of Group III element atoms between 0.3 ppm and 2000 ppm.

TABLE 269

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP III ELEMENT ATOMS

| | |
|---|---|
| Type of gas containing oxygen atoms | $O_2/H_2$ |
| Concentration of trace amount of oxygen atoms in whole annealing gas (ppm) | 2 |
| Type of gas containing Group III element atoms | $B_2H_6/H_2$ |

TABLE 268

| Concentration of trace amount of oxygen atoms: ppm | 0.3 | 0.8 | 1 | 10 | 100 | 500 | 1000 | 1050 | 1300 | 2000 |
|---|---|---|---|---|---|---|---|---|---|---|
| Initial photoelectric conversion characteristic | x | Δ | ○ | ○ | ○ | ○ | ○ | Δ | x | x |
| Variation of characteristic | x | Δ | ○ | ○ | ○ | ○ | ○ | x | x | x |
| Photo-degradation characteristic | x | x | ○ | ○ | ○ | ○ | ○ | Δ | x | x |
| Anti-environment characteristic | x | Δ | ○ | ○ | ○ | ○ | ○ | Δ | x | x |
| Adhesion | x | x | ○ | ○ | ○ | ○ | ○ | x | x | x |

EXAMPLE E-11

This example is different from Example E-3 in that the concentration of the gas containing trace amount of Group III element atoms used in the annealing under the static magnetic field was varied within the range of between 0.3 ppm and 2000 ppm, for the purpose of investigating the influence of the gas concentration on the performance such as the initial photoelectric conversion efficiency. $H_2$ gas was used as the diluting gas for varying the concentration of the gas containing trace amount of oxygen atoms and the concentration of the gas containing trace amount of Group III element atoms which are used in the annealing conducted under the static magnetic field.

In this example, a triple type photovoltaic element of FIG. 3 was produced by using the in-line type apparatus shown in FIG. 5. The process was materially the same as that in TABLE 269-continued CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP III ELEMENT ATOMS

| | |
|---|---|
| Concentration of trace amount of Group III element atoms in whole annealing gas (ppm) | 0.3–2000 |
| Type of magnet | ALNICO |
| Magnetic field of intensity (G) | 1400 |
| Annealing temp. (° C.) | 300 |
| Annealing press. (Torr) | 1.3 |

TABLE 270

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power W/cm$^2$ | RF Power W/cm$^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 47 | | | 51 | 170 | | | | 0.010 | 0.10 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 29 | | | 28 | 140 | | | | 0.008 | 0.10 | 0.3 | 350 | 98 |
| RF i-layer | | 3.5 | | | 90 | | 9 | 2 | 0.7 | | 0.008 | 280 | 23 |

TABLE 270-continued

| | SiH$_4$ flow rate sccm | Si$_2$H$_6$ flow rate sccm | CH$_4$ flow rate sccm | GeH$_4$ flow rate sccm | H$_2$ flow rate sccm | PH$_3$/H$_2$ flow rate sccm | B$_2$H$_6$/H$_2$ flow rate sccm | SiH$_4$/H$_2$ flow rate sccm | Press. Torr | MW Power W/cm$^2$ | RF Power W/cm$^2$ | Substrate temp. °C. | Film thickness nm |
|---|---|---|---|---|---|---|---|---|---|---|---|---|---|
| RF p-layer | | | 0.2 | | 80 | | | | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 75 | | | | 0.8 | | 0.007 | 190 | 90 |
| RF p-layer | | | 0.4 | | 90 | | 8 | 2 | 1.6 | | 0.07 | 170 | 10 |

These ten samples were subjected to evaluation of performance in the same way as that in Example E-3. Results of evaluation on each of the ten samples are shown in Table 271. The evaluation was made by normalizing the values measured on the respective samples with the values measured on the sample which was produced by using the gas containing trace amount of Group III element atoms having the concentration of 0.3 ppm. A mark x indicates that the normalized value is not less than 1.0 but below 1.4, a mark Δ indicates that the normalized value is not less than 1.4 but below 1.8 and a mark ○ indicates that the normalized value is not less than 1.8.

From Table 271, it is understood that the concentration of the gas containing trace amount of Group III element atoms, which is used in the atmosphere gas of the annealing containing trace amount of oxygen atoms and trace amount of Group III element atoms under the static magnetic field, most preferably ranges from 1 ppm to 1000 ppm with respect to the whole annealing gas (Total diluting H$_2$ gas in this case), in order to obtain good results in regard to the initial photoelectric conversion efficiency, variation of the efficiency, photo-degradation, anti-environment characteristic against high-temperature, high-humidity atmosphere, and adhesion.

TABLE 271

| Concentration of trace amount of oxygen atoms: ppm | 0.3 | 0.8 | 1 | 10 | 100 | 500 | 1000 | 1050 | 1300 | 2000 |
|---|---|---|---|---|---|---|---|---|---|---|
| Initial photoelectric conversion characteristic | x | Δ | ○ | ○ | ○ | ○ | ○ | Δ | x | x |
| Variation of characteristic | x | x | ○ | ○ | ○ | ○ | ○ | Δ | x | x |
| Photo-degradation characteristic | x | Δ | ○ | ○ | ○ | ○ | ○ | x | x | x |
| Anti-environment characteristic | x | x | ○ | ○ | ○ | ○ | ○ | Δ | x | x |
| Adhesion | x | Δ | ○ | ○ | ○ | ○ | ○ | x | x | x |

EXAMPLE E-12

This example is different from Example E-3 in that the concentration of the gas containing trace amount of Group III element atoms used in the annealing under static magnetic field was varied within the range of between 0.3 ppm and 2000 ppm, for the purpose of investigating the influence of the gas concentration on the performance such as the initial photoelectric conversion efficiency. He gas was used as the diluting gas for varying the concentration of the gas containing trace amount of oxygen atoms and the concentration of the gas containing trace amount of Group III element atoms used in the annealing under the static magnetic field.

In this example, a triple type photovoltaic element of FIG. 3 was produced by using the in-line type apparatus shown in FIG. 5. The process was materially the same as that in Example E-3, except that annealing conditions as shown in Table 272 and production conditions as shown in Table 273 were used. Ten sample elements were produced while varying the concentration of the gas containing trace amount of Group III element atoms between 0.3 ppm and 2000 ppm.

TABLE 272

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP III ELEMENT ATOMS

| | |
|---|---|
| Type of gas containing oxygen atoms | O$_2$/He |
| Concentration of trace amount of oxygen atoms in whole annealing gas (ppm) | 2 |
| Type of gas containing Group III element atoms | B$_2$H$_6$/He |
| Concentration of trace amount of Group III element atoms in whole annealing gas (ppm) | 0.3–2000 |
| Type of magnet | ALNICO |
| Magnetic field of intensity (G) | 1200 |

TABLE 272-continued

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP III ELEMENT ATOMS

| | |
|---|---|
| Annealing temp. (° C.) | 280 |
| Annealing press. (Torr) | 1.2 |

TABLE 273

| | SiH$_4$ flow rate sccm | Si$_2$H$_6$ flow rate sccm | CH$_4$ flow rate sccm | GeH$_4$ flow rate sccm | H$_2$ flow rate sccm | PH$_3$/H$_2$ flow rate sccm | B$_2$H$_6$/H$_2$ flow rate sccm | SIH$_4$/H$_2$ flow rate sccm | Press. Torr | MW Power W/cm$^2$ | RF Power W/cm$^2$ | Substrate temp. °C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 46 | | | 51 | 160 | | | | 0.010 | 0.10 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 29 | | | 28 | 150 | | | | 0.008 | 0.10 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 65 | | | | 0.8 | | 0.007 | 190 | 90 |
| RF p-layer | | | 0.4 | | 90 | | 8 | 2 | 1.6 | | 0.07 | 170 | 10 |

These ten samples were subjected to evaluation of performance in the same way as that in Example E-3. Results of evaluation on each of the ten samples are shown in Table 274. The evaluation was made by normalizing the values measured on the respective samples with the values measured on the sample which was produced by using the gas containing trace amount of Group III element atoms having the concentration of 0.3 ppm. A mark x indicates that the normalized value is not less than 1.0 but below 1.4, a mark Δ indicates that the normalized value is not less than 1.4 but below 1.8 and a mark ° indicates that the normalized value is not less than 1.8.

From Table 274, it is understood that the concentration of the gas containing trace amount of Group III element atoms, which is used in the annealing containing trace amount of oxygen atoms and trace amount of Group III element atoms under the static magnetic field, most preferably ranges from 1 ppm to 1000 ppm with respect to the whole annealing gas (Total diluting He gas in this case), in order to obtain good results in regard to the initial photoelectric conversion efficiency, variation of the efficiency, photo-degradation, anti-environment characteristic against high-temperature, high-humidity atmosphere, and adhesion.

EXAMPLE E-13

This example is different from Example E-3 in that the concentration of the gas containing trace amount of Group III element atoms used in the annealing under the static magnetic field was varied within the range of between 0.3 ppm and 2000 ppm, for the purpose of investigating the influence of the gas concentration on the performance such as the initial photoelectric conversion efficiency. Ar gas was used as the diluting gas for varying the concentration of the gas containing trace amount of oxygen atoms and the concentration of the gas containing trace amount of Croup III element atoms used in the annealing under the static magnetic field.

In this example, a triple type photovoltaic element of FIG. 3 was produced by using the in-line type apparatus shown in FIG. 5. The process was materially the same as that in Example E-3, except that annealing conditions as shown in Table 275 and production conditions as shown in Table 276 were used. Ten sample elements were produced while varying the concentration of the gas containing trace amount of Group III element atoms between 0.3 ppm and 2000 ppm.

TABLE 274

| Concentration of trace amount of Group III atoms: ppm | 0.3 | 0.8 | 1 | 10 | 100 | 500 | 1000 | 1050 | 1300 | 2000 |
|---|---|---|---|---|---|---|---|---|---|---|
| Initial photoelectric conversion characteristic | x | Δ | ○ | ○ | ○ | ○ | ○ | Δ | x | x |
| Variation of characteristic | x | x | ○ | ○ | ○ | ○ | ○ | Δ | x | x |
| Photo-degradation characteristic | x | Δ | ○ | ○ | ○ | ○ | ○ | x | x | x |
| Anti-environment characteristic | x | x | ○ | ○ | ○ | ○ | ○ | Δ | x | x |
| Adhesion | x | Δ | ○ | ○ | ○ | ○ | ○ | x | x | x |

TABLE 275

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP III ELEMENT ATOMS

| | |
|---|---|
| Type of gas containing oxygen atoms | $O_2/Ar$ |
| Concentration of trace amount of oxygen atoms in whole annealing gas (ppm) | 2 |
| Type of gas containing Group III element atoms | $BF_3/Ar$ |
| Concentration of trace amount of Group III element atoms in whole annealing gas (ppm) | 0.3–2000 |
| Type of magnet | ALNICO |
| Magnetic field of intensity (G) | 1600 |
| Annealing temp. (° C.) | 310 |
| Annealing press. (Torr) | 1.2 |

From Table 277, it is understood that the concentration of the gas containing trace amount of Group III element atoms, which is used in the atmosphere gas of the annealing containing trace amount of oxygen atoms and trace amount of Group III element atoms, most preferably ranges from 1 ppm to 1000 ppm with respect to the whole annealing gas (Total diluting Ar gas in this case), in order to obtain good results in regard to the initial photoelectric conversion efficiency, variation of the efficiency, photo-degradation, anti-environment characteristic against high-temperature, high-humidity atmosphere, and adhesion.

TABLE 276

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SiH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 200 | | | 1.3 | | 0.05 | 350 | 20 |
| RF i-layer | | 4.0 | | | 100 | | | | 0.8 | | 0.008 | 300 | 10 |
| MW i-layer | 46 | | | 49 | 180 | | | | 0.010 | 0.10 | 0.31 | 370 | 110 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 29 | | | 26 | 155 | | | | 0.008 | 0.10 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 65 | | | | 0.8 | | 0.007 | 190 | 90 |
| RF p-layer | | | 0.4 | | 90 | | 8 | 2 | 1.6 | | 0.07 | 170 | 10 |

These ten samples were subjected to evaluation of performance in the same way as that in Example E-3. Results of evaluation on each of the ten samples are shown in Table 277. The evaluation was made by normalizing the values measured on the respective samples with the values measured on the sample which was produced by using the gas containing trace amount of Group III element atoms having the concentration of 0.3 ppm. A mark x indicates that the normalized value is not less than 1.0 but below 1.4, a mark Δ indicates that the normalized value is not less than 1.4 but below 1.8 and a mark ○ indicates that the normalized value is not less than 1.8.

TABLE 277

| Concentration of trace amount of Group III atoms: ppm | 0.3 | 0.8 | 1 | 10 | 100 | 500 | 1000 | 1050 | 1300 | 2000 |
|---|---|---|---|---|---|---|---|---|---|---|
| Initial photoelectric conversion characteristic | x | x | ○ | ○ | ○ | ○ | ○ | Δ | x | x |
| Variation of characteristic | x | Δ | ○ | ○ | ○ | ○ | ○ | x | x | x |
| Photo-degradation characteristic | x | Δ | ○ | ○ | ○ | ○ | ○ | x | x | x |
| Anti-environment characteristic | x | Δ | ○ | ○ | ○ | ○ | ○ | x | x | x |
| Adhesion | x | x | ○ | ○ | ○ | ○ | ○ | Δ | x | x |

EXAMPLE E-14

This example is different from Example E-3 in that the intensity of the static magnetic field used in the annealing was varied within the range of between 30 G and 4000 G, for the purpose of investigating the influence of the magnetic field intensity on the performance such as the initial photoelectric conversion efficiency. $H_2$ gas was used as the diluting gas for determining the concentration of the gas containing trace amount of oxygen atoms and the concentration of the gas containing trace amount of Group III element atoms which are used in the annealing conducted under the static magnetic field.

In this example, a triple type photovoltaic element as shown in FIG. 3 was produced by using the in-line type apparatus shown in FIG. 5. The process was materially the same as that in Example E-3, except that annealing conditions as shown in Table 278 and production conditions as shown in Table 279 were used. Ten sample elements were produced while varying the intensity of the static magnetic field between 50 G and 4000 G.

TABLE 278

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP III ELEMENT ATOMS

| | |
|---|---|
| Type of gas containing oxygen atoms | $O_2/H_2$ |
| Concentration of trace amount of oxygen atoms in whole annealing gas (ppm) | 1 |
| Type of gas containing Group III element atoms | $B_3H_2/H_2$ |
| Concentration of trace amount of Group III element atoms in whole annealing gas (ppm) | 2 |
| Type of magnet | ALNICO |
| Magnetic field of intensity (G) | 30–4000 |
| Annealing temp. (° C.) | 300 |
| Annealing press. (Torr) | 1.3 | of evaluation on each of the ten samples are shown in Table 280. The evaluation was made by normalizing the values measured on the respective samples with the values measured on the sample which was produced by setting the static magnetic field intensity to 30 G. A mark x indicates that the normalized value is not less than 1.0 but below 1.4, a mark Δ indicates that the normalized value is not less than 1.4 but below 1.8 and a mark °indicates that the normalized value is not less than 1.8.

From Table 280, it is understood that the intensity of the magnetic field, under which the annealing is conducted in the atmosphere containing trace amount of oxygen atoms and trace amount of Group III element atoms, most preferably ranges from 100 to 3000 G, in order to obtain good results in regard to the initial photoelectric conversion efficiency, variation of the efficiency, photo-degradation, anti-environment characteristic against high-temperature, high-humidity atmosphere, and adhesion.

TABLE 279

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 48 | | | 51 | 200 | | | | 0.010 | 0.10 | 0.25 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 35 | | | 29 | 130 | | | | 0.013 | 0.10 | 0.24 | 350 | 98 |
| RF i-layer | | 4.0 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 70 | | | | 0.8 | | 0.007 | 190 | 90 |
| RF p-layer | | | 0.4 | | 90 | | 8 | 2 | 1.6 | | 0.07 | 170 | 10 |

These ten samples were subjected to evaluation of performance in the same way as that in Example E-3. Results

TABLE 280

| Magnetic field intensity | 30 | 70 | 100 | 500 | 1000 | 2000 | 3000 | 3050 | 3500 | 4000 |
|---|---|---|---|---|---|---|---|---|---|---|
| Initial photoelectric conversion characteristic | X | Δ | ○ | ○ | ○ | ○ | ○ | Δ | X | X |
| Variation of characteristic | X | Δ | ○ | ○ | ○ | ○ | ○ | X | X | X |
| Photo-degradation characteristic | X | X | ○ | ○ | ○ | ○ | ○ | Δ | X | X |

TABLE 280-continued

| Magnetic field intensity | 30 | 70 | 100 | 500 | 1000 | 2000 | 3000 | 3050 | 3500 | 4000 |
|---|---|---|---|---|---|---|---|---|---|---|
| Anti-environment characteristic | X | Δ | ○ | ○ | ○ | ○ | ○ | Δ | X | X |
| Adhesion | X | Δ | ○ | ○ | ○ | ○ | ○ | Δ | X | X |

EXAMPLE E-15

This example is different from Example E-3 in that the annealing temperature was varied within the range of between 25° C. and 500° C., for the purpose of investigating the influence of the annealing temperature on the performance such as the initial photoelectric conversion efficiency. $H_2$ gas was used as the diluting gas for determining the concentration of the gas containing trace amount of oxygen atoms and the concentration of the gas containing trace amount of Group III element atoms which were used in the annealing conducted under the static magnetic field.

In this example, a triple type photovoltaic element as shown in FIG. 3 was produced by using the in-line type apparatus shown in FIG. 5. The process was materially the same as that in Example E-3, except that annealing conditions as shown in Table 281 and production conditions as shown in Table 282 were used. Ten sample elements were produced while varying the annealing temperature between 25° C. and 500° C.

These ten samples were subjected to evaluation of performance in the same way as that in Example E-3. Results of evaluation on each of the ten samples are shown in Table 283. The evaluation was made by normalizing the values measured on -the respective samples with the values measured on the sample which was produced by setting the annealing temperature to 25° C. A mark x indicates that the normalized value is not less than 1.0 but below 1.4, a mark Δ indicates that the normalized value in not less than 1.4 but below 1.8 and a mark ○ indicates that the normalized value is not less than 1.8.

From Table 283, it is understood that the temperature of annealing conducted in the atmosphere containing trace amount of oxygen atoms and trace amount of Group III element atoms under the static magnetic field most preferably ranges from 50° C. to 400° C., in order to obtain good results in regard to the initial photoelectric conversion efficiency, variation of the efficiency, photo-degradation, anti-environment characteristic against high-temperature, high-humidity atmosphere, and adhesion.

TABLE 281

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP III ELEMENT ATOMS

| | |
|---|---|
| Type of gas containing oxygen atoms | $O_2/H_2$ |
| Concentration of trace amount of oxygen atoms in whole annealing gas (ppm) | 2 |
| Type of gas containing Group III element atoms | $BF_3/H_2$ |
| Concentration of trace amount of Group III element atoms in whole annealing gas (ppm) | 2 |
| Type of magnet | ALNICO |
| Magnetic field of intensity (G) | 1400 |
| Annealing temp. (° C.) | 25–500 |
| Annealing press. (Torr) | 1.2 |

TABLE 282

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 48 | | | 51 | 170 | | | | 0.010 | 0.10 | 0.25 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 33 | | | 29 | 130 | | | | 0.013 | 0.10 | 0.24 | 350 | 90 |
| RF i-layer | | 4.0 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 70 | | | | 0.8 | | 0.007 | 190 | 90 |
| RF p-layer | | | 0.4 | | 90 | | 8 | 2 | 1.6 | | 0.07 | 170 | 10 |

TABLE 283

| Annealing temp. (° C.) | 25 | 40 | 50 | 100 | 200 | 300 | 400 | 430 | 470 | 500 |
|---|---|---|---|---|---|---|---|---|---|---|
| Initial photoelectric conversion characteristic | X | Δ | ○ | ○ | ○ | ○ | ○ | X | X | X |
| Variation of characteristic | X | Δ | ○ | ○ | ○ | ○ | ○ | X | X | X |
| Photo-degradation characteristic | X | X | ○ | ○ | ○ | ○ | ○ | Δ | X | X |
| Anti-environment characteristic | X | Δ | ○ | ○ | ○ | ○ | ○ | X | X | X |
| Adhesion | X | Δ | ○ | ○ | ○ | ○ | ○ | X | X | X |

EXAMPLE E-16

This sample is different from Example E-3 in that the pressure of the annealing atmosphere was varied within the range of between 0.002 Torr and 100 Torr, for the purpose of investigating the influence of the annealing atmosphere pressure on the performance such as the initial photoelectric conversion efficiency. $H_2$ gas was used as the diluting gas for determining the concentration of the gas containing trace amount of oxygen and the concentration of the gas containing trace amount of Group III element atoms under the static magnetic field.

TABLE 284

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP III ELEMENT ATOMS

| | |
|---|---|
| Type of gas containing oxygen atoms | $O_2/H_2$ |
| Concentration of trace amount of oxygen atoms in whole annealing gas (ppm) | 2 |
| Type of gas containing Group III element atoms | $B_2H_6/H_2$ |
| Concentration of trace amount of Group III element atoms in whole annealing gas (ppm) | 2 |
| Type of magnet | ALNICO |
| Magnetic field of intensity (G) | 1700 |
| Annealing temp. (° C.) | 340 |
| Annealing press. (Torr) | 0.002–100 |

TABLE 285

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SiH_4/H_2$ flow rate sccm | Press. Torr | MW Power W/cm² | RF Power W/cm² | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 47 | | | 51 | 155 | | | | 0.010 | 0.08 | 0.25 | 380 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 33 | | | 28 | 145 | | | | 0.013 | 0.07 | 0.24 | 360 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 70 | | | | 0.8 | | 0.007 | 190 | 90 |
| RF p-layer | | | 0.4 | | 90 | | 8 | 2 | 1.6 | | 0.07 | 170 | 10 |

In this example, triple type photovoltaic element of the type shown in FIG. 3 was produced by using the in-line type apparatus shown in FIG. 5. The process was materially the same as that in Example E-3, except that annealing conditions as shown in Table 284 and production conditions as shown in Table 285 were used. Ten sample elements were produced while varying the pressure of the annealing atmosphere within the range of between 0.002 Torr and 100 Torr.

These ten samples were subjected to evaluation of performance in the same way as that in Example E-3. Results of evaluation on each of the ten samples are shown in Table 286. The evaluation was made by normalizing the values measured on the respective samples with the values measured on the sample which was produced by setting the annealing atmosphere pressure to 0.002 Torr. A mark x indicates that the normalized value is not less than 1.0 but below 1.4, a mark Δ indicates that the normalized value is not less than 1.4 but below 1.8 and a mark ○ indicates that the normalized value is not less than 1.8.

From Table 286, it is understood that the pressure of the annealing conducted in the atmosphere containing trace amount of oxygen atoms and trace amount of Group III element atoms under the static magnetic field most preferably ranges from 0.01 Torr to 10 Torr, in order to obtain good results in regard to the initial photoelectric conversion efficiency, variation of the efficiency, photo-degradation, anti-environment characteristic against high-temperature, high-humidity atmosphere, and adhesion.

TABLE 286

| Annealing press. (Torr) | 0.002 | 0.005 | 0.01 | 0.1 | 1 | 5 | 10 | 20 | 50 | 100 |
|---|---|---|---|---|---|---|---|---|---|---|
| Initial photoelectric conversion characteristic | X | Δ | ○ | ○ | ○ | ○ | ○ | X | X | X |
| Variation of characteristic | X | X | ○ | ○ | ○ | ○ | ○ | Δ | X | X |
| Photo-degradation characteristic | X | Δ | ○ | ○ | ○ | ○ | ○ | Δ | X | X |
| Anti-environment characteristic | X | X | ○ | ○ | ○ | ○ | ○ | Δ | X | X |
| Adhesion | X | Δ | ○ | ○ | ○ | ○ | ○ | X | X | X |

EXAMPLE E-17

This example is different from Example E-3 in that the following conditions (i) to (iv) were employed, for the purpose of investigating the influence of these conditions on the performance such as the initial photoelectric conversion efficiency.

(i) The frequency of the microwave was varied within the range of between 0.02 GHz and 50 GHz in the formation of the MW i-layer 304 of a-SiGe and in the formation of the MW i-layer 307 of a-SiGe.

(ii) He gas was used in place of Ar gas, as the diluting gas which determines the concentration of the gas containing trace amount of oxygen atoms used in the annealing conducted under the static magnetic field.

(iii) Different annealing conditions were adopted in annealing treatments effected on the MW i-layer 304 of a-SiGe and the MW i-layer 307 of a-SiGe.

(iv) $H_2$ gas was used in place of Ar gas as the diluting gas which determines the concentration of the gas containing trace amount of Group III element atoms used in the annealing conducted under the static magnetic field.

In this Example, a photovoltaic element of the triple type shown in FIG. 3 was manufactured by using an in-line type apparatus shown in FIG. 5. The process was as follows.

(1) A substrate having a reflecting layer 301 and a reflection enhancement layer 302 formed thereon (i.e. base member), prepared in the same way as that in Example E-1, was disposed on a substrate conveyor rails 413 laid in a load chamber 401, and the internal pressure of the load chamber 401 was lowered to $1 \times 10^{-5}$ Torr. by a vacuum pump (not shown).

(2) Then, gate valves 406 and 407 were opened and the substrate was conveyed into conveyance chambers 402, 403 into a deposition chamber 418 which had been evacuated to certain levels of vacuum by vacuum pumps which are not shown. The substrate was held such that its reverse side was kept in close contact with a substrate heater 411 so as to be heated by the heater 411, while the interior of the deposition chamber 418 was evacuated by the vacuum pump to a level of $1 \times 10^{-5}$ Torr.

(3) Preparation for film forming operation was thus completed. Then, $H_2$ gas was introduced into the deposition chamber 417 through a gas-introduction line 429 and the flow rate of the $H_2$ gas was controlled to 500 sccm by means of valves 441, 431, 430, under the control of a mass-flow controller 436. At the same time, the internal pressure of the deposition chamber 417 was regulated to 1.3 Torr. by a conductance valve (not shown). Meanwhile, the substrate heater 410 was adjusted to maintain the substrate temperature at 350° C. When the substrate temperature has been stabilized, an RF n-layer 303 of μc-Si, an RF i-layer 351 of a-Si, and an MW i-layer 304 of a-SiGe were formed in the same way as that in Example E-2. In the formation of the MW i-layer, the MW introduction window 425 was removed and, instead, an antenna-type MW introduction electrode (not shown) was used according to the frequency of the microwave.

(4) Then, a gas containing a trace amount of oxygen atoms and trace amount of Group III element atoms under a static magnetic field.

For the purpose of executing the annealing in the gas atmosphere containing a trace amount of oxygen atoms and trace amount of Group III element atoms under the static magnetic field, $O_2$/He gas (dilution: 2 ppm) as the gas containing oxygen atoms and $BF_3/H_2$ gas (dilution 2 ppm) as the gas containing trace amount of Group III element atoms were introduced into the deposition chamber 418 through the gas introduction line 449. The valves 465 and 455 were opened and the flow rate of the $O_2$/He gas (dilution 2 ppm) was controlled to 500 sccm by means of a mass flow controller 460. The flow rate of the $BF_3/H_2$ gas (dilution 2 ppm) also was regulated to 500 scam by means of valves and a mass-flow controller which are not shown. Then, an alnico magnet 495 of 1500 gauss having a height adjusting mechanism, serving as the means for applying the static magnetic field, was installed. Meanwhile, the pressure in the deposition chamber 418 was controlled to 1.0 Torr by a conductance valve (not shown). The annealing in a gas atmosphere containing trace amount of oxygen atoms and trace amount of Group III element atoms under the static magnetic field was conducted for 10 minutes, while the substrate heater 411 was controlled to maintain the substrate temperature at 300° C. Then, the alnico magnet 495 of 1500 gauss having the height adjusting mechanism, serving as the means for applying static magnetic field, was removed and the supply of the $O_2$/He gas (dilution: 2 ppm) and the $BF_3/H_2$ gas (dilution 2 ppm) into the deposition chamber 418 was stopped. The interior of the deposition chamber 418 and the gas line was then evacuated to $1 \times 10^{-5}$ Torr.

(5) Then, an RF i-layer 361 of a-Si, an RF p-layer 305 of a-SiC, an RF n-layer 306 of μc-Si, an RF i-layer 352 of a-Si, and an MW i-layer 307 of a-SiGe were successively formed, in accordance with a procedure which is substantially the same as that used in Example E-2. In the formation of the MW i-layer, the MW introduction window 425 was removed and, instead, an antenna-type MW introduction electrode (not shown) was used according to the frequency of the microwave.

(6) Then, an annealing was executed in an atmosphere of a gas containing a trace amount of oxygen atoms and a trace amount of Group III element atoms under a static magnetic field.

For the purpose of executing the annealing in the gas atmosphere containing a trace amount of oxygen atoms and a trace amount of Group III element atoms under the static magnetic field, $O_2$/He gas (dilution: 2 ppm) as the gas containing oxygen atoms and $BF_3/H_2$ gas (dilution 2 ppm) as the gas containing Group III element atoms were introduced into the deposition chamber 418 through the gas introduction line 449. The valves 465 and 455 were opened and the flow rate of the $O_2$/He gas (dilution 2 ppm) was controlled to 500 sccm by means of a mass-flow controller 460. The flow rate of the $BF_3/H_2$ gas (dilution 2 ppm) also was regulated to 500 sccm by means of valves and a mass-flow controller which are not shown. Then, an alnico magnet 495 of 1400 gauss having a height adjusting mechanism, serving as the means for applying the static magnetic field, was installed. Meanwhile, the pressure in the deposition chamber 418 was controlled to 1.2 Torr by a conductance valve (not shown). The annealing in a gas atmosphere containing trace amount of oxygen atoms and trace amount of Group III element atoms under the static magnetic field was conducted for 10 minutes, while the substrate heater 411 was controlled to maintain the substrate temperature at 280° C. Then, the alnico magnet 495 of 1400 gauss having the height adjusting mechanism, serving as means for applying the static magnetic field, was removed and the supply of the $O_2$/He gas (dilution: 2 ppm) and the $BF_3/H_2$ gas (dilution 2 ppm) into the deposition chamber 413 was stopped. The interior of the deposition chamber 418 and the gas line was then evacuated to $1\times10^{-5}$ Torr.

(7) Then, an RF i-layer 362 of a-Si, an RF p-layer 308 of a-SiC, an RF n-layer 309 of μc-Si, an RF i-layer 310 of a-Si, and an RF p-layer 311 of a-SiC were successively formed, in accordance with a procedure which is substantially the same as that used in Example E-2, i.e., in the same way as Example E-2.

(8) Then, an ITO film of 70 nm thick, serving as a transparent conductive layer 312, was formed on the RF p-layer 311 by vacuum evaporation.

(9) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Production of the photovoltaic element of this example was thus completed. Ten samples were produced while varying the microwave frequency within the range of from 0.02 GHz to 50 GHz during formation of the MW i-layer. The conditions of the annealing in the atmosphere of the gas containing trace amount of oxygen atoms and trace amount of Group III element atoms under the static magnetic field, and the conditions employed in the formation of the RF n-layer, RF i-layer, MW i-layer and RF p-layer are shown in Tables 287, 288 and 289.

TABLE 287

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP III ELEMENT ATOMS
(MW i-layer 304)

| | |
|---|---|
| Type of gas containing oxygen atoms | $O_2/H_2$ |
| Concentration of trace amount of oxygen atoms in whole annealing gas (ppm) | 1 |
| Type of gas containing Group III element atoms | $BF_3/H_2$ |
| Concentration of trace amount of Group III element atoms in whole annealing gas (ppm) | 1 |
| Type of magnet | ALNICO |
| Magnetic field of intensity (G) | 1500 |
| Annealing temp. (° C.) | 300 |
| Annealing press. (Torr) | 1.3 |

TABLE 288

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP III ELEMENT ATOMS
(MW i-layer 307)

| | |
|---|---|
| Type of gas containing oxygen atoms | $O_2/H_2$ |
| Concentration of trace amount of oxygen atoms in whole annealing gas (ppm) | 1 |
| Type of gas containing Group III element atoms | $BF_3/H_2$ |
| Concentration of trace amount of Group III element atoms in whole annealing gas (ppm) | 1 |
| Type of magnet | ALNICO |
| Magnetic field of intensity (G) | 1500 |
| Annealing temp. (° C.) | 300 |
| Annealing press. (Torr) | 1.3 |

TABLE 289

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_4/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 70 | | | 72 | 250 | | | | 0.010 | 0.25 | 0.28 | 380 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 43 | | | 40 | 200 | | | | 0.011 | 0.25 | 0.28 | 360 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 80 | | | | 0.8 | | 0.007 | 190 | 90 |
| RF p-layer | | | 0.4 | | 90 | | 8 | 2 | 1.6 | | 0.07 | 170 | 10 |

These ten samples were subjected to evaluation of performance in the same way as that in Example E-3. Results of evaluation on each of the ten samples are shown in Table 290. The evaluation was made by normalizing the values measured on the respective samples with the values measured on the sample which was produced by using the microwave frequency of 0.02 GHz. A mark X indicates that the normalized value is not less than 1.0 but below 1.4, a mark Δ indicates that the normalized value is not less than 1.4 but below 1.8 and a mark ○ indicates that the normalized value is not less than 1.8. A mark ⊚ indicates that the normalised value is more than 2.0.

From Table 290, it is understood that the frequency of the microwave, which is employed in the formation of the MW i-layer 304 of a-SiGe and the MW i-layer 307 of a-SiGe which are to be annealed in the gas atmosphere containing trace amount of oxygen a toms and trace amount of Group III element atoms under the static magnetic field, most preferably ranges from 0.1 GHz to 10 GHz, in order to obtain good results in regard to the initial photoelectric conversion efficiency, variation of the efficiency, photo-degradation, anti-environment characteristic against high-temperature, high-humidity atmosphere, and adhesion.

TABLE 290

| Microwave frequency: GH$_2$ | 0.02 | 0.05 | 0.1 | 0.5 | 1 | 2.45 | 10 | 20 | 30 | 50 |
|---|---|---|---|---|---|---|---|---|---|---|
| Initial photoelectric conversion characteristic | X | X | ⊚ | ○ | ○ | ⊚ | ○ | X | X | X |
| Variation of characteristic | X | X | ○ | ○ | ○ | ⊚ | ○ | X | X | X |
| Photo-degradation characteristic | X | X | ○ | ⊚ | ⊚ | ⊚ | ○ | Δ | X | X |
| Anti-environment characteristic | X | Δ | ⊚ | ⊚ | ○ | ⊚ | ○ | X | X | X |
| Adhesion | X | X | ○ | ⊚ | ○ | ⊚ | ○ | Δ | X | X |

EXAMPLE E-18

In this example, a triple type photovoltaic element of the type shown in FIG. 3 was produced by using the roll-to-roll type apparatus shown in FIG. 9. The annealing was conducted by using various combinations of annealing conditions in the atmosphere containing trace amount of oxygen atoms and trace amount of Group III element atoms under the static magnetic field. The production process was as follows.

(1) A sheet-like substrate (base member) of 30 cm wide, composed of a substrate of a stainless steel and carrying a reflecting layer such as of Ag (or Al—Si or the like) and a reflection enhancement layer such as of ZnO, was rolled up and set in a loading chamber 5010 for loading sheet-type substrate.

(2) The sheet-type substrate was threaded through all the deposition chambers and all the gas gates, and was connected to a sheet take-up jig disposed in an unload chamber 5150.

(3) The deposition chambers were evacuated to a level of $10^{-3}$ Torr or lower by evacuating systems which are not shown. Material gases were supplied to the deposition chambers, from mixing devices 5024, 5034, 5044, 5054, 5064, 5074, 5084, 5094, 5104, 5114, 5124, 5134 and 5144 associated with the respective deposition chambers.

(4) A gas containing trace amount of oxygen atoms and a gas containing trace amount of Group III element atoms, which are to be used in the annealing conducted under a static magnetic field, were supplied from the respective gate gas supply devices to the gas gates 5201, 5202, 5203, 5204, 5205, 5206, 5207, 5208, 5209, 5210, 5211, 5212, 5213 and 5214 each of which incorporated an alnico magnet roller having a magnetic field intensity of 1300 gauss.

In this example, the gap in the gas gate through which the sheet-type substrate passes was variable, and the gases containing trace amount of oxygen atoms and trace amount of Group III element atoms to be used in the annealing under the static magnetic field were supplied to the gas gates at a total flow rate of 1000 sccm. The temperature of the annealing conducted under the static magnetic field in the atmosphere containing trace amount of oxygen atoms and trace amount of Group III element atoms was controlled to range between 350° C. and 50° C. by means of heaters incorporated in the gas gates. At the same time, the annealing pressure was controlled to range between 3 Torr and 1 Torr, by means of an evacuating system which is not shown.

(5) The substrate was heated by a substrate heater of each deposition device, and the level of the vacuum in each deposition device was controlled by operating an evacuating valve of each evacuation device. Advance of the sheet-type substrate was commenced when the substrate temperature and the vacuum level had been settled, and RF power for generating plasma and MW power (frequency 2.45 GHz) were supplied to each deposition device.

A triple-type solar cell having three pin structures stacked on one on another on the sheet-type substrate 300 was thus produced.

(6) Then, an ITO film of 70 nm thick, serving as a transparent conductive layer 312, was formed on the RF p-layer 311 by vacuum evaporation.

(7) A mask having comb-shaped aperture was placed on the transparent electrode 312 and a comb-shaped collector 5 electrode 313 of Cr(40 nm)/Ag(1000 nm)/Cr(40 nm) was formed by vacuum evaporation.

Fabrication of the photovoltaic element of this example was thus completed. This element will be referred to as "SC/E-18". The conditions of the annealing in gas atmosphere containing trace amount of oxygen atoms and trace amount of Group III element atoms under the static magnetic field in this example, as well as the conditions of film-forming processes for forming the RF n-layer, RF i-layer, MW i-layer and RF-p layer are collectively shown in Tables 291 and 292.

TABLE 291

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF ATOMS OF GROUP III ELEMENT

| Gas gate | Type of gas containing oxygen atoms | Concentration of trace amount of oxygen atoms in whole annealing gas (ppm) | Type of gas containing Group III element atoms | Concentration of trace amount of Group III element atoms in whole annealing gas (ppm) | Annealing temp. (° C.) | Annealing press. (Torr) |
|---|---|---|---|---|---|---|
| 5201 | $O_2$/He | 500 | $B_2H_6$/He | 1 | 350 | 3.0 |
| 5202 | $O_2$/$H_2$ | 3 | $B_2H_6$/$H_2$ | 1 | 350 | 2.0 |
| 5203 | $O_2$/$H_2$ | 1 | $BF_3$/$H_2$ | 4 | 350 | 1.6 |
| 5204 | $O_2$/He | 1 | $BF_3$/He | 6 | 300 | 1.2 |
| 5205 | NO/He | 1 | $BF_3$/He | 400 | 300 | 2.5 |
| 5206 | NO/He | 200 | $B_2H_6$/He | 10 | 300 | 2.3 |
| 5207 | $O_2$/He | 10 | $B_2H_6$/He | 1 | 300 | 1.9 |
| 5208 | $O_2$/$H_2$ | 1 | $BF_3$/$H_2$ | 4 | 350 | 1.3 |
| 5209 | $O_2$/$H_2$ | 1 | $BF_3$/$H_2$ | 6 | 280 | 1.0 |
| 5210 | $O_2$/He | 2 | $B_2H_6$/He | 500 | 260 | 2.3 |
| 5211 | NO/He | 100 | $B_2H_6$/He | 10 | 230 | 2.2 |
| 5212 | $O_2$/$H_2$ | 1 | $B_2H_6$/He | 1 | 190 | 1.3 |
| 5213 | $O_2$/He | 3 | $B_2H_6$/He | 400 | 170 | 2.0 |
| 5214 | $O_2$/He | 500 | $B_2H_6$/He | 100 | 50 | 2.0 |

TABLE 292

| | $SiH_4$ flow rate sccm | $Si_2H_6$ flow rate sccm | $CH_4$ flow rate sccm | $GeH_4$ flow rate sccm | $H_2$ flow rate sccm | $PH_3$/$H_2$ flow rate sccm | $B_2H_6$/$H_2$ flow rate sccm | $SIH_4$/$H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 47 | | | 50 | 140 | | | | 0.005 | 0.07 | 0.28 | 380 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 33 | | | 30 | 130 | | | | 0.005 | 0.05 | 0.28 | 360 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 55 | | | | 0.8 | | 0.007 | 190 | 90 |
| RF p-layer | | | 0.4 | | 90 | | 8 | 2 | 1.6 | | 0.07 | 170 | 10 |

Comparative Example E 18-1

A process was conducted as Comparative Example E 18 1-1. This process was different from Example E-18 in that it omitted the annealing in the gas atmosphere containing trace amount of oxygen atoms and trace amount of Group III element atoms under the static magnetic field and that $H_2$ gas or He gas as desired was supplied to each gas gate as required.

Other conditions were materially the same as those in Example E-18. The photovoltaic element produced in Comparative Example E 18-1 will be referred to as "SC/CE18-1".

Six samples of the photovoltaic elements SC/E-18, as well as six samples of the photovoltaic elements SC/CE18-1, were produced and were subjected, basically in the same way as Example A-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The photo-degradation was evaluated by setting the element temperature to 45° C.

The anti-environment characteristic was evaluated by setting the temperature to 89° C., the humidity to 93% and the time of shelving in the dark place to 200 hours. The results are shown in Table 293.

The performance of the photovoltaic element is shown in Table 293 in terms of values measured on the samples of the photovoltaic element SC/E-18 as normalized by the values measured on the samples of the photovoltaic element SC/CE18-1.

TABLE 293

| Items of evaluation | Evaluation |
|---|---|
| Initial photoelectric conversion efficiency characteristic | 1.56 |
| Variation of Initial photoelectric conversion efficiency characteristic | 0.83 |
| Photo-degradation characteristic | 0.81 |
| Anti-environment characteristic | 0.83 |

TABLE 293-continued

| Items of evaluation | Evaluation |
| --- | --- |
| SEM observation of sectional face | 0.92 |
| Measurement of adhesion: Delamination | No delamination in SC/E-18 Slight delamination in SC/CE18-1 |

From Table 293, it is understood that the photovoltaic element SC/E-18 of this example exhibits superiority to the comparative example SC/CE18-1 in all items of the evaluation.

EXAMPLE E-19

In this example, a triple type photovoltaic element was produced by using the roll-to-roll type apparatus shown in FIG. 9. The annealing was conducted under a static magnetic field by using various combinations of annealing conditions conducted in an atmosphere containing trace amount of oxygen atoms and trace amount of Group III element atoms. The production process was as follows.

(1) A sheet-like substrate (base member) of 30 cm wide, composed of a substrate of a stainless steel and carrying a reflecting layer such as of Ag (or Al—Si or the like) and a reflection enhancement layer such as of ZnO, was rolled up and set in a loading chamber 5010 for loading sheet-type substrate. The sheet-type substrate was threaded through all the deposition chambers and all the gas gates, and was connected to a sheet take-up jig disposed in an unload chamber 5150. The deposition chambers were evacuated to a level of $10^{-3}$ Torr or lower by evacuating systems which are not shown.

(2) Material gases were supplied to the deposition chambers, from mixing devices 5024, 5034, 5044, 5054, 5064, 5074, 5084, 5094, 5104, 5114, 5124, 5134 and 5144 associated with the respective deposition chambers.

(3) Gases containing trace amounts of oxygen atoms and gases containing trace amounts of Group III element atoms, which were to be used in the annealing under the attic magnetic field, were supplied from the respective gate gas supply devices to the gas gates 5201, 5202, 5203, 5204, 5205, 5206, 5207, 5208, 5209, 5210, 5211, 5212, 5213 and 5214 each of which incorporated an alnico magnet roller M of 1300 gauss.

In this example, the gap in the gas gate through which the sheet-type substrate passes was variable, and the gases containing trace amount of oxygen atoms and trace amount of Group III element atoms, which were to be used in the annealing under the static magnetic field, were supplied to the gas gates at a total flow rate of 1000 sccm. The temperature of the annealing under the static magnetic field in the atmosphere containing trace amount of oxygen atoms and trace amount of Group III element atoms was controlled to range between 350° C. and 50° C. by means of heaters incorporated in the gas gates. At the same time, the annealing pressure was controlled to range between 3 Torr and 1 Torr, by means of an evacuating system which is not shown.

(4) The substrate was heated by a substrate heater of each deposition device, and the level of the vacuum in each deposition device was controlled by operating an evacuating valve of each evacuation device. Advance of the sheet-type substrate was commenced when the substrate temperature and the vacuum level had been settled, and RF power for generating plasma and MW power (frequency 0.5 Ghz) were supplied to each deposition antenna-type MW introduction electrode was used in the MW power supply system.

A triple-type solar cell having three pin structures stacked on one on another on the sheet-type substrate 300 was thus produced.

(5) Then, an ITO film of 70 nm thick, serving as a transparent conductive layer 312, was formed on the RF p-layer 311 by vacuum evaporation.

(6) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of this example was thus completed. This element will be referred to as "SC/E-19". The conditions of the annealing in gas atmosphere containing trace amount of oxygen atoms and trace amount of Group III element atoms under the static magnetic field in this example, as well as the conditions of film-forming processes for forming the RF n-layer, RF i-layer, MW i-layer and RF-p layer are collectively shown in Tables 294 and 295.

TABLE 294

CONDITIONS OF ANNEALING IN ATMOSPHERE FORMED OF GAS CONTAINING TRACE AMOUNT OF OXYGEN ATOMS AND GAS CONTAINING TRACE AMOUNT OF ATOMS OF GROUP III ELEMENT

| Gas gate | Type of gas containing oxygen atoms | Concentration of trace amount of oxygen atoms in whole annealing gas (ppm) | Type of gas containing Group III element atoms | Concentration of trace amount of Group III element atoms in whole annealing gas (ppm) | Annealing temp. (° C.) | Annealing press. (Torr) |
| --- | --- | --- | --- | --- | --- | --- |
| 5201 | $O_2$/Ar | 500 | $B_2H_6$/Ar | 1 | 350 | 3.0 |
| 5202 | $CO_2$/$H_2$ | 3 | $B_2H_6$/$H_2$ | 2 | 350 | 2.0 |
| 5203 | $O_2$/$H_2$ | 1 | $BF_3$ $H_2$ | 5 | 350 | 1.6 |
| 5204 | $O_2$/He | 1 | $BF_3$/He | 5 | 300 | 1.2 |
| 5205 | CO/He | 1 | $BF_3$/He | 500 | 300 | 2.5 |
| 5206 | NO/Ar | 100 | $B_2H_6$/Ar | 8 | 300 | 2.3 |
| 5207 | $O_2$/He | 10 | $B_2H_6$/He | 1 | 300 | 1.9 |
| 5208 | $O_2$/$H_2$ | 1 | $BF_3$/$H_2$ | 4 | 350 | 1.3 |
| 5209 | $O_2$/$H_2$ | 1 | $BF_3$ $H_2$ | 5 | 280 | 1.0 |
| 5210 | CO/He | 2 | $B_2H_6$/He | 500 | 260 | 2.3 |
| 5211 | NO/Ar | 80 | $B_2H_6$/Ar | 8 | 230 | 2.2 |
| 5212 | $O_2$/$H_2$ | 1 | $B_2H_6$/He | 1 | 190 | 1.3 |

TABLE 294-continued

CONDITIONS OF ANNEALING IN ATMOSPHERE FORMED OF GAS CONTAINING TRACE AMOUNT OF OXYGEN ATOMS AND GAS CONTAINING TRACE AMOUNT OF ATOMS OF GROUP III ELEMENT

| Gas gate | Type of gas containing oxygen atoms | Concentration of trace amount of oxygen atoms in whole annealing gas (ppm) | Type of gas containing Group III element atoms | Concentration of trace amount of Group III element atoms in whole annealing gas (ppm) | Annealing temp. (° C.) | Annealing press. (Torr) |
|---|---|---|---|---|---|---|
| 5213 | $O_2$/He | 5 | $B_2H_6$/He | 400 | 170 | 2.0 |
| 5214 | $O_2$/He | 500 | $B_2H_6$/He | 100 | 50 | 2.0 |

TABLE 295

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 45 | | | 47 | 250 | | | | 0.004 | 0.07 | 0.28 | 380 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 31 | | | 28 | 200 | | | | 0.004 | 0.05 | 0.30 | 360 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 55 | | | | 0.7 | | 0.007 | 190 | 90 |
| RF p-layer | | | 0.4 | | 90 | | 8 | 2 | 1.6 | | 0.07 | 170 | 10 |

Comparative Example E 19-1

A process was conducted as Comparative Example E 19-1. This process was different from Example E-19 in that it omitted the annealing conducted under the static magnetic field in the gas atmosphere containing trace amount of oxygen atoms and trace amount of Group III element atoms, and that $H_2$ gas, He gas or Ar gas as desired was supplied to each gas gate.

Other conditions were materially the same as those in Example E-19. The photovoltaic element produced in Comparative Example E 19-1 will be referred to as "SC/CE19-1".

Eight samples of the photovoltaic elements SC/E-19, as well as seven samples of the photovoltaic elements SC/CE19-1, were produced and were subjected, basically in the same way as Example A-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The initial photoelectric conversion efficiency was evaluated in terms of variation of the conversion efficiency among the seven sample elements of each type.

The photo-degradation characteristic was measured by setting the element temperature to 43° C. The anti-environment characteristic was evaluated by setting the temperature to 89° C., the humidity to 92% and the time of shelving in the dark place to 300 hours. The results are shown in Table 296.

The performance of the photovoltaic element is shown in Table 296 in terms of values measured on the samples of the photovoltaic element SC/E-19 as normalized by the values measured on the samples of the photovoltaic element SC/CE19-1.

TABLE 296

| Items of evaluation | Evaluation |
|---|---|
| Initial photoelectric conversion efficiency characteristic | 1.53 |
| Variation of Initial photoelectric conversion efficiency characteristic | 0.84 |
| Photo-degradation characteristic | 0.81 |
| Anti-environment characteristic | 0.84 |
| SEM observation of sectional face | 0.92 |
| Measurement of adhesion: Delamination | No delamination in SC/E-19 Slight delamination in SC/CE19-1 |

From Table 291, it is understood that the photovoltaic element SC/E-19 of this example exhibits superiority to the comparative example SC/CE19-1 in all items of the evaluation.

EXAMPLE E-20

In this example, a triple type photovoltaic element was produced by using the roll-to-roll type apparatus shown in FIG. 6. The annealing was conducted under a static magnetic field by using various combinations of conditions of annealing in the atmosphere containing trace amount of oxygen atoms and trace amount of Group III element atoms. The production process was as follows.

(1) A sheet-like substrate (base member) of 30 cm wide, composed of a substrate of a stainless steel and carrying a reflecting layer such as of Ag (or Al—Si or the like) and a reflection enhancement layer such as of ZnO, was rolled up and set in a loading chamber 5010 for loading sheet-type substrate. The sheet-type substrate was threaded through all the deposition chambers and all the gas gates, and was connected to a sheet take-up jig disposed in an unload chamber 5150. The deposition chambers were evacuated to a level of $10^{-3}$ Torr or lower by evacuating systems which are not shown.

(2) Material gases were supplied to the deposition chambers, from mixing devices 5024, 5034, 5044, 5054, 5064, 5074, 5084, 5094, 5104, 5114, 5124, 5134 and 5144 associated with the respective deposition chambers.

(3) Gases containing trace amounts of oxygen atoms and gases containing trace amounts of Group III element atoms, which were to be used in the annealing under the static magnetic field, were supplied from the respective gate gas supply devices to the gas gates 5201, 5202, 5203, 5204, 5205, 5206, 5207, 5208, 5209, 5210, 5211, 5212, 5213 and 5214 each of which incorporated an alnico magnet roller having a static field intensity of 1600 gauss.

In this example, the gap in the gas gate through which the sheet-type substrate passes was variable, and the gases containing trace amount of oxygen atoms and trace amount of Group III element atoms, which were to be used in the annealing conducted under the static magnetic field, were supplied to the gas gates at a total flow rate of 1400 sccm. The temperature of the annealing in the atmosphere containing trace amount of oxygen atoms and trace amount of Group III element atoms were controlled to range between 350° C. and 50° C. by means of heaters incorporated in the gas gates. At the same time, the annealing pressure was controlled to range between 3 Torr and 1 Torr, by means of an evacuating system which is not shown.

(4) The substrate was heated by a substrate heater of each deposition device, and the level of the vacuum in each deposition device was controlled by operating an evacuating valve of each evacuation device. Advance of the sheet-type substrate was commenced when the substrate temperature and the vacuum level had been settled, and RF power for generating plasma and MW power (frequency 0.1 GHz) were supplied to each deposition chamber. An antenna-type MW introduction electrode was used in the MW power supply system.

A triple-type solar cell having three pin structures stacked on one on another on the sheet-type substrate 300 was thus produced.

(5) Then, an ITO film of 70 nm thick, serving as a transparent conductive layer 312, was formed on the RF p-layer 311 by vacuum evaporation.

(6) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of this example was thus completed. This element will be referred to as "SC/E-20". The conditions of the annealing in gas atmosphere containing trace amount of oxygen atoms and trace amount of Group III element atoms in this example, as well as the conditions of film-forming processes for forming the RF n-layer, RF i-layer, MW i-layer and RF-p layer are collectively shown in Tables 297 and 298.

TABLE 297

CONDITIONS OF ANNEALING IN ATMOSPHERE FORMED OF GAS CONTAINING TRACE AMOUNT OF OXYGEN ATOMS AND GAS CONTAINING TRACE AMOUNT OF ATOMS OF GROUP III ELEMENT

| Gas Gate | Type of gas containing oxygen atoms | Concentration of trace amount of oxygen atoms in whole annealing gas (ppm) | Type of gas containing Group III element atoms | Concentration of trace amount of Group III element atoms in whole annealing gas (ppm) | Annealing temp. (° C.) | Annealing press. (Torr) |
|---|---|---|---|---|---|---|
| 5201 | $O_2$/He | 500 | $B_2H_6$/He | 1 | 350 | 3.0 |
| 5202 | $CO_2$/$H_2$ | 3 | $B_2H_6$/$H_2$ | 1 | 350 | 2.0 |
| 5203 | $O_2$/$H_2$ | 1 | $BF_3$ $H_2$ | 5 | 350 | 1.6 |
| 5204 | $O_2$/He | 1 | $BF_3$/He | 5 | 300 | 1.2 |
| 5205 | NO/He | 1 | $BF_3$/He | 500 | 300 | 2.5 |
| 5206 | NO/He | 200 | $B_2H_6$/He | 10 | 300 | 2.3 |
| 5207 | $O_2$/He | 10 | $B_2H_6$/He | 1 | 300 | 1.9 |
| 5208 | $O_2$/$H_2$ | 1 | $BF_3$/$H_2$ | 5 | 350 | 1.3 |
| 5209 | $O_2$/$H_2$ | 1 | $BF_3$ $H_2$ | 5 | 280 | 1.0 |
| 5210 | $O_2$/He | 2 | $B_2H_6$/He | 500 | 260 | 2.3 |
| 5211 | No/He | 100 | $B_2H_6$/He | 10 | 230 | 2.2 |
| 5212 | $O_2$/$H_2$ | 1 | $B_2H_6$/He | 1 | 190 | 1.3 |
| 5213 | $O_2$/He | 3 | $B_2H_6$/He | 500 | 170 | 2.0 |
| 5214 | $O_2$/He | 500 | $B_2H_6$/He | 100 | 50 | 2.0 |

TABLE 298

| | $SiH_4$ flow rate sccm | $Si_2H_6$ flow rate sccm | $CH_4$ flow rate sccm | $GeH_4$ flow rate sccm | $H_2$ flow rate sccm | $PH_3$/$H_2$ flow rate sccm | $B_2H_6$/$H_2$ flow rate sccm | $SIH_4$/$H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 220 | | 1.3 | | | 0.05 | 350 | 20 |
| RF i-layer | | 4.0 | | | 100 | | | 0.8 | | | 0.008 | 300 | 10 |
| MW i-layer | 46 | | | 48 | 250 | | | 0.004 | 0.26 | 0.29 | 380 | 90 |

TABLE 298-continued

| | SiH₄ flow rate sccm | Si₂H₆ flow rate sccm | CH₄ flow rate sccm | GeH₄ flow rate sccm | H₂ flow rate sccm | PH₃/H₂ flow rate sccm | B₂H₆/H₂ flow rate sccm | SIH₄/H₂ flow rate sccm | Press. Torr | MW Power W/cm² | RF Power W/cm² | Substrate temp. °C. | Film thickness nm |
|---|---|---|---|---|---|---|---|---|---|---|---|---|---|
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 31 | | | 29 | 230 | | | | 0.004 | 0.26 | 0.29 | 375 | 85 |
| RF i-layer | | 4.0 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 70 | | | | 0.7 | | 0.007 | 190 | 88 |
| RF p-layer | | | 0.4 | | 90 | | 8 | 2 | 1.6 | | 0.07 | 170 | 10 |

Comparative Example E 20-1

A process was conducted as Comparative Example E 20-1. This process was different from Example E-20 in that it omitted the annealing conducted under the static magnetic field in the gas atmosphere containing trace amount of oxygen atoms and trace amount of Group III element atoms, and that H₂ gas, He gas or Ar gas as desired was supplied to each gas gate.

Other conditions were materially the same as those in Example E-20. The photovoltaic element produced in Comparative Example E-20-1 will be referred to as "SC/CE20-1".

Eight samples of the photovoltaic elements SC/E-20, as well as eight samples of the photovoltaic elements SC/CE20-1, were produced and were subjected, basically in the same way as Example A-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The photo-degradation characteristic was measured by setting the element temperature to 41° C. The anti-environment characteristic was evaluated by setting the temperature to 89° C., the humidity to 94% and -the time of shelving in the dark place to 260 hours. The results are shown in Table 299.

The performance of the photovoltaic element is shown in Table 299 in terms of values measured on the samples of the photovoltaic element SC/E-20 as normalized by the values measured on the samples of the photovoltaic element SC/CE20-1.

TABLE 299

| Items of evaluation | Evaluation |
|---|---|
| Initial photoelectric conversion efficiency characteristic | 1.51 |
| Variation of Initial photoelectric conversion efficiency characteristic | 0.85 |
| Photo-degradation characteristic | 0.82 |
| Anti-environment characteristic | 0.84 |
| SEM observation of sectional face | 0.91 |
| Measurement of adhesion: Delamination | No delamination in SC/E-20 Slight delamination in SC/CE20-1 |

From Table 299, it is understood that the photovoltaic element in SC/E-20 of this example exhibits superiority to the comparative example SC/CE20-1 in all items of the evaluation.

EXAMPLE E-21

Using the in-line type apparatus shown in FIG. 5, four types of samples of mono-film were prepared for measurement of interface defect density. More specifically, these four samples are a sample Ea in which the mono-film of a formed semiconductor layer is an RF μ-layer, a sample Eb in which the mono-film of a formed semiconductor layer is an RF i-layer, a sample Ec in which the mono-film of a formed semiconductor layer is an MW i-layer, and a sample Ed in which the mono-film of a formed semiconductor layer is an RF p-layer.

The process for preparing these samples was as follows.
(1) A substrate (base member) for each sample was prepared by effecting, on a substrate 100 of quartz glass of 25 mm wide, 50 mm long and 0.8 mm thick, supersonic cleaning conducted by employing acetone and isopropanol, followed by drying with heated air.

(2) A Cr layer of 5 nm thick was formed on the surface of the substrate 100 of quartz glass by sputtering.

(3) Then, one of n-type semiconductor layer, i-type semiconductor layer and p-type semiconductor layer was formed to a thickness of 1 μm by the same method as that used in Example E-1, and the substrate having such semiconductor layer was subjected to annealing conducted under a static magnetic field in atmosphere of a gas containing trace amount of oxygen atoms and trace amount of Group III element atoms, in the same way as that in Example E-1.

Samples of mono-films for the purpose of measurement of interface defect density were thus prepared. The conditions of the annealing under the static magnetic field in gas atmosphere containing trace amount of oxygen atoms and trace amount of Group III element atoms in this example, as well as the conditions of film-forming processes for forming the RF n-layer, RF i-layer, MW i-layer and RF-p layer are collectively shown in Tables 300 and 301.

TABLE 300

CONDITIONS OF ANNEALING UNDER STATIC MAGNETIC FIELD IN ATMOSPHERE FORMED OF GAS
CONTAINING TRACE AMOUNT OF OXYGEN ATOMS AND GAS CONTAINING TRACE AMOUNT OF ATOMS OF GROUP III ELEMENT

| Sample | Type of gas containing oxygen atoms | Concentration of trace amount of oxygen atoms in whole annealing gas (ppm) | Type of gas containing Group III element atoms | Concentration of trace amount of Group III element atoms in whole annealing gas (ppm) | Type of magnet | Magnetic field intensity | Anneal temp. (° C.) | Anneal press. (Torr) |
|---|---|---|---|---|---|---|---|---|
| Ea | $O_2/Ar$ | 100 | $B_2H_6/Ar$ | 100 | SAMARIUM COBALT | 1000 | 350 | 2.8 |
| Eb | $O_2/H_2$ | 2 | $BF_3/H_2$ | 15 | ALNICO | 1500 | 250 | 1.5 |
| Ec | $O_2/H_2$ | 3 | $BF_3/H_2$ | 10 | ALNICO | 1800 | 300 | 2 |
| Ed | $CO_2/He$ | 200 | $B_2H_6/He$ | 500 | SAMARIUM COBALT | 2000 | 230 | 2.5 |

TABLE 301

| Sample | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. |
|---|---|---|---|---|---|---|---|---|---|---|---|---|
| Ea RF n-layer | 2.5 | | | | 100 | 180 | | | 1.3 | | 0.05 | 350 |
| Eb RF i-layer | | 4.5 | | | 110 | | | | 0.6 | | 0.008 | 300 |
| Ec MW i-layer | 45 | | | 47 | 130 | | | | 0.006 | 0.07 | 0.30 | 380 |
| Ed RF p-layer | | | 0.3 | | 80 | | 15 | 2 | 1.8 | | 0.07 | 230 |

Comparative Example E 21-1

A process was conducted as Comparative Example E 21-1. This process was different from Example E-21 in that the semiconductor layers were formed without the step of annealing conducted under the static magnetic field in the gas atmosphere containing trace amount of oxygen atoms and trace amount of Group III element atoms.

Other conditions were materially the same as those in Example E-21. The mono-film for measurement of interface defect density prepared in Comparative Example E 21-1 will be referred to as "SC/CE21-1".

Five samples of mono-film Ea to Ed, as well as five samples of mono-film SC/CE21-1, were produced and were subjected to PDS (Photothermal Deflection Spectroscopy) measurement in the same way as Example A-17. The results are shown in Table 302. The measurement results are shown in this Table in terms of values measured on the samples Ba to Bd normalized with the values measured on the samples of the comparative example, i.e., SC/CE21-1. Thus, the values shown in table 302 shows the ratio of reduction in the interface defect density.

TABLE 302

| SAMPLE NAME | TYPE OF SEMICONDUCTOR LAYER FORMED | Reduction of interfacial defect density |
|---|---|---|
| Ea | RF n-layer | 0.94 |
| Eb | RF i-layer | 0.88 |
| Ec | MW i-layer | 0.86 |
| Ed | RF p-layer | 0.94 |

From Table 302, it is understood that the samples of the Example E-21, which have undergone the annealing conducted under the static magnetic field in atmosphere gas containing trace amount of oxygen atoms and trace amount of Group III element atoms in accordance with the invention, exhibit smaller density of interface defects and, hence, superior performance, as compared with the samples of Comparative Example (SC/CE21-1) which were prepared without such annealing.

EXAMPLE F-1

In this Example, a photovoltaic element of the type shown in FIG. 1 was manufactured by using an in-line type apparatus shown in FIG. 5, in accordance with the following procedure.

(1) A substrate (base member) was prepared as follows. A substrate 100 of a stainless steel of 50 mm long, 50 mm wide and 0.5 mm thick was subjected to an ultrasonic cleaning which was conducted by using acetone and propanol, followed by drying with heated air. A light reflecting layer 101 of Ag, having a thickness of 0.3 μm, was formed on the stainless steel substrate 100 by sputtering at room temperature. Then, a reflection enhancement layer 102 of ZnO, having a thickness of 1.0 μm, was formed on the reflecting layer 101 at 350° C., thus completing preparation of the substrate (base member).

(2) A deposition apparatus 400 is capable of performing both MWPCVD process and RFPCVD process. Semiconductor layers were formed on the reflection enhancement layer by using this apparatus.

Material gas cylinders, which were not shown, were connected to the deposition apparatus, through gas introduction lines. These cylinders contained material gases of ultra-high purity. More specifically, the following material gas cylinders were connected: an $SiH_4$ gas cylinder, $O_2/H_2$ (dilution: 2 ppm) gas cylinder, an $O_2/He$ (dilution: 10 ppm)

gas cylinder, $O_2/Ar$ (dilution 100 ppm) gas cylinder, an $O_2/H_2$ (dilution: 2000 ppm) gas cylinder, a $CH_4$ gas cylinder, a $GeH_4$ gas cylinder, an $Si_2H_6$ gas cylinder, a $B_2H_6/H_2$ (dilutions: 2 ppm, 10 ppm, 100 ppm, 0.2%, 0.5%) gas cylinders, $PH_3/H_2$ (dilution 2 ppm, 10 ppm, 100 ppm, 2000 pm) gas cylinders, $PF_5/H_2$ (dilutions 2 ppm, 10 ppm, 100 ppm, 2000 ppm) gas cylinders, an $H_2$ gas cylinder, an He gas cylinder, an $SiCl_2H_2$ gas cylinder and an $SiH_4/H_2$ (dilution: 1%) gas cylinder.

(3) The substrate having the reflecting layer 101 and the reflection enhancement layer 102 formed thereon (i.e. base member) was disposed on a substrate conveyor rail 413 laid in a load chamber 401, and the internal pressure of the load chamber 401 was lowered to $1 \times 10^{-5}$ Torr. by a vacuum pump (not shown). Then, a gate valve 406 was opened and the substrate was conveyed into a conveyance chamber 402 and then, into a deposition chamber 417 which have been evacuated to certain levels of vacuum by vacuum pumps which are not shown. The substrate was held such that its reverse side is kept in close contact with a substrate heater 410 so as to be heated by the heater 410, while the interior of the deposition chamber 417 was evacuated by the vacuum pump to a level of $1 \times 10^{-5}$ Torr.

(4) Preparation for film forming operation was thus completed. Then, $H_2$ gas was introduced into the deposition chamber 417 through a gas-introduction line 429 and the flow rate of the $H_2$ gas was controlled to 500 sccm by means of valves 441, 431, 430, under the control of a mass-flow controller 436. At the same time, the internal pressure of the deposition chamber 417 was regulated to 1.0 Torr. by a conductance valve (not shown). Meanwhile, the substrate heater 410 was adjusted to maintain the substrate temperature at 350° C.

(5) An RF n-layer 103 of $\mu c$-Si was formed when the substrate temperature has become steady.

To this end, valves 443, 433, 444 and 434 were operated to introduce the $SiH_4$ gas and $PH_3/H_2$ gas into the deposition chamber 417 through the gas introduction line 429. Flow rates of the $SiH_4$ gas, $H_2$ gas and the $PH_3/H_2$ gas were controlled to 2 sccm, 100 sccm and 10 sccm, respectively, by means of the mass-flow controllers 438, 436 and 439, while the pressure in the deposition chamber 417 was controlled to 1.0 Torr. The power of an RF power supply 422 was set to 0.05 W/cm$^2$, and RF power was introduced from this power supply into a plasma-forming cup 420, so as to trigger a glow discharge, thereby starting formation of the RF n-layer on the substrate. The RF power was turned off when the thickness of the RF n-layer had reached 20 nm, thus terminating the glow discharge to complete the formation of the RF n-layer 103. The supply of the $SiH_4$ gas, $PH_3/H_2$ gas and $H_2$ gas into the deposition chamber 417 was stopped and the interior of the deposition chamber and the gas line were evacuated to $1 \times 10^{-5}$ Torr.

(6) Then, an annealing was executed in an atmosphere of a gas containing a trace amount of oxygen atoms and atoms of a Group V element atoms under a static magnetic field.

For the purpose of executing the annealing in the gas atmosphere containing a trace amount of oxygen atoms and Group V element atoms, $O_2/H_2$ gas (dilution: 2 ppm) was introduced as the oxygen atom-containing gas, as well as the $PH_3/H_2$ gas (dilution 2000 ppm) as the gas containing Group V element atoms, into the deposition chamber 417 through the gas introduction line 429. The valves 442 and 432 were opened and the flow rate of the $O_2/H_2$ gas (dilution 2 ppm) was controlled to 500 sccm by means of a mass-flow controller 437. Valves 444, 434 were opened and a mass-flow controller 439 was operated to maintain the flow rate of the $PH_3/H_2$ gas (dilution 2000 ppm) at 500 sccm. Then, an alnico magnet 495 of 2500 gauss having a height adjusting mechanism, serving as means for applying the static magnetic field, was installed. Meanwhile, the pressure in the deposition chamber 417 was controlled to 1.0 Torr by a conductance valve (not shown). The annealing in accordance with the invention in a gas atmosphere containing trace amounts of oxygen atoms and Group V element atoms under the static magnetic field was conducted for 10 minutes, while the substrate heater 410 was controlled to maintain the substrate temperature, at 350° C. Then, the alnico magnet of 2500 gauss having height adjusting mechanism, serving as means for applying the static magnetic field, was removed and the supply of the $O_2/H_2$ gas (dilution: 2 ppm) and the $PH_3/H_2$ gas (dilution 2000 ppm) into the deposition chamber 417 was stopped and the interior of the deposition chamber 417 and the gas line was evacuated to $1 \times 10^{-5}$ Torr.

(7) Then, an RF i-layer 151 of a-Si, an MW i-layer 104 of a-SiGe, an RF i-layer 161 of a-Si and an RF p-layer 105 of a-SiC were successively formed in accordance with the steps (7-1) to (7-3) of Example A-1.

(8) Then, an RF p-layer 105 of a-SiC was formed in accordance with the step (8) of Example A-1.

(9) Then, a transparent conductive layer 112 was formed on the RF p-layer 105, and a comb-shaped collector electrode 113 of Cr(40 nm)/Ag(1000 nm)/Cr(40 nm) was formed thereon by vacuum evaporation, in accordance with the steps (9) and (10) of Example A-1.

Fabrication of the photovoltaic element of this example (element of the type shown in FIG. 1) was thus completed. This element will be referred to as "SC/F-1". The conditions of the annealing conducted in gas atmosphere containing trace amount of oxygen atoms and trace amount of Group V element atoms under the static magnetic field in this example, as well as the conditions of film-forming processes for forming the RF n-layer, RF i-layer, MW i-layer and RF-p layer are collectively shown in Tables 303 and 304.

TABLE 303

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP V ELEMENT ATOMS

| | |
|---|---|
| Type of gas containing oxygen atoms | $O_2/H_2$ |
| Concentration of trace amount of oxygen atoms in whole annealing gas (ppm) | 1 |
| Type of gas containing Group V element atoms | $PH_3/H_2$ |
| Concentration of trace amount of Group V element atoms in whole annealing gas (ppm) | 1000 |
| Type of magnet | ALNICO |
| Magnetic field of intensity (G) | 2500 |
| Annealing temp. (° C.) | 350 |
| Annealing press. (Torr) | 1.3 |

TABLE 304

| SC Ex. 1 | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. °C. | Film thickness nm |
|---|---|---|---|---|---|---|---|---|---|---|---|---|---|
| RF n-layer (103) | 2 | | | | 100 | 10 | | | 1.0 | | 0.05 | 350 | 20 |
| RF i-layer (151) | | 4 | | | 110 | | | | 0.7 | | 0.008 | 300 | 10 |
| MW i-layer (104) | 49 | | | 47 | 180 | | | | 0.005 | 0.10 | 0.30 | 380 | 170 |
| RF i-layer (161) | | 3 | | | 80 | | | | 0.7 | | 0.007 | 250 | 20 |
| RF p-layer (105) | | | 0.3 | | 60 | | 10 | 2 | 2.0 | | 0.07 | 230 | 10 |

Comparative Example F 1-1

A process was conducted as Comparative Example Fl-1. This process was different from Example F-1 in that it omitted the annealing in the gas atmosphere containing trace amount of oxygen atoms and trace amount of Group V element atoms under the static magnetic field.

Other conditions were materially the same as those in Example F-1. The photovoltaic element produced in Comparative Example F1-1 will be referred to as "SC/CF1-1".

Seven samples of the photovoltaic elements SC/F-1, as well as seven samples of the photovoltaic elements SC/CF1-1, were produced and were subjected, basically in the same way as that in Example A-1, to measurement and evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The results are shown in Table 305. The photo-degradation was measured by setting the element temperature to 42° C. and the time of photo-irradiation to 1000 hours, while the anti-environment test was conducted by setting the atmosphere temperature to 84° C. and humidity to 87%.

The performance of the photovoltaic element is shown in Table 305 in terms of values measured on the samples of the photovoltaic element SC/F-1 as normalized by the values measured on the samples of the photovoltaic element SC/CF1-1.

TABLE 305

| Items of evaluation | Evaluation |
|---|---|
| Initial photoelectric conversion efficiency characteristic | 1.29 |
| Variation of Initial photoelectric conversion efficiency characteristic | 0.89 |
| Photo-degradation characteristic | 0.88 |
| Anti-environment characteristic | 0.86 |
| SEM observation of sectional face | 0.94 |
| Measurement of adhesion: Delamination | No delamination in SC/F-1 Slight delamination in SC/CF1-1 |

From the results shown in Table 305, it will be seen that all the sample photovoltaic elements SC/F-1 in accordance with Example A-1 exhibit superiority to the sample photovoltaic elements SC/CF1-1 of Comparison Example Fl-1 in all items of evaluation.

EXAMPLE F-2

In this Example, a photovoltaic element of the tandem type shown in FIG. 2 was manufactured by using an in-line type apparatus shown in FIG. 5, in accordance with the following procedure.

(1) A substrate having a reflecting layer 201 and a reflection enhancement layer 202 formed thereon (i.e. base member), prepared in the same way as that in Example C-1, was disposed on a substrate conveyor rails 413 laid in a load chamber 401, and the internal pressure of the load chamber 401 was lowered to $1 \times 10^{-5}$ Torr. by a vacuum pump (not shown).

(2) Then, a gate valve 406 was opened and the substrate was conveyed into a conveyance chamber 402 and then into a deposition chamber 417 which have been evacuated to certain levels of vacuum by vacuum pumps which are not shown. The substrate was held such that its reverse side is kept in close contact with a substrate heater 410 so as to be heated by the heater 410, while the interior of the deposition chamber 417 was evacuated by the vacuum pump to a level of $1 \times 10^{-5}$ Torr.

(3) Preparation for film forming operation was thus completed. Then, $H_2$ gas was introduced into the deposition chamber 417 through a gas-introduction line 429 and the flow rate of the $H_2$ gas was controlled to 500 sccm by means of valves 441, 431, 430, under the control of a mass-flow controller 436. At the same time, the internal pressure of the deposition chamber 417 was regulated to 1.0 Torr. by a conductance valve (not shown). Meanwhile, the substrate heater 410 was adjusted to maintain the substrate temperature at 350° C.

(4) An RF n-layer 203 of pc-Si was formed when the substrate temperature became steady.

To this end, valves 443, 433, 444 and 434 were operated to introduce the $SiH_4$ gas and $PH_3/H_2$ gas into the deposition chamber 417 through the gas introduction line 429. Flow rates of the $SiH_4$ gas, $H_2$ gas and the $PH_3/H_2$, gas were controlled to 2 sccm, 100 sccm and 10 sccm, respectively, by means of the mass-flow controllers 438, 436 and 439, while the pressure in the deposition chamber 417 was controlled to 1.0 Torr. The power of an RF power supply 422 was set to 0.05 $W/cm^2$, and RF power was introduced from this power supply into a plasma-forming cup 420, so as to trigger a glow discharge, thereby starting formation of the RF n-layer on the substrate.

The RF power was turned off when the thickness of the RF n-layer has reached 20 nm, thus terminating the glow discharge to complete the formation of the RF n-layer. The supply of the SiH4 gas, $PH_3/H_2$ gas and $H_2$ gas into the deposition chamber 417 was stopped and the interior of the deposition chamber and the gas line were evacuated to $1\times10^{-5}$ Torr.

(5) Then, an annealing was executed in accordance with the present invention in an atmosphere of a gas containing a trace amount of oxygen atoms and trace amount of Group V element atoms under a static magnetic field.

For the purpose of executing the annealing in the gas atmosphere containing a trace amount of oxygen atoms and trace amount of Group V element atoms under the static magnetic field, $O_2$/He gas (dilution: 10 ppm) as the oxygen atom-containing gas and $PH_3/H_2$ gas (dilution 2000 ppm) as the gas containing trace amount of Group V element atoms were introduced into the deposition chamber 417 through the gas introduction line 429. The valves 442 and 432 were opened and the flow rate of the $O_2$/He gas (dilution 10 ppm) was controlled to 500 sccm by means of a mass-flow controller 437. Valves 444, 432 were opened and a mass-flow controller 439 was operated so as to maintain the flow rate of the $PH_3/H_2$ gas (dilution 2000 ppm) at 500 sccm. Then, an alnico magnet 495 of 2300 gauss having a height adjusting mechanism, serving as means for applying the static magnetic field, was installed. The pressure in the deposition chamber 417 was controlled to 1.2 Torr by a conductance valve (not shown). The annealing in accordance with the invention in a gas atmosphere containing trace amount of oxygen atoms and trace amount of Group V element atoms under the static magnetic field was conducted for 10 minutes, while the substrate heater 410 was controlled to maintain the substrate temperature at 350° C. Then, the supply of the $O_2$/He gas (dilution: 10 ppm) and the $PH_3/H_2$ gas (dilution 2000 ppm) into the deposition chamber 417 was stopped and the interior of the deposition chamber 417 and the gas line was evacuated to $1'10^{-5}$ Torr.

Then, an RF i-layer 251 of a-Si, an MW i-layer 204 of a-SiGe, an RF i-layer 261 of a-Si, an RF p-layer 205 of a-SiC, an RF n-layer 206 of $\mu$-Si, an RF i-layer 207 of a-Si and an RF p-layer 208 of a-SiC were successively formed, in accordance with the steps (6-1) to (6-8) of Example A-2, under the conditions which will be described later. A transparent conductive layer 212 was formed on the RF p-layer, followed by formation of a collector electrode 213 thereon, in accordance with the steps (7) to (9) of Example A-2.

Fabrication of the photovoltaic element of this example was thus completed. This element will be referred to as "SC/F-2". The conditions of the annealing in gas atmosphere containing trace amount of oxygen atoms and Group V element atoms under the static magnetic field in this example, as well as, the conditions of film-forming processes for forming the RF n-layer, RF i-layer, MW i-layer and RF-p layer are collectively shown in Tables 306 and 307.

TABLE 306

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP V ELEMENT ATOMS

| | |
|---|---|
| Type of gas containing oxygen atoms | $O_2$/He |
| Concentration of trace amount of oxygen atoms in whole annealing gas (ppm) | 5 |
| Type of gas containing Group V element atoms | $PH_3/H_2$ |
| Concentration of trace amount of Group V element atoms in whole annealing gas (ppm) | 1000 |
| Type of magnet | ALNICO |
| Magnetic field of intensity (G) | 2300 |
| Annealing temp. (° C.) | 350 |
| Annealing press. (Torr) | 1.2 |

TABLE 307

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer (203) | 2 | | | | 100 | 10 | | | 1.0 | | 0.05 | 350 | 20 |
| RF i-layer (251) | | 4 | | | 110 | | | | 0.7 | | 0.008 | 300 | 10 |
| MW i-layer (204) | 50 | | | 53 | 200 | | | | 0.006 | 0.10 | 0.25 | 380 | 150 |
| RF i-layer (261) | | 3 | | | 80 | | | | 0.7 | | 0.007 | 250 | 20 |
| RF p-layer (205) | | | 0.3 | | 60 | | 10 | 2 | 2.0 | | 0.07 | 230 | 10 |
| RF n-layer (206) | 2.5 | | | | 50 | 15 | | | 1.0 | | 0.04 | 225 | 10 |
| RF i-layer (207) | | 2.5 | | | 60 | | | | 0.6 | | 0.007 | 200 | 120 |
| RF p-layer (208) | | | 0.3 | | 60 | | 10 | 2 | 2.0 | | 0.07 | 170 | 10 |

Comparative Example F 2-1

A process was conducted as Comparative Example F 2-1. This process was different from Example F-2 in that it omitted the annealing conducted in the gas atmosphere containing trace amount of oxygen atoms and trace amount of Group V element atoms under the static magnetic field.

Other conditions were materially the same as those in Example F-2. The photovoltaic element produced in Comparative Example F 2-1 will be referred to as "SC/CF2-1".

Seven samples of the photovoltaic elements SC/F-2, as well as seven samples of the photovoltaic elements SC/CF2-1, were produced and were subjected, basically in the same way as Example A-1, to measurement and evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The photo-degradation was measured by setting the element temperature to 40° C., while the anti-environment test was conducted by setting the atmosphere temperature to 86° C. and humidity to 92%. The results are shown in Table 308.

The performance of the photovoltaic element is shown in Table 308 in terms of values measured on the samples of the photovoltaic element SC/F-2 as normalized by the values measured on the samples of the photovoltaic element SC/CF2-1.

TABLE 308

| Items of evaluation | Evaluation |
| --- | --- |
| Initial photoelectric conversion efficiency characteristic | 1.29 |
| Variation of Initial photoelectric conversion efficiency characteristic | 0.89 |
| Photo-degradation characteristic | 0.86 |
| Anti-environment characteristic | 0.85 |
| SEM observation of sectional face | 0.93 |
| Measurement of adhesion: Delamination | No delamination in SC/F-2 Slight delamination in SC/CF2-1 |

From the results shown in Table 308, it will be seen that all the sample photovoltaic elements SC/F-2 in accordance with Example F-2 exhibit superiority to the sample photovoltaic elements SC/CF2-1 of Comparison Example F2-1 in all items of evaluation.

EXAMPLE F-3

In this Example, a photovoltaic element of the triple type shown in FIG. 3 was manufactured by using an in-line type apparatus shown in FIG. 5, in accordance with the following procedure.

(1) A substrate having a reflecting layer 301 and a reflection enhancement layer 302 formed thereon (i.e. base member), prepared in the same way as that in Example F-1, was disposed on a substrate conveyor rails 413 laid in a load chamber 401, and the internal pressure of the load chamber 401 was lowered to $1\times10^{-5}$ Torr. by a vacuum pump (not shown).

(2) Then, gate valves 406 and 407 were opened and the substrate was conveyed into conveyance chambers 402, 403 and then into a deposition chamber 418 which had been evacuated to certain levels of vacuum by vacuum pumps which are not shown. The substrate was held such that its reverse side was kept in close contact with a substrate heater 411 so as to be heated by the heater 411, while the interior of the deposition chamber 418 was evacuated by the vacuum pump to a level of $1\times10^{-5}$ Torr.

(3) Preparation for film forming operation was thus completed. Then, $H_2$ gas was introduced into the deposition chamber 417 through a gas-introduction line 429 and the flow rate of the $H_2$ gas was controlled to 500 sccm by means of valves 441, 431, 430, under the control of a mass-flow controller 436. At the same time, the internal pressure of the deposition chamber 417 was regulated to 1.3 Torr. by a conductance valve (not shown). Meanwhile, the substrate heater 410 was adjusted to maintain the substrate temperature at 350° C. An RF n-layer 303 of $\mu c$-Si was formed when the substrate temperature has become steady.

(4) To this end, valves 443, 433, 444 and 434 were operated to introduce the $SiH_4$ gas and $PH_3/H_2$ gas into the deposition chamber 417 through the gas introduction line 429. Flow rates of the $SiH_4$ gas, $H_2$ gas and the $PH_3/H_2$ gas were controlled to 2 sccm, 100 sccm and 200 sccm, respectively, by means of the mass-flow controllers 438, 436 and 439, while the pressure in the deposition chamber 417 was controlled to 1.3 Torr. The power of an RF power supply 422 was set to 0.05 W/cm$^2$, and RF power was introduced from this power supply into a plasma-forming cup 420, so as to trigger a glow discharge, thereby starting formation of the RF n-layer on the substrate. The RF power was turned off when the thickness of the RF n-layer has reached 20 nm, thus terminating the glow discharge to complete the formation of the RF n-layer 303. The supply of the $SiH_4$ gas, $PH_3/H_2$ gas and $H_2$ gas into the deposition chamber 417 was stopped and the interior of the deposition chamber and the gas line were evacuated to $1\times10^{-5}$ Torr.

(5) Then, an annealing was executed in an atmosphere of a gas containing a trace amount of oxygen atoms and a trace amount of Group V element atoms under a static magnetic field.

For the purpose of executing the annealing in the gas atmosphere containing a trace amount of oxygen atoms and a trace amount of Group V element atoms under the static magnetic field, $O_2/Ar$ gas (dilution: 100 ppm) as the gas containing oxygen atoms and $PH_3/H_2$ gas (dilution 1000 ppm) was the gas containing trace amount of Group V element atoms were introduced into the deposition chamber 417 through the gas introduction line 429. The valves 442 and 432 were opened and the flow rate of the $O_2/Ar$ gas (dilution 100 ppm) was controlled to 500 sccm by means of a mass-flow controller 437. Valves 443, 444 were opened and a mass-flow controller 437 was operated so as to control the flow rate of $PH_3/H_2$ gas (dilution 1000 ppm) to 500 sccm. Then, an alnico magnet 495 of 1800 gauss having the height adjusting mechanism, serving as the means for applying static magnetic field, was installed and the pressure in the deposition chamber 417 was controlled to 1.6 Torr by a conductance valve (not shown). The annealing in accordance with the invention in a gas atmosphere containing trace amount of oxygen atoms and trace amount of Group V element atoms under the static magnetic field was conducted for 10 minutes, while the substrate heater 410 was controlled to maintain the substrate temperature at 350° C. Then, the alnico magnet of 1800 gauss having the height adjusting mechanism, serving as the means for applying the static magnetic field, was removed and the supply of the $O_2/Ar$ gas (dilution: 100 ppm) and the $PH_3$, $H_2$ gas (dilution 1000 ppm) into the deposition chamber 417 was stopped. Then, the interior of the deposition chamber 417 and the gas line was evacuated to $1\times10^{-5}$ Torr.

(6) Then, an RF i-layer 351 of a-Si, an MW i-layer 304 of a-SiGe, an RF i-layer 361 of a-Si, an RF p-layer 305 of a-SiC, an RF n-layer 306 of pc-Si, an RF i-layer 352 of a-Si, an MW i-layer 307 of a-SiGe, an RF i-layer 362 of a-Si, an RF p-layer 308 of a-SiC, an RF n-layer 309 of $\mu c$-Si, an RF i-layer 310 of a-Si, and an RF p-layer 311 of a-SiC were successively formed, in accordance with a procedure which is substantially the same as that used in Example F-2, i.e., in the same way as that in Example A-2.

Fabrication of the photovoltaic element of the present invention was thus completed. This element will be referred to as "SC/F-3". The conditions of the annealing conducted in gas atmosphere containing trace amount of oxygen atoms and trace amount of Group V element atoms under the static magnetic field in this example, as well as the conditions of film-forming processes for forming the RF n-layer, RF i-layer, MW i-layer and RF-p layer are collectively shown in Tables 309 and 310.

TABLE 309

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP V ELEMENT ATOMS

| | |
|---|---|
| Type of gas containing oxygen atoms | $O_2$/Ar |
| Concentration of trace amount of oxygen atoms in whole annealing gas (ppm) | 50 |
| Type of gas containing Group III element atoms | $PH_3/H_2$ |
| Concentration of trace amount of Group III element atoms in whole annealing gas (ppm) | 500 |
| Type of magnet | ALNICO |
| Magnetic field of intensity (G) | 1800 |
| Annealing temp. (° C.) | 350 |
| Annealing press. (Torr) | 1.6 |

TABLE 311

| Items of evaluation | Evaluation |
|---|---|
| Initial photoelectric conversion efficiency characteristic | 1.39 |
| Variation of Initial photoelectric conversion efficiency characteristic | 0.86 |
| Photo-degradation characteristic | 0.85 |
| Anti-environment characteristic | 0.84 |
| SEM observation of sectional face | 0.94 |
| Measurement of adhesion: Delamination | No delamination in SC/F-3 Slight delamination in SC/CF3-1 |

TABLE 310

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SiH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer (303) | 2.0 | | | | 100 | 20 | | | 1.3 | | 0.05 | 350 | 20 |
| RF i-layer (351) | | 4.0 | | | 100 | | | | 0.8 | | 0.008 | 300 | 10 |
| MW i-layer (304) | 40 | | | 41 | 130 | | | | 0.010 | 0.10 | 0.31 | 370 | 110 |
| RF i-layer (361) | | 4.0 | | | 100 | | | | 0.75 | | 0.008 | 300 | 23 |
| RF p-layer (305) | | | 0.1 | | 80 | | 9 | 2 | 1.8 | | 0.07 | 300 | 10 |
| RF n-layer (306) | 1.1 | | | | 40 | 29 | | | 1.1 | | 0.04 | 300 | 10 |
| RF i-layer (352) | | 4.0 | | | 90 | | | | 0.75 | | 0.008 | 300 | 10 |
| MW i-layer (307) | 35 | | | 26 | 140 | | | | 0.013 | 0.08 | 0.3 | 350 | 100 |
| RF i-layer (362) | | 3.5 | | | 90 | | | | 0.7 | | 0.008 | 280 | 23 |
| RF p-layer (308) | | | 0.2 | | 80 | | 9 | 2 | 1.7 | | 0.07 | 260 | 10 |
| RF n-layer (309) | 0.8 | | | | 50 | 25 | | | 1.05 | | 0.04 | 230 | 10 |
| RF i-layer (310) | | 1.5 | | | 80 | | | | 0.8 | | 0.007 | 190 | 90 |
| RF p-layer (311) | | | 0.4 | | 90 | | 8 | 2 | 1.6 | | 0.07 | 170 | 10 |

Comparative Example F 3-1

A process was conducted as Comparative Example F3-1. This process was different from Example F-3 in that it omitted the annealing conducted in the gas atmosphere containing trace amount of oxygen atoms and trace amount of Group V element atoms under the static magnetic field. Other conditions were materially the same as those in Example F-3. The photovoltaic element produced in Comparative Example F 3-1 will be referred to as "SC/CF3-1".

Seven samples of the photovoltaic elements SC/F-3, as well as seven samples of the photovoltaic elements SC/CF3-1, were produced and were subjected, basically in the same way as Example A-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The photo-degradation characteristic was measured by setting the element temperature to 43° C. The anti-environment characteristic was evaluated by setting the temperature and humidity of the atmosphere to 85° C. and 92% and the time of shelving in the dark place to 270 hours. The results are shown in Table 311.

The performance of the photovoltaic element is shown in Table 311 in terms of values measured on the samples of the photovoltaic element SC/F-3 as normalized by the values measured on the samples of the photovoltaic element SC/CF3-1.

From the results shown in Table 311, it will be seen that all the sample photovoltaic elements SC/F-3 in accordance with Example F-3 exhibit superiority to the sample photovoltaic elements SC/CF3-1 of Comparison Example CF-1 in all items of evaluation.

EXAMPLE F-4

This Example is different from Example F-3 in that the annealing was effected on the RF i-layer 351 of a-Si, in place of the RF n-layer 3G3 of μc-Si. A photovoltaic element of the triple type shown in FIG. 3 was manufactured by using an in-line type apparatus shown in FIG. 5, in accordance with the following procedure.

(1) A substrate having a reflecting layer 301 and a reflection enhancement layer 302 formed thereon (i.e. base member), prepared in the same way as that in Example C-1, was disposed on a substrate conveyor rails 413 laid in a load chamber 401, and the internal pressure of the load chamber 401 was lowered to $1\times10^{-5}$ Torr. by a vacuum pump (not shown).

(2) Then, gate valves 406 and 407 were opened and the substrate was conveyed into conveyance chambers 402, 403 and then into a deposition chamber 418 which have been evacuated to certain levels of vacuum by vacuum pumps which are not shown. The substrate was held such that its reverse side is kept in close contact with a substrate heater 411 so as to be heated by the heater 411, while the interior of the deposition chamber 418 was evacuated by the vacuum pump to a level of $1\times10^{-5}$ Torr.

(3) Preparation for film forming operation was thus completed. Then, $H_2$ gas was introduced into the deposition chamber 417 through a gas-introduction line 429 and the flow rate of the H$_2$ gas was controlled to 500 sccm by means of valves 441, 431, 430, under the control of a mass-flow controller 436. At the same time, the internal pressure of the deposition chamber 417 was regulated to 1.3 Torr. by a conductance valve (not shown). Meanwhile, the substrate heater 410 was adjusted to maintain the substrate temperature at 350° C. An RF n-layer 303 of µc-Si, an RF i-layer 351 of a-Si, an MW i-layer 304 of a-SiGe and RF i-layer 361 of a-Si were formed when the substrate temperature became steady.

(4) Then, an annealing was executed in an atmosphere of a gas containing a trace amount of oxygen atoms and a trace amount of Group V element atoms under a static magnetic field.

For the purpose of executing the annealing in the gas atmosphere containing a trace amount of oxygen atoms and a trace amount of Group V element atoms under the static magnetic field, O$_2$/Ar gas (dilution: 100 ppm) as the gas containing oxygen atoms and PF$_5$/H$_2$ gas (dilution 100 ppm) were introduced into the deposition chamber 418 through the gas introduction line 449. The valves 465 and 455 were opened and the flow rate of the O$_2$/Ar gas (dilution 100 ppm) was controlled to 500 sccm by means of a mass-flow controller 460. Valves and a mass-flow controller (not shown) were operated so as to control the flow rate of the PF$_5$/H$_2$ gas (dilution 100 ppm) to 500 sccm. Then, an alnico magnet 495 of 2200 gauss having a height adjusting mechanism, serving as means for applying static magnetic pressure, was installed and the pressure in the deposition chamber 418 was controlled to 1.4 Torr by a conductance valve (not shown). The annealing in accordance with the invention in a gas atmosphere containing trace amount of oxygen atoms and trace amount of Group V element atoms under the static magnetic field was conducted for 10 minutes, while the substrate heater 411 was controlled to maintain the substrate temperature at 300° C. Then, the alnico magnet 495 of 2200 gauss having height adjusting mechanism, serving as means for applying the static magnetic field, was removed and the supply of the O$_2$/Ar gas (dilution: 100 ppm) and PH$_5$/H$_2$ gas (dilution 100 ppm) into the deposition chamber 418 was stopped and the interior of the deposition chamber 418 and the gas line was evacuated to 1×10$^{-5}$ Torr.

(5) Then, an RF p-layer 305 of a-SiC, an RF n-layer 306 of µc-Si, an RF i-layer 352 of a-Si, an MW i-layer 307 of a-SiGe, an RF i-layer 362 of a-Si, an RF p-layer 308 of a-SiC, an RF n-layer 309 of µc-Si, an RF i-layer 310 of a-Si, and an RF p-layer 311 of a-SiC-were successively formed, in accordance with a procedure which is substantially the same as that used in Example F-2, i.e., in the same way as that in Example A-2.

(6) Then, an ITO film of 70 nm thick, serving as a transparent conductive layer 312, was formed on the RF p-layer 311 by vacuum evaporation.

(7) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of the present invention was thus completed. This element will be referred to as "SC/F-4". The conditions of the annealing conducted in gas atmosphere containing trace amount of oxygen atoms and trace amount of Group V element atoms under the static magnetic field in this example, as well as the conditions of film-forming processes for forming the RF n-layer, RF i-layer, MW i-layer and RF-p layer are collectively shown in Tables 312 and 313.

TABLE 312

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP V ELEMENT ATOMS

| | |
|---|---|
| Type of gas containing oxygen atoms | O$_2$/He |
| Concentration of trace amount of oxygen atoms in whole annealing gas (ppm) | 50 |
| Type of gas containing Group V element atoms | PH$_5$/H$_2$ |
| Concentration of trace amount of Group V element atoms in whole annealing gas (ppm) | 50 |
| Type of magnet | ALNICO |
| Magnetic field of intensity (G) | 2200 |
| Annealing temp. (° C.) | 300 |
| Annealing press. (Torr) | 1.4 |

TABLE 313

| | SiH$_4$ flow rate sccm | Si$_2$H$_6$ flow rate sccm | CH$_4$ flow rate sccm | GeH$_4$ flow rate sccm | H$_2$ flow rate sccm | PH$_3$/H$_2$ flow rate sccm | B$_2$H$_6$/H$_2$ flow rate sccm | SIH$_4$/H$_2$ flow rate sccm | Press. Torr | MW Power W/cm$^2$ | RF Power W/cm$^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 50 | | | 51 | 200 | | | | 0.010 | 0.10 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 33 | | | 28 | 160 | | | | 0.013 | 0.10 | 0.3 | 350 | 100 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 1.5 | | | 60 | | | | 0.8 | | 0.007 | 190 | 90 |
| RF p-layer | | | 0.4 | | 90 | | 8 | 2 | 1.6 | | 0.07 | 170 | 10 |

Comparative Example F 4-1

A process was conducted as Comparative Example F 4-1. This process was different from Example F-4 in that it omitted the annealing conducted in the gas atmosphere containing trace amount of oxygen atoms and trace amount of Group V element atoms under the static magnetic field.

Other conditions were materially the same as those in Example F-4. The photovoltaic element produced in Comparative Example F 4-1 will be referred to as "SC/CF4-1".

Seven samples of the photovoltaic elements SC/F-4, as well as seven samples of the photovoltaic elements SC/CF4-1, were produced and were subjected, basically in the same way as Example A-1, for evaluation of various items of performance such as initial photoelectric conversion efficiency (photo-voltage/incident photo-power), variation or lack of-uniformity of the conversion efficiency, photo-degradation, anti-environment characteristic against high-temperature and high-humidity environment, SEM observation of cut surface, and adhesion. The photo-degradation characteristic was measured by setting the element temperature to 38° C. and irradiation time to 1150 hours. The anti-environment characteristic was evaluated by setting the temperature to 86° C., the humidity to 93% and the time of shelving in the dark place to 250 hours. The results are shown in Table 314.

The performance of the photovoltaic element is shown in Table 314 in terms of values measured on the samples of the photovoltaic element SC/F-4 as normalized by the values measured on the samples of the photovoltaic element SC/CF4-1.

TABLE 314

| Items of evaluation | Evaluation |
| --- | --- |
| Initial photoelectric conversion efficiency characteristic | 1.45 |
| Variation of Initial photoelectric conversion efficiency characteristic | 0.82 |
| Photo-degradation characteristic | 0.83 |
| Anti-environment characteristic | 0.84 |
| SEM observation of sectional face | 0.93 |
| Measurement of adhesion: Delamination | No delamination in SC/F-4 Slight delamination in SC/CF4-1 |

From the results shown in Table 314, it will be seen that all the sample photovoltaic elements SC/F-4 in accordance with Example F-4 exhibit superiority to the sample photovoltaic elements SC/CF4-1 of Comparison Example CF-1 in all items of evaluation.

EXAMPLE F-5

This Example is different from Example F-3 in that the annealing was effected on the MW i-Layer 304 of a-SiGe, in place of the RF n-layer 303 of $\mu$c-Si. A photovoltaic element of the triple type shown in FIG. 3 was manufactured by using an in-lines type apparatus shown in FIG. 5, in accordance with the following procedure.

(1) A substrate having a reflecting layer 301 and a reflection enhancement layer 302 formed thereon (i.e. base member), prepared in the same way as that in Example F-1, was disposed on a substrate conveyor rails 413 laid in a load chamber 401, and the internal pressure of the load chamber 401 was lowered to $1 \times 10^{-5}$ Torr. by a vacuum pump (not shown).

(2) Then, gate valves 406 and 407 were opened and the substrate was conveyed into conveyance chambers 402, 403 and then into a deposition chamber 418 which had been evacuated to certain levels of vacuum by vacuum pumps which are not shown. The substrate was held such that its reverse side was kept in close contact with a substrate heater 411 so as to be heated by the heater 411, while the interior of the deposition chamber 418 was evacuated by the vacuum pump to a level of $1 \times 10^{-5}$ Torr.

(3) Preparation for film forming operation was thus completed. Then, $H_2$ gas was introduced into the deposition chamber 417 through a gas-introduction line 429 and the flow rate of the $H_2$ gas was controlled to 500 sccm by means of valves 441, 431, 430, under the control of a mass-flow controller 436. At the same time, the internal pressure of the deposition chamber 417 was regulated to 1.3 Torr. by a conductance valve (not shown). Meanwhile, the substrate heater 410 was adjusted to maintain the substrate temperature at 350° C. An RF n-layer 303 of pc-Si and an RF i-layer 351 of a-Si were formed when the substrate temperature has become steady.

(4) Then, an annealing was executed in an atmosphere of a gas containing a trace amount of oxygen atoms and a trace amount of Group V element atoms under a static magnetic field.

For the purpose of executing the annealing in the gas atmosphere containing a trace amount of oxygen atoms and a trace amount of Group V element atoms under the static magnetic field, $O_2/H_2$ gas (dilution: 2 ppm) as the gas containing oxygen atoms, $PH_3/H_2$ gas (dilution 8 ppm) as the gas containing trace amount of Group V element atoms, and $B_2H_6/H_2$ gas (dilution 4 ppm) as the gas containing trace amount of Group III element were introduced into the deposition chamber 418 through the gas introduction line 449. The valves 465 and 455 were opened and the flow rate of the $O_2/H_2$ gas (dilution 2 ppm) was controlled to 500 sccm by means of a mass-flow controller 460. The flow rate of the $PH_3/H_2$ gas (dilution 8 ppm) gas was controlled to 250 sccm by means of valves and a mass-flow controller which are not shown. The flow rate of the $B_2H_6/H_2$ gas (dilution 4 ppm) was also controlled to 250 sccm by means of valves and a mass-flow controller which also are not shown.

Then, an alnico magnet 495 of 1700 gauss having a height adjusting mechanism, serving as the means for applying the static magnetic field, was installed and the pressure in the deposition chamber 418 was controlled to 1.3 Torr by a conductance valve (not shown). The annealing in accordance with the invention in a gas atmosphere containing trace amount of oxygen atoms and trace amount of Group V element atoms under the static magnetic field was conducted for 10 minutes, while the substrate heater 411 was controlled to maintain the substrate temperature at 300° C. Then, the alnico magnet 495 of 1700 gauss having the height adjusting mechanism, serving as the means for applying static magnetic field, was removed and the supply of the $O_2/H_2$ gas (dilution: 2 ppm), $PH_3/H_2$ gas (dilution 8 ppm) gas and the $B_2H_6/H_2$ gas (dilution 4 ppm) into the deposition chamber 418 was stopped and the interior of the deposition chamber 418 and the gas line was evacuated to $1 \times 10^{-5}$ Torr.

Then, an MW i-layer 304 of a-SiGe, an RF i-layer 361 of a-Si, an RF p-layer 305 of a-SiC, an RF n-layer 306 of $\mu$c-Si, an RF i-layer 352 of a-Si, an MW i-layer 307 of a-SiGe, an RF i-layer 362 of a-Si, an RF p-layer 308 of a-SiC, an RF n-layer 309 of $\mu$c-Si, an RF i-layer 310 of a-Si, and an RF p-layer 311 of a-SiC were successively formed, in accordance with a procedure which is substantially the same as that used in Example F-2, i.e., in the same way as that in Example A-2.

(5) Then, an ITO film of 70 nm thick, serving as a transparent conductive layer 312, was formed on the RF p-layer 311 by vacuum evaporation.

(6) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of the present invention was thus completed. This element will be referred to as "SC/F-5". The conditions of the annealing in gas atmosphere containing trace amount of oxygen atoms and trace amount of Group V element atoms in this example, as well as the conditions of film-forming processes for forming the RF n-layer, RF i-layer, MW i-layer and RF-p layer are collectively shown in Tables 315 and 316.

TABLE 315

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP V ELEMENT ATOMS

| | |
|---|---|
| Type of gas containing oxygen atoms | $O_2/H_2$ |
| Concentration of trace amount of oxygen atoms in whole annealing gas (ppm) | 1 |
| Type of gas containing Group V element atoms | $PH_3/H_2$ |
| Concentration of trace amount of Group III element atoms in whole annealing gas (ppm) | 2 |
| Type of gas containing trace amount of Group III element atoms | $B_2H_6/H_2$ |
| Concentration of trace amount of Group III element atoms in whole annealing gas (ppm) | 1 |
| Type of magnet | ALNICO |
| Magnetic field of intensity (G) | 1700 |
| Annealing temp. (° C.) | 300 |
| Annealing press. (Torr) | 1.3 | anti-environment characteristic against high-temperature and high-humidity environment, SEM observation of cut surface, and adhesion. The photo-degradation was evaluated by setting the element temperature to 42° C. and the photo irradiation time to 1150 hours. The anti-environment characteristic was evaluated by setting the temperature to 87° C., the humidity to 92% and the time of shelving in the dark place to 250 hours. The results are shown in Table 317. The performance of the photovoltaic element is shown in Table 317 in terms of values measured on the samples of the photovoltaic element SC/F-5 as normalized by the values measured on the samples of the photovoltaic element SC/CF5-1.

TABLE 317

| Items of evaluation | Evaluation |
|---|---|
| Initial photoelectric conversion efficiency characteristic | 1.38 |
| Variation of Initial photoelectric conversion efficiency characteristic | 0.85 |
| Photo-degradation characteristic | 0.84 |
| Anti-environment characteristic | 0.84 |
| SEM observation of sectional face | 0.93 |
| Measurement of adhesion: Delamination | No delamination in SC/F-5 Slight delamination in SC/CF5-1 |

From the results shown in Table 317, it will be seen that all the sample photovoltaic elements SC/F-5 in accordance

TABLE 316

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 200 | | | 1.3 | | 0.05 | 350 | 20 |
| RF i-layer | | 4.0 | | | 100 | | | | 0.8 | | 0.008 | 300 | 10 |
| MW i-layer | 50 | | | 51 | 160 | | | | 0.010 | 0.10 | 0.31 | 370 | 110 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 32 | | | 29 | 130 | | | | 0.013 | 0.11 | 0.3 | 350 | 100 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 1.5 | | | 65 | | | | 0.8 | | 0.007 | 1900 | 90 |
| RF p-layer | | | 0.4 | | 90 | | 8 | 2 | 1.6 | | 0.07 | 170 | 10 |

Comparative Example F 5-1

A process was conducted as Comparative Example F 5-1. This process was different from Example F-5 in that it omitted the annealing conducted in the gas atmosphere containing trace amount of oxygen atoms and trace amount of Group V element atoms under the static magnetic field.

Other conditions were materially the same as those in Example F-5. The photovoltaic element produced in Comparative Example E 5-1 will be referred to as "SC/CF5-1".

Six samples of the photovoltaic elements SC/F-5, as well as six samples of the photovoltaic elements SC/CF5-1, were produced and were subjected, basically in the same way as Example A-1, for evaluation of various items of performance such as initial photoelectric conversion efficiency (photo-voltage/incident photo-power), variation or lack of uniformity of the conversion efficiency, photo-degradation, with Example F-5 exhibit superiority to the sample photovoltaic elements SC/CF5-1 of Comparison Example F5-1 in all items of evaluation.

EXAMPLE F-6

This Example is different from Example F-3 in that the annealing was effected on the RF i-layer 361 of a-Si, in place of the RF n-layer 303 of $\mu$c-Si. A photovoltaic element of the triple type shown in FIG. 3 was manufactured by using an in-line type apparatus shown in FIG. 5, in accordance with the following procedure.

(1) A substrate having a reflecting layer 301 and a reflection enhancement layer 302 formed thereon (i.e. base member), prepared in the same way as that in Example F-1, was disposed on a substrate conveyor rails 413 laid in a load chamber 401, and the internal pressure of the load chamber 401 was lowered to $1\times10^{-5}$ Torr. by a vacuum pump (not shown).

(2) Then, gate valves 406 and 407 were opened and the substrate was conveyed into conveyance chambers 402, 403 and then into a deposition chamber 418 which had been evacuated to certain levels of vacuum by vacuum pumps which are not shown. The substrate was held such that its reverse side is kept in close contact with a substrate heater 411 so as to be heated by the heater 411, while the interior of the deposition chamber 418 was evacuated by the vacuum pump to a level of 1×10$^{-5}$ Torr.

(3) Preparation for film forming operation was thus completed. Then, H$^2$ gas was introduced into the deposition chamber 417 through a gas-introduction line 429 and the flow rate of the H$_2$ gas was controlled to 500 sccm by means of valves 441, 431, 430, under the control of a mass-flow controller 436. At the same time, the internal pressure of the deposition chamber 417 was regulated to 1.3 Torr. by a conductance valve (not shown). Meanwhile, the substrate heater 410 was adjusted to maintain the substrate temperature at 350° C. An RF n-layer 303 of μc-Si, an RF i-layer 351 of a-Si, an MW i-layer 304 of a-SiGe and an RF i-layer 361 of a-Si were formed when the substrate temperature has become steady.

(4) Then, an annealing was executed in an atmosphere of a gas containing a trace amount of oxygen atoms and a trace amount of Group V element atoms under a static magnetic field.

For the purpose of executing the annealing in the gas atmosphere containing a trace amount of oxygen atoms and a trace amount of Group V element atoms under the static magnetic field, O$^2$/He gas (dilution: 2 ppm) as the gas containing oxygen atoms, PF$_5$/H$_2$ gas (dilution 8 ppm) as the gas containing Group V element atoms and BF$_3$/H$_2$ gas (dilution 4 ppm) as the gas containing trace amount of Group III element atoms were introduced into the deposition chamber 418 through the gas introduction line 449. The valves 465 and 455 were opened and the flow rate of the O$_2$/He gas (dilution 2 ppm) was controlled to 500 sccm by means of a mass-flow controller 460. The flow rate of the PF$_5$/H$_2$ gas (dilution 8 ppm) gas also was regulated to 250 sccm by valves and a mass-flow controller (not shown). The flow rate of the BF$_3$/H$_2$ gas (dilution 4 ppm) also was regulated to 250 sccm by valves and a mass-flow controller (not shown).

Then, an alnico magnet 495 of 1500 gauss having a height adjusting mechanism, serving as the means for applying the static magnetic field, was installed and the pressure in the deposition chamber 418 was controlled to 1.2 Torr by a conductance valve (not shown). The annealing in accordance with the invention in a gas atmosphere containing trace amount of oxygen atoms and trace amount of Group V element atoms under the static magnetic field was conducted for 10 minutes, while the substrate heater 411 was controlled to maintain the substrate temperature at 300° C. Then, alnico magnet 495 of 1500 gauss having the height adjusting mechanism, serving as means for applying the static magnetic field, was removed and the supply of the O$_2$/He gas (dilution: 2 ppm), PF$_5$/H$_2$ gas (dilution 8 ppm) gas and the BF$_3$/H$_2$ gas (dilution 4 ppm) into the deposition chamber 418 was stopped and the interior of the deposition chamber 418 and the gas line was evacuated to 1×10$^{-5}$ Torr.

Then, an RF i-layer 361 of a-Si, an RF p-layer 305 of a-SiC, an RF n-layer 306 of μp-Si, an RF i-layer 352 of a-Si, an MW i-layer 307 of a-SiGe, an RF i-layer 362 of a-Si, an RF p-layer 308 of a-SiC, an RF n-layer 309 of μp-Si, an RF i-layer 310 of a-Si, and an RF p-layer 311 of a-SiC were successively formed, in accordance with a procedure which is substantially the same as that used in Example F-2, i.e., in the same way as that in Example A-2.

(5) Then, an ITO film of 70 nm thick, serving as a transparent conductive layer 312, was formed on the RF p-layer 311 by vacuum evaporation.

(6) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of this example was thus completed. This element will be referred to as "SC/F-6". The conditions of the annealing conducted in gas atmosphere containing trace amount of oxygen atoms and trace amount of Group V element atoms under the static magnetic field in this example, as well as the conditions of film-forming processes for forming the RF n-layer, RF i-layer, MW i-layer and RF-p layer are collectively shown in Tables 318 and 319.

TABLE 318

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP V ELEMENT ATOMS

| | |
|---|---|
| Type of gas containing oxygen atoms | O$_2$/He |
| Concentration of trace amount of oxygen atoms in whole annealing gas (ppm) | 1 |
| Type of gas containing Group V element atoms | PF$_3$/H$_2$ |
| Concentration of trace amount of Group III element atoms in whole annealing gas (ppm) | 2 |
| Type of gas containing trace amount of Group III element atoms | BF$_3$/H$_2$ |
| Concentration of trace amount of Group III element atoms in whole annealing gas (ppm) | 1 |
| Type of magnet | ALNICO |
| Magnetic field of intensity (G) | 1500 |
| Annealing temp. (° C.) | 320 |
| Annealing press. (Torr) | 1.2 |

TABLE 319

| | SiH$_4$ flow rate sccm | Si$_2$H$_6$ flow rate sccm | CH$_4$ flow rate sccm | GeH$_4$ flow rate sccm | H$_2$ flow rate sccm | PH$_3$/H$_2$ flow rate sccm | B$_2$H$_6$/H$_2$ flow rate sccm | SIH$_4$/H$_2$ flow rate sccm | Press. Torr | MW Power W/cm$^2$ | RF Power W/cm$^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 47 | | | 51 | 135 | | | | 0.010 | 0.09 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 31 | | | 27 | 130 | | | | 0.013 | 0.08 | 0.3 | 350 | 98 |

TABLE 319-continued

| | SiH$_4$ flow rate sccm | Si$_2$H$_6$ flow rate sccm | CH$_4$ flow rate sccm | GeH$_4$ flow rate sccm | H$_2$ flow rate sccm | PH$_3$/H$_2$ flow rate sccm | B$_2$H$_6$/H$_2$ flow rate sccm | SIH$_4$/H$_2$ flow rate sccm | Press. Torr | MW Power W/cm$^2$ | RF Power W/cm$^2$ | Substrate temp. ° C. | Film thickness nm |
|---|---|---|---|---|---|---|---|---|---|---|---|---|---|
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | | |
| RF n-layer | 0.8 | | | | 50 | 250 | | | 1.05 | | 0.04 | 230 | 10 |
| RF i-layer | | 2.0 | | | 70 | | | | 0.8 | | 0.007 | 190 | 90 |
| RF p-layer | | | 0.4 | | 90 | | 8 | 2 | 1.6 | | 0.07 | 170 | 10 |

Comparative Example F 6-1

A process was conducted as Comparative Example F6-1. This process was different from Example F-6 in that it omitted the annealing conducted in the gas atmosphere containing trace amount of oxygen atoms and trace amount of Group V element atoms under the static magnetic field.

Other conditions were materially the same as those in Example F-6. The photovoltaic element produced in Comparative Example F 6-1 will be referred to as "SC/CF6-1".

Six samples of the photovoltaic elements SC/F-6, as well as six samples of the photovoltaic elements SC/CF6-1, were produced and were subjected, basically in the same way as Example A-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The photo-degradation was evaluated by setting the element temperature to 42° C. and the photo-Irradiation time to 1150 hours. The anti-environment characteristic was evaluated by setting the temperature to 87° C., the humidity to 92% and the time of shelving in the dark place to 250 hours. The results are shown in Table 320.

The performance of the photovoltaic element is shown in Table 320 in terms of values measured on the samples of the photovoltaic element SC/F-6 as normalized by the values measured on the samples of the photovoltaic element SC/CF6-1.

TABLE 320

| Items of evaluation | Evaluation |
|---|---|
| Initial photoelectric conversion efficiency characteristic | 1.48 |
| Variation of Initial photoelectric conversion efficiency characteristic | 0.83 |
| Photo-degradation characteristic | 0.84 |
| Anti-environment characteristic | 0.84 |
| SEM observation of sectional face | 0.93 |
| Measurement of adhesion: Delamination | No delamination in SC/F-6 Slight delamination in SC/CF6-1 |

From the results shown in Table 320, it will be seen that all the sample photovoltaic elements SC/F-6 in accordance with Example F-6 exhibit superiority to the sample photovoltaic elements SC/CF6-1 of Comparison Example F6-1 in all items of evaluation.

EXAMPLE F-7

This Example is different from Example F-2 in that the annealing was effected on the RF p-layer 205 of a- SiC, in place of the RF n-layer 203 of μp-Si. A photovoltaic element of tandem type shown in FIG. 2 was manufactured by using an in-line type apparatus shown in FIG. 5, in accordance with the following procedure.

(1) A substrate having a reflecting layer 201 and a reflection enhancement layer 202 formed thereon (i.e. base member), prepared in the same way as that in Example F-1, was disposed on a substrate conveyor rails 413 laid in a load chamber 401, and the internal pressure of the load chamber 401 was lowered to 1×10$^{-5}$ Torr. by a vacuum pump (not shown).

(2) Then, the gate valve 406 was opened and the substrate was conveyed into the conveyance chamber 402 and the deposition chamber 417 which had been evacuated to certain levels of vacuum by vacuum pumps which are not shown. The substrate was held such that its reverse side was kept in close contact with a substrate heater 410 so as to be heated by the heater 410, while the interior of the deposition chamber 417 was evacuated by the vacuum pump to a level of 1×10$^{-5}$ Torr.

(3) Preparation for film forming operation was thus completed. Then, H$_2$ gas was introduced into the deposition chamber 417 through a gas-introduction line 429 and the flow rate of the H$_2$ gas was controlled to 500 sccm by means of valves 441, 431, 430, under the control of a mass-flow controller 436. At the same time, the internal pressure of the deposition chamber 417 was regulated to 1.0 Torr. by a conductance valve (not shown). Meanwhile, the substrate heater 410 was adjusted to maintain the substrate temperature at 350° C. An RF n-layer 203 of μc-Si, an RF i-layer 251 of a-Si, an MW i-layer 204 of a-SiGe, an RF i-layer 261 of a-Si and an RF P-layer 205 of a-SiC were formed in the same method as that in Example F-2, when the substrate temperature became steady.

(4) Then, an annealing was executed in an atmosphere of a gas containing a trace amount of oxygen atoms and a trace amount of Group V element atoms under a static magnetic field.

For the purpose of executing the annealing in the gas atmosphere containing a trace amount of oxygen atoms and Group V element atoms in the static magnetic field, O$_2$/H$_2$ gas (dilution: 2000 ppm) as the gas containing oxygen atoms, PH$_3$/H$_2$ gas (dilution 2000 ppm) as the gas containing trace amount of Group V element atoms and B$_2$H$_6$/H$_2$ gas (dilution 2000 ppm) as the gas containing trace amount of Group III element atoms were introduced into the deposition chamber 418 through the gas introduction line 429. The valves 442 and 432 were opened and the flow rate of the $O_2/H_2$ gas (dilution 2000 ppm) was controlled to 500 sccm by means of a mass-flow controller 436. The flow rate of the $PH_3/H_2$ gas (dilution 2000 ppm) was regulated to 250 sccm by means of valves and a mass-flow controller which are not shown. The flow rate of the $B_2H_6/H_2$ gas (dilution 2000 ppm) also was regulated to 250 sccm by means of valves and a mass-flow controller which are not shown.

Then, an alnico magnet 495 of 1400 gauss having height adjusting mechanism, serving as means for applying the static magnetic field, was installed and the pressure in the deposition chamber 417 was controlled to 1.5 Torr by a conductance valve (not shown). The annealing in accordance with the invention in a gas atmosphere containing trace amount of oxygen atoms and trace amount of Group V element atoms under the static magnetic field was conducted for 10 minutes, while the substrate heater 410 was controlled to maintain the substrate temperature at 225° C. Then, the alnico magnet 495 of 1400 gauss having the height adjusting mechanism, serving as the means for applying the static magnetic field, was removed and the supply of the $O_2/H_2$ gas (dilution: 2000 ppm), $PH_2/H_2$ gas (dilution 2000 ppm) and the $B_2H_6/H_2$ gas (dilution 2000 ppm) into the deposition chamber 417 was stopped. The interior of the deposition chamber 417 and the gas line was then evacuated to $1\times10^{-5}$ Torr.

(5) Then, an RF n-layer 206 of $\mu$c-Si, an RF i-layer 207 of a-Si and an RF p-layer 208 of a-SiC were successively formed, in accordance with a procedure which is substantially the same as that used in Example F-2.

(6) Then, an ITO film of 70 nm thick, serving as a transparent conductive layer 212, was formed on the RF p-layer 208 by vacuum evaporation.

(7) A mask having comb-shaped aperture was placed on the transparent electrode 212 and a comb-shaped collector electrode 213 of Cr(40 nm)/Ag(1000 nm)/Cr(40 nm) was formed by vacuum evaporation.

Fabrication of the photovoltaic element of this example was thus completed. This element will be referred to as "SC/F-7". The conditions of the annealing in gas atmosphere containing trace amount of oxygen atoms and trace amount of Group V element atoms in this example, as well as the conditions of film-forming processes for forming the RF n-layer, RF i-layer, MW i-layer and RF-p layer are collectively shown in Tables 321 and 322.

TABLE 321

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP V ELEMENT ATOMS

| | |
|---|---|
| Type of gas containing oxygen atoms | $O_2/H_2$ |
| Concentration of trace amount of oxygen atoms in whole annealing gas (ppm) | 1000 |
| Type of gas containing Group V element atoms | $PH_3/H_2$ |
| Concentration of trace amount of Group III element atoms in whole annealing gas (ppm) | 500 |
| Type of gas containing trace amount of Group III element atoms | $B_2H_6/H_2$ |
| Concentration of trace amount of Group III element atoms in whole annealing gas (ppm) | 500 |
| Type of magnet | ALNICO |
| Magnetic field of intensity (G) | 1400 |
| Annealing temp. (° C.) | 225 |
| Annealing press. (Torr) | 1.4 |

TABLE 322

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2 | | | | 100 | 200 | | | 1.0 | | 0.05 | 350 | 20 |
| RF i-layer | | 4 | | | 110 | | | | 0.7 | | 0.008 | 300 | 10 |
| MW i-layer | 48 | | | 52 | 230 | | | | 0.006 | 0.08 | 0.30 | 380 | 150 |
| RF i-layer | | 3 | | | 80 | | | | 0.7 | | 0.007 | 250 | 20 |
| RF p-layer | | | 0.3 | | 60 | | 10 | 2 | 2.0 | | 0.07 | 230 | 10 |
| RF n-layer | 2.5 | | | | 50 | 250 | | | 1.0 | | 0.04 | 225 | 10 |
| RF i-layer | | 2.2 | | | 85 | | | | 0.5 | | 0.007 | 200 | 120 |
| RF p-layer | | | 0.3 | | 60 | | 10 | 2 | 2.0 | | 0.07 | 170 | 10 |

Comparative Example F 7-1

A process was conducted as Comparative Example F 7-1. This process was different from Example F-7 in that it omitted the annealing conducted in the gas atmosphere containing trace amount of oxygen atoms and trace amount of Group V element atoms under the static magnetic field.

Other conditions were materially the same as those in Example F-7. The photovoltaic element produced in Comparative Example F 7-1 will be referred to as "SC/CF7-1".

Seven samples of the photovoltaic elements SC/F-7, as well as seven samples of the photovoltaic elements SC/CF7-1, were produced and were subjected, basically in the same way as Example A-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The photo-degradation was evaluated by setting the element temperature to 43° C.

and the photo-irradiation time to 1050 hours, while the anti-environment characteristic was evaluated by setting the temperature to 88° C., the humidity to 92% and the time of shelving in the dark place to 250 hours. The results are shown in Table 323.

The performance of the photovoltaic element is shown in Table 323 in terms of values measured on the samples of the photovoltaic element SC/F-7 as normalized by the values measured on the samples of the photovoltaic element SC/CF7-1.

TABLE 323

| Items of evaluation | Evaluation |
|---|---|
| Initial photoelectric conversion efficiency characteristic | 1.51 |
| Variation of Initial photoelectric conversion efficiency characteristic | 0.84 |
| Photo-degradation characteristic | 0.82 |
| Anti-environment characteristic | 0.84 |
| SEM observation of sectional face | 0.93 |
| Measurement of adhesion: Delamination | No delamination in SC/F-7 Slight delamination in SC/CF7-1 |

From the results shown in Table 323, it will be seen that all the sample photovoltaic elements SC/F-7 in accordance with Example F-7 exhibit superiority to the sample photovoltaic elements SC/CF7-1.

In this example, a triple type photovoltaic element as shown in FIG. 3 was produced by using the in-line type apparatus shown in FIG. 5. The process was materially the same as that in Example F-3, except that annealing conditions as shown in Table 324 and production conditions as shown in Table 325 were used. Ten sample elements were produced while varying the concentration of oxygen atoms-containing gas between 0.3 ppm and 2000 ppm.

TABLE 324

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP V ELEMENT ATOMS

| | |
|---|---|
| Type of gas containing oxygen atoms | $O_2/H_2$ |
| Concentration of trace amount of oxygen atoms in whole annealing gas (ppm) | 0.3–2000 |
| Type of gas containing Group V element atoms | $PH_3/H_2$ |
| Concentration of trace amount of Group V element atoms in whole annealing gas (ppm) | 4 |
| Type of magnet | ALNICO |
| Magnetic field intensity (G) | 1200 |
| Annealing temp. (° C.) | 320 |
| Annealing press. (Torr) | 1.3 |

TABLE 325

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 48 | | | 51 | 145 | | | | 0.010 | 0.11 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 32 | | | 27 | 120 | | | | 0.011 | 0.08 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.5 | | | 70 | | | | 0.8 | | 0.007 | 190 | 90 |
| RF p-layer | | | 0.4 | | 90 | | 8 | 2 | 1.6 | | 0.07 | 170 | 10 |

EXAMPLE F-8

This example is different from Example F-3 in that the concentration of the gas containing trace amount of oxygen atoms in the annealing gas containing trace amount of oxygen atoms and trace amount of Group V element atoms used in the annealing under the static magnetic field was varied within the range of between 0.3 ppm and 2000 ppm, for the purpose of investigating the influence of the gas concentration on the performance such as the initial photoelectric conversion efficiency. $H_2$ gas was used as the diluting gas for determining the concentration of the gas containing trace amount of oxygen atoms and the concentration of the gas containing trace amount of Group V element atoms.

These ten samples were subjected to evaluation of performance of various items in the same way as that in Example F-3. Results of evaluation on each of the ten samples are shown in Table 326. The evaluation was made by normalizing the measurement results of the samples with the values measured on the sample which was produced by using the annealing gas containing trace amount of oxygen atoms having the concentration of 0.3 ppm. A mark x indicates that the normalized value is not less than 1.0 but below 1.4, a mark Δ indicates that the normalized value is not less than 1.4 but below 1.8 and a mark o indicates that the normalized value is not less than 1.8.

From Table 326, it is understood that the concentration of the oxygen atom-containing gas, which is used in the annealing conducted in the atmosphere containing trace amount of oxygen atoms and trace amount of Group V element atoms under the static magnetic field, most preferably ranges from 1 ppm to 1000 ppm with respect to the whole annealing gas (total amount of diluting $H_2$ gas in this example), in order to obtain good results in regard to the initial photoelectric conversion efficiency, variation of the efficiency, photo-degradation, anti-environment characteristic against high-temperature, high-humidity atmosphere, and adhesion.

TABLE 326

| | Concentration of trace amount of oxygen atoms: ppm | | | | | | | | | |
|---|---|---|---|---|---|---|---|---|---|---|
| | 0.3 | 0.8 | 1 | 10 | 100 | 500 | 1000 | 1050 | 1300 | 2000 |
| Initial photoelectric conversion characteristic | x | Δ | ○ | ○ | ○ | ○ | ○ | x | x | x |
| Variation of characteristic | x | Δ | ○ | ○ | ○ | ○ | ○ | x | x | x |
| Photo-degradation characteristic | x | x | ○ | ○ | ○ | ○ | ○ | Δ | x | x |
| Anti-environment characteristic | x | Δ | ○ | ○ | ○ | ○ | ○ | Δ | x | x |
| Adhesion | x | x | ○ | ○ | ○ | ○ | ○ | Δ | x | x |

EXAMPLE F-9

This example is different from Example F-3 in that the concentration of the gas containing trace amount of oxygen atoms used in the annealing was varied within the range of between 0.3 ppm and 2000 ppm, for the purpose of investigating the influence of the gas concentration on the performance such as the initial photoelectric conversion efficiency. He gas was used as the diluting gas for determining the concentration of the gas containing trace amount of oxygen atoms and the concentration of the gas containing trace amount of Group V element atoms in accordance with the invention.

In this example, a triple type photovoltaic element of the type shown in FIG. 3 was produced by using the in-line type apparatus shown in FIG. 5. The process was materially the same as that in Example F-3, except that annealing conditions as shown in Table 327 and production conditions as shown in Table 328 were used. Ten sample elements were produced while varying the concentration of oxygen atoms-containing gas between 0.3 ppm and 2000 ppm.

TABLE 327

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP V ELEMENT ATOMS

| | |
|---|---|
| Type of gas containing oxygen atoms | $O_2$/He |
| Concentration of trace amount of oxygen atoms in whole annealing gas (ppm) | 0.3–2000 |
| Type of gas containing Group V element atoms | $PH_3$/He |
| Concentration of trace amount of Group V element atoms in whole annealing gas (ppm) | 3 |

TABLE 327-continued

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP V ELEMENT ATOMS

| | |
|---|---|
| Type of magnet | ALNICO |
| Magnetic field intensity (G) | 1300 |
| Annealing temp. (° C.) | 330 |
| Annealing press. (Torr) | 1.2 |

TABLE 328

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 46 | | | 49 | 230 | | | | 0.010 | 0.10 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 29 | | | 27 | 160 | | | | 0.008 | 0.09 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 60 | | | | 0.8 | | 0.007 | 190 | 90 |
| RF p-layer | | | 0.4 | | 90 | | 8 | 2 | 1.6 | | 0.07 | 170 | 10 |

These ten samples were subjected to evaluation of performance in the same way as that in Example F-3. Results of evaluation on each of the ten samples are shown in Table 329. The evaluation was made by normalizing the values measured on the respective samples with the values measured on the sample which was produced by using the annealing gas containing trace amount of oxygen atoms having the concentration of 0.3 ppm. A mark x indicates that the normalized value is not less than 1.0 but below 1.4, a mark Δ indicates that the normalized value is not less than 1.4 but below 1.8 and a mark ○ indicates that the normalized value is not less than 1.8.

From Table 329, it is understood that the concentration of the oxygen atom-containing gas, which is used in the atmosphere gas of the annealing containing trace amount of oxygen atoms and trace amount of Group V element atoms, most preferably ranges from .1 ppm to 1000 ppm with respect to the whole annealing gas (total diluting He gas in this case), in order to obtain good results in regard to the initial photoelectric conversion efficiency, variation of the efficiency, photo-degradation, anti-environment characteristic against high-temperature, high-humidity atmosphere, and adhesion.

TABLE 329

| | Concentration of trace amount of oxygen atoms: ppm | | | | | | | | | |
|---|---|---|---|---|---|---|---|---|---|---|
| | 0.3 | 0.8 | 1 | 10 | 100 | 500 | 1000 | 1050 | 1300 | 2000 |
| Initial photoelectric conversion characteristic | x | Δ | ○ | ○ | ○ | ○ | ○ | Δ | x | x |
| Variation of characteristic | x | x | ○ | ○ | ○ | ○ | ○ | Δ | x | x |
| Photo-degradation characteristic | x | Δ | ○ | ○ | ○ | ○ | ○ | x | x | x |
| Anti-environment characteristic | x | Δ | ○ | ○ | ○ | ○ | ○ | Δ | x | x |
| Adhesion | x | Δ | ○ | ○ | ○ | ○ | ○ | Δ | x | x |

EXAMPLE F-10

This example is different from Example F-3 in that the concentration of the gas containing trace amount of oxygen atoms used in the annealing atmosphere was varied within the range of between 0.3 ppm and 2000 ppm, for the purpose of investigating the influence of the gas concentration on the performance such as the initial photoelectric conversion efficiency. Ar gas was used as the diluting gas for determining the concentration of the gas containing trace amount of oxygen atoms and the concentration of the gas containing trace amount of Group V element atoms.

In this example, a triple type photovoltaic element of FIG. 3 was produced by using the in-line type apparatus shown in FIG. 5. The process were materially the same as that in Example F-3, except that annealing conditions as shown in Table 330 and production conditions as shown in Table 331 were used. Ten sample elements were produced while varying the concentration of oxygen atoms-containing gas between 0.3 ppm and 2000 ppm.

TABLE 330

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP V ELEMENT ATOMS

| | |
|---|---|
| Type of gas containing oxygen atoms | $O_2/Ar$ |
| Concentration of trace amount of oxygen atoms in whole annealing gas (ppm) | 0.3–2000 |
| Type of gas containing Group III element atoms | $PH_3/Ar$ |
| Concentration of trace amount of Group III element atoms in whole annealing gas (ppm) | 2 |

TABLE 330-continued

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP V ELEMENT ATOMS

| | |
|---|---|
| Type of magnet | ALNICO |
| Magnetic field intensity (G) | 1500 |
| Annealing temp. (° C.) | 300 |
| Annealing press. (Torr) | 1.4 |

TABLE 331

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 47 | | | 51 | 180 | | | | 0.010 | 0.10 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 29 | | | 28 | 160 | | | | 0.008 | 0.08 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 70 | | | | 0.8 | | 0.007 | 190 | 90 |
| RF p-layer | | | 0.4 | | 90 | | 8 | 2 | 1.6 | | 0.07 | 170 | 10 |

These ten samples were subjected to evaluation of performance in the same way as that in Example F-3. Results of evaluation on each of the ten samples are shown in Table 332. The evaluation was made by normalizing the values measured on the respective samples with the values measured on the sample which was produced by using the annealing gas containing trace amount of oxygen atoms having the concentration of 0.3 ppm. A mark x indicates that the normalized value is not less than 1.0 but below 1.4, a mark Δ indicates that the normalized value is not less than 1.4 but below 1.8 and a mark ○ indicates that the normalized value is not less than 1.8.

From Table 332, it is understood that the concentration of the oxygen atom-containing gas, which is used in the annealing conducted in an atmosphere containing trace amount of oxygen atoms and trace amount of Group V element atoms under the static magnetic field, most preferably ranges from 1 ppm to 1000 ppm with respect to the whole annealing gas (Total diluting Ar gas in this case), in order to obtain good results in regard to the initial photoelectric conversion efficiency, variation of the efficiency, photo-degradation, anti-environment characteristic against high-temperature, high-humidity atmosphere, and adhesion.

oxygen atoms and the concentration of the gas containing trace amount of Group V element atoms used in the annealing under the static magnetic field.

In this example, a triple type photovoltaic element of FIG. 3 was produced by using the in-line type apparatus shown in FIG. 5. The process was materially the same as that in Example F-3, except that annealing conditions as shown in Table 333 and production conditions as shown in Table 334 were used. Ten sample elements were produced while varying the concentration of the gas containing trace amount of Group V element atoms between 0.3 ppm and 2000 ppm.

TABLE 333

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP V ELEMENT ATOMS

| | |
|---|---|
| Type of gas containing oxygen atoms | $O_2/H_2$ |
| Concentration of trace amount of oxygen atoms in whole annealing gas (ppm) | 3 |
| Type of gas containing Group V element atoms | $PH_3/H_2$ |
| Concentration of trace amount of Group V element atoms in whole annealing gas (ppm) | 0.3–2000 |

TABLE 332

| | Concentration of trace amount of oxygen atoms: ppm | | | | | | | | | |
|---|---|---|---|---|---|---|---|---|---|---|
| | 0.3 | 0.8 | 1 | 10 | 100 | 500 | 1000 | 1050 | 1300 | 2000 |
| Initial photoelectric conversion characteristic | x | Δ | ○ | ○ | ○ | ○ | ○ | x | x | x |
| Variation of characteristic | x | x | ○ | ○ | ○ | ○ | ○ | Δ | x | x |
| Photo-degradation characteristic | x | x | ○ | ○ | ○ | ○ | ○ | Δ | x | x |
| Anti-environment characteristic | x | Δ | ○ | ○ | ○ | ○ | ○ | x | x | x |
| Adhesion | x | Δ | ○ | ○ | ○ | ○ | ○ | Δ | x | x |

EXAMPLE F-11

This example is different from Example F-3 in that the concentration of the gas containing trace amount of Group V element atoms used in the atmosphere of annealing under the static magnetic field was varied within the range of between 0.3 ppm and 2000 ppm, for the purpose of investigating the influence of the gas concentration on the performance such as the initial photoelectric conversion efficiency,. $H_2$ gas was used as the diluting gas for varying the concentration of the gas containing trace amount of TABLE 333-continued CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP V ELEMENT ATOMS

| | |
|---|---|
| Type of magnet | ALNICO |
| Magnetic field intensity (G) | 1100 |
| Annealing temp. (° C.) | 310 |
| Annealing press. (Torr) | 1.1 |

TABLE 334

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 47 | | | 52 | 160 | | | | 0.010 | 0.10 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 29 | | | 29 | 180 | | | | 0.008 | 0.10 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |

TABLE 334-continued

| | SiH₄ flow rate sccm | Si₂H₆ flow rate sccm | CH₄ flow rate sccm | GeH₄ flow rate sccm | H₂ flow rate sccm | PH₃/H₂ flow rate sccm | B₂H₆/H₂ flow rate sccm | SIH₄/H₂ flow rate sccm | Press. Torr | MW Power W/cm² | RF Power W/cm² | Substrate temp. ° C. | Film thickness nm |
|---|---|---|---|---|---|---|---|---|---|---|---|---|---|
| RF i-layer | 2.0 | | | | 65 | | | | 0.8 | | 0.007 | 190 | 90 |
| RF p-layer | | 0.4 | | | 90 | 8 | 2 | | 1.6 | | 0.07 | 170 | 10 |

These ten samples were subjected to evaluation of performance in the same way as that in Example F-3. Results of evaluation on each of the ten samples are shown in Table 335. The evaluation was made by normalizing the values measured on the respective samples with the values measured on the sample which was produced by using the gas containing trace amount of Group V element atoms having the concentration of 0.3 ppm. A mark x indicates that the normalized value is not less than 1.0 but below 1.4, a mark Δ indicates that the normalized value is not less than 1.4 but below 1.8 and a mark ○ indicates that the normalized value is not less than 1.8.

From Table 335, it is understood that the concentration of the gas containing trace amount of Group V element atoms, which is used in the atmosphere of the annealing conducted in the atmosphere containing trace amount of oxygen atoms and trace amount of Group V element atoms under the static magnetic field, most preferably ranges from 1 ppm to 1000 ppm with respect to the whole annealing gas (Total diluting H₂ gas in this case), in order to obtain good results in regard to the initial photoelectric conversion efficiency, variation of the efficiency, photo-degradation, anti-environment characteristic against high-temperature, high-humidity atmosphere, and adhesion.

TABLE 335

| | Concentration of trace amount of oxygen atoms: ppm | | | | | | | | | |
|---|---|---|---|---|---|---|---|---|---|---|
| | 0.3 | 0.8 | 1 | 10 | 100 | 500 | 1000 | 1050 | 1300 | 2000 |
| Initial photoelectric conversion characteristic | x | Δ | ○ | ○ | ○ | ○ | ○ | x | x | x |
| Variation of characteristic | x | x | ○ | ○ | ○ | ○ | ○ | Δ | x | x |
| Photo-degradation characteristic | x | x | ○ | ○ | ○ | ○ | ○ | Δ | x | x |
| Anti-environment characteristic | x | Δ | ○ | ○ | ○ | ○ | ○ | Δ | x | x |
| Adhesion | x | Δ | ○ | ○ | ○ | ○ | ○ | x | x | x |

EXAMPLE F-12

This example is different from Example F-3 in that the concentration of the gas containing trace amount of Group V element atoms used in the annealing under the static magnetic field was varied within the range of between 0.3 ppm and 2000 ppm, for the purpose of investigating the influence of the gas concentration on the performance such as the initial photoelectric conversion efficiency. He gas was used as the diluting gas for determining the concentration of the gas containing trace amount of oxygen atoms and the gas containing trace amount of Group V element atoms used in the annealing conducted in the static magnetic field.

In this example, a triple type photovoltaic element of FIG. 3 was produced by using the in-line type apparatus shown in FIG. 5. The process was materially the same as that in Example F-3, except that annealing conditions as shown in Table 336 and production conditions as shown in Table 337 were used. Ten sample elements were produced while varying the concentration of the gas containing trace amount of Group V element atoms between 0.3 ppm and 2000 ppm.

TABLE 336

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP V ELEMENT ATOMS

| | |
|---|---|
| Type of gas containing oxygen atoms | O₂/He |
| Concentration of trace amount of oxygen atoms in whole annealing gas (ppm) | 3 |
| Type of gas containing Group V element atoms | PH₃/H₂ |
| Concentration of trace amount of Group V element atoms in whole annealing gas (ppm) | 0.3–2000 |

TABLE 336-continued

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP V ELEMENT ATOMS

| | |
|---|---|
| Type of magnet | ALNICO |
| Magnetic field intensity (G) | 1500 |
| Annealing temp. (° C.) | 280 |
| Annealing press. (Torr) | 1.1 |

TABLE 337

|  | SiH₄ flow rate sccm | Si₂H₆ flow rate sccm | CH₄ flow rate sccm | GeH₄ flow rate sccm | H₂ flow rate sccm | PH₃/H₂ flow rate sccm | B₂H₆/H₂ flow rate sccm | SIH₄/H₂ flow rate sccm | Press. Torr | MW Power W/cm² | RF Power W/cm² | Substrate temp. °C. | Film thickness nm |
|---|---|---|---|---|---|---|---|---|---|---|---|---|---|
| RF n-layer | 2.0 |  |  |  | 100 | 220 |  |  | 1.3 |  | 0.05 | 350 | 20 |
| RF i-layer |  | 4.0 |  |  | 100 |  |  |  | 0.8 |  | 0.008 | 300 | 10 |
| MW i-layer | 46 |  |  | 50 | 140 |  |  |  | 0.010 | 0.10 | 0.31 | 370 | 100 |
| RF i-layer |  | 4.0 |  |  | 100 |  |  |  | 0.75 |  | 0.008 | 300 | 23 |
| RF p-layer |  |  | 0.1 |  | 80 |  | 9 | 2 | 1.8 |  | 0.07 | 300 | 10 |
| RF n-layer | 1.1 |  |  |  | 40 | 290 |  |  | 1.1 |  | 0.04 | 300 | 10 |
| RF i-layer |  | 4.0 |  |  | 90 |  |  |  | 0.75 |  | 0.008 | 300 | 10 |
| MW i-layer | 29 |  |  | 27 | 130 |  |  |  | 0.008 | 0.08 | 0.3 | 350 | 98 |
| RF i-layer |  | 3.5 |  |  | 90 |  |  |  | 0.7 |  | 0.008 | 280 | 23 |
| RF p-layer |  |  | 0.2 |  | 80 |  | 9 | 2 | 1.7 |  | 0.07 | 260 |  |
| RF n-layer | 0.8 |  |  |  | 50 | 250 |  |  | 1.05 |  | 0.04 | 230 | 10 |
| RF i-layer |  | 2.0 |  |  | 70 |  |  |  | 0.8 |  | 0.007 | 190 | 90 |
| RF p-layer |  |  | 0.4 |  | 90 |  | 8 | 2 | 1.6 |  | 0.07 | 170 | 10 |

These ten samples were subjected to evaluation of performance in the same way as that in Example F-3. Results of evaluation on each of the ten samples are shown in Table 338. The evaluation was made by normalizing the values measured on the respective samples with the values measured on the sample which was produced by using the gas containing trace amount of Group V element atoms having the concentration of 0.3 ppm. A mark x indicates that the normalized value is not less than 1.0 but below 1.4, a mark Δ indicates that the normalized value is not less than 1.4 but below 1.8 and a mark ○ indicates that the normalized value is not less than 1.8.

From Table 338, it is understood that the concentration of the gas containing trace amount of Group V element atoms, which is used in the atmosphere gas of the annealing containing trace amount of oxygen atoms and trace amount of Group V element atoms under the static magnetic field, most preferably ranges from 1 ppm to 1000 ppm with respect to the whole annealing gas (Total diluting He gas in this case), in order to obtain good results in regard to the initial photoelectric conversion efficiency, variation of the efficiency, photo-degradation, anti-environment characteristic against high-temperature, high-humidity atmosphere, and adhesion.

concentration of the gas containing trace amount of Group V element atoms used in the annealing conducted under the static magnetic field.

In this example, a triple type photovoltaic element of FIG. 3 was produced by using the in-line type apparatus shown in FIG. 5. The process was materially the same as that in Example F-3, except that annealing conditions as shown in Table 339 and production conditions as shown in Table 340 were used. Ten sample elements were produced while varying the concentration of the gas containing trace amount of Group V element atoms between 0.3 ppm and 2000 ppm.

TABLE 339

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP V ELEMENT ATOMS

| Type of gas containing oxygen atoms | O₂/Ar |
|---|---|
| Concentration of trace amount of oxygen atoms in whole annealing gas (ppm) | 2 |
| Type of gas containing Group V element atoms | PH₃/Ar |
| Concentration of trace amount of Group V element atoms in whole annealing gas (ppm) | 0.3–2000 |

TABLE 338

|  | Gas concentration: ppm | | | | | | | | | |
|---|---|---|---|---|---|---|---|---|---|---|
|  | 0.3 | 0.8 | 1 | 10 | 100 | 500 | 1000 | 1050 | 1300 | 2000 |
| Initial photoelectric conversion characteristic | x | Δ | ○ | ○ | ○ | ○ | ○ | Δ | x | x |
| Variation of characteristic | x |  | ○ | ○ | ○ | ○ | ○ | Δ | x | x |
| Photo-degradation characteristic | x | Δ | ○ | ○ | ○ | ○ | ○ | x | x | x |
| Anti-environment characteristic | x | Δ | ○ | ○ | ○ | ○ | ○ | Δ | x | x |
| Adhesion | x | x | ○ | ○ | ○ | ○ | ○ | Δ | x | x |

EXAMPLE F-13

This example is different from Example F-3 in that the concentration of the gas containing trace amount of Group V element atoms used in the annealing under the static magnetic field was varied within the range of between 0.3 ppm and 2000 ppm, for the purpose of investigating the in-fluence of the gas concentration on the performance such as the initial photoelectric conversion efficiency. Ar gas was used as the diluting gas for determining the concentration of the gas containing trace amount of oxygen atoms and the TABLE 339-continued CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP V ELEMENT ATOMS

| Type of magnet | ALNICO |
|---|---|
| Magnetic field intensity (G) | 1400 |

TABLE 339-continued

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP V ELEMENT ATOMS

| | |
|---|---|
| Annealing temp. (° C.) | 290 |
| Annealing press. (Torr) | 1.2 | containing trace amount of Group V element atoms under the static magnetic field, most preferably ranges from 1 ppm to 1000 ppm with respect to the whole annealing gas (Total diluting Ar gas in this case), in order to obtain good results in regard to the initial photoelectric conversion efficiency, variation of the efficiency, photo-degradation, anti-environment characteristic against high-temperature, high-humidity atmosphere, and adhesion.

TABLE 340

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 200 | | | 1.3 | | 0.05 | 350 | 20 |
| RF i-layer | | 4.0 | | | 100 | | | | 0.8 | | 0.008 | 300 | 10 |
| MW i-layer | 48 | | | 51 | 150 | | | | 0.010 | 0.10 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 35 | | | 28 | 140 | | | | 0.013 | 0.10 | 0.3 | 350 | 98 |
| RF i-layer | | 3.5 | | | 90 | | | | 0.7 | | 0.008 | 280 | 23 |
| RF p-layer | | | 0.2 | | 80 | | | | | | | | |
| RF n-layer | 0.8 | | | | 50 | 250 | | | 1.05 | | 0.04 | 230 | 10 |
| RF i-layer | | 2.0 | | | 80 | | | | 0.8 | | 0.007 | 190 | 90 |
| RF p-layer | | | 0.4 | | 90 | | 8 | 2 | 1.6 | | 0.07 | 170 | 10 |

These ten samples were subjected to evaluation of performance in the same way as that in Example F-3. Results of evaluation on each of the ten samples are shown in Table 341. The evaluation was made by normalizing the values measured on the respective samples with the values measured on the sample which was produced by using the gas containing trace amount of Group V element atoms having the concentration of 0.3 ppm. A mark x indicates that the normalized value is not less than 1.0 but below 1.4, a mark Δ indicates that the normalized value is not less than 1.4 but below 1.8 and a mark o indicates that the normalized value is not less than 1.8.

From Table 341, it is understood that the concentration of the gas containing trace amount of Group V element atoms, which is used in the annealing conducted in the atmosphere containing trace amount of oxygen atoms and the gas containing trace amount of Group V element atoms under the static magnetic field, most preferably ranges from 1 ppm to 1000 ppm with respect to the whole annealing gas (Total diluting Ar gas in this case), in order to obtain good results in regard to the initial photoelectric conversion efficiency, variation of the efficiency, photo-degradation, anti-environment characteristic against high-temperature, high-humidity atmosphere, and adhesion.

TABLE 341

| Gas concentration: ppm | 0.3 | 0.8 | 1 | 10 | 100 | 500 | 1000 | 1050 | 1300 | 2000 |
|---|---|---|---|---|---|---|---|---|---|---|
| Initial photoelectric conversion characteristic | × | Δ | ○ | ○ | ○ | ○ | ○ | × | × | × |
| Variation of characteristic | × | × | ○ | ○ | ○ | ○ | ○ | Δ | × | × |
| Photo-degradation characteristic | × | Δ | ○ | ○ | ○ | ○ | ○ | Δ | × | × |
| Anti-environment characteristic | × | Δ | ○ | ○ | ○ | ○ | ○ | Δ | × | × |
| Adhesion | × | × | ○ | ○ | ○ | ○ | ○ | Δ | × | × |

EXAMPLE C-14

In this example, annealing under the static magnetic field was conducted by using both a gas containing trace amount of Group III element atoms and a gas containing trace amount of Group V element atoms, and the concentration of the former gas was varied within the range of between 0.3 ppm and 2000 ppm, for the purpose of investigating the influence of the gas concentration on the performance such as the initial photoelectric conversion efficiency. $H_2$ gas was used as the diluting gas for determining the concentration of the gas containing trace amount of oxygen atoms, concentration of the gas containing trace amount of Group V element atoms, and the concentration of the gas containing trace amount of Group III element atoms.

In this example, a triple type photovoltaic element of FIG. 3 was produced by using the in-line type apparatus shown in FIG. 5. The process was materially the same as that in Example F-6, except that annealing conditions as shown in Table 342 and production conditions as shown in Table 343 were used. Ten sample elements were produced while varying the concentration of the gas containing trace amount of Group III element atoms between 0.3 ppm and 2000 ppm.

TABLE 342

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP V ELEMENT ATOMS

| | |
|---|---|
| Type of gas containing oxygen atoms | $O_2/H_2$ |
| Concentration of trace amount of oxygen atoms in whole annealing gas (ppm) | 2 |
| Type of gas containing Group V element atoms | $PH_3/H_2$ |
| Concentration of trace amount of Group III element atoms in whole annealing gas (ppm) | 2 |
| Type of gas containing trace amount of Group III element atoms | $B_2H_6/H_2$ |
| Concentration of trace amount of Group III element atoms in whole annealing gas (ppm) | 0.3–2000 |
| Type of magnet | ALNICO |
| Magnetic field intensity (G) | 1600 |
| Annealing temp. (° C.) | 280 |
| Annealing press. (Torr) | 1.0 |

344. The evaluation was made by normalizing the values measured on the respective samples with the values measured on the sample which was produced by using the gas containing trace amount of Group III element atoms having the concentration of 0.3 ppm. A mark x indicates that the normalized value is not less than 1.0 but below 1.4, a mark Δ indicates that the normalized value is not less than 1.4 but below 1.8 and a mark o indicates that the normalized value is not less than 1.8.

From Table 344, it is understood that the concentration of the gas containing trace amount of Group III element atoms, which is used in the annealing conducted under the static magnetic field in the atmosphere formed of the gas containing trace amount of oxygen atoms, the gas containing trace amount of Group V element atoms and also the gas containing trace amount of Group III element atoms, most preferably ranges from 1 ppm to 1000 ppm with respect to the whole annealing gas (Total diluting $H_2$ gas in this case), in order to obtain good results in regard to the initial photoelectric conversion efficiency, variation of the efficiency, photo-degradation, anti-environment characteristic against high-temperature, high-humidity atmosphere, and adhesion.

TABLE 343

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power W/cm² | RF Power W/cm² | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 47 | | | 51 | 170 | | | | 0.010 | 0.10 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 29 | | | 28 | 160 | | | | 0.008 | 0.08 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 70 | | | | 0.8 | | 0.007 | 190 | 90 |
| RF p-layer | | | 0.4 | | 90 | | 8 | 2 | 1.6 | | 0.07 | 170 | 10 |

These ten samples were subjected to evaluation of performance in the same way as that in Example F-6. Results of evaluation on each of the ten samples are shown in Table

TABLE 344

| | Concentration of trace amount of Group III atoms: ppm | | | | | | | | | |
|---|---|---|---|---|---|---|---|---|---|---|
| | 0.3 | 0.8 | 1 | 10 | 100 | 500 | 1000 | 1050 | 1300 | 2000 |
| Initial photoelectric conversion characteristic | x | Δ | o | o | o | o | o | x | x | x |
| Variation of characteristic | x | Δ | o | o | o | o | o | x | x | x |
| Photo-degradation characteristic | x | x | o | o | o | o | o | Δ | x | x |
| Anti-environment characteristic | x | Δ | o | o | o | o | o | x | x | x |
| Adhesion | x | Δ | o | o | o | o | o | Δ | x | x |

EXAMPLE F-15

In this example, annealing was conducted under a static magnetic field by using both a gas containing trace amount of Group III element atoms and a gas containing trace amount of Group V element atoms, and the concentration of the former gas was varied within the range of between 0.3 ppm and 2000 ppm, for the purpose of investigating the influence of the gas concentration on the performance such as the initial photoelectric conversion efficiency. He gas was used as the diluting gas for determining the concentration of the gas containing trace amount of oxygen atoms, concentration of the gas containing trace amount of Group V element atoms and the concentration of the gas containing trace amount of Group III element atoms which were used in the annealing under the static magnetic field.

In this example, a triple type photovoltaic element of FIG. 3 was produced by using the in-line type apparatus shown in FIG. 5. The process was materially the same as that in Example C-6, except that annealing conditions as shown in Table 345 and production conditions as shown in Table 346 were used. Ten sample elements were produced while varying the concentration of the gas containing trace amount of Group III element atoms between 0.3 ppm and 2000 ppm.

TABLE 345

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP V ELEMENT ATOMS

| | |
|---|---|
| Type of gas containing oxygen atoms | $O_2$/He |
| Concentration of trace amount of oxygen atoms in whole annealing gas (ppm) | 2 |
| Type of gas containing Group V element atoms | $PH_2$/He |
| Concentration of trace amount of Group III element atoms in whole annealing gas (ppm) | 2 |
| Type of gas containing trace amount of Group III element atoms | $B_2H_6/H_2$ |
| Concentration of trace amount of Group III element atoms in whole annealing gas (ppm) | 0.3–2000 |
| Type of magnet | ALNICO |
| Magnetic field intensity (G) | 1500 |
| Annealing temp. (° C.) | 280 |
| Annealing press. (Torr) | 1.1 |

These ten samples were subjected to evaluation of performance in the same way as that in Example F-6. Results of evaluation on each of the ten samples are shown in Table 347. The evaluation was made by normalizing the values measured on the respective samples with the values measured on the sample which was produced by using the gas containing trace amount of Group III element atoms having the concentration of 0.3 ppm. A mark x indicates that the normalized value is not less than 1.0 but below 1.4, a mark Δ indicates that the normalized value is not less than 1.4 but below 1.8 and a mark ○ indicates that the normalized value is not less than 1.8.

From Table 347, it is understood that the concentration of the gas containing trace amount of Group III element atoms, which is used in the annealing conducted under the static magnetic field in the atmosphere formed of the gas containing trace amount of oxygen atoms, the gas containing trace amount of Group V element atoms and also the gas containing trace amount of Group III element atoms, most preferably ranges from 1 ppm to 1000 ppm with respect to the whole annealing gas (Total diluting He gas in this case), in order to obtain good results in regard to the initial photoelectric conversion efficiency, variation of the efficiency, photo-degradation, anti-environment characteristic against high-temperature, high-humidity atmosphere, and adhesion.

TABLE 346

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 46 | | | 51 | 180 | | | | 0.010 | 0.10 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 29 | | | 27 | 150 | | | | 0.008 | 0.09 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 70 | | | | 0.8 | | 0.007 | 190 | 90 |
| RF p-layer | | | 0.4 | | 90 | | 8 | 2 | 1.6 | | 0.07 | 170 | 10 |

TABLE 347

| | Concentration of trace amount of Group III atoms: ppm | | | | | | | | | |
|---|---|---|---|---|---|---|---|---|---|---|
| | 0.3 | 0.8 | 1 | 10 | 100 | 500 | 1000 | 1050 | 1300 | 2000 |
| Initial photoelectric conversion characteristic | x | Δ | o | o | o | o | o | Δ | x | x |
| Variation of characteristic | x | | o | o | o | o | o | Δ | x | x |
| Photo-degradation characteristic | x | Δ | o | o | o | o | o | x | x | x |
| Anti-environment characteristic | x | Δ | o | o | o | o | o | x | x | x |
| Adhesion | x | Δ | o | o | o | o | o | Δ | x | x |

EXAMPLE F-16

In this example, annealing was conducted under a static magnetic field by using both a gas containing trace amount of Group III element atoms and a gas containing trace amount of Group V element atoms, and the concentration of the former gas was varied within the range of between 0.3 ppm and 2000 ppm, for the purpose of investigating the influence of the gas concentration on the performance such as the initial photoelectric conversion efficiency. Ar gas was used as the diluting gas for determining the concentration of the gas containing trace amount of oxygen atoms, concentration of the gas containing trace amount of Group V element atoms, and the concentration of the gas containing trace amount of Group III element atoms which were used in the annealing under the static magnetic field.

In this example, a triple type photovoltaic element of FIG. 3 was produced by using the in-line type of apparatus shown in FIG. 5. The process was materially the same as that in Example C-6, except that annealing conditions as shown in Table 348 and production conditions as shown in Table 349 were used. Ten sample elements were produced while varying the concentration of the gas containing trace amount of Group III element atoms between 0.3 ppm and 2000 ppm.

TABLE 348

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP V ELEMENT ATOMS

| | |
|---|---|
| Type of gas containing oxygen atoms | $O_2$/Ar |
| Concentration of trace amount of oxygen atoms in whole annealing gas (ppm) | 2 |
| Type of gas containing Group V element atoms | $PH_3$/Ar |
| Concentration of trace amount of Group III element atoms in whole annealing gas (ppm) | 2 |
| Type of gas containing trace amount of Group III element atoms | $BF_3$/Ar |
| Concentration of trace amount of Group III element atoms in whole annealing gas (ppm) | 0.3–2000 |
| Type of magnet | ALNICO |
| Magnetic field intensity (G) | 1300 |
| Annealing temp. (° C.) | 280 |
| Annealing press. (Torr) | 1.3 |

TABLE 349

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power W/cm² | RF Power W/cm² | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 46 | | | 49 | 200 | | | | 0.010 | 0.10 | 0.31 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 29 | | | 27 | 170 | | | | 0.008 | 0.10 | 0.3 | 350 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 70 | | | | 0.8 | | 0.007 | 190 | 90 |
| RF p-layer | | | 0.4 | | 90 | | 8 | 2 | 1.6 | | 0.07 | 170 | 10 |

These ten samples were subjected to evaluation of performance in the same way as that in Example F-6. Results of evaluation on each of the ten samples are shown in Table 350. The evaluation was made by normalizing the values measured on the respective samples with the values measured on the sample which was produced by using the gas containing trace amount of Group III element atoms having the concentration of 0.3 ppm. A mark x indicates that the normalized value is not less than 1.0 but below 1.4, a mark Δ indicates that the normalized value is not less than 1.4 but below 1.8 and a mark o indicates that the normalized value is not less than 1.8.

From Table 350, it is understood that the concentration of the gas containing trace amount of Group III element atoms, which is used in the annealing conducted in under the static magnetic field in the atmosphere formed of the gas containing trace amount of oxygen atoms, the gas containing trace amount of Group V element atoms and also the gas containing trace amount of Group III element atoms, most preferably ranges from 1 ppm to 1000 ppm with respect to the whole annealing gas (Total diluting He gas in this case), in order to obtain good results in regard to the initial photoelectric conversion efficiency, variation of the efficiency, photo-degradation, anti-environment characteristic against high-temperature, high-humidity atmosphere, and adhesion.

TABLE 350

| | Concentration of trace amount of Group III atoms: ppm | | | | | | | | | |
|---|---|---|---|---|---|---|---|---|---|---|
| | 0.3 | 0.8 | 1 | 10 | 100 | 500 | 1000 | 1050 | 1300 | 2000 |
| Initial photoelectric conversion characteristic | x | Δ | ○ | ○ | ○ | ○ | ○ | x | x | x |
| Variation of characteristic | x | Δ | ○ | ○ | ○ | ○ | ○ | x | x | x |
| Photo-degradation characteristic | x | Δ | ○ | ○ | ○ | ○ | ○ | x | x | x |
| Anti-environment characteristic | x | x | ○ | ○ | ○ | ○ | ○ | Δ | x | x |
| Adhesion | x | x | ○ | ○ | ○ | ○ | ○ | Δ | x | x |

EXAMPLE C-17

This example is different from Example F-3 in that the intensity of the magnetic field used in the annealing was varied within the range of between 30 and 4000 G, for the purpose of investigating the influence of the static magnetic field intensity on the performance such as the initial photoelectric conversion efficiency. $H_2$ gas was used as the diluting gas for determining the concentration of the gas containing trace amount of oxygen atoms and the concentration of the gas containing trace amount of Group V element atoms used in the annealing conducted under the static magnetic field.

In this example, a triple type photovoltaic element as shown in FIG. 3 was produced by using the in-line type apparatus shown in FIG. 5. The process was materially the same as that in Example F-3, except that annealing conditions as shown in Table 351 and production conditions as shown in Table 352 were used. Ten sample elements were produced while varying the static magnetic field intensity between 30 G and 4000 G.

TABLE 351

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP V ELEMENT ATOMS

| Type of gas containing oxygen atoms | $O_2/H_2$ |
|---|---|
| Concentration of trace amount of oxygen atoms in whole annealing gas (ppm) | 1 |

TABLE 351-continued

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP V ELEMENT ATOMS

| Type of gas containing Group V element atoms | $PF_3/H_2$ |
|---|---|
| Concentration of trace amount of Group V element atoms in whole annealing gas (ppm) | 2 |
| Type of magnet | ALNICO |
| Magnetic field of intensity (G) | 30–4000 |
| Annealing temp. (° C.) | 300 |
| Annealing press. (Torr) | 1.4 |

TABLE 352

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 48 | | | 51 | 170 | | | | 0.010 | 0.10 | 0.25 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 35 | | | 29 | 140 | | | | 0.013 | 0.10 | 0.24 | 350 | 98 |
| RF i-layer | | 4.0 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 60 | | | | 0.8 | | 0.007 | 190 | 90 |
| RF p-layer | | | 0.4 | | 90 | | 8 | 2 | 1.6 | | 0.07 | 170 | 10 |

These ten samples were subjected to evaluation of performance in the same way as that in Example F-3. Results of evaluation on each of the ten samples are shown in Table 353. The evaluation was made by normalizing the values measured on the respective samples with the values measured on the sample which was produced by setting the static magnetic field intensity to 30 G. A mark x indicates that the normalized value is not less than 1.0 but below 1.4, a mark Δ indicates that the normalized value is not less than 1.4 but below 1.8 and a mark ○ indicates that the normalized value is not less than 1.8.

From Table 353, it is understood that the intensity of the static magnetic field used in the annealing preferably ranges from 100 G to 3000 G in order to obtain good results in regard to the initial photoelectric conversion efficiency, variation of the efficiency, photo-degradation, anti-environment characteristic against high-temperature, high-humidity atmosphere, and adhesion.

TABLE 353

| Magnetic field intensity | 30 | 70 | 100 | 500 | 1000 | 2000 | 3000 | 3050 | 3500 | 4000 |
|---|---|---|---|---|---|---|---|---|---|---|
| Initial photoelectric conversion characteristic | X | Δ | ○ | ○ | ○ | ○ | ○ | Δ | X | X |
| Variation of characteristic | X | X | ○ | ○ | ○ | ○ | ○ | X | X | X |
| Photo-degradation characteristic | X | Δ | ○ | ○ | ○ | ○ | ○ | Δ | X | X |
| Anti-environment characteristic | X | X | ○ | ○ | ○ | ○ | ○ | Δ | X | X |
| Adhesion | X | Δ | ○ | ○ | ○ | ○ | ○ | Δ | X | X |

EXAMPLE F-18

This example is different from Example F-3 in that the annealing temperature was varied within the range of between 25° C. and 500° C., for the purpose of investigating the influence of the annealing temperature on the performance such as the initial photoelectric conversion efficiency. $H_2$ gas was used as the diluting gas for determining the concentration of the gas containing trace amount of oxygen atoms and the concentration of the gas containing trace amount of Group V element atoms used in the annealing conducted under the static magnetic field.

In this example, a triple type photovoltaic element as shown in FIG. 3 was produced by using the in-line type apparatus shown in FIG. 5. The process was materially the same as that in Example F-3, except that annealing conditions as shown in Table 354 and production conditions as shown in Table 355 were used. Ten sample elements were produced while varying the annealing temperature between 25° C. and 500° C.

TABLE 354

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP V ELEMENT ATOMS

| | |
|---|---|
| Type of gas containing oxygen atoms | $O_2/H_2$ |
| Concentration of trace amount of oxygen atoms in whole annealing gas (ppm) | 2 |
| Type of gas containing Group V element atoms | $PF_3/H_2$ |
| Concentration of trace amount of Group V element atoms in whole annealing gas (ppm) | 2 |
| Type of magnet | ALNICO |
| Magnetic field of intensity (G) | 1300 |
| Annealing temp. (° C.) | 25–500 |
| Annealing press. (Torr) | 1.3 |

TABLE 355

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SiH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 48 | | | 51 | 180 | | | | 0.010 | 0.10 | 0.25 | 370 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 35 | | | 29 | 160 | | | | 0.013 | 0.09 | 0.24 | 350 | 98 |
| RF i-layer | | 4.0 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 70 | | | | 0.8 | | 0.007 | 190 | 90 |
| RF p-layer | | | 0.4 | | 90 | | 8 | 2 | 1.6 | | 0.07 | 170 | 10 |

These ten samples were subjected to evaluation of performance in the same way as that in Example F-3. Results of evaluation on each of the ten samples are shown in Table 356. The evaluation was made by normalizing the values-measured on the respective samples with the values measured on the sample which was produced by setting the annealing temperature to 25° C. A mark x indicates that the normalized value is not less than 1.0 but below 1.4, a mark Δ indicates that the normalized value is not less than 1.4 but below 1.8 and a mark ○ indicates that the normalized value is not less than 1.8.

From Table 356, it is understood that the temperature of annealing conducted in the atmosphere containing trace amount of oxygen atoms and trace amount of Group V element atoms most preferably ranges from 50° C. to 400° C., in order to obtain good results in regard to the initial photoelectric conversion efficiency, variation of the efficiency, photo-degradation, anti-environment characteristic against high-temperature, high-humidity atmosphere, and adhesion.

TABLE 356

| Annealing temp. (° C.) | 25 | 40 | 50 | 100 | 200 | 300 | 400 | 430 | 470 | 500 |
|---|---|---|---|---|---|---|---|---|---|---|
| Initial photoelectric conversion characteristic | x | Δ | ○ | ○ | ○ | ○ | ○ | x | x | x |
| Variation of characteristic | x | x | ○ | ○ | ○ | ○ | ○ | Δ | x | x |
| Photo-degradation characteristic | x | x | ○ | ○ | ○ | ○ | ○ | Δ | x | x |
| Anti-environment characteristic | x | Δ | ○ | ○ | ○ | ○ | ○ | x | x | x |
| Adhesion | x | Δ | ○ | ○ | ○ | ○ | ○ | Δ | x | x |

EXAMPLE F-19

This example is different from Example F-3 in that the pressure of the annealing atmosphere was varied within the range of between 0.002 Torr and 100 Torr, for the purpose of investigating the influence of the annealing atmosphere pressure on the performance such as the initial photoelectric conversion efficiency. $H_2$ gas was used as the diluting gas for determining the concentration of the gas containing trace amount of oxygen and the concentration of the gas containing trace amount of Group V element atoms used in the annealing under the static magnetic field.

In this example, triple type photovoltaic element of the type shown in FIG. 3 was produced by using the in-line type apparatus shown in FIG. 5. The process were materially the same as that in Example F-3, except that annealing conditions as shown in Table 357 and production conditions as shown in Table 358 were used.

Ten sample elements were produced while varying the pressure of the annealing atmosphere within the range of between 0.002 Torr and 100 Torr.

TABLE 357

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP V ELEMENT ATOMS

| | |
|---|---|
| Type of gas containing oxygen atoms | $O_2/H_2$ |
| Concentration of trace amount of oxygen atoms in whole annealing gas (ppm) | 2 |
| Type of gas containing Group V element atoms | $PF_3/H_2$ |
| Concentration of trace amount of Group V element atoms in whole annealing gas (ppm) | 2 |

TABLE 357-continued

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP V ELEMENT ATOMS

| | |
|---|---|
| Type of magnet | ALNICO |
| Magnetic field of intensity (G) | 1400 |
| Annealing temp. (° C.) | 320 |
| Annealing press. (Torr) | 0.002–100 |

TABLE 358

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SiH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 47 | | | 51 | 160 | | | | 0.010 | 0.08 | 0.25 | 380 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 31 | | | 28 | 150 | | | | 0.013 | 0.07 | 0.24 | 360 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 70 | | | | 0.8 | | 0.007 | 190 | 90 |
| RF p-layer | | | 0.4 | | 90 | | 8 | 2 | 1.6 | | 0.07 | 170 | 10 |

Ten samples were subjected to evaluation of performance in the same way as that in Example F-3. Results of evaluation on each of the ten samples are shown in Table 359. The evaluation was made by normalizing the values measured on the respective samples with the values measured on the sample which was produced by setting the annealing atmosphere pressure to 0.002 Torr. A mark x indicates that the normalized value is not less than 1.0 but below 1.4, a mark Δ indicates that the normalized value is not less than 1.4 but below 1.8 and a mark ○ indicates that the normalized value is not less than 1.8.

From Table 359, it is understood that the pressure of the annealing conducted the atmosphere containing trace amount of oxygen atoms and trace amount of Group V element atoms most preferably ranges from 0.01 Torr to 10 Torr in order to obtain good results in regard to the initial photoelectric conversion efficiency, variation of the efficiency, photo-degradation, anti-environment characteristic against high-temperature, high-humidity atmosphere, and adhesion.

TABLE 359

| Annealing press. (Torr) | 0.002 | 0.005 | 0.01 | 0.1 | 1 | 5 | 10 | 20 | 50 | 100 |
|---|---|---|---|---|---|---|---|---|---|---|
| Initial photoelectric conversion characteristic | x | Δ | ○ | ○ | ○ | ○ | ○ | Δ | x | x |
| Variation of characteristic | x | x | ○ | ○ | ○ | ○ | ○ | Δ | x | x |
| Photo-degradation characteristic | x | Δ | ○ | ○ | ○ | ○ | ○ | x | x | x |
| Anti-environment characteristic | x | Δ | ○ | ○ | ○ | ○ | ○ | Δ | x | x |
| Adhesion | x | Δ | ○ | ○ | ○ | ○ | ○ | x | x | x |

EXAMPLE F-20

This example is different from Example F-3 in that the following conditions (i) to (iv) were employed, for the purpose of investigating the influence of these conditions on the performance such as the initial photoelectric conversion efficiency.

(i) The frequency of the microwave was varied within the range of between 0.02 GHz and 50 GHz in the formation of the MW i-layer 304 of a-SiGe and in the formation of the MW i-layer 307 of a-SiGe.

(ii) He gas was used in place of Ar gas, as the diluting gas which determines the concentration of the gas containing trace amount of oxygen atoms used in the annealing under the static magnetic field.

(iii) Different annealing conditions were adopted in annealing treatments effected on the MW i-layer 304 of a-SiGe and the MW i-layer 307 of a-SiGe.

(iv) $H_2$ gas was used in place of Ar gas as the diluting gas which determines the concentration of the gas containing trace amount of Group V element atoms and the concentration of the gas containing trace amount of Group III element atoms used in the annealing under the static magnetic field.

In this Example, a photovoltaic element of the triple type shown in FIG. 3 was manufactured by using an in-line type apparatus shown in FIG. 5. The process was as substantially the same as Example F-3, except for the conditions mentioned above.

(1) A substrate having a reflecting layer 301 and a reflection enhancement layer 302 formed thereon (i.e. base member), prepared in the same way as that in Example F-1, was disposed on a substrate conveyor rails 413 laid in a load chamber 401, and the internal pressure of the load chamber 401 was lowered to $1 \times 10^{-5}$ Torr. by a vacuum pump (not shown).

(2) Then, gate valves 406 and 407 were opened and the substrate was conveyed into conveyance chambers 402, 403 and then into a deposition chamber 418 which had been evacuated to certain levels of vacuum by vacuum pumps which are not shown. The substrate was held such that its reverse side was kept in close contact with a substrate heater 411 so as to be heated by the heater 411, while the interior of the deposition chamber 418 was evacuated by the vacuum pump to a level of $1 \times 10^{-5}$ Torr.

(3) Preparation for film forming operation was thus completed. Then, $H_2$ gas was, introduced into the deposition chamber 417 through a gas-introduction, line 429 and the flow rate of the $H_2$ gas was controlled to 500 sccm by means of valves 441, 431, 430, under the control of a mass-flow controller 436. At the same time, the internal pressure of the deposition chamber 417 was regulated to 1.3 Torr. by a conductance valve (not shown). Meanwhile, the substrate heater 410 was adjusted to maintain the substrate temperature at 350° C. When the substrate temperature had been stabilized, an RF n-layer 303 of μc-Si, an RF i-layer 351 of a-Si, and an MW i-layer 304 of a-SiGe were formed in the same way as that in Example F-2. In the formation of the MW i-layer, the MW introduction window 425 was removed and, instead, an antenna-type MW introduction electrode (not shown) was used according to the frequency of the microwave.

(4) Then, an annealing was executed under a static magnetic field in an atmosphere of a gas containing a trace amount of oxygen atoms and trace amount of Group V element atoms.

For the purpose of executing the annealing in the gas atmosphere containing a trace amount of oxygen atoms and trace amount of Group V element atoms, $O_2$/He gas (dilution: 2 ppm) as the gas containing oxygen atoms, and $PF_3/H_2$ gas (dilution 4 ppm) as the gas containing trace amount of Group V element atoms and $BF_3/H_2$ gas (dilution 4 ppm) were introduced into the deposition chamber 418 through the gas introduction line 449. The valves 465 and 455 were opened and the flow rate of the $O_2$/He gas (dilution 2 ppm) was controlled to 500 sccm by means of a mass-flow controller 460. The flow rate of the $PF_3/H_2$ gas (dilution 4 ppm) also was regulated to 250 sccm by means of valves and a mass-flow controller which are not shown. The flow rate of the $PF_3/H_2$ gas (dilution 4 ppm) also was regulated to 250 sccm by means of valves and a mass-flow controller which are not shown.

Then, an alnico magnet 495 of 1800 gauss having height adjusting mechanism, serving as means for applying the static magnetic field, was installed and the pressure in the deposition chamber 418 was controlled to 1.3 Torr by a conductance valve (not shown). The annealing in a gas atmosphere containing trace amount of oxygen atoms and trace amount of Group V element atoms under the static magnetic field was conducted for 10 minutes, while the substrate heater 411 was controlled to maintain the substrate temperature at 300° C. Then, the alnico magnet 495 of 1800 gauss having height adjusting mechanism, serving as means for applying the static magnetic field, was removed and the supply of the $O_2$/He gas (dilution: 2 ppm), $PF_3/H_2$ gas (dilution 4 ppm) and $BF_3/H_2$ gas (dilution 4 ppm) into the deposition chamber 418 was stopped, and the interior of the deposition chamber 418 and the gas line was evacuated to $1 \times 10^{-5}$ Torr.

(5) Then, an RF i-layer 361 of a-Si, an RF p-layer 305 of a-SiC, an RF n-layer 306 of μc-Ei, an RF i-layer 352 of a-Si, and MW i-layer 307 of a-SiGe were successively formed, in accordance with a procedure which is substantially the same as that used in Example F-2. In the formation of the MW i-layer, the MW introduction window 425 was removed and, instead, an antenna-type MW introduction electrode (not shown) was used depending on the frequency of the microwave.

(6) Then, an annealing was executed under a static magnetic field in an atmosphere of a gas containing a trace amount of oxygen atoms and a trace amount of Group V element atoms.

For the purpose of executing the annealing in the gas atmosphere containing a trace amount of oxygen atoms and a trace amount of Group V element atoms, $O_2$/He gas (dilution: 2 ppm) as the gas containing oxygen atoms, $PF_3/H_2$ gas (dilution 4 ppm) as the gas containing trace amount of Group V element atoms and $BF_3/H_2$ gas (dilution 4 ppm) as the gas containing Group III element atoms were introduced into the deposition chamber 418 through the gas introduction line 449. The valves 465 and 455 were opened and the flow rate of the $O_2$/He gas (dilution 2 ppm) was controlled to 500 sccm by means of a mass-flow controller 460. The flow rate of the $PF_3/H_2$ gas (dilution 4 ppm) also was regulated to 250 sccm by means of valves and a mass-flow con-troller which are not shown. The flow rate of the $BF_3/H_2$ gas (dilution 4 ppm) also was regulated to 250 sccm by means of valves and a mass-flow controller which are not shown.

Then, an alnico magnet 495 of 1600 gauss having a height adjusting mechanism, serving as means for applying the static magnetic field, was installed and the pressure in the deposition chamber 418 was controlled to 1.1 Torr by a conductance valve (not shown). The annealing in a gas atmosphere containing trace amount of oxygen atoms and trace amount of Group V element atoms under the static magnetic field was conducted for 10 minutes, while the substrate heater 411 was controlled to maintain the substrate temperature at 270° C. Then, the alnico magnet 495 of 1600 gauss having the height adjusting mechanism, serving as the means for applying the static magnetic field, was removed and the supply of the $O_2$/He gas (dilution: 2 ppm), $PF_3/H_2$ gas (dilution 4 ppm) and the $BF_3/H_2$ gas (dilution 4 ppm) into the deposition chamber 418 was stopped. The interior of the deposition chamber 418 and the gas line was evacuated to $1\times10^{-5}$ Torr.

(7) Then, an RF i-layer 362 of a-Si, an RF p-layer 308 of a-SiC, an RF n-layer 309 of µc-Si, an RF i-layer 310 of a-Si, and an RF p-layer 311 of a-SiC were successively formed, in accordance with a procedure which is substantially the same as that used in Example F-2.

(8) Then, an ITO film of 70 nm thick, serving as a transparent conductive layer 312, was formed on the RF player 311 by vacuum evaporation.

(9) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Production of the photovoltaic element of this example was thus completed. Ten samples were produced while varying the microwave frequency within the range of from 0.02 GHz to 50 GHz during formation of the MW i-layer. The conditions of the annealing conducted under the static magnetic field in the atmosphere of the gas containing trace amount of oxygen atoms and trace amount of Group V element atoms, and the conditions employed in the formation of the RF n-layer, RF i-layer, MW i-layer and RF p-layer are shown in Tables 360, 361 and 362.

TABLE 360

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP V ELEMENT ATOMS (MW i-layer 304)

| | |
|---|---|
| Type of gas containing oxygen atoms | $O_2$/He |
| Concentration of trace amount of oxygen atoms in whole annealing gas (ppm) | 1 |
| Type of gas containing Group V element atoms | $PF_3/H_2$ |
| Concentration of trace amount of Group III element atoms in whole annealing gas (ppm) | 1 |
| Type of gas containing trace amount of Group III element atoms | $BF_3/H_2$ |
| Concentration of trace amount of Group III element atoms in whole annealing gas (ppm) | 1 |
| Type of magnet | ALNICO |
| Magnetic field of intensity (G) | 1800 |
| Annealing temp. (° C.) | 300 |
| Annealing press. (Torr) | 1.3 |

TABLE 361

CONDITIONS OF ANNEALING UNDER STATIC MAGNETIC FIELD IN ATMOSPHERE FORMED OF GAS CONTAINING TRACE AMOUNT OF OXYGEN ATOMS AND GAS CONTAINING TRACE AMOUNT OF GROUP V ELEMENT ATOMS (MW i-layer 307)

| | |
|---|---|
| Type of gas containing oxygen atoms | $O_2$/He |
| Concentration of trace amount of oxygen atoms in whole annealing gas (ppm) | 1 |
| Type of gas containing Group V element atoms | $PF_3/H_2$ |
| Concentration of trace amount of Group III element atoms in whole annealing gas (ppm) | 1 |
| Type of gas containing trace amount of Group III element atoms | $BF_3/H_2$ |
| Concentration of trace amount of Group III element atoms in whole annealing gas (ppm) | 1 |
| Type of magnet | ALNICO |
| Magnetic field of intensity (G) | 1600 |
| Annealing temp. (° C.) | 270 |
| Annealing press. (Torr) | 1.1 |

TABLE 362

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_6/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 67 | | | 69 | 200 | | | | 0.012 | 0.25 | 0.28 | 380 | 100 |
| RF i-layer | | 4.0 | | | 100 | | | | 0.75 | | 0.008 | 300 | 23 |
| RF p-layer | | 0.1 | | | 80 | | 9 | 2 | 1.8 | | 0.07 | 300 | 10 |
| RF n-layer | 1.1 | | | | 40 | 290 | | | 1.1 | | 0.04 | 300 | 10 |

TABLE 362-continued

| | SiH$_4$ flow rate sccm | Si$_2$H$_6$ flow rate sccm | CH$_4$ flow rate sccm | GeH$_4$ flow rate sccm | H$_2$ flow rate sccm | PH$_3$/H$_2$ flow rate sccm | B$_2$H$_6$/H$_2$ flow rate sccm | SIH$_4$/H$_2$ flow rate sccm | Press. Torr | MW Power W/cm$^2$ | RF Power W/cm$^2$ | Substrate temp. °C. | Film thickness nm |
|---|---|---|---|---|---|---|---|---|---|---|---|---|---|
| RF i-layer | | 4.0 | | | 90 | | | | 0.75 | | 0.008 | 300 | 10 |
| MW i-layer | 43 | | | 40 | 170 | | | | 0.011 | 0.25 | 0.28 | 360 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 70 | | | | 0.8 | | 0.007 | 190 | 90 |
| RF p-layer | | | 0.4 | | 90 | | 8 | 2 | 1.6 | | 0.07 | 170 | 10 |

These ten samples were subjected to evaluation of performance in the same way as that in Example F-3. Results of evaluation on each of the ten samples are shown in Table 363. The evaluation was made by normalizing the values measured on the respective samples with the values measured on the sample which was produced by using the microwave frequency of 0.02 GHz. A mark x indicates that the normalized value is not less than 1.0 but below 1.4, a mark Δ indicates that the normalized value is not less than 1.4 but below 1.8 and a mark ○ indicates that the normalized value is not less than 1.8. A mark ⊙ indicates that the normalised value is more than 2.0.

From Table 363, it is understood that the frequency of the microwave, which is employed in the formation of the MW i-layer 304 of a-SiGe and the MW i-layer 307 of a-SiGe which are to be annealed in the gas atmosphere containing trace amount of oxygen atoms and trace amount of Group V element atoms under the static magnetic field, most preferably ranges from 0.1 GHz to 10 GHz, in order to obtain good results in regard to the initial photoelectric conversion efficiency, variation of the efficiency, photo-degradation, anti-environment characteristic against high-temperature, high-humidity atmosphere, and adhesion.

TABLE 363

| Microwave frequency: Ghz | 0.02 | 0.05 | 0.1 | 0.5 | 1 | 2.45 | 10 | 20 | 30 | 50 |
|---|---|---|---|---|---|---|---|---|---|---|
| Initial photoelectric conversion characteristic | X | X | ○ | ○ | ○ | ⊙ | ○ | X | X | X |
| Variation of characteristic | X | Δ | ⊙ | ⊙ | ○ | ⊙ | ○ | X | X | X |
| Photo-degradation characteristic | X | Δ | ○ | ○ | ⊙ | ⊙ | ○ | Δ | X | X |
| Anti-environment characteristic | X | Δ | ○ | ⊙ | ○ | ⊙ | ○ | Δ | X | X |
| Adhesion | X | X | ⊙ | ⊙ | ○ | ⊙ | ○ | Δ | X | X |

EXAMPLE F-21

In this example, a triple type photovoltaic element of the type shown in FIG. 3 was produced by suing the roll-to-roll type apparatus shown in FIG. 9. The annealing was conducted by using various combinations of annealing conditions in the atmosphere containing trace amount of oxygen atoms and trace amount of Group V element atoms under a static magnetic field. The production process was as follows.

(1) A sheet-like substrate (base member) of 30 cm wide, composed of a substrate of a stainless steel and carrying a reflecting layer such as of Ag (or Al—Si or the like) and a reflection enhancement layer such as of ZnO, was rolled up and set in a loading chamber 5010 for loading sheet-type substrate.

(2) The sheet-type substrate was threaded through all the deposition chambers and all the gas gates, and was connected to a sheet take-up jig disposed in an unload chamber 5150.

(3) The deposition chambers were evacuated to a level of $10^{-3}$ Torr or lower by evacuating systems which are not shown. Material gases were supplied to t he deposition chambers, from mixing devices 5024, 5034, 5044, 5054, 5064, 5074, 5084, 5094, 5104, 5114, 5124, 5134 and 5144 associated with the respective deposition chambers.

(4) Gases containing trace amounts of oxygen atoms and gases containing trace amounts of Group V element atoms were supplied from the respective gate gas supply devices to the gas gates 5201, 5202, 5203, 5204, 5205, 5206, 5207, 5208, 5209, 5210, 5211, 5212, 5213 and 5214 each of which was provided therein with an alnico magnet roller M of 1300 gauss.

In this example, the gap in the gas gate through which the sheet-type substrate passes was variable, and the gases containing trace amount of oxygen atoms and trace amount of Group V element atoms were supplied to the gas gates under the static magnetic fields at a total flow rate of 1000 sccm. The temperature of the annealing under the static magnetic field in the atmosphere containing trace amount of oxygen atoms and trace amount of Group V element atoms was controlled to range between 350° C. and 50° C. by means of heaters incorporated in the gas gates. At the same time, the annealing pressure was controlled to range between 3 Torr and 1 Torr, by means of an evacuating system which is not shown.

(5) The substrate was heated by a substrate heater of each deposition device, and the level of the vacuum in each deposition device was controlled by operating an evacuating valve of each evacuation device. Advance of the sheet-type substrate was commenced when the substrate temperature and the vacuum level had been settled, and RF power for generating plasma and MW power (frequency 2.45 GHz) were supplied to each deposition device.

A triple-type solar cell having three pin structures stacked on one on another on the sheet-type substrate 300 was thus produced.

(6) Then, an ITO film of 70 nm thick, serving as a transparent conductive layer 312, was formed on the RF p-layer 311 by vacuum evaporation.

(7) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of this example was thus completed. This element will be referred to as "SC/F-21". The conditions of the annealing conducted under the static magnetic field in gas atmosphere containing trace amount of oxygen atoms and trace amount of Group V element atoms in this example, as well as the conditions of film-forming processes for forming the RF n-layer, RF i-layer, MW i-layer and RF-p layer are collectively shown in Tables 364 and 365.

SC/CF21-1, were produced and were subjected, basically in the same way as Example A-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The photo-degradation was evaluated by setting the element tempera-

TABLE 364

CONDITIONS OF ANNEALING IN ATMOSPHERE FORMED OF GAS CONTAINING TRACE AMOUNT OF OXYGEN ATOMS AND GAS CONTAINING TRACE AMOUNT OF ATOMS OF GROUP V ELEMENT

| Gas Gate | Type of gas containing oxygen atoms | Concentration of trace amount of oxygen atoms in whole annealing gas (ppm) | Type of gas containing Group V element atoms | Concentration of trace amount of Group V element atoms in whole annealing gas (ppm) | Type of gas containing Group III element atoms | Concentration of trace amount of Group III element atoms in whole annealing gas (ppm) | Annealing temp. (° c.) | Annealing Press. (Torr) |
|---|---|---|---|---|---|---|---|---|
| 5201 | $O_2$/He | 500 | $PH_3/H_2$ | 500 | | | 350 | 3.0 |
| 5202 | $O_2/H_2$ | 3 | $PF_3/H_2$ | 3 | | | 350 | 2.0 |
| 5203 | $O_2/H_2$ | 1 | $PH_5$/He | 2 | $BF_3/H_2$ | 4 | 350 | 1.6 |
| 5204 | $O_2$/He | 1 | $PH_3/H_2$ | 2 | $BF_3$/He | 3 | 300 | 1.2 |
| 5205 | NO/He | 1 | $PH_3/H_2$ | 1 | | | 300 | 2.5 |
| 5206 | NO/He | 200 | $PH_5/H_2$ | 200 | $B_2H_6$/He | 200 | 300 | 2.3 |
| 5207 | $O_2$/He | 10 | $PH_3$/He | 3 | | | 300 | 1.9 |
| 5208 | $O_2/H_2$ | 1 | $PF_5$/He | 1 | $BF_3/H_2$ | 4 | 350 | 1.3 |
| 5209 | $O_2/H_2$ | 1 | $PF_3$/He | 1 | $BF_3/H_2$ | 3 | 280 | 1.0 |
| 5210 | $O_2$/He | 2 | $PH_3$/He | 1 | | | 260 | 2.3 |
| 5211 | NO/He | 100 | $PF_3/H_2$ | 200 | $B_2H_6$/He | 200 | 230 | 2.2 |
| 5212 | $O_2/H_2$ | 1 | $PH_3$/He | 2 | | | 190 | 1.3 |
| 5213 | $O_2$/He | 3 | $PH_5$/He | 1 | | | 170 | 2.0 |
| 5214 | $O_2$/He | 500 | $PH_3/H_2$ | 1 | | | 50 | 2.0 |

TABLE 365

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_4/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 2.0 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 47 | | | 50 | 225 | | | | 0.005 | 0.07 | 0.28 | 380 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 33 | | | 30 | 170 | | | | 0.005 | 0.07 | 0.28 | 360 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 70 | | | | 0.8 | | 0.007 | 190 | 90 |
| RF p-layer | | | 0.4 | | 90 | | 8 | 2 | 1.6 | | 0.07 | 170 | 10 |

Comparative Example F 21-1

A process was conducted as Comparative Example F21-1. This process was different from Example F-21 in that it omitted the annealing conducted under the static magnetic field in the gas atmosphere containing trace amount of oxygen atoms and trace amount of Group V element atoms and that $H_2$ or He gas as desired was supplied to each gas gate.

Other conditions were materially the same as those in Example F-21. The photovoltaic element produced in Comparative Example F21-1 will be referred to as "SC/CF21-1".

Seven samples of the photovoltaic elements SC/F-21, as well as seven samples of the photovoltaic elements ture to 43° C. and the photo-irradiation time to 1210 hours. The anti-environment characteristic was evaluated by setting the temperature to 91° C., the humidity to 93% and the time of shelving in the dark place to 230 hours. The results are shown in Table 66.

The performance of the photovoltaic element is shown in Table 366 in terms of values measured on the samples of the photovoltaic element SC/F-21 as normalized by the values measured on the samples of the photovoltaic element SC/CF21-1.

TABLE 366

| Items of evaluation | Evaluation |
|---|---|
| Initial photoelectric conversion efficiency characteristic | 1.56 |
| Variation of Initial photoelectric conversion efficiency characteristic | 0.82 |
| Photo-degradation characteristic | 0.81 |
| Anti-environment characteristic | 0.83 |
| SEM observation of sectional face | 0.92 |
| Measurement of adhesion: Delamination | No delamination in SC/F-21 Slight delamination in SC/CF21-1 |

From Table 366, it is understood that the photovoltaic element SC/F-21 of this example exhibits superiority to the comparative example SC/CF21-1 in all items of the evaluation.

EXAMPLE F-22

In this example, a triple type photovoltaic element was produced by using the roll-to-roll type apparatus shown in FIG. 9. The annealing was conducted under various combinations of annealing conditions conducted in an atmosphere containing trace amount of oxygen atoms and trace amount of Group V element atoms. The production process was as follows:

(1) A sheet-like substrate (base member) of 30 cm wide, composed of a substrate of a stainless steel and carrying a reflecting layer such as of Ag (or Al—Si or the like) and a reflection enhancement layer such as of ZnO, was rolled up and set in a loading chamber 5010 for loading sheet-type substrate. The sheet-type substrate was threaded through all the deposition chambers and all the gas gates, and was connected to a sheet take-up jig disposed in an unload chamber 5150. The deposition chambers were evacuated to a level of $10^{-3}$ Torr or lower by evacuating systems which are not shown.

(2) Material gases were supplied to the deposition chambers, from mixing devices 5024, 5034, 5044, 5054, 5064, 5074, 5084, 5094, 5104, 5114, 5124, 5134 and 5144 associated with the respective deposition chambers.

(3) Gases containing trace amounts of oxygen atoms and gases containing trace amounts of Group V element atoms for use in the annealing under static magnetic fields were supplied from the respective gate gas supply devices to the gas gates 5201, 5202, 5203, 5204, 5205, 5206, 5207, 5208, 5209, 5210, 5211, 5212, 5213 and 5214 each of which was provided therein with an alnico magnet roller M having a static magnetic field intensity of 1300 gauss.

In this example, the gap in the gas gate through which the sheet-type substrate passes was variable, and the gases containing trace amount of oxygen atoms and trace amount of Group V element atoms under the static magnetic field were supplied to the gas gates at a total flow rate of 1000 sccm. The temperature of the annealing conducted in the atmosphere containing trace amount of oxygen atoms and trace amount of Group V element atoms under the static magnetic field was controlled to range between 350° C. and 250° C. by means of heaters incorporated in the gas gates. At the same time, the annealing pressure was controlled to range between 3 Torr and 1 Torr, by means of an evacuating system which is not shown.

(4) The substrate was heated by a substrate heater of each deposition device, and the level of the vacuum in each deposition device was controlled by operating an evacuating valve of each evacuation device. Advance of the sheet-type substrate was commenced when the substrate temperature and the vacuum level had been settled, and RF power for generating plasma and MW power (frequency 0.5 GHz) were supplied to each deposition chamber. An antenna-type MW introduction electrode was used in the MW power supply system.

A triple-type solar cell having three pin structures stacked on one on another on the sheet-type substrate 300 was thus produced.

(5) Then, an ITO film of 70' nm thick, serving as a transparent conductive layer 312, was formed on the RF p-layer 311 by vacuum evaporation.

(6) A mask having comb-shaped aperture was placed on the transparent electrode 312 and a comb-shaped collector electrode 313 of Cr(40 nm)/Ag(1000 nm)/Cr(40 nm) was formed by vacuum evaporation.

Fabrication of the photovoltaic element of this example was thus completed. This element will be referred to as "SC/F-22". The conditions of the annealing conducted under the static magnetic field in gas atmosphere containing trace amount of oxygen atoms and trace amount of Group V element atoms in this example, as well as the conditions of film-forming processes for forming the RF n-layer, RF i-layer, MW i-layer and RF-p layer are collectively shown in Tables 367 and 368.

TABLE 367

CONDITIONS OF ANNEALING IN ATMOSPHERE FORMED OF GAS CONTAINING TRACE AMOUNT OF OXYGEN ATOMS AND GAS CONTAINING TRACE AMOUNT OF ATOMS OF GROUP V ELEMENT

| Gas Gate | Type of gas containing oxygen atoms | Concentration of trace amount of oxygen atoms in whole annealing gas (ppm) | Type of gas containing Group V element atoms | Concentration of trace amount of Group V element atoms in whole annealing gas (ppm) | Type of gas containing Group III element atoms | Concentration of trace amount of Group III element atoms in whole annealing gas (ppm) | Annealing temp. (° c.) | Annealing Press. (Torr) |
|---|---|---|---|---|---|---|---|---|
| 5201 | $O_2$/Ar | 500 | $PH_3$/He | 500 | | | 350 | 3.0 |
| 5202 | $CO_2$/$H_2$ | 4 | $PF_3$/$H_2$ | 4 | | | 350 | 2.0 |
| 5203 | $O_2$/$H_2$ | 1 | $PF_5$/He | 2 | $BF_3$/$H_2$ | 4 | 350 | 1.6 |
| 5204 | $O_2$/He | 1 | $PH_3$/$H_2$ | 2 | $BF_3$/He | 3 | 300 | 1.2 |
| 5205 | CO/He | 6 | $PH_3$/$H_2$ | 1 | | | 300 | 2.5 |
| 5206 | NO/Ar | 200 | $PF_5$/Ar | 200 | $B_2H_6$/He | 200 | 300 | 2.3 |
| 5207 | $O_2$/He | 15 | $PH_3$/He | 4 | | | 300 | 1.9 |
| 5208 | $O_2$/$H_2$ | 1 | $PF_3$/He | 1 | $BF_3$/$H_2$ | 4 | 350 | 1.3 |

TABLE 367-continued

CONDITIONS OF ANNEALING IN ATMOSPHERE FORMED OF GAS CONTAINING TRACE AMOUNT OF OXYGEN ATOMS AND GAS CONTAINING TRACE AMOUNT OF ATOMS OF GROUP V ELEMENT

| Gas Gate | Type of gas containing oxygen atoms | Concentration of trace amount of oxygen atoms in whole annealing gas (ppm) | Type of gas containing Group V element atoms | Concentration of trace amount of Group V element atoms in whole annealing gas (ppm) | Type of gas containing Group III element atoms | Concentration of trace amount of Group III element atoms in whole annealing gas (ppm) | Annealing temp. (° c.) | Annealing Press. (Torr) |
|---|---|---|---|---|---|---|---|---|
| 5209 | $O_2/H_2$ | 1 | $PF_3/He$ | 1 | $BF_3/H_2$ | 3 | 280 | 1.0 |
| 5210 | CO/He | 2 | $PH_3/He$ | 1 | | | 260 | 2.3 |
| 5211 | NO/Ar | 8 | $PF_3/Ar$ | 200 | $B_2H_6/He$ | 200 | 230 | 2.2 |
| 5212 | $O_2/H_2$ | 1 | $PH_3/He$ | 2 | | | 190 | 1.3 |
| 5213 | $O_2/He$ | 3 | $PF_3/He$ | 1 | | | 170 | 2.0 |
| 5214 | $O_2/He$ | 500 | $PH_3/H_2$ | 1 | | | 50 | 2.0 |

TABLE 368

| | $SiH_4$ flow rate sccm | $Si_2H_6$ flow rate sccm | $CH_4$ flow rate sccm | $GeH_4$ flow rate sccm | $H_2$ flow rate sccm | $PH_3/H_2$ flow rate sccm | $B_2H_4/H_2$ flow rate sccm | $SIH_4/H_2$ flow rate sccm | Press. Torr | MW Power $W/cm^2$ | RF Power $W/cm^2$ | Substrate temp. ° C. | Film thickness nm |
|---|---|---|---|---|---|---|---|---|---|---|---|---|---|
| RF n-layer | 20 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 45 | | | 47 | 200 | | | | 0.004 | 0.11 | 0.30 | 380 | 100 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 31 | | | 29 | 180 | | | | 0.004 | 0.10 | 0.30 | 360 | 98 |
| RF i-layer | | 3.5 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 90 | | | | 0.7 | | 0.007 | 190 | 90 |
| RF p-layer | | | 0.4 | | 90 | | 8 | 2 | 1.6 | | 0.07 | 170 | 10 |

Comparative Example F 22-1

A process was conducted as Comparative Example F 22-1. This process was different from Example F-22 in that it omitted the annealing conducted in the gas atmosphere containing trace amount of oxygen atoms and trace amount of Group V element atoms under the static magnetic field, and that $H_2$ gas, He gas or Ar gas as desired was supplied to each gas gate.

Other conditions were materially the same as those in Example F-22. The photovoltaic element produced in Comparative Example F 22-1 will be referred to as "SC/CF22-1".

Seven samples of the photovoltaic elements SC/F-22, as well as seven samples of the photovoltaic elements SC/CF22-1, were produced and were subjected, basically in the same way as Example A-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The photo-degradation characteristic was measured by setting the element temperature to 41° C. and the photo-irradiation time to 1200 hours. The anti-environment characteristic was evaluated by setting the temperature to 89° C., the humidity to 94% and the time of shelving in the dark place to 350 hours. The results are shown in Table 369.

The performance of the photovoltaic element is shown in Table 369 in terms of values measured on the samples of the photovoltaic element SC/F-22 as normalized by the values measured on the samples of the photovoltaic element SC/CF22-1.

TABLE 369

| Items of evaluation | Evaluation |
|---|---|
| Initial photoelectric conversion efficiency characteristic | 1.52 |
| Variation of Initial photoelectric conversion efficiency characteristic | 0.82 |
| Photo-degradation characteristic | 0.81 |
| Anti-environment characteristic | 0.84 |
| SEM observation of sectional face | 0.92 |
| Measurement of adhesion: Delamination | No delamination in SC/F-22 Slight delamination in SC/CF22-1 |

From Table 369, it is understood that the photovoltaic element SC/F-22 of this example exhibits superiority to the comparative example SC/CF22-1 in all items of the evaluation.

EXAMPLE F-23

In this example, a triple type photovoltaic element was produced by using the roll-to-roll type apparatus shown in FIG. 6. The annealing was conducted under various combinations of conditions of annealing in the atmosphere containing trace amount of oxygen atoms and trace amount of Group V element atoms under the static magnetic field. The production process was as follows.

(1) A sheet-like substrate (base member) of 30 cm wide, composed of a substrate of a stainless steel and carrying a reflecting layer such as of Ag (or Al—Si or the like) and a reflection enhancement layer such as of ZnO, was rolled up and set in a loading chamber 5010 for loading sheet-type substrate. The sheet-type substrate was threaded through all the deposition chambers and all the gas gates, and was connected to a sheet take-up jig disposed in an unload chamber 5150. The deposition chambers were evacuated to a level of $10^{-3}$ Torr or lower by evacuating systems which are not shown.

(2) Material gases were supplied to the deposition chambers, from mixing devices 5024, 5034, 5044, 5054, 5064, 5074, 5084, 5094, 5104, 5114, 5124, 5134 and 5144 associated with the respective deposition chambers.

(3) Gases containing trace amounts of oxygen atoms and gases containing trace amounts of Group V element atoms to be used under the static magnetic field were supplied from the respective gate gas supply devices to the gas gates 5201, 5202, 5203, 5204, 5205, 5206, 5207, 5208, 5209, 5210, 5211, 5212, 5213 and 5214 each of which was provided therein with an alnico magnet roller M having a static magnetic field of 1400 gauss.

In this example, the gap in the gas gate through which the sheet-type substrate passes was variable, and the gases containing trace amount of oxygen atoms and trace amount of Group V element atoms under the static magnetic field were supplied to the gas gates at a total flow rate of 1400 sccm. The temperature of the annealing conducted in the atmosphere containing trace amount of oxygen atoms and trace amount of Group V element atoms under the static magnetic field were controlled to range between 350° C. and 50° C. by means of heaters incorporated in the gas gates. At the same time, the annealing pressure was controlled to range between 3 Torr and 1 Torr, by means of an evacuating system which is not shown.

(4) The substrate was heated by a substrate heater of each deposition device, and the level of the vacuum in each deposition device was controlled by operating an evacuating valve of each evacuation device. Advance of the sheet-type substrate was commenced when the substrate temperature and the vacuum level have been settled, and RF power for generating plasma and MW power (frequency 0.1 GHz) were supplied to each deposition chamber. An antenna-type MW introduction electrode was used in the MW power supply system.

A triple-type solar cell having three pin structures stacked on one on another on the sheet-type substrate 300 was thus produced.

(5) Then, an ITO film of 70 nm thick, serving as a transparent conductive layer 312, was formed on the RF p-layer 311 by vacuum evaporation.

(6) A mask having comb-shaped aperture was placed on the transparent electrode 312 and a comb-shaped collector electrode 313 of Cr(40 nm )/Ag(1000 nm)/Cr(40 nm) was formed by vacuum evaporation.

Fabrication of the photovoltaic element of this example was thus completed. This element will be referred to as "SC/F-23". The conditions of the annealing conducted in gas atmosphere containing trace amount of oxygen atoms under the static magnetic field in this example, as well as the conditions of film-forming processes for forming the RF n-layer, RF i-layer, MW i-layer and RF-p layer are collectively shown in Tables 370 and 371.

TABLE 370

CONDITIONS OF ANNEALING IN ATMOSPHERE FORMED OF GAS CONTAINING TRACE AMOUNT OF OXYGEN ATOMS AND GAS CONTAINING TRACE AMOUNT OF ATOMS OF GROUP V ELEMENT

| Gas Gate | Type of gas containing oxygen atoms | Concentration of trace amount of oxygen atoms in whole annealing gas (ppm) | Type of gas containing Group V element atoms | Concentration of trace amount of Group V element atoms in whole annealing gas (ppm) | Type of gas containing Group III element atoms | Concentration of trace amount of Group III element atoms in whole annealing gas (ppm) | Annealing temp. (° C.) | Annealing Press. (Torr) |
|---|---|---|---|---|---|---|---|---|
| 5201 | $O_2$/Ar | 500 | $PH_3$/He | 500 | | | 350 | 3.0 |
| 5202 | $CO_2$/$H_2$ | 3 | $PF_3$/$H_2$ | 3 | | | 350 | 2.0 |
| 5203 | $O_2$/$H_2$ | 1 | $PF_5$/He | 2 | $BF_3$/$H_2$ | 5 | 350 | 1.6 |
| 5204 | $O_2$/He | 1 | $PH_3$/$H_2$ | 2 | $BF_3$/He | 3 | 300 | 1.2 |
| 5205 | CO/He | 6 | $PH_3$/$H_2$ | 1 | | | 300 | 2.5 |
| 5206 | NO/Ar | 140 | $PF_3$/Ar | 140 | $B_2H_6$/He | 150 | 300 | 2.3 |
| 5207 | $O_2$/He | 10 | $PH_3$/He | 3 | | | 300 | 1.9 |
| 5208 | $O_2$/$H_2$ | 1 | $PH_3$/He | 1 | $BF_3$/$H_2$ | 5 | 350 | 1.3 |
| 5209 | $O_2$/$H_2$ | 1 | $PF_5$/He | 1 | $BF_3$/$H_2$ | 3 | 280 | 1.0 |
| 5210 | CO/He | 2 | $PH_3$/He | 1 | | | 260 | 2.3 |
| 5211 | NO/Ar | 90 | $PF_5$/Ar | 200 | $B_2H_6$/He | 200 | 230 | 2.2 |
| 5212 | $O_2$/$H_2$ | 1 | $PH_3$/He | 2 | | | 190 | 1.3 |
| 5213 | $O_2$/He | 3 | $PF_3$/He | 1 | | | 170 | 2.0 |
| 5214 | $O_2$/He | 500 | $PH_3$/$H_2$ | 1 | | | 50 | 2.0 |

TABLE 371

| | SiH$_4$ flow rate sccm | Si$_2$H$_6$ flow rate sccm | CH$_4$ flow rate sccm | GeH$_4$ flow rate sccm | H$_2$ flow rate sccm | PH$_3$/H$_2$ flow rate sccm | B$_2$H$_4$/H$_2$ flow rate sccm | SIH$_4$/H$_2$ flow rate sccm | Press. Torr | MW Power W/cm$^2$ | RF Power W/cm$^2$ | Substrate temp. °C. | Film thickness nm |
|---|---|---|---|---|---|---|---|---|---|---|---|---|---|
| RF n-layer | 20 | | | | 100 | 220 | | | 1.3 | | 0.05 | 350 | 20 |
| RF i-layer | | 4.0 | | | 100 | | | | 0.8 | | 0.008 | 300 | 10 |
| MW i-layer | 46 | | | 48 | 190 | | | | 0.004 | 0.26 | 0.29 | 380 | 90 |
| RF i-layer | | 4.0 | | | 100 | | | | 0.75 | | 0.008 | 300 | 23 |
| RF p-layer | | | 0.1 | | 80 | | 9 | 2 | 1.8 | | 0.07 | 300 | 10 |
| RF n-layer | 1.1 | | | | 40 | 290 | | | 1.1 | | 0.04 | 300 | 10 |
| RF i-layer | | 4.0 | | | 90 | | | | 0.75 | | 0.008 | 300 | 10 |
| MW i-layer | 31 | | | 28 | 160 | | | | 0.004 | 0.26 | 0.29 | 375 | 85 |
| RF i-layer | | 4.0 | | | 90 | | | | 0.7 | | 0.008 | 280 | 23 |
| RF p-layer | | | 0.2 | | 80 | | 9 | 2 | 1.7 | | 0.07 | 260 | 10 |
| RF n-layer | 0.8 | | | | 50 | 250 | | | 1.05 | | 0.04 | 230 | 10 |
| RF i-layer | | 2.0 | | | 70 | | | | 0.7 | | 0.007 | 190 | 88 |
| RF p-layer | | | 0.4 | | 90 | | 8 | 2 | 1.6 | | 0.07 | 170 | 10 |

Comparative Example F 23-1

A process was conducted as Comparative Example F23-1. This process was different from Example F-23 in that it omitted the annealing conducted in the gas atmosphere containing trace amount of oxygen atoms and trace amount of Group V element atoms under static magnetic field and that H$_2$ gas, He gas or Ar gas as desired was supplied to each gas gate.

Other conditions were materially the same as those in Example F-23. The photovoltaic element produced in Comparative Example F 23-1 will be referred to as "SC/CF23-1".

Eight samples of the photovoltaic elements SC/F-23, as well as eight samples of the photovoltaic elements SC/CF23-1, were produced and were subjected, basically in the same way as Example A-1, for evaluation of various items of performance such as initial photoelectric conversion efficiency (photo-voltage/incident photo-power), variation or lack of uniformity of the conversion efficiency, photo-degradation, anti-environment characteristic against high-temperature and high-humidity environment, SEM observation of cut surface, and adhesion. The photo-degradation characteristic was measured by setting the element temperature to 40° C. and the photo-irradiation time to 1200 hours. The anti-environment characteristic was evaluated by setting the temperature to 90° C., the humidity to 93% and the time of shelving in the dark place to 360 hours. The results are shown in Table 372.

The performance of the photovoltaic element is shown in Table 372 in terms of values measured on the samples of the photovoltaic element SC/F-23 as normalized by the values measured on the samples of the photovoltaic element SC/CF23-1.

TABLE 372

| Items of evaluation | Evaluation |
|---|---|
| Initial photoelectric conversion efficiency characteristic | 1.52 |
| Variation of Initial photoelectric conversion efficiency characteristic | 0.84 |
| Photo-degradation characteristic | 0.82 |
| Anti-environment characteristic | 0.84 |
| SEM observation of sectional face | 0.91 |
| Measurement of adhesion: Delamination | No delamination in SC/F-23 Slight delamination in SC/CF23-1 |

From Table 372, it is understood that the photovoltaic element in SC/F-23 of this example exhibits superiority to the comparative example SC/CF23-1 in all items of the evaluation.

EXAMPLE F-24

Using the in-line type apparatus shown in FIG. 5, four types of samples of mono-film were prepared for measurement of interface defect density. More specifically, these four samples are a sample Fa in which the mono-film of a formed semiconductor layer is an RF n-layer, a sample Fb in which the mono-film of a formed semiconductor layer is an RF i-layer, a sample Fc in which the mono-film of a formed semiconductor layer is an MW i-layer, and a sample Fd in which the mono-film of a formed semiconductor layer is an RF p-layer.

The process for preparing these samples was as follows.

(1) A substrate (base member) for each sample was prepared by effecting, on a substrate 100 of quartz glass of 25 mm wide, 50 mm long and 0.8 mm thick, supersonic cleaning conducted by employing acetone and isopropanol, followed by drying with heated air.

(2) A Cr layer of 5 nm thick was formed on the surface of the substrate 100 of quartz glass by sputtering.

(3) Then, one of n-type semiconductor layer, i-type semiconductor layer and p-type semiconductor layer was formed to a thickness of 1 pm by the same method as that used in Example F-1, and the substrate having such semiconductor layer was subjected to annealing conducted under a static magnetic field in atmosphere of a gas containing trace amount of oxygen atoms and trace amount of Group V element atoms, in the same way as that in Example F-1.

Samples of mono-films for the purpose of measurement of interface defect density were thus prepared. The conditions of the annealing conducted in gas atmosphere containing trace amount of oxygen atoms and trace amount of Group V element atoms under the static magnetic field in this example, as well as the conditions of film-forming processes for forming the RF n-layer, RF i-layer, MW i-layer and RF-p layer are collectively shown in Tables 373 and 374.

TABLE 373

CONDITIONS OF ANNEALING UNDER STATIC MAGNETIC FIELD IN ATMOSPHERE FORMED OF GAS
CONTAINING TRACE AMOUNT OF OXYGEN ATOMS AND GAS CONTAINING TRACE AMOUNT OF ATOMS OF
GROUP V ELEMENT ATOMS

| Sample | Type of gas containing oxygen atoms | Concentration of trace amount of Oxygen atoms (ppm) | Type of gas containing Group V element atoms | Concentration of trace amount of Group V element atoms in whole annealing gas (ppm) | Type of magnet | Magnetic field intensity (G) | Anneal temp. (° C.) | Anneal press. (Torr) |
|---|---|---|---|---|---|---|---|---|
| Fa | $O_2$/Ar | 110 | $PH_3$/Ar | 500 | SAMARIUM COBALT | 1100 | 350 | 2.8 |
| Fb | $O_2$/$H_2$ | 3 | $PF_3$/$H_2$ | 1 | ALUNICO | 1400 | 250 | 1.8 |
| Fc | $O_2$/$H_2$ | 4 | $PF_3$/$H_2$ | 1 | ALUNICO | 1200 | 300 | 1.4 |
| Fd | $CO_2$/He | 220 | $PH_3$/He | 30 | SAMARIUM COBALT | 1000 | 230 | 2.7 |

TABLE 374

| Sample | $SiH_4$ flow rate sccm | $Si_2H_6$ flow rate sccm | $CH_4$ flow rate sccm | $GeH_4$ flow rate sccm | $H_2$ flow rate sccm | $PH_3$/$H_2$ flow rate sccm | $B_2H_6$/$H_2$ flow rate sccm | $SIH_4$/$H_2$ flow rate sccm | Press. Torr | MW Power $W/cm^2$ | RF Power $W/cm^2$ | Substrate temp. ° C. |
|---|---|---|---|---|---|---|---|---|---|---|---|---|
| Fa RF n-layer | 2.5 | | | | 80 | 120 | | | 1.0 | | 0.05 | 350 |
| Fb RF i-layer | | 4.5 | | | 130 | | | | 0.6 | | 0.008 | 300 |
| Fc MW i-layer | 45 | | | 48 | 200 | | | | 0.006 | 0.08 | 0.30 | 380 |
| Fd RF i-layer | | | 0.3 | | 80 | | 15 | 2 | 1.8 | | 0.07 | 230 |

Comparative Example F 24-1

A process was conducted as Comparative Example F 24-1. This process was different from Example F-24 in that the semiconductor layers were formed without the step of annealing conducted in the gas atmosphere containing trace amount of oxygen atoms and trace amount of Group V element atoms under the static magnetic field.

Other conditions were materially the same as those in Example F-24. The mono-film for measurement of interface defect density prepared in Comparative Example F24-1 will be referred to as "SC/CF24-1".

Three samples of mono-film Fa to Fd, as well as three samples of mono-film SC/F24-1, were produced and were subjected to PDS (Photothermal Deflection Spectroscopy) measurement in the same way as that in Example A-17. The results are shown in Table 375. The measurement results are shown in this Table in terms of values measured on the samples Fa to Fd normalized with the values measured on the samples of the comparative example, i.e., SC/CF24-1. Thus, the values shown in table 375 shows the ratio of reduction in the interface defect density.

TABLE 375

| Sample name | Type of semiconductor layer formed | Reduction of interfacial defect density |
|---|---|---|
| Fa | RF n-layer | 0.91 |
| Fb | RF i-layer | 0.87 |
| Fc | MW i-layer | 0.85 |
| Fd | RF p-layer | 0.93 |

From Table 375, it is understood that the samples of the Example F-24, which had undergone the annealing conducted under the static magnetic field in atmosphere gas containing trace amount of oxygen atoms and trace amount of Group V element atoms in accordance with the invention, exhibit smaller density of interface defects and, hence, superior performance, as compared with the samples of Comparative Example (SC/CF23-1) which were prepared without such annealing.

What is claimed is:

1. A method for manufacturing a photovoltaic element wherein a pin-structure formed by laminating n-, i- and p-type semiconductor layers, each of which contains silicon atoms and comprises a non-monocrystalline crystal structure, is formed at least one or more times on a substrate,
    said method comprising steps of forming each of said semiconductor layers and annealing the surface of at least one of said semiconductor layers or said substrate in an atmosphere of hydrogen gas, helium gas or argon gas that contains 1 to 1000 ppm of oxygen atom containing gas.

2. A method for manufacturing a photovoltaic element according to claim 1, wherein the temperature of said annealing step is set in the range of 50 to 400° C.

3. A method for manufacturing a photovoltaic element according to claim 1, wherein the pressure in said annealing step is set in the range of 0.01 to 10 Torr.

4. A method for manufacturing a photovoltaic element according to claim 1, wherein said oxygen atom containing gas is at least one selected from the group consisting of $O_2$, CO, $CO_2$, NO, $NO_2$, $N_2O$, $CH_3CH_2OH$ and $CH_3OH$.

5. A method for manufacturing a photovoltaic element according to claim 1, wherein said annealing step is performed using hydrogen gas, helium gas or argon gas that further contains 1 to 1000 ppm of boron atom containing gas.

6. A method for manufacturing a photovoltaic element according to claim 5, wherein said boron atom containing gas is at least one of boron hydrides selected from the group consisting of $B_2H_6$, $B_4H_{10}$, $B_5H_9$, $B_5H_{11}$, $B_6H_{10}$, $B_6H_{12}$ and $B_6H_{14}$.

7. A method for manufacturing a photovoltaic element according to claim 5, wherein said boron atom containing gas is at least one of boron halides selected between $BF_3$ and $BCl_3$.

8. A method for manufacturing a photovoltaic element according to claim 1, wherein said annealing step is performed using hydrogen gas, helium gas or argon gas that further contains 1 to 1000 ppm of phosphorus atom containing gas.

9. A method for manufacturing a photovoltaic element according to claim 8, wherein said phosphorus atom containing gas is at least one of phosphorus hydrides selected between $PH_3$ and $P_2H_4$.

10. A method for manufacturing a photovoltaic element according to claim 1, wherein said annealing step is performed using hydrogen gas, helium gas or argon gas that further contains 1 to 1000 ppm of boron atom containing gas and 1 to 1000 ppm of phosphorus atom containing gas.

11. A method for manufacturing a photovoltaic element wherein a pin-structure formed by laminating n-, i- and p-type semiconductor layers, each of which contains silicon atoms and comprises a non-monocrystalline crystal structure, is formed at least one or more times on a substrate, said method comprising steps of forming each of said semiconductor layers and annealing the surface of at least one of said semiconductor layers or said substrate in an atmosphere of hydrogen gas, helium gas or argon gas that contains 1 to 1000 ppm of oxygen atom containing gas, and wherein said step of forming the semiconductor layer is performed with the microwave plasma CVD process and the microwave frequency in said CVD process is set in the range of 0.1 to 10 GHz.

12. A method for manufacturing a photovoltaic element wherein a pin-structure formed by laminating n-, i- and p-type semiconductor layers, each of which contains silicon atoms and comprises a non-monocrystalline crystal structure, is formed at least one or more times on a substrate, said method comprising steps of forming each of said semiconductor layers and annealing the surface of at least one of said semiconductor layers or said substrate in an atmosphere of hydrogen gas, helium gas or argon gas that contains 1 to 1000 ppm of oxygen atom containing gas that further contains 1 to 1000 ppm of phosphorous atom containing gas, wherein said phosphorus atom containing gas is at least one of phosphorus halides selected from the group consisting of $PH_4I$, $PF_3$, $PF_5$, $PCl_3$, $PCl_5$, $PBr_3$ and $PI_3$.

13. A method for manufacturing a photovoltaic element wherein a pin-structure formed by laminating n-, i- and p-type semiconductor layers, each of which contains silicon atoms and comprises a non-monocrystalline crystal structure, is formed at least one or more times on a substrate, said manufacture method comprising steps of forming each of said semiconductor layers and annealing the surface of at least one of said semiconductor layers or said substrate in an atmosphere of hydrogen gas, helium gas or argon gas that contains 1 to 1000 ppm of oxygen atom containing gas, while a magnetic field of 100 to 3000 G is applied to said atmosphere.

14. A method for manufacturing a photovoltaic element according to claim 13, wherein the temperature of said annealing step is set in the range of 50 to 400° C.

15. A method for manufacturing a photovoltaic element according to claim 13, wherein the pressure in said annealing step is set in the range of 0.01 to 10 Torr.

16. A method for manufacturing a photovoltaic element according to claim 13, wherein said step of forming the semiconductor layer is performed with the microwave plasma CVD process and the microwave frequency in said CVD process is set in the range of 0.1 to 10 GHz.

17. A method for manufacturing a photovoltaic element according to claim 13, wherein said oxygen atom containing gas is at least one selected from the group consisting of $O_2$, $CO$, $CO_2$, $NO$, $NO_2$, $N_2O$, $CH_3CH_2OH$ and $CH_3OH$.

18. A method for manufacturing a photovoltaic element according to claim 13, wherein said annealing step is performed using hydrogen gas, helium gas or argon gas that further contains 1 to 1000 ppm of boron atom containing gas.

19. A method for manufacturing a photovoltaic element according to claim 18, wherein said boron atom containing gas is at least one of boron hydrides selected from the group consisting of $B_2H_6$, $B_4H_{10}$ or $B_5H_9$, $B_5H_{11}$, $B_6H_{10}$, $B_6H_{12}$ and $B_6H_{14}$.

20. A method for manufacturing a photovoltaic element according to claim 18, wherein said boron atom containing gas is at least one of boron halides selected between $BF_3$ and $BCl_3$.

21. A method for manufacturing a photovoltaic element according to claim 13, wherein said annealing step is performed using hydrogen gas, helium gas or argon gas that further contains 1 to 1000 ppm of phosphorus atom containing gas.

22. A method for manufacturing a photovoltaic element according to claim 21, wherein said phosphorus atom containing gas is at least one of phosphorus hydrides selected between $PH_3$ and $P_2H_4$.

23. A method for manufacturing a photovoltaic element according to claim 21, wherein said phosphorus atom containing gas is at least one of phosphorus halides selected from the group consisting of $PH_4I$, $PF_3$, $PF_5$, $PCl_3$, $PCl_5$, $PBr_3$ and $PI_3$.

24. A method for manufacturing a photovoltaic element according to claim 13, wherein said annealing step is performed using hydrogen gas, helium gas or argon gas that further contains 1 to 1000 ppm of boron atom containing gas and 1 to 1000 ppm of phosphorus atom containing gas.

\* \* \* \* \*

UNITED STATES PATENT AND TRADEMARK OFFICE
CERTIFICATE OF CORRECTION

PATENT NO. : 6,379,994 B1
DATED : April 30, 2002
INVENTOR(S) : Masafumi Sano et al.

It is certified that error appears in the above-identified patent and that said Letters Patent is hereby corrected as shown below:

Column 8,
Line 39, "p--type" should read -- p-type --.

Column 18,
Line 22, "pin- structures" should read -- pin-structures --.

Column 19,
Line 29, "-the" should read -- the --.

Column 21,
Line 23, "reducer" should read -- reduce --;
Line 62, "aback-tail" should read -- a back-tail --.

Column 24,
Line 5, "such" should read -- such as --.

Column 28,
Line 36, "has" should read -- had--;
Line 64, "has" should read -- had --.

Column 30,
Line 4, "has" should read -- had --.

Column 34,
Line 24, "has" should be deleted;
Line 57, "has" should be deleted.

Column 35,
Line 31, "has" should be deleted;
Line 63, "has" should be deleted.

Column 42,
Line 27, "shown" should read -- shown. --;
Line 50, "The, valves" should read -- The valves --.

UNITED STATES PATENT AND TRADEMARK OFFICE
CERTIFICATE OF CORRECTION

PATENT NO. : 6,379,994 B1
DATED : April 30, 2002
INVENTOR(S) : Masafumi Sano et al.

It is certified that error appears in the above-identified patent and that said Letters Patent is hereby corrected as shown below:

Column 48,
Line 15, "aSi(;e" should read -- a-SiGe --;
Line 34, "gas; line" should read -- gas line --;
Line 45, "evaporation" should read -- evaporation. --.

Column 56,
Line 5, "A" should read -- $\Delta$ --.

Column 59,
Line 29, "mark °" should read -- mark O --.

Column 61,
Line 29, "mark °" should read -- mark O --.

Column 65,
Line 5, "mark °" should read -- mark O --.

Column 71,
Line 38, "on another" should read -- another --.

Column 75,
Line 24, "Phy." should read -- Phys. --.

Column 76,
Line 25, "pc-Si" should read -- $\mu$c-Si --.

Column 79,
Line 20, "pc-Si" should read -- $\mu$c-Si --.

Column 82,
Line 39, "was ;" should read -- was --.

Column 89,
Line 23, "f low" should read -- flow --.

Column 92,
Line 42, "e" should be deleted;
Line 59, "as" should read -- was --.

UNITED STATES PATENT AND TRADEMARK OFFICE
CERTIFICATE OF CORRECTION

PATENT NO. : 6,379,994 B1
DATED : April 30, 2002
INVENTOR(S) : Masafumi Sano et al.

It is certified that error appears in the above-identified patent and that said Letters Patent is hereby corrected as shown below:

Column 95,
Line 63, "was" should read -- way --.

Column 101,
Line 27, "that:" should read -- that -->>.

Column 103,
Line 22, "H$_2$gas" should read -- H$_2$ gas --.

Column 115,
Line 37, "pc-Si," should read -- µc-Si, --.

Column 117,
Line 30, "mark O" should read -- mark. ⊚ --.

Column 120,
Line 2, "B 17" should read -- B-17 --.

Column 122,
Line 35, "on another" should read -- another --.

Column 132,
Line 42, "RF-p layr" should read -- RF p-layer --.

Column 134,
Line 28, "we as" should read -- was --.

Column 135,
Line 51, "pc-Si," should read -- µc-Si, --;
Line 65, "and. RF-p layer" should read -- and RF p-layer --.

Column 141,
Line 1, "112,," should read -- 112, --.

UNITED STATES PATENT AND TRADEMARK OFFICE
CERTIFICATE OF CORRECTION

PATENT NO. : 6,379,994 B1
DATED : April 30, 2002
INVENTOR(S) : Masafumi Sano et al.

It is certified that error appears in the above-identified patent and that said Letters Patent is hereby corrected as shown below:

Column 148,
Line 29, "BF3/H$_2$" should read -- BF$_3$/H$_2$ --.

Column 152,
Line 11, "µc-S:i," should read -- µc-Si, --.

Column 161,
Line 9, "the-" should read -- the --;
Line 10, "diluting-gas" should read -- diluting gas --.

Column 167,
Line 32, "determiLning" should read -- determining --;
Line 60, "were" should read -- was --.

Column 168,
Line 62, "-the" should read -- the --.

Column 169,
Line 46, "were" should read -- was --.

Column 171,
Line 10, "1.4,but" should read -- 1.4 but --;
Line 45, "2000." should read -- 2000 --.

Column 175,
Line 21, "Fame" should read -- same --.

Column 179,
Line 14, "-the" should read -- the --;
Line 30, "mass-flow-controller" should read -- mass-flow controller --;
Line 63, "and." should read -- and --.

Column 181,
Line 52, "1.8." should read -- 1.8. A mark ⊙ indicates that the normalized value is more than 2.0. --;
Line 58, "aSiGe" should read -- a-SiGe --;
Line 64, "antienvironment" should read -- anti-environment --.

UNITED STATES PATENT AND TRADEMARK OFFICE
CERTIFICATE OF CORRECTION

PATENT NO. : 6,379,994 B1
DATED : April 30, 2002
INVENTOR(S) : Masafumi Sano et al.

It is certified that error appears in the above-identified patent and that said Letters Patent is hereby corrected as shown below:

Column 186,
Line 46, "on another" should read -- another --.

Column 190,
Line 22, "generating-plasma" should read -- generating plasma --;
Line 27, "on another" should read -- another --.

Column 193,
Line 2, "for" should read -- for- --.

Column 196,
Line 1, "gels-introduction" should read -- gas-introduction --;
Line 25, "$SiH_4$," should read -- $SiH_4$ --;
Line 58, "(7-1 )" should read -- (7-1) --.

Column 198,
Line 38, "exhibit :" should read -- exhibit --.

Column 199,
Line 38, "$O_2$/ lie" should read -- $O_2$/He --.

Column 200,
Line 16, "(6-1 )" should read -- (6-1) --.

Column 201,
Line 46, "with-Example" should read -- with Example --.

Column 202,
Line 7, "f "should read -- flow --;
Line 8, "low" should be deleted.

Column 208,
Line 7, "f" should read -- flow --;
Line 8, "low" should be deleted;
Line 26, "$O_2$/ lie" should read -- $O_2$/He --;
Line 46, "a-SiGe s," should read -- A-SiGe, --; and "a-Si-" should read -- a-Si, --.

UNITED STATES PATENT AND TRADEMARK OFFICE
CERTIFICATE OF CORRECTION

| | | |
|---|---|---|
| PATENT NO. | : 6,379,994 B1 | |
| DATED | : April 30, 2002 | |
| INVENTOR(S) | : Masafumi Sano et al. | |

It is certified that error appears in the above-identified patent and that said Letters Patent is hereby corrected as shown below:

Column 210,
Line 53, "i-Layer" should read -- i-layer --.

Column 211,
Line 18, "or a a-SiGe" should read -- of a-SiGe --.

Column 212,
Line 56, "D 61." should read -- D 6-1. --.

Column 216,
Line 44, "were" should read -- was --.

Column 217,
Line 21, "that:" should read -- that --.

Column 223,
Line 10, "that:" should read -- that --.

Column 224,
Line 12, "t hat" should read -- that --.

Column 227,
Line 30, "were" should read -- was --.

Column 229,
Line 37, "aSiGe" should read -- a-SiGe --.

Column 231,
Table 223, "$O_2$/HE" should read -- $O_2$/He --.

UNITED STATES PATENT AND TRADEMARK OFFICE
CERTIFICATE OF CORRECTION

PATENT NO. : 6,379,994 B1
DATED : April 30, 2002
INVENTOR(S) : Masafumi Sano et al.

It is certified that error appears in the above-identified patent and that said Letters Patent is hereby corrected as shown below:

Column 237,
Line 58, "e" should be deleted.

Column 240,
Line 62, "H2" should read -- $H_2$ --.

Column 242,
Line 20, "Process" should read -- process --.

Column 252,
Line 11, "a-Site,,an" should read -- a-SiGe, --.

Column 254,
Line 19, "rail 413" should read -- rails 413 --;
Line 42, "12" should be deleted--.

Column 255,
Line 12, "i.e.,in" should read -- i.e., in --.

Column 261,
Line 34, "ppm ) i" should read -- ppm) --.

Column 262,
Line 19, "a-com-shaped" should read -- a comb-shaped --.

Column 263,
Line 13, "E6-1." should read -- E 6-1. --.

Column 264,
Line 18, "rail 413" should read -- rails 413 --.

Column 267,
Line 22, "were" should read -- was --.

UNITED STATES PATENT AND TRADEMARK OFFICE
CERTIFICATE OF CORRECTION

PATENT NO. : 6,379,994 B1
DATED : April 30, 2002
INVENTOR(S) : Masafumi Sano et al.

It is certified that error appears in the above-identified patent and that said Letters Patent is hereby corrected as shown below:

Column 273,
Line 7, "containing" should be deleted.

Column 274,
Line 1, "at" should read -- that --.

Column 277,
Line 32, "mark °" should read -- mark. ⊙ --.

Column 282,
Line 8, "mark °indicates" should read -- mark O indicates- -.

Column 284,
Line 15, "-the" should read -- the --.

Column 286,
Line 56, "mark °" should read -- mark O --.

Column 287,
Line 53, "into" should read -- and then into --.

Column 291,
Line 12, "normalised" should read -- normalized --;
Line 18, "a toms" should read -- atoms --.

Column 292
Line 45, "on another" should read -- another --.

Column 293,
Line 45, "E 18" should read -- E 18-1 --;
Line 46, "1-1." should be deleted.

Column 296,
Line 25, "on another" should read -- another --.

UNITED STATES PATENT AND TRADEMARK OFFICE
CERTIFICATE OF CORRECTION

PATENT NO.     : 6,379,994 B1
DATED          : April 30, 2002
INVENTOR(S)    : Masafumi Sano et al.

It is certified that error appears in the above-identified patent and that said Letters Patent is hereby corrected as shown below:

Column 300,
Line 16, "on another" should read -- another --.

Column 301,
Line 44, "-the" should read -- the --.

Column 303,
Line 53, "shows" should read -- show --.

Column 305,
Line 3, "GeH," should read -- $GeH_4$ --.

Column 308,
Line 49, "pc-Si" should read -- µc-Si --.

Column 309,
Line 54, "1' $10^{-5}$ Torr." should read -- 1 x $10^{-5}$ Torr. --;
Line 60, "(6-1 )" should read -- (6-1) --.

Column 312,
Line 52, "pc-Si," should read -- µc-Si, --.

Column 316,
Line 2, "a-SiC-were" should read -- a-SiC were --.

Column 317,
Line 10, "of-uniformity" should read -- of uniformity --;
Line 51, "in-lines" should read -- in-line --.

Column 318,
Line 12, "pc-Si" should read -- µc-Si --.

Column 321,
Line 10, "$H^2$" should read -- $H_2$ --;
Line 30, "$O^2$/He" should read -- $O_2$/He --.

UNITED STATES PATENT AND TRADEMARK OFFICE
CERTIFICATE OF CORRECTION

PATENT NO. : 6,379,994 B1
DATED : April 30, 2002
INVENTOR(S) : Masafumi Sano et al.

It is certified that error appears in the above-identified patent and that said Letters Patent is hereby corrected as shown below:

Column 322,
Line 9, "μp-Si," should read -- μc-Si, --;
Line 11, "μp-Si," should read -- μc-Si, --.

Column 323
Line 36, "Irradiation" should read -- irradiation --.

Column 324,
Line 16, "a- SiC," should read -- a-SiC, --;
Line 17, "μp-Si." should read -- μc-Si. --;
Line 52, "P-layer" should read -- p-layer --.

Column 331,
Line 11, "from. l ppm" should read -- from 1 ppm --;
Line 44, "were" should read -- was --.

Column 333,
Line 47, "efficiency,. $H_2$gas" should read -- efficiency. $H_2$ gas --.

Column 346,
Line 61, "in under" should read -- under --.

Column 350,
Line 66, "values-" should read -- values --.

Column 351,
Line 12, should read -- photoelectric conversion efficiency, variation of the efficiency, --;
Line 60, "were" should read -- was --.

Column 353,
Line 9, should read -- photoelectric conversion efficiency, variation of the efficiency, --.

Column 354,
Line 9, "was," should read -- was --;
Line 10, "gas-introduction," should read -- gas-introduction --;
Line 64, "μc-Ei," should read -- μc-Si. --.

UNITED STATES PATENT AND TRADEMARK OFFICE
CERTIFICATE OF CORRECTION

PATENT NO. : 6,379,994 B1
DATED : April 30, 2002
INVENTOR(S) : Masafumi Sano et al.

It is certified that error appears in the above-identified patent and that said Letters Patent is hereby corrected as shown below:

Column 355,
Line 21, "con-troller" should read -- controller --.

Column 357,
Line 26, "normalised" should read -- normalized --;
Line 59, "suing" should read -- using --.

Column 358,
Line 25, "t he" should read -- the --;
Line 58, "on another" should read -- another --.

Column 361,
Line 25, "triple type" should read -- triple-type --;
Line 37, "all," should read -- all --.

Column 362,
Line 31, "on another" should read -- another --.

Column 366,
Line 20, "on another" should read -- another --.

Column 372,
Line 32, "$B_4H_{10}$ or" should read -- $B_4H_{10}$ --.

Signed and Sealed this

Fourteenth Day of January, 2003

JAMES E. ROGAN
*Director of the United States Patent and Trademark Office*